(12) United States Patent
Van De Ven et al.

(10) Patent No.: US 8,018,135 B2
(45) Date of Patent: Sep. 13, 2011

(54) LIGHTING DEVICE AND METHOD OF MAKING

(75) Inventors: Antony Paul Van De Ven, Hong Kong (CN); Gerald H. Negley, Durhan, NC (US)

(73) Assignee: Cree, Inc., Durham, NC (US)

( * ) Notice: Subject to any disclaimer, the term of this patent is extended or adjusted under 35 U.S.C. 154(b) by 259 days.

(21) Appl. No.: 12/248,220

(22) Filed: Oct. 9, 2008

(65) Prior Publication Data

US 2009/0184616 A1  Jul. 23, 2009

Related U.S. Application Data

(60) Provisional application No. 60/978,880, filed on Oct. 10, 2007, provisional application No. 61/037,365, filed on Mar. 18, 2008.

(51) Int. Cl.
*H01L 33/00* (2010.01)
(52) U.S. Cl. ............................ 313/498; 362/231; 445/25
(58) Field of Classification Search .......... 313/498–512; 362/231; 445/25
See application file for complete search history.

(56) References Cited

U.S. PATENT DOCUMENTS

| | | |
|---|---|---|
| 3,805,937 A | 4/1974 | Hatanaka et al. |
| 3,875,456 A | 4/1975 | Kano et al. |
| 3,927,290 A | 12/1975 | Denley |
| 4,120,026 A | 10/1978 | Tsuchihashi et al. |
| 4,325,146 A | 4/1982 | Lennington |
| 4,408,157 A | 10/1983 | Beaubien |
| 4,420,398 A | 12/1983 | Castino |
| 4,710,699 A | 12/1987 | Miyamoto |
| 4,772,885 A | 9/1988 | Uehara et al. |
| 5,087,883 A | 2/1992 | Hoffman |
| 5,166,815 A | 11/1992 | Elderfield |
| 5,264,997 A | 11/1993 | Hutchisson et al. |
| 5,407,799 A | 4/1995 | Studier |
| 5,410,519 A | 4/1995 | Hall et al. |
| 5,477,436 A | 12/1995 | Betling et al. |
| 5,563,849 A | 10/1996 | Hall et al. |
| 5,803,579 A | 9/1998 | Turnbull et al. |
| 5,851,063 A | 12/1998 | Doughty et al. |
| 5,959,316 A | 9/1999 | Lowery |

(Continued)

FOREIGN PATENT DOCUMENTS

DE    3 916 875    12/1990

(Continued)

OTHER PUBLICATIONS

U.S. Appl. No. 12/257,804, filed Oct. 24, 2008.

(Continued)

*Primary Examiner* — Nimeshkumar D Patel
*Assistant Examiner* — Mary Ellen Bowman
(74) *Attorney, Agent, or Firm* — Burr & Brown

(57) ABSTRACT

A lighting device comprising at least one non-white light source, at least a first supplemental light emitter and at least a second supplemental light emitter. The non-white light source(s) is outside an area from 0.01 u'v' above to below the blackbody locus, and within an area defined by curves between saturated light of wavelength 430-480 nm and 560-580 nm and line segments between saturated light of wavelength 430-580 nm and 480-560 nm. The first supplemental light emitter(s) have dominant emission wavelength of 465-540 nm. The second supplemental light emitter(s) have dominant emission wavelength of 600-640 nm.

37 Claims, 9 Drawing Sheets

U.S. PATENT DOCUMENTS

| | | | |
|---|---|---|---|
| 6,066,861 A | 5/2000 | Hohn et al. |
| 6,076,936 A | 6/2000 | George |
| 6,084,250 A | 7/2000 | Jüstel et al. |
| 6,095,666 A | 8/2000 | Salam |
| 6,132,072 A | 10/2000 | Turnbull et al. |
| 6,153,971 A | 11/2000 | Shimizu et al. |
| 6,212,213 B1 | 4/2001 | Weber et al. |
| 6,234,648 B1 | 5/2001 | Borner et al. |
| 6,252,254 B1 | 6/2001 | Soules |
| 6,255,670 B1 | 7/2001 | Srivastava et al. |
| 6,278,135 B1 | 8/2001 | Srivastava et al. |
| 6,292,901 B1 | 9/2001 | Lys et al. |
| 6,294,800 B1 | 9/2001 | Duggal et al. |
| 6,319,425 B1 | 11/2001 | Tasaki et al. |
| 6,335,538 B1 | 1/2002 | Prutchi et al. |
| 6,337,536 B1 | 1/2002 | Matsubara et al. |
| 6,348,766 B1 | 2/2002 | Ohishi et al. |
| 6,350,041 B1 | 2/2002 | Tarsa et al. |
| 6,357,889 B1 | 3/2002 | Duggal et al. |
| 6,394,621 B1 | 5/2002 | Hanewinkel |
| 6,429,583 B1 | 8/2002 | Levinson et al. |
| 6,441,558 B1 | 8/2002 | Muthu et al. |
| 6,480,299 B1 | 11/2002 | Drakopoulos et al. |
| 6,501,100 B1 | 12/2002 | Srivastava et al. |
| 6,504,179 B1 | 1/2003 | Ellens et al. |
| 6,513,949 B1 | 2/2003 | Marshall et al. |
| 6,522,065 B1 | 2/2003 | Srivastava et al. |
| 6,538,371 B1 | 3/2003 | Duggal et al. |
| 6,550,949 B1 | 4/2003 | Bauer et al. |
| 6,552,495 B1 | 4/2003 | Chang |
| 6,577,073 B2 | 6/2003 | Shimizu et al. |
| 6,578,986 B2 | 6/2003 | Swaris et al. |
| 6,592,810 B2 | 7/2003 | Nishida et al. |
| 6,600,175 B1 | 7/2003 | Baretz et al. |
| 6,600,324 B2 | 7/2003 | St-Germain |
| 6,603,258 B1 | 8/2003 | Mueller-Mach et al. |
| 6,608,485 B2 | 8/2003 | St-Germain |
| 6,616,862 B2 | 9/2003 | Srivastava et al. |
| 6,624,350 B2 | 9/2003 | Nixon et al. |
| 6,636,003 B2 | 10/2003 | Rahm et al. |
| 6,642,666 B1 | 11/2003 | St-Germain |
| 6,685,852 B2 | 2/2004 | Setlur et al. |
| 6,686,691 B1 | 2/2004 | Mueller et al. |
| 6,692,136 B2 | 2/2004 | Marshall et al. |
| 6,703,173 B2 | 3/2004 | Lu et al. |
| 6,712,486 B1 | 3/2004 | Popovich et al. |
| 6,737,801 B2 | 5/2004 | Ragle |
| 6,744,194 B2 | 6/2004 | Fukasawa et al. |
| 6,762,563 B2 | 7/2004 | St-Germain |
| 6,784,463 B2 | 8/2004 | Camras et al. |
| 6,791,257 B1 | 9/2004 | Sato et al. |
| 6,817,735 B2 | 11/2004 | Shimizu et al. |
| 6,841,804 B1 | 1/2005 | Chen et al. |
| 6,851,834 B2 | 2/2005 | Leysath |
| 6,880,954 B2 | 4/2005 | Ollet et al. |
| 6,882,101 B2 | 4/2005 | Ragle |
| 6,914,267 B2 | 7/2005 | Fukasawa et al. |
| 6,936,857 B2 | 8/2005 | Doxsee et al. |
| 6,967,116 B2 | 11/2005 | Negley |
| 6,980,176 B2 | 12/2005 | Matsumoto et al. |
| 7,005,679 B2 | 2/2006 | Tarsa et al. |
| 7,008,078 B2 | 3/2006 | Shimizu et al. |
| 7,009,343 B2 | 3/2006 | Lim et al. |
| 7,014,336 B1 | 3/2006 | Ducharme et al. |
| 7,023,019 B2 | 4/2006 | Maeda et al. |
| 7,061,454 B2 | 6/2006 | Sasuga et al. |
| 7,066,623 B2 | 6/2006 | Lee et al. |
| 7,083,302 B2 | 8/2006 | Chen et al. |
| 7,093,958 B2 | 8/2006 | Coushaine |
| 7,095,056 B2 | 8/2006 | Vitta et al. |
| 7,102,172 B2 | 9/2006 | Lynch et al. |
| 7,116,308 B1 | 10/2006 | Heeks et al. |
| 7,118,262 B2 | 10/2006 | Negley et al. |
| 7,125,143 B2 | 10/2006 | Hacker |
| 7,135,644 B1 | 11/2006 | Gilliland |
| 7,135,664 B2 | 11/2006 | Vornsand et al. |
| 7,144,121 B2 | 12/2006 | Minano et al. |
| 7,164,231 B2 | 1/2007 | Choi et al. |
| 7,207,691 B2 | 4/2007 | Lee et al. |
| 7,213,940 B1 | 5/2007 | Van De Ven et al. |
| 7,215,074 B2 | 5/2007 | Shimizu et al. |
| 7,232,212 B2 | 6/2007 | Iwase |
| 7,239,085 B2 | 7/2007 | Kawamura |
| 7,250,715 B2 | 7/2007 | Mueller et al. |
| 7,255,457 B2 | 8/2007 | Ducharme et al. |
| 7,256,557 B2 | 8/2007 | Lim et al. |
| 7,322,732 B2 | 1/2008 | Negley et al. |
| 7,329,024 B2 | 2/2008 | Lynch et al. |
| 7,334,917 B2 | 2/2008 | Laski |
| 7,358,954 B2 | 4/2008 | Negley et al. |
| 7,365,485 B2 | 4/2008 | Fukasawa et al. |
| 7,387,405 B2 | 6/2008 | Ducharme et al. |
| 7,422,504 B2 | 9/2008 | Maeda et al. |
| 7,453,195 B2 | 11/2008 | Radkov |
| 7,462,502 B2 | 12/2008 | Paolini et al. |
| 7,474,044 B2 | 1/2009 | Ge |
| 2001/0002049 A1 | 5/2001 | Reeh et al. |
| 2002/0006044 A1 | 1/2002 | Harbers et al. |
| 2002/0070681 A1 | 6/2002 | Shimizu et al. |
| 2002/0087532 A1 | 7/2002 | Barritz et al. |
| 2002/0149576 A1 | 10/2002 | Tanaka et al. |
| 2003/0026096 A1 | 2/2003 | Ellens et al. |
| 2003/0030063 A1 | 2/2003 | Sosniak et al. |
| 2003/0067773 A1 | 4/2003 | Marshall et al. |
| 2003/0146411 A1 | 8/2003 | Srivastava et al. |
| 2003/0222268 A1 | 12/2003 | Yocom et al. |
| 2004/0046178 A1 | 3/2004 | Sano |
| 2004/0105261 A1 | 6/2004 | Ducharme et al. |
| 2004/0105264 A1 | 6/2004 | Spero |
| 2004/0212998 A1 | 10/2004 | Mohacsi |
| 2004/0217364 A1 | 11/2004 | Tarsa et al. |
| 2004/0218387 A1 | 11/2004 | Gerlach |
| 2004/0218388 A1 | 11/2004 | Suzuki |
| 2004/0239839 A1 | 12/2004 | Hong |
| 2004/0264193 A1 | 12/2004 | Okumura |
| 2004/0264212 A1 | 12/2004 | Chung et al. |
| 2005/0007306 A1 | 1/2005 | Ilsaka et al. |
| 2005/0052378 A1 | 3/2005 | Hacker |
| 2005/0082974 A1 | 4/2005 | Fukasawa et al. |
| 2005/0117334 A1* | 6/2005 | Lee et al. ............. 362/231 |
| 2005/0190141 A1 | 9/2005 | Roth et al. |
| 2005/0231976 A1 | 10/2005 | Keuper et al. |
| 2005/0243556 A1 | 11/2005 | Lynch |
| 2005/0251698 A1 | 11/2005 | Lynch et al. |
| 2005/0259423 A1 | 11/2005 | Heuser et al. |
| 2005/0274972 A1 | 12/2005 | Roth et al. |
| 2006/0012989 A1 | 1/2006 | Lee |
| 2006/0022582 A1 | 2/2006 | Radkov |
| 2006/0060872 A1 | 3/2006 | Edmond et al. |
| 2006/0067073 A1 | 3/2006 | Ting |
| 2006/0105482 A1 | 5/2006 | Alferink et al. |
| 2006/0113548 A1 | 6/2006 | Chen et al. |
| 2006/0138435 A1 | 6/2006 | Tarsa et al. |
| 2006/0138937 A1 | 6/2006 | Ibbetson |
| 2006/0152140 A1 | 7/2006 | Brandes |
| 2006/0152172 A9 | 7/2006 | Mueller et al. |
| 2006/0180818 A1 | 8/2006 | Nagai et al. |
| 2006/0181192 A1 | 8/2006 | Radkov |
| 2006/0245184 A1 | 11/2006 | Galli |
| 2007/0001188 A1 | 1/2007 | Lee |
| 2007/0001994 A1 | 1/2007 | Roth |
| 2007/0041220 A1 | 2/2007 | Lynch |
| 2007/0051966 A1 | 3/2007 | Higashi et al. |
| 2007/0090381 A1 | 4/2007 | Otsuka et al. |
| 2007/0137074 A1 | 6/2007 | Van De Ven et al. |
| 2007/0139920 A1 | 6/2007 | Van De Ven et al. |
| 2007/0139923 A1 | 6/2007 | Negley |
| 2007/0170447 A1 | 7/2007 | Negley |
| 2007/0171145 A1 | 7/2007 | Coleman et al. |
| 2007/0202623 A1 | 8/2007 | Gao |
| 2007/0223219 A1 | 9/2007 | Medendorp et al. |
| 2007/0236911 A1 | 10/2007 | Negley |
| 2007/0247414 A1 | 10/2007 | Robert |
| 2007/0247847 A1 | 10/2007 | Villard |
| 2007/0262337 A1 | 11/2007 | Villard |
| 2007/0263393 A1 | 11/2007 | Van De Ven et al. |
| 2007/0267983 A1 | 11/2007 | Van De Ven et al. |

| | | | | | | |
|---|---|---|---|---|---|---|
| 2007/0274063 A1 | 11/2007 | Negley | | JP | 2007-141737 | 6/2007 |
| 2007/0274080 A1 | 11/2007 | Negley et al. | | TW | 546854 | 8/2003 |
| 2007/0276606 A1 | 11/2007 | Radkov | | WO | 98/43014 | 10/1998 |
| 2007/0278503 A1 | 12/2007 | Van De Ven et al. | | WO | 99/66483 | 12/1999 |
| 2007/0278934 A1 | 12/2007 | Van De Ven et al. | | WO | 00/34709 | 6/2000 |
| 2007/0278974 A1 | 12/2007 | Van De Ven | | WO | 01/41215 | 6/2001 |
| 2007/0279440 A1 | 12/2007 | Negley | | WO | 01/43113 | 6/2001 |
| 2007/0279903 A1 | 12/2007 | Negley | | WO | 01/69692 | 9/2001 |
| 2007/0280624 A1 | 12/2007 | Negley et al. | | WO | 03/056876 | 7/2003 |
| 2008/0084685 A1 | 4/2008 | Van De Ven | | WO | 03/091771 | 11/2003 |
| 2008/0084700 A1 | 4/2008 | Van De Ven | | WO | 2004/068909 | 8/2004 |
| 2008/0084701 A1 | 4/2008 | Van De Ven et al. | | WO | 2005/004202 | 1/2005 |
| 2008/0088248 A1 | 4/2008 | Myers | | WO | 2005013365 | 2/2005 |
| 2008/0089053 A1 | 4/2008 | Negley | | WO | 2005/013365 | 10/2005 |
| 2008/0106895 A1 | 5/2008 | Van De Ven | | WO | 2005/124877 | 12/2005 |
| 2008/0106907 A1 | 5/2008 | Trott et al. | | WO | 2005124877 | 12/2005 |
| 2008/0112168 A1 | 5/2008 | Pickard et al. | | WO | WO 2005/124877 | 12/2005 |
| 2008/0112170 A1 | 5/2008 | Trott et al. | | WO | 2006/028312 | 3/2006 |
| 2008/0112183 A1 | 5/2008 | Negley | | WO | 2007/061758 | 5/2007 |
| 2008/0130265 A1 | 6/2008 | Negley | | | | |
| 2008/0130285 A1 | 6/2008 | Negley | | | | |
| 2008/0136313 A1 | 6/2008 | Van De Ven | | | | |
| 2008/0137347 A1 | 6/2008 | Trott et al. | | | | |
| 2008/0170396 A1 | 7/2008 | Yuan et al. | | | | |
| 2008/0179602 A1 | 7/2008 | Negley | | | | |
| 2008/0192462 A1 | 8/2008 | Steedly et al. | | | | |
| 2008/0192493 A1 | 8/2008 | Villard | | | | |
| 2008/0211416 A1 | 9/2008 | Negley et al. | | | | |
| 2008/0231201 A1 | 9/2008 | Higley et al. | | | | |
| 2008/0259589 A1 | 10/2008 | Van De Ven et al. | | | | |
| 2008/0278928 A1 | 11/2008 | Van De Ven et al. | | | | |
| 2008/0278940 A1 | 11/2008 | Van De Ven et al. | | | | |
| 2008/0278950 A1 | 11/2008 | Pickard et al. | | | | |
| 2008/0278952 A1 | 11/2008 | Trott et al. | | | | |
| 2008/0304260 A1 | 12/2008 | Van De Ven et al. | | | | |
| 2008/0304261 A1 | 12/2008 | Van De Ven et al. | | | | |
| 2008/0304269 A1 | 12/2008 | Pickard et al. | | | | |
| 2008/0309255 A1 | 12/2008 | Myers | | | | |
| 2008/0310154 A1 | 12/2008 | Van De Ven et al. | | | | |
| 2009/0002986 A1 | 1/2009 | Medendorp et al. | | | | |

FOREIGN PATENT DOCUMENTS

| | | |
|---|---|---|
| DE | 3916875 | 12/1990 |
| DE | 10-335077 | 3/2005 |
| DE | 103 35 077 | 3/2005 |
| EP | 0 838 866 | 4/1998 |
| EP | 0 971 421 | 1/2000 |
| EP | 1 024 399 | 8/2000 |
| EP | 1 081 771 | 3/2001 |
| EP | 1 160 883 | 12/2001 |
| EP | 1 160 883 A2 | 12/2001 |
| EP | 1 193 772 | 4/2002 |
| EP | 1 367 655 | 12/2003 |
| EP | 1 380 876 | 1/2004 |
| EP | 1 462 711 | 9/2004 |
| EP | 1 462 711 | 12/2004 |
| EP | 1 566 848 | 8/2005 |
| EP | 1 571 715 | 9/2005 |
| EP | 1 760 795 | 1/2006 |
| JP | 04-159519 | 6/1992 |
| JP | 09-146089 | 6/1997 |
| JP | 10-163535 | 6/1998 |
| JP | 2000-022222 | 1/2000 |
| JP | 2000-183408 | 6/2000 |
| JP | 2001-111114 | 4/2001 |
| JP | 2001-156331 | 6/2001 |
| JP | 2001-307506 | 11/2001 |
| JP | 2002-150821 | 5/2002 |
| JP | 2003-515956 | 5/2003 |
| JP | 2003-529889 | 10/2003 |
| JP | 2004-080046 | 3/2004 |
| JP | 2004-103443 | 4/2004 |
| JP | 2004-253309 | 9/2004 |
| JP | 2004-356116 | 12/2004 |
| JP | 2004-363055 | 12/2004 |
| JP | 2005-005482 | 1/2005 |
| JP | 2005-101296 | 4/2005 |
| JP | 2005-142311 | 6/2005 |
| JP | 2007-122950 | 5/2007 |

OTHER PUBLICATIONS

U.S. Appl. No. 11/613,733, filed Dec. 20, 2006, Van de Ven et al.
DOE SSL CALiPer Report, "Product Test Reference: CALiPER 07-31 Downlight Lamp".
DOE SSL CALiPer Report, Product Test Reference: CALiPER 07-47.
U.S. Department of Energy, "DOE Solid-State Lighting CALiPER Program, Summary of Results: Round 3 of Product Testing," Oct. 2007.
U.S. Department of Energy, "DOE Solid-State Lighting CALiPER Program, Summary of Results: Round 4 of Product Testing," Jan. 2008.
U.S. Department of Energy, "DOE Solid-State Lighting CALiPER Program, Summary of Results: Round 5 of Product Testing," May 2008.
Web page, Product overview sheets for "Lexel" available from http://web.archive.org/web/20070106231922/http://tirsys.com/technology/index.htm as retrieved Jan. 6, 2007.
"Light Emitting Diodes (LEDs) for General Illumination" OIDA, edited by Tsao, J.Y., Sandia National Laboratories, Oct. 2002 available at http://lighting.sandia.gov/lightingdocs/OIDA_SSL_LED_Roadmap_Full.pdf as retrieved on Jun. 10, 2004.
Narukawa, Yukio; Narita, Junya; Sakamoto, Takahiko; Deguchi, Kouichiro; Yamada, Takao; and Mukai, Takashi, "Ultra-High Efficiency White Light Emitting Diodes", Japanese Journal of Applied Physics, vol. 45, No. 41, 2006, pp. L1084-L1086.
Zukausakas, A., Shuir M.S., Gaska, R., "Introduction to Solid-State Lighting," John Wiley & Sons, 2002. (Section 6.1, pp. 118-122).
Duggal, A., "Organic electroluminescence," edited by Zakya Kafafi, CRC Press, 2005. (pp. 437-466).
Schubert, E.F., "Light-Emitting Diodes." 2nd ed., Cambridge University Press, 2006. (Chapter 21, pp. 346-366).
U.S. Appl. No. 11/613,692, filed Dec. 20, 2006.
U.S. Appl. No. 11/614,180, filed Dec. 21, 2006.
U.S. Appl. No. 11/624,811, filed Jan. 19, 2007.
U.S. Appl. No. 11/626,483, filed Jan. 24, 2007.
U.S. Appl. No. 11/743,754, filed May 3, 2007.
U.S. Appl. No. 11/751,982, filed May 22, 2007.
U.S. Appl. No. 11/753,103, filed May 24, 2007.
U.S. Appl. No. 11/751,990, filed May 22, 2007.
U.S. Appl. No. 11/736,761, filed Apr. 18, 2007.
U.S. Appl. No. 11/736,799, filed Apr. 18, 2007.
U.S. Appl. No. 11/737,321, filed Apr. 19, 2007.
U.S. Appl. No. 11/755,162, filed May 30, 2007.
U.S. Appl. No. 11/854,744, filed Sep. 13, 2007.
U.S. Appl. No. 11/936,163, filed Nov. 7, 2007.
U.S. Appl. No. 11/843,243, filed Aug. 22, 2007.
U.S. Appl. No. 11/948,021, filed Nov. 30, 2007.
U.S. Appl. No. 11/870,679, filed Oct. 11, 2007.
U.S. Appl. No. 11/947,392, filed Nov. 29, 2007.
U.S. Appl. No. 11/951,626, filed Dec. 6, 2007.
U.S. Appl. No. 12/117,148, filed May 8, 2008.
U.S. Appl. No. 12/117,280, filed May 8, 2008.
U.S. Appl. No. 12/017,676, filed Jan. 22, 2008.

U.S. Appl. No. 11/613,714, filed Dec. 20, 2006.
U.S. Appl. No. 11/755,153, filed May 30, 2007.
U.S. Appl. No. 12/117,122, filed May 8, 2008.
U.S. Appl. No. 12/117,131, filed May 8, 2008.
U.S. Appl. No. 12/117,136, filed May 8, 2008.
U.S. Appl. No. 11/947,323, filed Nov. 29, 2007.
U.S. Appl. No. 12/035,604, filed Feb. 22, 2008.
U.S. Appl. No. 12/117,271, filed May 8, 2008.
U.S. Appl. No. 12/057,748, filed Mar. 28, 2008.
U.S. Appl. No. 11/743,324, filed May 2, 2007.
U.S. Appl. No. 11/032,363, filed Jan. 10, 2005.
U.S. Appl. No. 61/075,513, filed Jun. 25, 2008.
U.S. Appl. No. 12/277,745, filed Nov. 25, 2008.
U.S. Appl. No. 12/257,804, filed Oct. 24, 2008.
U.S. Appl. No. 12/328,144, filed Dec. 4, 2008.
Van de Ven et al., "Warm White Illumination with High CRI and High Efficacy by Combining 455 nm Excited Yellowish Phosphor LEDs and Red AlInGaP LEDs", First International Conference on White LEDs and Solid State Lighting, Nov. 26, 2007.
Cree® XLamp® 7090 XR-E Series LED Binning and Labeling, 2006.
White Light LED, Part Nos. NSPW300BS and NSPW312BS, High Brightness LEDs, Nov. 12, 1999, Publisher: Nichia Corporation.
Chhajed, S., *Influence of junction temperature on chromaticity and color-rendering properties of trichromatic white-light sources . . .*, Journal of Applied Physics, 2005, vol. 97pp. 1-8, Feb. 16, 2005.
Color Kinetics Inc., Color Kinetics Support : White Papers & Presentations; available at http://www.colorkinetics.com/support/whitepapers/:, Solid State Lighting White Papers & Presentations, Feb. 22, 2006, pp. 1-4.
Color Kinetics Inc., *Color Quality of Intelligent Solid-State Light Systems*, Color Quality of Solid-State Light Sources, Mar. 2005, pp. 1-3.
Compound Semiconductors Online, "LED Lighting Fixtures, Inc. Sets World Record at 80 Lumens per Watt for Warm White", Compound Semiconductors Online, May 30, 2006, pp. 1.
Cree, Inc., "Cree® Xlamp® 7090 XR-E Series LED Binning and Labeling," Application Note: CLD-AP08.000, 7pp (2006), Jan. 2006.
CSA International, "Test Data Report," Project No. 1786317, Report No. 1786317-1 (Apr. 2006).
DOE SSL CALiPer Report, "Product Test Reference: CALiPER 07-31 Downlight Lamp", Sep. 7, 2007.
DOE SSL CALiPer Report, "Product Test Reference: CALiPER 07-47 Downlight Lamp", Sep. 7, 2007.
Krames et al., *Lumileds Lighting, Light from Silicon Valley*, Progress and Future Direction of LED Technology, SSL Workshop, Nov. 13, 2003, Publisher: Limileds Lighting Inc., pp. 1-21.

Narendran et al., "Solid State lighting: failure analysis of white LEDs," Journal of Cystal Growth, vol. 268, Issues 1-4, Aug. 2004, Abstract.
Press Release from LED Lighting Fixtures dated Apr. 24, 2006 entitled "LED Lighting Fixtures, Inc. achieves unprecedented gain in light output from new luminaire".
Press Release from LED Lighting Fixtures dated Feb. 16, 2006 entitled "LED Lighting Fixtures, Inc. Announces Record Performance".
Press Release from LED Lighting Fixtures dated Feb. 7, 2007 entitled "LED Lighting Fixtures Announces its first LED-based Recessed Down Light".
Press Release from LED Lighting Fixtures dated Jan. 26, 2006 entitled "LED Lighting Fixtures Creates 750 Lumen Recessed Light and Uses Only 16 Watts of Power".
Press Release from LED Lighting Fixtures dated May 30, 2006 entitled "LED Lighting Fixtures, Inc. Sets World Record at 80 Lumens per Watt for Warm White Fixture".
Press Release from LED Lighting Fixtures dated Nov. 28, 2007 entitled "New Lamp from LED Lighting Fixtures Shatter World Record for Energy Efficiency".
Shimizu, "Development of High-Efficiency LED Downlight", First International Conference on White LEDs and Solid State Lighting, Nov. 30, 2007.
U.S. Department of Energy, "DOE Solid-State Lighting CALiPER Program, Summary of Results: Round 3 of Product Testing," Oct. 2007.
U.S. Department of Energy, "DOE Solid-State Lighting CALiPER Program, Summary of Results: Round 4 of Product Testing," Jan. 2008.
U.S. Department of Energy, "DOE Solid-State Lighting CALiPER Program, Summary of Results: Round 5 of Product Testing," May 2008.
Van De Ven et al., "Warm White Illumination with High CRI and High Efficacy by Combining 455 nm Excited Yellowish Phosphor LEDs and Red AlInGaP LEDs," First International Conference on White LEDs and Solid State Lighting, Nov. 30, 2007.
CSA International, "Test Data Report," Project No. 1786317, Report No. 1786317-1 (Apr. 2006).
Optoled Lighting Inc., *OptoLED Product Information*, 2009, Publisher: OptoLED GmBH website: accessed at http://222.optoled.de/englisch/products/led.html, Jan. 16, 2009.
Permlight Inc., *Enbryten LED Product Information*, Feb. 2005, Publisher: Permlight Inc. website; accessed at http://www.webarchive.org displaying that www.permlight.com/products/LEDfixtures.asp was publicly available Jan. 2004.

* cited by examiner

LIGHTING DEVICE AND METHOD OF MAKING

CROSS-REFERENCE TO RELATED APPLICATIONS

This application claims the benefit of U.S. Provisional Patent Application No. 60/978,880, filed Oct. 10, 2007, the entirety of which is incorporated herein by reference.

This application claims the benefit of U.S. Provisional Patent Application No. 61/037,365, filed Mar. 18, 2008, the entirety of which is incorporated herein by reference.

FIELD OF THE INVENTIVE SUBJECT MATTER

The present inventive subject matter relates to lighting devices and methods of making them. In some embodiments, the present inventive subject matter relates to a lighting device which includes one or more non-white light sources and at least two supplemental light emitters which improve the CRI Ra of the light emitted from the lighting device. In addition, some embodiments of the present inventive subject matter provide lighting devices which respectively emit light of high CRI Ra in a wide range of color temperatures.

BACKGROUND

Color reproduction is typically measured using the Color Rendering Index (CRI Ra). CRI Ra is a modified average of the relative measurements of how the color rendition of an illumination system compares to that of a reference radiator when illuminating eight reference colors, i.e., it is a relative measure of the shift in surface color of an object when lit by a particular lamp. The CRI Ra equals 100 if the color coordinates of a set of test colors being illuminated by the illumination system are the same as the coordinates of the same test colors being irradiated by the reference radiator. Daylight has a high CRI (Ra of approximately 100), with incandescent bulbs also being relatively close (Ra greater than 95), and fluorescent lighting being less accurate (typical Ra of 70-80). Certain types of specialized lighting have very low CRI (e.g., mercury vapor or sodium lamps have Ra as low as about 40 or even lower). Sodium lights are used, e.g., to light highways—driver response time, however, significantly decreases with lower CRI Ra values (for any given brightness, legibility decreases with lower CRI Ra). See Commission Internationale de l'Eclairage. Method of Measuring and Specifying Colour Rendering Properties of Light Sources, CIE 13.3 (1995) for further information on CRI.

Aspects related to the present inventive subject matter can be represented on either the 1931 CIE (Commission International de l'Eclairage) Chromaticity Diagram or the 1976 CIE Chromaticity Diagram, both of which are well-known and readily available to those of ordinary skill in the art.

The CIE Chromaticity Diagrams map out the human color perception in terms of two CIE parameters x and y (in the case of the 1931 diagram) or u' and v' (in the case of the 1976 diagram). The spectral colors are distributed around the edge of the outlined space, which includes all of the hues perceived by the human eye. The boundary line represents maximum saturation for the spectral colors. The 1976 CIE Chromaticity Diagram is similar to the 1931 Diagram, except that the 1976 Diagram has been modified such that similar distances on the Diagram represent similar perceived differences in color.

Since similar distances on the 1976 Diagram represent similar perceived differences in color, deviation from a point on the 1976 Diagram can be expressed in terms of the coordinates, u' and v', e.g., distance from the point=$(\Delta u'^2+\Delta v'^2)^{1/2}$, and the hues defined by a locus of points which are each a common distance from a specified hue consist of hues which would each be perceived as differing from the specified hue to a common extent.

The chromaticity coordinates (i.e., color points) that lie along the blackbody locus obey Planck's equation: $E(\lambda)=A \lambda^{-5}/(e^{(B/T)}-1)$, where E is the emission intensity, $\lambda$ is the emission wavelength, T the color temperature of the blackbody and A and B are constants. Color coordinates that lie on or near the blackbody locus yield pleasing white light to a human observer. The 1976 CIE Diagram includes temperature listings along the blackbody locus. These temperature listings show the color path of a blackbody radiator that is caused to increase to such temperatures. As a heated object becomes incandescent, it first glows reddish, then yellowish, then white, and finally blueish. This occurs because the wavelength associated with the peak radiation of the blackbody radiator becomes progressively shorter with increased temperature, consistent with the Wien Displacement Law. Illuminants which produce light which is on or near the blackbody locus can thus be described in terms of their color temperature.

Many methods are known for allowing a lighting device to be adjustable in color temperature, including using a variable combination of warm white and cool white light sources, using red, green and blue light sources. However, all these methods generally provide low to medium CRI Ra.

Light emitting diode lamps have been demonstrated to be able to produce white light with component efficacy >150 L/W and are anticipated to be the predominant lighting devices within the next decade. See e.g., Narukawa, Narita, Sakamoto, Deguchi, Yamada, Mukai: "Ultra-High Efficiency White Light Emitting Diodes" Jpn. J. Appl. Phys. 32 (1993) L9 Vol. 45, No. 41, 2006, pp. L1084-L10-86; and on the World Wide Web nichia.com/about_nichia/2006/2006_122001.html.

Many systems are based primarily on LEDs which combine blue emitters+YAG:Ce or BOSE phosphors or Red, Green and Blue InGaN/AlInGaP LEDs; or UV LED excited RGB phosphors. These methods have good efficacy but only medium CRI or very good CRI and low efficacy. The efficacy and CRI tradeoff in LEDs is also an issue in the lighting industry with regard to fluorescent illumination. See Zukauskas A., Shur M. S., Cacka R. "Introduction to Solid-State Lighting" 2002, ISBN 0-471-215574-0, section 6.1.1 page 118.

While some luminaires use yellow sodium light, the majority of illumination uses light that is colored more naturally, similar to the color or color temperature of natural sources, including the color emitted by burning fuels, incandescent sources or daylight.

The term "white light" or "whiteness" does not clearly cover this range of colors as it is plain that a candle flame and other incandescent sources are yellowish, i.e., not completely white. Therefore the color of illumination is generally and better defined in terms of correlated color temperature (CCT) and needs to also be defined as to its proximity to the planckian black body locus (BBL) in addition to its CCT.

CRI Ra is the most commonly used metric for measuring color quality today. This CIE standard method (see, e.g., Commission Internationale de l'Eclairage. Method of Measuring and Specifying Colour Rendering Properties of Light Sources, CIE 13.3 (1995)) compares the rendered colors of 8 reference color swatches illuminated by the test illumination to the rendered color of the same swatches illuminated by reference light. Illumination with a CRI Ra of less than 50 is very poor and only used in applications where there is no alternative for economic issues. Lights with a CRI Ra between 70 and 80 have application for general illumination where the colors of objects are not important. For some general interior illumination, a CRI Ra>80 is acceptable.

A light with color coordinates within 4 MacAdam step ellipses of the planckian locus and a CRI Ra>85 is more suitable for general illumination purposes. CRI Ra>90 is preferable and provides greater color quality.

Some of the most commonly used LEDs in solid state lighting are phosphor excited LEDs. In many instances, a yellow phosphor (typically YAG:Ce or BOSE) is coated on a blue InGaN LED die. The resultant mix of yellow phosphor emitted light and some leaking blue light combines to produce a white light. This method typically produces light >5000K CCT and typically has a CRI Ra of between ~70 and 80. For warm white colors, an orange phosphor or a mix of red and yellow phosphor can be used.

Light made from combinations of standard "pure colors," red, green and blue, exhibit poor efficacy due primarily to the poor quantum efficiency of green LEDs. R+G+B lights also suffer from lower CRI Ra, in part due to the narrow full width at half maximum (FWHM) values of the green and red LEDs. Pure color LEDs (i.e., saturated LEDs) usually have a FWHM value in the range of from about 15 nm to about 30 nm.

UV based LEDs combined with red, green and blue phosphors offer quite good CRI Ra, similar to fluorescent lighting. Due to increased Stokes losses, however, they also have lower efficacies.

The highest efficiency LEDs today are blue LEDs made from InGaN. Commercially available devices have external quantum efficiency (EQE) as great as 60%. The highest efficiency phosphors suitable for LEDs today are YAG:Ce and BOSE phosphor with a peak emission around 555 nm. YAG:Ce has a quantum efficiency of >90% and is an extremely robust and well tested phosphor. Using this approach, almost any color along the tie line between blue and yellow is possible as shown in FIG. 2.

If the portion of the lumens of blue light is approximately greater than 3% and approximately less than 7% then the combined emitted light appears white and falls within the generally acceptable color boundaries of light suitable for illumination. Efficacy as high as 150 L/W has been reported for LEDs made in this area, but commercially available lamps generally have CRI Ra in the range of from 70 to 80.

White LED lamps made with this method typically have a CRI Ra of between 70 and 80. The primary omission from the spectrum being red color components and, to some extent, cyan.

Red AlInGaP LEDs have very high internal quantum efficiency, but due to the large refractive index mismatch between AlInGaP and suitable encapsulant materials, a lot of light is lost due to total internal reflection (TIR). Regardless, red and orange packaged LEDs are commercially available with efficacies higher than 60 L/W.

Additional information on LEDs for general illumination, shortcomings and potential solutions may be found in "Light Emitting Diodes (LEDs) for General Illumination" OIDA, edited by Tsao J. Y, Sandia National Laboratories, 2002.

U.S. Pat. No. 7,095,056 (Vitta '056) discloses a white light emitting device and method that generate light by combining light produced by a white light source (i.e., light which is perceived as white) with light produced by at least one supplemental light emitting diode (LED). In one aspect, Vitta '056 provides a device which comprises a light source which emits light which would be perceived as white, a first supplemental light emitting diode (LED) that produces cyan light, and a second supplemental LED that produces red light, wherein the light emitted from the device comprises a combination of the light produced by the white light source, the first supplemental LED, and the second supplemental LED. While the arrangement disclosed in Vitta '056 allows the CCT to be changed, the CRI and the usefulness of the device reduces significantly at lower color temperatures, making this arrangement generally undesirable for indoor general illumination.

The whiteness of the emission from a lighting device is somewhat subjective. In terms of illumination, it is generally defined as to its proximity to the planckian blackbody locus. Schubert, in his book *Light-Emitting Diodes*, second edition, on page 325 states, "the pleasantness and quality of white illumination decreases rapidly if the chromaticity point of the illumination source deviates from the planckian locus by a distance of greater than 0.01 in the x,y chromaticity system. This corresponds to the distance of about 4 MacAdam ellipses, a standard employed by the lighting industry. See Duggal A. R. "Organic electroluminescent devices for solid-state lighting" in Organic Electroluminescence edited by Z. H. Kafafi (Taylor and Francis Group, Boca Raton, Fla., 2005). Note the 0.01-rule-of-thumb is a necessary but not a sufficient condition for high quality illumination sources." A lighting device which has color coordinates that are within 4 MacAdam step ellipses of the planckian locus and which has a CRI Ra>80 is generally acceptable as a white light for illumination purposes. A lighting device which has color coordinates within 7 MacAdam ellipses of the planckian locus and which has a CRI Ra>70 is used as the minimum standards for many other white lighting devices including CFL and SSL (solid state lighting) lighting devices. (see DOE—Energy Star Program requirements for SSL Luminaires, 2006).

The distance a color point is from the BBL can also be more easily defined in terms of Eu'v'. This is the length of a line between the color point of the lighting device and the nearest point on the BBL defined in the CIE76 color space. A Eu'v' of 0.0012 is approximately equivalent to a single step MacAdam ellipse in the area near the BBL.

General illumination generally has a color temperature between 2,000 K and 10,000 K, with the majority of lighting devices for general illumination being between 2,700 K and 6,500 K. The white area is within Eu'v' 0.01 (approximately 8 MacAdam ellipses) of the planckian locus and between 2,500 K and 10,000 K, and is shown in FIG. 1.

BRIEF SUMMARY OF THE INVENTIVE SUBJECT MATTER

The present inventive subject matter provides color combinations of light emitters, e.g., LEDs, that can be constructed into lighting devices with high CRI, warm and cool color temperatures and/or variable color temperatures.

The present inventive subject matter provides lighting devices which comprise at least one or more non-white light sources (e.g., non-saturated phosphor LEDs which emit off-white or low to medium purity color), a second light source emitting light in the red to orange part of the color spectrum and a third light source emitting light in the blue to green spectrum. In some embodiments, the mixed light from the three (or more) sources forms a light spectrum which is perceived as being within 4 MacAdam Ellipses of the planckian blackbody locus and with a CRI Ra of greater than 90. Also provided is a lighting device where the color temperature can be changed while maintaining a very high CRI by using at least a fourth light source that emits light perceived as either white and/or off-white and/or purple-ish and/or blueish-purple and/or blueish-green light.

In some embodiments according to the present inventive subject matter, there are provided lighting devices which mix light from a non-white phosphor-LED and two other colored light emitting diodes to produce white light with a CRI Ra of greater than 95 for color temperatures between 2,700 K and 6,500 K. For example, in representative embodiments, the phosphor-LED is yellowish in color, comprising a blue light emitting diode emitting light with a peak in the range of 430 nm to 480 nm, preferably around 465 nm, and a yellow phosphor. A suitable phosphor (among many others) is YAG:CE or BOSE with a dominant wavelength between 560 nm to 580 nm, preferably around 570 nm. The other color light emitting diodes in such embodiments can be made of AlInGaP and InGaN (or other suitable semi-conductors) and may also incorporate one or more luminescent material. One of the diodes in such devices (termed RO for red/orange) should emit light with a dominant wavelength between 600 nm and 640 nm, e.g., between 610 nm and 630 nm (for example, around 619 nm), and the other (termed BCG for blue-cyan-green) should emit light with a dominant wavelength between 465 nm and 540 nm (for example, around 495 nm).

Table 1 below shows a very small selection of representative suitable combinations of colors to produce white light based on the DOE color points for SSL lights with a very high CRI Ra (approximately 95 or better):

TABLE 1

| Color | Phosphor LED parameters | | | RO parameters | | BCG parameters | |
|---|---|---|---|---|---|---|---|
| | CIE31 x | CIE31 y | L | dom.. λ nm | L | dom. λ nm | L |
| 2700K | 0.4095 | 0.5146 | 78% | 619 | 21% | 465 | 1.4% |
| 3000K | 0.4095 | 0.5146 | 80% | 619 | 18% | 470 | 2.3% |
| 3500K | 0.3710 | 0.4423 | 82% | 619 | 15% | 480 | 3.2% |
| 4000K | 0.3557 | 0.4137 | 84% | 622 | 12% | 485 | 4.6% |
| 4500K | 0.3379 | 0.3803 | 84% | 622 | 10% | 491 | 6.4% |
| 5000K | 0.3265 | 0.3589 | 83% | 622 | 9% | 495 | 8.5% |
| 5700K | 0.3216 | 0.3497 | 84% | 626 | 7% | 491 | 8.6% |
| 6500K | 0.3204 | 0.3474 | 86% | 634 | 5% | 486 | 9.1% |

The above-listed phosphor LED CIE31 points are selections from a large range.

An illustration of points (not inclusive of all possibilities), based on commonly available YAG:Ce phosphor variations, is shown in FIG. 6 on a section of a CIE31 chromaticity chart.

Another illustration is provided in FIG. 7, in which specific points (in black, labeled A-H) are identified as possible selections for color temperatures from 2,700 K to 6,500 K. These points are not inclusive of the total available for a selected color temperature. For a selected color temperature, the choice of the color point of the phosphor LED is dependent on the dominant wavelength of the RO and BCG components, and can fall almost anywhere in an area bounded by 430 nm, 480 nm, 560 nm and 580 nm and excluding the +/−0.01 u'v' white area.

Many combinations of LED and phosphor LED colors can be chosen to create a high CRI Ra lighting device as described above. FIG. 8 is an area graph showing combinations for a high CRI DOE 3,500 K SSL white light using a non-white phosphor and two supplementary LEDs. The axes indicate the dominant wavelengths for each of the supplementary LEDs. The x-y coordinates of the phosphor LED can be calculated using standard color matching formulas, well-known to those familiar with the art.

As an example, a 3,500 K lighting device could comprise the combination of a phosphor LED with CIE31 color coordinates of x 0.3598 and y 0.4215. Matching this with a 618 nm (615-620 nm) RO LED and a 488 nm (485-490 nm) BCG color, in the lumens ratio of 71:22:7, will give a CRI Ra of about 96.

Shown in FIGS. 9-11, respectively, are the spectrum, the CRI chart for the 14 CRI color samples, and the CIE31 chart indicating the color coordinate locations for component colors and the resultant 3,500 K white light.

According to a first aspect of the present inventive subject matter, there is provided a lighting device comprising:

a first group of non-white light sources, each of the non-white light sources, if illuminated, emitting light having u', v' color coordinates which define a point which is (1) outside an area bounded by a first white-light boundary curve which is 0.01 u'v' above the planckian blackbody locus and a second white-light boundary curve which is 0.01 u'v' below the planckian blackbody locus and (2) within an area on a 1976 CIE Chromaticity Diagram enclosed by a first saturated light curve extending along all points representing saturated light having wavelength in the range of from about 430 nm to about 480 nm, a first line segment extending from a point representing saturated light having wavelength of about 480 nm to a point representing saturated light having wavelength of about 560 nm, a second saturated light curve extending along all points representing saturated light having wavelength in the range of from about 560 nm to about 580 nm, and a second line segment extending from a point representing saturated light having wavelength of about 580 nm to a point representing saturated light having wavelength of about 430 nm;

a first group of supplemental light emitters, each of the first group of supplemental light emitters having a dominant emission wavelength in the range of from about 465 nm to about 540 nm; and a second group of supplemental light emitters, each of the second group of supplemental light emitters having a dominant emission wavelength in the range of from about 600 nm to about 640 nm.

According to a second aspect of the present inventive subject matter, there is provided a lighting device comprising:

a first group of non-white light sources, each of the non-white light sources comprising at least a first light source solid state light emitter and at least a first luminescent material, wherein if the first group of non-white light sources is illuminated, the first group of non-white light sources emits light having u', v' color coordinates which define a point which is (1) outside an area bounded by a first white-light boundary curve which is 0.01 u'v' above the planckian blackbody locus and a second white-light boundary curve which is 0.01 u'v' below the planckian blackbody locus and (2) within an area on a 1976 CIE Chromaticity Diagram enclosed by a first saturated light curve extending along all points representing saturated light having wavelength in the range of from about 430 nm to about 480 nm, a first line segment extending from a point representing saturated light having wavelength of about 480 nm to a point representing saturated light having wavelength of about 560 nm, a second saturated light curve extending along all points representing saturated light having wavelength in the range of from about 560 nm to about 580 nm, and a second line segment extending from a point representing saturated light having wavelength of about 580 nm to a point representing saturated light having wavelength of about 430 nm;

a first group of supplemental light emitters, each of the first group of supplemental light emitters having a dominant emission wavelength in the range of from about 465 nm to about 540 nm; and a second group of supplemental light emitters, each of the second group of supplemental light emitters having a dominant emission wavelength in the range of from about 600 nm to about 640 nm.

According to a third aspect of the present inventive subject matter, there is provided a lighting device comprising:

a first group of non-white light sources, each of the non-white light sources, if illuminated, emitting light having u', v' color coordinates which define a point which is (1) outside an area bounded by a first white-light boundary curve which is 0.01 u'v' above the planckian blackbody locus and a second white-light boundary curve which is 0.01 u'v' below the planckian blackbody locus and (2) within an area on a 1976 CIE Chromaticity Diagram enclosed by a first saturated light curve extending along all points representing saturated light having wavelength in the range of from about 430 nm to about 480 nm, a first line segment extending from a point representing saturated light having wavelength of about 480 nm to a point representing saturated light having wavelength of about 560 nm, a second saturated light curve extending along all points representing saturated light having wavelength in the range of from about 560 nm to about 580 nm, and a second line segment extending from a point representing saturated light having wavelength of about 580 nm to a point representing saturated light having wavelength of about 430 nm;

a first group of supplemental light emitters, each of the first group of supplemental light emitters comprising a solid state light emitter having a dominant emission wavelength in the range of from about 465 nm to about 540 nm; and a second group of supplemental light emitters, each of the second group of supplemental light emitters comprising a solid state light emitter having a dominant emission wavelength in the range of from about 600 nm to about 640 nm.

In some embodiments according to the present inventive subject matter, the first non-white light source comprises at least a first light source solid state light emitter and at least a first luminescent material.

In some embodiments according to the present inventive subject matter, the first group of non-white light sources comprises at least a first light source whose light output wavelength dispersion has a full width at half maximum value (FWHM value) of at least 40 nm.

In some embodiments according to the present inventive subject matter, if each of the first group of non-white light sources, each of the first group of supplemental light emitters and each of the second group of supplemental light emitters are emitting light, a mixture of (1) light emitted from the lighting device which was emitted by the first group of non-white light sources, (2) light emitted from the lighting device which was emitted by the first group of supplemental light emitters, and (3) light emitted from the lighting device which was emitted by the second group of supplemental light emitters would, in the absence of any additional light, have a combined illumination having x, y color coordinates which is within 0.01 u'v' of at least one point on the blackbody locus on a 1976 CIE Chromaticity Diagram.

In some embodiments according to the present inventive subject matter, the lighting device further comprises at least a first power line, and if energy is supplied to the first power line, the lighting device emits light which is within 0.01 u'v' of at least one point on the blackbody locus on a 1976 CIE Chromaticity Diagram.

In some embodiments according to the present inventive subject matter, if each of the first group of non-white light sources, each of the first group of supplemental light emitters and each of the second group of supplemental light emitters are emitting light, a mixture of (1) light emitted from the lighting device which was emitted by the first group of non-white light sources, (2) light emitted from the lighting device which was emitted by the first group of supplemental light emitters, and (3) light emitted from the lighting device which was emitted by the second group of supplemental light emitters would, in the absence of any additional light, have a correlated color temperature in the range of from about 2,000 K to about 11,000 K.

In some embodiments according to the present inventive subject matter, if each of the first group of non-white light sources, each of the first group of supplemental light emitters and each of the second group of supplemental light emitters are emitting light, a mixture of (1) light emitted from the lighting device which was emitted by the first group of non-white light sources, (2) light emitted from the lighting device which was emitted by the first group of supplemental light emitters, and (3) light emitted from the lighting device which was emitted by the second group of supplemental light emitters would, in the absence of any additional light, have a CRI Ra of at least 85.

In some embodiments according to the present inventive subject matter, if each of the first group of non-white light sources, each of the first group of supplemental light emitters and each of the second group of supplemental light emitters are emitting light, a mixture of (1) light emitted from the lighting device which was emitted by the first group of non-white light sources, (2) light emitted from the lighting device which was emitted by the first group of supplemental light emitters, and (3) light emitted from the lighting device which was emitted by the second group of supplemental light emitters would, in the absence of any additional light, have a CRI Ra of at least 90.

In some embodiments according to the present inventive subject matter, if each of the first group of non-white light sources, each of the first group of supplemental light emitters and each of the second group of supplemental light emitters are emitting light, light emitted from the lighting device which was emitted by the first group of non-white light sources comprises from about 40 percent to about 95 percent of the light emitted from the lighting device. In some of such embodiments, (1) the first group of non-white light sources comprises at least a first solid state light emitter which has a peak emission wavelength in the range of from about 390 nm to about 480 nm (and in some cases from about 430 nm to about 480 nm), and/or (2) the first group of non-white light sources comprises at least a first luminescent material which has a dominant emission wavelength in the range of from about 560 nm to about 580 nm (and in some cases from about 565 nm to about 575 nm).

In some embodiments according to the present inventive subject matter, the first group of supplemental light emitters comprises at least one first supplemental group light emitter which has a FWHM value of at least 40 nm.

In some embodiments according to the present inventive subject matter, the first group of supplemental light emitters comprises at least one first supplemental group light emitter which has a FWHM value in the range of from about 15 to about 30 nm.

In some embodiments according to the present inventive subject matter, each of the second group of supplemental light emitters has a dominant emission wavelength in the range of from about 610 nm to about 635 nm.

In some embodiments according to the present inventive subject matter, the second group of supplemental light emitters comprises at least one second supplemental group light emitter which has a FWHM value of at least 40 nm.

In some embodiments according to the present inventive subject matter, the second group of supplemental light emitters comprises at least one second supplemental group light emitter which has a FWHM value in the range of from about 15 nm to about 30 nm.

In some embodiments according to the present inventive subject matter, each of the first group of supplemental light emitters is a packaged light emitting diode and each of the second group of supplemental light emitters is a packaged light emitting diode.

In some embodiments according to the present inventive subject matter, at least one of the first group of supplemental light emitters and at least one of the second group of supplemental light emitters are combined as a single light emitting diode.

In some embodiments according to the present inventive subject matter, (1) the first non-white light source comprises at least a first light source solid state light emitter and at least a first luminescent material, and (2) at least one of the first group of supplemental light emitters, at least one of the second group of supplemental light emitters, the first light source solid state light emitter and the first luminescent material are combined as a single light emitting diode. In some of such embodiments, the first light source solid state light emitter is a light emitting diode.

In some embodiments according to the present inventive subject matter, each of the non-white light sources, if illuminated, emits light having x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

In some embodiments according to the present inventive subject matter, the first group of non-white light sources consists of a single light emitter.

In some embodiments according to the present inventive subject matter, the first group of supplemental light emitters consists of a single light emitter.

In some embodiments according to the present inventive subject matter, the first group of supplemental light emitters consists of a plurality of light emitters.

In some embodiments according to the present inventive subject matter, the second group of supplemental light emitters consists of a single light emitter.

In some embodiments according to the present inventive subject matter, the second group of supplemental light emitters consists of a plurality of light emitters.

In some embodiments according to the present inventive subject matter, the lighting device further comprises at least a third group of supplemental light emitters, the third group of supplemental light emitters comprising at least one light source that emits light perceived as white, off-white, purpleish, blueish-purple and/or blueish-green.

Some embodiments of the present inventive subject matter provide a lighting device that includes a first group of non-white light sources, each of said non-white light sources which, if illuminated, emit light having u', v' color coordinates which define a point which is (1) outside an area bounded by a first white-light boundary curve which is 0.01 u'v' above the planckian blackbody locus and a second white-light boundary curve which is 0.01 u'v' below the planckian blackbody locus and (2) within an area on a 1976 CIE Chromaticity Diagram enclosed by a first saturated light curve extending along all points representing saturated light having wavelength in the range of from about 430 nm to about 480 nm, a first line segment extending from a point representing saturated light having wavelength of about 480 nm to a point representing saturated light having wavelength of about 560 nm, a second saturated light curve extending along all points representing saturated light having wavelength in the range of from about 560 nm to about 580 nm, and a second line segment extending from a point representing saturated light having wavelength of about 580 nm to a point representing saturated light having wavelength of about 430 nm. A second group of non-white light sources are also included. Each of said second group of non-white light sources, if illuminated, emit light having u', v' color coordinates which define a point which is (1) outside the area bounded by the first white-light boundary curve and the second white-light boundary curve, and (2) within the area on a 1976 CIE Chromaticity Diagram enclosed by the first saturated light curve, the first line segment, the second saturated light curve, and the second line segment. At least one first supplemental light emitter having a dominant emission wavelength in the range of from about 465 nm to about 540 nm is also included in the lighting device. At least one second supplemental light emitter having a dominant emission wavelength in the range of from about 600 nm to about 640 nm is also provided. The first group of non-white light sources are electrically connected so as to be commonly energized and the second group of non-white light sources are electrically connected so as to be commonly energized and separately energized from the first group of non-white light sources. The at least one first supplemental light emitter being electrically connected so as to be commonly energized with one of the first group of non-white light emitters or the second group of non-white light emitters.

In particular embodiments, the first group of non-white light emitters and the second group of non-white light emitters have respective color points such that at least a portion of a tie line between the respective color points on the CIE31 Chromaticity Diagram is contained within a region bounded by the points having x, y coordinates of about 0.3528,0.4414; 0.3640,0.4629; 0.3953,0.4487; and 0.3845, 0.4296. In such embodiments, the at least one first supplemental light emitter may have a dominant wavelength of from about 475 nm to about 485 nm. In some embodiments, the at least one first supplemental light emitter has a dominant wavelength of about 480 nm. The lighting device may have a color temperature of from about 2500K to about 4000K (in many cases in the range of from about 2700K to about 3500K) and a color point within about 4 MacAdam ellipses of the blackbody locus.

In still other embodiments, the first group of non-white light emitters and the second group of non-white light emitters have respective color points such that at least a portion of a tie line between the respective color points on the CIE31 Chromaticity Diagram is contained within a region bounded by the points having x, y coordinates of about 0.3318,0.4013; 0.3426,0.4219; 0.3747,0.4122; and 0.3643, 0.3937. In such embodiments, the at least one first supplemental light emitter may have a dominant wavelength of from about 475 nm to about 485 nm. In particular embodiments, the at least one first supplemental light emitter has a dominant wavelength of about 480 nm. The lighting device may have a color temperature of about 4000K and a color point within about 4 MacAdam ellipses of the blackbody locus.

The devices according to the present inventive subject matter can be used for general illumination, for specialty illumination, and for medical applications and/or indications.

The inventive subject matter may be more fully understood with reference to the accompanying drawings and the following detailed description of the inventive subject matter.

DETAILED DESCRIPTION OF THE INVENTIVE SUBJECT MATTER

Figure 1:
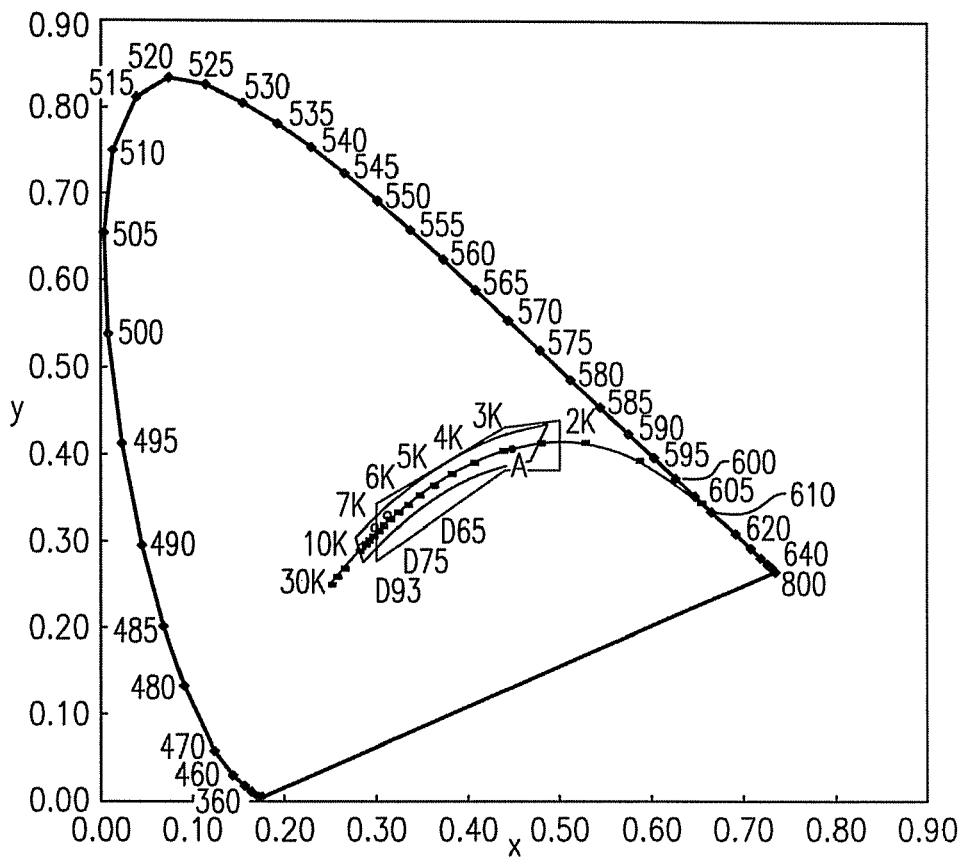
FIG. 1 is a CIE diagram illustrating the blackbody locus and a region of white light.

The present inventive subject matter now will be described more fully hereinafter with reference to the accompanying drawings, in which embodiments of the inventive subject matter are shown. However, this inventive subject matter should not be construed as limited to the embodiments set forth herein. Rather, these embodiments are provided so that this disclosure will be thorough and complete, and will fully convey the scope of the inventive subject matter to those skilled in the art. Like numbers refer to like elements throughout. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although the terms "first", "second", etc. may be used herein to describe various elements, components, regions, layers, sections and/or parameters, these elements, components, regions, layers, sections and/or parameters should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive subject matter.

Furthermore, relative terms, such as "lower" or "bottom" and "upper" or "top," may be used herein to describe one element's relationship to another elements as illustrated in the Figures. Such relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The expression "lighting device", as used herein, is not limited, except that it is capable of emitting light. That is, a lighting device can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or backlighting (e.g., back light poster, signage, LCD displays), bulb replacements (e.g., for replacing AC incandescent lights, low voltage lights, fluorescent lights, etc.), lights used for outdoor lighting, lights used for security lighting, lights used for exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting—work lights, etc., mirrors/vanity lighting, or any other light emitting device.

The present inventive subject matter further relates to an illuminated enclosure (the volume of which can be illuminated uniformly or non-uniformly), comprising an enclosed space and at least one lighting device according to the present inventive subject matter, wherein the lighting device illuminates at least a portion of the enclosure (uniformly or non-uniformly).

The present inventive subject matter is further directed to an illuminated area, comprising at least one item, e.g., selected from among the group consisting of a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, etc., having mounted therein or thereon at least one lighting device as described herein.

The expression "illumination" (or "illuminated"), as used herein when referring to a solid state light emitter, means that at least some current is being supplied to the solid state light emitter to cause the solid state light emitter to emit at least some light. The expression "illuminated" encompasses situations where the solid state light emitter emits light continuously or intermittently at a rate such that a human eye would perceive it as emitting light continuously, or where a plurality of solid state light emitters of the same color or different colors are emitting light intermittently and/or alternatingly (with or without overlap in "on" times) in such a way that a human eye would perceive them as emitting light continuously (and, in cases where different colors are emitted, as a mixture of those colors).

The expression "excited", as used herein when referring to a lumiphor or a luminescent material, means that at least some electromagnetic radiation (e.g., visible light, UV light or infrared light) is contacting the luminescent material, causing the luminescent material to emit at least some light. The expression "excited" encompasses situations where the luminescent material emits light continuously or intermittently at a rate such that a human eye would perceive it as emitting light continuously, or where a plurality of luminescent materials of the same color or different colors are emitting light intermittently and/or alternatingly (with or without overlap in "on" times) in such a way that a human eye would perceive them as emitting light continuously (and, in cases where different colors are emitted, as a mixture of those colors).

The expression "dominant emission wavelength", as used herein, means (1) in the case of a solid state light emitter, the dominant wavelength of light that the solid state light emitter emits if it is illuminated, and (2) in the case of a luminescent material, the dominant wavelength of light that the luminescent material emits if it is excited.

The expression "peak emission wavelength", as used herein, means (1) in the case of a solid state light emitter, the peak wavelength of light that the solid state light emitter emits if it is illuminated, and (2) in the case of a luminescent material, the peak wavelength of light that the luminescent material emits if it is excited.

The expression "correlated color temperature" is used according to its well-known meaning to refer to the temperature of a blackbody that is, in a well-defined sense (i.e., can be readily and precisely determined by those skilled in the art), nearest in color.

The expression "dominant wavelength", is used herein according to its well-known and accepted meaning to refer to the perceived color of a spectrum, i.e., the single wavelength of light which produces a color sensation most similar to the color sensation perceived from viewing light emitted by the light source (i.e., it is roughly akin to "hue"), as opposed to "peak wavelength", which is well-known to refer to the spectral line with the greatest power in the spectral power distribution of the light source. Because the human eye does not perceive all wavelengths equally (it perceives yellow and green better than red and blue), and because the light emitted by many solid state light emitter (e.g., LEDs) is actually a range of wavelengths, the color perceived (i.e., the dominant wavelength) is not necessarily equal to (and often differs from) the wavelength with the highest power (peak wavelength). A truly monochromatic light such as a laser has the same dominant and peak wavelengths.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

The expression "commonly energized", as used herein, means that the items described as being commonly energized are on a common energy supply structure (e.g., a common power line), such that when energy is being supplied to a first item, energy is necessarily also being supplied to the other item or items which are described as being "commonly energized" with the first item.

Any desired solid state light emitter or emitters can be employed in accordance with the present inventive subject matter. Persons of skill in the art are aware of, and have ready access to, a wide variety of such emitters. Such solid state light emitters include inorganic and organic light emitters. Examples of types of such light emitters include a wide variety of light emitting diodes (inorganic or organic, including polymer light emitting diodes (PLEDs)), laser diodes, thin film electroluminescent devices, light emitting polymers (LEPs), a variety of each of which are well-known in the art (and therefore it is not necessary to describe in detail such devices, and/or the materials out of which such devices are made).

The lighting devices according to the present inventive subject matter can comprise any desired number of solid state emitters. For example, a lighting device according to the present inventive subject matter can include 50 or more light emitting diodes, or can include 100 or more light emitting diodes, etc.

Representative examples of suitable LEDs are described in:

U.S. Patent Application No. 60/753,138, filed on Dec. 22, 2005, entitled "LIGHTING DEVICE" (inventor: Gerald H. Negley) and U.S. patent application Ser. No. 11/614,180, filed Dec. 21, 2006 (now U.S. Patent Publication No. 2007/0236911), the entireties of which are hereby incorporated by reference;

U.S. Patent Application No. 60/794,379, filed on Apr. 24, 2006, entitled "SHIFTING SPECTRAL CONTENT IN LEDS BY SPATIALLY SEPARATING LUMIPHOR FILMS" (inventors: Gerald H. Negley and Antony Paul van de Ven) and U.S. patent application Ser. No. 11/624,811, filed Jan. 19, 2007 (now U.S. Patent Publication No. 2007/0170447), the entireties of which are hereby incorporated by reference;

U.S. Patent Application No. 60/808,702, filed on May 26, 2006, entitled "LIGHTING DEVICE" (inventors: Gerald H. Negley and Antony Paul van de Ven) and U.S. patent application Ser. No. 11/751,982, filed May 22, 2007 (now U.S. Patent Publication No. 2007/0274080), the entireties of which are hereby incorporated by reference;

U.S. Patent Application No. 60/808,925, filed on May 26, 2006, entitled "SOLID STATE LIGHT EMITTING DEVICE AND METHOD OF MAKING SAME" (inventors: Gerald H. Negley and Neal Hunter) and U.S. patent application Ser. No. 11/753,103, filed May 24, 2007 (now U.S. Patent Publication No. 2007/0280624), the entireties of which are hereby incorporated by reference;

U.S. Patent Application No. 60/802,697, filed on May 23, 2006, entitled "LIGHTING DEVICE AND METHOD OF MAKING" (inventor: Gerald H. Negley) and U.S. patent application Ser. No. 11/751,990, filed May 22, 2007 (now U.S. Patent Publication No. 2007/0274063), the entireties of which are hereby incorporated by reference;

U.S. Patent Application No. 60/793,524, filed on Apr. 20, 2006, entitled "LIGHTING DEVICE AND LIGHTING METHOD" (inventors: Gerald H. Negley and Antony Paul van de Ven) and U.S. patent application Ser. No. 11/736,761, filed Apr. 18, 2007 (now U.S. Patent Publication No. 2007/0278934), the entireties of which are hereby incorporated by reference;

U.S. Patent Application No. 60/857,305, filed on Nov. 7, 2006, entitled "LIGHTING DEVICE AND LIGHTING METHOD" (inventors: Antony Paul van de Ven and Gerald H. Negley; and U.S. patent application Ser. No. 11/936,163, filed Nov. 7, 2007 (now U.S. Patent Publication No. 2008/0106895), the entireties of which are hereby incorporated by reference;

U.S. Patent Application No. 60/839,453, filed on Aug. 23, 2006, entitled "LIGHTING DEVICE AND LIGHTING METHOD" (inventors: Antony Paul van de Ven and Gerald H. Negley) and U.S. patent application Ser. No. 11/843,243, filed Aug. 22, 2007 (now U.S. Patent Publication No. 2008/0084685), the entireties of which are hereby incorporated by reference;

U.S. Patent Application No. 60/851,230, filed on Oct. 12, 2006, entitled "LIGHTING DEVICE AND METHOD OF MAKING SAME" (inventor: Gerald H. Negley) and U.S. patent application Ser. No. 11/870,679, filed Oct. 11, 2007 (now U.S. Patent Publication No. 2008/0089053), the entireties of which are hereby incorporated by reference;

U.S. Patent Application No. 60/916,608, filed on May 8, 2007, entitled "LIGHTING DEVICE AND LIGHTING METHOD" (inventors: Antony Paul van de Ven and Gerald H. Negley), and U.S. patent application Ser. No. 12/117,148, filed May 8, 2008 (now U.S. Patent Publication No. 2008/0304261), the entireties of which are hereby incorporated by reference;

U.S. patent application Ser. No. 12/017,676, filed on Jan. 22, 2008, entitled "ILLUMINATION DEVICE HAVING ONE OR MORE LUMIPHORS, AND METHODS OF FABRICATING SAME" (inventors: Gerald H. Negley and Antony Paul van de Ven), U.S. Patent Application No. 60/982,900, filed on Oct. 26, 2007 (inventors: Gerald H. Negley and Antony Paul van de Ven), the entirety of which is hereby incorporated by reference.

A wide variety of luminescent materials (also known as lumiphors or luminophoric media, e.g., as disclosed in U.S. Pat. No. 6,600,175, the entirety of which is hereby incorporated by reference) are well-known and available to persons of skill in the art. For example, a phosphor is a luminescent material that emits a responsive radiation (e.g., visible light) when excited by a source of exciting radiation. In many instances, the responsive radiation has a wavelength which is different from the wavelength of the exciting radiation. Other examples of luminescent materials include scintillators, day glow tapes and inks which glow in the visible spectrum upon illumination with ultraviolet light.

Luminescent materials can be categorized as being down-converting, i.e., a material which converts photons to a lower energy level (longer wavelength) or up-converting, i.e., a material which converts photons to a higher energy level (shorter wavelength).

Inclusion of luminescent materials in LED devices has been accomplished in a variety of ways, one representative way being by adding the luminescent materials to a clear or transparent encapsulant material (e.g., epoxy-based, silicone-based, glass-based or metal oxide-based material) as discussed above, for example by a blending or coating process.

As noted above, in some embodiments according to the present inventive subject matter, the non-white light source comprises at least one phosphor-LED. Phosphor-LEDs are made by coating, or surrounding, or having in proximity to a light emitting diode (e.g., which emits blue or violet-blue or violet light), a luminescent material that is excited by the light-emitting-diode's light. Often, the luminescent material is chosen to emit yellow light, as a combination of blue and yellow light can make white light. A phosphor often used is YAG:Ce. The light emitted by the luminescent material can be combined with a portion of the light emitted by the light-emitting-diode, and the combined light has a hue and purity different from either the light-emitting-diode or the phosphor.

Figure 2:
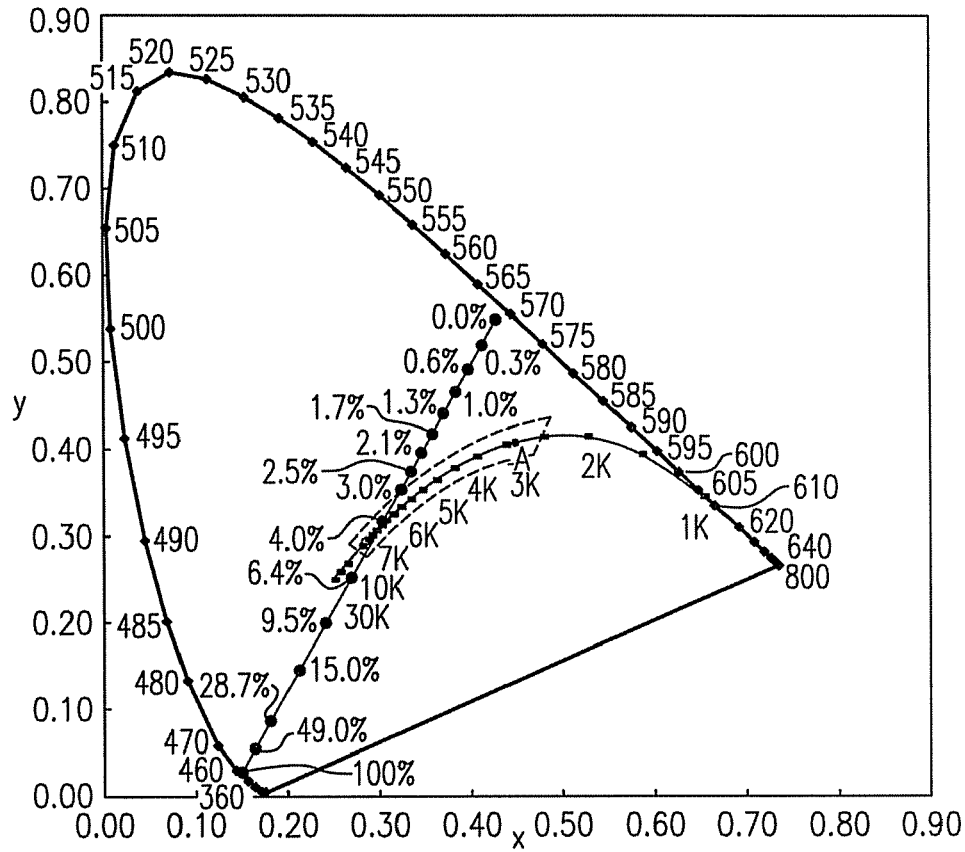
FIG. 2 is a CIE diagram illustrating the range of hues obtainable from a YAG phosphor converted blue LED.

"White LEDs" (i.e., white LED lamps) are commonly produced using a light-emitting-diode that emits light around 455 nm and a phosphor YAG:Ce which has a yellow dominant wavelength of around 570 nm. If the portion of the lumens blue light is approximately greater than 3% and approximately less than 7%, then the combined emitted light appears white and falls within the generally acceptable color boundaries of light suitable for illumination (see FIG. 2).

Figure 3:
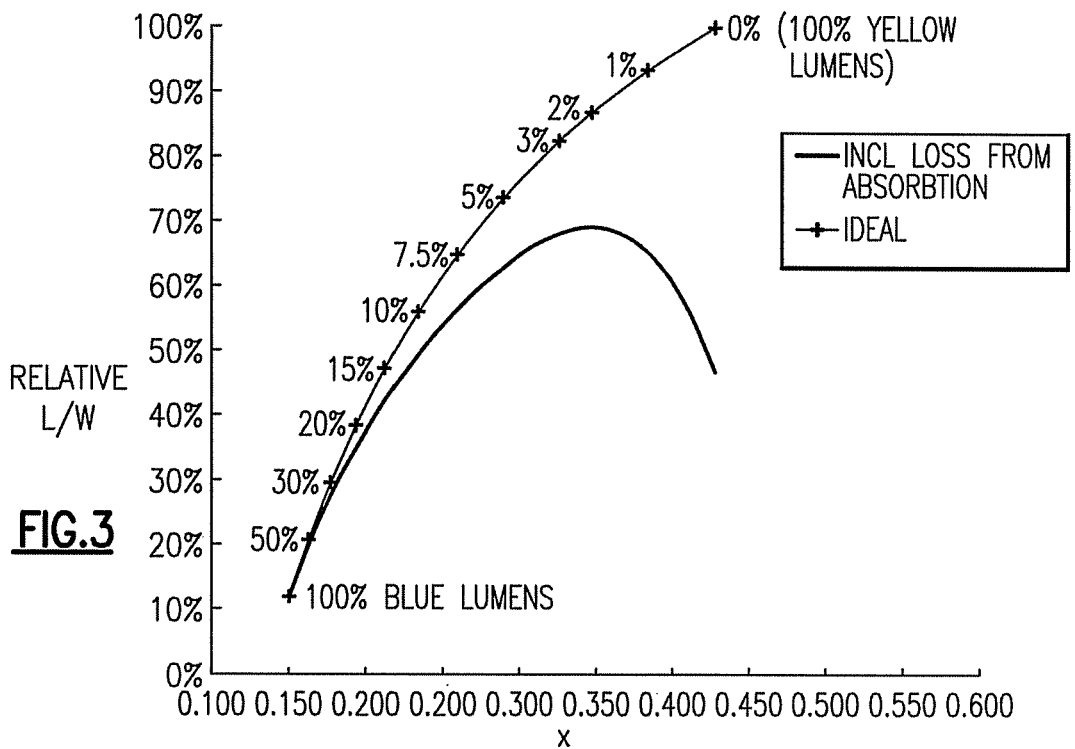
FIG. 3 is graph of phosphor LED efficiency.

The efficacy of such phosphor lamps will ideally increase continuously as a greater portion of the blue light is converted to yellow, due to the sensitivity of the eye, which is much more sensitive to yellow light than to blue light. In practice, however, the efficiency of the combined light peaks, as some of the blue light is lost due to parasitic absorption, and a greater portion of the yellow light is re-absorbed due to the thicker phosphor layer required. The peak efficacy and the color temperature of the peak efficacy is typically at around 2 percent blue lumens output (see FIG. 3).

High efficacy can be achieved by: (1) careful selection of phosphor particle size; (2) the position of the phosphor relative to the blue emitter (see, e.g., U.S. Patent Application No. 60/753,138, filed on Dec. 22, 2005, entitled "LIGHTING DEVICE" (inventor: Gerald H. Negley) and U.S. patent application Ser. No. 11/614,180, filed Dec. 21, 2006 (now U.S. Patent Publication No. 2007/0236911), the entireties of which are hereby incorporated by reference) and/or (3) the density of the phosphor within the binder. Methods for using phosphors include coating the phosphor as a thin layer directly on the blue emitter, dispersing the phosphor in transparent medium around the blue emitter or as a layer separated from the light-emitting-diode. The present inventors have found that a particle size of about 5 micrometers and spatially separated from the blue emitter provides improved results.

To obtain a particular color of phosphor lamp, the amount of phosphor can be varied. For instance, for a white phosphor LED lamp, approximately 20 percent by weight of a transparent binder can be combined with the phosphor to coat the blue light-emitting-diode. By increasing the amount of phosphor in the binder, the color of LED will move toward yellow, and conversely, reducing the amount of phosphor will generally move the color of the light toward blue.

Other combinations can use light-emitting-diodes between 405 nm and 490 nm, and luminescent materials having a dominant wavelength emissions in the range of from 550 nm to 600 nm.

While it is possible to manufacture white LED lamps using the above methods, typically their CRI is low, e.g., Ra less than 70.

Methods to increase the CRI of such lamps have been described by others and include adding a red phosphor with the yellow phosphor to increase the red light emitted. Such methods have achieved very high CRI, in some cases Ra as high as 96, but due to the Stokes losses associated with using a blue excited red phosphor, efficacy is generally very low.

Figure 4:
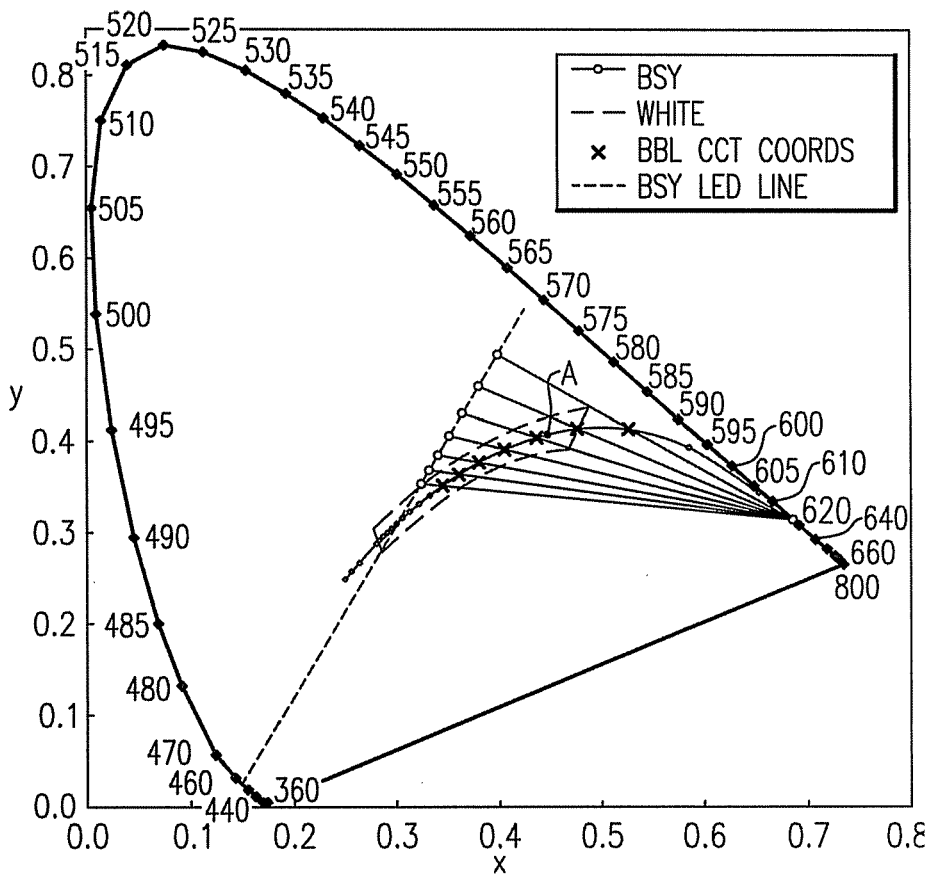
FIG. 4 is a CIE diagram illustrating the generation of white light by combining a non-saturated non-white phosphor converted LED with a red/orange LED.
Figure 5:
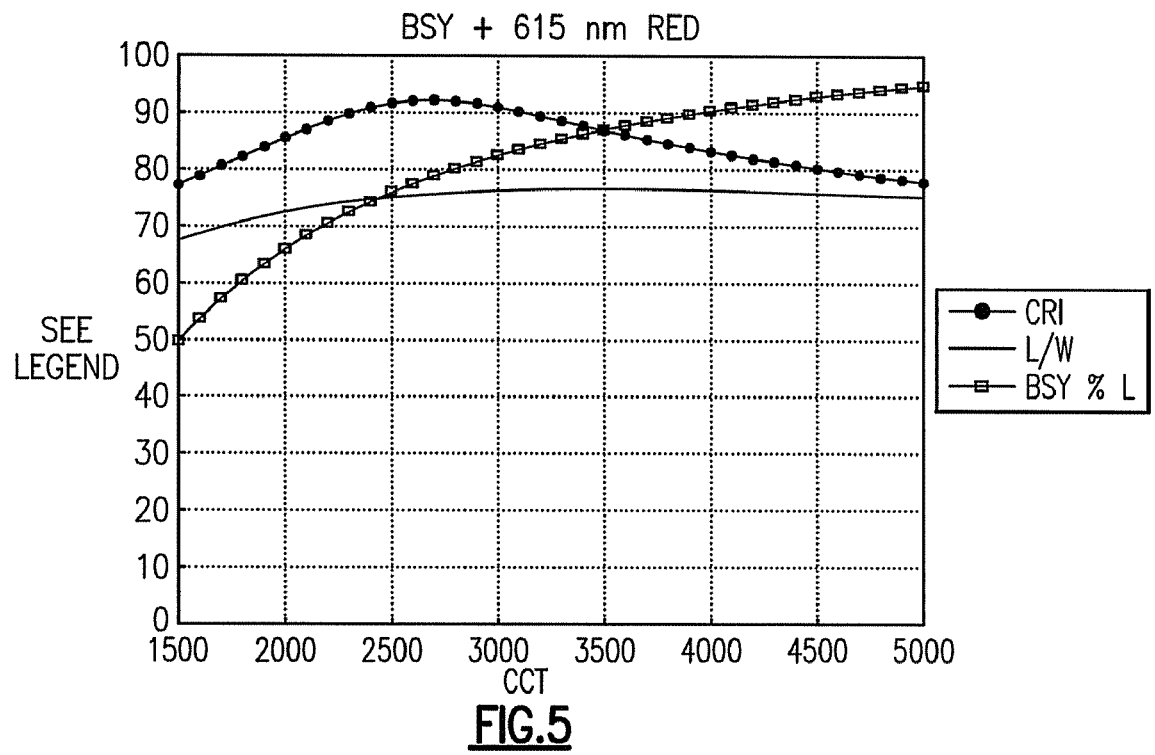
FIG. 5 is a graph of CRI Ra and efficacy versus correlated color temperature for a particular combination of non-white LED and red/orange LED system.
Figure 6:
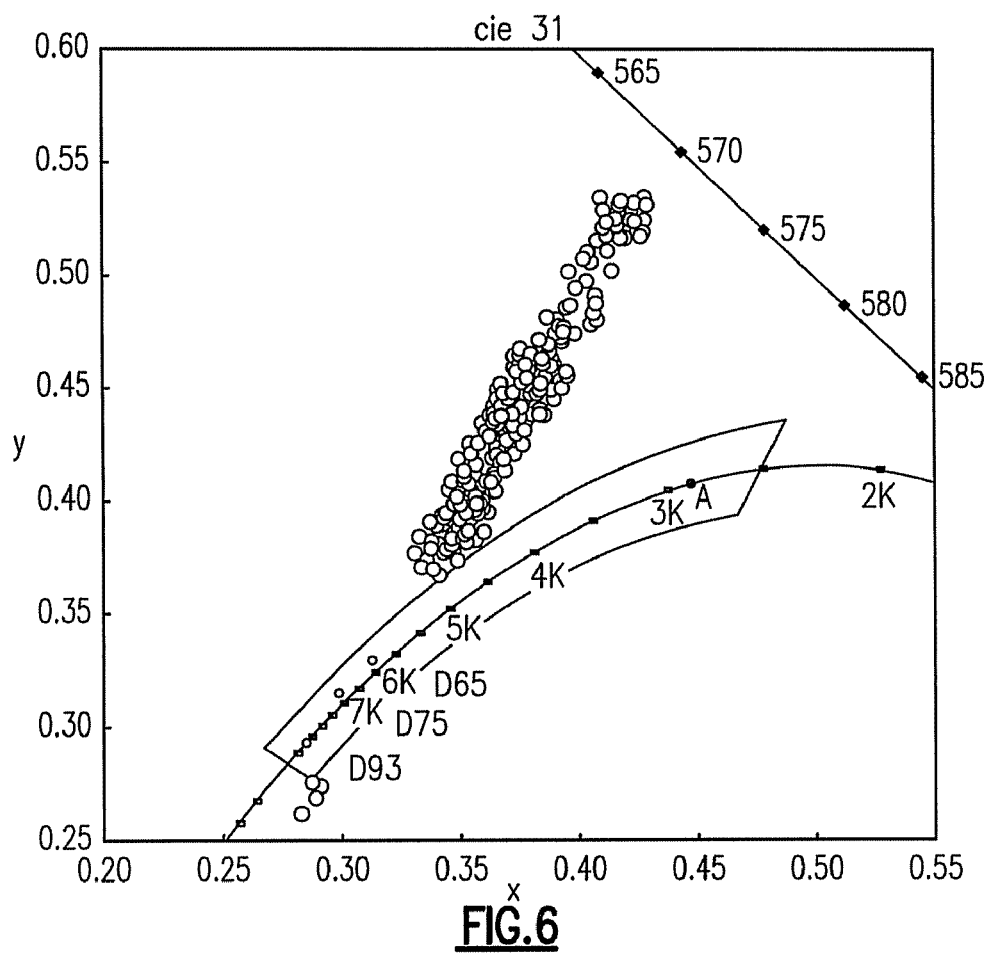
FIG. 6 is a CIE diagram with exemplary color points suitable for use in some embodiments of the present inventive subject matter.
Figure 7:
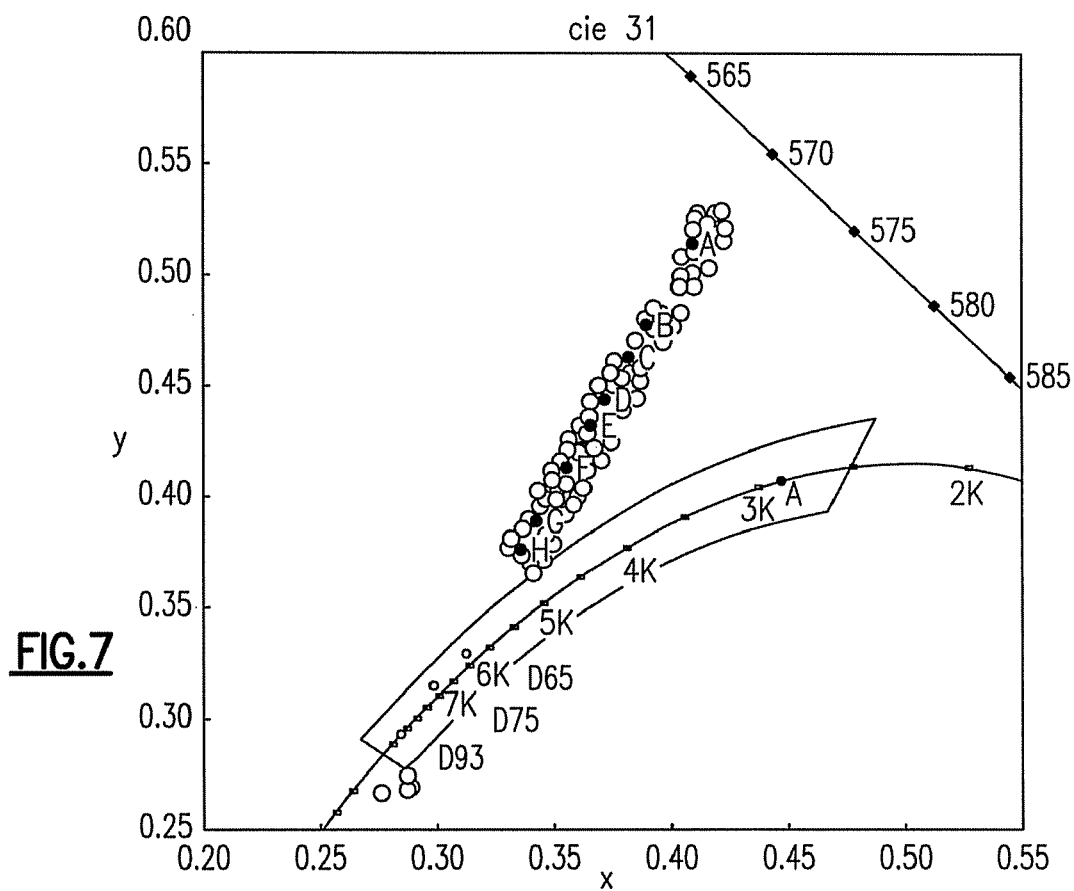
FIG. 7 is CIE diagram illustrating specific possible color points for generating white light from 2700K to 6500K.
Figure 8:
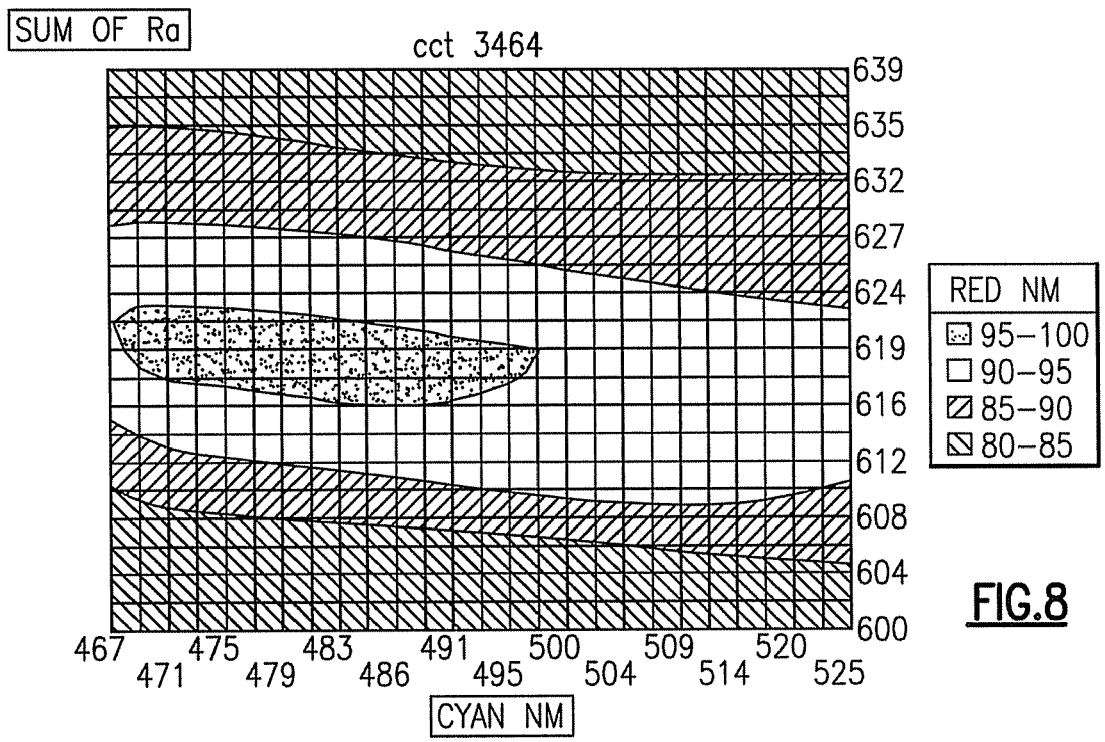
FIG. 8 is an area graph showing combinations for a high CRI DOE 3,500 K SSL white light using a non-white phosphor and two supplementary LEDs.
Figure 9:
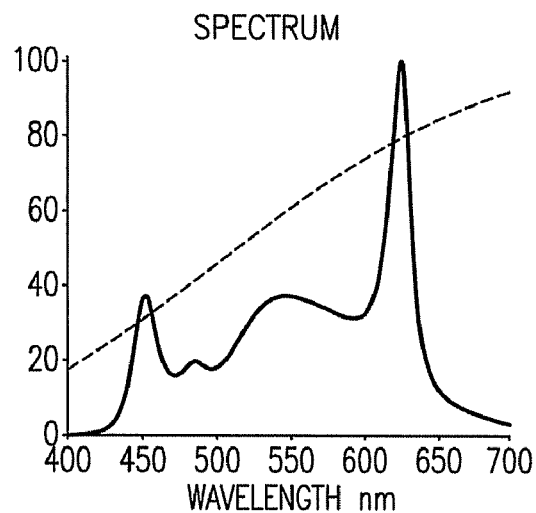
FIG. 9 is an exemplary spectrum of an SSL incorporating some embodiments of the present inventive subject matter.
Figure 10:
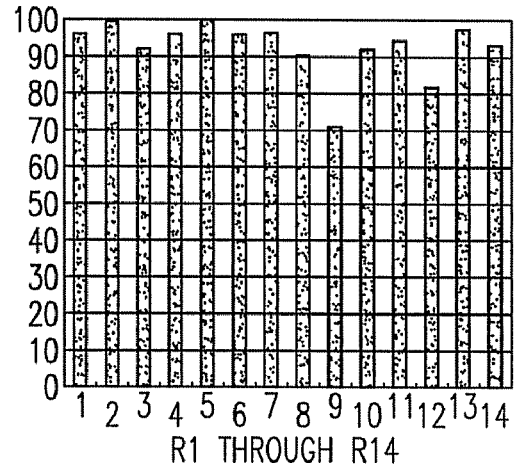
FIG. 10 is a chart of CRI Ra components of an SSL incorporating some embodiments of the present inventive subject matter.
Figure 11:
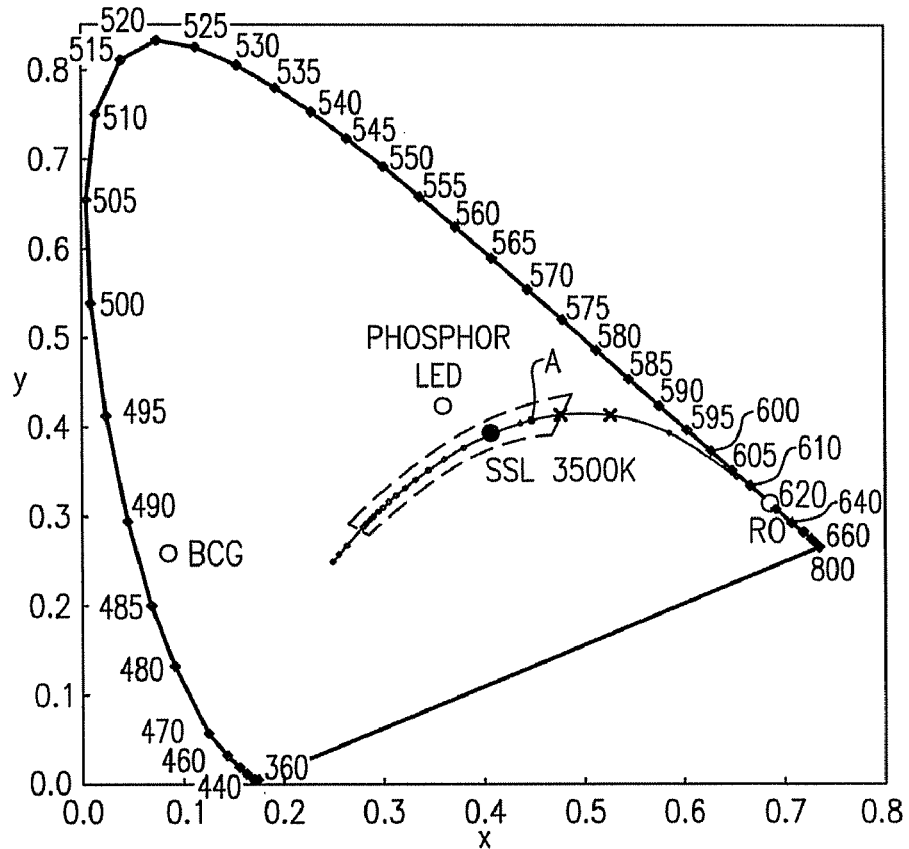
FIG. 11 is a CIE diagram of component and combined color points for an exemplary SSL incorporating some embodiments of the present inventive subject matter.

The present inventors, van de Ven and Negley, have disclosed lighting devices comprising a phosphor LED, generally with a yellowish hue, combined with a red LED, which achieves improved CRI and efficacy of the mixed light (see, (1) e.g., U.S. Patent Application No. 60/793,524, filed on Apr. 20, 2006, entitled "LIGHTING DEVICE AND LIGHTING METHOD" (inventors: Gerald H. Negley and Antony Paul van de Ven) and U.S. patent application Ser. No. 11/736,761, filed Apr. 18, 2007 (now U.S. Patent Publication No. 2007/0278934), the entireties of which are hereby incorporated by reference; (2) U.S. Patent Application No. 60/793,518, filed on Apr. 20, 2006, entitled "LIGHTING DEVICE AND LIGHTING METHOD" (inventors: Gerald H. Negley and Antony Paul van de Ven) and U.S. patent application Ser. No. 11/736,799, filed Apr. 18, 2007 (now U.S. Patent Publication No. 2007/0267983), the entireties of which are hereby incorporated by reference; (3) U.S. Patent Application No. 60/793,530, filed on Apr. 20, 2006, entitled "LIGHTING DEVICE AND LIGHTING METHOD" (inventors: Gerald H. Negley and Antony Paul van de Ven) and U.S. patent application Ser. No. 11/737,321, filed Apr. 19, 2007 (now U.S. Patent Publication No. 2007/0278503), the entireties of which are hereby incorporated by reference; (4) U.S. Patent Application No. 60/857,305, filed on Nov. 7, 2006, entitled "LIGHTING DEVICE AND LIGHTING METHOD" (inventors: Antony Paul van de Ven and Gerald H. Negley; and U.S. patent application Ser. No. 11/936,163, filed Nov. 7, 2007 (now U.S. Patent Publication No. 2008/0106895), the entireties of which are hereby incorporated by reference; (5) U.S. Pat. No. 7,213,940, issued on May 8, 2007, entitled "LIGHTING DEVICE AND LIGHTING METHOD" (inventors: Antony Paul van de Ven and Gerald H. Negley), the entirety of which is hereby incorporated by reference, U.S. Patent Application No. 60/868,134, filed on Dec. 1, 2006, entitled "LIGHTING DEVICE AND LIGHTING METHOD" (inventors: Antony Paul van de Ven and Gerald H. Negley), the entirety of which is hereby incorporated by reference, U.S. patent application Ser. No. 11/948,021, filed on Nov. 30, 2007 (now U.S. Patent Publication No. 2008/0130285), entitled "LIGHTING DEVICE AND LIGHTING METHOD" (inventors: Antony Paul van de Ven and Gerald H. Negley), the entirety of which is hereby incorporated by reference; and (6) U.S. Patent Application No. 60/868,986, filed on Dec. 7, 2006, entitled "LIGHTING DEVICE AND LIGHTING METHOD" (inventors: Antony Paul van de Ven and Gerald H. Negley), and U.S. patent application Ser. No. 11/951,626, filed Dec. 6, 2007 (now U.S. Patent Publication No. 2008/0136313), the entireties of which are hereby incorporated by reference). These lighting devices can achieve CRI Ra greater than 90 for color temperatures below 3,500 K and very good efficacy. The CIE31 diagram in FIG. 4 illustrates how a non-white phosphor LED when selected with appropriate coordinates can be mixed with a red LED to produce light that is on or close to the Planckian blackbody locus. FIG. 5 shows the efficacy and high CRI Ra achievable with such arrangements. Such devices are especially effective for providing high CRI Ra for color temperatures of 3,500 K and lower, without the need for additional components.

The lighting devices of the present inventive subject matter can be supplied with electricity in any desired manner. Skilled artisans are familiar with a wide variety of power supplying apparatuses, and any such apparatuses can be employed in connection with the present inventive subject matter. The lighting devices of the present inventive subject matter can be electrically connected (or selectively connected) to any desired power source, persons of skill in the art being familiar with a variety of such power sources.

Representative examples of circuitry which may be used in practicing the present inventive subject matter are described in:

U.S. Patent Application No. 60/752,753, filed on Dec. 21, 2005, entitled "LIGHTING DEVICE" (inventors: Gerald H. Negley, Antony Paul van de Ven and Neal Hunter) and U.S. patent application Ser. No. 11/613,692, filed Dec. 20, 2006 (now U.S. Patent Publication No. 2007/0139923), the entireties of which are hereby incorporated by reference;

U.S. Patent Application No. 60/809,959, filed on Jun. 1, 2006, entitled "LIGHTING DEVICE WITH COOLING" (inventors: Thomas G. Coleman, Gerald H. Negley and Antony Paul van de Ven) and U.S. patent application Ser. No. 11/626,483, filed Jan. 24, 2007 (now U.S. Patent Publication No. 2007/0171145), the entireties of which are hereby incorporated by reference;

U.S. Patent Application No. 60/798,446, filed on May 5, 2006, entitled "LIGHTING DEVICE" (inventor: Antony Paul van de Ven) and U.S. patent application Ser. No. 11/743,754, filed May 3, 2007 (now U.S. Patent Publication No. 2007/0263393), the entireties of which are hereby incorporated by reference;

U.S. Patent Application No. 60/809,595, filed on May 31, 2006, entitled "LIGHTING DEVICE AND METHOD OF LIGHTING" (inventor: Gerald H. Negley) and U.S. patent application Ser. No. 11/755,162, filed May 30, 2007 (now U.S. Patent Publication No. 2007/0279440), the entireties of which are hereby incorporated by reference;

U.S. Patent Application No. 60/844,325, filed on Sep. 13, 2006, entitled "BOOST/FLYBACK POWER SUPPLY TOPOLOGY WITH LOW SIDE MOSFET CURRENT CONTROL" (inventor: Peter Jay Myers), and U.S. patent application Ser. No. 11/854,744, filed Sep. 13, 2007 (now U.S. Patent Publication No. 2008/0088248), entitled "CIRCUITRY FOR SUPPLYING ELECTRICAL POWER TO LOADS", the entireties of which are hereby incorporated by reference;

U.S. Patent Application No. 60/943,910, filed on Jun. 14, 2007, entitled "DEVICES AND METHODS FOR POWER CONVERSION FOR LIGHTING DEVICES WHICH INCLUDE SOLID STATE LIGHT EMITTERS" (inventor: Peter Jay Myers), and U.S. patent application Ser. No. 12/117,280, filed May 8, 2008 (now U.S. Patent Publication No. 2008/0309255), the entireties of which are hereby incorporated by reference;

U.S. Patent Application No. 61/022,886, filed on Jan. 23, 2008, entitled "FREQUENCY CONVERTED DIMMING SIGNAL GENERATION" (inventors: Peter Jay Myers, Michael Harris and Terry Given) and U.S. Patent Application No. 61/039,926, filed Mar. 27, 2008, the entireties of which are hereby incorporated by reference.

With regard to mixed light output from the lighting devices according to the present inventive subject matter, the present inventive subject matter is further directed to such mixed light in the proximity of light on the blackbody locus having color temperature of 2700 K, 3000 K or 3500 K, namely: mixed light having x, y color coordinates which are within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.4578, 0.4101, the second point having x, y coordinates of 0.4813, 0.4319, the third point having x, y coordinates of 0.4562, 0.4260, the fourth point having x, y coordinates of 0.4373, 0.3893, and the fifth point having x, y coordinates of 0.4593, 0.3944 (i.e., proximate to 2700 K); or mixed light having x, y color coordinates which are within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.4338, 0.4030, the second point having x, y coordinates of 0.4562, 0.4260, the third point having x, y coordinates of 0.4299, 0.4165, the fourth point having x, y coordinates of 0.4147, 0.3814, and the fifth point having x, y coordinates of 0.4373, 0.3893 (i.e., proximate to 3000 K); or mixed light having x, y color coordinates which are within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.4073, 0.3930, the second point having x, y coordinates of 0.4299, 0.4165, the third point having x, y coordinates of 0.3996, 0.4015, the fourth point having x, y coordinates of 0.3889, 0.3690, and the fifth point having x, y coordinates of 0.4147, 0.3814 (i.e., proximate to 3500 K).

The present inventive subject matter is further directed to an illuminated enclosure, comprising an enclosed space and at least one lighting device as described herein, wherein the lighting device illuminates at least a portion of the enclosure.

The present inventive subject matter is further directed to an illuminated surface, comprising a surface and at least one lighting device as described herein, wherein if the lighting device is illuminated, the lighting device would illuminate at least a portion of the surface.

The present inventive subject matter is further directed to methods which comprise making lighting devices in accordance with the present inventive subject matter.

Embodiments in accordance with the present inventive subject matter are described herein with reference to cross-sectional (and/or plan view) illustrations that are schematic illustrations of idealized embodiments of the present inventive subject matter. As such, variations from the shapes of the illustrations as a result, for example, of manufacturing techniques and/or tolerances, are to be expected. Thus, embodiments of the present inventive subject matter should not be construed as limited to the particular shapes of regions illustrated herein but are to include deviations in shapes that result, for example, from manufacturing. For example, a molded region illustrated or described as a rectangle will, typically, have rounded or curved features. Thus, the regions illustrated in the figures are schematic in nature and their shapes are not intended to illustrate the precise shape of a region of a device and are not intended to limit the scope of the present inventive subject matter.

A number of specific embodiments of lighting devices in accordance with the present inventive subject matter are depicted in FIGS. 12-35, as discussed below.

Figure 12:
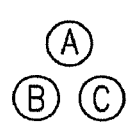
FIGS. 12 through 25 are exemplary LED arrangements incorporating embodiments of the present inventive subject matter.

FIG. 12 is a symbolic view of phosphor, RO and BCG emitters shown as separate LED packages according to an embodiment of the present inventive subject matter in a cluster format. In FIG. 12, as well as in FIGS. 13-18, "A" represents a phosphor LED, "B" represents an RO LED, and "C" represents a BCG LED.

Figure 13:
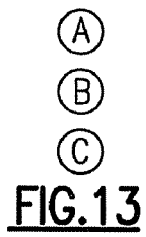

FIG. 13 is a symbolic view of phosphor, RO and BCG emitters shown as LEDs according to an embodiment of the present inventive subject matter in line format.

Figure 14:
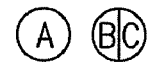

FIG. 14 is a symbolic view of RO and BCG emitters combined into single LED, and a phosphor LED as separate package according to an embodiment of the present inventive subject matter.

Figure 15:

FIG. 15 is a symbolic view of RO and phosphor LED emitters combined in a single package and BCG in a separate LED package according to an embodiment of the present inventive subject matter.

Figure 16:

FIG. 16 is a symbolic view of an RO emitter shown as an LED, with BCG and phosphor LED emitters combined in a single package according to an embodiment of the present inventive subject matter.

Figure 17:

FIG. 17 is a symbolic view of an embodiment of a lighting device according to the present inventive subject matter in which all emitters are combined in a single package. Note: multiple packages can be used in lighting devices according to the present inventive subject matter.

Figure 18:
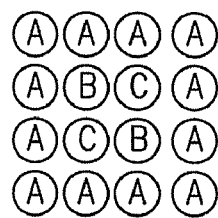

FIG. 18 is a symbolic view of multiple individually packaged emitters in an array according to an embodiment of the present inventive subject matter.

Figure 19:

FIG. 19 is a perspective view of a through-hole package LED according to an embodiment of the present inventive subject matter.

Figure 20:
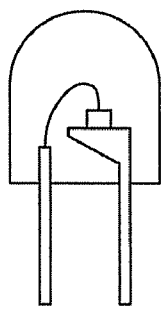

FIG. 20 is a side view of an LED without a reflector cup according to an embodiment of the present inventive subject matter.

Figure 21:
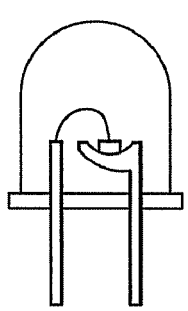

FIG. 21 is a side view of an RO/BCG LED with a reflector cup according to an embodiment of the present inventive subject matter.

Figure 22:
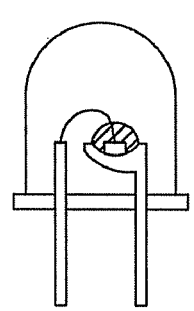

FIG. 22 is a side view of a phosphor LED with a reflector cup according to an embodiment of the present inventive subject matter.

Note that individual through hole LEDs as described in FIGS. 19 through 22 may be combined to provide a solid state luminaire according to embodiments of the present inventive subject matter. Alternatively or additionally, more than one of the LEDs may be combined in a single package of the types illustrated in FIGS. 19 through 22. Thus, for example, an RO LED and a BCG LED may be combined in a single package. The package may have two leads or, if individual control of the LEDs is desired, three or more leads.

Figure 23:
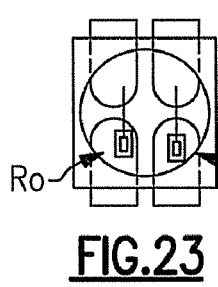

FIG. 23 is a top view of an SMD LED including RO and BCG emitters according to an embodiment of the present inventive subject matter.

Figure 24:
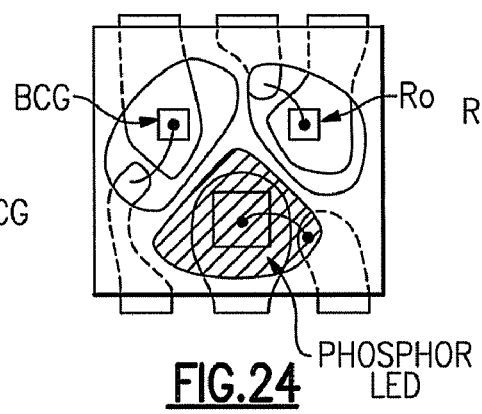

FIG. 24 is a top view of an SMD LED including phosphor LED, RO and BCG emitters in a circular arrangement according to an embodiment of the present inventive subject matter. Note: the phosphor excitation light-emitting diode can be larger than RO and BCG light-emitting-diodes to compensate for required lumens.

Figure 25:
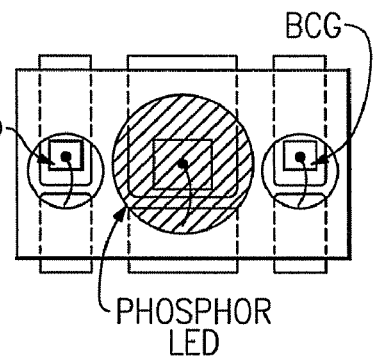

FIG. 25 is a device as depicted in FIG. 24, except that the emitters are in a linear arrangement, according to an embodiment of the present inventive subject matter.

Figure 26:
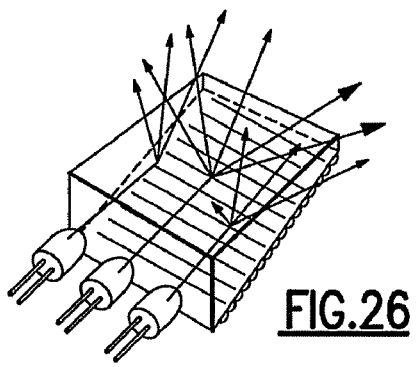
FIGS. 26 through 31 are exemplary luminaires incorporating some embodiments of the present inventive subject matter.

FIG. 26 is a perspective view of a tapered mixing device according to an embodiment of the present inventive subject matter, in which light mixes in a tapered sheet or cavity.

Figure 27:
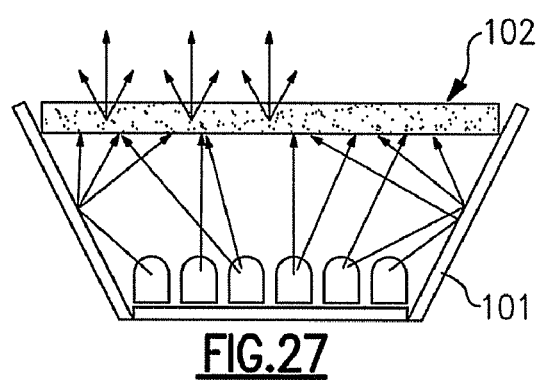

FIG. 27 is a side view of a cavity mixing chamber with light internally reflected off high reflective specular or diffuse Lambertian type material 101 (e.g. MCPET®, marketed by Furukawa, a Japanese corporation) and a diffuser 102, according to an embodiment of the present inventive subject matter. The diffuser 102 may, for example, be a single element or multiple elements. For example, the diffuser 102 may be a film or a pattern molded into a lens. Suitable diffuser materials may be provided, for example, by Bayer, RPC Photonics, Luminit, Fusion Optix, 3M and/or Bright View Technologies.

Figure 28:
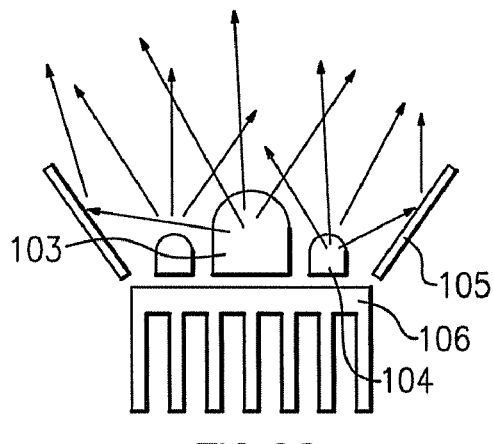

FIG. 28 is a side view of a lighting device according to an embodiment of the present inventive subject matter, showing large LEDs 103 and small LEDs 104 in a reflector 105 and mounted on a heat sink 106.

Figure 29:
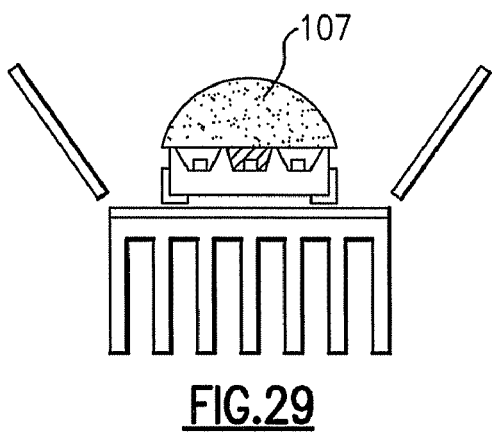

FIG. 29 is a side view of an embodiment of a lighting device according to the present inventive subject matter, using an SMD LED (per FIG. 24 and FIG. 25) with a secondary lens/diffuser 107.

Figure 30:
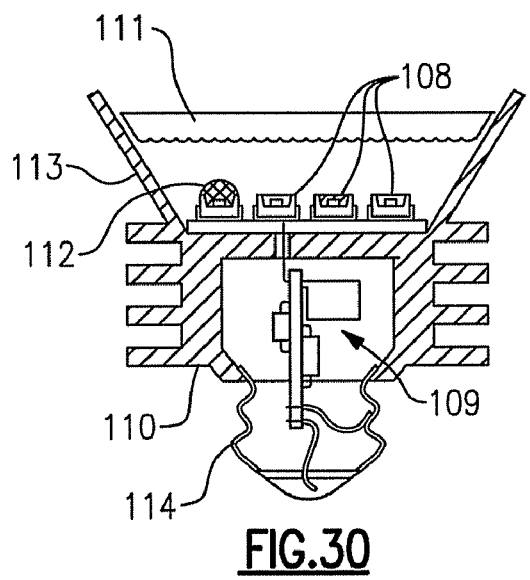

FIG. 30 is a cutaway side view of an embodiment of a lighting device provided as a self ballasted lamp according to the present inventive subject matter, including LEDs 108, a power supply unit (PSU) and controller 109, a heat sink 110, a textured diffuser 111, a light/color sensor 112, a reflector 113 and a power connector 114. Such a self-ballasted lamp may be provided by incorporating the combination of light emitters described herein in the self-ballasted lamps as described in U.S. Patent Application No. 60/861,824, filed on Nov. 30, 2006 entitled "SELF-BALLASTED SOLID STATE LIGHTING DEVICES" (inventors: Gerald H. Negley, Antony Paul van de Ven, Wai Kwan Chan, Paul Kenneth Pickard and Peter Jay Myers), U.S. Patent Application No. 60/916,664, filed May 8, 2007, and U.S. patent application Ser. No. 11/947,392, filed on Nov. 29, 2007 (now U.S. Patent Publication No. 2008/0130298), the entireties of which are hereby incorporated by reference.

Figure 31:
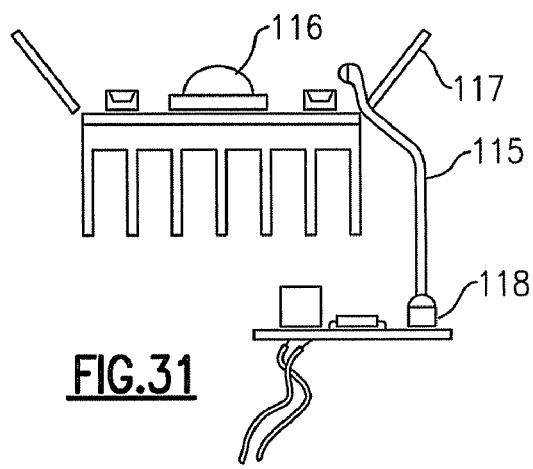

FIG. 31 is a side view of an embodiment of a lighting device according to the present inventive subject matter with an optical link (fiber optic device or light guide device 115) between an optical cavity (including a large phosphor LED 116 and a reflector 117) and a sensor 118 (connected to a power supply unit and controller) mounted not within the cavity.

Figure 32:
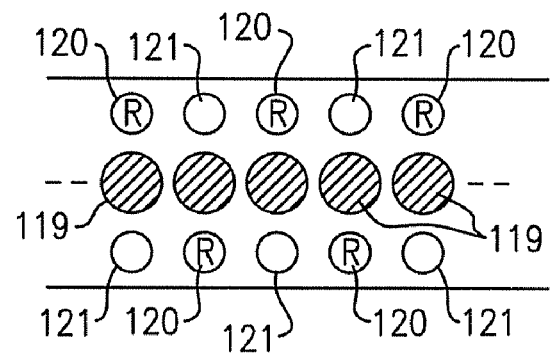
FIG. 32 is a schematic diagram of a luminaire incorporating some embodiments of the present inventive subject matter.

FIG. 32 is a top view of an embodiment of a lighting device according to the present inventive subject matter, including LEDs (phosphor LEDs 119, RO LEDs 120 and BCG LEDs 121) arranged in a linear format.

Figure 33:
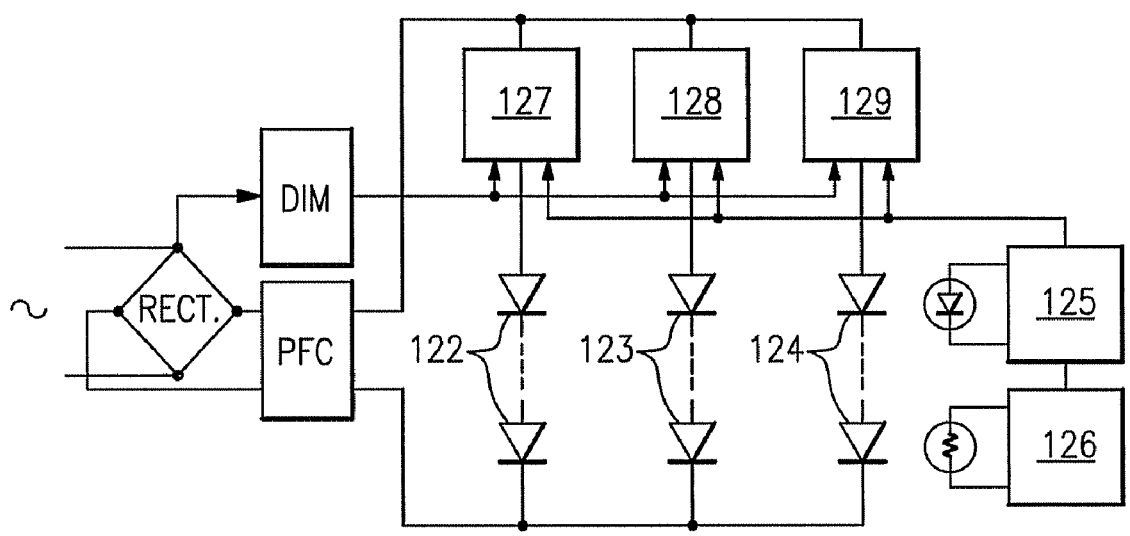
FIG. 33 is a diagram of a linear arrangement of LEDs incorporating some embodiments of the present inventive subject matter.

FIG. 33 is a schematic block diagram of an electrical and control circuit of an embodiment of a lighting device according to the present inventive subject matter. In the circuit illustrated in FIG. 33, the phosphor LEDs 122, the RO LEDs 123 and the BCG LEDs 124 may be controlled so as to control the combined color produced by the LEDs to be on or near the BBL. While the individual strings of LEDs (the expression "string", as used herein, means that at least two light sources are electrically connected in series) illustrated in FIG. 33 may be separately controlled, they may also be dependently controlled. Thus, for example, the color temperature of the lighting device may be established at the time of manufacture as described in U.S. Patent Application No. 60/990,724, filed on Nov. 28, 2007, entitled "SOLID STATE LIGHTING DEVICES AND METHODS OF MANUFACTURING THE SAME" (inventors: Gerald H. Negley, Antony Paul van de Ven, Kenneth R. Byrd and Peter Jay Myers) and U.S. Patent Application No. 61/041,404, filed on Apr. 1, 2008, the entireties of which are hereby incorporated by reference. The circuit also includes a rectifier ("RECT"), a dimmer ("DIM") and a power factor controller ("PFC").

As is further illustrated in FIG. 33, the color temperature may be maintained by, for example, the light sensor 125 and/or the temperature sensor 126 providing information to the regulated power supply units (the LED PSU 127, the RO LED PSU 128 and the BCG LED PSU 129) so as to adjust the current/voltage applied to the LEDs (the LED PSU 127 adjusts the current/voltage supplied to the phosphor LEDs 122, the LED PSU 128 adjusts the current/voltage supplied to the RO LEDs 123 and the LED PSU 129 adjusts the current/voltage supplied to the BCG LEDs 124), to maintain or otherwise control a color point of the lighting device. Such sensing may compensate for variations in aging of the differing LEDs and/or variation in temperature response of the differing LEDs. Suitable sensing techniques are known to those of skill in the art and described in U.S. Patent Application No. 60/943,910, filed on Jun. 14, 2007, entitled "DEVICES AND METHODS FOR POWER CONVERSION FOR LIGHTING DEVICES WHICH INCLUDE SOLID STATE LIGHT EMITTERS" (inventor: Peter Jay Myers), and U.S. patent application Ser. No. 12/117,280, filed May 8, 2008 (now U.S. Patent Publication No. 2008/0309255), the entireties of which are hereby incorporated by reference.

Figure 34:
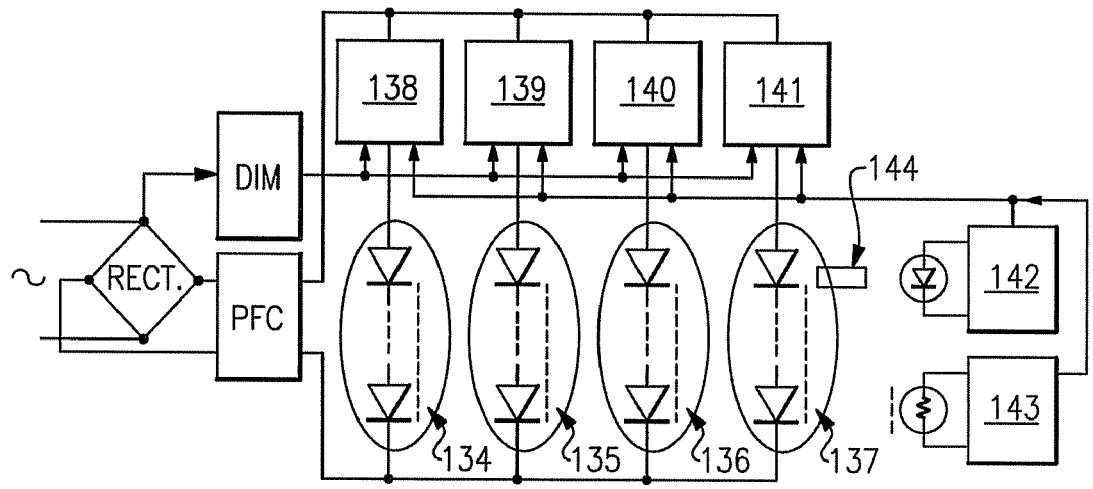
FIG. 34 is a schematic diagram of a luminaire incorporating further embodiments of the present inventive subject matter.

FIG. 34 is a schematic block diagram of the circuit of an embodiment of a lighting device according to the present inventive subject matter, similar to the embodiment shown in FIG. 33, but incorporating two types of phosphor LEDs (namely, more yellowish phosphor LEDs 134 and more blueish phosphor LEDs 135), along with RO LEDs 136 and BCG LEDs 137, which makes it possible to adjust the color temperature and maintain high CRI. Each string of LEDs 134-137 has a corresponding PSU 138-141. Such an embodiment may be particularly well suited for use with the manufacturing methods discussed above with respect to U.S. Patent Application Ser. Nos. 60/990,724 and 61/041,404. The more blueish phosphor LEDs and the more yellowish phosphor LEDs are used to precisely match the required phosphor LED color point. The embodiment shown in FIG. 34 also includes a light sensor 142 and a temperature sensor 143. Optionally, the embodiment shown in FIG. 34 can include an optical fiber or guide 144 for getting light from the LEDs to the light sensor 136.

Figure 35:
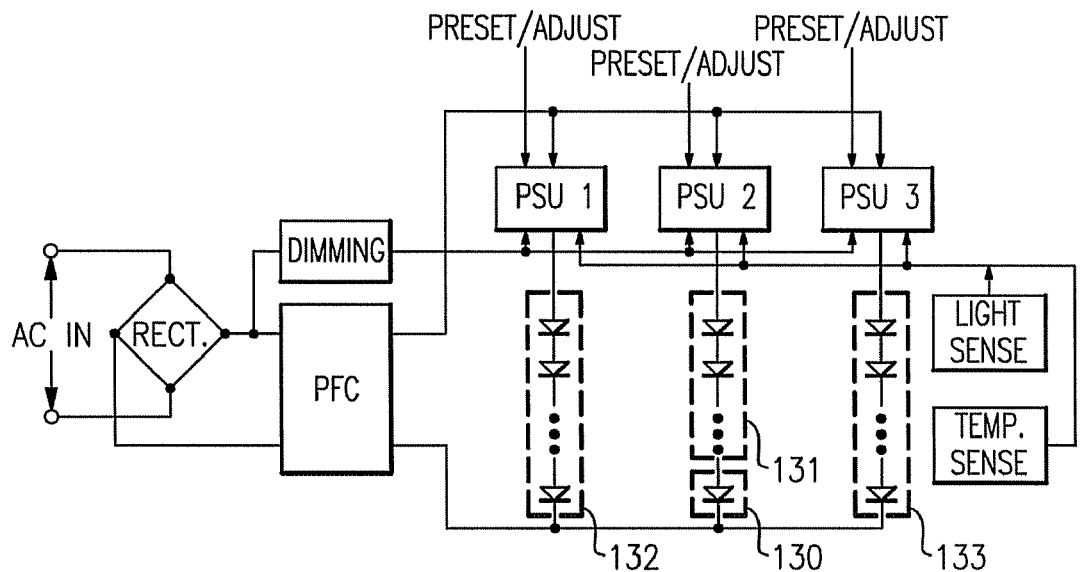
FIG. 35 is a schematic diagram of a luminaire combining a blue/cyan/green LED in a same string as a non-white phosphor LED according to further embodiments of the present inventive subject matter.

FIG. 35 is a schematic block diagram of a circuit for a lighting device incorporating some embodiments of the present inventive subject matter. As seen in FIG. 35, BCG LED(s) 130 may be included in a same string as one or more phosphor LEDs 131. In particular, two slightly different hue phosphor converted LEDs may be provided in separate strings, namely, more blueish phosphor LEDs 131 and more yellowish phosphor LEDs 132. The drive current through the two strings may be adjusted to set the overall color of the lighting device. The current through the two strings may be adjusted to move along a tie line between the color points of more yellowish phosphor LEDs and more blueish phosphor LEDs. The current through the RO LEDs may be adjusted to pull the combined color point of the phosphor LEDs to the proximity of the BBL.

In the embodiment illustrated in FIG. 35, the BCG LED(s) 130 may be added in series with or replace one or more of the phosphor converted LEDs 131 (and/or 132). Including the BCG LED(s) in a same string as the phosphor LEDs may simplify the power supply design, as only three drive units are needed. Accordingly, the methods of manufacture described in U.S. Provisional Application Ser. No. 60/990,724 may be used with little or no modification.

In particular embodiments, the BCG LED(s) 130 replace one of the more blueish phosphor LEDs 131. Such a replacement of a blueish phosphor LED 131 may allow the same combination of color points of phosphor LEDs to be used to make 2700K lighting devices as makes 3500K lighting devices and the devices may all have a CRI Ra of 92 or greater and, in some cases 94 or greater.

For example, the phosphor LEDs may be selected from a first color bin having chromaticity region bounding coordinates of a CIE31 Chromaticity diagram of 0.3640, 0.4629; 0.3953, 0.4487; 0.3892, 0.438; and 0.3577, 0.4508 and a second color bin having chromaticity region bounding coordinates of a CIE31 Chromaticity diagram of 0.3577, 0.4508; 0.3892, 0.4380; 0.3845, 0.4296; and 0.3528, 0.4414. A first string of phosphor LEDs is provided from the first color bin and a second string of phosphor LEDs is provided from the second color bin. The second string has one fewer phosphor LEDs but an additional BCG LED with a dominant wavelength in the range of from about 475 nm to about 480 nm. Alternatively, the BCG LED could replace one of the phosphor LEDs from the first string. A third string of RO LEDs 133 with a dominant wavelength in the range of from about 615 nm to about 625 nm is also provided. Such a configuration may allow for controlling the current through the various LEDs so as to provide a lighting device with a color temperature of from about 2500K to about 4000K (in many cases from about 2700K to about 3500K) with a CRI Ra of greater than 92 and, in some cases, greater than 94. Furthermore, the color point of the lighting device may be within 7 MacAdam ellipses of the BBL and, in some embodiments, within 4 MacAdam ellipses of the BBL.

In some embodiments, other phosphor LED color bins which provide a tie line that passes through the two regions described above may be used.

In other embodiments where multiple BCG LED(s) are used, the BCG LEDs may replace an LED from each of the phosphor LED strings. Thus, a phosphor converted LED could be replaced by a BCG in each of the two phosphor LED strings. One example of such an embodiment may produce a lighting device having a color temperature of about 4000K and a CRI Ra of 92 or greater. In particular, the phosphor LEDs may be selected from a first color bin having chromaticity region bounding coordinates of a CIE31 Chromaticity diagram of 0.3426, 0.4219; 0.3747, 0.4122; 0.3696, 0.4031; and 0.3373, 0.4118 and a second color bin having chromaticity region bounding coordinates of a CIE31 Chromaticity diagram of 0.3373, 0.4118; 0.3696, 0.4031; 0.3643, 0.3937; and 0.3318, 0.4013. A first string of phosphor LEDs is provided from the first color bin and a second string of phosphor LEDs is provided from the second color bin. Each string has one BCG LED with a dominant wavelength in the range of from about 475 nm to about 480 nm. A third string of RO LEDs with a dominant wavelength in the range of from about 615 nm to about 625 nm is also provided.

Table 2 shows the data points for color temperatures (in 100 K steps) between 2,500 K and 6,500 K, and RO and BCG combination in approximately 5 nm steps, with the optimum phosphor lamp CIE31 x-y coordinates to achieve the highest CRI.

TABLE 2

| Tar CCT | tar x | tar y | RO % L | RO nm | PL % L | PL-CCT | BCG % L | BCG nm | L/W | Ra | R8 |
|---|---|---|---|---|---|---|---|---|---|---|---|
| 6500 | 0.3135 | 0.3237 | 4% | 611 | 89.4% | 4131 | 6.3% | 467 | 46 | 81 | 66 |
| 6500 | 0.3135 | 0.3237 | 4% | 616 | 89.8% | 4131 | 6.3% | 467 | 46 | 83 | 72 |
| 6500 | 0.3135 | 0.3237 | 4% | 620 | 90.1% | 4131 | 6.3% | 467 | 45 | 84 | 76 |
| 6500 | 0.3135 | 0.3237 | 3% | 626 | 90.3% | 4131 | 6.3% | 467 | 45 | 85 | 81 |
| 6500 | 0.3135 | 0.3237 | 3% | 631 | 90.5% | 4131 | 6.3% | 467 | 45 | 86 | 85 |
| 6500 | 0.3135 | 0.3237 | 3% | 635 | 90.6% | 4131 | 6.3% | 467 | 44 | 87 | 88 |
| 6500 | 0.3135 | 0.3237 | 3% | 640 | 90.7% | 4131 | 6.3% | 467 | 44 | 87 | 91 |
| 6500 | 0.3135 | 0.3237 | 6% | 611 | 85.4% | 4280 | 8.3% | 471 | 49 | 85 | 68 |
| 6500 | 0.3135 | 0.3237 | 6% | 616 | 86.1% | 4288 | 8.2% | 471 | 49 | 87 | 76 |
| 6500 | 0.3135 | 0.3237 | 5% | 620 | 86.5% | 4282 | 8.2% | 471 | 49 | 89 | 82 |
| 6500 | 0.3135 | 0.3237 | 5% | 626 | 86.7% | 4268 | 8.3% | 471 | 48 | 90 | 88 |
| 6500 | 0.3135 | 0.3237 | 5% | 631 | 87.2% | 4288 | 8.2% | 471 | 48 | 91 | 91 |
| 6500 | 0.3135 | 0.3237 | 4% | 635 | 87.6% | 4331 | 8.0% | 471 | 48 | 92 | 92 |
| 6500 | 0.3135 | 0.3237 | 4% | 640 | 88.0% | 4357 | 7.8% | 471 | 47 | 92 | 92 |
| 6500 | 0.3135 | 0.3237 | 7% | 611 | 85.8% | 5079 | 7.6% | 476 | 58 | 86 | 69 |
| 6500 | 0.3135 | 0.3237 | 6% | 616 | 86.5% | 5071 | 7.6% | 476 | 57 | 88 | 77 |
| 6500 | 0.3135 | 0.3237 | 6% | 620 | 86.8% | 5045 | 7.7% | 476 | 56 | 90 | 84 |
| 6500 | 0.3135 | 0.3237 | 5% | 626 | 87.0% | 5030 | 7.7% | 476 | 56 | 91 | 90 |
| 6500 | 0.3135 | 0.3237 | 5% | 631 | 87.6% | 5058 | 7.5% | 476 | 55 | 92 | 93 |
| 6500 | 0.3135 | 0.3237 | 5% | 635 | 88.2% | 5107 | 7.3% | 476 | 55 | 93 | 93 |
| 6500 | 0.3135 | 0.3237 | 4% | 640 | 88.5% | 5129 | 7.1% | 476 | 54 | 93 | 92 |

TABLE 2-continued

| | | | | | | | | | | |
|---|---|---|---|---|---|---|---|---|---|---|
| 6500 | 0.3135 | 0.3237 | 7% | 611 | 85.4% | 5640 | 7.7% | 480 | 60 | 87 | 70 |
| 6500 | 0.3135 | 0.3237 | 6% | 616 | 86.0% | 5606 | 7.8% | 480 | 59 | 89 | 79 |
| 6500 | 0.3135 | 0.3237 | 6% | 620 | 86.2% | 5578 | 7.9% | 480 | 59 | 91 | 86 |
| 6500 | 0.3135 | 0.3237 | 5% | 626 | 86.7% | 5571 | 7.9% | 480 | 58 | 93 | 92 |
| 6500 | 0.3135 | 0.3237 | 5% | 631 | 87.4% | 5604 | 7.6% | 480 | 57 | 94 | 94 |
| 6500 | 0.3135 | 0.3237 | 5% | 635 | 88.0% | 5645 | 7.2% | 480 | 57 | 94 | 94 |
| 6500 | 0.3135 | 0.3237 | 4% | 640 | 88.4% | 5658 | 7.1% | 480 | 55 | 94 | 91 |
| 6500 | 0.3135 | 0.3237 | 7% | 611 | 84.0% | 6226 | 8.5% | 486 | 61 | 89 | 72 |
| 6500 | 0.3135 | 0.3237 | 7% | 616 | 84.6% | 6180 | 8.6% | 486 | 61 | 91 | 82 |
| 6500 | 0.3135 | 0.3237 | 6% | 620 | 85.0% | 6159 | 8.6% | 486 | 60 | 93 | 89 |
| 6500 | 0.3135 | 0.3237 | 6% | 626 | 85.8% | 6155 | 8.4% | 486 | 59 | 95 | 95 |
| 6500 | 0.3135 | 0.3237 | 5% | 631 | 86.8% | 6180 | 7.9% | 486 | 59 | 95 | 95 |
| 6500 | 0.3135 | 0.3237 | 5% | 635 | 87.4% | 6192 | 7.7% | 486 | 58 | 95 | 92 |
| 6500 | 0.3135 | 0.3237 | 5% | 640 | 87.7% | 6190 | 7.6% | 486 | 57 | 94 | 88 |
| 6500 | 0.3135 | 0.3237 | 8% | 611 | 81.8% | 6792 | 9.9% | 491 | 62 | 91 | 75 |
| 6500 | 0.3135 | 0.3237 | 7% | 616 | 82.7% | 6737 | 9.8% | 491 | 62 | 94 | 85 |
| 6500 | 0.3135 | 0.3237 | 7% | 620 | 83.5% | 6705 | 9.7% | 491 | 61 | 96 | 93 |
| 6500 | 0.3135 | 0.3237 | 6% | 626 | 84.8% | 6686 | 9.1% | 491 | 61 | 97 | 97 |
| 6500 | 0.3135 | 0.3237 | 6% | 631 | 85.8% | 6674 | 8.7% | 491 | 60 | 96 | 93 |
| 6500 | 0.3135 | 0.3237 | 5% | 635 | 86.1% | 6662 | 8.6% | 491 | 59 | 95 | 88 |
| 6500 | 0.3135 | 0.3237 | 5% | 640 | 86.4% | 6652 | 8.5% | 491 | 57 | 95 | 84 |
| 6500 | 0.3135 | 0.3237 | 9% | 611 | 79.4% | 7300 | 11.4% | 496 | 63 | 93 | 77 |
| 6500 | 0.3135 | 0.3237 | 8% | 616 | 80.9% | 7203 | 11.1% | 496 | 63 | 96 | 88 |
| 6500 | 0.3135 | 0.3237 | 7% | 620 | 81.9% | 7147 | 10.8% | 496 | 62 | 97 | 96 |
| 6500 | 0.3135 | 0.3237 | 6% | 626 | 83.6% | 7081 | 10.0% | 496 | 62 | 97 | 96 |
| 6500 | 0.3135 | 0.3237 | 6% | 631 | 84.4% | 7046 | 9.7% | 496 | 61 | 96 | 89 |
| 6500 | 0.3135 | 0.3237 | 6% | 635 | 85.1% | 7020 | 9.3% | 496 | 60 | 95 | 86 |
| 6500 | 0.3135 | 0.3237 | 5% | 640 | 85.8% | 6997 | 9.0% | 496 | 58 | 94 | 82 |
| 6500 | 0.3135 | 0.3237 | 10% | 611 | 76.5% | 7975 | 13.5% | 502 | 64 | 95 | 80 |
| 6500 | 0.3135 | 0.3237 | 9% | 616 | 78.7% | 7772 | 12.7% | 502 | 64 | 97 | 92 |
| 6500 | 0.3135 | 0.3237 | 8% | 620 | 80.2% | 7645 | 12.1% | 502 | 63 | 97 | 99 |
| 6500 | 0.3135 | 0.3237 | 7% | 626 | 82.2% | 7509 | 11.1% | 502 | 63 | 96 | 93 |
| 6500 | 0.3135 | 0.3237 | 6% | 631 | 83.4% | 7430 | 10.5% | 502 | 62 | 94 | 87 |
| 6500 | 0.3135 | 0.3237 | 6% | 635 | 84.3% | 7377 | 10.0% | 502 | 61 | 93 | 84 |
| 6500 | 0.3135 | 0.3237 | 5% | 640 | 85.1% | 7329 | 9.6% | 502 | 59 | 92 | 80 |
| 6500 | 0.3135 | 0.3237 | 11% | 611 | 73.5% | 8750 | 15.7% | 508 | 65 | 95 | 83 |
| 6500 | 0.3135 | 0.3237 | 9% | 616 | 75.5% | 8460 | 15.1% | 508 | 65 | 96 | 96 |
| 6500 | 0.3135 | 0.3237 | 8% | 620 | 78.9% | 8077 | 13.2% | 508 | 64 | 95 | 98 |
| 6500 | 0.3135 | 0.3237 | 7% | 626 | 81.2% | 7858 | 12.0% | 508 | 64 | 93 | 91 |
| 6500 | 0.3135 | 0.3237 | 6% | 631 | 82.8% | 7720 | 11.1% | 508 | 63 | 92 | 86 |
| 6500 | 0.3135 | 0.3237 | 6% | 635 | 83.6% | 7651 | 10.7% | 508 | 62 | 91 | 83 |
| 6500 | 0.3135 | 0.3237 | 5% | 640 | 84.4% | 7591 | 10.3% | 508 | 60 | 89 | 79 |
| 6500 | 0.3135 | 0.3237 | 12% | 611 | 70.1% | 9647 | 18.2% | 514 | 66 | 94 | 85 |
| 6500 | 0.3135 | 0.3237 | 10% | 616 | 73.4% | 9027 | 16.7% | 514 | 66 | 94 | 97 |
| 6500 | 0.3135 | 0.3237 | 8% | 620 | 77.6% | 8426 | 14.3% | 514 | 65 | 93 | 96 |
| 6500 | 0.3135 | 0.3237 | 7% | 626 | 80.5% | 8097 | 12.7% | 514 | 65 | 91 | 91 |
| 6500 | 0.3135 | 0.3237 | 6% | 631 | 81.9% | 7948 | 12.0% | 514 | 64 | 90 | 85 |
| 6500 | 0.3135 | 0.3237 | 6% | 635 | 82.8% | 7861 | 11.5% | 514 | 62 | 89 | 82 |
| 6500 | 0.3135 | 0.3237 | 5% | 640 | 83.6% | 7779 | 11.0% | 514 | 60 | 88 | 78 |
| 6500 | 0.3135 | 0.3237 | 13% | 611 | 65.5% | 11306 | 21.7% | 521 | 67 | 92 | 87 |
| 6500 | 0.3135 | 0.3237 | 10% | 616 | 71.2% | 9715 | 18.7% | 521 | 67 | 92 | 96 |
| 6500 | 0.3135 | 0.3237 | 8% | 620 | 76.2% | 8811 | 15.7% | 521 | 66 | 91 | 94 |
| 6500 | 0.3135 | 0.3237 | 7% | 626 | 78.8% | 8432 | 14.2% | 521 | 66 | 89 | 89 |
| 6500 | 0.3135 | 0.3237 | 6% | 631 | 80.5% | 8229 | 13.3% | 521 | 64 | 88 | 84 |
| 6500 | 0.3135 | 0.3237 | 6% | 635 | 81.6% | 8097 | 12.6% | 521 | 63 | 87 | 80 |
| 6500 | 0.3135 | 0.3237 | 5% | 640 | 82.9% | 7960 | 11.8% | 521 | 61 | 86 | 78 |
| 6500 | 0.3135 | 0.3237 | 14% | 611 | 60.9% | 13918 | 25.4% | 527 | 68 | 90 | 89 |
| 6500 | 0.3135 | 0.3237 | 10% | 616 | 68.7% | 10520 | 20.8% | 527 | 68 | 90 | 95 |
| 6500 | 0.3135 | 0.3237 | 8% | 620 | 74.3% | 9236 | 17.3% | 527 | 67 | 89 | 93 |
| 6500 | 0.3135 | 0.3237 | 7% | 626 | 77.1% | 8772 | 15.7% | 527 | 66 | 87 | 87 |
| 6500 | 0.3135 | 0.3237 | 6% | 631 | 79.2% | 8469 | 14.5% | 527 | 65 | 86 | 83 |
| 6500 | 0.3135 | 0.3237 | 6% | 635 | 80.9% | 8252 | 13.4% | 527 | 64 | 85 | 81 |
| 6500 | 0.3135 | 0.3237 | 5% | 640 | 82.9% | 8021 | 12.0% | 527 | 62 | 84 | 80 |
| 6500 | 0.3135 | 0.3237 | 15% | 611 | 53.2% | 26345 | 31.6% | 534 | 69 | 88 | 90 |
| 6500 | 0.3135 | 0.3237 | 11% | 616 | 65.6% | 11784 | 23.7% | 534 | 69 | 88 | 93 |
| 6500 | 0.3135 | 0.3237 | 9% | 620 | 70.8% | 10113 | 20.4% | 534 | 68 | 87 | 91 |
| 6500 | 0.3135 | 0.3237 | 7% | 626 | 74.7% | 9277 | 18.0% | 534 | 67 | 85 | 86 |
| 6500 | 0.3135 | 0.3237 | 6% | 631 | 78.2% | 8677 | 15.6% | 534 | 66 | 84 | 84 |
| 6500 | 0.3135 | 0.3237 | 5% | 635 | 80.8% | 8316 | 13.8% | 534 | 65 | 83 | 84 |
| 6500 | 0.3135 | 0.3237 | 5% | 640 | 83.3% | 8023 | 12.0% | 534 | 63 | 82 | 84 |
| 6500 | 0.3135 | 0.3237 | 16% | 611 | 47.6% | 391150 | 36.9% | 540 | 71 | 85 | 87 |
| 6500 | 0.3135 | 0.3237 | 11% | 616 | 59.2% | 16070 | 29.4% | 540 | 69 | 85 | 92 |
| 6500 | 0.3135 | 0.3237 | 9% | 620 | 65.9% | 11813 | 24.8% | 540 | 69 | 84 | 89 |
| 6500 | 0.3135 | 0.3237 | 7% | 626 | 72.8% | 9729 | 20.0% | 540 | 68 | 83 | 87 |
| 6500 | 0.3135 | 0.3237 | 6% | 631 | 77.8% | 8788 | 16.4% | 540 | 67 | 82 | 87 |
| 6500 | 0.3135 | 0.3237 | 5% | 635 | 80.8% | 8361 | 14.2% | 540 | 66 | 81 | 87 |
| 6500 | 0.3135 | 0.3237 | 4% | 640 | 83.3% | 8046 | 12.3% | 540 | 64 | 81 | 87 |
| 6400 | 0.3151 | 0.3252 | 5% | 611 | 89.3% | 4131 | 6.2% | 467 | 46 | 81 | 66 |
| 6400 | 0.3151 | 0.3252 | 4% | 616 | 89.7% | 4131 | 6.2% | 467 | 46 | 83 | 72 |
| 6400 | 0.3151 | 0.3252 | 4% | 620 | 90.0% | 4131 | 6.2% | 467 | 46 | 84 | 77 |

TABLE 2-continued

| | | | | | | | | | | |
|---|---|---|---|---|---|---|---|---|---|---|
| 6400 | 0.3151 | 0.3252 | 4% | 626 | 90.3% | 4131 | 6.2% | 467 | 45 | 85 | 82 |
| 6400 | 0.3151 | 0.3252 | 3% | 631 | 90.5% | 4131 | 6.2% | 467 | 45 | 86 | 86 |
| 6400 | 0.3151 | 0.3252 | 3% | 635 | 90.6% | 4131 | 6.2% | 467 | 44 | 87 | 89 |
| 6400 | 0.3151 | 0.3252 | 3% | 640 | 90.7% | 4131 | 6.2% | 467 | 44 | 88 | 92 |
| 6400 | 0.3151 | 0.3252 | 7% | 611 | 85.3% | 4266 | 8.2% | 471 | 49 | 85 | 67 |
| 6400 | 0.3151 | 0.3252 | 6% | 616 | 86.0% | 4276 | 8.1% | 471 | 49 | 87 | 76 |
| 6400 | 0.3151 | 0.3252 | 5% | 620 | 86.4% | 4270 | 8.1% | 471 | 48 | 89 | 82 |
| 6400 | 0.3151 | 0.3252 | 5% | 626 | 86.7% | 4258 | 8.2% | 471 | 48 | 90 | 88 |
| 6400 | 0.3151 | 0.3252 | 5% | 631 | 87.2% | 4284 | 8.1% | 471 | 48 | 91 | 92 |
| 6400 | 0.3151 | 0.3252 | 5% | 635 | 87.6% | 4327 | 7.8% | 471 | 48 | 92 | 93 |
| 6400 | 0.3151 | 0.3252 | 4% | 640 | 88.0% | 4347 | 7.7% | 471 | 47 | 92 | 92 |
| 6400 | 0.3151 | 0.3252 | 7% | 611 | 85.7% | 5051 | 7.5% | 476 | 58 | 86 | 69 |
| 6400 | 0.3151 | 0.3252 | 6% | 616 | 86.4% | 5044 | 7.5% | 476 | 57 | 88 | 77 |
| 6400 | 0.3151 | 0.3252 | 6% | 620 | 86.7% | 5019 | 7.6% | 476 | 57 | 90 | 84 |
| 6400 | 0.3151 | 0.3252 | 5% | 626 | 87.0% | 5006 | 7.6% | 476 | 56 | 92 | 90 |
| 6400 | 0.3151 | 0.3252 | 5% | 631 | 87.6% | 5040 | 7.4% | 476 | 55 | 93 | 93 |
| 6400 | 0.3151 | 0.3252 | 5% | 635 | 88.2% | 5088 | 7.1% | 476 | 55 | 93 | 93 |
| 6400 | 0.3151 | 0.3252 | 4% | 640 | 88.5% | 5104 | 7.0% | 476 | 54 | 93 | 91 |
| 6400 | 0.3151 | 0.3252 | 7% | 611 | 85.3% | 5599 | 7.6% | 480 | 60 | 87 | 70 |
| 6400 | 0.3151 | 0.3252 | 6% | 616 | 85.9% | 5567 | 7.7% | 480 | 59 | 90 | 79 |
| 6400 | 0.3151 | 0.3252 | 6% | 620 | 86.2% | 5540 | 7.8% | 480 | 59 | 91 | 86 |
| 6400 | 0.3151 | 0.3252 | 6% | 626 | 86.6% | 5534 | 7.8% | 480 | 58 | 93 | 92 |
| 6400 | 0.3151 | 0.3252 | 5% | 631 | 87.4% | 5573 | 7.4% | 480 | 58 | 94 | 94 |
| 6400 | 0.3151 | 0.3252 | 5% | 635 | 88.1% | 5611 | 7.1% | 480 | 57 | 94 | 93 |
| 6400 | 0.3151 | 0.3252 | 5% | 640 | 88.4% | 5618 | 7.0% | 480 | 55 | 94 | 90 |
| 6400 | 0.3151 | 0.3252 | 8% | 611 | 84.0% | 6170 | 8.4% | 486 | 62 | 89 | 72 |
| 6400 | 0.3151 | 0.3252 | 7% | 616 | 84.5% | 6125 | 8.5% | 486 | 61 | 92 | 82 |
| 6400 | 0.3151 | 0.3252 | 6% | 620 | 85.0% | 6104 | 8.5% | 486 | 60 | 93 | 89 |
| 6400 | 0.3151 | 0.3252 | 6% | 626 | 85.8% | 6102 | 8.3% | 486 | 60 | 95 | 95 |
| 6400 | 0.3151 | 0.3252 | 5% | 631 | 86.9% | 6130 | 7.8% | 486 | 59 | 95 | 95 |
| 6400 | 0.3151 | 0.3252 | 5% | 635 | 87.4% | 6138 | 7.6% | 486 | 58 | 95 | 92 |
| 6400 | 0.3151 | 0.3252 | 5% | 640 | 87.6% | 6135 | 7.5% | 486 | 57 | 94 | 87 |
| 6400 | 0.3151 | 0.3252 | 8% | 611 | 81.7% | 6717 | 9.8% | 491 | 63 | 91 | 75 |
| 6400 | 0.3151 | 0.3252 | 8% | 616 | 82.7% | 6663 | 9.7% | 491 | 62 | 94 | 85 |
| 6400 | 0.3151 | 0.3252 | 7% | 620 | 83.4% | 6632 | 9.6% | 491 | 61 | 96 | 93 |
| 6400 | 0.3151 | 0.3252 | 6% | 626 | 84.9% | 6615 | 8.9% | 491 | 61 | 97 | 97 |
| 6400 | 0.3151 | 0.3252 | 6% | 631 | 85.8% | 6602 | 8.6% | 491 | 60 | 96 | 92 |
| 6400 | 0.3151 | 0.3252 | 5% | 635 | 86.1% | 6591 | 8.5% | 491 | 59 | 95 | 88 |
| 6400 | 0.3151 | 0.3252 | 5% | 640 | 86.4% | 6581 | 8.4% | 491 | 57 | 94 | 83 |
| 6400 | 0.3151 | 0.3252 | 9% | 611 | 79.4% | 7204 | 11.3% | 496 | 63 | 93 | 77 |
| 6400 | 0.3151 | 0.3252 | 8% | 616 | 80.9% | 7111 | 11.0% | 496 | 63 | 96 | 88 |
| 6400 | 0.3151 | 0.3252 | 7% | 620 | 81.9% | 7056 | 10.7% | 496 | 62 | 97 | 96 |
| 6400 | 0.3151 | 0.3252 | 7% | 626 | 83.6% | 6993 | 9.9% | 496 | 62 | 97 | 95 |
| 6400 | 0.3151 | 0.3252 | 6% | 631 | 84.4% | 6959 | 9.5% | 496 | 61 | 96 | 89 |
| 6400 | 0.3151 | 0.3252 | 6% | 635 | 85.2% | 6934 | 9.2% | 496 | 60 | 95 | 85 |
| 6400 | 0.3151 | 0.3252 | 5% | 640 | 85.9% | 6912 | 8.8% | 496 | 58 | 93 | 82 |
| 6400 | 0.3151 | 0.3252 | 10% | 611 | 76.5% | 7848 | 13.3% | 502 | 64 | 95 | 80 |
| 6400 | 0.3151 | 0.3252 | 9% | 616 | 78.7% | 7653 | 12.6% | 502 | 64 | 97 | 92 |
| 6400 | 0.3151 | 0.3252 | 8% | 620 | 80.3% | 7529 | 11.9% | 502 | 63 | 97 | 100 |
| 6400 | 0.3151 | 0.3252 | 7% | 626 | 82.3% | 7401 | 10.9% | 502 | 63 | 96 | 93 |
| 6400 | 0.3151 | 0.3252 | 6% | 631 | 83.5% | 7325 | 10.4% | 502 | 62 | 94 | 87 |
| 6400 | 0.3151 | 0.3252 | 6% | 635 | 84.4% | 7274 | 9.9% | 502 | 61 | 93 | 83 |
| 6400 | 0.3151 | 0.3252 | 5% | 640 | 85.2% | 7227 | 9.4% | 502 | 59 | 91 | 80 |
| 6400 | 0.3151 | 0.3252 | 11% | 611 | 73.4% | 8586 | 15.6% | 508 | 65 | 95 | 82 |
| 6400 | 0.3151 | 0.3252 | 10% | 616 | 75.5% | 8303 | 14.9% | 508 | 65 | 96 | 96 |
| 6400 | 0.3151 | 0.3252 | 8% | 620 | 79.0% | 7938 | 13.0% | 508 | 65 | 95 | 98 |
| 6400 | 0.3151 | 0.3252 | 7% | 626 | 81.3% | 7727 | 11.8% | 508 | 64 | 93 | 91 |
| 6400 | 0.3151 | 0.3252 | 6% | 631 | 82.9% | 7597 | 10.9% | 508 | 63 | 92 | 86 |
| 6400 | 0.3151 | 0.3252 | 6% | 635 | 83.8% | 7531 | 10.5% | 508 | 62 | 90 | 83 |
| 6400 | 0.3151 | 0.3252 | 5% | 640 | 84.5% | 7473 | 10.1% | 508 | 60 | 89 | 79 |
| 6400 | 0.3151 | 0.3252 | 12% | 611 | 70.2% | 9424 | 18.0% | 514 | 66 | 94 | 85 |
| 6400 | 0.3151 | 0.3252 | 10% | 616 | 73.5% | 8838 | 16.6% | 514 | 66 | 94 | 97 |
| 6400 | 0.3151 | 0.3252 | 8% | 620 | 77.7% | 8265 | 14.1% | 514 | 65 | 93 | 96 |
| 6400 | 0.3151 | 0.3252 | 7% | 626 | 80.6% | 7952 | 12.5% | 514 | 65 | 91 | 90 |
| 6400 | 0.3151 | 0.3252 | 6% | 631 | 82.0% | 7811 | 11.8% | 514 | 64 | 90 | 85 |
| 6400 | 0.3151 | 0.3252 | 6% | 635 | 82.9% | 7727 | 11.3% | 514 | 62 | 89 | 81 |
| 6400 | 0.3151 | 0.3252 | 5% | 640 | 83.8% | 7649 | 10.8% | 514 | 60 | 88 | 78 |
| 6400 | 0.3151 | 0.3252 | 13% | 611 | 65.6% | 10955 | 21.5% | 521 | 67 | 92 | 87 |
| 6400 | 0.3151 | 0.3252 | 10% | 616 | 71.3% | 9480 | 18.5% | 521 | 67 | 92 | 96 |
| 6400 | 0.3151 | 0.3252 | 8% | 620 | 76.3% | 8625 | 15.5% | 521 | 67 | 91 | 94 |
| 6400 | 0.3151 | 0.3252 | 7% | 626 | 79.0% | 8265 | 13.9% | 521 | 66 | 89 | 89 |
| 6400 | 0.3151 | 0.3252 | 6% | 631 | 80.6% | 8072 | 13.0% | 521 | 64 | 88 | 83 |
| 6400 | 0.3151 | 0.3252 | 6% | 635 | 81.8% | 7946 | 12.3% | 521 | 63 | 87 | 80 |
| 6400 | 0.3151 | 0.3252 | 5% | 640 | 83.1% | 7816 | 11.5% | 521 | 61 | 86 | 78 |
| 6400 | 0.3151 | 0.3252 | 14% | 611 | 61.0% | 13316 | 25.2% | 527 | 68 | 90 | 88 |
| 6400 | 0.3151 | 0.3252 | 11% | 616 | 68.8% | 10221 | 20.6% | 527 | 68 | 90 | 95 |
| 6400 | 0.3151 | 0.3252 | 8% | 620 | 74.5% | 9018 | 17.1% | 527 | 67 | 89 | 93 |
| 6400 | 0.3151 | 0.3252 | 7% | 626 | 77.3% | 8579 | 15.5% | 527 | 66 | 87 | 87 |
| 6400 | 0.3151 | 0.3252 | 6% | 631 | 79.4% | 8292 | 14.2% | 527 | 65 | 86 | 83 |
| 6400 | 0.3151 | 0.3252 | 6% | 635 | 81.1% | 8087 | 13.1% | 527 | 64 | 85 | 81 |

TABLE 2-continued

| | | | | | | | | | | |
|---|---|---|---|---|---|---|---|---|---|---|
| 6400 | 0.3151 | 0.3252 | 5% | 640 | 83.1% | 7869 | 11.7% | 527 | 62 | 84 | 80 |
| 6400 | 0.3151 | 0.3252 | 15% | 611 | 53.4% | 23560 | 31.3% | 534 | 69 | 88 | 89 |
| 6400 | 0.3151 | 0.3252 | 11% | 616 | 65.8% | 11374 | 23.5% | 534 | 69 | 88 | 93 |
| 6400 | 0.3151 | 0.3252 | 9% | 620 | 71.0% | 9819 | 20.1% | 534 | 68 | 87 | 91 |
| 6400 | 0.3151 | 0.3252 | 7% | 626 | 74.9% | 9041 | 17.7% | 534 | 67 | 85 | 86 |
| 6400 | 0.3151 | 0.3252 | 6% | 631 | 78.5% | 8479 | 15.3% | 534 | 66 | 84 | 84 |
| 6400 | 0.3151 | 0.3252 | 5% | 635 | 81.1% | 8140 | 13.4% | 534 | 65 | 83 | 84 |
| 6400 | 0.3151 | 0.3252 | 5% | 640 | 83.6% | 7865 | 11.7% | 534 | 63 | 82 | 84 |
| 6400 | 0.3151 | 0.3252 | 16% | 611 | 46.9% | 391150 | 37.2% | 540 | 71 | 85 | 87 |
| 6400 | 0.3151 | 0.3252 | 12% | 616 | 59.5% | 15085 | 29.0% | 540 | 70 | 85 | 92 |
| 6400 | 0.3151 | 0.3252 | 9% | 620 | 66.2% | 11339 | 24.5% | 540 | 69 | 84 | 89 |
| 6400 | 0.3151 | 0.3252 | 7% | 626 | 73.1% | 9444 | 19.6% | 540 | 68 | 83 | 87 |
| 6400 | 0.3151 | 0.3252 | 6% | 631 | 78.2% | 8571 | 16.0% | 540 | 67 | 82 | 87 |
| 6400 | 0.3151 | 0.3252 | 5% | 635 | 81.1% | 8172 | 13.8% | 540 | 66 | 81 | 87 |
| 6400 | 0.3151 | 0.3252 | 4% | 640 | 83.7% | 7876 | 11.9% | 540 | 64 | 81 | 87 |
| 6300 | 0.3168 | 0.3268 | 5% | 611 | 89.2% | 4131 | 6.1% | 467 | 46 | 81 | 66 |
| 6300 | 0.3168 | 0.3268 | 4% | 616 | 89.7% | 4131 | 6.1% | 467 | 46 | 83 | 72 |
| 6300 | 0.3168 | 0.3268 | 4% | 620 | 90.0% | 4131 | 6.1% | 467 | 46 | 84 | 77 |
| 6300 | 0.3168 | 0.3268 | 4% | 626 | 90.2% | 4131 | 6.1% | 467 | 45 | 85 | 82 |
| 6300 | 0.3168 | 0.3268 | 3% | 631 | 90.4% | 4131 | 6.1% | 467 | 45 | 86 | 87 |
| 6300 | 0.3168 | 0.3268 | 3% | 635 | 90.6% | 4131 | 6.1% | 467 | 45 | 87 | 90 |
| 6300 | 0.3168 | 0.3268 | 3% | 640 | 90.7% | 4131 | 6.1% | 467 | 44 | 88 | 93 |
| 6300 | 0.3168 | 0.3268 | 7% | 611 | 85.2% | 4252 | 8.1% | 471 | 49 | 85 | 67 |
| 6300 | 0.3168 | 0.3268 | 6% | 616 | 86.0% | 4263 | 8.1% | 471 | 49 | 87 | 76 |
| 6300 | 0.3168 | 0.3268 | 6% | 620 | 86.3% | 4258 | 8.1% | 471 | 48 | 89 | 82 |
| 6300 | 0.3168 | 0.3268 | 5% | 626 | 86.6% | 4248 | 8.1% | 471 | 48 | 91 | 88 |
| 6300 | 0.3168 | 0.3268 | 5% | 631 | 87.2% | 4281 | 7.9% | 471 | 48 | 92 | 92 |
| 6300 | 0.3168 | 0.3268 | 5% | 635 | 87.6% | 4321 | 7.7% | 471 | 48 | 92 | 93 |
| 6300 | 0.3168 | 0.3268 | 4% | 640 | 87.9% | 4337 | 7.6% | 471 | 47 | 92 | 91 |
| 6300 | 0.3168 | 0.3268 | 7% | 611 | 85.6% | 5023 | 7.5% | 476 | 58 | 86 | 68 |
| 6300 | 0.3168 | 0.3268 | 6% | 616 | 86.3% | 5017 | 7.4% | 476 | 57 | 88 | 77 |
| 6300 | 0.3168 | 0.3268 | 6% | 620 | 86.6% | 4993 | 7.5% | 476 | 57 | 90 | 84 |
| 6300 | 0.3168 | 0.3268 | 5% | 626 | 87.0% | 4982 | 7.6% | 476 | 56 | 92 | 90 |
| 6300 | 0.3168 | 0.3268 | 5% | 631 | 87.6% | 5023 | 7.3% | 476 | 55 | 93 | 93 |
| 6300 | 0.3168 | 0.3268 | 5% | 635 | 88.2% | 5068 | 7.0% | 476 | 55 | 93 | 93 |
| 6300 | 0.3168 | 0.3268 | 5% | 640 | 88.5% | 5078 | 7.0% | 476 | 54 | 93 | 91 |
| 6300 | 0.3168 | 0.3268 | 7% | 611 | 85.2% | 5559 | 7.6% | 480 | 60 | 87 | 70 |
| 6300 | 0.3168 | 0.3268 | 7% | 616 | 85.8% | 5528 | 7.6% | 480 | 60 | 90 | 79 |
| 6300 | 0.3168 | 0.3268 | 6% | 620 | 86.1% | 5502 | 7.7% | 480 | 59 | 92 | 86 |
| 6300 | 0.3168 | 0.3268 | 6% | 626 | 86.6% | 5498 | 7.7% | 480 | 58 | 93 | 92 |
| 6300 | 0.3168 | 0.3268 | 5% | 631 | 87.5% | 5542 | 7.3% | 480 | 58 | 94 | 94 |
| 6300 | 0.3168 | 0.3268 | 5% | 635 | 88.0% | 5575 | 7.0% | 480 | 57 | 94 | 93 |
| 6300 | 0.3168 | 0.3268 | 5% | 640 | 88.3% | 5579 | 7.0% | 480 | 55 | 94 | 89 |
| 6300 | 0.3168 | 0.3268 | 8% | 611 | 83.9% | 6114 | 8.3% | 486 | 62 | 89 | 72 |
| 6300 | 0.3168 | 0.3268 | 7% | 616 | 84.5% | 6070 | 8.4% | 486 | 61 | 92 | 82 |
| 6300 | 0.3168 | 0.3268 | 7% | 620 | 85.0% | 6050 | 8.4% | 486 | 60 | 94 | 90 |
| 6300 | 0.3168 | 0.3268 | 6% | 626 | 85.8% | 6050 | 8.2% | 486 | 60 | 95 | 95 |
| 6300 | 0.3168 | 0.3268 | 5% | 631 | 86.9% | 6079 | 7.6% | 486 | 59 | 95 | 94 |
| 6300 | 0.3168 | 0.3268 | 5% | 635 | 87.3% | 6084 | 7.5% | 486 | 58 | 95 | 91 |
| 6300 | 0.3168 | 0.3268 | 5% | 640 | 87.6% | 6080 | 7.4% | 486 | 57 | 94 | 86 |
| 6300 | 0.3168 | 0.3268 | 9% | 611 | 81.6% | 6642 | 9.7% | 491 | 63 | 91 | 74 |
| 6300 | 0.3168 | 0.3268 | 8% | 616 | 82.7% | 6589 | 9.6% | 491 | 62 | 94 | 85 |
| 6300 | 0.3168 | 0.3268 | 7% | 620 | 83.4% | 6559 | 9.5% | 491 | 62 | 96 | 93 |
| 6300 | 0.3168 | 0.3268 | 6% | 626 | 84.9% | 6544 | 8.8% | 491 | 61 | 97 | 97 |
| 6300 | 0.3168 | 0.3268 | 6% | 631 | 85.7% | 6530 | 8.5% | 491 | 60 | 96 | 92 |
| 6300 | 0.3168 | 0.3268 | 6% | 635 | 86.1% | 6520 | 8.4% | 491 | 59 | 95 | 87 |
| 6300 | 0.3168 | 0.3268 | 5% | 640 | 86.4% | 6511 | 8.3% | 491 | 57 | 94 | 82 |
| 6300 | 0.3168 | 0.3268 | 9% | 611 | 79.3% | 7110 | 11.2% | 496 | 63 | 93 | 77 |
| 6300 | 0.3168 | 0.3268 | 8% | 616 | 80.8% | 7020 | 10.9% | 496 | 63 | 96 | 88 |
| 6300 | 0.3168 | 0.3268 | 8% | 620 | 81.9% | 6966 | 10.6% | 496 | 62 | 97 | 97 |
| 6300 | 0.3168 | 0.3268 | 7% | 626 | 83.6% | 6907 | 9.8% | 496 | 62 | 97 | 95 |
| 6300 | 0.3168 | 0.3268 | 6% | 631 | 84.5% | 6872 | 9.4% | 496 | 61 | 96 | 89 |
| 6300 | 0.3168 | 0.3268 | 6% | 635 | 85.3% | 6848 | 9.0% | 496 | 60 | 94 | 85 |
| 6300 | 0.3168 | 0.3268 | 5% | 640 | 86.0% | 6828 | 8.7% | 496 | 58 | 93 | 81 |
| 6300 | 0.3168 | 0.3268 | 10% | 611 | 76.5% | 7723 | 13.2% | 502 | 64 | 95 | 80 |
| 6300 | 0.3168 | 0.3268 | 9% | 616 | 78.7% | 7536 | 12.4% | 502 | 64 | 97 | 92 |
| 6300 | 0.3168 | 0.3268 | 8% | 620 | 80.4% | 7415 | 11.7% | 502 | 63 | 97 | 100 |
| 6300 | 0.3168 | 0.3268 | 7% | 626 | 82.3% | 7294 | 10.8% | 502 | 63 | 95 | 93 |
| 6300 | 0.3168 | 0.3268 | 6% | 631 | 83.5% | 7222 | 10.2% | 502 | 62 | 94 | 87 |
| 6300 | 0.3168 | 0.3268 | 6% | 635 | 84.5% | 7172 | 9.7% | 502 | 61 | 92 | 83 |
| 6300 | 0.3168 | 0.3268 | 5% | 640 | 85.3% | 7127 | 9.2% | 502 | 59 | 91 | 80 |
| 6300 | 0.3168 | 0.3268 | 11% | 611 | 73.4% | 8426 | 15.4% | 508 | 66 | 95 | 82 |
| 6300 | 0.3168 | 0.3268 | 10% | 616 | 75.6% | 8150 | 14.7% | 508 | 65 | 96 | 95 |
| 6300 | 0.3168 | 0.3268 | 8% | 620 | 79.1% | 7802 | 12.8% | 508 | 65 | 95 | 98 |
| 6300 | 0.3168 | 0.3268 | 7% | 626 | 81.4% | 7600 | 11.6% | 508 | 64 | 93 | 91 |
| 6300 | 0.3168 | 0.3268 | 6% | 631 | 83.0% | 7477 | 10.7% | 508 | 63 | 91 | 86 |
| 6300 | 0.3168 | 0.3268 | 6% | 635 | 83.9% | 7413 | 10.3% | 508 | 62 | 90 | 82 |
| 6300 | 0.3168 | 0.3268 | 5% | 640 | 84.7% | 7358 | 9.9% | 508 | 60 | 89 | 79 |
| 6300 | 0.3168 | 0.3268 | 12% | 611 | 70.2% | 9207 | 17.8% | 514 | 67 | 94 | 84 |
| 6300 | 0.3168 | 0.3268 | 10% | 616 | 73.5% | 8654 | 16.4% | 514 | 66 | 94 | 97 |

TABLE 2-continued

| | | | | | | | | | | |
|---|---|---|---|---|---|---|---|---|---|---|
| 6300 | 0.3168 | 0.3268 | 8% | 620 | 77.8% | 8108 | 13.9% | 514 | 66 | 93 | 96 |
| 6300 | 0.3168 | 0.3268 | 7% | 626 | 80.7% | 7812 | 12.3% | 514 | 65 | 91 | 90 |
| 6300 | 0.3168 | 0.3268 | 6% | 631 | 82.2% | 7677 | 11.5% | 514 | 64 | 90 | 85 |
| 6300 | 0.3168 | 0.3268 | 6% | 635 | 83.1% | 7597 | 11.0% | 514 | 63 | 89 | 81 |
| 6300 | 0.3168 | 0.3268 | 5% | 640 | 84.0% | 7522 | 10.5% | 514 | 61 | 87 | 78 |
| 6300 | 0.3168 | 0.3268 | 13% | 611 | 65.6% | 10621 | 21.3% | 521 | 68 | 92 | 87 |
| 6300 | 0.3168 | 0.3268 | 10% | 616 | 71.4% | 9254 | 18.3% | 521 | 67 | 92 | 96 |
| 6300 | 0.3168 | 0.3268 | 8% | 620 | 76.4% | 8445 | 15.2% | 521 | 67 | 91 | 94 |
| 6300 | 0.3168 | 0.3268 | 7% | 626 | 79.2% | 8102 | 13.7% | 521 | 66 | 89 | 89 |
| 6300 | 0.3168 | 0.3268 | 6% | 631 | 80.8% | 7918 | 12.8% | 521 | 65 | 88 | 83 |
| 6300 | 0.3168 | 0.3268 | 6% | 635 | 82.0% | 7799 | 12.1% | 521 | 63 | 87 | 80 |
| 6300 | 0.3168 | 0.3268 | 5% | 640 | 83.3% | 7675 | 11.3% | 521 | 61 | 86 | 78 |
| 6300 | 0.3168 | 0.3268 | 14% | 611 | 61.1% | 12754 | 24.9% | 527 | 69 | 90 | 88 |
| 6300 | 0.3168 | 0.3268 | 11% | 616 | 69.0% | 9934 | 20.4% | 527 | 68 | 90 | 95 |
| 6300 | 0.3168 | 0.3268 | 8% | 620 | 74.7% | 8808 | 16.8% | 527 | 67 | 89 | 93 |
| 6300 | 0.3168 | 0.3268 | 7% | 626 | 77.5% | 8392 | 15.2% | 527 | 66 | 87 | 87 |
| 6300 | 0.3168 | 0.3268 | 6% | 631 | 79.6% | 8121 | 13.9% | 527 | 65 | 86 | 83 |
| 6300 | 0.3168 | 0.3268 | 6% | 635 | 81.3% | 7927 | 12.8% | 527 | 64 | 85 | 81 |
| 6300 | 0.3168 | 0.3268 | 5% | 640 | 83.4% | 7722 | 11.4% | 527 | 62 | 84 | 80 |
| 6300 | 0.3168 | 0.3268 | 15% | 611 | 53.6% | 21312 | 31.0% | 534 | 70 | 88 | 89 |
| 6300 | 0.3168 | 0.3268 | 11% | 616 | 65.9% | 10986 | 23.2% | 534 | 69 | 88 | 93 |
| 6300 | 0.3168 | 0.3268 | 9% | 620 | 71.3% | 9538 | 19.8% | 534 | 68 | 87 | 91 |
| 6300 | 0.3168 | 0.3268 | 7% | 626 | 75.2% | 8813 | 17.4% | 534 | 67 | 85 | 86 |
| 6300 | 0.3168 | 0.3268 | 6% | 631 | 78.8% | 8288 | 14.9% | 534 | 66 | 84 | 84 |
| 6300 | 0.3168 | 0.3268 | 6% | 635 | 81.4% | 7969 | 13.1% | 534 | 65 | 83 | 84 |
| 6300 | 0.3168 | 0.3268 | 5% | 640 | 83.9% | 7711 | 11.3% | 534 | 63 | 82 | 84 |
| 6300 | 0.3168 | 0.3268 | 16% | 611 | 46.3% | 391150 | 37.5% | 540 | 71 | 85 | 88 |
| 6300 | 0.3168 | 0.3268 | 12% | 616 | 59.8% | 14204 | 28.6% | 540 | 70 | 85 | 92 |
| 6300 | 0.3168 | 0.3268 | 9% | 620 | 66.5% | 10898 | 24.1% | 540 | 69 | 84 | 89 |
| 6300 | 0.3168 | 0.3268 | 7% | 626 | 73.5% | 9173 | 19.2% | 540 | 68 | 83 | 87 |
| 6300 | 0.3168 | 0.3268 | 6% | 631 | 78.5% | 8362 | 15.6% | 540 | 67 | 82 | 87 |
| 6300 | 0.3168 | 0.3268 | 5% | 635 | 81.5% | 7989 | 13.4% | 540 | 66 | 81 | 87 |
| 6300 | 0.3168 | 0.3268 | 4% | 640 | 84.1% | 7712 | 11.4% | 540 | 64 | 81 | 87 |
| 6200 | 0.3185 | 0.3284 | 5% | 611 | 89.1% | 4131 | 6.0% | 467 | 46 | 81 | 66 |
| 6200 | 0.3185 | 0.3284 | 4% | 616 | 89.6% | 4131 | 6.0% | 467 | 46 | 83 | 72 |
| 6200 | 0.3185 | 0.3284 | 4% | 620 | 89.9% | 4131 | 6.0% | 467 | 46 | 84 | 77 |
| 6200 | 0.3185 | 0.3284 | 4% | 626 | 90.2% | 4131 | 6.0% | 467 | 46 | 86 | 83 |
| 6200 | 0.3185 | 0.3284 | 4% | 631 | 90.4% | 4131 | 6.0% | 467 | 45 | 87 | 88 |
| 6200 | 0.3185 | 0.3284 | 3% | 635 | 90.5% | 4131 | 6.0% | 467 | 45 | 87 | 91 |
| 6200 | 0.3185 | 0.3284 | 3% | 640 | 90.6% | 4131 | 6.0% | 467 | 44 | 88 | 94 |
| 6200 | 0.3185 | 0.3284 | 7% | 611 | 85.1% | 4239 | 8.1% | 471 | 49 | 85 | 67 |
| 6200 | 0.3185 | 0.3284 | 6% | 616 | 85.9% | 4251 | 8.0% | 471 | 49 | 87 | 76 |
| 6200 | 0.3185 | 0.3284 | 6% | 620 | 86.3% | 4246 | 8.0% | 471 | 48 | 89 | 83 |
| 6200 | 0.3185 | 0.3284 | 5% | 626 | 86.6% | 4239 | 8.0% | 471 | 48 | 91 | 89 |
| 6200 | 0.3185 | 0.3284 | 5% | 631 | 87.2% | 4278 | 7.8% | 471 | 48 | 92 | 92 |
| 6200 | 0.3185 | 0.3284 | 5% | 635 | 87.6% | 4314 | 7.6% | 471 | 48 | 92 | 93 |
| 6200 | 0.3185 | 0.3284 | 5% | 640 | 87.9% | 4327 | 7.5% | 471 | 47 | 92 | 91 |
| 6200 | 0.3185 | 0.3284 | 7% | 611 | 85.5% | 4996 | 7.4% | 476 | 58 | 86 | 68 |
| 6200 | 0.3185 | 0.3284 | 6% | 616 | 86.2% | 4991 | 7.4% | 476 | 57 | 89 | 77 |
| 6200 | 0.3185 | 0.3284 | 6% | 620 | 86.5% | 4967 | 7.5% | 476 | 57 | 90 | 84 |
| 6200 | 0.3185 | 0.3284 | 6% | 626 | 86.9% | 4959 | 7.5% | 476 | 56 | 92 | 91 |
| 6200 | 0.3185 | 0.3284 | 5% | 631 | 87.7% | 5007 | 7.2% | 476 | 56 | 93 | 93 |
| 6200 | 0.3185 | 0.3284 | 5% | 635 | 88.2% | 5045 | 6.9% | 476 | 55 | 93 | 93 |
| 6200 | 0.3185 | 0.3284 | 5% | 640 | 88.4% | 5053 | 6.9% | 476 | 54 | 93 | 90 |
| 6200 | 0.3185 | 0.3284 | 7% | 611 | 85.1% | 5518 | 7.5% | 480 | 60 | 87 | 70 |
| 6200 | 0.3185 | 0.3284 | 7% | 616 | 85.7% | 5489 | 7.6% | 480 | 60 | 90 | 79 |
| 6200 | 0.3185 | 0.3284 | 6% | 620 | 86.0% | 5464 | 7.6% | 480 | 59 | 92 | 87 |
| 6200 | 0.3185 | 0.3284 | 6% | 626 | 86.6% | 5462 | 7.6% | 480 | 58 | 93 | 93 |
| 6200 | 0.3185 | 0.3284 | 5% | 631 | 87.5% | 5511 | 7.2% | 480 | 58 | 94 | 94 |
| 6200 | 0.3185 | 0.3284 | 5% | 635 | 88.0% | 5537 | 6.9% | 480 | 57 | 94 | 92 |
| 6200 | 0.3185 | 0.3284 | 5% | 640 | 88.3% | 5540 | 6.9% | 480 | 55 | 94 | 89 |
| 6200 | 0.3185 | 0.3284 | 8% | 611 | 83.8% | 6058 | 8.2% | 486 | 62 | 89 | 72 |
| 6200 | 0.3185 | 0.3284 | 7% | 616 | 84.4% | 6016 | 8.3% | 486 | 61 | 92 | 82 |
| 6200 | 0.3185 | 0.3284 | 7% | 620 | 84.9% | 5996 | 8.3% | 486 | 61 | 94 | 90 |
| 6200 | 0.3185 | 0.3284 | 6% | 626 | 85.8% | 5999 | 8.0% | 486 | 60 | 95 | 95 |
| 6200 | 0.3185 | 0.3284 | 6% | 631 | 86.9% | 6028 | 7.5% | 486 | 59 | 95 | 94 |
| 6200 | 0.3185 | 0.3284 | 5% | 635 | 87.3% | 6030 | 7.4% | 486 | 58 | 95 | 90 |
| 6200 | 0.3185 | 0.3284 | 5% | 640 | 87.6% | 6025 | 7.3% | 486 | 57 | 94 | 86 |
| 6200 | 0.3185 | 0.3284 | 9% | 611 | 81.6% | 6567 | 9.6% | 491 | 63 | 91 | 74 |
| 6200 | 0.3185 | 0.3284 | 8% | 616 | 82.6% | 6515 | 9.5% | 491 | 62 | 94 | 85 |
| 6200 | 0.3185 | 0.3284 | 7% | 620 | 83.4% | 6486 | 9.4% | 491 | 62 | 96 | 93 |
| 6200 | 0.3185 | 0.3284 | 6% | 626 | 85.0% | 6473 | 8.6% | 491 | 61 | 97 | 97 |
| 6200 | 0.3185 | 0.3284 | 6% | 631 | 85.7% | 6460 | 8.4% | 491 | 60 | 96 | 91 |
| 6200 | 0.3185 | 0.3284 | 6% | 635 | 86.0% | 6449 | 8.3% | 491 | 59 | 95 | 86 |
| 6200 | 0.3185 | 0.3284 | 5% | 640 | 86.4% | 6441 | 8.2% | 491 | 57 | 94 | 82 |
| 6200 | 0.3185 | 0.3284 | 10% | 611 | 79.3% | 7017 | 11.1% | 496 | 64 | 93 | 77 |
| 6200 | 0.3185 | 0.3284 | 8% | 616 | 80.8% | 6930 | 10.8% | 496 | 63 | 96 | 88 |
| 6200 | 0.3185 | 0.3284 | 8% | 620 | 81.9% | 6877 | 10.4% | 496 | 62 | 97 | 97 |
| 6200 | 0.3185 | 0.3284 | 7% | 626 | 83.6% | 6821 | 9.6% | 496 | 62 | 97 | 95 |
| 6200 | 0.3185 | 0.3284 | 6% | 631 | 84.6% | 6787 | 9.2% | 496 | 61 | 96 | 89 |

TABLE 2-continued

| | | | | | | | | | | | |
|---|---|---|---|---|---|---|---|---|---|---|---|
| 6200 | 0.3185 | 0.3284 | 6% | 635 | 85.4% | 6764 | 8.8% | 496 | 60 | 94 | 85 |
| 6200 | 0.3185 | 0.3284 | 5% | 640 | 86.1% | 6744 | 8.5% | 496 | 58 | 93 | 81 |
| 6200 | 0.3185 | 0.3284 | 10% | 611 | 76.5% | 7600 | 13.1% | 502 | 65 | 95 | 79 |
| 6200 | 0.3185 | 0.3284 | 9% | 616 | 78.7% | 7420 | 12.3% | 502 | 64 | 97 | 92 |
| 6200 | 0.3185 | 0.3284 | 8% | 620 | 80.5% | 7303 | 11.6% | 502 | 64 | 97 | 100 |
| 6200 | 0.3185 | 0.3284 | 7% | 626 | 82.4% | 7189 | 10.6% | 502 | 63 | 95 | 93 |
| 6200 | 0.3185 | 0.3284 | 6% | 631 | 83.6% | 7120 | 10.0% | 502 | 62 | 94 | 86 |
| 6200 | 0.3185 | 0.3284 | 6% | 635 | 84.6% | 7071 | 9.5% | 502 | 61 | 92 | 83 |
| 6200 | 0.3185 | 0.3284 | 5% | 640 | 85.5% | 7028 | 9.0% | 502 | 59 | 91 | 79 |
| 6200 | 0.3185 | 0.3284 | 11% | 611 | 73.4% | 8269 | 15.3% | 508 | 66 | 95 | 82 |
| 6200 | 0.3185 | 0.3284 | 10% | 616 | 75.6% | 7999 | 14.6% | 508 | 65 | 96 | 95 |
| 6200 | 0.3185 | 0.3284 | 8% | 620 | 79.2% | 7670 | 12.7% | 508 | 65 | 95 | 98 |
| 6200 | 0.3185 | 0.3284 | 7% | 626 | 81.6% | 7475 | 11.4% | 508 | 64 | 93 | 91 |
| 6200 | 0.3185 | 0.3284 | 6% | 631 | 83.2% | 7358 | 10.5% | 508 | 63 | 91 | 86 |
| 6200 | 0.3185 | 0.3284 | 6% | 635 | 84.0% | 7298 | 10.1% | 508 | 62 | 90 | 82 |
| 6200 | 0.3185 | 0.3284 | 6% | 640 | 84.8% | 7244 | 9.7% | 508 | 60 | 89 | 78 |
| 6200 | 0.3185 | 0.3284 | 12% | 611 | 70.2% | 8997 | 17.6% | 514 | 67 | 94 | 84 |
| 6200 | 0.3185 | 0.3284 | 10% | 616 | 73.6% | 8474 | 16.2% | 514 | 66 | 94 | 97 |
| 6200 | 0.3185 | 0.3284 | 8% | 620 | 77.9% | 7956 | 13.7% | 514 | 66 | 93 | 96 |
| 6200 | 0.3185 | 0.3284 | 7% | 626 | 80.8% | 7674 | 12.1% | 514 | 65 | 91 | 90 |
| 6200 | 0.3185 | 0.3284 | 6% | 631 | 82.3% | 7545 | 11.3% | 514 | 64 | 90 | 85 |
| 6200 | 0.3185 | 0.3284 | 6% | 635 | 83.2% | 7469 | 10.8% | 514 | 63 | 88 | 81 |
| 6200 | 0.3185 | 0.3284 | 6% | 640 | 84.1% | 7397 | 10.3% | 514 | 61 | 87 | 77 |
| 6200 | 0.3185 | 0.3284 | 13% | 611 | 65.7% | 10301 | 21.1% | 521 | 68 | 92 | 86 |
| 6200 | 0.3185 | 0.3284 | 10% | 616 | 71.4% | 9034 | 18.1% | 521 | 67 | 92 | 96 |
| 6200 | 0.3185 | 0.3284 | 8% | 620 | 76.6% | 8269 | 15.0% | 521 | 67 | 91 | 94 |
| 6200 | 0.3185 | 0.3284 | 7% | 626 | 79.3% | 7944 | 13.4% | 521 | 66 | 89 | 89 |
| 6200 | 0.3185 | 0.3284 | 6% | 631 | 81.0% | 7769 | 12.5% | 521 | 65 | 88 | 83 |
| 6200 | 0.3185 | 0.3284 | 6% | 635 | 82.2% | 7655 | 11.8% | 521 | 63 | 87 | 80 |
| 6200 | 0.3185 | 0.3284 | 6% | 640 | 83.5% | 7537 | 11.0% | 521 | 61 | 85 | 77 |
| 6200 | 0.3185 | 0.3284 | 14% | 611 | 61.2% | 12232 | 24.7% | 527 | 69 | 90 | 88 |
| 6200 | 0.3185 | 0.3284 | 11% | 616 | 69.1% | 9662 | 20.2% | 527 | 68 | 90 | 95 |
| 6200 | 0.3185 | 0.3284 | 9% | 620 | 74.9% | 8604 | 16.6% | 527 | 68 | 89 | 93 |
| 6200 | 0.3185 | 0.3284 | 7% | 626 | 77.7% | 8210 | 14.9% | 527 | 67 | 87 | 87 |
| 6200 | 0.3185 | 0.3284 | 7% | 631 | 79.9% | 7954 | 13.6% | 527 | 65 | 86 | 83 |
| 6200 | 0.3185 | 0.3284 | 6% | 635 | 81.6% | 7771 | 12.5% | 527 | 64 | 85 | 80 |
| 6200 | 0.3185 | 0.3284 | 5% | 640 | 83.6% | 7578 | 11.1% | 527 | 62 | 84 | 80 |
| 6200 | 0.3185 | 0.3284 | 16% | 611 | 53.7% | 19444 | 30.8% | 534 | 70 | 88 | 89 |
| 6200 | 0.3185 | 0.3284 | 11% | 616 | 66.0% | 10622 | 23.0% | 534 | 69 | 88 | 93 |
| 6200 | 0.3185 | 0.3284 | 9% | 620 | 71.5% | 9270 | 19.5% | 534 | 68 | 87 | 91 |
| 6200 | 0.3185 | 0.3284 | 8% | 626 | 75.4% | 8594 | 17.0% | 534 | 67 | 85 | 86 |
| 6200 | 0.3185 | 0.3284 | 6% | 631 | 79.1% | 8103 | 14.6% | 534 | 66 | 84 | 84 |
| 6200 | 0.3185 | 0.3284 | 6% | 635 | 81.7% | 7804 | 12.7% | 534 | 65 | 83 | 83 |
| 6200 | 0.3185 | 0.3284 | 5% | 640 | 84.2% | 7561 | 10.9% | 534 | 63 | 82 | 84 |
| 6200 | 0.3185 | 0.3284 | 17% | 611 | 45.6% | 391150 | 37.8% | 540 | 71 | 85 | 88 |
| 6200 | 0.3185 | 0.3284 | 12% | 616 | 60.1% | 13424 | 28.3% | 540 | 70 | 85 | 92 |
| 6200 | 0.3185 | 0.3284 | 9% | 620 | 66.9% | 10487 | 23.7% | 540 | 69 | 84 | 89 |
| 6200 | 0.3185 | 0.3284 | 7% | 626 | 73.8% | 8914 | 18.8% | 540 | 68 | 83 | 87 |
| 6200 | 0.3185 | 0.3284 | 6% | 631 | 78.9% | 8160 | 15.1% | 540 | 67 | 82 | 87 |
| 6200 | 0.3185 | 0.3284 | 5% | 635 | 81.9% | 7812 | 12.9% | 540 | 66 | 81 | 87 |
| 6200 | 0.3185 | 0.3284 | 4% | 640 | 84.5% | 7553 | 11.0% | 540 | 64 | 81 | 87 |
| 6100 | 0.3203 | 0.3301 | 5% | 611 | 89.0% | 4131 | 5.9% | 467 | 47 | 82 | 66 |
| 6100 | 0.3203 | 0.3301 | 5% | 616 | 89.5% | 4131 | 5.9% | 467 | 46 | 83 | 72 |
| 6100 | 0.3203 | 0.3301 | 4% | 620 | 89.8% | 4131 | 5.9% | 467 | 46 | 85 | 78 |
| 6100 | 0.3203 | 0.3301 | 4% | 626 | 90.1% | 4131 | 5.9% | 467 | 46 | 86 | 83 |
| 6100 | 0.3203 | 0.3301 | 4% | 631 | 90.3% | 4131 | 5.9% | 467 | 45 | 87 | 88 |
| 6100 | 0.3203 | 0.3301 | 4% | 635 | 90.5% | 4131 | 5.9% | 467 | 45 | 88 | 92 |
| 6100 | 0.3203 | 0.3301 | 4% | 640 | 90.6% | 4131 | 5.9% | 467 | 44 | 88 | 95 |
| 6100 | 0.3203 | 0.3301 | 7% | 611 | 84.9% | 4225 | 8.0% | 471 | 49 | 85 | 67 |
| 6100 | 0.3203 | 0.3301 | 6% | 616 | 85.8% | 4238 | 7.9% | 471 | 49 | 88 | 76 |
| 6100 | 0.3203 | 0.3301 | 6% | 620 | 86.2% | 4235 | 7.9% | 471 | 48 | 89 | 83 |
| 6100 | 0.3203 | 0.3301 | 6% | 626 | 86.5% | 4230 | 7.9% | 471 | 48 | 91 | 89 |
| 6100 | 0.3203 | 0.3301 | 5% | 631 | 87.2% | 4276 | 7.7% | 471 | 48 | 92 | 93 |
| 6100 | 0.3203 | 0.3301 | 5% | 635 | 87.6% | 4306 | 7.5% | 471 | 48 | 92 | 92 |
| 6100 | 0.3203 | 0.3301 | 5% | 640 | 87.9% | 4317 | 7.5% | 471 | 47 | 92 | 90 |
| 6100 | 0.3203 | 0.3301 | 7% | 611 | 85.3% | 4967 | 7.3% | 476 | 58 | 86 | 68 |
| 6100 | 0.3203 | 0.3301 | 7% | 616 | 86.1% | 4964 | 7.3% | 476 | 57 | 89 | 78 |
| 6100 | 0.3203 | 0.3301 | 6% | 620 | 86.5% | 4941 | 7.4% | 476 | 57 | 91 | 85 |
| 6100 | 0.3203 | 0.3301 | 6% | 626 | 86.9% | 4936 | 7.4% | 476 | 56 | 92 | 91 |
| 6100 | 0.3203 | 0.3301 | 5% | 631 | 87.7% | 4991 | 7.0% | 476 | 56 | 93 | 94 |
| 6100 | 0.3203 | 0.3301 | 5% | 635 | 88.1% | 5021 | 6.8% | 476 | 55 | 93 | 93 |
| 6100 | 0.3203 | 0.3301 | 5% | 640 | 88.4% | 5027 | 6.8% | 476 | 54 | 93 | 89 |
| 6100 | 0.3203 | 0.3301 | 8% | 611 | 84.9% | 5478 | 7.4% | 480 | 61 | 87 | 70 |
| 6100 | 0.3203 | 0.3301 | 7% | 616 | 85.6% | 5450 | 7.5% | 480 | 60 | 90 | 79 |
| 6100 | 0.3203 | 0.3301 | 6% | 620 | 86.0% | 5426 | 7.6% | 480 | 59 | 92 | 87 |
| 6100 | 0.3203 | 0.3301 | 6% | 626 | 86.5% | 5427 | 7.5% | 480 | 58 | 94 | 93 |
| 6100 | 0.3203 | 0.3301 | 5% | 631 | 87.5% | 5481 | 7.0% | 480 | 58 | 94 | 94 |
| 6100 | 0.3203 | 0.3301 | 5% | 635 | 88.0% | 5499 | 6.8% | 480 | 57 | 94 | 92 |
| 6100 | 0.3203 | 0.3301 | 5% | 640 | 88.2% | 5501 | 6.8% | 480 | 55 | 94 | 88 |
| 6100 | 0.3203 | 0.3301 | 8% | 611 | 83.7% | 6003 | 8.2% | 486 | 62 | 89 | 71 |

TABLE 2-continued

| | | | | | | | | | | |
|---|---|---|---|---|---|---|---|---|---|---|
| 6100 | 0.3203 | 0.3301 | 7% | 616 | 84.3% | 5961 | 8.2% | 486 | 61 | 92 | 82 |
| 6100 | 0.3203 | 0.3301 | 7% | 620 | 84.9% | 5942 | 8.2% | 486 | 61 | 94 | 90 |
| 6100 | 0.3203 | 0.3301 | 6% | 626 | 85.8% | 5949 | 7.9% | 486 | 60 | 95 | 96 |
| 6100 | 0.3203 | 0.3301 | 6% | 631 | 86.9% | 5976 | 7.4% | 486 | 60 | 95 | 94 |
| 6100 | 0.3203 | 0.3301 | 5% | 635 | 87.3% | 5975 | 7.3% | 486 | 58 | 95 | 90 |
| 6100 | 0.3203 | 0.3301 | 5% | 640 | 87.5% | 5971 | 7.3% | 486 | 57 | 94 | 85 |
| 6100 | 0.3203 | 0.3301 | 9% | 611 | 81.5% | 6493 | 9.5% | 491 | 63 | 91 | 74 |
| 6100 | 0.3203 | 0.3301 | 8% | 616 | 82.6% | 6443 | 9.4% | 491 | 62 | 94 | 85 |
| 6100 | 0.3203 | 0.3301 | 7% | 620 | 83.4% | 6415 | 9.3% | 491 | 62 | 96 | 94 |
| 6100 | 0.3203 | 0.3301 | 6% | 626 | 85.0% | 6404 | 8.5% | 491 | 61 | 97 | 97 |
| 6100 | 0.3203 | 0.3301 | 6% | 631 | 85.7% | 6389 | 8.3% | 491 | 60 | 96 | 91 |
| 6100 | 0.3203 | 0.3301 | 6% | 635 | 86.0% | 6379 | 8.2% | 491 | 59 | 95 | 86 |
| 6100 | 0.3203 | 0.3301 | 6% | 640 | 86.4% | 6372 | 8.1% | 491 | 57 | 94 | 81 |
| 6100 | 0.3203 | 0.3301 | 10% | 611 | 79.2% | 6925 | 11.0% | 496 | 64 | 93 | 76 |
| 6100 | 0.3203 | 0.3301 | 9% | 616 | 80.8% | 6840 | 10.7% | 496 | 63 | 96 | 88 |
| 6100 | 0.3203 | 0.3301 | 8% | 620 | 81.9% | 6790 | 10.3% | 496 | 63 | 98 | 97 |
| 6100 | 0.3203 | 0.3301 | 7% | 626 | 83.6% | 6736 | 9.5% | 496 | 62 | 97 | 95 |
| 6100 | 0.3203 | 0.3301 | 6% | 631 | 84.7% | 6702 | 9.0% | 496 | 61 | 95 | 88 |
| 6100 | 0.3203 | 0.3301 | 6% | 635 | 85.4% | 6681 | 8.7% | 496 | 60 | 94 | 84 |
| 6100 | 0.3203 | 0.3301 | 6% | 640 | 86.2% | 6662 | 8.3% | 496 | 58 | 93 | 80 |
| 6100 | 0.3203 | 0.3301 | 11% | 611 | 76.5% | 7480 | 12.9% | 502 | 65 | 95 | 79 |
| 6100 | 0.3203 | 0.3301 | 9% | 616 | 78.7% | 7307 | 12.1% | 502 | 64 | 97 | 92 |
| 6100 | 0.3203 | 0.3301 | 8% | 620 | 80.5% | 7193 | 11.4% | 502 | 64 | 97 | 100 |
| 6100 | 0.3203 | 0.3301 | 7% | 626 | 82.4% | 7086 | 10.5% | 502 | 63 | 95 | 92 |
| 6100 | 0.3203 | 0.3301 | 6% | 631 | 83.7% | 7018 | 9.8% | 502 | 62 | 93 | 86 |
| 6100 | 0.3203 | 0.3301 | 6% | 635 | 84.7% | 6971 | 9.3% | 502 | 61 | 92 | 82 |
| 6100 | 0.3203 | 0.3301 | 6% | 640 | 85.6% | 6930 | 8.8% | 502 | 59 | 91 | 79 |
| 6100 | 0.3203 | 0.3301 | 11% | 611 | 73.4% | 8114 | 15.2% | 508 | 66 | 95 | 82 |
| 6100 | 0.3203 | 0.3301 | 10% | 616 | 75.7% | 7853 | 14.4% | 508 | 65 | 95 | 95 |
| 6100 | 0.3203 | 0.3301 | 8% | 620 | 79.2% | 7540 | 12.5% | 508 | 65 | 95 | 97 |
| 6100 | 0.3203 | 0.3301 | 7% | 626 | 81.7% | 7353 | 11.2% | 508 | 64 | 93 | 91 |
| 6100 | 0.3203 | 0.3301 | 6% | 631 | 83.3% | 7242 | 10.3% | 508 | 63 | 91 | 86 |
| 6100 | 0.3203 | 0.3301 | 6% | 635 | 84.2% | 7184 | 9.9% | 508 | 62 | 90 | 82 |
| 6100 | 0.3203 | 0.3301 | 6% | 640 | 85.0% | 7133 | 9.4% | 508 | 60 | 89 | 78 |
| 6100 | 0.3203 | 0.3301 | 12% | 611 | 70.3% | 8792 | 17.5% | 514 | 67 | 93 | 84 |
| 6100 | 0.3203 | 0.3301 | 10% | 616 | 73.7% | 8299 | 16.0% | 514 | 66 | 94 | 97 |
| 6100 | 0.3203 | 0.3301 | 8% | 620 | 78.1% | 7807 | 13.5% | 514 | 66 | 93 | 96 |
| 6100 | 0.3203 | 0.3301 | 7% | 626 | 81.0% | 7539 | 11.9% | 514 | 65 | 91 | 90 |
| 6100 | 0.3203 | 0.3301 | 6% | 631 | 82.5% | 7416 | 11.1% | 514 | 64 | 90 | 84 |
| 6100 | 0.3203 | 0.3301 | 6% | 635 | 83.4% | 7343 | 10.6% | 514 | 63 | 88 | 81 |
| 6100 | 0.3203 | 0.3301 | 6% | 640 | 84.3% | 7274 | 10.0% | 514 | 61 | 87 | 77 |
| 6100 | 0.3203 | 0.3301 | 13% | 611 | 65.8% | 9995 | 20.9% | 521 | 68 | 92 | 86 |
| 6100 | 0.3203 | 0.3301 | 11% | 616 | 71.5% | 8822 | 17.9% | 521 | 67 | 92 | 96 |
| 6100 | 0.3203 | 0.3301 | 9% | 620 | 76.7% | 8098 | 14.8% | 521 | 67 | 91 | 94 |
| 6100 | 0.3203 | 0.3301 | 7% | 626 | 79.5% | 7790 | 13.2% | 521 | 66 | 89 | 88 |
| 6100 | 0.3203 | 0.3301 | 7% | 631 | 81.2% | 7623 | 12.2% | 521 | 65 | 88 | 83 |
| 6100 | 0.3203 | 0.3301 | 6% | 635 | 82.4% | 7515 | 11.5% | 521 | 63 | 86 | 80 |
| 6100 | 0.3203 | 0.3301 | 6% | 640 | 83.7% | 7403 | 10.7% | 521 | 61 | 85 | 77 |
| 6100 | 0.3203 | 0.3301 | 14% | 611 | 61.3% | 11747 | 24.5% | 527 | 69 | 90 | 88 |
| 6100 | 0.3203 | 0.3301 | 11% | 616 | 69.2% | 9401 | 19.9% | 527 | 68 | 90 | 95 |
| 6100 | 0.3203 | 0.3301 | 9% | 620 | 75.0% | 8406 | 16.3% | 527 | 68 | 89 | 93 |
| 6100 | 0.3203 | 0.3301 | 7% | 626 | 77.9% | 8034 | 14.6% | 527 | 67 | 87 | 87 |
| 6100 | 0.3203 | 0.3301 | 7% | 631 | 80.1% | 7792 | 13.3% | 527 | 65 | 86 | 83 |
| 6100 | 0.3203 | 0.3301 | 6% | 635 | 81.8% | 7620 | 12.2% | 527 | 64 | 85 | 80 |
| 6100 | 0.3203 | 0.3301 | 5% | 640 | 83.9% | 7437 | 10.8% | 527 | 62 | 84 | 80 |
| 6100 | 0.3203 | 0.3301 | 16% | 611 | 53.9% | 17884 | 30.4% | 534 | 70 | 88 | 89 |
| 6100 | 0.3203 | 0.3301 | 11% | 616 | 66.2% | 10276 | 22.7% | 534 | 69 | 88 | 93 |
| 6100 | 0.3203 | 0.3301 | 9% | 620 | 71.8% | 9013 | 19.2% | 534 | 68 | 87 | 91 |
| 6100 | 0.3203 | 0.3301 | 8% | 626 | 75.7% | 8383 | 16.7% | 534 | 67 | 85 | 86 |
| 6100 | 0.3203 | 0.3301 | 6% | 631 | 79.4% | 7924 | 14.2% | 534 | 66 | 84 | 84 |
| 6100 | 0.3203 | 0.3301 | 6% | 635 | 82.0% | 7644 | 12.3% | 534 | 65 | 83 | 83 |
| 6100 | 0.3203 | 0.3301 | 5% | 640 | 84.5% | 7415 | 10.5% | 534 | 63 | 82 | 84 |
| 6100 | 0.3203 | 0.3301 | 17% | 611 | 45.3% | 185455 | 37.9% | 540 | 71 | 85 | 88 |
| 6100 | 0.3203 | 0.3301 | 12% | 616 | 60.4% | 12716 | 27.9% | 540 | 70 | 85 | 92 |
| 6100 | 0.3203 | 0.3301 | 10% | 620 | 67.2% | 10102 | 23.3% | 540 | 69 | 84 | 89 |
| 6100 | 0.3203 | 0.3301 | 7% | 626 | 74.2% | 8666 | 18.4% | 540 | 68 | 83 | 87 |
| 6100 | 0.3203 | 0.3301 | 6% | 631 | 79.3% | 7967 | 14.7% | 540 | 67 | 82 | 87 |
| 6100 | 0.3203 | 0.3301 | 5% | 635 | 82.3% | 7642 | 12.5% | 540 | 66 | 82 | 87 |
| 6100 | 0.3203 | 0.3301 | 5% | 640 | 85.0% | 7399 | 10.5% | 540 | 64 | 81 | 87 |
| 6000 | 0.3221 | 0.3318 | 5% | 611 | 88.9% | 4131 | 5.8% | 467 | 47 | 82 | 65 |
| 6000 | 0.3221 | 0.3318 | 5% | 616 | 89.4% | 4131 | 5.8% | 467 | 47 | 83 | 73 |
| 6000 | 0.3221 | 0.3318 | 4% | 620 | 89.8% | 4131 | 5.8% | 467 | 46 | 85 | 78 |
| 6000 | 0.3221 | 0.3318 | 4% | 626 | 90.1% | 4131 | 5.8% | 467 | 46 | 86 | 84 |
| 6000 | 0.3221 | 0.3318 | 4% | 631 | 90.3% | 4131 | 5.8% | 467 | 45 | 87 | 89 |
| 6000 | 0.3221 | 0.3318 | 4% | 635 | 90.4% | 4131 | 5.8% | 467 | 45 | 88 | 93 |
| 6000 | 0.3221 | 0.3318 | 4% | 640 | 90.6% | 4131 | 5.8% | 467 | 44 | 89 | 96 |
| 6000 | 0.3221 | 0.3318 | 7% | 611 | 84.8% | 4212 | 7.9% | 471 | 49 | 85 | 67 |
| 6000 | 0.3221 | 0.3318 | 7% | 616 | 85.7% | 4226 | 7.8% | 471 | 49 | 88 | 76 |
| 6000 | 0.3221 | 0.3318 | 6% | 620 | 86.1% | 4223 | 7.8% | 471 | 48 | 90 | 83 |
| 6000 | 0.3221 | 0.3318 | 6% | 626 | 86.5% | 4222 | 7.8% | 471 | 48 | 91 | 90 |

TABLE 2-continued

| | | | | | | | | | | |
|---|---|---|---|---|---|---|---|---|---|---|
| 6000 | 0.3221 | 0.3318 | 5% | 631 | 87.2% | 4273 | 7.5% | 471 | 48 | 92 | 93 |
| 6000 | 0.3221 | 0.3318 | 5% | 635 | 87.6% | 4297 | 7.4% | 471 | 48 | 92 | 92 |
| 6000 | 0.3221 | 0.3318 | 5% | 640 | 87.8% | 4307 | 7.4% | 471 | 47 | 92 | 89 |
| 6000 | 0.3221 | 0.3318 | 8% | 611 | 85.2% | 4939 | 7.3% | 476 | 58 | 86 | 68 |
| 6000 | 0.3221 | 0.3318 | 7% | 616 | 86.0% | 4937 | 7.2% | 476 | 58 | 89 | 78 |
| 6000 | 0.3221 | 0.3318 | 6% | 620 | 86.4% | 4915 | 7.3% | 476 | 57 | 91 | 85 |
| 6000 | 0.3221 | 0.3318 | 6% | 626 | 86.8% | 4913 | 7.3% | 476 | 56 | 93 | 92 |
| 6000 | 0.3221 | 0.3318 | 5% | 631 | 87.7% | 4975 | 6.9% | 476 | 56 | 93 | 94 |
| 6000 | 0.3221 | 0.3318 | 5% | 635 | 88.1% | 4996 | 6.8% | 476 | 55 | 93 | 92 |
| 6000 | 0.3221 | 0.3318 | 5% | 640 | 88.3% | 5001 | 6.7% | 476 | 54 | 93 | 88 |
| 6000 | 0.3221 | 0.3318 | 8% | 611 | 84.8% | 5437 | 7.4% | 480 | 61 | 87 | 69 |
| 6000 | 0.3221 | 0.3318 | 7% | 616 | 85.5% | 5411 | 7.4% | 480 | 60 | 90 | 80 |
| 6000 | 0.3221 | 0.3318 | 7% | 620 | 85.9% | 5388 | 7.5% | 480 | 59 | 92 | 87 |
| 6000 | 0.3221 | 0.3318 | 6% | 626 | 86.5% | 5392 | 7.4% | 480 | 59 | 94 | 93 |
| 6000 | 0.3221 | 0.3318 | 6% | 631 | 87.6% | 5449 | 6.9% | 480 | 58 | 94 | 94 |
| 6000 | 0.3221 | 0.3318 | 5% | 635 | 87.9% | 5461 | 6.8% | 480 | 57 | 94 | 91 |
| 6000 | 0.3221 | 0.3318 | 5% | 640 | 88.2% | 5462 | 6.7% | 480 | 55 | 94 | 87 |
| 6000 | 0.3221 | 0.3318 | 8% | 611 | 83.6% | 5947 | 8.1% | 486 | 62 | 89 | 71 |
| 6000 | 0.3221 | 0.3318 | 8% | 616 | 84.3% | 5907 | 8.1% | 486 | 61 | 92 | 82 |
| 6000 | 0.3221 | 0.3318 | 7% | 620 | 84.8% | 5889 | 8.1% | 486 | 61 | 94 | 90 |
| 6000 | 0.3221 | 0.3318 | 6% | 626 | 85.9% | 5899 | 7.8% | 486 | 60 | 96 | 96 |
| 6000 | 0.3221 | 0.3318 | 6% | 631 | 86.9% | 5923 | 7.3% | 486 | 60 | 95 | 93 |
| 6000 | 0.3221 | 0.3318 | 6% | 635 | 87.2% | 5921 | 7.2% | 486 | 58 | 95 | 89 |
| 6000 | 0.3221 | 0.3318 | 5% | 640 | 87.5% | 5917 | 7.2% | 486 | 57 | 94 | 84 |
| 6000 | 0.3221 | 0.3318 | 9% | 611 | 81.4% | 6420 | 9.4% | 491 | 63 | 91 | 74 |
| 6000 | 0.3221 | 0.3318 | 8% | 616 | 82.5% | 6371 | 9.3% | 491 | 63 | 94 | 85 |
| 6000 | 0.3221 | 0.3318 | 8% | 620 | 83.3% | 6344 | 9.1% | 491 | 62 | 96 | 94 |
| 6000 | 0.3221 | 0.3318 | 7% | 626 | 85.0% | 6334 | 8.3% | 491 | 62 | 97 | 97 |
| 6000 | 0.3221 | 0.3318 | 6% | 631 | 85.6% | 6320 | 8.2% | 491 | 60 | 96 | 90 |
| 6000 | 0.3221 | 0.3318 | 6% | 635 | 86.0% | 6310 | 8.1% | 491 | 59 | 95 | 85 |
| 6000 | 0.3221 | 0.3318 | 6% | 640 | 86.4% | 6303 | 7.9% | 491 | 57 | 94 | 80 |
| 6000 | 0.3221 | 0.3318 | 10% | 611 | 79.1% | 6834 | 10.9% | 496 | 64 | 93 | 76 |
| 6000 | 0.3221 | 0.3318 | 9% | 616 | 80.7% | 6752 | 10.5% | 496 | 63 | 96 | 89 |
| 6000 | 0.3221 | 0.3318 | 8% | 620 | 81.9% | 6703 | 10.2% | 496 | 63 | 98 | 97 |
| 6000 | 0.3221 | 0.3318 | 7% | 626 | 83.6% | 6651 | 9.4% | 496 | 62 | 97 | 94 |
| 6000 | 0.3221 | 0.3318 | 6% | 631 | 84.7% | 6618 | 8.9% | 496 | 61 | 95 | 88 |
| 6000 | 0.3221 | 0.3318 | 6% | 635 | 85.5% | 6598 | 8.5% | 496 | 60 | 94 | 84 |
| 6000 | 0.3221 | 0.3318 | 6% | 640 | 86.3% | 6580 | 8.1% | 496 | 58 | 93 | 80 |
| 6000 | 0.3221 | 0.3318 | 11% | 611 | 76.4% | 7362 | 12.8% | 502 | 65 | 95 | 79 |
| 6000 | 0.3221 | 0.3318 | 9% | 616 | 78.8% | 7195 | 12.0% | 502 | 64 | 97 | 92 |
| 6000 | 0.3221 | 0.3318 | 8% | 620 | 80.6% | 7084 | 11.2% | 502 | 64 | 97 | 100 |
| 6000 | 0.3221 | 0.3318 | 7% | 626 | 82.5% | 6983 | 10.3% | 502 | 63 | 95 | 92 |
| 6000 | 0.3221 | 0.3318 | 7% | 631 | 83.8% | 6917 | 9.6% | 502 | 62 | 93 | 86 |
| 6000 | 0.3221 | 0.3318 | 6% | 635 | 84.8% | 6872 | 9.1% | 502 | 61 | 92 | 82 |
| 6000 | 0.3221 | 0.3318 | 6% | 640 | 85.7% | 6833 | 8.6% | 502 | 59 | 91 | 79 |
| 6000 | 0.3221 | 0.3318 | 12% | 611 | 73.4% | 7962 | 15.0% | 508 | 66 | 94 | 82 |
| 6000 | 0.3221 | 0.3318 | 10% | 616 | 75.7% | 7709 | 14.2% | 508 | 65 | 95 | 95 |
| 6000 | 0.3221 | 0.3318 | 8% | 620 | 79.3% | 7412 | 12.3% | 508 | 65 | 95 | 97 |
| 6000 | 0.3221 | 0.3318 | 7% | 626 | 81.8% | 7233 | 10.9% | 508 | 65 | 93 | 91 |
| 6000 | 0.3221 | 0.3318 | 6% | 631 | 83.4% | 7128 | 10.1% | 508 | 63 | 91 | 85 |
| 6000 | 0.3221 | 0.3318 | 6% | 635 | 84.3% | 7072 | 9.6% | 508 | 62 | 90 | 81 |
| 6000 | 0.3221 | 0.3318 | 6% | 640 | 85.1% | 7023 | 9.2% | 508 | 60 | 89 | 78 |
| 6000 | 0.3221 | 0.3318 | 12% | 611 | 70.3% | 8594 | 17.3% | 514 | 67 | 93 | 84 |
| 6000 | 0.3221 | 0.3318 | 10% | 616 | 73.7% | 8129 | 15.8% | 514 | 66 | 94 | 96 |
| 6000 | 0.3221 | 0.3318 | 9% | 620 | 78.2% | 7662 | 13.3% | 514 | 66 | 93 | 96 |
| 6000 | 0.3221 | 0.3318 | 7% | 626 | 81.1% | 7408 | 11.6% | 514 | 65 | 91 | 90 |
| 6000 | 0.3221 | 0.3318 | 7% | 631 | 82.6% | 7290 | 10.8% | 514 | 64 | 89 | 84 |
| 6000 | 0.3221 | 0.3318 | 6% | 635 | 83.6% | 7220 | 10.3% | 514 | 63 | 88 | 80 |
| 6000 | 0.3221 | 0.3318 | 6% | 640 | 84.5% | 7154 | 9.8% | 514 | 61 | 87 | 77 |
| 6000 | 0.3221 | 0.3318 | 13% | 611 | 65.9% | 9705 | 20.7% | 521 | 68 | 92 | 86 |
| 6000 | 0.3221 | 0.3318 | 11% | 616 | 71.6% | 8616 | 17.7% | 521 | 67 | 92 | 96 |
| 6000 | 0.3221 | 0.3318 | 9% | 620 | 76.9% | 7932 | 14.5% | 521 | 67 | 91 | 94 |
| 6000 | 0.3221 | 0.3318 | 7% | 626 | 79.7% | 7639 | 12.9% | 521 | 66 | 89 | 88 |
| 6000 | 0.3221 | 0.3318 | 7% | 631 | 81.4% | 7481 | 11.9% | 521 | 65 | 88 | 83 |
| 6000 | 0.3221 | 0.3318 | 6% | 635 | 82.6% | 7378 | 11.2% | 521 | 63 | 86 | 80 |
| 6000 | 0.3221 | 0.3318 | 6% | 640 | 84.0% | 7272 | 10.4% | 521 | 61 | 85 | 77 |
| 6000 | 0.3221 | 0.3318 | 14% | 611 | 61.4% | 11291 | 24.2% | 527 | 69 | 90 | 87 |
| 6000 | 0.3221 | 0.3318 | 11% | 616 | 69.3% | 9150 | 19.7% | 527 | 68 | 90 | 95 |
| 6000 | 0.3221 | 0.3318 | 9% | 620 | 75.2% | 8215 | 16.0% | 527 | 68 | 89 | 93 |
| 6000 | 0.3221 | 0.3318 | 8% | 626 | 78.1% | 7863 | 14.3% | 527 | 67 | 87 | 87 |
| 6000 | 0.3221 | 0.3318 | 7% | 631 | 80.4% | 7635 | 13.0% | 527 | 65 | 86 | 82 |
| 6000 | 0.3221 | 0.3318 | 6% | 635 | 82.1% | 7472 | 11.8% | 527 | 64 | 85 | 80 |
| 6000 | 0.3221 | 0.3318 | 5% | 640 | 84.2% | 7301 | 10.5% | 527 | 62 | 84 | 79 |
| 6000 | 0.3221 | 0.3318 | 16% | 611 | 54.1% | 16539 | 30.1% | 534 | 70 | 88 | 88 |
| 6000 | 0.3221 | 0.3318 | 11% | 616 | 66.3% | 9948 | 22.5% | 534 | 69 | 88 | 93 |
| 6000 | 0.3221 | 0.3318 | 9% | 620 | 72.0% | 8767 | 18.8% | 534 | 69 | 87 | 91 |
| 6000 | 0.3221 | 0.3318 | 8% | 626 | 76.0% | 8179 | 16.3% | 534 | 67 | 85 | 86 |
| 6000 | 0.3221 | 0.3318 | 6% | 631 | 79.7% | 7751 | 13.8% | 534 | 66 | 84 | 84 |
| 6000 | 0.3221 | 0.3318 | 6% | 635 | 82.4% | 7489 | 11.9% | 534 | 65 | 83 | 83 |
| 6000 | 0.3221 | 0.3318 | 5% | 640 | 84.9% | 7274 | 10.1% | 534 | 63 | 82 | 84 |

TABLE 2-continued

| | | | | | | | | | | |
|---|---|---|---|---|---|---|---|---|---|---|
| 6000 | 0.3221 | 0.3318 | 17% | 611 | 45.5% | 85478 | 37.6% | 540 | 71 | 85 | 88 |
| 6000 | 0.3221 | 0.3318 | 12% | 616 | 60.7% | 12077 | 27.5% | 540 | 70 | 86 | 92 |
| 6000 | 0.3221 | 0.3318 | 10% | 620 | 67.5% | 9743 | 22.9% | 540 | 69 | 85 | 89 |
| 6000 | 0.3221 | 0.3318 | 8% | 626 | 74.5% | 8430 | 18.0% | 540 | 68 | 83 | 87 |
| 6000 | 0.3221 | 0.3318 | 6% | 631 | 79.7% | 7781 | 14.2% | 540 | 67 | 82 | 87 |
| 6000 | 0.3221 | 0.3318 | 5% | 635 | 82.8% | 7478 | 12.0% | 540 | 66 | 82 | 87 |
| 6000 | 0.3221 | 0.3318 | 5% | 640 | 85.4% | 7250 | 10.0% | 540 | 64 | 81 | 87 |
| 5900 | 0.3240 | 0.3336 | 6% | 611 | 88.8% | 4131 | 5.7% | 467 | 47 | 82 | 65 |
| 5900 | 0.3240 | 0.3336 | 5% | 616 | 89.4% | 4131 | 5.7% | 467 | 47 | 84 | 73 |
| 5900 | 0.3240 | 0.3336 | 5% | 620 | 89.7% | 4131 | 5.7% | 467 | 46 | 85 | 79 |
| 5900 | 0.3240 | 0.3336 | 4% | 626 | 90.0% | 4131 | 5.7% | 467 | 46 | 86 | 85 |
| 5900 | 0.3240 | 0.3336 | 4% | 631 | 90.2% | 4131 | 5.7% | 467 | 46 | 88 | 90 |
| 5900 | 0.3240 | 0.3336 | 4% | 635 | 90.4% | 4131 | 5.7% | 467 | 45 | 88 | 94 |
| 5900 | 0.3240 | 0.3336 | 4% | 640 | 90.5% | 4131 | 5.7% | 467 | 44 | 89 | 98 |
| 5900 | 0.3240 | 0.3336 | 8% | 611 | 84.7% | 4198 | 7.8% | 471 | 49 | 85 | 67 |
| 5900 | 0.3240 | 0.3336 | 7% | 616 | 85.6% | 4214 | 7.7% | 471 | 49 | 88 | 76 |
| 5900 | 0.3240 | 0.3336 | 6% | 620 | 86.0% | 4212 | 7.7% | 471 | 48 | 90 | 84 |
| 5900 | 0.3240 | 0.3336 | 6% | 626 | 86.5% | 4214 | 7.7% | 471 | 48 | 92 | 90 |
| 5900 | 0.3240 | 0.3336 | 5% | 631 | 87.2% | 4268 | 7.4% | 471 | 48 | 92 | 93 |
| 5900 | 0.3240 | 0.3336 | 5% | 635 | 87.5% | 4288 | 7.3% | 471 | 48 | 93 | 92 |
| 5900 | 0.3240 | 0.3336 | 5% | 640 | 87.8% | 4296 | 7.3% | 471 | 47 | 92 | 88 |
| 5900 | 0.3240 | 0.3336 | 8% | 611 | 85.1% | 4911 | 7.2% | 476 | 58 | 86 | 68 |
| 5900 | 0.3240 | 0.3336 | 7% | 616 | 85.9% | 4910 | 7.1% | 476 | 58 | 89 | 78 |
| 5900 | 0.3240 | 0.3336 | 7% | 620 | 86.3% | 4889 | 7.2% | 476 | 57 | 91 | 85 |
| 5900 | 0.3240 | 0.3336 | 6% | 626 | 86.8% | 4892 | 7.2% | 476 | 56 | 93 | 92 |
| 5900 | 0.3240 | 0.3336 | 6% | 631 | 87.7% | 4956 | 6.8% | 476 | 56 | 93 | 94 |
| 5900 | 0.3240 | 0.3336 | 5% | 635 | 88.0% | 4971 | 6.7% | 476 | 55 | 93 | 92 |
| 5900 | 0.3240 | 0.3336 | 5% | 640 | 88.3% | 4975 | 6.6% | 476 | 54 | 93 | 87 |
| 5900 | 0.3240 | 0.3336 | 8% | 611 | 84.7% | 5397 | 7.3% | 480 | 61 | 87 | 69 |
| 5900 | 0.3240 | 0.3336 | 7% | 616 | 85.4% | 5373 | 7.3% | 480 | 60 | 90 | 80 |
| 5900 | 0.3240 | 0.3336 | 7% | 620 | 85.8% | 5350 | 7.4% | 480 | 59 | 92 | 88 |
| 5900 | 0.3240 | 0.3336 | 6% | 626 | 86.5% | 5359 | 7.2% | 480 | 59 | 94 | 94 |
| 5900 | 0.3240 | 0.3336 | 6% | 631 | 87.6% | 5415 | 6.8% | 480 | 58 | 94 | 94 |
| 5900 | 0.3240 | 0.3336 | 5% | 635 | 87.9% | 5422 | 6.7% | 480 | 57 | 94 | 91 |
| 5900 | 0.3240 | 0.3336 | 5% | 640 | 88.1% | 5423 | 6.6% | 480 | 55 | 94 | 86 |
| 5900 | 0.3240 | 0.3336 | 9% | 611 | 83.5% | 5892 | 8.0% | 486 | 62 | 89 | 71 |
| 5900 | 0.3240 | 0.3336 | 8% | 616 | 84.2% | 5854 | 8.1% | 486 | 62 | 92 | 82 |
| 5900 | 0.3240 | 0.3336 | 7% | 620 | 84.8% | 5836 | 8.0% | 486 | 61 | 94 | 91 |
| 5900 | 0.3240 | 0.3336 | 7% | 626 | 85.9% | 5851 | 7.6% | 486 | 60 | 96 | 96 |
| 5900 | 0.3240 | 0.3336 | 6% | 631 | 86.9% | 5870 | 7.2% | 486 | 60 | 96 | 93 |
| 5900 | 0.3240 | 0.3336 | 6% | 635 | 87.2% | 5867 | 7.1% | 486 | 58 | 95 | 88 |
| 5900 | 0.3240 | 0.3336 | 5% | 640 | 87.5% | 5864 | 7.1% | 486 | 57 | 94 | 83 |
| 5900 | 0.3240 | 0.3336 | 9% | 611 | 81.3% | 6347 | 9.3% | 491 | 63 | 91 | 74 |
| 5900 | 0.3240 | 0.3336 | 8% | 616 | 82.5% | 6300 | 9.2% | 491 | 63 | 94 | 86 |
| 5900 | 0.3240 | 0.3336 | 8% | 620 | 83.3% | 6273 | 9.0% | 491 | 62 | 96 | 94 |
| 5900 | 0.3240 | 0.3336 | 7% | 626 | 85.0% | 6265 | 8.2% | 491 | 62 | 97 | 97 |
| 5900 | 0.3240 | 0.3336 | 6% | 631 | 85.6% | 6251 | 8.1% | 491 | 61 | 96 | 90 |
| 5900 | 0.3240 | 0.3336 | 6% | 635 | 86.0% | 6242 | 8.0% | 491 | 59 | 95 | 84 |
| 5900 | 0.3240 | 0.3336 | 6% | 640 | 86.5% | 6237 | 7.7% | 491 | 57 | 94 | 80 |
| 5900 | 0.3240 | 0.3336 | 10% | 611 | 79.1% | 6743 | 10.8% | 496 | 64 | 93 | 76 |
| 5900 | 0.3240 | 0.3336 | 9% | 616 | 80.7% | 6665 | 10.4% | 496 | 63 | 96 | 89 |
| 5900 | 0.3240 | 0.3336 | 8% | 620 | 82.0% | 6615 | 10.0% | 496 | 63 | 98 | 97 |
| 5900 | 0.3240 | 0.3336 | 7% | 626 | 83.7% | 6567 | 9.2% | 496 | 62 | 97 | 94 |
| 5900 | 0.3240 | 0.3336 | 6% | 631 | 84.8% | 6536 | 8.7% | 496 | 61 | 95 | 88 |
| 5900 | 0.3240 | 0.3336 | 6% | 635 | 85.6% | 6516 | 8.3% | 496 | 60 | 94 | 83 |
| 5900 | 0.3240 | 0.3336 | 6% | 640 | 86.3% | 6500 | 7.9% | 496 | 58 | 92 | 79 |
| 5900 | 0.3240 | 0.3336 | 11% | 611 | 76.4% | 7245 | 12.6% | 502 | 65 | 95 | 79 |
| 5900 | 0.3240 | 0.3336 | 9% | 616 | 78.8% | 7085 | 11.8% | 502 | 65 | 96 | 91 |
| 5900 | 0.3240 | 0.3336 | 8% | 620 | 80.7% | 6977 | 11.0% | 502 | 64 | 97 | 100 |
| 5900 | 0.3240 | 0.3336 | 7% | 626 | 82.6% | 6881 | 10.1% | 502 | 63 | 95 | 92 |
| 5900 | 0.3240 | 0.3336 | 7% | 631 | 84.0% | 6817 | 9.4% | 502 | 62 | 93 | 86 |
| 5900 | 0.3240 | 0.3336 | 6% | 635 | 85.0% | 6774 | 8.9% | 502 | 61 | 92 | 82 |
| 5900 | 0.3240 | 0.3336 | 6% | 640 | 85.9% | 6738 | 8.4% | 502 | 59 | 90 | 78 |
| 5900 | 0.3240 | 0.3336 | 12% | 611 | 73.3% | 7813 | 14.9% | 508 | 66 | 94 | 81 |
| 5900 | 0.3240 | 0.3336 | 10% | 616 | 75.8% | 7569 | 14.0% | 508 | 66 | 95 | 95 |
| 5900 | 0.3240 | 0.3336 | 9% | 620 | 79.4% | 7287 | 12.1% | 508 | 65 | 95 | 97 |
| 5900 | 0.3240 | 0.3336 | 7% | 626 | 81.9% | 7115 | 10.7% | 508 | 65 | 93 | 91 |
| 5900 | 0.3240 | 0.3336 | 7% | 631 | 83.6% | 7016 | 9.9% | 508 | 64 | 91 | 85 |
| 5900 | 0.3240 | 0.3336 | 6% | 635 | 84.5% | 6963 | 9.4% | 508 | 62 | 90 | 81 |
| 5900 | 0.3240 | 0.3336 | 6% | 640 | 85.3% | 6916 | 9.0% | 508 | 60 | 88 | 77 |
| 5900 | 0.3240 | 0.3336 | 13% | 611 | 70.4% | 8401 | 17.1% | 514 | 67 | 93 | 83 |
| 5900 | 0.3240 | 0.3336 | 11% | 616 | 73.8% | 7962 | 15.6% | 514 | 66 | 94 | 96 |
| 5900 | 0.3240 | 0.3336 | 9% | 620 | 78.3% | 7520 | 13.1% | 514 | 66 | 93 | 96 |
| 5900 | 0.3240 | 0.3336 | 7% | 626 | 81.3% | 7279 | 11.4% | 514 | 66 | 91 | 90 |
| 5900 | 0.3240 | 0.3336 | 7% | 631 | 82.8% | 7167 | 10.6% | 514 | 64 | 89 | 84 |
| 5900 | 0.3240 | 0.3336 | 6% | 635 | 83.8% | 7100 | 10.1% | 514 | 63 | 88 | 80 |
| 5900 | 0.3240 | 0.3336 | 6% | 640 | 84.7% | 7037 | 9.5% | 514 | 61 | 87 | 77 |
| 5900 | 0.3240 | 0.3336 | 14% | 611 | 66.0% | 9426 | 20.4% | 521 | 68 | 92 | 85 |
| 5900 | 0.3240 | 0.3336 | 11% | 616 | 71.7% | 8417 | 17.5% | 521 | 68 | 92 | 96 |
| 5900 | 0.3240 | 0.3336 | 9% | 620 | 77.0% | 7771 | 14.3% | 521 | 67 | 91 | 94 |

TABLE 2-continued

| | | | | | | | | | | | |
|---|---|---|---|---|---|---|---|---|---|---|---|
| 5900 | 0.3240 | 0.3336 | 7% | 626 | 79.9% | 7493 | 12.6% | 521 | 66 | 89 | 88 |
| 5900 | 0.3240 | 0.3336 | 7% | 631 | 81.6% | 7342 | 11.7% | 521 | 65 | 87 | 83 |
| 5900 | 0.3240 | 0.3336 | 6% | 635 | 82.8% | 7245 | 10.9% | 521 | 64 | 86 | 79 |
| 5900 | 0.3240 | 0.3336 | 6% | 640 | 84.2% | 7144 | 10.1% | 521 | 62 | 85 | 77 |
| 5900 | 0.3240 | 0.3336 | 14% | 611 | 61.6% | 10865 | 24.0% | 527 | 69 | 90 | 87 |
| 5900 | 0.3240 | 0.3336 | 11% | 616 | 69.4% | 8909 | 19.5% | 527 | 68 | 90 | 95 |
| 5900 | 0.3240 | 0.3336 | 9% | 620 | 75.4% | 8030 | 15.7% | 527 | 68 | 89 | 93 |
| 5900 | 0.3240 | 0.3336 | 8% | 626 | 78.4% | 7698 | 14.0% | 527 | 67 | 87 | 87 |
| 5900 | 0.3240 | 0.3336 | 7% | 631 | 80.6% | 7482 | 12.6% | 527 | 66 | 86 | 82 |
| 5900 | 0.3240 | 0.3336 | 6% | 635 | 82.4% | 7329 | 11.5% | 527 | 64 | 85 | 80 |
| 5900 | 0.3240 | 0.3336 | 5% | 640 | 84.4% | 7168 | 10.1% | 527 | 62 | 84 | 79 |
| 5900 | 0.3240 | 0.3336 | 16% | 611 | 54.3% | 15395 | 29.8% | 534 | 70 | 88 | 88 |
| 5900 | 0.3240 | 0.3336 | 11% | 616 | 66.5% | 9640 | 22.2% | 534 | 69 | 88 | 93 |
| 5900 | 0.3240 | 0.3336 | 9% | 620 | 72.3% | 8532 | 18.5% | 534 | 69 | 87 | 91 |
| 5900 | 0.3240 | 0.3336 | 8% | 626 | 76.3% | 7983 | 15.9% | 534 | 68 | 85 | 86 |
| 5900 | 0.3240 | 0.3336 | 7% | 631 | 80.0% | 7584 | 13.4% | 534 | 66 | 84 | 84 |
| 5900 | 0.3240 | 0.3336 | 6% | 635 | 82.7% | 7339 | 11.6% | 534 | 65 | 83 | 83 |
| 5900 | 0.3240 | 0.3336 | 5% | 640 | 85.2% | 7136 | 9.7% | 534 | 63 | 82 | 84 |
| 5900 | 0.3240 | 0.3336 | 17% | 611 | 45.7% | 54595 | 37.2% | 540 | 71 | 86 | 87 |
| 5900 | 0.3240 | 0.3336 | 12% | 616 | 61.0% | 11496 | 27.1% | 540 | 70 | 86 | 92 |
| 5900 | 0.3240 | 0.3336 | 10% | 620 | 67.9% | 9406 | 22.4% | 540 | 69 | 85 | 90 |
| 5900 | 0.3240 | 0.3336 | 8% | 626 | 74.9% | 8204 | 17.5% | 540 | 58 | 83 | 87 |
| 5900 | 0.3240 | 0.3336 | 6% | 631 | 80.1% | 7602 | 13.8% | 540 | 67 | 82 | 87 |
| 5900 | 0.3240 | 0.3336 | 5% | 635 | 83.2% | 7319 | 11.5% | 540 | 66 | 82 | 87 |
| 5900 | 0.3240 | 0.3336 | 5% | 640 | 85.9% | 7106 | 9.5% | 540 | 64 | 81 | 87 |
| 5800 | 0.3260 | 0.3354 | 6% | 611 | 88.7% | 4131 | 5.6% | 467 | 47 | 82 | 65 |
| 5800 | 0.3260 | 0.3354 | 5% | 616 | 89.3% | 4131 | 5.6% | 467 | 47 | 84 | 73 |
| 5800 | 0.3260 | 0.3354 | 5% | 620 | 89.6% | 4131 | 5.6% | 467 | 47 | 85 | 79 |
| 5800 | 0.3260 | 0.3354 | 4% | 626 | 89.9% | 4131 | 5.6% | 467 | 46 | 87 | 85 |
| 5800 | 0.3260 | 0.3354 | 4% | 631 | 90.2% | 4131 | 5.6% | 467 | 46 | 88 | 91 |
| 5800 | 0.3260 | 0.3354 | 4% | 635 | 90.3% | 4131 | 5.6% | 467 | 45 | 89 | 95 |
| 5800 | 0.3260 | 0.3354 | 4% | 640 | 90.5% | 4131 | 5.6% | 467 | 44 | 89 | 98 |
| 5800 | 0.3260 | 0.3354 | 8% | 611 | 84.5% | 4185 | 7.7% | 471 | 48 | 85 | 67 |
| 5800 | 0.3260 | 0.3354 | 7% | 616 | 85.4% | 4202 | 7.6% | 471 | 48 | 88 | 77 |
| 5800 | 0.3260 | 0.3354 | 6% | 620 | 85.9% | 4200 | 7.6% | 471 | 48 | 90 | 84 |
| 5800 | 0.3260 | 0.3354 | 6% | 626 | 86.4% | 4208 | 7.6% | 471 | 48 | 92 | 91 |
| 5800 | 0.3260 | 0.3354 | 6% | 631 | 87.1% | 4262 | 7.3% | 471 | 48 | 93 | 93 |
| 5800 | 0.3260 | 0.3354 | 5% | 635 | 87.5% | 4279 | 7.2% | 471 | 48 | 93 | 91 |
| 5800 | 0.3260 | 0.3354 | 5% | 640 | 87.7% | 4286 | 7.2% | 471 | 47 | 92 | 88 |
| 5800 | 0.3260 | 0.3354 | 8% | 611 | 84.9% | 4884 | 7.1% | 476 | 58 | 86 | 68 |
| 5800 | 0.3260 | 0.3354 | 7% | 616 | 85.8% | 4884 | 7.1% | 476 | 58 | 89 | 78 |
| 5800 | 0.3260 | 0.3354 | 7% | 620 | 86.2% | 4863 | 7.1% | 476 | 57 | 91 | 86 |
| 5800 | 0.3260 | 0.3354 | 6% | 626 | 86.8% | 4871 | 7.0% | 476 | 56 | 93 | 92 |
| 5800 | 0.3260 | 0.3354 | 6% | 631 | 87.7% | 4934 | 6.6% | 476 | 56 | 94 | 94 |
| 5800 | 0.3260 | 0.3354 | 5% | 635 | 88.0% | 4946 | 6.6% | 476 | 55 | 93 | 91 |
| 5800 | 0.3260 | 0.3354 | 5% | 640 | 88.2% | 4949 | 6.5% | 476 | 53 | 93 | 86 |
| 5800 | 0.3260 | 0.3354 | 8% | 611 | 84.5% | 5357 | 7.2% | 480 | 61 | 88 | 69 |
| 5800 | 0.3260 | 0.3354 | 7% | 616 | 85.3% | 5334 | 7.2% | 480 | 60 | 91 | 80 |
| 5800 | 0.3260 | 0.3354 | 7% | 620 | 85.7% | 5312 | 7.3% | 480 | 59 | 93 | 88 |
| 5800 | 0.3260 | 0.3354 | 6% | 626 | 86.5% | 5327 | 7.1% | 480 | 59 | 94 | 94 |
| 5800 | 0.3260 | 0.3354 | 6% | 631 | 87.5% | 5379 | 6.6% | 480 | 58 | 95 | 94 |
| 5800 | 0.3260 | 0.3354 | 6% | 635 | 87.8% | 5384 | 6.6% | 480 | 57 | 94 | 90 |
| 5800 | 0.3260 | 0.3354 | 5% | 640 | 88.1% | 5384 | 6.5% | 480 | 55 | 93 | 85 |
| 5800 | 0.3260 | 0.3354 | 9% | 611 | 83.3% | 5838 | 7.9% | 486 | 63 | 89 | 71 |
| 5800 | 0.3260 | 0.3354 | 8% | 616 | 84.1% | 5800 | 7.9% | 486 | 62 | 92 | 82 |
| 5800 | 0.3260 | 0.3354 | 7% | 620 | 84.7% | 5783 | 7.9% | 486 | 61 | 94 | 91 |
| 5800 | 0.3260 | 0.3354 | 7% | 626 | 85.9% | 5802 | 7.4% | 486 | 61 | 96 | 96 |
| 5800 | 0.3260 | 0.3354 | 6% | 631 | 86.8% | 5817 | 7.1% | 486 | 60 | 96 | 92 |
| 5800 | 0.3260 | 0.3354 | 6% | 635 | 87.1% | 5814 | 7.0% | 486 | 59 | 95 | 87 |
| 5800 | 0.3260 | 0.3354 | 6% | 640 | 87.4% | 5811 | 7.0% | 486 | 57 | 94 | 82 |
| 5800 | 0.3260 | 0.3354 | 10% | 611 | 81.2% | 6275 | 9.2% | 491 | 64 | 91 | 73 |
| 5800 | 0.3260 | 0.3354 | 9% | 616 | 82.4% | 6229 | 9.0% | 491 | 63 | 94 | 86 |
| 5800 | 0.3260 | 0.3354 | 8% | 620 | 83.3% | 6204 | 8.9% | 491 | 62 | 96 | 94 |
| 5800 | 0.3260 | 0.3354 | 7% | 626 | 85.0% | 6196 | 8.1% | 491 | 62 | 97 | 96 |
| 5800 | 0.3260 | 0.3354 | 6% | 631 | 85.6% | 6182 | 7.9% | 491 | 61 | 96 | 89 |
| 5800 | 0.3260 | 0.3354 | 6% | 635 | 86.0% | 6174 | 7.8% | 491 | 59 | 95 | 84 |
| 5800 | 0.3260 | 0.3354 | 6% | 640 | 86.7% | 6172 | 7.5% | 491 | 57 | 93 | 79 |
| 5800 | 0.3260 | 0.3354 | 10% | 611 | 79.0% | 6654 | 10.7% | 496 | 64 | 93 | 76 |
| 5800 | 0.3260 | 0.3354 | 9% | 616 | 80.6% | 6578 | 10.3% | 496 | 64 | 96 | 89 |
| 5800 | 0.3260 | 0.3354 | 8% | 620 | 82.0% | 6529 | 9.8% | 496 | 63 | 98 | 97 |
| 5800 | 0.3260 | 0.3354 | 7% | 626 | 83.7% | 6484 | 9.0% | 496 | 63 | 97 | 94 |
| 5800 | 0.3260 | 0.3354 | 7% | 631 | 84.9% | 6454 | 8.5% | 496 | 61 | 95 | 87 |
| 5800 | 0.3260 | 0.3354 | 6% | 635 | 85.7% | 6436 | 8.1% | 496 | 60 | 93 | 83 |
| 5800 | 0.3260 | 0.3354 | 6% | 640 | 86.4% | 6420 | 7.8% | 496 | 58 | 92 | 79 |
| 5800 | 0.3260 | 0.3354 | 11% | 611 | 76.4% | 7131 | 12.5% | 502 | 65 | 95 | 78 |
| 5800 | 0.3260 | 0.3354 | 10% | 616 | 78.8% | 6977 | 11.7% | 502 | 65 | 96 | 91 |
| 5800 | 0.3260 | 0.3354 | 8% | 620 | 80.8% | 6872 | 10.8% | 502 | 64 | 97 | 100 |
| 5800 | 0.3260 | 0.3354 | 7% | 626 | 82.7% | 6781 | 9.9% | 502 | 64 | 95 | 92 |
| 5800 | 0.3260 | 0.3354 | 7% | 631 | 84.1% | 6719 | 9.2% | 502 | 63 | 93 | 85 |
| 5800 | 0.3260 | 0.3354 | 6% | 635 | 85.1% | 6678 | 8.6% | 502 | 61 | 92 | 82 |

TABLE 2-continued

| | | | | | | | | | | | |
|---|---|---|---|---|---|---|---|---|---|---|---|
| 5800 | 0.3260 | 0.3354 | 6% | 640 | 86.0% | 6644 | 8.2% | 502 | 59 | 90 | 78 |
| 5800 | 0.3260 | 0.3354 | 12% | 611 | 73.3% | 7668 | 14.7% | 508 | 66 | 94 | 81 |
| 5800 | 0.3260 | 0.3354 | 10% | 616 | 75.9% | 7432 | 13.8% | 508 | 66 | 95 | 95 |
| 5800 | 0.3260 | 0.3354 | 9% | 620 | 79.5% | 7165 | 11.9% | 508 | 65 | 95 | 97 |
| 5800 | 0.3260 | 0.3354 | 7% | 626 | 82.1% | 7000 | 10.5% | 508 | 65 | 93 | 91 |
| 5800 | 0.3260 | 0.3354 | 7% | 631 | 83.7% | 6906 | 9.6% | 508 | 64 | 91 | 85 |
| 5800 | 0.3260 | 0.3354 | 6% | 635 | 84.6% | 6855 | 9.2% | 508 | 62 | 90 | 81 |
| 5800 | 0.3260 | 0.3354 | 6% | 640 | 85.5% | 6810 | 8.7% | 508 | 60 | 88 | 77 |
| 5800 | 0.3260 | 0.3354 | 13% | 611 | 70.4% | 8213 | 16.9% | 514 | 67 | 93 | 83 |
| 5800 | 0.3260 | 0.3354 | 11% | 616 | 73.9% | 7800 | 15.4% | 514 | 67 | 94 | 96 |
| 5800 | 0.3260 | 0.3354 | 9% | 620 | 78.4% | 7382 | 12.8% | 514 | 66 | 93 | 96 |
| 5800 | 0.3260 | 0.3354 | 7% | 626 | 81.4% | 7153 | 11.1% | 514 | 66 | 91 | 90 |
| 5800 | 0.3260 | 0.3354 | 7% | 631 | 83.0% | 7046 | 10.3% | 514 | 64 | 89 | 84 |
| 5800 | 0.3260 | 0.3354 | 6% | 635 | 83.9% | 6982 | 9.8% | 514 | 63 | 88 | 80 |
| 5800 | 0.3260 | 0.3354 | 6% | 640 | 84.9% | 6922 | 9.2% | 514 | 61 | 87 | 76 |
| 5800 | 0.3260 | 0.3354 | 14% | 611 | 66.1% | 9160 | 20.2% | 521 | 69 | 92 | 85 |
| 5800 | 0.3260 | 0.3354 | 11% | 616 | 71.8% | 8224 | 17.2% | 521 | 68 | 92 | 96 |
| 5800 | 0.3260 | 0.3354 | 9% | 620 | 77.1% | 7615 | 14.0% | 521 | 67 | 91 | 94 |
| 5800 | 0.3260 | 0.3354 | 8% | 626 | 80.1% | 7350 | 12.3% | 521 | 66 | 89 | 88 |
| 5800 | 0.3260 | 0.3354 | 7% | 631 | 81.8% | 7207 | 11.3% | 521 | 65 | 87 | 83 |
| 5800 | 0.3260 | 0.3354 | 6% | 635 | 83.1% | 7114 | 10.6% | 521 | 64 | 86 | 79 |
| 5800 | 0.3260 | 0.3354 | 6% | 640 | 84.5% | 7019 | 9.8% | 521 | 62 | 85 | 77 |
| 5800 | 0.3260 | 0.3354 | 15% | 611 | 61.7% | 10465 | 23.7% | 527 | 69 | 90 | 87 |
| 5800 | 0.3260 | 0.3354 | 11% | 616 | 69.6% | 8677 | 19.2% | 527 | 69 | 90 | 95 |
| 5800 | 0.3260 | 0.3354 | 9% | 620 | 75.6% | 7851 | 15.4% | 527 | 68 | 89 | 93 |
| 5800 | 0.3260 | 0.3354 | 8% | 626 | 78.6% | 7537 | 13.7% | 527 | 67 | 87 | 87 |
| 5800 | 0.3260 | 0.3354 | 7% | 631 | 80.9% | 7334 | 12.3% | 527 | 66 | 86 | 82 |
| 5800 | 0.3260 | 0.3354 | 6% | 635 | 82.7% | 7190 | 11.1% | 527 | 64 | 85 | 80 |
| 5800 | 0.3260 | 0.3354 | 6% | 640 | 84.7% | 7038 | 9.8% | 527 | 62 | 84 | 79 |
| 5800 | 0.3260 | 0.3354 | 16% | 611 | 54.6% | 14384 | 29.5% | 534 | 70 | 88 | 88 |
| 5800 | 0.3260 | 0.3354 | 11% | 616 | 66.6% | 9347 | 21.9% | 534 | 70 | 88 | 93 |
| 5800 | 0.3260 | 0.3354 | 9% | 620 | 72.6% | 8306 | 18.1% | 534 | 69 | 87 | 91 |
| 5800 | 0.3260 | 0.3354 | 8% | 626 | 76.6% | 7795 | 15.5% | 534 | 68 | 86 | 86 |
| 5800 | 0.3260 | 0.3354 | 7% | 631 | 80.3% | 7423 | 13.0% | 534 | 66 | 84 | 84 |
| 5800 | 0.3260 | 0.3354 | 6% | 635 | 83.0% | 7193 | 11.1% | 534 | 65 | 83 | 83 |
| 5800 | 0.3260 | 0.3354 | 5% | 640 | 85.6% | 7003 | 9.3% | 534 | 63 | 82 | 83 |
| 5800 | 0.3260 | 0.3354 | 17% | 611 | 45.9% | 40283 | 36.9% | 540 | 72 | 86 | 87 |
| 5800 | 0.3260 | 0.3354 | 12% | 616 | 61.3% | 10964 | 26.7% | 540 | 70 | 86 | 92 |
| 5800 | 0.3260 | 0.3354 | 10% | 620 | 68.3% | 9089 | 22.0% | 540 | 69 | 85 | 90 |
| 5800 | 0.3260 | 0.3354 | 8% | 626 | 75.3% | 7987 | 17.0% | 540 | 68 | 83 | 87 |
| 5800 | 0.3260 | 0.3354 | 6% | 631 | 80.5% | 7430 | 13.3% | 540 | 67 | 82 | 87 |
| 5800 | 0.3260 | 0.3354 | 5% | 635 | 83.6% | 7166 | 11.0% | 540 | 66 | 82 | 87 |
| 5800 | 0.3260 | 0.3354 | 5% | 640 | 86.4% | 6966 | 9.0% | 540 | 64 | 81 | 87 |
| 5700 | 0.3281 | 0.3372 | 6% | 611 | 88.5% | 4131 | 5.5% | 467 | 47 | 82 | 65 |
| 5700 | 0.3281 | 0.3372 | 5% | 616 | 89.2% | 4131 | 5.5% | 467 | 47 | 84 | 73 |
| 5700 | 0.3281 | 0.3372 | 5% | 620 | 89.5% | 4131 | 5.5% | 467 | 47 | 85 | 79 |
| 5700 | 0.3281 | 0.3372 | 5% | 626 | 89.9% | 4131 | 5.5% | 467 | 46 | 87 | 86 |
| 5700 | 0.3281 | 0.3372 | 4% | 631 | 90.1% | 4131 | 5.5% | 467 | 46 | 88 | 92 |
| 5700 | 0.3281 | 0.3372 | 4% | 635 | 90.3% | 4131 | 5.5% | 467 | 45 | 89 | 96 |
| 5700 | 0.3281 | 0.3372 | 4% | 640 | 90.4% | 4131 | 5.5% | 467 | 44 | 90 | 99 |
| 5700 | 0.3281 | 0.3372 | 8% | 611 | 84.4% | 4172 | 7.7% | 471 | 48 | 85 | 67 |
| 5700 | 0.3281 | 0.3372 | 7% | 616 | 85.3% | 4191 | 7.5% | 471 | 48 | 88 | 77 |
| 5700 | 0.3281 | 0.3372 | 7% | 620 | 85.8% | 4189 | 7.5% | 471 | 48 | 90 | 84 |
| 5700 | 0.3281 | 0.3372 | 6% | 626 | 86.4% | 4203 | 7.5% | 471 | 48 | 92 | 91 |
| 5700 | 0.3281 | 0.3372 | 6% | 631 | 87.1% | 4255 | 7.2% | 471 | 48 | 93 | 93 |
| 5700 | 0.3281 | 0.3372 | 5% | 635 | 87.4% | 4270 | 7.1% | 471 | 48 | 93 | 91 |
| 5700 | 0.3281 | 0.3372 | 5% | 640 | 87.7% | 4277 | 7.1% | 471 | 47 | 92 | 87 |
| 5700 | 0.3281 | 0.3372 | 8% | 611 | 84.8% | 4856 | 7.0% | 476 | 58 | 86 | 68 |
| 5700 | 0.3281 | 0.3372 | 7% | 616 | 85.7% | 4857 | 7.0% | 476 | 58 | 89 | 78 |
| 5700 | 0.3281 | 0.3372 | 7% | 620 | 86.1% | 4837 | 7.0% | 476 | 57 | 92 | 86 |
| 5700 | 0.3281 | 0.3372 | 6% | 626 | 86.7% | 4852 | 6.9% | 476 | 56 | 93 | 93 |
| 5700 | 0.3281 | 0.3372 | 6% | 631 | 87.6% | 4911 | 6.5% | 476 | 56 | 94 | 94 |
| 5700 | 0.3281 | 0.3372 | 6% | 635 | 87.9% | 4920 | 6.5% | 476 | 55 | 94 | 90 |
| 5700 | 0.3281 | 0.3372 | 5% | 640 | 88.2% | 4924 | 6.4% | 476 | 53 | 93 | 85 |
| 5700 | 0.3281 | 0.3372 | 8% | 611 | 84.4% | 5317 | 7.1% | 480 | 61 | 88 | 69 |
| 5700 | 0.3281 | 0.3372 | 8% | 616 | 85.2% | 5296 | 7.1% | 480 | 60 | 91 | 80 |
| 5700 | 0.3281 | 0.3372 | 7% | 620 | 85.6% | 5274 | 7.2% | 480 | 60 | 93 | 88 |
| 5700 | 0.3281 | 0.3372 | 7% | 626 | 86.5% | 5295 | 7.0% | 480 | 59 | 94 | 94 |
| 5700 | 0.3281 | 0.3372 | 6% | 631 | 87.5% | 5342 | 6.5% | 480 | 58 | 95 | 93 |
| 5700 | 0.3281 | 0.3372 | 6% | 635 | 87.8% | 5346 | 6.5% | 480 | 57 | 94 | 89 |
| 5700 | 0.3281 | 0.3372 | 6% | 640 | 88.0% | 5345 | 6.4% | 480 | 55 | 93 | 84 |
| 5700 | 0.3281 | 0.3372 | 9% | 611 | 83.2% | 5783 | 7.8% | 486 | 63 | 89 | 71 |
| 5700 | 0.3281 | 0.3372 | 8% | 616 | 84.0% | 5747 | 7.8% | 486 | 62 | 92 | 83 |
| 5700 | 0.3281 | 0.3372 | 8% | 620 | 84.6% | 5731 | 7.8% | 486 | 61 | 95 | 91 |
| 5700 | 0.3281 | 0.3372 | 7% | 626 | 86.0% | 5754 | 7.3% | 486 | 61 | 96 | 96 |
| 5700 | 0.3281 | 0.3372 | 6% | 631 | 86.8% | 5764 | 7.0% | 486 | 60 | 96 | 92 |
| 5700 | 0.3281 | 0.3372 | 6% | 635 | 87.1% | 5761 | 6.9% | 486 | 59 | 95 | 86 |
| 5700 | 0.3281 | 0.3372 | 6% | 640 | 87.4% | 5760 | 6.8% | 486 | 57 | 94 | 81 |
| 5700 | 0.3281 | 0.3372 | 10% | 611 | 81.1% | 6204 | 9.1% | 491 | 64 | 91 | 73 |
| 5700 | 0.3281 | 0.3372 | 9% | 616 | 82.4% | 6159 | 8.9% | 491 | 63 | 95 | 86 |

TABLE 2-continued

| | | | | | | | | | | | |
|---|---|---|---|---|---|---|---|---|---|---|---|
| 5700 | 0.3281 | 0.3372 | 8% | 620 | 83.3% | 6135 | 8.7% | 491 | 62 | 97 | 95 |
| 5700 | 0.3281 | 0.3372 | 7% | 626 | 85.0% | 6128 | 8.0% | 491 | 62 | 97 | 96 |
| 5700 | 0.3281 | 0.3372 | 7% | 631 | 85.5% | 6114 | 7.8% | 491 | 61 | 96 | 88 |
| 5700 | 0.3281 | 0.3372 | 6% | 635 | 86.0% | 6107 | 7.7% | 491 | 59 | 95 | 83 |
| 5700 | 0.3281 | 0.3372 | 6% | 640 | 86.8% | 6108 | 7.3% | 491 | 58 | 93 | 79 |
| 5700 | 0.3281 | 0.3372 | 11% | 611 | 78.9% | 6566 | 10.5% | 496 | 65 | 93 | 75 |
| 5700 | 0.3281 | 0.3372 | 9% | 616 | 80.6% | 6492 | 10.2% | 496 | 64 | 96 | 89 |
| 5700 | 0.3281 | 0.3372 | 8% | 620 | 82.1% | 6444 | 9.6% | 496 | 63 | 98 | 97 |
| 5700 | 0.3281 | 0.3372 | 7% | 626 | 83.8% | 6402 | 8.9% | 496 | 63 | 97 | 94 |
| 5700 | 0.3281 | 0.3372 | 7% | 631 | 85.0% | 6374 | 8.3% | 496 | 62 | 95 | 87 |
| 5700 | 0.3281 | 0.3372 | 6% | 635 | 85.8% | 6356 | 7.9% | 496 | 60 | 93 | 82 |
| 5700 | 0.3281 | 0.3372 | 6% | 640 | 86.5% | 6341 | 7.6% | 496 | 58 | 92 | 78 |
| 5700 | 0.3281 | 0.3372 | 11% | 611 | 76.3% | 7019 | 12.3% | 502 | 66 | 95 | 78 |
| 5700 | 0.3281 | 0.3372 | 10% | 616 | 78.8% | 6871 | 11.5% | 502 | 65 | 96 | 91 |
| 5700 | 0.3281 | 0.3372 | 9% | 620 | 80.8% | 6770 | 10.6% | 502 | 65 | 97 | 100 |
| 5700 | 0.3281 | 0.3372 | 8% | 626 | 82.8% | 6682 | 9.6% | 502 | 64 | 95 | 92 |
| 5700 | 0.3281 | 0.3372 | 7% | 631 | 84.3% | 6622 | 8.9% | 502 | 63 | 93 | 85 |
| 5700 | 0.3281 | 0.3372 | 6% | 635 | 85.3% | 6584 | 8.4% | 502 | 61 | 91 | 81 |
| 5700 | 0.3281 | 0.3372 | 6% | 640 | 86.1% | 6551 | 7.9% | 502 | 59 | 90 | 77 |
| 5700 | 0.3281 | 0.3372 | 12% | 611 | 73.3% | 7525 | 14.5% | 508 | 67 | 94 | 81 |
| 5700 | 0.3281 | 0.3372 | 10% | 616 | 75.9% | 7298 | 13.6% | 508 | 66 | 95 | 95 |
| 5700 | 0.3281 | 0.3372 | 9% | 620 | 79.6% | 7045 | 11.6% | 508 | 66 | 95 | 97 |
| 5700 | 0.3281 | 0.3372 | 8% | 626 | 82.2% | 6888 | 10.2% | 508 | 65 | 93 | 91 |
| 5700 | 0.3281 | 0.3372 | 7% | 631 | 83.8% | 6798 | 9.4% | 508 | 64 | 91 | 85 |
| 5700 | 0.3281 | 0.3372 | 6% | 635 | 84.8% | 6749 | 8.9% | 508 | 62 | 89 | 81 |
| 5700 | 0.3281 | 0.3372 | 6% | 640 | 85.6% | 6706 | 8.4% | 508 | 60 | 88 | 76 |
| 5700 | 0.3281 | 0.3372 | 13% | 611 | 70.5% | 8031 | 16.7% | 514 | 68 | 93 | 83 |
| 5700 | 0.3281 | 0.3372 | 11% | 616 | 73.9% | 7643 | 15.2% | 514 | 67 | 94 | 96 |
| 5700 | 0.3281 | 0.3372 | 9% | 620 | 78.5% | 7248 | 12.6% | 514 | 67 | 93 | 96 |
| 5700 | 0.3281 | 0.3372 | 8% | 626 | 81.6% | 7030 | 10.9% | 514 | 66 | 91 | 90 |
| 5700 | 0.3281 | 0.3372 | 7% | 631 | 83.1% | 6928 | 10.0% | 514 | 64 | 89 | 84 |
| 5700 | 0.3281 | 0.3372 | 6% | 635 | 84.1% | 6866 | 9.5% | 514 | 63 | 88 | 80 |
| 5700 | 0.3281 | 0.3372 | 6% | 640 | 85.1% | 6809 | 8.9% | 514 | 61 | 87 | 76 |
| 5700 | 0.3281 | 0.3372 | 14% | 611 | 66.2% | 8904 | 19.9% | 521 | 69 | 92 | 85 |
| 5700 | 0.3281 | 0.3372 | 11% | 616 | 71.9% | 8037 | 17.0% | 521 | 68 | 92 | 96 |
| 5700 | 0.3281 | 0.3372 | 9% | 620 | 77.3% | 7463 | 13.7% | 521 | 68 | 91 | 94 |
| 5700 | 0.3281 | 0.3372 | 8% | 626 | 80.3% | 7211 | 12.0% | 521 | 67 | 89 | 88 |
| 5700 | 0.3281 | 0.3372 | 7% | 631 | 82.1% | 7075 | 11.0% | 521 | 65 | 87 | 83 |
| 5700 | 0.3281 | 0.3372 | 6% | 635 | 83.3% | 6987 | 10.3% | 521 | 64 | 86 | 79 |
| 5700 | 0.3281 | 0.3372 | 6% | 640 | 84.7% | 6897 | 9.4% | 521 | 62 | 85 | 76 |
| 5700 | 0.3281 | 0.3372 | 15% | 611 | 61.8% | 10087 | 23.4% | 527 | 70 | 90 | 86 |
| 5700 | 0.3281 | 0.3372 | 11% | 616 | 69.7% | 8454 | 18.9% | 527 | 69 | 90 | 95 |
| 5700 | 0.3281 | 0.3372 | 9% | 620 | 75.8% | 7678 | 15.1% | 527 | 68 | 89 | 93 |
| 5700 | 0.3281 | 0.3372 | 8% | 626 | 78.9% | 7382 | 13.3% | 527 | 67 | 87 | 87 |
| 5700 | 0.3281 | 0.3372 | 7% | 631 | 81.1% | 7190 | 11.9% | 527 | 66 | 86 | 82 |
| 5700 | 0.3281 | 0.3372 | 6% | 635 | 82.9% | 7054 | 10.8% | 527 | 64 | 85 | 80 |
| 5700 | 0.3281 | 0.3372 | 6% | 640 | 85.0% | 6911 | 9.4% | 527 | 62 | 84 | 79 |
| 5700 | 0.3281 | 0.3372 | 16% | 611 | 54.8% | 13501 | 29.1% | 534 | 71 | 88 | 87 |
| 5700 | 0.3281 | 0.3372 | 12% | 616 | 66.8% | 9069 | 21.6% | 534 | 70 | 88 | 93 |
| 5700 | 0.3281 | 0.3372 | 9% | 620 | 72.9% | 8089 | 17.7% | 534 | 69 | 87 | 91 |
| 5700 | 0.3281 | 0.3372 | 8% | 626 | 76.9% | 7614 | 15.1% | 534 | 68 | 86 | 86 |
| 5700 | 0.3281 | 0.3372 | 7% | 631 | 80.7% | 7267 | 12.6% | 534 | 66 | 84 | 84 |
| 5700 | 0.3281 | 0.3372 | 6% | 635 | 83.4% | 7052 | 10.7% | 534 | 65 | 83 | 83 |
| 5700 | 0.3281 | 0.3372 | 5% | 640 | 86.0% | 6873 | 8.9% | 534 | 64 | 82 | 83 |
| 5700 | 0.3281 | 0.3372 | 17% | 611 | 46.2% | 31924 | 36.5% | 540 | 72 | 86 | 87 |
| 5700 | 0.3281 | 0.3372 | 12% | 616 | 61.6% | 10478 | 26.2% | 540 | 71 | 86 | 92 |
| 5700 | 0.3281 | 0.3372 | 10% | 620 | 68.6% | 8791 | 21.5% | 540 | 70 | 85 | 90 |
| 5700 | 0.3281 | 0.3372 | 8% | 626 | 75.7% | 7781 | 16.5% | 540 | 68 | 84 | 87 |
| 5700 | 0.3281 | 0.3372 | 6% | 631 | 81.0% | 7265 | 12.7% | 540 | 67 | 83 | 87 |
| 5700 | 0.3281 | 0.3372 | 5% | 635 | 84.1% | 7018 | 10.5% | 540 | 66 | 82 | 87 |
| 5700 | 0.3281 | 0.3372 | 5% | 640 | 86.8% | 6831 | 8.4% | 540 | 64 | 81 | 87 |
| 5600 | 0.3302 | 0.3391 | 6% | 611 | 88.4% | 4131 | 5.4% | 467 | 48 | 82 | 65 |
| 5600 | 0.3302 | 0.3391 | 6% | 616 | 89.0% | 4131 | 5.4% | 467 | 47 | 84 | 73 |
| 5600 | 0.3302 | 0.3391 | 5% | 620 | 89.4% | 4131 | 5.4% | 467 | 47 | 86 | 80 |
| 5600 | 0.3302 | 0.3391 | 5% | 626 | 89.8% | 4131 | 5.4% | 467 | 47 | 87 | 87 |
| 5600 | 0.3302 | 0.3391 | 5% | 631 | 90.0% | 4131 | 5.3% | 467 | 46 | 89 | 93 |
| 5600 | 0.3302 | 0.3391 | 4% | 635 | 90.2% | 4131 | 5.3% | 467 | 45 | 89 | 97 |
| 5600 | 0.3302 | 0.3391 | 4% | 640 | 90.4% | 4131 | 5.3% | 467 | 44 | 90 | 98 |
| 5600 | 0.3302 | 0.3391 | 8% | 611 | 84.2% | 4160 | 7.6% | 471 | 48 | 86 | 67 |
| 5600 | 0.3302 | 0.3391 | 7% | 616 | 85.2% | 4179 | 7.4% | 471 | 48 | 89 | 77 |
| 5600 | 0.3302 | 0.3391 | 7% | 620 | 85.7% | 4178 | 7.4% | 471 | 48 | 91 | 85 |
| 5600 | 0.3302 | 0.3391 | 6% | 626 | 86.3% | 4199 | 7.3% | 471 | 48 | 92 | 92 |
| 5600 | 0.3302 | 0.3391 | 6% | 631 | 87.1% | 4247 | 7.1% | 471 | 48 | 93 | 93 |
| 5600 | 0.3302 | 0.3391 | 6% | 635 | 87.4% | 4260 | 7.0% | 471 | 48 | 93 | 90 |
| 5600 | 0.3302 | 0.3391 | 5% | 640 | 87.6% | 4267 | 6.9% | 471 | 47 | 92 | 86 |
| 5600 | 0.3302 | 0.3391 | 8% | 611 | 84.6% | 4828 | 7.0% | 476 | 58 | 87 | 68 |
| 5600 | 0.3302 | 0.3391 | 8% | 616 | 85.6% | 4831 | 6.9% | 476 | 58 | 90 | 78 |
| 5600 | 0.3302 | 0.3391 | 7% | 620 | 86.0% | 4812 | 6.9% | 476 | 57 | 92 | 87 |
| 5600 | 0.3302 | 0.3391 | 7% | 626 | 86.7% | 4834 | 6.8% | 476 | 57 | 93 | 93 |
| 5600 | 0.3302 | 0.3391 | 6% | 631 | 87.6% | 4887 | 6.4% | 476 | 56 | 94 | 93 |

TABLE 2-continued

| | | | | | | | | | | |
|---|---|---|---|---|---|---|---|---|---|---|
| 5600 | 0.3302 | 0.3391 | 6% | 635 | 87.9% | 4895 | 6.4% | 476 | 55 | 94 | 89 |
| 5600 | 0.3302 | 0.3391 | 6% | 640 | 88.1% | 4898 | 6.3% | 476 | 53 | 93 | 84 |
| 5600 | 0.3302 | 0.3391 | 9% | 611 | 84.3% | 5278 | 7.0% | 480 | 61 | 88 | 69 |
| 5600 | 0.3302 | 0.3391 | 8% | 616 | 85.1% | 5257 | 7.0% | 480 | 61 | 91 | 80 |
| 5600 | 0.3302 | 0.3391 | 7% | 620 | 85.5% | 5237 | 7.1% | 480 | 60 | 93 | 89 |
| 5600 | 0.3302 | 0.3391 | 7% | 626 | 86.5% | 5265 | 6.8% | 480 | 59 | 95 | 95 |
| 5600 | 0.3302 | 0.3391 | 6% | 631 | 87.4% | 5305 | 6.4% | 480 | 58 | 95 | 93 |
| 5600 | 0.3302 | 0.3391 | 6% | 635 | 87.7% | 5307 | 6.4% | 480 | 57 | 94 | 88 |
| 5600 | 0.3302 | 0.3391 | 6% | 640 | 88.0% | 5307 | 6.3% | 480 | 55 | 93 | 83 |
| 5600 | 0.3302 | 0.3391 | 9% | 611 | 83.1% | 5729 | 7.7% | 486 | 63 | 89 | 71 |
| 5600 | 0.3302 | 0.3391 | 8% | 616 | 83.9% | 5694 | 7.7% | 486 | 62 | 93 | 83 |
| 5600 | 0.3302 | 0.3391 | 8% | 620 | 84.6% | 5678 | 7.7% | 486 | 61 | 95 | 91 |
| 5600 | 0.3302 | 0.3391 | 7% | 626 | 86.0% | 5707 | 7.1% | 486 | 61 | 96 | 96 |
| 5600 | 0.3302 | 0.3391 | 6% | 631 | 86.7% | 5711 | 6.9% | 486 | 60 | 96 | 91 |
| 5600 | 0.3302 | 0.3391 | 6% | 635 | 87.1% | 5709 | 6.8% | 486 | 59 | 95 | 86 |
| 5600 | 0.3302 | 0.3391 | 6% | 640 | 87.4% | 5709 | 6.7% | 486 | 57 | 93 | 80 |
| 5600 | 0.3302 | 0.3391 | 10% | 611 | 81.0% | 6133 | 9.0% | 491 | 64 | 91 | 73 |
| 5600 | 0.3302 | 0.3391 | 9% | 616 | 82.3% | 6090 | 8.8% | 491 | 63 | 95 | 86 |
| 5600 | 0.3302 | 0.3391 | 8% | 620 | 83.3% | 6067 | 8.6% | 491 | 63 | 97 | 95 |
| 5600 | 0.3302 | 0.3391 | 7% | 626 | 84.9% | 6061 | 7.8% | 491 | 62 | 97 | 96 |
| 5600 | 0.3302 | 0.3391 | 7% | 631 | 85.5% | 6047 | 7.7% | 491 | 61 | 96 | 88 |
| 5600 | 0.3302 | 0.3391 | 6% | 635 | 86.1% | 6043 | 7.5% | 491 | 60 | 94 | 83 |
| 5600 | 0.3302 | 0.3391 | 6% | 640 | 86.9% | 6044 | 7.1% | 491 | 58 | 93 | 78 |
| 5600 | 0.3302 | 0.3391 | 11% | 611 | 78.9% | 6478 | 10.4% | 496 | 65 | 93 | 75 |
| 5600 | 0.3302 | 0.3391 | 9% | 616 | 80.5% | 6408 | 10.1% | 496 | 64 | 96 | 89 |
| 5600 | 0.3302 | 0.3391 | 8% | 620 | 82.1% | 6361 | 9.4% | 496 | 64 | 98 | 97 |
| 5600 | 0.3302 | 0.3391 | 8% | 626 | 83.8% | 6321 | 8.7% | 496 | 63 | 97 | 93 |
| 5600 | 0.3302 | 0.3391 | 7% | 631 | 85.0% | 6294 | 8.1% | 496 | 62 | 94 | 86 |
| 5600 | 0.3302 | 0.3391 | 6% | 635 | 85.8% | 6278 | 7.7% | 496 | 61 | 93 | 82 |
| 5600 | 0.3302 | 0.3391 | 6% | 640 | 86.6% | 6264 | 7.4% | 496 | 58 | 92 | 77 |
| 5600 | 0.3302 | 0.3391 | 12% | 611 | 76.3% | 6909 | 12.2% | 502 | 66 | 94 | 78 |
| 5600 | 0.3302 | 0.3391 | 10% | 616 | 78.8% | 6766 | 11.3% | 502 | 65 | 96 | 91 |
| 5600 | 0.3302 | 0.3391 | 9% | 620 | 80.9% | 6669 | 10.4% | 502 | 65 | 97 | 99 |
| 5600 | 0.3302 | 0.3391 | 8% | 626 | 82.9% | 6584 | 9.4% | 502 | 64 | 95 | 91 |
| 5600 | 0.3302 | 0.3391 | 7% | 631 | 84.4% | 6527 | 8.7% | 502 | 63 | 93 | 85 |
| 5600 | 0.3302 | 0.3391 | 6% | 635 | 85.4% | 6491 | 8.2% | 502 | 62 | 91 | 81 |
| 5600 | 0.3302 | 0.3391 | 6% | 640 | 86.3% | 6460 | 7.7% | 502 | 59 | 90 | 77 |
| 5600 | 0.3302 | 0.3391 | 12% | 611 | 73.3% | 7386 | 14.3% | 508 | 67 | 94 | 80 |
| 5600 | 0.3302 | 0.3391 | 11% | 616 | 76.0% | 7167 | 13.4% | 508 | 66 | 95 | 95 |
| 5600 | 0.3302 | 0.3391 | 9% | 620 | 79.7% | 6928 | 11.4% | 508 | 66 | 95 | 97 |
| 5600 | 0.3302 | 0.3391 | 8% | 626 | 82.3% | 6777 | 10.0% | 508 | 65 | 92 | 90 |
| 5600 | 0.3302 | 0.3391 | 7% | 631 | 84.0% | 6692 | 9.1% | 508 | 64 | 91 | 84 |
| 5600 | 0.3302 | 0.3391 | 6% | 635 | 84.9% | 6645 | 8.6% | 508 | 63 | 89 | 80 |
| 5600 | 0.3302 | 0.3391 | 6% | 640 | 85.8% | 6604 | 8.2% | 508 | 60 | 88 | 76 |
| 5600 | 0.3302 | 0.3391 | 13% | 611 | 70.5% | 7855 | 16.4% | 514 | 68 | 93 | 82 |
| 5600 | 0.3302 | 0.3391 | 11% | 616 | 74.0% | 7490 | 15.0% | 514 | 67 | 94 | 96 |
| 5600 | 0.3302 | 0.3391 | 9% | 620 | 78.6% | 7116 | 12.3% | 514 | 67 | 93 | 95 |
| 5600 | 0.3302 | 0.3391 | 8% | 626 | 81.7% | 6910 | 10.6% | 514 | 66 | 91 | 90 |
| 5600 | 0.3302 | 0.3391 | 7% | 631 | 83.3% | 6812 | 9.8% | 514 | 65 | 89 | 83 |
| 5600 | 0.3302 | 0.3391 | 6% | 635 | 84.3% | 6753 | 9.2% | 514 | 63 | 88 | 79 |
| 5600 | 0.3302 | 0.3391 | 6% | 640 | 85.3% | 6698 | 8.6% | 514 | 61 | 86 | 76 |
| 5600 | 0.3302 | 0.3391 | 14% | 611 | 66.3% | 8658 | 19.7% | 521 | 69 | 92 | 84 |
| 5600 | 0.3302 | 0.3391 | 11% | 616 | 72.0% | 7857 | 16.8% | 521 | 68 | 92 | 96 |
| 5600 | 0.3302 | 0.3391 | 9% | 620 | 77.4% | 7315 | 13.5% | 521 | 68 | 91 | 94 |
| 5600 | 0.3302 | 0.3391 | 8% | 626 | 80.5% | 7076 | 11.7% | 521 | 67 | 89 | 88 |
| 5600 | 0.3302 | 0.3391 | 7% | 631 | 82.3% | 6947 | 10.7% | 521 | 65 | 87 | 82 |
| 5600 | 0.3302 | 0.3391 | 6% | 635 | 83.6% | 6863 | 10.0% | 521 | 64 | 86 | 79 |
| 5600 | 0.3302 | 0.3391 | 6% | 640 | 85.0% | 6777 | 9.1% | 521 | 62 | 85 | 76 |
| 5600 | 0.3302 | 0.3391 | 15% | 611 | 62.0% | 9734 | 23.1% | 527 | 70 | 90 | 86 |
| 5600 | 0.3302 | 0.3391 | 12% | 616 | 69.8% | 8239 | 18.7% | 527 | 69 | 90 | 95 |
| 5600 | 0.3302 | 0.3391 | 9% | 620 | 76.0% | 7511 | 14.8% | 527 | 68 | 89 | 93 |
| 5600 | 0.3302 | 0.3391 | 8% | 626 | 79.1% | 7231 | 13.0% | 527 | 67 | 87 | 87 |
| 5600 | 0.3302 | 0.3391 | 7% | 631 | 81.4% | 7050 | 11.6% | 527 | 66 | 86 | 82 |
| 5600 | 0.3302 | 0.3391 | 6% | 635 | 83.2% | 6923 | 10.4% | 527 | 64 | 85 | 80 |
| 5600 | 0.3302 | 0.3391 | 6% | 640 | 85.3% | 6788 | 9.0% | 527 | 62 | 84 | 79 |
| 5600 | 0.3302 | 0.3391 | 16% | 611 | 55.0% | 12711 | 28.8% | 534 | 71 | 88 | 87 |
| 5600 | 0.3302 | 0.3391 | 12% | 616 | 66.9% | 8803 | 21.3% | 534 | 70 | 88 | 93 |
| 5600 | 0.3302 | 0.3391 | 10% | 620 | 73.1% | 7881 | 17.3% | 534 | 69 | 87 | 91 |
| 5600 | 0.3302 | 0.3391 | 8% | 626 | 77.3% | 7439 | 14.7% | 534 | 68 | 86 | 86 |
| 5600 | 0.3302 | 0.3391 | 7% | 631 | 81.0% | 7116 | 12.2% | 534 | 67 | 84 | 84 |
| 5600 | 0.3302 | 0.3391 | 6% | 635 | 83.8% | 6915 | 10.3% | 534 | 65 | 83 | 83 |
| 5600 | 0.3302 | 0.3391 | 5% | 640 | 86.4% | 6747 | 8.4% | 534 | 64 | 82 | 83 |
| 5600 | 0.3302 | 0.3391 | 18% | 611 | 46.4% | 26520 | 36.1% | 540 | 72 | 86 | 87 |
| 5600 | 0.3302 | 0.3391 | 12% | 616 | 62.0% | 10030 | 25.8% | 540 | 71 | 86 | 92 |
| 5600 | 0.3302 | 0.3391 | 10% | 620 | 69.0% | 8508 | 21.0% | 540 | 70 | 85 | 90 |
| 5600 | 0.3302 | 0.3391 | 8% | 626 | 76.1% | 7584 | 16.0% | 540 | 69 | 84 | 87 |
| 5600 | 0.3302 | 0.3391 | 6% | 631 | 81.4% | 7105 | 12.2% | 540 | 67 | 83 | 87 |
| 5600 | 0.3302 | 0.3391 | 5% | 635 | 84.6% | 6875 | 9.9% | 540 | 66 | 82 | 87 |
| 5600 | 0.3302 | 0.3391 | 5% | 640 | 87.4% | 6700 | 7.9% | 540 | 64 | 81 | 87 |
| 5500 | 0.3325 | 0.3411 | 6% | 611 | 88.3% | 4131 | 5.3% | 467 | 48 | 82 | 65 |

TABLE 2-continued

| | | | | | | | | | | |
|---|---|---|---|---|---|---|---|---|---|---|
| 5500 | 0.3325 | 0.3411 | 6% | 616 | 88.9% | 4131 | 5.2% | 467 | 48 | 84 | 73 |
| 5500 | 0.3325 | 0.3411 | 5% | 620 | 89.3% | 4131 | 5.2% | 467 | 47 | 86 | 80 |
| 5500 | 0.3325 | 0.3411 | 5% | 626 | 89.7% | 4131 | 5.2% | 467 | 47 | 88 | 88 |
| 5500 | 0.3325 | 0.3411 | 5% | 631 | 90.0% | 4131 | 5.2% | 467 | 46 | 89 | 94 |
| 5500 | 0.3325 | 0.3411 | 5% | 635 | 90.1% | 4131 | 5.2% | 467 | 46 | 90 | 98 |
| 5500 | 0.3325 | 0.3411 | 4% | 640 | 90.3% | 4131 | 5.2% | 467 | 45 | 90 | 97 |
| 5500 | 0.3325 | 0.3411 | 8% | 611 | 84.1% | 4147 | 7.5% | 471 | 48 | 86 | 66 |
| 5500 | 0.3325 | 0.3411 | 8% | 616 | 85.1% | 4168 | 7.3% | 471 | 48 | 89 | 77 |
| 5500 | 0.3325 | 0.3411 | 7% | 620 | 85.6% | 4168 | 7.3% | 471 | 48 | 91 | 85 |
| 5500 | 0.3325 | 0.3411 | 7% | 626 | 86.3% | 4195 | 7.2% | 471 | 48 | 93 | 92 |
| 5500 | 0.3325 | 0.3411 | 6% | 631 | 87.0% | 4239 | 6.9% | 471 | 48 | 93 | 93 |
| 5500 | 0.3325 | 0.3411 | 6% | 635 | 87.3% | 4251 | 6.9% | 471 | 48 | 93 | 89 |
| 5500 | 0.3325 | 0.3411 | 6% | 640 | 87.6% | 4258 | 6.8% | 471 | 46 | 92 | 84 |
| 5500 | 0.3325 | 0.3411 | 9% | 611 | 84.4% | 4801 | 6.9% | 476 | 59 | 87 | 67 |
| 5500 | 0.3325 | 0.3411 | 8% | 616 | 85.5% | 4804 | 6.8% | 476 | 58 | 90 | 79 |
| 5500 | 0.3325 | 0.3411 | 7% | 620 | 85.9% | 4786 | 6.8% | 476 | 57 | 92 | 87 |
| 5500 | 0.3325 | 0.3411 | 7% | 626 | 86.7% | 4817 | 6.6% | 476 | 57 | 94 | 94 |
| 5500 | 0.3325 | 0.3411 | 6% | 631 | 87.5% | 4863 | 6.3% | 476 | 56 | 94 | 93 |
| 5500 | 0.3325 | 0.3411 | 6% | 635 | 87.8% | 4870 | 6.3% | 476 | 55 | 94 | 88 |
| 5500 | 0.3325 | 0.3411 | 6% | 640 | 88.1% | 4872 | 6.2% | 476 | 53 | 93 | 83 |
| 5500 | 0.3325 | 0.3411 | 9% | 611 | 84.1% | 5239 | 6.9% | 480 | 61 | 88 | 69 |
| 5500 | 0.3325 | 0.3411 | 8% | 616 | 85.0% | 5219 | 6.9% | 480 | 61 | 91 | 80 |
| 5500 | 0.3325 | 0.3411 | 8% | 620 | 85.5% | 5200 | 7.0% | 480 | 60 | 93 | 89 |
| 5500 | 0.3325 | 0.3411 | 7% | 626 | 86.5% | 5236 | 6.6% | 480 | 59 | 95 | 95 |
| 5500 | 0.3325 | 0.3411 | 6% | 631 | 87.3% | 5267 | 6.3% | 480 | 59 | 95 | 92 |
| 5500 | 0.3325 | 0.3411 | 6% | 635 | 87.7% | 5270 | 6.3% | 480 | 57 | 94 | 87 |
| 5500 | 0.3325 | 0.3411 | 6% | 640 | 87.9% | 5270 | 6.2% | 480 | 55 | 93 | 82 |
| 5500 | 0.3325 | 0.3411 | 9% | 611 | 83.0% | 5675 | 7.6% | 486 | 63 | 89 | 70 |
| 5500 | 0.3325 | 0.3411 | 9% | 616 | 83.8% | 5641 | 7.6% | 486 | 62 | 93 | 83 |
| 5500 | 0.3325 | 0.3411 | 8% | 620 | 84.5% | 5627 | 7.6% | 486 | 62 | 95 | 92 |
| 5500 | 0.3325 | 0.3411 | 7% | 626 | 86.0% | 5658 | 6.9% | 486 | 61 | 96 | 96 |
| 5500 | 0.3325 | 0.3411 | 7% | 631 | 86.7% | 5659 | 6.7% | 486 | 60 | 96 | 90 |
| 5500 | 0.3325 | 0.3411 | 6% | 635 | 87.0% | 5657 | 6.7% | 486 | 59 | 94 | 85 |
| 5500 | 0.3325 | 0.3411 | 6% | 640 | 87.4% | 5660 | 6.5% | 486 | 57 | 93 | 79 |
| 5500 | 0.3325 | 0.3411 | 10% | 611 | 80.9% | 6063 | 8.8% | 491 | 64 | 91 | 73 |
| 5500 | 0.3325 | 0.3411 | 9% | 616 | 82.3% | 6021 | 8.7% | 491 | 63 | 95 | 86 |
| 5500 | 0.3325 | 0.3411 | 8% | 620 | 83.3% | 6000 | 8.4% | 491 | 63 | 97 | 95 |
| 5500 | 0.3325 | 0.3411 | 7% | 626 | 84.9% | 5994 | 7.7% | 491 | 62 | 97 | 95 |
| 5500 | 0.3325 | 0.3411 | 7% | 631 | 85.5% | 5981 | 7.6% | 491 | 61 | 96 | 87 |
| 5500 | 0.3325 | 0.3411 | 7% | 635 | 86.3% | 5980 | 7.2% | 491 | 60 | 94 | 82 |
| 5500 | 0.3325 | 0.3411 | 6% | 640 | 87.1% | 5981 | 6.8% | 491 | 58 | 93 | 78 |
| 5500 | 0.3325 | 0.3411 | 11% | 611 | 78.8% | 6392 | 10.3% | 496 | 65 | 93 | 75 |
| 5500 | 0.3325 | 0.3411 | 10% | 616 | 80.4% | 6324 | 9.9% | 496 | 64 | 96 | 89 |
| 5500 | 0.3325 | 0.3411 | 9% | 620 | 82.2% | 6279 | 9.2% | 496 | 64 | 98 | 98 |
| 5500 | 0.3325 | 0.3411 | 8% | 626 | 83.8% | 6242 | 8.5% | 496 | 63 | 96 | 93 |
| 5500 | 0.3325 | 0.3411 | 7% | 631 | 85.1% | 6216 | 7.9% | 496 | 62 | 94 | 86 |
| 5500 | 0.3325 | 0.3411 | 7% | 635 | 85.9% | 6201 | 7.5% | 496 | 61 | 93 | 81 |
| 5500 | 0.3325 | 0.3411 | 6% | 640 | 86.7% | 6188 | 7.2% | 496 | 59 | 91 | 77 |
| 5500 | 0.3325 | 0.3411 | 12% | 611 | 76.3% | 6801 | 12.0% | 502 | 66 | 94 | 77 |
| 5500 | 0.3325 | 0.3411 | 10% | 616 | 78.9% | 6662 | 11.1% | 502 | 65 | 96 | 91 |
| 5500 | 0.3325 | 0.3411 | 9% | 620 | 80.9% | 6570 | 10.2% | 502 | 65 | 97 | 99 |
| 5500 | 0.3325 | 0.3411 | 8% | 626 | 83.0% | 6488 | 9.2% | 502 | 64 | 94 | 91 |
| 5500 | 0.3325 | 0.3411 | 7% | 631 | 84.5% | 6433 | 8.4% | 502 | 63 | 92 | 85 |
| 5500 | 0.3325 | 0.3411 | 7% | 635 | 85.5% | 6399 | 7.9% | 502 | 62 | 91 | 80 |
| 5500 | 0.3325 | 0.3411 | 6% | 640 | 86.4% | 6370 | 7.4% | 502 | 60 | 89 | 76 |
| 5500 | 0.3325 | 0.3411 | 13% | 611 | 73.3% | 7249 | 14.2% | 508 | 67 | 94 | 80 |
| 5500 | 0.3325 | 0.3411 | 11% | 616 | 76.0% | 7039 | 13.2% | 508 | 66 | 95 | 94 |
| 5500 | 0.3325 | 0.3411 | 9% | 620 | 79.7% | 6813 | 11.2% | 508 | 66 | 95 | 97 |
| 5500 | 0.3325 | 0.3411 | 8% | 626 | 82.5% | 6669 | 9.7% | 508 | 65 | 92 | 90 |
| 5500 | 0.3325 | 0.3411 | 7% | 631 | 84.1% | 6588 | 8.9% | 508 | 64 | 90 | 84 |
| 5500 | 0.3325 | 0.3411 | 7% | 635 | 85.1% | 6543 | 8.4% | 508 | 63 | 89 | 80 |
| 5500 | 0.3325 | 0.3411 | 6% | 640 | 86.0% | 6503 | 7.9% | 508 | 60 | 88 | 76 |
| 5500 | 0.3325 | 0.3411 | 13% | 611 | 70.6% | 7684 | 16.2% | 514 | 68 | 93 | 82 |
| 5500 | 0.3325 | 0.3411 | 11% | 616 | 74.1% | 7340 | 14.7% | 514 | 67 | 94 | 96 |
| 5500 | 0.3325 | 0.3411 | 9% | 620 | 78.8% | 6988 | 12.1% | 514 | 67 | 93 | 95 |
| 5500 | 0.3325 | 0.3411 | 8% | 626 | 81.9% | 6792 | 10.3% | 514 | 66 | 91 | 89 |
| 5500 | 0.3325 | 0.3411 | 7% | 631 | 83.5% | 6699 | 9.5% | 514 | 65 | 89 | 83 |
| 5500 | 0.3325 | 0.3411 | 7% | 635 | 84.5% | 6642 | 8.9% | 514 | 63 | 88 | 79 |
| 5500 | 0.3325 | 0.3411 | 6% | 640 | 85.6% | 6590 | 8.3% | 514 | 61 | 86 | 75 |
| 5500 | 0.3325 | 0.3411 | 14% | 611 | 66.4% | 8422 | 19.4% | 521 | 69 | 92 | 84 |
| 5500 | 0.3325 | 0.3411 | 11% | 616 | 72.1% | 7682 | 16.5% | 521 | 68 | 92 | 95 |
| 5500 | 0.3325 | 0.3411 | 9% | 620 | 77.6% | 7171 | 13.2% | 521 | 68 | 91 | 94 |
| 5500 | 0.3325 | 0.3411 | 8% | 626 | 80.7% | 6944 | 11.4% | 521 | 67 | 89 | 88 |
| 5500 | 0.3325 | 0.3411 | 7% | 631 | 82.5% | 6821 | 10.4% | 521 | 65 | 87 | 82 |
| 5500 | 0.3325 | 0.3411 | 7% | 635 | 83.8% | 6742 | 9.6% | 521 | 64 | 86 | 79 |
| 5500 | 0.3325 | 0.3411 | 6% | 640 | 85.2% | 6661 | 8.7% | 521 | 62 | 85 | 76 |
| 5500 | 0.3325 | 0.3411 | 15% | 611 | 62.1% | 9401 | 22.8% | 527 | 70 | 90 | 85 |
| 5500 | 0.3325 | 0.3411 | 12% | 616 | 69.9% | 8032 | 18.4% | 527 | 69 | 90 | 95 |
| 5500 | 0.3325 | 0.3411 | 9% | 620 | 76.2% | 7350 | 14.5% | 527 | 69 | 89 | 93 |
| 5500 | 0.3325 | 0.3411 | 8% | 626 | 79.4% | 7084 | 12.6% | 527 | 67 | 88 | 87 |

TABLE 2-continued

| | | | | | | | | | | |
|---|---|---|---|---|---|---|---|---|---|---|
| 5500 | 0.3325 | 0.3411 | 7% | 631 | 81.7% | 6914 | 11.2% | 527 | 66 | 86 | 82 |
| 5500 | 0.3325 | 0.3411 | 6% | 635 | 83.5% | 6794 | 10.0% | 527 | 64 | 85 | 79 |
| 5500 | 0.3325 | 0.3411 | 6% | 640 | 85.6% | 6668 | 8.6% | 527 | 62 | 84 | 78 |
| 5500 | 0.3325 | 0.3411 | 16% | 611 | 55.2% | 12007 | 28.4% | 534 | 71 | 88 | 87 |
| 5500 | 0.3325 | 0.3411 | 12% | 616 | 67.1% | 8550 | 21.0% | 534 | 70 | 88 | 93 |
| 5500 | 0.3325 | 0.3411 | 10% | 620 | 73.4% | 7683 | 16.9% | 534 | 69 | 87 | 91 |
| 5500 | 0.3325 | 0.3411 | 8% | 626 | 77.6% | 7271 | 14.3% | 534 | 68 | 86 | 86 |
| 5500 | 0.3325 | 0.3411 | 7% | 631 | 81.4% | 6971 | 11.7% | 534 | 67 | 84 | 84 |
| 5500 | 0.3325 | 0.3411 | 6% | 635 | 84.1% | 6782 | 9.8% | 534 | 65 | 83 | 83 |
| 5500 | 0.3325 | 0.3411 | 5% | 640 | 86.8% | 6624 | 7.9% | 534 | 64 | 82 | 83 |
| 5500 | 0.3325 | 0.3411 | 18% | 611 | 46.6% | 22708 | 35.7% | 540 | 72 | 86 | 86 |
| 5500 | 0.3325 | 0.3411 | 12% | 616 | 62.3% | 9620 | 25.3% | 540 | 71 | 86 | 92 |
| 5500 | 0.3325 | 0.3411 | 10% | 620 | 69.4% | 8242 | 20.5% | 540 | 70 | 85 | 90 |
| 5500 | 0.3325 | 0.3411 | 8% | 626 | 76.6% | 7396 | 15.5% | 540 | 69 | 84 | 88 |
| 5500 | 0.3325 | 0.3411 | 6% | 631 | 81.9% | 6952 | 11.7% | 540 | 67 | 83 | 87 |
| 5500 | 0.3325 | 0.3411 | 6% | 635 | 85.1% | 6737 | 9.3% | 540 | 66 | 82 | 87 |
| 5500 | 0.3325 | 0.3411 | 5% | 640 | 87.9% | 6572 | 7.3% | 540 | 64 | 81 | 87 |
| 5400 | 0.3348 | 0.3431 | 7% | 611 | 88.1% | 4131 | 5.1% | 467 | 48 | 82 | 65 |
| 5400 | 0.3348 | 0.3431 | 6% | 616 | 88.8% | 4131 | 5.1% | 467 | 48 | 85 | 74 |
| 5400 | 0.3348 | 0.3431 | 6% | 620 | 89.2% | 4131 | 5.1% | 467 | 47 | 86 | 81 |
| 5400 | 0.3348 | 0.3431 | 5% | 626 | 89.6% | 4131 | 5.1% | 467 | 47 | 88 | 88 |
| 5400 | 0.3348 | 0.3431 | 5% | 631 | 89.9% | 4131 | 5.1% | 467 | 46 | 89 | 95 |
| 5400 | 0.3348 | 0.3431 | 5% | 635 | 90.1% | 4131 | 5.1% | 467 | 46 | 90 | 99 |
| 5400 | 0.3348 | 0.3431 | 5% | 640 | 90.2% | 4131 | 5.1% | 467 | 45 | 90 | 95 |
| 5400 | 0.3348 | 0.3431 | 9% | 611 | 83.9% | 4135 | 7.4% | 471 | 48 | 86 | 66 |
| 5400 | 0.3348 | 0.3431 | 8% | 616 | 85.0% | 4157 | 7.2% | 471 | 48 | 89 | 77 |
| 5400 | 0.3348 | 0.3431 | 7% | 620 | 85.5% | 4157 | 7.2% | 471 | 48 | 91 | 86 |
| 5400 | 0.3348 | 0.3431 | 7% | 626 | 86.3% | 4193 | 7.0% | 471 | 48 | 93 | 92 |
| 5400 | 0.3348 | 0.3431 | 6% | 631 | 86.9% | 4231 | 6.8% | 471 | 48 | 93 | 92 |
| 5400 | 0.3348 | 0.3431 | 6% | 635 | 87.3% | 4243 | 6.8% | 471 | 48 | 93 | 88 |
| 5400 | 0.3348 | 0.3431 | 6% | 640 | 87.5% | 4249 | 6.7% | 471 | 46 | 92 | 83 |
| 5400 | 0.3348 | 0.3431 | 9% | 611 | 84.3% | 4774 | 6.8% | 476 | 59 | 87 | 67 |
| 5400 | 0.3348 | 0.3431 | 8% | 616 | 85.3% | 4778 | 6.7% | 476 | 58 | 90 | 79 |
| 5400 | 0.3348 | 0.3431 | 7% | 620 | 85.8% | 4762 | 6.7% | 476 | 57 | 92 | 87 |
| 5400 | 0.3348 | 0.3431 | 7% | 626 | 86.7% | 4802 | 6.5% | 476 | 57 | 94 | 94 |
| 5400 | 0.3348 | 0.3431 | 6% | 631 | 87.4% | 4838 | 6.2% | 476 | 56 | 94 | 92 |
| 5400 | 0.3348 | 0.3431 | 6% | 635 | 87.7% | 4845 | 6.2% | 476 | 55 | 94 | 88 |
| 5400 | 0.3348 | 0.3431 | 6% | 640 | 88.0% | 4847 | 6.1% | 476 | 53 | 93 | 82 |
| 5400 | 0.3348 | 0.3431 | 9% | 611 | 83.9% | 5200 | 6.9% | 480 | 62 | 88 | 68 |
| 5400 | 0.3348 | 0.3431 | 8% | 616 | 84.9% | 5182 | 6.8% | 480 | 61 | 91 | 80 |
| 5400 | 0.3348 | 0.3431 | 8% | 620 | 85.4% | 5164 | 6.9% | 480 | 60 | 94 | 89 |
| 5400 | 0.3348 | 0.3431 | 7% | 626 | 86.5% | 5208 | 6.5% | 480 | 60 | 95 | 95 |
| 5400 | 0.3348 | 0.3431 | 7% | 631 | 87.3% | 5230 | 6.2% | 480 | 59 | 95 | 91 |
| 5400 | 0.3348 | 0.3431 | 6% | 635 | 87.6% | 5232 | 6.2% | 480 | 57 | 94 | 86 |
| 5400 | 0.3348 | 0.3431 | 6% | 640 | 87.9% | 5235 | 6.1% | 480 | 55 | 93 | 81 |
| 5400 | 0.3348 | 0.3431 | 10% | 611 | 82.8% | 5622 | 7.5% | 486 | 63 | 89 | 70 |
| 5400 | 0.3348 | 0.3431 | 9% | 616 | 83.7% | 5588 | 7.5% | 486 | 62 | 93 | 83 |
| 5400 | 0.3348 | 0.3431 | 8% | 620 | 84.5% | 5576 | 7.4% | 486 | 62 | 95 | 92 |
| 5400 | 0.3348 | 0.3431 | 7% | 626 | 86.0% | 5608 | 6.8% | 486 | 61 | 96 | 96 |
| 5400 | 0.3348 | 0.3431 | 7% | 631 | 86.6% | 5607 | 6.6% | 486 | 60 | 95 | 89 |
| 5400 | 0.3348 | 0.3431 | 6% | 635 | 87.0% | 5605 | 6.5% | 486 | 59 | 94 | 84 |
| 5400 | 0.3348 | 0.3431 | 6% | 640 | 87.5% | 5611 | 6.4% | 486 | 57 | 93 | 78 |
| 5400 | 0.3348 | 0.3431 | 10% | 611 | 80.8% | 5994 | 8.7% | 491 | 64 | 91 | 72 |
| 5400 | 0.3348 | 0.3431 | 9% | 616 | 82.2% | 5954 | 8.5% | 491 | 64 | 95 | 86 |
| 5400 | 0.3348 | 0.3431 | 8% | 620 | 83.2% | 5934 | 8.3% | 491 | 63 | 97 | 95 |
| 5400 | 0.3348 | 0.3431 | 8% | 626 | 84.8% | 5928 | 7.6% | 491 | 62 | 97 | 95 |
| 5400 | 0.3348 | 0.3431 | 7% | 631 | 85.5% | 5917 | 7.4% | 491 | 61 | 95 | 86 |
| 5400 | 0.3348 | 0.3431 | 7% | 635 | 86.4% | 5917 | 7.0% | 491 | 60 | 94 | 82 |
| 5400 | 0.3348 | 0.3431 | 6% | 640 | 87.2% | 5918 | 6.6% | 491 | 58 | 92 | 77 |
| 5400 | 0.3348 | 0.3431 | 11% | 611 | 78.7% | 6307 | 10.1% | 496 | 65 | 93 | 75 |
| 5400 | 0.3348 | 0.3431 | 10% | 616 | 80.3% | 6242 | 9.8% | 496 | 64 | 96 | 89 |
| 5400 | 0.3348 | 0.3431 | 9% | 620 | 82.2% | 6198 | 9.0% | 496 | 64 | 98 | 98 |
| 5400 | 0.3348 | 0.3431 | 8% | 626 | 83.9% | 6163 | 8.3% | 496 | 63 | 96 | 93 |
| 5400 | 0.3348 | 0.3431 | 7% | 631 | 85.2% | 6139 | 7.7% | 496 | 62 | 94 | 86 |
| 5400 | 0.3348 | 0.3431 | 7% | 635 | 86.0% | 6125 | 7.3% | 496 | 61 | 93 | 81 |
| 5400 | 0.3348 | 0.3431 | 6% | 640 | 86.7% | 6113 | 7.0% | 496 | 59 | 91 | 76 |
| 5400 | 0.3348 | 0.3431 | 12% | 611 | 76.2% | 6695 | 11.9% | 502 | 66 | 94 | 77 |
| 5400 | 0.3348 | 0.3431 | 10% | 616 | 78.9% | 6560 | 10.9% | 502 | 66 | 96 | 91 |
| 5400 | 0.3348 | 0.3431 | 9% | 620 | 81.0% | 6473 | 10.0% | 502 | 65 | 97 | 99 |
| 5400 | 0.3348 | 0.3431 | 8% | 626 | 83.1% | 6394 | 8.9% | 502 | 64 | 94 | 91 |
| 5400 | 0.3348 | 0.3431 | 7% | 631 | 84.7% | 6342 | 8.2% | 502 | 63 | 92 | 84 |
| 5400 | 0.3348 | 0.3431 | 7% | 635 | 85.7% | 6310 | 7.6% | 502 | 62 | 91 | 80 |
| 5400 | 0.3348 | 0.3431 | 6% | 640 | 86.6% | 6282 | 7.2% | 502 | 60 | 89 | 76 |
| 5400 | 0.3348 | 0.3431 | 13% | 611 | 73.3% | 7116 | 14.0% | 508 | 67 | 94 | 80 |
| 5400 | 0.3348 | 0.3431 | 11% | 616 | 76.1% | 6913 | 13.0% | 508 | 66 | 95 | 94 |
| 5400 | 0.3348 | 0.3431 | 9% | 620 | 79.8% | 6701 | 11.0% | 508 | 66 | 94 | 97 |
| 5400 | 0.3348 | 0.3431 | 8% | 626 | 82.6% | 6563 | 9.5% | 508 | 65 | 92 | 90 |
| 5400 | 0.3348 | 0.3431 | 7% | 631 | 84.3% | 6485 | 8.6% | 508 | 64 | 90 | 84 |
| 5400 | 0.3348 | 0.3431 | 7% | 635 | 85.3% | 6443 | 8.1% | 508 | 63 | 89 | 79 |
| 5400 | 0.3348 | 0.3431 | 6% | 640 | 86.2% | 6405 | 7.6% | 508 | 60 | 87 | 75 |

TABLE 2-continued

| | | | | | | | | | | |
|---|---|---|---|---|---|---|---|---|---|---|
| 5400 | 0.3348 | 0.3431 | 13% | 611 | 70.6% | 7518 | 16.0% | 514 | 68 | 93 | 81 |
| 5400 | 0.3348 | 0.3431 | 11% | 616 | 74.2% | 7195 | 14.5% | 514 | 67 | 94 | 96 |
| 5400 | 0.3348 | 0.3431 | 9% | 620 | 78.9% | 6863 | 11.8% | 514 | 67 | 93 | 95 |
| 5400 | 0.3348 | 0.3431 | 8% | 626 | 82.0% | 6677 | 10.0% | 514 | 66 | 91 | 89 |
| 5400 | 0.3348 | 0.3431 | 7% | 631 | 83.7% | 6587 | 9.2% | 514 | 65 | 89 | 83 |
| 5400 | 0.3348 | 0.3431 | 7% | 635 | 84.8% | 6533 | 8.6% | 514 | 63 | 88 | 79 |
| 5400 | 0.3348 | 0.3431 | 6% | 640 | 85.8% | 6483 | 8.0% | 514 | 61 | 86 | 75 |
| 5400 | 0.3348 | 0.3431 | 14% | 611 | 66.5% | 8195 | 19.1% | 521 | 69 | 92 | 83 |
| 5400 | 0.3348 | 0.3431 | 12% | 616 | 72.2% | 7513 | 16.2% | 521 | 68 | 92 | 95 |
| 5400 | 0.3348 | 0.3431 | 9% | 620 | 77.8% | 7032 | 12.9% | 521 | 68 | 91 | 94 |
| 5400 | 0.3348 | 0.3431 | 8% | 626 | 80.9% | 6816 | 11.1% | 521 | 67 | 89 | 88 |
| 5400 | 0.3348 | 0.3431 | 7% | 631 | 82.8% | 6699 | 10.0% | 521 | 65 | 87 | 82 |
| 5400 | 0.3348 | 0.3431 | 7% | 635 | 84.1% | 6624 | 9.2% | 521 | 64 | 86 | 78 |
| 5400 | 0.3348 | 0.3431 | 6% | 640 | 85.5% | 6547 | 8.4% | 521 | 62 | 85 | 76 |
| 5400 | 0.3348 | 0.3431 | 15% | 611 | 62.3% | 9087 | 22.5% | 527 | 70 | 90 | 85 |
| 5400 | 0.3348 | 0.3431 | 12% | 616 | 70.1% | 7834 | 18.1% | 527 | 69 | 90 | 95 |
| 5400 | 0.3348 | 0.3431 | 9% | 620 | 76.4% | 7193 | 14.1% | 527 | 69 | 89 | 93 |
| 5400 | 0.3348 | 0.3431 | 8% | 626 | 79.6% | 6943 | 12.2% | 527 | 67 | 88 | 87 |
| 5400 | 0.3348 | 0.3431 | 7% | 631 | 82.0% | 6782 | 10.8% | 527 | 66 | 86 | 82 |
| 5400 | 0.3348 | 0.3431 | 7% | 635 | 83.8% | 6670 | 9.6% | 527 | 65 | 85 | 79 |
| 5400 | 0.3348 | 0.3431 | 6% | 640 | 86.0% | 6550 | 8.2% | 527 | 63 | 84 | 78 |
| 5400 | 0.3348 | 0.3431 | 17% | 611 | 55.5% | 11371 | 28.0% | 534 | 71 | 88 | 86 |
| 5400 | 0.3348 | 0.3431 | 12% | 616 | 67.2% | 8308 | 20.7% | 534 | 70 | 88 | 93 |
| 5400 | 0.3348 | 0.3431 | 10% | 620 | 73.8% | 7493 | 16.5% | 534 | 69 | 87 | 92 |
| 5400 | 0.3348 | 0.3431 | 8% | 626 | 78.0% | 7109 | 13.8% | 534 | 68 | 86 | 86 |
| 5400 | 0.3348 | 0.3431 | 7% | 631 | 81.8% | 6829 | 11.3% | 534 | 67 | 84 | 84 |
| 5400 | 0.3348 | 0.3431 | 6% | 635 | 84.5% | 6653 | 9.3% | 534 | 65 | 83 | 83 |
| 5400 | 0.3348 | 0.3431 | 5% | 640 | 87.2% | 6504 | 7.5% | 534 | 64 | 82 | 83 |
| 5400 | 0.3348 | 0.3431 | 18% | 611 | 46.9% | 19849 | 35.3% | 540 | 72 | 86 | 86 |
| 5400 | 0.3348 | 0.3431 | 13% | 616 | 62.7% | 9240 | 24.8% | 540 | 71 | 86 | 92 |
| 5400 | 0.3348 | 0.3431 | 10% | 620 | 69.9% | 7989 | 20.0% | 540 | 70 | 85 | 90 |
| 5400 | 0.3348 | 0.3431 | 8% | 626 | 77.0% | 7216 | 15.0% | 540 | 69 | 84 | 88 |
| 5400 | 0.3348 | 0.3431 | 6% | 631 | 82.4% | 6804 | 11.1% | 540 | 67 | 83 | 87 |
| 5400 | 0.3348 | 0.3431 | 6% | 635 | 85.6% | 6603 | 8.8% | 540 | 66 | 82 | 87 |
| 5400 | 0.3348 | 0.3431 | 5% | 640 | 88.4% | 6448 | 6.7% | 540 | 64 | 81 | 87 |
| 5300 | 0.3372 | 0.3451 | 7% | 611 | 87.9% | 4131 | 5.0% | 467 | 48 | 82 | 64 |
| 5300 | 0.3372 | 0.3451 | 6% | 616 | 88.7% | 4131 | 5.0% | 467 | 48 | 85 | 74 |
| 5300 | 0.3372 | 0.3451 | 6% | 620 | 89.1% | 4131 | 5.0% | 467 | 48 | 87 | 81 |
| 5300 | 0.3372 | 0.3451 | 6% | 626 | 89.5% | 4131 | 5.0% | 467 | 47 | 88 | 89 |
| 5300 | 0.3372 | 0.3451 | 5% | 631 | 89.8% | 4131 | 5.0% | 467 | 46 | 90 | 96 |
| 5300 | 0.3372 | 0.3451 | 5% | 635 | 90.0% | 4131 | 5.0% | 467 | 46 | 90 | 99 |
| 5300 | 0.3372 | 0.3451 | 5% | 640 | 90.1% | 4131 | 5.0% | 467 | 45 | 90 | 94 |
| 5300 | 0.3372 | 0.3451 | 9% | 611 | 83.8% | 4131 | 7.2% | 471 | 48 | 86 | 66 |
| 5300 | 0.3372 | 0.3451 | 8% | 616 | 84.8% | 4146 | 7.1% | 471 | 48 | 89 | 78 |
| 5300 | 0.3372 | 0.3451 | 7% | 620 | 85.4% | 4148 | 7.1% | 471 | 47 | 91 | 86 |
| 5300 | 0.3372 | 0.3451 | 7% | 626 | 86.2% | 4190 | 6.9% | 471 | 48 | 93 | 93 |
| 5300 | 0.3372 | 0.3451 | 6% | 631 | 86.9% | 4223 | 6.7% | 471 | 48 | 93 | 92 |
| 5300 | 0.3372 | 0.3451 | 6% | 635 | 87.2% | 4235 | 6.6% | 471 | 48 | 93 | 87 |
| 5300 | 0.3372 | 0.3451 | 6% | 640 | 87.5% | 4240 | 6.6% | 471 | 46 | 92 | 82 |
| 5300 | 0.3372 | 0.3451 | 9% | 611 | 84.1% | 4747 | 6.7% | 476 | 59 | 87 | 67 |
| 5300 | 0.3372 | 0.3451 | 8% | 616 | 85.2% | 4753 | 6.6% | 476 | 58 | 90 | 79 |
| 5300 | 0.3372 | 0.3451 | 8% | 620 | 85.7% | 4737 | 6.6% | 476 | 57 | 93 | 88 |
| 5300 | 0.3372 | 0.3451 | 7% | 626 | 86.7% | 4787 | 6.3% | 476 | 57 | 94 | 94 |
| 5300 | 0.3372 | 0.3451 | 7% | 631 | 87.3% | 4814 | 6.1% | 476 | 56 | 94 | 92 |
| 5300 | 0.3372 | 0.3451 | 6% | 635 | 87.7% | 4821 | 6.0% | 476 | 55 | 94 | 87 |
| 5300 | 0.3372 | 0.3451 | 6% | 640 | 87.9% | 4823 | 6.0% | 476 | 53 | 93 | 81 |
| 5300 | 0.3372 | 0.3451 | 9% | 611 | 83.8% | 5161 | 6.8% | 480 | 62 | 88 | 68 |
| 5300 | 0.3372 | 0.3451 | 9% | 616 | 84.7% | 5144 | 6.7% | 480 | 61 | 91 | 80 |
| 5300 | 0.3372 | 0.3451 | 8% | 620 | 85.3% | 5128 | 6.8% | 480 | 60 | 94 | 90 |
| 5300 | 0.3372 | 0.3451 | 7% | 626 | 86.5% | 5179 | 6.3% | 480 | 60 | 95 | 96 |
| 5300 | 0.3372 | 0.3451 | 7% | 631 | 87.2% | 5193 | 6.1% | 480 | 59 | 95 | 91 |
| 5300 | 0.3372 | 0.3451 | 6% | 635 | 87.5% | 5196 | 6.0% | 480 | 57 | 94 | 85 |
| 5300 | 0.3372 | 0.3451 | 6% | 640 | 87.9% | 5202 | 6.0% | 480 | 55 | 93 | 80 |
| 5300 | 0.3372 | 0.3451 | 10% | 611 | 82.7% | 5568 | 7.4% | 486 | 64 | 89 | 70 |
| 5300 | 0.3372 | 0.3451 | 9% | 616 | 83.6% | 5536 | 7.4% | 486 | 63 | 93 | 83 |
| 5300 | 0.3372 | 0.3451 | 8% | 620 | 84.4% | 5526 | 7.3% | 486 | 62 | 95 | 92 |
| 5300 | 0.3372 | 0.3451 | 7% | 626 | 86.0% | 5557 | 6.6% | 486 | 61 | 96 | 96 |
| 5300 | 0.3372 | 0.3451 | 7% | 631 | 86.6% | 5555 | 6.5% | 486 | 60 | 95 | 89 |
| 5300 | 0.3372 | 0.3451 | 7% | 635 | 86.9% | 5555 | 6.4% | 486 | 59 | 94 | 83 |
| 5300 | 0.3372 | 0.3451 | 6% | 640 | 87.5% | 5563 | 6.2% | 486 | 57 | 93 | 78 |
| 5300 | 0.3372 | 0.3451 | 11% | 611 | 80.7% | 5926 | 8.6% | 491 | 65 | 91 | 72 |
| 5300 | 0.3372 | 0.3451 | 9% | 616 | 82.1% | 5886 | 8.4% | 491 | 64 | 95 | 86 |
| 5300 | 0.3372 | 0.3451 | 9% | 620 | 83.2% | 5868 | 8.1% | 491 | 63 | 97 | 95 |
| 5300 | 0.3372 | 0.3451 | 8% | 626 | 84.8% | 5862 | 7.5% | 491 | 62 | 97 | 94 |
| 5300 | 0.3372 | 0.3451 | 7% | 631 | 85.6% | 5854 | 7.2% | 491 | 61 | 95 | 86 |
| 5300 | 0.3372 | 0.3451 | 7% | 635 | 86.5% | 5855 | 6.8% | 491 | 60 | 94 | 81 |
| 5300 | 0.3372 | 0.3451 | 6% | 640 | 87.3% | 5856 | 6.4% | 491 | 58 | 92 | 77 |
| 5300 | 0.3372 | 0.3451 | 11% | 611 | 78.6% | 6223 | 10.0% | 496 | 65 | 93 | 74 |
| 5300 | 0.3372 | 0.3451 | 10% | 616 | 80.2% | 6161 | 9.7% | 496 | 64 | 96 | 89 |
| 5300 | 0.3372 | 0.3451 | 9% | 620 | 82.2% | 6119 | 8.9% | 496 | 64 | 98 | 98 |

TABLE 2-continued

| | | | | | | | | | | | |
|---|---|---|---|---|---|---|---|---|---|---|---|
| 5300 | 0.3372 | 0.3451 | 8% | 626 | 84.0% | 6086 | 8.1% | 496 | 63 | 96 | 92 |
| 5300 | 0.3372 | 0.3451 | 7% | 631 | 85.3% | 6063 | 7.5% | 496 | 62 | 94 | 85 |
| 5300 | 0.3372 | 0.3451 | 7% | 635 | 86.1% | 6050 | 7.1% | 496 | 61 | 92 | 80 |
| 5300 | 0.3372 | 0.3451 | 6% | 640 | 86.8% | 6038 | 6.7% | 496 | 59 | 91 | 75 |
| 5300 | 0.3372 | 0.3451 | 12% | 611 | 76.2% | 6590 | 11.7% | 502 | 66 | 94 | 77 |
| 5300 | 0.3372 | 0.3451 | 10% | 616 | 78.9% | 6461 | 10.7% | 502 | 66 | 96 | 91 |
| 5300 | 0.3372 | 0.3451 | 9% | 620 | 81.0% | 6377 | 9.8% | 502 | 65 | 97 | 99 |
| 5300 | 0.3372 | 0.3451 | 8% | 626 | 83.2% | 6302 | 8.7% | 502 | 64 | 94 | 91 |
| 5300 | 0.3372 | 0.3451 | 7% | 631 | 84.8% | 6252 | 7.9% | 502 | 63 | 92 | 84 |
| 5300 | 0.3372 | 0.3451 | 7% | 635 | 85.8% | 6222 | 7.4% | 502 | 62 | 90 | 80 |
| 5300 | 0.3372 | 0.3451 | 6% | 640 | 86.8% | 6196 | 6.9% | 502 | 60 | 89 | 75 |
| 5300 | 0.3372 | 0.3451 | 13% | 611 | 73.3% | 6985 | 13.8% | 508 | 67 | 94 | 79 |
| 5300 | 0.3372 | 0.3451 | 11% | 616 | 76.2% | 6791 | 12.7% | 508 | 67 | 95 | 94 |
| 5300 | 0.3372 | 0.3451 | 9% | 620 | 79.9% | 6591 | 10.7% | 508 | 66 | 94 | 97 |
| 5300 | 0.3372 | 0.3451 | 8% | 626 | 82.7% | 6459 | 9.2% | 508 | 66 | 92 | 90 |
| 5300 | 0.3372 | 0.3451 | 7% | 631 | 84.5% | 6385 | 8.3% | 508 | 64 | 90 | 84 |
| 5300 | 0.3372 | 0.3451 | 7% | 635 | 85.5% | 6344 | 7.8% | 508 | 63 | 89 | 79 |
| 5300 | 0.3372 | 0.3451 | 6% | 640 | 86.4% | 6308 | 7.3% | 508 | 60 | 87 | 75 |
| 5300 | 0.3372 | 0.3451 | 14% | 611 | 70.7% | 7358 | 15.7% | 514 | 68 | 93 | 81 |
| 5300 | 0.3372 | 0.3451 | 12% | 616 | 74.3% | 7054 | 14.2% | 514 | 68 | 94 | 95 |
| 5300 | 0.3372 | 0.3451 | 9% | 620 | 79.0% | 6741 | 11.5% | 514 | 67 | 93 | 95 |
| 5300 | 0.3372 | 0.3451 | 8% | 626 | 82.2% | 6564 | 9.7% | 514 | 66 | 91 | 89 |
| 5300 | 0.3372 | 0.3451 | 7% | 631 | 83.9% | 6478 | 8.8% | 514 | 65 | 89 | 83 |
| 5300 | 0.3372 | 0.3451 | 7% | 635 | 85.0% | 6427 | 8.3% | 514 | 63 | 87 | 78 |
| 5300 | 0.3372 | 0.3451 | 6% | 640 | 86.0% | 6379 | 7.7% | 514 | 61 | 86 | 75 |
| 5300 | 0.3372 | 0.3451 | 15% | 611 | 66.6% | 7977 | 18.8% | 521 | 69 | 92 | 83 |
| 5300 | 0.3372 | 0.3451 | 12% | 616 | 72.3% | 7350 | 16.0% | 521 | 69 | 92 | 95 |
| 5300 | 0.3372 | 0.3451 | 10% | 620 | 77.9% | 6896 | 12.6% | 521 | 68 | 91 | 94 |
| 5300 | 0.3372 | 0.3451 | 8% | 626 | 81.1% | 6691 | 10.7% | 521 | 67 | 89 | 88 |
| 5300 | 0.3372 | 0.3451 | 7% | 631 | 83.0% | 6579 | 9.7% | 521 | 66 | 87 | 82 |
| 5300 | 0.3372 | 0.3451 | 7% | 635 | 84.4% | 6508 | 8.9% | 521 | 64 | 86 | 78 |
| 5300 | 0.3372 | 0.3451 | 6% | 640 | 85.8% | 6435 | 8.0% | 521 | 62 | 85 | 75 |
| 5300 | 0.3372 | 0.3451 | 15% | 611 | 62.4% | 8788 | 22.2% | 527 | 70 | 90 | 84 |
| 5300 | 0.3372 | 0.3451 | 12% | 616 | 70.2% | 7643 | 17.8% | 527 | 69 | 90 | 95 |
| 5300 | 0.3372 | 0.3451 | 10% | 620 | 76.6% | 7042 | 13.8% | 527 | 69 | 89 | 93 |
| 5300 | 0.3372 | 0.3451 | 8% | 626 | 79.9% | 6805 | 11.8% | 527 | 68 | 88 | 87 |
| 5300 | 0.3372 | 0.3451 | 7% | 631 | 82.3% | 6654 | 10.4% | 527 | 66 | 86 | 82 |
| 5300 | 0.3372 | 0.3451 | 7% | 635 | 84.2% | 6548 | 9.2% | 527 | 65 | 85 | 79 |
| 5300 | 0.3372 | 0.3451 | 6% | 640 | 86.3% | 6436 | 7.8% | 527 | 63 | 84 | 78 |
| 5300 | 0.3372 | 0.3451 | 17% | 611 | 55.7% | 10797 | 27.6% | 534 | 71 | 88 | 86 |
| 5300 | 0.3372 | 0.3451 | 12% | 616 | 67.4% | 8076 | 20.3% | 534 | 70 | 89 | 93 |
| 5300 | 0.3372 | 0.3451 | 10% | 620 | 74.1% | 7310 | 16.0% | 534 | 69 | 87 | 92 |
| 5300 | 0.3372 | 0.3451 | 8% | 626 | 78.3% | 6953 | 13.4% | 534 | 68 | 86 | 86 |
| 5300 | 0.3372 | 0.3451 | 7% | 631 | 82.1% | 6693 | 10.8% | 534 | 67 | 84 | 83 |
| 5300 | 0.3372 | 0.3451 | 6% | 635 | 84.9% | 6528 | 8.8% | 534 | 65 | 83 | 83 |
| 5300 | 0.3372 | 0.3451 | 5% | 640 | 87.6% | 6387 | 6.9% | 534 | 64 | 82 | 83 |
| 5300 | 0.3372 | 0.3451 | 18% | 611 | 47.2% | 17655 | 34.8% | 540 | 73 | 86 | 86 |
| 5300 | 0.3372 | 0.3451 | 13% | 616 | 63.0% | 8888 | 24.3% | 540 | 71 | 86 | 92 |
| 5300 | 0.3372 | 0.3451 | 10% | 620 | 70.3% | 7751 | 19.5% | 540 | 70 | 85 | 90 |
| 5300 | 0.3372 | 0.3451 | 8% | 626 | 77.5% | 7043 | 14.4% | 540 | 69 | 84 | 88 |
| 5300 | 0.3372 | 0.3451 | 7% | 631 | 82.9% | 6661 | 10.5% | 540 | 68 | 83 | 87 |
| 5300 | 0.3372 | 0.3451 | 6% | 635 | 86.2% | 6474 | 8.1% | 540 | 66 | 82 | 87 |
| 5300 | 0.3372 | 0.3451 | 5% | 640 | 89.0% | 6329 | 6.0% | 540 | 64 | 82 | 87 |
| 5200 | 0.3397 | 0.3472 | 7% | 611 | 87.8% | 4131 | 4.9% | 467 | 49 | 82 | 64 |
| 5200 | 0.3397 | 0.3472 | 7% | 616 | 88.5% | 4131 | 4.9% | 467 | 48 | 85 | 74 |
| 5200 | 0.3397 | 0.3472 | 6% | 620 | 89.0% | 4131 | 4.9% | 467 | 48 | 87 | 82 |
| 5200 | 0.3397 | 0.3472 | 6% | 626 | 89.4% | 4131 | 4.9% | 467 | 47 | 89 | 90 |
| 5200 | 0.3397 | 0.3472 | 5% | 631 | 89.7% | 4131 | 4.9% | 467 | 47 | 90 | 97 |
| 5200 | 0.3397 | 0.3472 | 5% | 635 | 89.9% | 4131 | 4.9% | 467 | 46 | 90 | 97 |
| 5200 | 0.3397 | 0.3472 | 5% | 640 | 90.1% | 4131 | 4.9% | 467 | 45 | 89 | 92 |
| 5200 | 0.3397 | 0.3472 | 9% | 611 | 83.7% | 4131 | 7.1% | 471 | 48 | 86 | 66 |
| 5200 | 0.3397 | 0.3472 | 8% | 616 | 84.7% | 4135 | 7.0% | 471 | 48 | 89 | 78 |
| 5200 | 0.3397 | 0.3472 | 8% | 620 | 85.3% | 4139 | 7.0% | 471 | 47 | 92 | 87 |
| 5200 | 0.3397 | 0.3472 | 7% | 626 | 86.2% | 4187 | 6.7% | 471 | 48 | 93 | 93 |
| 5200 | 0.3397 | 0.3472 | 7% | 631 | 86.8% | 4216 | 6.6% | 471 | 48 | 94 | 91 |
| 5200 | 0.3397 | 0.3472 | 6% | 635 | 87.1% | 4227 | 6.5% | 471 | 48 | 93 | 86 |
| 5200 | 0.3397 | 0.3472 | 6% | 640 | 87.4% | 4233 | 6.5% | 471 | 46 | 92 | 81 |
| 5200 | 0.3397 | 0.3472 | 10% | 611 | 83.9% | 4721 | 6.6% | 476 | 59 | 87 | 67 |
| 5200 | 0.3397 | 0.3472 | 8% | 616 | 85.0% | 4727 | 6.5% | 476 | 58 | 91 | 79 |
| 5200 | 0.3397 | 0.3472 | 8% | 620 | 85.5% | 4714 | 6.5% | 476 | 58 | 93 | 88 |
| 5200 | 0.3397 | 0.3472 | 7% | 626 | 86.6% | 4769 | 6.1% | 476 | 57 | 94 | 95 |
| 5200 | 0.3397 | 0.3472 | 7% | 631 | 87.3% | 4790 | 6.0% | 476 | 56 | 94 | 91 |
| 5200 | 0.3397 | 0.3472 | 6% | 635 | 87.6% | 4797 | 5.9% | 476 | 55 | 94 | 85 |
| 5200 | 0.3397 | 0.3472 | 6% | 640 | 87.9% | 4805 | 5.8% | 476 | 53 | 92 | 80 |
| 5200 | 0.3397 | 0.3472 | 10% | 611 | 83.6% | 5122 | 6.7% | 480 | 62 | 88 | 68 |
| 5200 | 0.3397 | 0.3472 | 9% | 616 | 84.6% | 5107 | 6.6% | 480 | 61 | 92 | 81 |
| 5200 | 0.3397 | 0.3472 | 8% | 620 | 85.2% | 5094 | 6.6% | 480 | 60 | 94 | 90 |
| 5200 | 0.3397 | 0.3472 | 7% | 626 | 86.5% | 5147 | 6.1% | 480 | 60 | 95 | 96 |
| 5200 | 0.3397 | 0.3472 | 7% | 631 | 87.1% | 5157 | 6.0% | 480 | 59 | 95 | 90 |
| 5200 | 0.3397 | 0.3472 | 7% | 635 | 87.5% | 5160 | 5.9% | 480 | 57 | 94 | 84 |

TABLE 2-continued

| | | | | | | | | | | | |
|---|---|---|---|---|---|---|---|---|---|---|---|
| 5200 | 0.3397 | 0.3472 | 6% | 640 | 87.9% | 5171 | 5.8% | 480 | 55 | 93 | 78 |
| 5200 | 0.3397 | 0.3472 | 10% | 611 | 82.5% | 5516 | 7.3% | 486 | 64 | 90 | 70 |
| 5200 | 0.3397 | 0.3472 | 9% | 616 | 83.5% | 5485 | 7.3% | 486 | 63 | 93 | 83 |
| 5200 | 0.3397 | 0.3472 | 9% | 620 | 84.4% | 5477 | 7.1% | 486 | 62 | 96 | 93 |
| 5200 | 0.3397 | 0.3472 | 8% | 626 | 85.9% | 5506 | 6.5% | 486 | 62 | 96 | 96 |
| 5200 | 0.3397 | 0.3472 | 7% | 631 | 86.5% | 5504 | 6.4% | 486 | 60 | 95 | 88 |
| 5200 | 0.3397 | 0.3472 | 7% | 635 | 86.9% | 5505 | 6.3% | 486 | 59 | 94 | 82 |
| 5200 | 0.3397 | 0.3472 | 6% | 640 | 87.5% | 5516 | 6.0% | 486 | 57 | 93 | 77 |
| 5200 | 0.3397 | 0.3472 | 11% | 611 | 80.6% | 5858 | 8.4% | 491 | 65 | 91 | 72 |
| 5200 | 0.3397 | 0.3472 | 10% | 616 | 82.0% | 5820 | 8.3% | 491 | 64 | 95 | 86 |
| 5200 | 0.3397 | 0.3472 | 9% | 620 | 83.2% | 5804 | 7.9% | 491 | 63 | 97 | 96 |
| 5200 | 0.3397 | 0.3472 | 8% | 626 | 84.7% | 5797 | 7.3% | 491 | 63 | 97 | 94 |
| 5200 | 0.3397 | 0.3472 | 7% | 631 | 85.7% | 5792 | 6.9% | 491 | 61 | 95 | 86 |
| 5200 | 0.3397 | 0.3472 | 7% | 635 | 86.6% | 5793 | 6.5% | 491 | 60 | 93 | 81 |
| 5200 | 0.3397 | 0.3472 | 6% | 640 | 87.4% | 5795 | 6.2% | 491 | 58 | 92 | 76 |
| 5200 | 0.3397 | 0.3472 | 12% | 611 | 78.5% | 6141 | 9.8% | 496 | 66 | 93 | 74 |
| 5200 | 0.3397 | 0.3472 | 10% | 616 | 80.3% | 6080 | 9.4% | 496 | 65 | 96 | 89 |
| 5200 | 0.3397 | 0.3472 | 9% | 620 | 82.2% | 6041 | 8.7% | 496 | 64 | 98 | 98 |
| 5200 | 0.3397 | 0.3472 | 8% | 626 | 84.0% | 6010 | 7.9% | 496 | 63 | 96 | 92 |
| 5200 | 0.3397 | 0.3472 | 7% | 631 | 85.3% | 5988 | 7.3% | 496 | 62 | 94 | 85 |
| 5200 | 0.3397 | 0.3472 | 7% | 635 | 86.2% | 5976 | 6.9% | 496 | 61 | 92 | 79 |
| 5200 | 0.3397 | 0.3472 | 7% | 640 | 87.0% | 5965 | 6.5% | 496 | 59 | 90 | 75 |
| 5200 | 0.3397 | 0.3472 | 12% | 611 | 76.1% | 6487 | 11.5% | 502 | 67 | 94 | 76 |
| 5200 | 0.3397 | 0.3472 | 11% | 616 | 78.9% | 6365 | 10.5% | 502 | 66 | 96 | 91 |
| 5200 | 0.3397 | 0.3472 | 9% | 620 | 81.1% | 6284 | 9.5% | 502 | 65 | 96 | 99 |
| 5200 | 0.3397 | 0.3472 | 8% | 626 | 83.3% | 6212 | 8.4% | 502 | 65 | 94 | 91 |
| 5200 | 0.3397 | 0.3472 | 7% | 631 | 85.0% | 6165 | 7.6% | 502 | 63 | 92 | 84 |
| 5200 | 0.3397 | 0.3472 | 7% | 635 | 86.0% | 6136 | 7.1% | 502 | 62 | 90 | 79 |
| 5200 | 0.3397 | 0.3472 | 6% | 640 | 86.9% | 6111 | 6.6% | 502 | 60 | 89 | 75 |
| 5200 | 0.3397 | 0.3472 | 13% | 611 | 73.3% | 6858 | 13.5% | 508 | 68 | 94 | 79 |
| 5200 | 0.3397 | 0.3472 | 11% | 616 | 76.2% | 6672 | 12.5% | 508 | 67 | 95 | 94 |
| 5200 | 0.3397 | 0.3472 | 10% | 620 | 80.0% | 6482 | 10.5% | 508 | 66 | 94 | 97 |
| 5200 | 0.3397 | 0.3472 | 8% | 626 | 82.9% | 6357 | 8.9% | 508 | 66 | 92 | 90 |
| 5200 | 0.3397 | 0.3472 | 7% | 631 | 84.6% | 6287 | 8.0% | 508 | 64 | 90 | 83 |
| 5200 | 0.3397 | 0.3472 | 7% | 635 | 85.7% | 6248 | 7.5% | 508 | 63 | 89 | 79 |
| 5200 | 0.3397 | 0.3472 | 6% | 640 | 86.6% | 6214 | 7.0% | 508 | 60 | 87 | 74 |
| 5200 | 0.3397 | 0.3472 | 14% | 611 | 70.7% | 7202 | 15.5% | 514 | 69 | 93 | 80 |
| 5200 | 0.3397 | 0.3472 | 12% | 616 | 74.3% | 6916 | 14.0% | 514 | 68 | 94 | 95 |
| 5200 | 0.3397 | 0.3472 | 10% | 620 | 79.1% | 6622 | 11.3% | 514 | 67 | 93 | 95 |
| 5200 | 0.3397 | 0.3472 | 8% | 626 | 82.4% | 6453 | 9.4% | 514 | 66 | 91 | 89 |
| 5200 | 0.3397 | 0.3472 | 7% | 631 | 84.1% | 6372 | 8.5% | 514 | 65 | 89 | 83 |
| 5200 | 0.3397 | 0.3472 | 7% | 635 | 85.2% | 6323 | 7.9% | 514 | 63 | 87 | 78 |
| 5200 | 0.3397 | 0.3472 | 6% | 640 | 86.3% | 6278 | 7.3% | 514 | 61 | 86 | 74 |
| 5200 | 0.3397 | 0.3472 | 15% | 611 | 66.8% | 7769 | 18.5% | 521 | 70 | 92 | 82 |
| 5200 | 0.3397 | 0.3472 | 12% | 616 | 72.4% | 7192 | 15.7% | 521 | 69 | 92 | 95 |
| 5200 | 0.3397 | 0.3472 | 10% | 620 | 78.1% | 6765 | 12.2% | 521 | 68 | 91 | 94 |
| 5200 | 0.3397 | 0.3472 | 8% | 626 | 81.3% | 6568 | 10.4% | 521 | 67 | 89 | 88 |
| 5200 | 0.3397 | 0.3472 | 7% | 631 | 83.3% | 6463 | 9.3% | 521 | 66 | 87 | 82 |
| 5200 | 0.3397 | 0.3472 | 7% | 635 | 84.7% | 6395 | 8.5% | 521 | 64 | 86 | 78 |
| 5200 | 0.3397 | 0.3472 | 6% | 640 | 86.1% | 6327 | 7.6% | 521 | 62 | 84 | 75 |
| 5200 | 0.3397 | 0.3472 | 16% | 611 | 62.6% | 8505 | 21.8% | 527 | 71 | 90 | 84 |
| 5200 | 0.3397 | 0.3472 | 12% | 616 | 70.3% | 7460 | 17.5% | 527 | 70 | 91 | 95 |
| 5200 | 0.3397 | 0.3472 | 10% | 620 | 76.9% | 6896 | 13.4% | 527 | 69 | 89 | 93 |
| 5200 | 0.3397 | 0.3472 | 8% | 626 | 80.2% | 6671 | 11.4% | 527 | 68 | 88 | 87 |
| 5200 | 0.3397 | 0.3472 | 7% | 631 | 82.6% | 6529 | 9.9% | 527 | 66 | 86 | 82 |
| 5200 | 0.3397 | 0.3472 | 7% | 635 | 84.5% | 6429 | 8.8% | 527 | 65 | 85 | 79 |
| 5200 | 0.3397 | 0.3472 | 6% | 640 | 86.6% | 6325 | 7.3% | 527 | 63 | 83 | 78 |
| 5200 | 0.3397 | 0.3472 | 17% | 611 | 55.9% | 10274 | 27.2% | 534 | 72 | 89 | 85 |
| 5200 | 0.3397 | 0.3472 | 12% | 616 | 67.6% | 7856 | 20.0% | 534 | 71 | 89 | 93 |
| 5200 | 0.3397 | 0.3472 | 10% | 620 | 74.4% | 7135 | 15.6% | 534 | 70 | 88 | 92 |
| 5200 | 0.3397 | 0.3472 | 8% | 626 | 78.7% | 6803 | 12.9% | 534 | 68 | 86 | 86 |
| 5200 | 0.3397 | 0.3472 | 7% | 631 | 82.5% | 6560 | 10.3% | 534 | 67 | 84 | 83 |
| 5200 | 0.3397 | 0.3472 | 6% | 635 | 85.4% | 6406 | 8.3% | 534 | 66 | 83 | 83 |
| 5200 | 0.3397 | 0.3472 | 6% | 640 | 88.1% | 6275 | 6.4% | 534 | 64 | 82 | 83 |
| 5200 | 0.3397 | 0.3472 | 18% | 611 | 47.5% | 15892 | 34.4% | 540 | 73 | 86 | 85 |
| 5200 | 0.3397 | 0.3472 | 13% | 616 | 63.4% | 8560 | 23.8% | 540 | 71 | 86 | 92 |
| 5200 | 0.3397 | 0.3472 | 10% | 620 | 70.7% | 7526 | 18.9% | 540 | 70 | 86 | 90 |
| 5200 | 0.3397 | 0.3472 | 8% | 626 | 78.0% | 6878 | 13.8% | 540 | 69 | 84 | 88 |
| 5200 | 0.3397 | 0.3472 | 7% | 631 | 83.4% | 6523 | 9.9% | 540 | 68 | 83 | 87 |
| 5200 | 0.3397 | 0.3472 | 6% | 635 | 86.7% | 6349 | 7.5% | 540 | 66 | 82 | 87 |
| 5200 | 0.3397 | 0.3472 | 5% | 640 | 89.6% | 6213 | 5.4% | 540 | 64 | 82 | 87 |
| 5100 | 0.3424 | 0.3494 | 8% | 611 | 87.6% | 4131 | 4.8% | 467 | 49 | 82 | 64 |
| 5100 | 0.3424 | 0.3494 | 7% | 616 | 88.3% | 4131 | 4.8% | 467 | 49 | 85 | 74 |
| 5100 | 0.3424 | 0.3494 | 6% | 620 | 88.8% | 4131 | 4.8% | 467 | 48 | 87 | 82 |
| 5100 | 0.3424 | 0.3494 | 6% | 626 | 89.2% | 4131 | 4.8% | 467 | 48 | 89 | 91 |
| 5100 | 0.3424 | 0.3494 | 6% | 631 | 89.6% | 4131 | 4.8% | 467 | 47 | 90 | 98 |
| 5100 | 0.3424 | 0.3494 | 5% | 635 | 89.8% | 4131 | 4.8% | 467 | 46 | 90 | 96 |
| 5100 | 0.3424 | 0.3494 | 5% | 640 | 90.0% | 4131 | 4.8% | 467 | 45 | 89 | 91 |
| 5100 | 0.3424 | 0.3494 | 10% | 611 | 83.6% | 4131 | 6.9% | 471 | 48 | 86 | 66 |
| 5100 | 0.3424 | 0.3494 | 9% | 616 | 84.6% | 4131 | 6.9% | 471 | 48 | 90 | 78 |

TABLE 2-continued

| | | | | | | | | | | | |
|---|---|---|---|---|---|---|---|---|---|---|---|
| 5100 | 0.3424 | 0.3494 | 8% | 620 | 85.2% | 4131 | 6.9% | 471 | 47 | 92 | 87 |
| 5100 | 0.3424 | 0.3494 | 7% | 626 | 86.1% | 4182 | 6.6% | 471 | 48 | 94 | 94 |
| 5100 | 0.3424 | 0.3494 | 7% | 631 | 86.7% | 4209 | 6.4% | 471 | 48 | 94 | 91 |
| 5100 | 0.3424 | 0.3494 | 7% | 635 | 87.1% | 4221 | 6.4% | 471 | 48 | 93 | 85 |
| 5100 | 0.3424 | 0.3494 | 6% | 640 | 87.4% | 4239 | 6.3% | 471 | 46 | 92 | 80 |
| 5100 | 0.3424 | 0.3494 | 10% | 611 | 83.7% | 4694 | 6.5% | 476 | 59 | 87 | 67 |
| 5100 | 0.3424 | 0.3494 | 9% | 616 | 84.9% | 4701 | 6.4% | 476 | 58 | 91 | 79 |
| 5100 | 0.3424 | 0.3494 | 8% | 620 | 85.4% | 4692 | 6.4% | 476 | 58 | 93 | 89 |
| 5100 | 0.3424 | 0.3494 | 7% | 626 | 86.6% | 4749 | 6.0% | 476 | 57 | 95 | 95 |
| 5100 | 0.3424 | 0.3494 | 7% | 631 | 87.2% | 4767 | 5.9% | 476 | 56 | 94 | 90 |
| 5100 | 0.3424 | 0.3494 | 7% | 635 | 87.5% | 4775 | 5.8% | 476 | 55 | 93 | 84 |
| 5100 | 0.3424 | 0.3494 | 6% | 640 | 87.9% | 4791 | 5.7% | 476 | 53 | 92 | 79 |
| 5100 | 0.3424 | 0.3494 | 10% | 611 | 83.4% | 5084 | 6.6% | 480 | 62 | 88 | 68 |
| 5100 | 0.3424 | 0.3494 | 9% | 616 | 84.4% | 5069 | 6.5% | 480 | 61 | 92 | 81 |
| 5100 | 0.3424 | 0.3494 | 8% | 620 | 85.1% | 5060 | 6.5% | 480 | 60 | 94 | 90 |
| 5100 | 0.3424 | 0.3494 | 8% | 626 | 86.4% | 5112 | 6.0% | 480 | 60 | 96 | 96 |
| 5100 | 0.3424 | 0.3494 | 7% | 631 | 87.0% | 5121 | 5.8% | 480 | 59 | 95 | 89 |
| 5100 | 0.3424 | 0.3494 | 7% | 635 | 87.4% | 5126 | 5.8% | 480 | 57 | 94 | 83 |
| 5100 | 0.3424 | 0.3494 | 6% | 640 | 87.9% | 5141 | 5.6% | 480 | 55 | 92 | 77 |
| 5100 | 0.3424 | 0.3494 | 11% | 611 | 82.4% | 5463 | 7.1% | 486 | 64 | 90 | 69 |
| 5100 | 0.3424 | 0.3494 | 9% | 616 | 83.4% | 5434 | 7.1% | 486 | 63 | 93 | 83 |
| 5100 | 0.3424 | 0.3494 | 9% | 620 | 84.3% | 5429 | 6.9% | 486 | 62 | 96 | 93 |
| 5100 | 0.3424 | 0.3494 | 8% | 626 | 85.8% | 5456 | 6.4% | 486 | 62 | 97 | 95 |
| 5100 | 0.3424 | 0.3494 | 7% | 631 | 86.4% | 5454 | 6.2% | 486 | 60 | 95 | 87 |
| 5100 | 0.3424 | 0.3494 | 7% | 635 | 86.9% | 5457 | 6.1% | 486 | 59 | 94 | 81 |
| 5100 | 0.3424 | 0.3494 | 7% | 640 | 87.6% | 5470 | 5.8% | 486 | 57 | 92 | 76 |
| 5100 | 0.3424 | 0.3494 | 11% | 611 | 80.5% | 5791 | 8.3% | 491 | 65 | 91 | 71 |
| 5100 | 0.3424 | 0.3494 | 10% | 616 | 81.9% | 5754 | 8.1% | 491 | 64 | 95 | 86 |
| 5100 | 0.3424 | 0.3494 | 9% | 620 | 83.2% | 5739 | 7.7% | 491 | 63 | 97 | 96 |
| 5100 | 0.3424 | 0.3494 | 8% | 626 | 84.7% | 5733 | 7.2% | 491 | 63 | 97 | 93 |
| 5100 | 0.3424 | 0.3494 | 8% | 631 | 85.8% | 5731 | 6.7% | 491 | 61 | 95 | 85 |
| 5100 | 0.3424 | 0.3494 | 7% | 635 | 86.7% | 5732 | 6.3% | 491 | 60 | 93 | 80 |
| 5100 | 0.3424 | 0.3494 | 7% | 640 | 87.5% | 5734 | 5.9% | 491 | 58 | 91 | 75 |
| 5100 | 0.3424 | 0.3494 | 12% | 611 | 78.4% | 6060 | 9.7% | 496 | 66 | 93 | 74 |
| 5100 | 0.3424 | 0.3494 | 10% | 616 | 80.4% | 6000 | 9.2% | 496 | 65 | 96 | 88 |
| 5100 | 0.3424 | 0.3494 | 9% | 620 | 82.2% | 5965 | 8.5% | 496 | 64 | 98 | 98 |
| 5100 | 0.3424 | 0.3494 | 8% | 626 | 84.1% | 5935 | 7.6% | 496 | 64 | 96 | 92 |
| 5100 | 0.3424 | 0.3494 | 8% | 631 | 85.4% | 5915 | 7.0% | 496 | 62 | 93 | 84 |
| 5100 | 0.3424 | 0.3494 | 7% | 635 | 86.3% | 5903 | 6.6% | 496 | 61 | 92 | 79 |
| 5100 | 0.3424 | 0.3494 | 7% | 640 | 87.2% | 5893 | 6.2% | 496 | 59 | 90 | 74 |
| 5100 | 0.3424 | 0.3494 | 13% | 611 | 76.0% | 6386 | 11.3% | 502 | 67 | 94 | 76 |
| 5100 | 0.3424 | 0.3494 | 11% | 616 | 78.8% | 6270 | 10.3% | 502 | 66 | 96 | 91 |
| 5100 | 0.3424 | 0.3494 | 10% | 620 | 81.1% | 6192 | 9.3% | 502 | 66 | 96 | 99 |
| 5100 | 0.3424 | 0.3494 | 8% | 626 | 83.4% | 6123 | 8.2% | 502 | 65 | 94 | 90 |
| 5100 | 0.3424 | 0.3494 | 8% | 631 | 85.1% | 6079 | 7.4% | 502 | 63 | 91 | 83 |
| 5100 | 0.3424 | 0.3494 | 7% | 635 | 86.2% | 6051 | 6.8% | 502 | 62 | 90 | 79 |
| 5100 | 0.3424 | 0.3494 | 7% | 640 | 87.1% | 6028 | 6.3% | 502 | 60 | 88 | 74 |
| 5100 | 0.3424 | 0.3494 | 13% | 611 | 73.3% | 6733 | 13.3% | 508 | 68 | 94 | 78 |
| 5100 | 0.3424 | 0.3494 | 11% | 616 | 76.3% | 6554 | 12.2% | 508 | 67 | 95 | 94 |
| 5100 | 0.3424 | 0.3494 | 10% | 620 | 80.1% | 6377 | 10.2% | 508 | 67 | 94 | 97 |
| 5100 | 0.3424 | 0.3494 | 8% | 626 | 83.0% | 6258 | 8.6% | 508 | 66 | 92 | 89 |
| 5100 | 0.3424 | 0.3494 | 8% | 631 | 84.8% | 6191 | 7.7% | 508 | 64 | 90 | 83 |
| 5100 | 0.3424 | 0.3494 | 7% | 635 | 85.9% | 6154 | 7.1% | 508 | 63 | 88 | 78 |
| 5100 | 0.3424 | 0.3494 | 7% | 640 | 86.8% | 6121 | 6.6% | 508 | 61 | 87 | 74 |
| 5100 | 0.3424 | 0.3494 | 14% | 611 | 70.8% | 7051 | 15.2% | 514 | 69 | 93 | 80 |
| 5100 | 0.3424 | 0.3494 | 12% | 616 | 74.4% | 6782 | 13.7% | 514 | 68 | 94 | 95 |
| 5100 | 0.3424 | 0.3494 | 10% | 620 | 79.2% | 6505 | 11.0% | 514 | 68 | 93 | 95 |
| 5100 | 0.3424 | 0.3494 | 8% | 626 | 82.6% | 6346 | 9.1% | 514 | 67 | 90 | 89 |
| 5100 | 0.3424 | 0.3494 | 8% | 631 | 84.3% | 6268 | 8.2% | 514 | 65 | 88 | 82 |
| 5100 | 0.3424 | 0.3494 | 7% | 635 | 85.4% | 6222 | 7.6% | 514 | 64 | 87 | 78 |
| 5100 | 0.3424 | 0.3494 | 7% | 640 | 86.5% | 6179 | 6.9% | 514 | 61 | 86 | 74 |
| 5100 | 0.3424 | 0.3494 | 15% | 611 | 66.9% | 7569 | 18.2% | 521 | 70 | 92 | 82 |
| 5100 | 0.3424 | 0.3494 | 12% | 616 | 72.5% | 7038 | 15.4% | 521 | 69 | 92 | 95 |
| 5100 | 0.3424 | 0.3494 | 10% | 620 | 78.3% | 6636 | 11.9% | 521 | 68 | 91 | 94 |
| 5100 | 0.3424 | 0.3494 | 8% | 626 | 81.6% | 6449 | 10.0% | 521 | 67 | 89 | 88 |
| 5100 | 0.3424 | 0.3494 | 8% | 631 | 83.6% | 6350 | 8.9% | 521 | 66 | 87 | 82 |
| 5100 | 0.3424 | 0.3494 | 7% | 635 | 84.9% | 6286 | 8.1% | 521 | 64 | 86 | 78 |
| 5100 | 0.3424 | 0.3494 | 6% | 640 | 86.4% | 6222 | 7.2% | 521 | 62 | 84 | 75 |
| 5100 | 0.3424 | 0.3494 | 16% | 611 | 62.7% | 8236 | 21.4% | 527 | 71 | 90 | 84 |
| 5100 | 0.3424 | 0.3494 | 12% | 616 | 70.5% | 7283 | 17.1% | 527 | 70 | 91 | 94 |
| 5100 | 0.3424 | 0.3494 | 10% | 620 | 77.1% | 6754 | 13.0% | 527 | 69 | 89 | 93 |
| 5100 | 0.3424 | 0.3494 | 8% | 626 | 80.5% | 6541 | 11.0% | 527 | 68 | 88 | 87 |
| 5100 | 0.3424 | 0.3494 | 8% | 631 | 83.0% | 6407 | 9.5% | 527 | 66 | 86 | 82 |
| 5100 | 0.3424 | 0.3494 | 7% | 635 | 84.9% | 6314 | 8.3% | 527 | 65 | 85 | 79 |
| 5100 | 0.3424 | 0.3494 | 6% | 640 | 87.0% | 6217 | 6.9% | 527 | 63 | 83 | 77 |
| 5100 | 0.3424 | 0.3494 | 17% | 611 | 56.2% | 9798 | 26.8% | 534 | 72 | 89 | 85 |
| 5100 | 0.3424 | 0.3494 | 13% | 616 | 67.7% | 7645 | 19.6% | 534 | 71 | 89 | 93 |
| 5100 | 0.3424 | 0.3494 | 10% | 620 | 74.7% | 6967 | 15.1% | 534 | 70 | 88 | 92 |
| 5100 | 0.3424 | 0.3494 | 9% | 626 | 79.1% | 6658 | 12.4% | 534 | 68 | 86 | 86 |
| 5100 | 0.3424 | 0.3494 | 7% | 631 | 82.9% | 6432 | 9.8% | 534 | 67 | 84 | 83 |

TABLE 2-continued

| | | | | | | | | | | |
|---|---|---|---|---|---|---|---|---|---|---|
| 5100 | 0.3424 | 0.3494 | 6% | 635 | 85.8% | 6288 | 7.8% | 534 | 66 | 83 | 83 |
| 5100 | 0.3424 | 0.3494 | 6% | 640 | 88.5% | 6166 | 5.9% | 534 | 64 | 82 | 83 |
| 5100 | 0.3424 | 0.3494 | 18% | 611 | 47.8% | 14450 | 33.9% | 540 | 73 | 86 | 85 |
| 5100 | 0.3424 | 0.3494 | 13% | 616 | 63.8% | 8255 | 23.3% | 540 | 71 | 87 | 92 |
| 5100 | 0.3424 | 0.3494 | 10% | 620 | 71.2% | 7313 | 18.3% | 540 | 70 | 86 | 91 |
| 5100 | 0.3424 | 0.3494 | 8% | 626 | 78.5% | 6720 | 13.2% | 540 | 69 | 84 | 88 |
| 5100 | 0.3424 | 0.3494 | 7% | 631 | 84.0% | 6390 | 9.3% | 540 | 68 | 83 | 87 |
| 5100 | 0.3424 | 0.3494 | 6% | 635 | 87.3% | 6228 | 6.9% | 540 | 66 | 82 | 87 |
| 5100 | 0.3424 | 0.3494 | 5% | 640 | 90.2% | 6102 | 4.7% | 540 | 64 | 82 | 87 |
| 5000 | 0.3451 | 0.3516 | 8% | 611 | 87.4% | 4131 | 4.7% | 467 | 49 | 83 | 64 |
| 5000 | 0.3451 | 0.3516 | 7% | 616 | 88.2% | 4131 | 4.6% | 467 | 49 | 85 | 75 |
| 5000 | 0.3451 | 0.3516 | 7% | 620 | 88.7% | 4131 | 4.6% | 467 | 48 | 87 | 83 |
| 5000 | 0.3451 | 0.3516 | 6% | 626 | 89.1% | 4131 | 4.6% | 467 | 48 | 89 | 92 |
| 5000 | 0.3451 | 0.3516 | 6% | 631 | 89.4% | 4131 | 4.6% | 467 | 47 | 91 | 99 |
| 5000 | 0.3451 | 0.3516 | 6% | 635 | 89.7% | 4131 | 4.6% | 467 | 46 | 90 | 95 |
| 5000 | 0.3451 | 0.3516 | 6% | 640 | 89.9% | 4131 | 4.6% | 467 | 45 | 89 | 89 |
| 5000 | 0.3451 | 0.3516 | 10% | 611 | 83.5% | 4131 | 6.7% | 471 | 49 | 86 | 65 |
| 5000 | 0.3451 | 0.3516 | 9% | 616 | 84.5% | 4131 | 6.7% | 471 | 48 | 90 | 78 |
| 5000 | 0.3451 | 0.3516 | 8% | 620 | 85.1% | 4131 | 6.7% | 471 | 48 | 92 | 87 |
| 5000 | 0.3451 | 0.3516 | 8% | 626 | 86.0% | 4177 | 6.4% | 471 | 48 | 94 | 94 |
| 5000 | 0.3451 | 0.3516 | 7% | 631 | 86.6% | 4203 | 6.3% | 471 | 48 | 94 | 90 |
| 5000 | 0.3451 | 0.3516 | 7% | 635 | 87.0% | 4218 | 6.2% | 471 | 48 | 93 | 84 |
| 5000 | 0.3451 | 0.3516 | 6% | 640 | 87.5% | 4248 | 6.0% | 471 | 47 | 92 | 79 |
| 5000 | 0.3451 | 0.3516 | 10% | 611 | 83.5% | 4668 | 6.4% | 476 | 59 | 87 | 66 |
| 5000 | 0.3451 | 0.3516 | 9% | 616 | 84.7% | 4676 | 6.3% | 476 | 58 | 91 | 79 |
| 5000 | 0.3451 | 0.3516 | 8% | 620 | 85.3% | 4670 | 6.3% | 476 | 58 | 93 | 89 |
| 5000 | 0.3451 | 0.3516 | 8% | 626 | 86.5% | 4728 | 5.8% | 476 | 58 | 95 | 95 |
| 5000 | 0.3451 | 0.3516 | 7% | 631 | 87.1% | 4745 | 5.7% | 476 | 56 | 94 | 89 |
| 5000 | 0.3451 | 0.3516 | 7% | 635 | 87.5% | 4755 | 5.6% | 476 | 55 | 93 | 83 |
| 5000 | 0.3451 | 0.3516 | 7% | 640 | 87.9% | 4778 | 5.5% | 476 | 53 | 92 | 78 |
| 5000 | 0.3451 | 0.3516 | 10% | 611 | 83.2% | 5046 | 6.4% | 480 | 62 | 88 | 67 |
| 5000 | 0.3451 | 0.3516 | 9% | 616 | 84.3% | 5033 | 6.4% | 480 | 61 | 92 | 81 |
| 5000 | 0.3451 | 0.3516 | 9% | 620 | 85.0% | 5028 | 6.3% | 480 | 61 | 94 | 91 |
| 5000 | 0.3451 | 0.3516 | 8% | 626 | 86.3% | 5078 | 5.8% | 480 | 60 | 96 | 95 |
| 5000 | 0.3451 | 0.3516 | 7% | 631 | 87.0% | 5086 | 5.7% | 480 | 59 | 95 | 88 |
| 5000 | 0.3451 | 0.3516 | 7% | 635 | 87.4% | 5092 | 5.6% | 480 | 57 | 94 | 82 |
| 5000 | 0.3451 | 0.3516 | 7% | 640 | 87.9% | 5112 | 5.4% | 480 | 55 | 92 | 76 |
| 5000 | 0.3451 | 0.3516 | 11% | 611 | 82.2% | 5412 | 7.0% | 486 | 64 | 90 | 69 |
| 5000 | 0.3451 | 0.3516 | 10% | 616 | 83.3% | 5383 | 7.0% | 486 | 63 | 94 | 83 |
| 5000 | 0.3451 | 0.3516 | 9% | 620 | 84.3% | 5382 | 6.8% | 486 | 62 | 96 | 93 |
| 5000 | 0.3451 | 0.3516 | 8% | 626 | 85.7% | 5406 | 6.2% | 486 | 62 | 97 | 95 |
| 5000 | 0.3451 | 0.3516 | 8% | 631 | 86.4% | 5404 | 6.1% | 486 | 60 | 95 | 86 |
| 5000 | 0.3451 | 0.3516 | 7% | 635 | 86.9% | 5411 | 5.9% | 486 | 59 | 94 | 80 |
| 5000 | 0.3451 | 0.3516 | 7% | 640 | 87.7% | 5428 | 5.6% | 486 | 57 | 92 | 75 |
| 5000 | 0.3451 | 0.3516 | 11% | 611 | 80.4% | 5725 | 8.2% | 491 | 65 | 91 | 71 |
| 5000 | 0.3451 | 0.3516 | 10% | 616 | 81.8% | 5689 | 8.0% | 491 | 64 | 95 | 86 |
| 5000 | 0.3451 | 0.3516 | 9% | 620 | 83.1% | 5676 | 7.6% | 491 | 64 | 97 | 96 |
| 5000 | 0.3451 | 0.3516 | 8% | 626 | 84.7% | 5671 | 7.0% | 491 | 63 | 97 | 93 |
| 5000 | 0.3451 | 0.3516 | 8% | 631 | 85.9% | 5670 | 6.5% | 491 | 62 | 94 | 85 |
| 5000 | 0.3451 | 0.3516 | 7% | 635 | 86.8% | 5672 | 6.0% | 491 | 60 | 93 | 79 |
| 5000 | 0.3451 | 0.3516 | 7% | 640 | 87.6% | 5675 | 5.7% | 491 | 58 | 91 | 74 |
| 5000 | 0.3451 | 0.3516 | 12% | 611 | 78.3% | 5980 | 9.5% | 496 | 66 | 93 | 73 |
| 5000 | 0.3451 | 0.3516 | 11% | 616 | 80.4% | 5922 | 8.9% | 496 | 65 | 96 | 88 |
| 5000 | 0.3451 | 0.3516 | 10% | 620 | 82.1% | 5889 | 8.3% | 496 | 65 | 98 | 99 |
| 5000 | 0.3451 | 0.3516 | 8% | 626 | 84.2% | 5861 | 7.4% | 496 | 64 | 95 | 91 |
| 5000 | 0.3451 | 0.3516 | 8% | 631 | 85.5% | 5843 | 6.7% | 496 | 63 | 93 | 84 |
| 5000 | 0.3451 | 0.3516 | 7% | 635 | 86.4% | 5832 | 6.3% | 496 | 61 | 91 | 78 |
| 5000 | 0.3451 | 0.3516 | 7% | 640 | 87.3% | 5823 | 5.9% | 496 | 59 | 90 | 73 |
| 5000 | 0.3451 | 0.3516 | 13% | 611 | 76.0% | 6287 | 11.1% | 502 | 67 | 94 | 76 |
| 5000 | 0.3451 | 0.3516 | 11% | 616 | 78.8% | 6177 | 10.1% | 502 | 66 | 96 | 91 |
| 5000 | 0.3451 | 0.3516 | 10% | 620 | 81.2% | 6102 | 9.1% | 502 | 66 | 96 | 99 |
| 5000 | 0.3451 | 0.3516 | 9% | 626 | 83.6% | 6037 | 7.9% | 502 | 65 | 94 | 90 |
| 5000 | 0.3451 | 0.3516 | 8% | 631 | 85.2% | 5994 | 7.1% | 502 | 64 | 91 | 83 |
| 5000 | 0.3451 | 0.3516 | 7% | 635 | 86.3% | 5969 | 6.5% | 502 | 62 | 90 | 78 |
| 5000 | 0.3451 | 0.3516 | 7% | 640 | 87.3% | 5946 | 6.0% | 502 | 60 | 88 | 74 |
| 5000 | 0.3451 | 0.3516 | 14% | 611 | 73.3% | 6611 | 13.1% | 508 | 68 | 94 | 78 |
| 5000 | 0.3451 | 0.3516 | 12% | 616 | 76.4% | 6440 | 11.9% | 508 | 67 | 95 | 93 |
| 5000 | 0.3451 | 0.3516 | 10% | 620 | 80.2% | 6274 | 9.9% | 508 | 67 | 94 | 97 |
| 5000 | 0.3451 | 0.3516 | 9% | 626 | 83.2% | 6161 | 8.3% | 508 | 66 | 92 | 89 |
| 5000 | 0.3451 | 0.3516 | 8% | 631 | 85.0% | 6098 | 7.4% | 508 | 65 | 90 | 83 |
| 5000 | 0.3451 | 0.3516 | 7% | 635 | 86.1% | 6062 | 6.8% | 508 | 63 | 88 | 78 |
| 5000 | 0.3451 | 0.3516 | 7% | 640 | 87.1% | 6031 | 6.3% | 508 | 61 | 87 | 73 |
| 5000 | 0.3451 | 0.3516 | 14% | 611 | 70.8% | 6904 | 14.9% | 514 | 69 | 93 | 79 |
| 5000 | 0.3451 | 0.3516 | 12% | 616 | 74.5% | 6651 | 13.4% | 514 | 68 | 94 | 95 |
| 5000 | 0.3451 | 0.3516 | 10% | 620 | 79.4% | 6392 | 10.7% | 514 | 68 | 93 | 95 |
| 5000 | 0.3451 | 0.3516 | 9% | 626 | 82.7% | 6241 | 8.8% | 514 | 67 | 90 | 89 |
| 5000 | 0.3451 | 0.3516 | 8% | 631 | 84.5% | 6167 | 7.8% | 514 | 65 | 88 | 82 |
| 5000 | 0.3451 | 0.3516 | 7% | 635 | 85.7% | 6123 | 7.2% | 514 | 64 | 87 | 77 |
| 5000 | 0.3451 | 0.3516 | 7% | 640 | 86.8% | 6082 | 6.5% | 514 | 61 | 85 | 73 |
| 5000 | 0.3451 | 0.3516 | 15% | 611 | 67.0% | 7377 | 17.9% | 521 | 70 | 92 | 81 |

TABLE 2-continued

| | | | | | | | | | | |
|---|---|---|---|---|---|---|---|---|---|---|
| 5000 | 0.3451 | 0.3516 | 12% | 616 | 72.6% | 6889 | 15.1% | 521 | 69 | 92 | 95 |
| 5000 | 0.3451 | 0.3516 | 10% | 620 | 78.4% | 6511 | 11.6% | 521 | 69 | 91 | 94 |
| 5000 | 0.3451 | 0.3516 | 9% | 626 | 81.8% | 6334 | 9.6% | 521 | 67 | 89 | 88 |
| 5000 | 0.3451 | 0.3516 | 8% | 631 | 83.9% | 6239 | 8.5% | 521 | 66 | 87 | 81 |
| 5000 | 0.3451 | 0.3516 | 7% | 635 | 85.3% | 6179 | 7.7% | 521 | 64 | 86 | 77 |
| 5000 | 0.3451 | 0.3516 | 7% | 640 | 86.7% | 6119 | 6.7% | 521 | 62 | 84 | 74 |
| 5000 | 0.3451 | 0.3516 | 16% | 611 | 62.9% | 7981 | 21.1% | 527 | 71 | 90 | 83 |
| 5000 | 0.3451 | 0.3516 | 13% | 616 | 70.6% | 7113 | 16.8% | 527 | 70 | 91 | 94 |
| 5000 | 0.3451 | 0.3516 | 10% | 620 | 77.3% | 6617 | 12.6% | 527 | 69 | 89 | 93 |
| 5000 | 0.3451 | 0.3516 | 9% | 626 | 80.8% | 6415 | 10.5% | 527 | 68 | 88 | 87 |
| 5000 | 0.3451 | 0.3516 | 8% | 631 | 83.3% | 6290 | 9.0% | 527 | 66 | 86 | 81 |
| 5000 | 0.3451 | 0.3516 | 7% | 635 | 85.2% | 6203 | 7.8% | 527 | 65 | 85 | 79 |
| 5000 | 0.3451 | 0.3516 | 6% | 640 | 87.4% | 6112 | 6.4% | 527 | 62 | 83 | 77 |
| 5000 | 0.3451 | 0.3516 | 17% | 611 | 56.4% | 9364 | 26.3% | 534 | 72 | 89 | 84 |
| 5000 | 0.3451 | 0.3516 | 13% | 616 | 67.9% | 7444 | 19.3% | 534 | 71 | 89 | 93 |
| 5000 | 0.3451 | 0.3516 | 10% | 620 | 75.1% | 6806 | 14.6% | 534 | 70 | 88 | 92 |
| 5000 | 0.3451 | 0.3516 | 9% | 626 | 79.5% | 6517 | 11.8% | 534 | 68 | 86 | 87 |
| 5000 | 0.3451 | 0.3516 | 7% | 631 | 83.4% | 6308 | 9.2% | 534 | 67 | 85 | 83 |
| 5000 | 0.3451 | 0.3516 | 7% | 635 | 86.2% | 6174 | 7.3% | 534 | 66 | 83 | 82 |
| 5000 | 0.3451 | 0.3516 | 6% | 640 | 89.0% | 6060 | 5.3% | 534 | 64 | 82 | 82 |
| 5000 | 0.3451 | 0.3516 | 19% | 611 | 48.1% | 13253 | 33.4% | 540 | 73 | 86 | 85 |
| 5000 | 0.3451 | 0.3516 | 13% | 616 | 64.1% | 7970 | 22.8% | 540 | 72 | 87 | 92 |
| 5000 | 0.3451 | 0.3516 | 11% | 620 | 71.7% | 7111 | 17.7% | 540 | 70 | 86 | 91 |
| 5000 | 0.3451 | 0.3516 | 8% | 626 | 79.0% | 6568 | 12.6% | 540 | 69 | 84 | 88 |
| 5000 | 0.3451 | 0.3516 | 7% | 631 | 84.5% | 6263 | 8.6% | 540 | 68 | 83 | 87 |
| 5000 | 0.3451 | 0.3516 | 6% | 635 | 87.9% | 6112 | 6.2% | 540 | 66 | 83 | 87 |
| 5000 | 0.3451 | 0.3516 | 5% | 640 | 90.8% | 5994 | 4.0% | 540 | 64 | 82 | 87 |
| 4900 | 0.3480 | 0.3539 | 8% | 611 | 87.1% | 4131 | 4.5% | 467 | 50 | 83 | 64 |
| 4900 | 0.3480 | 0.3539 | 7% | 616 | 88.0% | 4131 | 4.5% | 467 | 49 | 86 | 75 |
| 4900 | 0.3480 | 0.3539 | 7% | 620 | 88.5% | 4131 | 4.5% | 467 | 49 | 88 | 84 |
| 4900 | 0.3480 | 0.3539 | 7% | 626 | 89.0% | 4131 | 4.5% | 467 | 48 | 90 | 93 |
| 4900 | 0.3480 | 0.3539 | 6% | 631 | 89.3% | 4131 | 4.5% | 467 | 47 | 91 | 98 |
| 4900 | 0.3480 | 0.3539 | 6% | 635 | 89.5% | 4131 | 4.5% | 467 | 46 | 90 | 93 |
| 4900 | 0.3480 | 0.3539 | 6% | 640 | 89.8% | 4131 | 4.5% | 467 | 45 | 89 | 87 |
| 4900 | 0.3480 | 0.3539 | 10% | 611 | 83.4% | 4131 | 6.5% | 471 | 49 | 86 | 65 |
| 4900 | 0.3480 | 0.3539 | 9% | 616 | 84.4% | 4131 | 6.5% | 471 | 48 | 90 | 78 |
| 4900 | 0.3480 | 0.3539 | 8% | 620 | 85.0% | 4131 | 6.5% | 471 | 48 | 93 | 88 |
| 4900 | 0.3480 | 0.3539 | 8% | 626 | 85.9% | 4172 | 6.3% | 471 | 49 | 94 | 94 |
| 4900 | 0.3480 | 0.3539 | 7% | 631 | 86.6% | 4200 | 6.1% | 471 | 48 | 94 | 89 |
| 4900 | 0.3480 | 0.3539 | 7% | 635 | 87.0% | 4222 | 6.0% | 471 | 48 | 93 | 83 |
| 4900 | 0.3480 | 0.3539 | 7% | 640 | 87.5% | 4256 | 5.8% | 471 | 47 | 92 | 77 |
| 4900 | 0.3480 | 0.3539 | 10% | 611 | 83.3% | 4643 | 6.3% | 476 | 59 | 87 | 66 |
| 4900 | 0.3480 | 0.3539 | 9% | 616 | 84.5% | 4651 | 6.1% | 476 | 59 | 91 | 80 |
| 4900 | 0.3480 | 0.3539 | 9% | 620 | 85.2% | 4651 | 6.1% | 476 | 58 | 94 | 89 |
| 4900 | 0.3480 | 0.3539 | 8% | 626 | 86.4% | 4707 | 5.7% | 476 | 58 | 95 | 95 |
| 4900 | 0.3480 | 0.3539 | 7% | 631 | 87.0% | 4725 | 5.6% | 476 | 57 | 94 | 88 |
| 4900 | 0.3480 | 0.3539 | 7% | 635 | 87.4% | 4737 | 5.5% | 476 | 55 | 93 | 82 |
| 4900 | 0.3480 | 0.3539 | 7% | 640 | 88.0% | 4765 | 5.3% | 476 | 54 | 92 | 76 |
| 4900 | 0.3480 | 0.3539 | 11% | 611 | 83.0% | 5009 | 6.3% | 480 | 62 | 88 | 67 |
| 4900 | 0.3480 | 0.3539 | 10% | 616 | 84.1% | 4996 | 6.3% | 480 | 61 | 92 | 81 |
| 4900 | 0.3480 | 0.3539 | 9% | 620 | 84.9% | 4997 | 6.2% | 480 | 61 | 95 | 91 |
| 4900 | 0.3480 | 0.3539 | 8% | 626 | 86.3% | 5043 | 5.7% | 480 | 60 | 96 | 95 |
| 4900 | 0.3480 | 0.3539 | 8% | 631 | 86.9% | 5052 | 5.6% | 480 | 59 | 95 | 87 |
| 4900 | 0.3480 | 0.3539 | 7% | 635 | 87.3% | 5060 | 5.5% | 480 | 58 | 93 | 81 |
| 4900 | 0.3480 | 0.3539 | 7% | 640 | 87.9% | 5085 | 5.2% | 480 | 56 | 92 | 75 |
| 4900 | 0.3480 | 0.3539 | 11% | 611 | 82.0% | 5360 | 6.9% | 486 | 64 | 90 | 69 |
| 4900 | 0.3480 | 0.3539 | 10% | 616 | 83.1% | 5333 | 6.9% | 486 | 63 | 94 | 83 |
| 4900 | 0.3480 | 0.3539 | 9% | 620 | 84.3% | 5336 | 6.6% | 486 | 63 | 96 | 94 |
| 4900 | 0.3480 | 0.3539 | 8% | 626 | 85.7% | 5357 | 6.1% | 486 | 62 | 97 | 94 |
| 4900 | 0.3480 | 0.3539 | 8% | 631 | 86.3% | 5356 | 5.9% | 486 | 60 | 95 | 85 |
| 4900 | 0.3480 | 0.3539 | 7% | 635 | 87.0% | 5366 | 5.7% | 486 | 59 | 93 | 79 |
| 4900 | 0.3480 | 0.3539 | 7% | 640 | 87.8% | 5386 | 5.3% | 486 | 57 | 91 | 74 |
| 4900 | 0.3480 | 0.3539 | 12% | 611 | 80.2% | 5660 | 8.0% | 491 | 65 | 91 | 71 |
| 4900 | 0.3480 | 0.3539 | 10% | 616 | 81.7% | 5625 | 7.8% | 491 | 64 | 95 | 86 |
| 4900 | 0.3480 | 0.3539 | 10% | 620 | 83.1% | 5613 | 7.4% | 491 | 64 | 97 | 97 |
| 4900 | 0.3480 | 0.3539 | 9% | 626 | 84.7% | 5609 | 6.8% | 491 | 63 | 96 | 92 |
| 4900 | 0.3480 | 0.3539 | 8% | 631 | 86.0% | 5610 | 6.2% | 491 | 62 | 94 | 84 |
| 4900 | 0.3480 | 0.3539 | 7% | 635 | 86.9% | 5613 | 5.8% | 491 | 60 | 92 | 79 |
| 4900 | 0.3480 | 0.3539 | 7% | 640 | 87.7% | 5615 | 5.4% | 491 | 58 | 90 | 73 |
| 4900 | 0.3480 | 0.3539 | 12% | 611 | 78.2% | 5901 | 9.3% | 496 | 66 | 93 | 73 |
| 4900 | 0.3480 | 0.3539 | 11% | 616 | 80.4% | 5846 | 8.7% | 496 | 65 | 96 | 88 |
| 4900 | 0.3480 | 0.3539 | 10% | 620 | 82.1% | 5815 | 8.1% | 496 | 65 | 98 | 99 |
| 4900 | 0.3480 | 0.3539 | 9% | 626 | 84.2% | 5788 | 7.1% | 496 | 64 | 95 | 91 |
| 4900 | 0.3480 | 0.3539 | 8% | 631 | 85.6% | 5771 | 6.5% | 496 | 63 | 93 | 83 |
| 4900 | 0.3480 | 0.3539 | 7% | 635 | 86.6% | 5762 | 6.0% | 496 | 61 | 91 | 78 |
| 4900 | 0.3480 | 0.3539 | 7% | 640 | 87.5% | 5753 | 5.6% | 496 | 59 | 89 | 73 |
| 4900 | 0.3480 | 0.3539 | 13% | 611 | 75.9% | 6190 | 10.9% | 502 | 67 | 94 | 75 |
| 4900 | 0.3480 | 0.3539 | 11% | 616 | 78.8% | 6085 | 9.9% | 502 | 66 | 96 | 90 |
| 4900 | 0.3480 | 0.3539 | 10% | 620 | 81.2% | 6014 | 8.8% | 502 | 66 | 96 | 99 |
| 4900 | 0.3480 | 0.3539 | 9% | 626 | 83.7% | 5952 | 7.6% | 502 | 65 | 93 | 90 |

TABLE 2-continued

| | | | | | | | | | | | |
|---|---|---|---|---|---|---|---|---|---|---|---|
| 4900 | 0.3480 | 0.3539 | 8% | 631 | 85.4% | 5912 | 6.8% | 502 | 64 | 91 | 82 |
| 4900 | 0.3480 | 0.3539 | 7% | 635 | 86.5% | 5887 | 6.2% | 502 | 62 | 89 | 78 |
| 4900 | 0.3480 | 0.3539 | 7% | 640 | 87.5% | 5867 | 5.7% | 502 | 60 | 88 | 73 |
| 4900 | 0.3480 | 0.3539 | 14% | 611 | 73.3% | 6492 | 12.8% | 508 | 68 | 94 | 77 |
| 4900 | 0.3480 | 0.3539 | 12% | 616 | 76.4% | 6328 | 11.7% | 508 | 67 | 95 | 93 |
| 4900 | 0.3480 | 0.3539 | 10% | 620 | 80.3% | 6173 | 9.6% | 508 | 67 | 94 | 97 |
| 4900 | 0.3480 | 0.3539 | 9% | 626 | 83.3% | 6066 | 8.0% | 508 | 66 | 92 | 89 |
| 4900 | 0.3480 | 0.3539 | 8% | 631 | 85.2% | 6006 | 7.0% | 508 | 65 | 89 | 82 |
| 4900 | 0.3480 | 0.3539 | 7% | 635 | 86.3% | 5972 | 6.5% | 508 | 63 | 88 | 77 |
| 4900 | 0.3480 | 0.3539 | 7% | 640 | 87.3% | 5943 | 5.9% | 508 | 61 | 86 | 73 |
| 4900 | 0.3480 | 0.3539 | 14% | 611 | 70.9% | 6762 | 14.6% | 514 | 69 | 93 | 79 |
| 4900 | 0.3480 | 0.3539 | 12% | 616 | 74.6% | 6524 | 13.1% | 514 | 68 | 94 | 95 |
| 4900 | 0.3480 | 0.3539 | 10% | 620 | 79.5% | 6282 | 10.3% | 514 | 68 | 93 | 95 |
| 4900 | 0.3480 | 0.3539 | 9% | 626 | 82.9% | 6138 | 8.4% | 514 | 67 | 90 | 89 |
| 4900 | 0.3480 | 0.3539 | 8% | 631 | 84.8% | 6068 | 7.4% | 514 | 65 | 88 | 82 |
| 4900 | 0.3480 | 0.3539 | 7% | 635 | 85.9% | 6026 | 6.8% | 514 | 64 | 87 | 77 |
| 4900 | 0.3480 | 0.3539 | 7% | 640 | 87.1% | 5988 | 6.2% | 514 | 61 | 85 | 73 |
| 4900 | 0.3480 | 0.3539 | 15% | 611 | 67.1% | 7194 | 17.5% | 521 | 70 | 92 | 81 |
| 4900 | 0.3480 | 0.3539 | 13% | 616 | 72.7% | 6745 | 14.8% | 521 | 69 | 92 | 95 |
| 4900 | 0.3480 | 0.3539 | 10% | 620 | 78.6% | 6390 | 11.2% | 521 | 69 | 91 | 94 |
| 4900 | 0.3480 | 0.3539 | 9% | 626 | 82.1% | 6221 | 9.2% | 521 | 68 | 89 | 88 |
| 4900 | 0.3480 | 0.3539 | 8% | 631 | 84.2% | 6132 | 8.0% | 521 | 66 | 87 | 81 |
| 4900 | 0.3480 | 0.3539 | 7% | 635 | 85.6% | 6076 | 7.2% | 521 | 64 | 86 | 77 |
| 4900 | 0.3480 | 0.3539 | 7% | 640 | 87.1% | 6019 | 6.3% | 521 | 62 | 84 | 74 |
| 4900 | 0.3480 | 0.3539 | 16% | 611 | 63.1% | 7740 | 20.7% | 527 | 71 | 90 | 82 |
| 4900 | 0.3480 | 0.3539 | 13% | 616 | 70.8% | 6950 | 16.4% | 527 | 70 | 91 | 94 |
| 4900 | 0.3480 | 0.3539 | 10% | 620 | 77.6% | 6484 | 12.2% | 527 | 69 | 90 | 93 |
| 4900 | 0.3480 | 0.3539 | 9% | 626 | 81.2% | 6294 | 10.1% | 527 | 68 | 88 | 87 |
| 4900 | 0.3480 | 0.3539 | 8% | 631 | 83.7% | 6176 | 8.6% | 527 | 66 | 86 | 81 |
| 4900 | 0.3480 | 0.3539 | 7% | 635 | 85.6% | 6095 | 7.3% | 527 | 65 | 85 | 78 |
| 4900 | 0.3480 | 0.3539 | 6% | 640 | 87.7% | 6010 | 5.9% | 527 | 62 | 83 | 77 |
| 4900 | 0.3480 | 0.3539 | 17% | 611 | 56.7% | 8964 | 25.8% | 534 | 72 | 89 | 84 |
| 4900 | 0.3480 | 0.3539 | 13% | 616 | 68.1% | 7252 | 18.9% | 534 | 71 | 89 | 93 |
| 4900 | 0.3480 | 0.3539 | 10% | 620 | 75.4% | 6652 | 14.1% | 534 | 70 | 88 | 92 |
| 4900 | 0.3480 | 0.3539 | 9% | 626 | 79.9% | 6382 | 11.3% | 534 | 69 | 86 | 87 |
| 4900 | 0.3480 | 0.3539 | 8% | 631 | 83.8% | 6188 | 8.7% | 534 | 67 | 85 | 83 |
| 4900 | 0.3480 | 0.3539 | 7% | 635 | 86.7% | 6064 | 6.7% | 534 | 66 | 84 | 82 |
| 4900 | 0.3480 | 0.3539 | 6% | 640 | 89.5% | 5957 | 4.7% | 534 | 63 | 83 | 82 |
| 4900 | 0.3480 | 0.3539 | 19% | 611 | 48.4% | 12234 | 32.9% | 540 | 73 | 86 | 84 |
| 4900 | 0.3480 | 0.3539 | 13% | 616 | 64.5% | 7705 | 22.2% | 540 | 72 | 87 | 92 |
| 4900 | 0.3480 | 0.3539 | 11% | 620 | 72.2% | 6920 | 17.1% | 540 | 71 | 86 | 91 |
| 4900 | 0.3480 | 0.3539 | 9% | 626 | 79.5% | 6422 | 12.0% | 540 | 69 | 85 | 88 |
| 4900 | 0.3480 | 0.3539 | 7% | 631 | 85.1% | 6140 | 7.9% | 540 | 68 | 83 | 87 |
| 4900 | 0.3480 | 0.3539 | 6% | 635 | 88.5% | 6000 | 5.5% | 540 | 66 | 83 | 87 |
| 4900 | 0.3480 | 0.3539 | 5% | 640 | 91.5% | 5890 | 3.2% | 540 | 64 | 82 | 87 |
| 4800 | 0.3510 | 0.3562 | 9% | 611 | 86.9% | 4131 | 4.4% | 467 | 50 | 83 | 63 |
| 4800 | 0.3510 | 0.3562 | 8% | 616 | 87.8% | 4131 | 4.4% | 467 | 49 | 86 | 75 |
| 4800 | 0.3510 | 0.3562 | 7% | 620 | 88.3% | 4131 | 4.4% | 467 | 49 | 88 | 84 |
| 4800 | 0.3510 | 0.3562 | 7% | 626 | 88.8% | 4131 | 4.4% | 467 | 48 | 90 | 94 |
| 4800 | 0.3510 | 0.3562 | 6% | 631 | 89.2% | 4131 | 4.4% | 467 | 47 | 91 | 97 |
| 4800 | 0.3510 | 0.3562 | 6% | 635 | 89.4% | 4131 | 4.4% | 467 | 46 | 90 | 91 |
| 4800 | 0.3510 | 0.3562 | 6% | 640 | 89.6% | 4131 | 4.4% | 467 | 45 | 89 | 85 |
| 4800 | 0.3510 | 0.3562 | 10% | 611 | 83.3% | 4131 | 6.3% | 471 | 49 | 86 | 65 |
| 4800 | 0.3510 | 0.3562 | 9% | 616 | 84.3% | 4131 | 6.3% | 471 | 49 | 90 | 78 |
| 4800 | 0.3510 | 0.3562 | 9% | 620 | 85.0% | 4131 | 6.3% | 471 | 48 | 93 | 88 |
| 4800 | 0.3510 | 0.3562 | 8% | 626 | 85.8% | 4168 | 6.1% | 471 | 49 | 94 | 94 |
| 4800 | 0.3510 | 0.3562 | 8% | 631 | 86.5% | 4201 | 5.9% | 471 | 49 | 94 | 88 |
| 4800 | 0.3510 | 0.3562 | 7% | 635 | 87.0% | 4227 | 5.8% | 471 | 48 | 93 | 82 |
| 4800 | 0.3510 | 0.3562 | 7% | 640 | 87.5% | 4263 | 5.6% | 471 | 47 | 91 | 76 |
| 4800 | 0.3510 | 0.3562 | 11% | 611 | 83.1% | 4618 | 6.1% | 476 | 59 | 87 | 66 |
| 4800 | 0.3510 | 0.3562 | 10% | 616 | 84.3% | 4627 | 6.0% | 476 | 59 | 91 | 80 |
| 4800 | 0.3510 | 0.3562 | 9% | 620 | 85.1% | 4633 | 5.9% | 476 | 58 | 94 | 90 |
| 4800 | 0.3510 | 0.3562 | 8% | 626 | 86.3% | 4686 | 5.6% | 476 | 58 | 95 | 95 |
| 4800 | 0.3510 | 0.3562 | 8% | 631 | 87.0% | 4706 | 5.4% | 476 | 57 | 94 | 87 |
| 4800 | 0.3510 | 0.3562 | 7% | 635 | 87.4% | 4720 | 5.3% | 476 | 55 | 93 | 81 |
| 4800 | 0.3510 | 0.3562 | 7% | 640 | 88.0% | 4752 | 5.1% | 476 | 54 | 92 | 75 |
| 4800 | 0.3510 | 0.3562 | 11% | 611 | 82.8% | 4971 | 6.2% | 480 | 63 | 88 | 67 |
| 4800 | 0.3510 | 0.3562 | 10% | 616 | 84.0% | 4959 | 6.2% | 480 | 62 | 92 | 81 |
| 4800 | 0.3510 | 0.3562 | 9% | 620 | 84.9% | 4967 | 6.0% | 480 | 61 | 95 | 92 |
| 4800 | 0.3510 | 0.3562 | 8% | 626 | 86.2% | 5010 | 5.5% | 480 | 60 | 96 | 95 |
| 4800 | 0.3510 | 0.3562 | 8% | 631 | 86.8% | 5018 | 5.4% | 480 | 59 | 95 | 86 |
| 4800 | 0.3510 | 0.3562 | 7% | 635 | 87.3% | 5030 | 5.3% | 480 | 58 | 93 | 80 |
| 4800 | 0.3510 | 0.3562 | 7% | 640 | 88.0% | 5058 | 5.0% | 480 | 56 | 92 | 74 |
| 4800 | 0.3510 | 0.3562 | 11% | 611 | 81.8% | 5310 | 6.7% | 486 | 64 | 90 | 68 |
| 4800 | 0.3510 | 0.3562 | 10% | 616 | 83.0% | 5284 | 6.7% | 486 | 63 | 94 | 83 |
| 4800 | 0.3510 | 0.3562 | 9% | 620 | 84.2% | 5290 | 6.4% | 486 | 63 | 96 | 94 |
| 4800 | 0.3510 | 0.3562 | 9% | 626 | 85.6% | 5308 | 5.9% | 486 | 62 | 97 | 94 |
| 4800 | 0.3510 | 0.3562 | 8% | 631 | 86.3% | 5309 | 5.7% | 486 | 61 | 95 | 84 |
| 4800 | 0.3510 | 0.3562 | 8% | 635 | 87.0% | 5324 | 5.4% | 486 | 59 | 93 | 78 |
| 4800 | 0.3510 | 0.3562 | 7% | 640 | 87.9% | 5345 | 5.0% | 486 | 57 | 91 | 73 |

TABLE 2-continued

| | | | | | | | | | | |
|---|---|---|---|---|---|---|---|---|---|---|
| 4800 | 0.3510 | 0.3562 | 12% | 611 | 80.1% | 5595 | 7.8% | 491 | 66 | 91 | 70 |
| 4800 | 0.3510 | 0.3562 | 11% | 616 | 81.6% | 5561 | 7.6% | 491 | 65 | 95 | 86 |
| 4800 | 0.3510 | 0.3562 | 10% | 620 | 83.0% | 5550 | 7.2% | 491 | 64 | 97 | 97 |
| 4800 | 0.3510 | 0.3562 | 9% | 626 | 84.7% | 5549 | 6.5% | 491 | 63 | 96 | 92 |
| 4800 | 0.3510 | 0.3562 | 8% | 631 | 86.0% | 5551 | 5.9% | 491 | 62 | 94 | 83 |
| 4800 | 0.3510 | 0.3562 | 8% | 635 | 87.0% | 5554 | 5.5% | 491 | 61 | 92 | 78 |
| 4800 | 0.3510 | 0.3562 | 7% | 640 | 87.8% | 5557 | 5.1% | 491 | 58 | 90 | 72 |
| 4800 | 0.3510 | 0.3562 | 13% | 611 | 78.1% | 5824 | 9.1% | 496 | 66 | 93 | 72 |
| 4800 | 0.3510 | 0.3562 | 11% | 616 | 80.4% | 5771 | 8.5% | 496 | 66 | 96 | 88 |
| 4800 | 0.3510 | 0.3562 | 10% | 620 | 82.1% | 5741 | 7.9% | 496 | 65 | 97 | 99 |
| 4800 | 0.3510 | 0.3562 | 9% | 626 | 84.3% | 5717 | 6.8% | 496 | 64 | 95 | 91 |
| 4800 | 0.3510 | 0.3562 | 8% | 631 | 85.8% | 5701 | 6.2% | 496 | 63 | 92 | 83 |
| 4800 | 0.3510 | 0.3562 | 8% | 635 | 86.7% | 5692 | 5.7% | 496 | 61 | 91 | 77 |
| 4800 | 0.3510 | 0.3562 | 7% | 640 | 87.7% | 5685 | 5.3% | 496 | 59 | 89 | 72 |
| 4800 | 0.3510 | 0.3562 | 13% | 611 | 75.8% | 6096 | 10.7% | 502 | 67 | 94 | 75 |
| 4800 | 0.3510 | 0.3562 | 12% | 616 | 78.8% | 5995 | 9.7% | 502 | 67 | 96 | 90 |
| 4800 | 0.3510 | 0.3562 | 10% | 620 | 81.2% | 5928 | 8.6% | 502 | 66 | 96 | 98 |
| 4800 | 0.3510 | 0.3562 | 9% | 626 | 83.8% | 5869 | 7.3% | 502 | 65 | 93 | 89 |
| 4800 | 0.3510 | 0.3562 | 8% | 631 | 85.5% | 5831 | 6.4% | 502 | 64 | 91 | 82 |
| 4800 | 0.3510 | 0.3562 | 7% | 635 | 86.7% | 5808 | 5.9% | 502 | 62 | 89 | 77 |
| 4800 | 0.3510 | 0.3562 | 7% | 640 | 87.7% | 5788 | 5.3% | 502 | 60 | 87 | 72 |
| 4800 | 0.3510 | 0.3562 | 14% | 611 | 73.2% | 6376 | 12.6% | 508 | 69 | 94 | 77 |
| 4800 | 0.3510 | 0.3562 | 12% | 616 | 76.5% | 6220 | 11.4% | 508 | 68 | 95 | 93 |
| 4800 | 0.3510 | 0.3562 | 10% | 620 | 80.3% | 6075 | 9.3% | 508 | 67 | 94 | 97 |
| 4800 | 0.3510 | 0.3562 | 9% | 626 | 83.5% | 5974 | 7.7% | 508 | 66 | 91 | 89 |
| 4800 | 0.3510 | 0.3562 | 8% | 631 | 85.4% | 5916 | 6.7% | 508 | 65 | 89 | 82 |
| 4800 | 0.3510 | 0.3562 | 7% | 635 | 86.5% | 5884 | 6.1% | 508 | 63 | 88 | 77 |
| 4800 | 0.3510 | 0.3562 | 7% | 640 | 87.5% | 5856 | 5.5% | 508 | 61 | 86 | 72 |
| 4800 | 0.3510 | 0.3562 | 15% | 611 | 71.0% | 6624 | 14.3% | 514 | 69 | 93 | 78 |
| 4800 | 0.3510 | 0.3562 | 12% | 616 | 74.7% | 6400 | 12.8% | 514 | 68 | 94 | 94 |
| 4800 | 0.3510 | 0.3562 | 10% | 620 | 79.6% | 6174 | 10.0% | 514 | 68 | 93 | 95 |
| 4800 | 0.3510 | 0.3562 | 9% | 626 | 83.1% | 6039 | 8.0% | 514 | 67 | 90 | 88 |
| 4800 | 0.3510 | 0.3562 | 8% | 631 | 85.0% | 5972 | 7.0% | 514 | 65 | 88 | 81 |
| 4800 | 0.3510 | 0.3562 | 7% | 635 | 86.2% | 5932 | 6.4% | 514 | 64 | 87 | 77 |
| 4800 | 0.3510 | 0.3562 | 7% | 640 | 87.4% | 5896 | 5.7% | 514 | 61 | 85 | 72 |
| 4800 | 0.3510 | 0.3562 | 16% | 611 | 67.3% | 7017 | 17.1% | 521 | 71 | 92 | 80 |
| 4800 | 0.3510 | 0.3562 | 13% | 616 | 72.8% | 6605 | 14.4% | 521 | 69 | 92 | 95 |
| 4800 | 0.3510 | 0.3562 | 10% | 620 | 78.8% | 6273 | 10.8% | 521 | 69 | 91 | 94 |
| 4800 | 0.3510 | 0.3562 | 9% | 626 | 82.3% | 6112 | 8.8% | 521 | 68 | 89 | 88 |
| 4800 | 0.3510 | 0.3562 | 8% | 631 | 84.5% | 6028 | 7.6% | 521 | 66 | 87 | 81 |
| 4800 | 0.3510 | 0.3562 | 7% | 635 | 85.9% | 5975 | 6.8% | 521 | 64 | 85 | 77 |
| 4800 | 0.3510 | 0.3562 | 7% | 640 | 87.4% | 5922 | 5.8% | 521 | 62 | 84 | 74 |
| 4800 | 0.3510 | 0.3562 | 16% | 611 | 63.3% | 7510 | 20.3% | 527 | 71 | 90 | 82 |
| 4800 | 0.3510 | 0.3562 | 13% | 616 | 70.9% | 6792 | 16.1% | 527 | 70 | 91 | 94 |
| 4800 | 0.3510 | 0.3562 | 10% | 620 | 77.8% | 6356 | 11.7% | 527 | 69 | 90 | 93 |
| 4800 | 0.3510 | 0.3562 | 9% | 626 | 81.5% | 6176 | 9.6% | 527 | 68 | 88 | 87 |
| 4800 | 0.3510 | 0.3562 | 8% | 631 | 84.0% | 6066 | 8.1% | 527 | 66 | 86 | 81 |
| 4800 | 0.3510 | 0.3562 | 7% | 635 | 86.0% | 5990 | 6.8% | 527 | 65 | 85 | 78 |
| 4800 | 0.3510 | 0.3562 | 6% | 640 | 88.1% | 5912 | 5.4% | 527 | 62 | 83 | 76 |
| 4800 | 0.3510 | 0.3562 | 18% | 611 | 57.0% | 8594 | 25.4% | 534 | 72 | 89 | 83 |
| 4800 | 0.3510 | 0.3562 | 13% | 616 | 68.2% | 7068 | 18.5% | 534 | 71 | 89 | 93 |
| 4800 | 0.3510 | 0.3562 | 11% | 620 | 75.8% | 6503 | 13.6% | 534 | 70 | 88 | 92 |
| 4800 | 0.3510 | 0.3562 | 9% | 626 | 80.3% | 6252 | 10.7% | 534 | 69 | 86 | 87 |
| 4800 | 0.3510 | 0.3562 | 8% | 631 | 84.3% | 6073 | 8.1% | 534 | 67 | 85 | 83 |
| 4800 | 0.3510 | 0.3562 | 7% | 635 | 87.2% | 5958 | 6.1% | 534 | 66 | 84 | 82 |
| 4800 | 0.3510 | 0.3562 | 6% | 640 | 90.0% | 5858 | 4.1% | 534 | 63 | 83 | 82 |
| 4800 | 0.3510 | 0.3562 | 19% | 611 | 48.7% | 11361 | 32.3% | 540 | 74 | 86 | 84 |
| 4800 | 0.3510 | 0.3562 | 13% | 616 | 64.9% | 7458 | 21.7% | 540 | 72 | 87 | 92 |
| 4800 | 0.3510 | 0.3562 | 11% | 620 | 72.7% | 6738 | 16.4% | 540 | 71 | 86 | 91 |
| 4800 | 0.3510 | 0.3562 | 9% | 626 | 80.0% | 6282 | 11.3% | 540 | 69 | 85 | 88 |
| 4800 | 0.3510 | 0.3562 | 7% | 631 | 85.7% | 6022 | 7.2% | 540 | 68 | 84 | 87 |
| 4800 | 0.3510 | 0.3562 | 6% | 635 | 89.1% | 5892 | 4.7% | 540 | 66 | 83 | 87 |
| 4800 | 0.3510 | 0.3562 | 5% | 640 | 92.2% | 5789 | 2.5% | 540 | 64 | 82 | 87 |
| 4700 | 0.3541 | 0.3586 | 9% | 611 | 86.6% | 4131 | 4.3% | 467 | 50 | 83 | 63 |
| 4700 | 0.3541 | 0.3586 | 8% | 616 | 87.6% | 4131 | 4.3% | 467 | 50 | 86 | 75 |
| 4700 | 0.3541 | 0.3586 | 8% | 620 | 88.1% | 4131 | 4.3% | 467 | 49 | 88 | 85 |
| 4700 | 0.3541 | 0.3586 | 7% | 626 | 88.6% | 4131 | 4.3% | 467 | 48 | 91 | 95 |
| 4700 | 0.3541 | 0.3586 | 7% | 631 | 89.0% | 4131 | 4.3% | 467 | 47 | 91 | 96 |
| 4700 | 0.3541 | 0.3586 | 6% | 635 | 89.3% | 4131 | 4.2% | 467 | 46 | 90 | 90 |
| 4700 | 0.3541 | 0.3586 | 6% | 640 | 89.5% | 4131 | 4.2% | 467 | 45 | 89 | 83 |
| 4700 | 0.3541 | 0.3586 | 11% | 611 | 83.1% | 4131 | 6.2% | 471 | 50 | 87 | 65 |
| 4700 | 0.3541 | 0.3586 | 10% | 616 | 84.2% | 4131 | 6.1% | 471 | 49 | 91 | 79 |
| 4700 | 0.3541 | 0.3586 | 9% | 620 | 84.9% | 4131 | 6.1% | 471 | 48 | 93 | 89 |
| 4700 | 0.3541 | 0.3586 | 8% | 626 | 85.8% | 4165 | 5.9% | 471 | 49 | 95 | 94 |
| 4700 | 0.3541 | 0.3586 | 8% | 631 | 86.5% | 4208 | 5.7% | 471 | 49 | 94 | 87 |
| 4700 | 0.3541 | 0.3586 | 7% | 635 | 87.0% | 4231 | 5.6% | 471 | 48 | 93 | 81 |
| 4700 | 0.3541 | 0.3586 | 7% | 640 | 87.6% | 4271 | 5.3% | 471 | 48 | 91 | 75 |
| 4700 | 0.3541 | 0.3586 | 11% | 611 | 82.8% | 4593 | 6.0% | 476 | 59 | 88 | 66 |
| 4700 | 0.3541 | 0.3586 | 10% | 616 | 84.1% | 4603 | 5.9% | 476 | 59 | 92 | 80 |
| 4700 | 0.3541 | 0.3586 | 9% | 620 | 85.0% | 4617 | 5.8% | 476 | 58 | 94 | 90 |

TABLE 2-continued

| | | | | | | | | | | |
|---|---|---|---|---|---|---|---|---|---|---|
| 4700 | 0.3541 | 0.3586 | 8% | 626 | 86.2% | 4666 | 5.4% | 476 | 58 | 95 | 95 |
| 4700 | 0.3541 | 0.3586 | 8% | 631 | 86.9% | 4688 | 5.2% | 476 | 57 | 94 | 86 |
| 4700 | 0.3541 | 0.3586 | 8% | 635 | 87.4% | 4704 | 5.1% | 476 | 55 | 93 | 80 |
| 4700 | 0.3541 | 0.3586 | 7% | 640 | 88.0% | 4741 | 4.8% | 476 | 54 | 91 | 74 |
| 4700 | 0.3541 | 0.3586 | 11% | 611 | 82.5% | 4934 | 6.1% | 480 | 63 | 89 | 67 |
| 4700 | 0.3541 | 0.3586 | 10% | 616 | 83.8% | 4923 | 6.0% | 480 | 62 | 93 | 81 |
| 4700 | 0.3541 | 0.3586 | 9% | 620 | 84.8% | 4938 | 5.8% | 480 | 61 | 95 | 92 |
| 4700 | 0.3541 | 0.3586 | 9% | 626 | 86.1% | 4977 | 5.4% | 480 | 60 | 96 | 94 |
| 4700 | 0.3541 | 0.3586 | 8% | 631 | 86.7% | 4985 | 5.2% | 480 | 59 | 94 | 85 |
| 4700 | 0.3541 | 0.3586 | 8% | 635 | 87.3% | 5002 | 5.1% | 480 | 58 | 93 | 79 |
| 4700 | 0.3541 | 0.3586 | 7% | 640 | 88.0% | 5032 | 4.8% | 480 | 56 | 91 | 73 |
| 4700 | 0.3541 | 0.3586 | 12% | 611 | 81.6% | 5259 | 6.6% | 486 | 65 | 90 | 68 |
| 4700 | 0.3541 | 0.3586 | 11% | 616 | 82.8% | 5235 | 6.6% | 486 | 64 | 94 | 83 |
| 4700 | 0.3541 | 0.3586 | 10% | 620 | 84.1% | 5244 | 6.2% | 486 | 63 | 96 | 94 |
| 4700 | 0.3541 | 0.3586 | 9% | 626 | 85.5% | 5259 | 5.8% | 486 | 62 | 96 | 93 |
| 4700 | 0.3541 | 0.3586 | 8% | 631 | 86.3% | 5265 | 5.5% | 486 | 61 | 94 | 83 |
| 4700 | 0.3541 | 0.3586 | 8% | 635 | 87.1% | 5283 | 5.2% | 486 | 59 | 92 | 78 |
| 4700 | 0.3541 | 0.3586 | 7% | 640 | 88.0% | 5305 | 4.7% | 486 | 57 | 90 | 72 |
| 4700 | 0.3541 | 0.3586 | 12% | 611 | 79.9% | 5531 | 7.7% | 491 | 66 | 91 | 70 |
| 4700 | 0.3541 | 0.3586 | 11% | 616 | 81.5% | 5499 | 7.5% | 491 | 65 | 96 | 86 |
| 4700 | 0.3541 | 0.3586 | 10% | 620 | 83.0% | 5489 | 7.0% | 491 | 64 | 98 | 97 |
| 4700 | 0.3541 | 0.3586 | 9% | 626 | 84.7% | 5490 | 6.3% | 491 | 63 | 96 | 91 |
| 4700 | 0.3541 | 0.3586 | 8% | 631 | 86.1% | 5494 | 5.7% | 491 | 62 | 93 | 83 |
| 4700 | 0.3541 | 0.3586 | 8% | 635 | 87.1% | 5497 | 5.2% | 491 | 61 | 91 | 77 |
| 4700 | 0.3541 | 0.3586 | 7% | 640 | 87.9% | 5500 | 4.8% | 491 | 58 | 89 | 72 |
| 4700 | 0.3541 | 0.3586 | 13% | 611 | 77.9% | 5747 | 9.0% | 496 | 67 | 93 | 72 |
| 4700 | 0.3541 | 0.3586 | 11% | 616 | 80.4% | 5697 | 8.3% | 496 | 66 | 96 | 88 |
| 4700 | 0.3541 | 0.3586 | 10% | 620 | 82.1% | 5669 | 7.7% | 496 | 65 | 97 | 99 |
| 4700 | 0.3541 | 0.3586 | 9% | 626 | 84.4% | 5647 | 6.6% | 496 | 64 | 95 | 90 |
| 4700 | 0.3541 | 0.3586 | 8% | 631 | 85.9% | 5632 | 5.9% | 496 | 63 | 92 | 82 |
| 4700 | 0.3541 | 0.3586 | 8% | 635 | 86.9% | 5624 | 5.4% | 496 | 61 | 90 | 77 |
| 4700 | 0.3541 | 0.3586 | 7% | 640 | 87.8% | 5617 | 4.9% | 496 | 59 | 88 | 71 |
| 4700 | 0.3541 | 0.3586 | 14% | 611 | 75.7% | 6003 | 10.5% | 502 | 68 | 94 | 74 |
| 4700 | 0.3541 | 0.3586 | 12% | 616 | 78.7% | 5908 | 9.4% | 502 | 67 | 96 | 90 |
| 4700 | 0.3541 | 0.3586 | 10% | 620 | 81.3% | 5844 | 8.3% | 502 | 66 | 96 | 98 |
| 4700 | 0.3541 | 0.3586 | 9% | 626 | 83.9% | 5787 | 7.0% | 502 | 65 | 93 | 89 |
| 4700 | 0.3541 | 0.3586 | 8% | 631 | 85.7% | 5751 | 6.1% | 502 | 64 | 90 | 82 |
| 4700 | 0.3541 | 0.3586 | 8% | 635 | 86.8% | 5730 | 5.5% | 502 | 62 | 89 | 77 |
| 4700 | 0.3541 | 0.3586 | 7% | 640 | 87.9% | 5711 | 5.0% | 502 | 60 | 87 | 72 |
| 4700 | 0.3541 | 0.3586 | 14% | 611 | 73.2% | 6263 | 12.3% | 508 | 69 | 93 | 76 |
| 4700 | 0.3541 | 0.3586 | 12% | 616 | 76.6% | 6114 | 11.1% | 508 | 68 | 95 | 93 |
| 4700 | 0.3541 | 0.3586 | 11% | 620 | 80.4% | 5979 | 9.0% | 508 | 67 | 94 | 96 |
| 4700 | 0.3541 | 0.3586 | 9% | 626 | 83.6% | 5883 | 7.3% | 508 | 66 | 91 | 89 |
| 4700 | 0.3541 | 0.3586 | 8% | 631 | 85.5% | 5829 | 6.3% | 508 | 65 | 89 | 81 |
| 4700 | 0.3541 | 0.3586 | 8% | 635 | 86.7% | 5799 | 5.7% | 508 | 63 | 87 | 76 |
| 4700 | 0.3541 | 0.3586 | 7% | 640 | 87.8% | 5772 | 5.1% | 508 | 61 | 86 | 72 |
| 4700 | 0.3541 | 0.3586 | 15% | 611 | 71.0% | 6490 | 14.0% | 514 | 70 | 93 | 78 |
| 4700 | 0.3541 | 0.3586 | 13% | 616 | 74.8% | 6279 | 12.4% | 514 | 69 | 94 | 94 |
| 4700 | 0.3541 | 0.3586 | 11% | 620 | 79.7% | 6070 | 9.7% | 514 | 68 | 93 | 95 |
| 4700 | 0.3541 | 0.3586 | 9% | 626 | 83.3% | 5941 | 7.7% | 514 | 67 | 90 | 88 |
| 4700 | 0.3541 | 0.3586 | 8% | 631 | 85.3% | 5878 | 6.6% | 514 | 65 | 88 | 81 |
| 4700 | 0.3541 | 0.3586 | 8% | 635 | 86.5% | 5841 | 6.0% | 514 | 64 | 86 | 76 |
| 4700 | 0.3541 | 0.3586 | 7% | 640 | 87.7% | 5806 | 5.3% | 514 | 61 | 85 | 72 |
| 4700 | 0.3541 | 0.3586 | 16% | 611 | 67.4% | 6848 | 16.7% | 521 | 71 | 91 | 80 |
| 4700 | 0.3541 | 0.3586 | 13% | 616 | 72.9% | 6469 | 14.1% | 521 | 70 | 92 | 94 |
| 4700 | 0.3541 | 0.3586 | 11% | 620 | 79.0% | 6159 | 10.5% | 521 | 69 | 91 | 94 |
| 4700 | 0.3541 | 0.3586 | 9% | 626 | 82.6% | 6007 | 8.3% | 521 | 68 | 89 | 88 |
| 4700 | 0.3541 | 0.3586 | 8% | 631 | 84.8% | 5927 | 7.1% | 521 | 66 | 87 | 81 |
| 4700 | 0.3541 | 0.3586 | 7% | 635 | 86.2% | 5877 | 6.3% | 521 | 64 | 85 | 77 |
| 4700 | 0.3541 | 0.3586 | 7% | 640 | 87.8% | 5827 | 5.3% | 521 | 62 | 84 | 73 |
| 4700 | 0.3541 | 0.3586 | 17% | 611 | 63.5% | 7293 | 19.8% | 527 | 72 | 90 | 81 |
| 4700 | 0.3541 | 0.3586 | 13% | 616 | 71.1% | 6640 | 15.7% | 527 | 70 | 91 | 94 |
| 4700 | 0.3541 | 0.3586 | 11% | 620 | 78.1% | 6232 | 11.3% | 527 | 70 | 90 | 93 |
| 4700 | 0.3541 | 0.3586 | 9% | 626 | 81.8% | 6062 | 9.1% | 527 | 68 | 88 | 87 |
| 4700 | 0.3541 | 0.3586 | 8% | 631 | 84.4% | 5959 | 7.5% | 527 | 66 | 86 | 81 |
| 4700 | 0.3541 | 0.3586 | 7% | 635 | 86.3% | 5889 | 6.3% | 527 | 65 | 84 | 78 |
| 4700 | 0.3541 | 0.3586 | 7% | 640 | 88.5% | 5815 | 4.9% | 527 | 62 | 83 | 76 |
| 4700 | 0.3541 | 0.3586 | 18% | 611 | 57.2% | 8252 | 24.9% | 534 | 73 | 89 | 83 |
| 4700 | 0.3541 | 0.3586 | 14% | 616 | 68.4% | 6891 | 18.1% | 534 | 71 | 89 | 93 |
| 4700 | 0.3541 | 0.3586 | 11% | 620 | 76.2% | 6360 | 13.0% | 534 | 70 | 88 | 92 |
| 4700 | 0.3541 | 0.3586 | 9% | 626 | 80.8% | 6127 | 10.1% | 534 | 69 | 86 | 87 |
| 4700 | 0.3541 | 0.3586 | 8% | 631 | 84.7% | 5962 | 7.5% | 534 | 67 | 85 | 83 |
| 4700 | 0.3541 | 0.3586 | 7% | 635 | 87.6% | 5855 | 5.5% | 534 | 66 | 84 | 82 |
| 4700 | 0.3541 | 0.3586 | 6% | 640 | 90.5% | 5761 | 3.5% | 534 | 63 | 83 | 82 |
| 4700 | 0.3541 | 0.3586 | 19% | 611 | 49.1% | 10604 | 31.7% | 540 | 74 | 87 | 83 |
| 4700 | 0.3541 | 0.3586 | 14% | 616 | 65.2% | 7228 | 21.1% | 540 | 72 | 87 | 92 |
| 4700 | 0.3541 | 0.3586 | 11% | 620 | 73.2% | 6565 | 15.7% | 540 | 71 | 86 | 91 |
| 4700 | 0.3541 | 0.3586 | 9% | 626 | 80.6% | 6149 | 10.6% | 540 | 69 | 85 | 88 |
| 4700 | 0.3541 | 0.3586 | 7% | 631 | 86.3% | 5909 | 6.5% | 540 | 68 | 84 | 87 |
| 4700 | 0.3541 | 0.3586 | 6% | 635 | 89.8% | 5787 | 3.9% | 540 | 66 | 83 | 87 |

TABLE 2-continued

| | | | | | | | | | | |
|---|---|---|---|---|---|---|---|---|---|---|
| 4700 | 0.3541 | 0.3586 | 5% | 640 | 92.9% | 5691 | 1.7% | 540 | 64 | 82 | 87 |
| 4600 | 0.3574 | 0.3611 | 9% | 611 | 86.4% | 4131 | 4.1% | 467 | 50 | 83 | 63 |
| 4600 | 0.3574 | 0.3611 | 9% | 616 | 87.3% | 4131 | 4.1% | 467 | 50 | 86 | 76 |
| 4600 | 0.3574 | 0.3611 | 8% | 620 | 87.9% | 4131 | 4.1% | 467 | 49 | 89 | 86 |
| 4600 | 0.3574 | 0.3611 | 7% | 626 | 88.4% | 4131 | 4.1% | 467 | 49 | 91 | 96 |
| 4600 | 0.3574 | 0.3611 | 7% | 631 | 88.8% | 4131 | 4.1% | 467 | 48 | 91 | 94 |
| 4600 | 0.3574 | 0.3611 | 7% | 635 | 89.1% | 4131 | 4.1% | 467 | 47 | 90 | 88 |
| 4600 | 0.3574 | 0.3611 | 7% | 640 | 89.3% | 4131 | 4.1% | 467 | 45 | 89 | 81 |
| 4600 | 0.3574 | 0.3611 | 11% | 611 | 82.9% | 4131 | 6.0% | 471 | 50 | 87 | 64 |
| 4600 | 0.3574 | 0.3611 | 10% | 616 | 84.1% | 4131 | 5.9% | 471 | 49 | 91 | 79 |
| 4600 | 0.3574 | 0.3611 | 9% | 620 | 84.8% | 4131 | 5.9% | 471 | 49 | 93 | 90 |
| 4600 | 0.3574 | 0.3611 | 9% | 626 | 85.7% | 4166 | 5.7% | 471 | 49 | 95 | 94 |
| 4600 | 0.3574 | 0.3611 | 8% | 631 | 86.5% | 4212 | 5.5% | 471 | 49 | 94 | 86 |
| 4600 | 0.3574 | 0.3611 | 8% | 635 | 87.0% | 4234 | 5.4% | 471 | 49 | 92 | 80 |
| 4600 | 0.3574 | 0.3611 | 7% | 640 | 87.6% | 4280 | 5.1% | 471 | 48 | 91 | 73 |
| 4600 | 0.3574 | 0.3611 | 12% | 611 | 82.6% | 4568 | 5.9% | 476 | 59 | 88 | 65 |
| 4600 | 0.3574 | 0.3611 | 10% | 616 | 83.9% | 4579 | 5.8% | 476 | 59 | 92 | 80 |
| 4600 | 0.3574 | 0.3611 | 10% | 620 | 84.9% | 4601 | 5.6% | 476 | 58 | 94 | 91 |
| 4600 | 0.3574 | 0.3611 | 9% | 626 | 86.1% | 4649 | 5.2% | 476 | 58 | 95 | 94 |
| 4600 | 0.3574 | 0.3611 | 8% | 631 | 86.8% | 4669 | 5.1% | 476 | 57 | 94 | 85 |
| 4600 | 0.3574 | 0.3611 | 8% | 635 | 87.3% | 4690 | 4.9% | 476 | 56 | 93 | 79 |
| 4600 | 0.3574 | 0.3611 | 7% | 640 | 88.0% | 4732 | 4.6% | 476 | 54 | 91 | 72 |
| 4600 | 0.3574 | 0.3611 | 12% | 611 | 82.3% | 4897 | 6.0% | 480 | 63 | 89 | 66 |
| 4600 | 0.3574 | 0.3611 | 11% | 616 | 83.6% | 4888 | 5.9% | 480 | 62 | 93 | 81 |
| 4600 | 0.3574 | 0.3611 | 10% | 620 | 84.7% | 4909 | 5.6% | 480 | 61 | 95 | 92 |
| 4600 | 0.3574 | 0.3611 | 9% | 626 | 86.0% | 4945 | 5.2% | 480 | 61 | 96 | 94 |
| 4600 | 0.3574 | 0.3611 | 8% | 631 | 86.6% | 4953 | 5.1% | 480 | 59 | 94 | 84 |
| 4600 | 0.3574 | 0.3611 | 8% | 635 | 87.3% | 4976 | 4.8% | 480 | 58 | 93 | 78 |
| 4600 | 0.3574 | 0.3611 | 7% | 640 | 88.0% | 5006 | 4.5% | 480 | 56 | 91 | 71 |
| 4600 | 0.3574 | 0.3611 | 12% | 611 | 81.4% | 5210 | 6.5% | 486 | 65 | 90 | 68 |
| 4600 | 0.3574 | 0.3611 | 11% | 616 | 82.7% | 5187 | 6.4% | 486 | 64 | 94 | 84 |
| 4600 | 0.3574 | 0.3611 | 10% | 620 | 84.1% | 5199 | 6.0% | 486 | 63 | 97 | 95 |
| 4600 | 0.3574 | 0.3611 | 9% | 626 | 85.3% | 5211 | 5.6% | 486 | 62 | 96 | 92 |
| 4600 | 0.3574 | 0.3611 | 8% | 631 | 86.3% | 5223 | 5.3% | 486 | 61 | 94 | 83 |
| 4600 | 0.3574 | 0.3611 | 8% | 635 | 87.2% | 5243 | 4.9% | 486 | 59 | 92 | 77 |
| 4600 | 0.3574 | 0.3611 | 7% | 640 | 88.1% | 5266 | 4.4% | 486 | 57 | 90 | 71 |
| 4600 | 0.3574 | 0.3611 | 13% | 611 | 79.7% | 5468 | 7.5% | 491 | 66 | 91 | 69 |
| 4600 | 0.3574 | 0.3611 | 11% | 616 | 81.4% | 5437 | 7.3% | 491 | 65 | 96 | 86 |
| 4600 | 0.3574 | 0.3611 | 10% | 620 | 83.0% | 5431 | 6.7% | 491 | 64 | 98 | 97 |
| 4600 | 0.3574 | 0.3611 | 9% | 626 | 84.8% | 5432 | 6.0% | 491 | 63 | 96 | 91 |
| 4600 | 0.3574 | 0.3611 | 8% | 631 | 86.2% | 5437 | 5.4% | 491 | 62 | 93 | 82 |
| 4600 | 0.3574 | 0.3611 | 8% | 635 | 87.2% | 5441 | 4.9% | 491 | 61 | 91 | 76 |
| 4600 | 0.3574 | 0.3611 | 7% | 640 | 88.0% | 5445 | 4.5% | 491 | 58 | 89 | 71 |
| 4600 | 0.3574 | 0.3611 | 13% | 611 | 77.8% | 5672 | 8.8% | 496 | 67 | 93 | 71 |
| 4600 | 0.3574 | 0.3611 | 12% | 616 | 80.3% | 5624 | 8.0% | 496 | 66 | 96 | 88 |
| 4600 | 0.3574 | 0.3611 | 11% | 620 | 82.0% | 5598 | 7.4% | 496 | 65 | 97 | 99 |
| 4600 | 0.3574 | 0.3611 | 9% | 626 | 84.4% | 5577 | 6.3% | 496 | 64 | 94 | 90 |
| 4600 | 0.3574 | 0.3611 | 8% | 631 | 86.0% | 5564 | 5.6% | 496 | 63 | 92 | 81 |
| 4600 | 0.3574 | 0.3611 | 8% | 635 | 87.0% | 5557 | 5.1% | 496 | 62 | 90 | 76 |
| 4600 | 0.3574 | 0.3611 | 7% | 640 | 88.0% | 5551 | 4.6% | 496 | 59 | 88 | 70 |
| 4600 | 0.3574 | 0.3611 | 14% | 611 | 75.7% | 5912 | 10.3% | 502 | 68 | 94 | 74 |
| 4600 | 0.3574 | 0.3611 | 12% | 616 | 78.7% | 5821 | 9.2% | 502 | 67 | 96 | 90 |
| 4600 | 0.3574 | 0.3611 | 11% | 620 | 81.3% | 5761 | 8.0% | 502 | 66 | 96 | 98 |
| 4600 | 0.3574 | 0.3611 | 9% | 626 | 84.0% | 5708 | 6.7% | 502 | 65 | 93 | 89 |
| 4600 | 0.3574 | 0.3611 | 8% | 631 | 85.8% | 5673 | 5.8% | 502 | 64 | 90 | 81 |
| 4600 | 0.3574 | 0.3611 | 8% | 635 | 87.0% | 5653 | 5.2% | 502 | 62 | 88 | 76 |
| 4600 | 0.3574 | 0.3611 | 7% | 640 | 88.1% | 5635 | 4.6% | 502 | 60 | 87 | 71 |
| 4600 | 0.3574 | 0.3611 | 15% | 611 | 73.2% | 6153 | 12.0% | 508 | 69 | 93 | 76 |
| 4600 | 0.3574 | 0.3611 | 13% | 616 | 76.6% | 6011 | 10.7% | 508 | 68 | 95 | 92 |
| 4600 | 0.3574 | 0.3611 | 11% | 620 | 80.5% | 5886 | 8.7% | 508 | 67 | 94 | 96 |
| 4600 | 0.3574 | 0.3611 | 9% | 626 | 83.7% | 5795 | 7.0% | 508 | 66 | 91 | 88 |
| 4600 | 0.3574 | 0.3611 | 8% | 631 | 85.7% | 5744 | 5.9% | 508 | 65 | 89 | 81 |
| 4600 | 0.3574 | 0.3611 | 8% | 635 | 86.9% | 5715 | 5.3% | 508 | 63 | 87 | 76 |
| 4600 | 0.3574 | 0.3611 | 7% | 640 | 88.0% | 5689 | 4.7% | 508 | 61 | 85 | 71 |
| 4600 | 0.3574 | 0.3611 | 15% | 611 | 71.0% | 6361 | 13.7% | 514 | 70 | 93 | 77 |
| 4600 | 0.3574 | 0.3611 | 13% | 616 | 75.0% | 6163 | 12.1% | 514 | 69 | 93 | 94 |
| 4600 | 0.3574 | 0.3611 | 11% | 620 | 79.9% | 5968 | 9.3% | 514 | 68 | 92 | 95 |
| 4600 | 0.3574 | 0.3611 | 9% | 626 | 83.5% | 5847 | 7.3% | 514 | 67 | 90 | 88 |
| 4600 | 0.3574 | 0.3611 | 8% | 631 | 85.5% | 5787 | 6.2% | 514 | 65 | 88 | 81 |
| 4600 | 0.3574 | 0.3611 | 8% | 635 | 86.8% | 5751 | 5.5% | 514 | 64 | 86 | 76 |
| 4600 | 0.3574 | 0.3611 | 7% | 640 | 88.0% | 5718 | 4.8% | 514 | 61 | 85 | 71 |
| 4600 | 0.3574 | 0.3611 | 16% | 611 | 67.6% | 6685 | 16.3% | 521 | 71 | 91 | 79 |
| 4600 | 0.3574 | 0.3611 | 13% | 616 | 73.0% | 6338 | 13.7% | 521 | 70 | 92 | 94 |
| 4600 | 0.3574 | 0.3611 | 11% | 620 | 79.1% | 6048 | 10.1% | 521 | 69 | 91 | 94 |
| 4600 | 0.3574 | 0.3611 | 9% | 626 | 82.9% | 5904 | 7.9% | 521 | 68 | 89 | 87 |
| 4600 | 0.3574 | 0.3611 | 8% | 631 | 85.1% | 5829 | 6.6% | 521 | 66 | 87 | 81 |
| 4600 | 0.3574 | 0.3611 | 8% | 635 | 86.6% | 5782 | 5.8% | 521 | 64 | 85 | 76 |
| 4600 | 0.3574 | 0.3611 | 7% | 640 | 88.1% | 5735 | 4.8% | 521 | 62 | 84 | 73 |
| 4600 | 0.3574 | 0.3611 | 17% | 611 | 63.7% | 7086 | 19.4% | 527 | 72 | 90 | 80 |
| 4600 | 0.3574 | 0.3611 | 13% | 616 | 71.2% | 6493 | 15.3% | 527 | 71 | 91 | 94 |

TABLE 2-continued

| | | | | | | | | | | | |
|---|---|---|---|---|---|---|---|---|---|---|---|
| 4600 | 0.3574 | 0.3611 | 11% | 620 | 78.3% | 6112 | 10.8% | 527 | 70 | 90 | 93 |
| 4600 | 0.3574 | 0.3611 | 9% | 626 | 82.2% | 5951 | 8.6% | 527 | 68 | 88 | 87 |
| 4600 | 0.3574 | 0.3611 | 8% | 631 | 84.8% | 5855 | 7.0% | 527 | 66 | 86 | 81 |
| 4600 | 0.3574 | 0.3611 | 7% | 635 | 86.8% | 5790 | 5.8% | 527 | 65 | 84 | 78 |
| 4600 | 0.3574 | 0.3611 | 7% | 640 | 88.9% | 5722 | 4.3% | 527 | 62 | 83 | 76 |
| 4600 | 0.3574 | 0.3611 | 18% | 611 | 57.5% | 7934 | 24.3% | 534 | 73 | 89 | 82 |
| 4600 | 0.3574 | 0.3611 | 14% | 616 | 68.6% | 6722 | 17.6% | 534 | 71 | 89 | 93 |
| 4600 | 0.3574 | 0.3611 | 11% | 620 | 76.6% | 6223 | 12.5% | 534 | 70 | 88 | 92 |
| 4600 | 0.3574 | 0.3611 | 9% | 626 | 81.2% | 6007 | 9.5% | 534 | 69 | 86 | 87 |
| 4600 | 0.3574 | 0.3611 | 8% | 631 | 85.2% | 5854 | 6.9% | 534 | 67 | 85 | 83 |
| 4600 | 0.3574 | 0.3611 | 7% | 635 | 88.1% | 5755 | 4.8% | 534 | 65 | 84 | 82 |
| 4600 | 0.3574 | 0.3611 | 6% | 640 | 91.0% | 5668 | 2.8% | 534 | 63 | 83 | 82 |
| 4600 | 0.3574 | 0.3611 | 19% | 611 | 49.5% | 9941 | 31.1% | 540 | 74 | 87 | 83 |
| 4600 | 0.3574 | 0.3611 | 14% | 616 | 65.6% | 7013 | 20.5% | 540 | 72 | 87 | 92 |
| 4600 | 0.3574 | 0.3611 | 11% | 620 | 73.7% | 6401 | 15.0% | 540 | 71 | 87 | 92 |
| 4600 | 0.3574 | 0.3611 | 9% | 626 | 81.2% | 6021 | 9.9% | 540 | 69 | 85 | 88 |
| 4600 | 0.3574 | 0.3611 | 7% | 631 | 87.0% | 5799 | 5.7% | 540 | 68 | 84 | 87 |
| 4600 | 0.3574 | 0.3611 | 6% | 635 | 90.5% | 5686 | 3.1% | 540 | 66 | 83 | 87 |
| 4600 | 0.3574 | 0.3611 | 6% | 640 | 93.6% | 5596 | 0.8% | 540 | 64 | 82 | 87 |
| 4500 | 0.3608 | 0.3636 | 10% | 611 | 86.1% | 4131 | 4.0% | 467 | 51 | 83 | 63 |
| 4500 | 0.3608 | 0.3636 | 9% | 616 | 87.1% | 4131 | 4.0% | 467 | 50 | 87 | 76 |
| 4500 | 0.3608 | 0.3636 | 8% | 620 | 87.7% | 4131 | 4.0% | 467 | 50 | 89 | 86 |
| 4500 | 0.3608 | 0.3636 | 8% | 626 | 88.2% | 4131 | 4.0% | 467 | 49 | 91 | 97 |
| 4500 | 0.3608 | 0.3636 | 7% | 631 | 88.7% | 4131 | 4.0% | 467 | 48 | 91 | 93 |
| 4500 | 0.3608 | 0.3636 | 7% | 635 | 88.9% | 4131 | 4.0% | 467 | 47 | 90 | 86 |
| 4500 | 0.3608 | 0.3636 | 7% | 640 | 89.2% | 4131 | 4.0% | 467 | 45 | 89 | 79 |
| 4500 | 0.3608 | 0.3636 | 11% | 611 | 82.8% | 4131 | 5.8% | 471 | 50 | 87 | 64 |
| 4500 | 0.3608 | 0.3636 | 10% | 616 | 83.9% | 4131 | 5.8% | 471 | 50 | 91 | 79 |
| 4500 | 0.3608 | 0.3636 | 10% | 620 | 84.6% | 4131 | 5.7% | 471 | 49 | 94 | 90 |
| 4500 | 0.3608 | 0.3636 | 9% | 626 | 85.6% | 4175 | 5.5% | 471 | 50 | 95 | 94 |
| 4500 | 0.3608 | 0.3636 | 8% | 631 | 86.4% | 4213 | 5.3% | 471 | 50 | 94 | 85 |
| 4500 | 0.3608 | 0.3636 | 8% | 635 | 86.9% | 4239 | 5.1% | 471 | 49 | 92 | 78 |
| 4500 | 0.3608 | 0.3636 | 8% | 640 | 87.6% | 4293 | 4.9% | 471 | 48 | 91 | 72 |
| 4500 | 0.3608 | 0.3636 | 12% | 611 | 82.3% | 4544 | 5.8% | 476 | 60 | 88 | 65 |
| 4500 | 0.3608 | 0.3636 | 11% | 616 | 83.7% | 4556 | 5.6% | 476 | 59 | 92 | 80 |
| 4500 | 0.3608 | 0.3636 | 10% | 620 | 84.8% | 4585 | 5.4% | 476 | 59 | 95 | 91 |
| 4500 | 0.3608 | 0.3636 | 9% | 626 | 86.0% | 4636 | 5.0% | 476 | 58 | 95 | 94 |
| 4500 | 0.3608 | 0.3636 | 8% | 631 | 86.7% | 4651 | 4.9% | 476 | 57 | 94 | 84 |
| 4500 | 0.3608 | 0.3636 | 8% | 635 | 87.3% | 4679 | 4.7% | 476 | 56 | 92 | 77 |
| 4500 | 0.3608 | 0.3636 | 8% | 640 | 88.0% | 4722 | 4.4% | 476 | 54 | 91 | 71 |
| 4500 | 0.3608 | 0.3636 | 12% | 611 | 82.0% | 4861 | 5.8% | 480 | 63 | 89 | 66 |
| 4500 | 0.3608 | 0.3636 | 11% | 616 | 83.4% | 4853 | 5.7% | 480 | 62 | 93 | 82 |
| 4500 | 0.3608 | 0.3636 | 10% | 620 | 84.6% | 4880 | 5.4% | 480 | 62 | 96 | 93 |
| 4500 | 0.3608 | 0.3636 | 9% | 626 | 85.9% | 4913 | 5.0% | 480 | 61 | 96 | 93 |
| 4500 | 0.3608 | 0.3636 | 9% | 631 | 86.6% | 4924 | 4.9% | 480 | 59 | 94 | 83 |
| 4500 | 0.3608 | 0.3636 | 8% | 635 | 87.3% | 4950 | 4.6% | 480 | 58 | 92 | 77 |
| 4500 | 0.3608 | 0.3636 | 8% | 640 | 88.1% | 4983 | 4.3% | 480 | 56 | 90 | 70 |
| 4500 | 0.3608 | 0.3636 | 13% | 611 | 81.1% | 5161 | 6.3% | 486 | 65 | 90 | 67 |
| 4500 | 0.3608 | 0.3636 | 11% | 616 | 82.5% | 5141 | 6.2% | 486 | 64 | 94 | 84 |
| 4500 | 0.3608 | 0.3636 | 10% | 620 | 84.0% | 5153 | 5.8% | 486 | 63 | 97 | 95 |
| 4500 | 0.3608 | 0.3636 | 9% | 626 | 85.2% | 5164 | 5.4% | 486 | 62 | 96 | 92 |
| 4500 | 0.3608 | 0.3636 | 9% | 631 | 86.3% | 5182 | 5.0% | 486 | 61 | 94 | 82 |
| 4500 | 0.3608 | 0.3636 | 8% | 635 | 87.3% | 5205 | 4.6% | 486 | 60 | 92 | 76 |
| 4500 | 0.3608 | 0.3636 | 8% | 640 | 88.2% | 5228 | 4.1% | 486 | 57 | 89 | 70 |
| 4500 | 0.3608 | 0.3636 | 13% | 611 | 79.5% | 5406 | 7.3% | 491 | 66 | 91 | 69 |
| 4500 | 0.3608 | 0.3636 | 12% | 616 | 81.2% | 5376 | 7.1% | 491 | 65 | 96 | 86 |
| 4500 | 0.3608 | 0.3636 | 11% | 620 | 83.0% | 5372 | 6.5% | 491 | 65 | 98 | 98 |
| 4500 | 0.3608 | 0.3636 | 9% | 626 | 84.8% | 5375 | 5.7% | 491 | 64 | 95 | 90 |
| 4500 | 0.3608 | 0.3636 | 9% | 631 | 86.3% | 5382 | 5.0% | 491 | 62 | 93 | 82 |
| 4500 | 0.3608 | 0.3636 | 8% | 635 | 87.3% | 5386 | 4.6% | 491 | 61 | 90 | 76 |
| 4500 | 0.3608 | 0.3636 | 8% | 640 | 88.2% | 5391 | 4.2% | 491 | 58 | 88 | 70 |
| 4500 | 0.3608 | 0.3636 | 14% | 611 | 77.6% | 5598 | 8.6% | 496 | 67 | 93 | 71 |
| 4500 | 0.3608 | 0.3636 | 12% | 616 | 80.3% | 5552 | 7.8% | 496 | 66 | 96 | 88 |
| 4500 | 0.3608 | 0.3636 | 11% | 620 | 82.0% | 5528 | 7.2% | 496 | 65 | 97 | 100 |
| 4500 | 0.3608 | 0.3636 | 10% | 626 | 84.5% | 5510 | 6.0% | 496 | 65 | 94 | 90 |
| 4500 | 0.3608 | 0.3636 | 9% | 631 | 86.1% | 5498 | 5.3% | 496 | 63 | 91 | 81 |
| 4500 | 0.3608 | 0.3636 | 8% | 635 | 87.1% | 5492 | 4.8% | 496 | 62 | 89 | 75 |
| 4500 | 0.3608 | 0.3636 | 8% | 640 | 88.2% | 5486 | 4.3% | 496 | 59 | 87 | 70 |
| 4500 | 0.3608 | 0.3636 | 14% | 611 | 75.6% | 5823 | 10.0% | 502 | 68 | 94 | 73 |
| 4500 | 0.3608 | 0.3636 | 12% | 616 | 78.7% | 5737 | 8.9% | 502 | 67 | 96 | 90 |
| 4500 | 0.3608 | 0.3636 | 11% | 620 | 81.3% | 5680 | 7.7% | 502 | 67 | 96 | 98 |
| 4500 | 0.3608 | 0.3636 | 10% | 626 | 84.1% | 5629 | 6.4% | 502 | 66 | 93 | 88 |
| 4500 | 0.3608 | 0.3636 | 9% | 631 | 86.0% | 5597 | 5.4% | 502 | 64 | 90 | 80 |
| 4500 | 0.3608 | 0.3636 | 8% | 635 | 87.2% | 5578 | 4.8% | 502 | 63 | 88 | 75 |
| 4500 | 0.3608 | 0.3636 | 7% | 640 | 88.3% | 5561 | 4.2% | 502 | 60 | 86 | 70 |
| 4500 | 0.3608 | 0.3636 | 15% | 611 | 73.2% | 6046 | 11.7% | 508 | 69 | 93 | 75 |
| 4500 | 0.3608 | 0.3636 | 13% | 616 | 76.7% | 5911 | 10.4% | 508 | 68 | 94 | 92 |
| 4500 | 0.3608 | 0.3636 | 11% | 620 | 80.6% | 5795 | 8.4% | 508 | 68 | 94 | 96 |
| 4500 | 0.3608 | 0.3636 | 9% | 626 | 83.9% | 5709 | 6.6% | 508 | 67 | 91 | 88 |
| 4500 | 0.3608 | 0.3636 | 9% | 631 | 86.0% | 5659 | 5.5% | 508 | 65 | 89 | 81 |

TABLE 2-continued

| | | | | | | | | | | | |
|---|---|---|---|---|---|---|---|---|---|---|---|
| 4500 | 0.3608 | 0.3636 | 8% | 635 | 87.2% | 5632 | 4.9% | 508 | 63 | 87 | 75 |
| 4500 | 0.3608 | 0.3636 | 7% | 640 | 88.3% | 5607 | 4.3% | 508 | 61 | 85 | 70 |
| 4500 | 0.3608 | 0.3636 | 16% | 611 | 71.1% | 6236 | 13.3% | 514 | 70 | 92 | 76 |
| 4500 | 0.3608 | 0.3636 | 13% | 616 | 75.1% | 6050 | 11.7% | 514 | 69 | 93 | 93 |
| 4500 | 0.3608 | 0.3636 | 11% | 620 | 80.0% | 5870 | 9.0% | 514 | 68 | 92 | 95 |
| 4500 | 0.3608 | 0.3636 | 9% | 626 | 83.7% | 5755 | 6.9% | 514 | 67 | 90 | 88 |
| 4500 | 0.3608 | 0.3636 | 8% | 631 | 85.8% | 5697 | 5.8% | 514 | 66 | 88 | 81 |
| 4500 | 0.3608 | 0.3636 | 8% | 635 | 87.0% | 5663 | 5.1% | 514 | 64 | 86 | 76 |
| 4500 | 0.3608 | 0.3636 | 7% | 640 | 88.3% | 5632 | 4.4% | 514 | 61 | 84 | 71 |
| 4500 | 0.3608 | 0.3636 | 16% | 611 | 67.7% | 6528 | 15.9% | 521 | 71 | 91 | 78 |
| 4500 | 0.3608 | 0.3636 | 14% | 616 | 73.1% | 6210 | 13.3% | 521 | 70 | 92 | 94 |
| 4500 | 0.3608 | 0.3636 | 11% | 620 | 79.3% | 5941 | 9.6% | 521 | 69 | 91 | 94 |
| 4500 | 0.3608 | 0.3636 | 9% | 626 | 83.2% | 5804 | 7.4% | 521 | 68 | 89 | 87 |
| 4500 | 0.3608 | 0.3636 | 8% | 631 | 85.4% | 5733 | 6.1% | 521 | 66 | 87 | 80 |
| 4500 | 0.3608 | 0.3636 | 8% | 635 | 86.9% | 5689 | 5.3% | 521 | 64 | 85 | 76 |
| 4500 | 0.3608 | 0.3636 | 7% | 640 | 88.5% | 5645 | 4.3% | 521 | 62 | 84 | 72 |
| 4500 | 0.3608 | 0.3636 | 17% | 611 | 63.9% | 6889 | 18.9% | 527 | 72 | 90 | 80 |
| 4500 | 0.3608 | 0.3636 | 14% | 616 | 71.4% | 6351 | 14.9% | 527 | 71 | 91 | 94 |
| 4500 | 0.3608 | 0.3636 | 11% | 620 | 78.6% | 5997 | 10.4% | 527 | 70 | 90 | 94 |
| 4500 | 0.3608 | 0.3636 | 9% | 626 | 82.5% | 5845 | 8.0% | 527 | 68 | 88 | 87 |
| 4500 | 0.3608 | 0.3636 | 8% | 631 | 85.2% | 5755 | 6.4% | 527 | 66 | 86 | 81 |
| 4500 | 0.3608 | 0.3636 | 8% | 635 | 87.2% | 5694 | 5.2% | 527 | 65 | 84 | 77 |
| 4500 | 0.3608 | 0.3636 | 7% | 640 | 89.4% | 5631 | 3.7% | 527 | 62 | 83 | 75 |
| 4500 | 0.3608 | 0.3636 | 18% | 611 | 57.8% | 7640 | 23.8% | 534 | 73 | 89 | 81 |
| 4500 | 0.3608 | 0.3636 | 14% | 616 | 68.8% | 6559 | 17.2% | 534 | 72 | 89 | 93 |
| 4500 | 0.3608 | 0.3636 | 11% | 620 | 77.0% | 6092 | 11.9% | 534 | 70 | 88 | 93 |
| 4500 | 0.3608 | 0.3636 | 9% | 626 | 81.7% | 5891 | 8.9% | 534 | 69 | 87 | 87 |
| 4500 | 0.3608 | 0.3636 | 8% | 631 | 85.7% | 5750 | 6.2% | 534 | 67 | 85 | 83 |
| 4500 | 0.3608 | 0.3636 | 7% | 635 | 88.7% | 5658 | 4.2% | 534 | 65 | 84 | 82 |
| 4500 | 0.3608 | 0.3636 | 6% | 640 | 91.6% | 5576 | 2.1% | 534 | 63 | 83 | 81 |
| 4500 | 0.3608 | 0.3636 | 20% | 611 | 49.8% | 9360 | 30.5% | 540 | 74 | 87 | 82 |
| 4500 | 0.3608 | 0.3636 | 14% | 616 | 66.0% | 6811 | 19.9% | 540 | 72 | 88 | 92 |
| 4500 | 0.3608 | 0.3636 | 11% | 620 | 74.3% | 6245 | 14.3% | 540 | 71 | 87 | 92 |
| 4500 | 0.3608 | 0.3636 | 9% | 626 | 81.8% | 5899 | 9.1% | 540 | 69 | 85 | 89 |
| 4500 | 0.3608 | 0.3636 | 7% | 631 | 87.6% | 5694 | 4.9% | 540 | 68 | 84 | 87 |
| 4500 | 0.3608 | 0.3636 | 6% | 635 | 91.2% | 5589 | 2.3% | 540 | 66 | 83 | 87 |
| 4500 | 0.3608 | 0.3636 | 6% | 640 | 94.3% | 5506 | 0.0% | 540 | 64 | 82 | 87 |
| 4400 | 0.3644 | 0.3661 | 10% | 611 | 85.8% | 4131 | 3.9% | 467 | 51 | 83 | 62 |
| 4400 | 0.3644 | 0.3661 | 9% | 616 | 86.8% | 4131 | 3.9% | 467 | 50 | 87 | 76 |
| 4400 | 0.3644 | 0.3661 | 9% | 620 | 87.4% | 4131 | 3.9% | 467 | 50 | 90 | 87 |
| 4400 | 0.3644 | 0.3661 | 8% | 626 | 88.0% | 4131 | 3.8% | 467 | 49 | 92 | 98 |
| 4400 | 0.3644 | 0.3661 | 8% | 631 | 88.5% | 4131 | 3.8% | 467 | 48 | 91 | 91 |
| 4400 | 0.3644 | 0.3661 | 7% | 635 | 88.7% | 4131 | 3.8% | 467 | 47 | 90 | 84 |
| 4400 | 0.3644 | 0.3661 | 7% | 640 | 89.0% | 4131 | 3.8% | 467 | 45 | 89 | 77 |
| 4400 | 0.3644 | 0.3661 | 12% | 611 | 82.6% | 4131 | 5.6% | 471 | 51 | 87 | 64 |
| 4400 | 0.3644 | 0.3661 | 11% | 616 | 83.8% | 4131 | 5.6% | 471 | 50 | 91 | 79 |
| 4400 | 0.3644 | 0.3661 | 10% | 620 | 84.5% | 4131 | 5.5% | 471 | 49 | 94 | 91 |
| 4400 | 0.3644 | 0.3661 | 9% | 626 | 85.6% | 4189 | 5.2% | 471 | 50 | 95 | 94 |
| 4400 | 0.3644 | 0.3661 | 9% | 631 | 86.3% | 4212 | 5.1% | 471 | 50 | 93 | 84 |
| 4400 | 0.3644 | 0.3661 | 8% | 635 | 86.9% | 4247 | 4.9% | 471 | 49 | 92 | 77 |
| 4400 | 0.3644 | 0.3661 | 8% | 640 | 87.6% | 4307 | 4.6% | 471 | 49 | 90 | 70 |
| 4400 | 0.3644 | 0.3661 | 12% | 611 | 82.0% | 4521 | 5.6% | 476 | 60 | 88 | 64 |
| 4400 | 0.3644 | 0.3661 | 11% | 616 | 83.5% | 4534 | 5.5% | 476 | 59 | 92 | 80 |
| 4400 | 0.3644 | 0.3661 | 10% | 620 | 84.7% | 4569 | 5.2% | 476 | 59 | 95 | 92 |
| 4400 | 0.3644 | 0.3661 | 9% | 626 | 85.9% | 4622 | 4.8% | 476 | 58 | 96 | 93 |
| 4400 | 0.3644 | 0.3661 | 9% | 631 | 86.6% | 4635 | 4.7% | 476 | 57 | 94 | 83 |
| 4400 | 0.3644 | 0.3661 | 8% | 635 | 87.3% | 4672 | 4.4% | 476 | 56 | 92 | 76 |
| 4400 | 0.3644 | 0.3661 | 8% | 640 | 88.0% | 4708 | 4.2% | 476 | 54 | 90 | 69 |
| 4400 | 0.3644 | 0.3661 | 13% | 611 | 81.7% | 4826 | 5.7% | 480 | 63 | 89 | 65 |
| 4400 | 0.3644 | 0.3661 | 11% | 616 | 83.2% | 4820 | 5.6% | 480 | 62 | 93 | 82 |
| 4400 | 0.3644 | 0.3661 | 10% | 620 | 84.5% | 4850 | 5.2% | 480 | 62 | 96 | 93 |
| 4400 | 0.3644 | 0.3661 | 9% | 626 | 85.7% | 4880 | 4.9% | 480 | 61 | 96 | 92 |
| 4400 | 0.3644 | 0.3661 | 9% | 631 | 86.6% | 4897 | 4.6% | 480 | 59 | 94 | 82 |
| 4400 | 0.3644 | 0.3661 | 8% | 635 | 87.3% | 4923 | 4.4% | 480 | 58 | 92 | 75 |
| 4400 | 0.3644 | 0.3661 | 8% | 640 | 88.1% | 4964 | 4.0% | 480 | 56 | 90 | 69 |
| 4400 | 0.3644 | 0.3661 | 13% | 611 | 80.9% | 5113 | 6.2% | 486 | 65 | 90 | 67 |
| 4400 | 0.3644 | 0.3661 | 12% | 616 | 82.4% | 5095 | 6.0% | 486 | 64 | 95 | 84 |
| 4400 | 0.3644 | 0.3661 | 11% | 620 | 83.8% | 5108 | 5.6% | 486 | 64 | 97 | 96 |
| 4400 | 0.3644 | 0.3661 | 10% | 626 | 85.1% | 5120 | 5.2% | 486 | 62 | 96 | 91 |
| 4400 | 0.3644 | 0.3661 | 9% | 631 | 86.4% | 5143 | 4.7% | 486 | 61 | 93 | 81 |
| 4400 | 0.3644 | 0.3661 | 8% | 635 | 87.4% | 5168 | 4.2% | 486 | 60 | 91 | 75 |
| 4400 | 0.3644 | 0.3661 | 8% | 640 | 88.4% | 5192 | 3.8% | 486 | 57 | 89 | 69 |
| 4400 | 0.3644 | 0.3661 | 14% | 611 | 79.3% | 5345 | 7.1% | 491 | 66 | 91 | 68 |
| 4400 | 0.3644 | 0.3661 | 12% | 616 | 81.1% | 5317 | 6.9% | 491 | 65 | 96 | 86 |
| 4400 | 0.3644 | 0.3661 | 11% | 620 | 82.9% | 5314 | 6.3% | 491 | 65 | 98 | 98 |
| 4400 | 0.3644 | 0.3661 | 10% | 626 | 84.9% | 5320 | 5.4% | 491 | 64 | 95 | 90 |
| 4400 | 0.3644 | 0.3661 | 9% | 631 | 86.4% | 5327 | 4.7% | 491 | 63 | 92 | 81 |
| 4400 | 0.3644 | 0.3661 | 8% | 635 | 87.4% | 5332 | 4.3% | 491 | 61 | 90 | 75 |
| 4400 | 0.3644 | 0.3661 | 8% | 640 | 88.3% | 5337 | 3.9% | 491 | 58 | 88 | 69 |
| 4400 | 0.3644 | 0.3661 | 14% | 611 | 77.5% | 5525 | 8.4% | 496 | 67 | 93 | 70 |

TABLE 2-continued

| | | | | | | | | | | | |
|---|---|---|---|---|---|---|---|---|---|---|---|
| 4400 | 0.3644 | 0.3661 | 12% | 616 | 80.2% | 5482 | 7.5% | 496 | 66 | 96 | 87 |
| 4400 | 0.3644 | 0.3661 | 11% | 620 | 82.0% | 5459 | 6.9% | 496 | 66 | 97 | 100 |
| 4400 | 0.3644 | 0.3661 | 10% | 626 | 84.5% | 5443 | 5.7% | 496 | 65 | 94 | 89 |
| 4400 | 0.3644 | 0.3661 | 9% | 631 | 86.2% | 5433 | 5.0% | 496 | 63 | 91 | 80 |
| 4400 | 0.3644 | 0.3661 | 8% | 635 | 87.3% | 5427 | 4.4% | 496 | 62 | 89 | 74 |
| 4400 | 0.3644 | 0.3661 | 8% | 640 | 88.3% | 5423 | 3.9% | 496 | 59 | 87 | 69 |
| 4400 | 0.3644 | 0.3661 | 15% | 611 | 75.5% | 5736 | 9.8% | 502 | 68 | 94 | 72 |
| 4400 | 0.3644 | 0.3661 | 13% | 616 | 78.7% | 5654 | 8.7% | 502 | 67 | 95 | 90 |
| 4400 | 0.3644 | 0.3661 | 11% | 620 | 81.4% | 5600 | 7.4% | 502 | 67 | 95 | 98 |
| 4400 | 0.3644 | 0.3661 | 10% | 626 | 84.2% | 5552 | 6.0% | 502 | 66 | 92 | 88 |
| 4400 | 0.3644 | 0.3661 | 9% | 631 | 86.1% | 5522 | 5.1% | 502 | 64 | 90 | 80 |
| 4400 | 0.3644 | 0.3661 | 8% | 635 | 87.4% | 5504 | 4.4% | 502 | 63 | 88 | 75 |
| 4400 | 0.3644 | 0.3661 | 8% | 640 | 88.5% | 5489 | 3.8% | 502 | 60 | 86 | 69 |
| 4400 | 0.3644 | 0.3661 | 15% | 611 | 73.1% | 5942 | 11.4% | 508 | 69 | 93 | 74 |
| 4400 | 0.3644 | 0.3661 | 13% | 616 | 76.8% | 5814 | 10.1% | 508 | 68 | 94 | 92 |
| 4400 | 0.3644 | 0.3661 | 11% | 620 | 80.7% | 5706 | 8.1% | 508 | 68 | 94 | 96 |
| 4400 | 0.3644 | 0.3661 | 10% | 626 | 84.1% | 5624 | 6.2% | 508 | 67 | 91 | 88 |
| 4400 | 0.3644 | 0.3661 | 9% | 631 | 86.2% | 5577 | 5.1% | 508 | 65 | 88 | 80 |
| 4400 | 0.3644 | 0.3661 | 8% | 635 | 87.4% | 5551 | 4.5% | 508 | 63 | 87 | 75 |
| 4400 | 0.3644 | 0.3661 | 8% | 640 | 88.6% | 5528 | 3.9% | 508 | 60 | 85 | 70 |
| 4400 | 0.3644 | 0.3661 | 16% | 611 | 71.1% | 6115 | 13.0% | 514 | 70 | 92 | 76 |
| 4400 | 0.3644 | 0.3661 | 13% | 616 | 75.2% | 5940 | 11.3% | 514 | 69 | 93 | 93 |
| 4400 | 0.3644 | 0.3661 | 11% | 620 | 80.1% | 5774 | 8.6% | 514 | 69 | 92 | 95 |
| 4400 | 0.3644 | 0.3661 | 10% | 626 | 83.9% | 5664 | 6.4% | 514 | 67 | 90 | 88 |
| 4400 | 0.3644 | 0.3661 | 9% | 631 | 86.0% | 5610 | 5.3% | 514 | 66 | 87 | 80 |
| 4400 | 0.3644 | 0.3661 | 8% | 635 | 87.3% | 5578 | 4.6% | 514 | 64 | 86 | 75 |
| 4400 | 0.3644 | 0.3661 | 8% | 640 | 88.6% | 5548 | 3.9% | 514 | 61 | 84 | 70 |
| 4400 | 0.3644 | 0.3661 | 17% | 611 | 67.8% | 6378 | 15.5% | 521 | 71 | 91 | 77 |
| 4400 | 0.3644 | 0.3661 | 14% | 616 | 73.3% | 6087 | 12.9% | 521 | 70 | 92 | 94 |
| 4400 | 0.3644 | 0.3661 | 11% | 620 | 79.5% | 5838 | 9.2% | 521 | 69 | 91 | 94 |
| 4400 | 0.3644 | 0.3661 | 10% | 626 | 83.5% | 5707 | 6.9% | 521 | 68 | 89 | 87 |
| 4400 | 0.3644 | 0.3661 | 9% | 631 | 85.8% | 5640 | 5.6% | 521 | 66 | 87 | 80 |
| 4400 | 0.3644 | 0.3661 | 8% | 635 | 87.3% | 5598 | 4.7% | 521 | 64 | 85 | 76 |
| 4400 | 0.3644 | 0.3661 | 7% | 640 | 88.9% | 5558 | 3.8% | 521 | 61 | 83 | 72 |
| 4400 | 0.3644 | 0.3661 | 17% | 611 | 64.1% | 6702 | 18.4% | 527 | 72 | 90 | 79 |
| 4400 | 0.3644 | 0.3661 | 14% | 616 | 71.6% | 6215 | 14.4% | 527 | 71 | 91 | 94 |
| 4400 | 0.3644 | 0.3661 | 11% | 620 | 78.9% | 5886 | 9.9% | 527 | 70 | 90 | 94 |
| 4400 | 0.3644 | 0.3661 | 10% | 626 | 82.9% | 5742 | 7.5% | 527 | 68 | 88 | 87 |
| 4400 | 0.3644 | 0.3661 | 9% | 631 | 85.6% | 5657 | 5.8% | 527 | 66 | 86 | 81 |
| 4400 | 0.3644 | 0.3661 | 8% | 635 | 87.6% | 5601 | 4.6% | 527 | 65 | 84 | 77 |
| 4400 | 0.3644 | 0.3661 | 7% | 640 | 89.8% | 5542 | 3.1% | 527 | 62 | 83 | 75 |
| 4400 | 0.3644 | 0.3661 | 19% | 611 | 58.1% | 7367 | 23.2% | 534 | 73 | 89 | 81 |
| 4400 | 0.3644 | 0.3661 | 14% | 616 | 69.0% | 6402 | 16.7% | 534 | 72 | 89 | 93 |
| 4400 | 0.3644 | 0.3661 | 11% | 620 | 77.4% | 5967 | 11.2% | 534 | 70 | 89 | 93 |
| 4400 | 0.3644 | 0.3661 | 10% | 626 | 82.2% | 5780 | 8.2% | 534 | 69 | 87 | 87 |
| 4400 | 0.3644 | 0.3661 | 8% | 631 | 86.2% | 5650 | 5.5% | 534 | 67 | 85 | 83 |
| 4400 | 0.3644 | 0.3661 | 7% | 635 | 89.2% | 5564 | 3.5% | 534 | 65 | 84 | 82 |
| 4400 | 0.3644 | 0.3661 | 6% | 640 | 92.1% | 5488 | 1.4% | 534 | 63 | 83 | 81 |
| 4400 | 0.3644 | 0.3661 | 20% | 611 | 50.2% | 8843 | 29.8% | 540 | 74 | 87 | 81 |
| 4400 | 0.3644 | 0.3661 | 14% | 616 | 66.3% | 6622 | 19.3% | 540 | 72 | 88 | 92 |
| 4400 | 0.3644 | 0.3661 | 12% | 620 | 74.9% | 6097 | 13.5% | 540 | 71 | 87 | 92 |
| 4400 | 0.3644 | 0.3661 | 9% | 626 | 82.4% | 5782 | 8.3% | 540 | 69 | 86 | 89 |
| 4400 | 0.3644 | 0.3661 | 8% | 631 | 88.3% | 5592 | 4.1% | 540 | 68 | 84 | 87 |
| 4400 | 0.3644 | 0.3661 | 7% | 635 | 91.9% | 5495 | 1.4% | 540 | 66 | 83 | 87 |
| 4400 | 0.3644 | 0.3661 | 6% | 640 | 94.0% | 5445 | 0.0% | 540 | 63 | 83 | 85 |
| 4300 | 0.3681 | 0.3687 | 11% | 611 | 85.4% | 4131 | 3.7% | 467 | 52 | 84 | 62 |
| 4300 | 0.3681 | 0.3687 | 10% | 616 | 86.5% | 4131 | 3.7% | 467 | 51 | 87 | 76 |
| 4300 | 0.3681 | 0.3687 | 9% | 620 | 87.2% | 4131 | 3.7% | 467 | 50 | 90 | 88 |
| 4300 | 0.3681 | 0.3687 | 8% | 626 | 87.8% | 4131 | 3.7% | 467 | 49 | 92 | 99 |
| 4300 | 0.3681 | 0.3687 | 8% | 631 | 88.3% | 4131 | 3.7% | 467 | 48 | 91 | 89 |
| 4300 | 0.3681 | 0.3687 | 8% | 635 | 88.5% | 4131 | 3.7% | 467 | 47 | 90 | 82 |
| 4300 | 0.3681 | 0.3687 | 7% | 640 | 88.8% | 4131 | 3.7% | 467 | 45 | 88 | 74 |
| 4300 | 0.3681 | 0.3687 | 12% | 611 | 82.3% | 4131 | 5.4% | 471 | 51 | 87 | 63 |
| 4300 | 0.3681 | 0.3687 | 11% | 616 | 83.6% | 4131 | 5.4% | 471 | 50 | 92 | 79 |
| 4300 | 0.3681 | 0.3687 | 10% | 620 | 84.3% | 4131 | 5.3% | 471 | 50 | 94 | 91 |
| 4300 | 0.3681 | 0.3687 | 9% | 626 | 85.6% | 4201 | 5.0% | 471 | 51 | 95 | 93 |
| 4300 | 0.3681 | 0.3687 | 9% | 631 | 86.2% | 4214 | 4.9% | 471 | 50 | 93 | 83 |
| 4300 | 0.3681 | 0.3687 | 8% | 635 | 86.9% | 4261 | 4.6% | 471 | 50 | 92 | 76 |
| 4300 | 0.3681 | 0.3687 | 8% | 640 | 87.5% | 4307 | 4.4% | 471 | 49 | 90 | 68 |
| 4300 | 0.3681 | 0.3687 | 13% | 611 | 81.7% | 4498 | 5.5% | 476 | 60 | 88 | 64 |
| 4300 | 0.3681 | 0.3687 | 11% | 616 | 83.3% | 4513 | 5.3% | 476 | 59 | 93 | 81 |
| 4300 | 0.3681 | 0.3687 | 10% | 620 | 84.5% | 4551 | 5.0% | 476 | 59 | 95 | 93 |
| 4300 | 0.3681 | 0.3687 | 10% | 626 | 85.8% | 4605 | 4.6% | 476 | 59 | 96 | 93 |
| 4300 | 0.3681 | 0.3687 | 9% | 631 | 86.5% | 4623 | 4.5% | 476 | 57 | 93 | 82 |
| 4300 | 0.3681 | 0.3687 | 9% | 635 | 87.2% | 4657 | 4.2% | 476 | 56 | 92 | 75 |
| 4300 | 0.3681 | 0.3687 | 8% | 640 | 88.0% | 4700 | 3.9% | 476 | 54 | 89 | 68 |
| 4300 | 0.3681 | 0.3687 | 13% | 611 | 81.5% | 4791 | 5.5% | 480 | 63 | 89 | 65 |
| 4300 | 0.3681 | 0.3687 | 12% | 616 | 83.0% | 4788 | 5.4% | 480 | 62 | 93 | 82 |
| 4300 | 0.3681 | 0.3687 | 11% | 620 | 84.3% | 4819 | 5.0% | 480 | 62 | 96 | 94 |
| 4300 | 0.3681 | 0.3687 | 10% | 626 | 85.6% | 4847 | 4.7% | 480 | 61 | 96 | 92 |

TABLE 2-continued

| | | | | | | | | | | | |
|---|---|---|---|---|---|---|---|---|---|---|---|
| 4300 | 0.3681 | 0.3687 | 9% | 631 | 86.5% | 4869 | 4.4% | 480 | 59 | 93 | 81 |
| 4300 | 0.3681 | 0.3687 | 9% | 635 | 87.3% | 4901 | 4.1% | 480 | 58 | 91 | 74 |
| 4300 | 0.3681 | 0.3687 | 8% | 640 | 88.3% | 4949 | 3.6% | 480 | 56 | 89 | 68 |
| 4300 | 0.3681 | 0.3687 | 13% | 611 | 80.6% | 5065 | 6.0% | 486 | 65 | 90 | 66 |
| 4300 | 0.3681 | 0.3687 | 12% | 616 | 82.2% | 5051 | 5.8% | 486 | 64 | 95 | 84 |
| 4300 | 0.3681 | 0.3687 | 11% | 620 | 83.7% | 5063 | 5.4% | 486 | 64 | 97 | 96 |
| 4300 | 0.3681 | 0.3687 | 10% | 626 | 85.1% | 5079 | 5.0% | 486 | 63 | 96 | 90 |
| 4300 | 0.3681 | 0.3687 | 9% | 631 | 86.5% | 5106 | 4.4% | 486 | 61 | 93 | 80 |
| 4300 | 0.3681 | 0.3687 | 9% | 635 | 87.6% | 5133 | 3.9% | 486 | 60 | 90 | 74 |
| 4300 | 0.3681 | 0.3687 | 8% | 640 | 88.5% | 5156 | 3.5% | 486 | 57 | 88 | 68 |
| 4300 | 0.3681 | 0.3687 | 14% | 611 | 79.1% | 5285 | 7.0% | 491 | 67 | 91 | 68 |
| 4300 | 0.3681 | 0.3687 | 12% | 616 | 80.9% | 5258 | 6.7% | 491 | 66 | 96 | 86 |
| 4300 | 0.3681 | 0.3687 | 11% | 620 | 82.8% | 5257 | 6.0% | 491 | 65 | 97 | 98 |
| 4300 | 0.3681 | 0.3687 | 10% | 626 | 84.9% | 5266 | 5.1% | 491 | 64 | 95 | 90 |
| 4300 | 0.3681 | 0.3687 | 9% | 631 | 86.5% | 5273 | 4.4% | 491 | 63 | 92 | 80 |
| 4300 | 0.3681 | 0.3687 | 9% | 635 | 87.5% | 5279 | 4.0% | 491 | 61 | 89 | 74 |
| 4300 | 0.3681 | 0.3687 | 8% | 640 | 88.4% | 5285 | 3.5% | 491 | 58 | 87 | 68 |
| 4300 | 0.3681 | 0.3687 | 15% | 611 | 77.3% | 5454 | 8.1% | 496 | 67 | 93 | 70 |
| 4300 | 0.3681 | 0.3687 | 13% | 616 | 80.1% | 5413 | 7.3% | 496 | 67 | 96 | 87 |
| 4300 | 0.3681 | 0.3687 | 11% | 620 | 82.0% | 5392 | 6.6% | 496 | 66 | 97 | 100 |
| 4300 | 0.3681 | 0.3687 | 10% | 626 | 84.6% | 5378 | 5.4% | 496 | 65 | 93 | 89 |
| 4300 | 0.3681 | 0.3687 | 9% | 631 | 86.3% | 5369 | 4.6% | 496 | 63 | 90 | 79 |
| 4300 | 0.3681 | 0.3687 | 9% | 635 | 87.4% | 5365 | 4.1% | 496 | 62 | 88 | 73 |
| 4300 | 0.3681 | 0.3687 | 8% | 640 | 88.5% | 5361 | 3.5% | 496 | 59 | 86 | 68 |
| 4300 | 0.3681 | 0.3687 | 15% | 611 | 75.3% | 5650 | 9.5% | 502 | 69 | 93 | 72 |
| 4300 | 0.3681 | 0.3687 | 13% | 616 | 78.6% | 5572 | 8.4% | 502 | 68 | 95 | 89 |
| 4300 | 0.3681 | 0.3687 | 11% | 620 | 81.4% | 5522 | 7.1% | 502 | 67 | 95 | 98 |
| 4300 | 0.3681 | 0.3687 | 10% | 626 | 84.3% | 5478 | 5.7% | 502 | 66 | 92 | 88 |
| 4300 | 0.3681 | 0.3687 | 9% | 631 | 86.3% | 5449 | 4.7% | 502 | 64 | 89 | 79 |
| 4300 | 0.3681 | 0.3687 | 8% | 635 | 87.6% | 5433 | 4.0% | 502 | 63 | 87 | 74 |
| 4300 | 0.3681 | 0.3687 | 8% | 640 | 88.7% | 5418 | 3.4% | 502 | 60 | 85 | 69 |
| 4300 | 0.3681 | 0.3687 | 16% | 611 | 73.1% | 5841 | 11.1% | 508 | 70 | 93 | 74 |
| 4300 | 0.3681 | 0.3687 | 13% | 616 | 76.8% | 5719 | 9.7% | 508 | 69 | 94 | 91 |
| 4300 | 0.3681 | 0.3687 | 12% | 620 | 80.7% | 5619 | 7.7% | 508 | 68 | 94 | 96 |
| 4300 | 0.3681 | 0.3687 | 10% | 626 | 84.2% | 5541 | 5.8% | 508 | 67 | 91 | 88 |
| 4300 | 0.3681 | 0.3687 | 9% | 631 | 86.4% | 5497 | 4.7% | 508 | 65 | 88 | 80 |
| 4300 | 0.3681 | 0.3687 | 8% | 635 | 87.7% | 5473 | 4.0% | 508 | 63 | 86 | 74 |
| 4300 | 0.3681 | 0.3687 | 8% | 640 | 88.9% | 5451 | 3.4% | 508 | 60 | 84 | 69 |
| 4300 | 0.3681 | 0.3687 | 16% | 611 | 71.2% | 5998 | 12.6% | 514 | 71 | 92 | 75 |
| 4300 | 0.3681 | 0.3687 | 14% | 616 | 75.3% | 5834 | 10.9% | 514 | 69 | 93 | 93 |
| 4300 | 0.3681 | 0.3687 | 12% | 620 | 80.2% | 5680 | 8.2% | 514 | 69 | 92 | 95 |
| 4300 | 0.3681 | 0.3687 | 10% | 626 | 84.2% | 5576 | 6.0% | 514 | 67 | 90 | 88 |
| 4300 | 0.3681 | 0.3687 | 9% | 631 | 86.3% | 5525 | 4.8% | 514 | 66 | 87 | 80 |
| 4300 | 0.3681 | 0.3687 | 8% | 635 | 87.7% | 5494 | 4.1% | 514 | 64 | 86 | 75 |
| 4300 | 0.3681 | 0.3687 | 8% | 640 | 88.9% | 5467 | 3.4% | 514 | 61 | 84 | 70 |
| 4300 | 0.3681 | 0.3687 | 17% | 611 | 68.0% | 6234 | 15.0% | 521 | 72 | 91 | 77 |
| 4300 | 0.3681 | 0.3687 | 14% | 616 | 73.4% | 5968 | 12.5% | 521 | 70 | 92 | 93 |
| 4300 | 0.3681 | 0.3687 | 12% | 620 | 79.7% | 5737 | 8.8% | 521 | 69 | 91 | 94 |
| 4300 | 0.3681 | 0.3687 | 10% | 626 | 83.8% | 5613 | 6.4% | 521 | 68 | 89 | 87 |
| 4300 | 0.3681 | 0.3687 | 9% | 631 | 86.1% | 5549 | 5.1% | 521 | 66 | 86 | 80 |
| 4300 | 0.3681 | 0.3687 | 8% | 635 | 87.7% | 5510 | 4.2% | 521 | 64 | 85 | 75 |
| 4300 | 0.3681 | 0.3687 | 8% | 640 | 89.3% | 5473 | 3.2% | 521 | 61 | 83 | 71 |
| 4300 | 0.3681 | 0.3687 | 18% | 611 | 64.3% | 6523 | 17.9% | 527 | 72 | 90 | 78 |
| 4300 | 0.3681 | 0.3687 | 14% | 616 | 71.7% | 6083 | 14.0% | 527 | 71 | 91 | 93 |
| 4300 | 0.3681 | 0.3687 | 12% | 620 | 79.1% | 5779 | 9.4% | 527 | 70 | 90 | 94 |
| 4300 | 0.3681 | 0.3687 | 10% | 626 | 83.3% | 5641 | 6.9% | 527 | 68 | 88 | 87 |
| 4300 | 0.3681 | 0.3687 | 9% | 631 | 86.1% | 5563 | 5.2% | 527 | 66 | 86 | 81 |
| 4300 | 0.3681 | 0.3687 | 8% | 635 | 88.1% | 5510 | 4.0% | 527 | 65 | 84 | 77 |
| 4300 | 0.3681 | 0.3687 | 7% | 640 | 90.3% | 5456 | 2.5% | 527 | 62 | 83 | 74 |
| 4300 | 0.3681 | 0.3687 | 19% | 611 | 58.4% | 7112 | 22.6% | 534 | 73 | 89 | 80 |
| 4300 | 0.3681 | 0.3687 | 15% | 616 | 69.2% | 6252 | 16.2% | 534 | 72 | 90 | 93 |
| 4300 | 0.3681 | 0.3687 | 12% | 620 | 77.8% | 5847 | 10.6% | 534 | 71 | 89 | 93 |
| 4300 | 0.3681 | 0.3687 | 10% | 626 | 82.7% | 5673 | 7.5% | 534 | 69 | 87 | 87 |
| 4300 | 0.3681 | 0.3687 | 8% | 631 | 86.7% | 5552 | 4.8% | 534 | 67 | 85 | 83 |
| 4300 | 0.3681 | 0.3687 | 7% | 635 | 89.7% | 5473 | 2.8% | 534 | 65 | 84 | 81 |
| 4300 | 0.3681 | 0.3687 | 7% | 640 | 92.7% | 5403 | 0.7% | 534 | 63 | 83 | 81 |
| 4300 | 0.3681 | 0.3687 | 20% | 611 | 50.6% | 8381 | 29.2% | 540 | 75 | 87 | 81 |
| 4300 | 0.3681 | 0.3687 | 15% | 616 | 66.6% | 6444 | 18.7% | 540 | 73 | 88 | 92 |
| 4300 | 0.3681 | 0.3687 | 12% | 620 | 75.5% | 5957 | 12.7% | 540 | 71 | 87 | 92 |
| 4300 | 0.3681 | 0.3687 | 9% | 626 | 83.1% | 5669 | 7.5% | 540 | 69 | 86 | 89 |
| 4300 | 0.3681 | 0.3687 | 8% | 631 | 89.0% | 5494 | 3.2% | 540 | 67 | 84 | 87 |
| 4300 | 0.3681 | 0.3687 | 7% | 635 | 92.7% | 5404 | 0.5% | 540 | 66 | 84 | 87 |
| 4300 | 0.3681 | 0.3687 | 6% | 640 | 93.6% | 5384 | 0.0% | 540 | 63 | 83 | 83 |
| 4200 | 0.3720 | 0.3714 | 11% | 611 | 85.0% | 4131 | 3.6% | 467 | 52 | 84 | 62 |
| 4200 | 0.3720 | 0.3714 | 10% | 616 | 86.2% | 4131 | 3.6% | 467 | 51 | 88 | 77 |
| 4200 | 0.3720 | 0.3714 | 10% | 620 | 86.9% | 4131 | 3.6% | 467 | 50 | 91 | 89 |
| 4200 | 0.3720 | 0.3714 | 9% | 626 | 87.5% | 4131 | 3.6% | 467 | 49 | 92 | 98 |
| 4200 | 0.3720 | 0.3714 | 8% | 631 | 88.0% | 4131 | 3.6% | 467 | 48 | 91 | 88 |
| 4200 | 0.3720 | 0.3714 | 8% | 635 | 88.3% | 4131 | 3.6% | 467 | 47 | 90 | 80 |
| 4200 | 0.3720 | 0.3714 | 8% | 640 | 88.6% | 4131 | 3.6% | 467 | 45 | 88 | 72 |

TABLE 2-continued

| | | | | | | | | | | |
|---|---|---|---|---|---|---|---|---|---|---|
| 4200 | 0.3720 | 0.3714 | 13% | 611 | 82.1% | 4131 | 5.2% | 471 | 51 | 87 | 63 |
| 4200 | 0.3720 | 0.3714 | 11% | 616 | 83.4% | 4131 | 5.2% | 471 | 51 | 92 | 80 |
| 4200 | 0.3720 | 0.3714 | 11% | 620 | 84.2% | 4131 | 5.1% | 471 | 50 | 95 | 92 |
| 4200 | 0.3720 | 0.3714 | 10% | 626 | 85.5% | 4204 | 4.7% | 471 | 51 | 95 | 93 |
| 4200 | 0.3720 | 0.3714 | 9% | 631 | 86.1% | 4221 | 4.6% | 471 | 50 | 93 | 81 |
| 4200 | 0.3720 | 0.3714 | 9% | 635 | 86.8% | 4268 | 4.4% | 471 | 50 | 91 | 74 |
| 4200 | 0.3720 | 0.3714 | 8% | 640 | 87.5% | 4313 | 4.1% | 471 | 49 | 89 | 66 |
| 4200 | 0.3720 | 0.3714 | 13% | 611 | 81.4% | 4476 | 5.3% | 476 | 60 | 88 | 64 |
| 4200 | 0.3720 | 0.3714 | 12% | 616 | 83.0% | 4494 | 5.1% | 476 | 59 | 93 | 81 |
| 4200 | 0.3720 | 0.3714 | 11% | 620 | 84.3% | 4534 | 4.8% | 476 | 59 | 95 | 93 |
| 4200 | 0.3720 | 0.3714 | 10% | 626 | 85.6% | 4585 | 4.4% | 476 | 59 | 95 | 92 |
| 4200 | 0.3720 | 0.3714 | 9% | 631 | 86.5% | 4613 | 4.2% | 476 | 57 | 93 | 81 |
| 4200 | 0.3720 | 0.3714 | 9% | 635 | 87.1% | 4642 | 4.0% | 476 | 56 | 91 | 73 |
| 4200 | 0.3720 | 0.3714 | 8% | 640 | 88.0% | 4700 | 3.6% | 476 | 54 | 89 | 66 |
| 4200 | 0.3720 | 0.3714 | 13% | 611 | 81.1% | 4756 | 5.4% | 480 | 63 | 89 | 64 |
| 4200 | 0.3720 | 0.3714 | 12% | 616 | 82.8% | 4758 | 5.2% | 480 | 62 | 94 | 82 |
| 4200 | 0.3720 | 0.3714 | 11% | 620 | 84.2% | 4788 | 4.8% | 480 | 62 | 96 | 94 |
| 4200 | 0.3720 | 0.3714 | 10% | 626 | 85.4% | 4815 | 4.5% | 480 | 61 | 96 | 91 |
| 4200 | 0.3720 | 0.3714 | 9% | 631 | 86.4% | 4842 | 4.2% | 480 | 60 | 93 | 80 |
| 4200 | 0.3720 | 0.3714 | 9% | 635 | 87.3% | 4882 | 3.8% | 480 | 58 | 91 | 73 |
| 4200 | 0.3720 | 0.3714 | 8% | 640 | 88.4% | 4937 | 3.3% | 480 | 56 | 88 | 67 |
| 4200 | 0.3720 | 0.3714 | 14% | 611 | 80.3% | 5018 | 5.8% | 486 | 66 | 90 | 66 |
| 4200 | 0.3720 | 0.3714 | 12% | 616 | 82.1% | 5007 | 5.6% | 486 | 65 | 95 | 84 |
| 4200 | 0.3720 | 0.3714 | 11% | 620 | 83.5% | 5018 | 5.2% | 486 | 64 | 97 | 96 |
| 4200 | 0.3720 | 0.3714 | 10% | 626 | 85.0% | 5038 | 4.7% | 486 | 63 | 95 | 90 |
| 4200 | 0.3720 | 0.3714 | 9% | 631 | 86.6% | 5071 | 4.1% | 486 | 62 | 92 | 80 |
| 4200 | 0.3720 | 0.3714 | 9% | 635 | 87.7% | 5099 | 3.5% | 486 | 60 | 90 | 73 |
| 4200 | 0.3720 | 0.3714 | 8% | 640 | 88.6% | 5118 | 3.1% | 486 | 58 | 87 | 67 |
| 4200 | 0.3720 | 0.3714 | 14% | 611 | 78.9% | 5226 | 6.8% | 491 | 67 | 91 | 67 |
| 4200 | 0.3720 | 0.3714 | 13% | 616 | 80.7% | 5200 | 6.5% | 491 | 66 | 96 | 86 |
| 4200 | 0.3720 | 0.3714 | 12% | 620 | 82.7% | 5201 | 5.8% | 491 | 65 | 97 | 99 |
| 4200 | 0.3720 | 0.3714 | 10% | 626 | 85.0% | 5213 | 4.8% | 491 | 64 | 94 | 89 |
| 4200 | 0.3720 | 0.3714 | 9% | 631 | 86.5% | 5220 | 4.1% | 491 | 63 | 91 | 79 |
| 4200 | 0.3720 | 0.3714 | 9% | 635 | 87.5% | 5227 | 3.7% | 491 | 61 | 89 | 73 |
| 4200 | 0.3720 | 0.3714 | 8% | 640 | 88.6% | 5234 | 3.2% | 491 | 58 | 86 | 66 |
| 4200 | 0.3720 | 0.3714 | 15% | 611 | 77.1% | 5384 | 7.9% | 496 | 68 | 93 | 69 |
| 4200 | 0.3720 | 0.3714 | 13% | 616 | 80.0% | 5346 | 7.0% | 496 | 67 | 96 | 87 |
| 4200 | 0.3720 | 0.3714 | 12% | 620 | 82.0% | 5327 | 6.3% | 496 | 66 | 97 | 99 |
| 4200 | 0.3720 | 0.3714 | 10% | 626 | 84.6% | 5315 | 5.1% | 496 | 65 | 93 | 88 |
| 4200 | 0.3720 | 0.3714 | 9% | 631 | 86.4% | 5307 | 4.3% | 496 | 63 | 90 | 79 |
| 4200 | 0.3720 | 0.3714 | 9% | 635 | 87.6% | 5304 | 3.7% | 496 | 62 | 88 | 73 |
| 4200 | 0.3720 | 0.3714 | 8% | 640 | 88.7% | 5301 | 3.1% | 496 | 59 | 86 | 67 |
| 4200 | 0.3720 | 0.3714 | 16% | 611 | 75.2% | 5566 | 9.2% | 502 | 69 | 93 | 71 |
| 4200 | 0.3720 | 0.3714 | 13% | 616 | 78.6% | 5493 | 8.1% | 502 | 68 | 95 | 89 |
| 4200 | 0.3720 | 0.3714 | 12% | 620 | 81.4% | 5446 | 6.8% | 502 | 67 | 95 | 98 |
| 4200 | 0.3720 | 0.3714 | 10% | 626 | 84.4% | 5405 | 5.3% | 502 | 66 | 92 | 87 |
| 4200 | 0.3720 | 0.3714 | 9% | 631 | 86.4% | 5378 | 4.3% | 502 | 64 | 89 | 79 |
| 4200 | 0.3720 | 0.3714 | 9% | 635 | 87.8% | 5363 | 3.6% | 502 | 63 | 87 | 73 |
| 4200 | 0.3720 | 0.3714 | 8% | 640 | 89.0% | 5349 | 3.0% | 502 | 60 | 85 | 68 |
| 4200 | 0.3720 | 0.3714 | 16% | 611 | 73.0% | 5743 | 10.8% | 508 | 70 | 93 | 73 |
| 4200 | 0.3720 | 0.3714 | 14% | 616 | 76.9% | 5626 | 9.3% | 508 | 69 | 94 | 91 |
| 4200 | 0.3720 | 0.3714 | 12% | 620 | 80.8% | 5534 | 7.3% | 508 | 68 | 94 | 96 |
| 4200 | 0.3720 | 0.3714 | 10% | 626 | 84.4% | 5461 | 5.4% | 508 | 67 | 91 | 87 |
| 4200 | 0.3720 | 0.3714 | 9% | 631 | 86.6% | 5420 | 4.3% | 508 | 65 | 88 | 79 |
| 4200 | 0.3720 | 0.3714 | 9% | 635 | 87.9% | 5396 | 3.6% | 508 | 63 | 86 | 74 |
| 4200 | 0.3720 | 0.3714 | 8% | 640 | 89.1% | 5376 | 2.9% | 508 | 60 | 84 | 68 |
| 4200 | 0.3720 | 0.3714 | 17% | 611 | 71.2% | 5885 | 12.2% | 514 | 71 | 92 | 74 |
| 4200 | 0.3720 | 0.3714 | 14% | 616 | 75.4% | 5731 | 10.5% | 514 | 69 | 93 | 92 |
| 4200 | 0.3720 | 0.3714 | 12% | 620 | 80.4% | 5589 | 7.8% | 514 | 69 | 92 | 95 |
| 4200 | 0.3720 | 0.3714 | 10% | 626 | 84.4% | 5491 | 5.5% | 514 | 67 | 90 | 87 |
| 4200 | 0.3720 | 0.3714 | 9% | 631 | 86.6% | 5442 | 4.3% | 514 | 66 | 87 | 80 |
| 4200 | 0.3720 | 0.3714 | 8% | 635 | 88.0% | 5414 | 3.6% | 514 | 64 | 85 | 74 |
| 4200 | 0.3720 | 0.3714 | 8% | 640 | 89.3% | 5388 | 2.8% | 514 | 61 | 84 | 69 |
| 4200 | 0.3720 | 0.3714 | 17% | 611 | 68.1% | 6096 | 14.6% | 521 | 72 | 91 | 76 |
| 4200 | 0.3720 | 0.3714 | 14% | 616 | 73.6% | 5853 | 12.0% | 521 | 70 | 92 | 93 |
| 4200 | 0.3720 | 0.3714 | 12% | 620 | 79.9% | 5639 | 8.3% | 521 | 69 | 91 | 94 |
| 4200 | 0.3720 | 0.3714 | 10% | 626 | 84.1% | 5521 | 5.8% | 521 | 68 | 89 | 87 |
| 4200 | 0.3720 | 0.3714 | 9% | 631 | 86.5% | 5462 | 4.5% | 521 | 66 | 86 | 80 |
| 4200 | 0.3720 | 0.3714 | 8% | 635 | 88.1% | 5425 | 3.6% | 521 | 64 | 85 | 75 |
| 4200 | 0.3720 | 0.3714 | 8% | 640 | 89.7% | 5390 | 2.6% | 521 | 61 | 83 | 71 |
| 4200 | 0.3720 | 0.3714 | 18% | 611 | 64.6% | 6353 | 17.3% | 527 | 73 | 90 | 77 |
| 4200 | 0.3720 | 0.3714 | 15% | 616 | 71.9% | 5957 | 13.5% | 527 | 71 | 91 | 93 |
| 4200 | 0.3720 | 0.3714 | 12% | 620 | 79.4% | 5675 | 8.8% | 527 | 70 | 90 | 94 |
| 4200 | 0.3720 | 0.3714 | 10% | 626 | 83.7% | 5544 | 6.2% | 527 | 68 | 88 | 87 |
| 4200 | 0.3720 | 0.3714 | 9% | 631 | 86.5% | 5471 | 4.6% | 527 | 66 | 86 | 80 |
| 4200 | 0.3720 | 0.3714 | 8% | 635 | 88.5% | 5423 | 3.3% | 527 | 64 | 84 | 77 |
| 4200 | 0.3720 | 0.3714 | 7% | 640 | 90.7% | 5373 | 1.9% | 527 | 62 | 83 | 74 |
| 4200 | 0.3720 | 0.3714 | 19% | 611 | 58.8% | 6874 | 22.0% | 534 | 74 | 89 | 79 |
| 4200 | 0.3720 | 0.3714 | 15% | 616 | 69.5% | 6109 | 15.6% | 534 | 72 | 90 | 93 |
| 4200 | 0.3720 | 0.3714 | 12% | 620 | 78.2% | 5731 | 9.9% | 534 | 71 | 89 | 93 |

TABLE 2-continued

| | | | | | | | | | | | |
|---|---|---|---|---|---|---|---|---|---|---|---|
| 4200 | 0.3720 | 0.3714 | 10% | 626 | 83.2% | 5569 | 6.8% | 534 | 69 | 87 | 87 |
| 4200 | 0.3720 | 0.3714 | 9% | 631 | 87.3% | 5458 | 4.1% | 534 | 67 | 85 | 83 |
| 4200 | 0.3720 | 0.3714 | 8% | 635 | 90.3% | 5386 | 2.0% | 534 | 65 | 84 | 81 |
| 4200 | 0.3720 | 0.3714 | 7% | 640 | 93.2% | 5323 | 0.0% | 534 | 63 | 83 | 80 |
| 4200 | 0.3720 | 0.3714 | 21% | 611 | 51.0% | 7965 | 28.5% | 540 | 75 | 87 | 80 |
| 4200 | 0.3720 | 0.3714 | 15% | 616 | 67.0% | 6277 | 18.1% | 540 | 73 | 88 | 92 |
| 4200 | 0.3720 | 0.3714 | 12% | 620 | 76.1% | 5824 | 11.9% | 540 | 71 | 88 | 92 |
| 4200 | 0.3720 | 0.3714 | 10% | 626 | 83.7% | 5561 | 6.6% | 540 | 69 | 86 | 89 |
| 4200 | 0.3720 | 0.3714 | 8% | 631 | 89.8% | 5401 | 2.3% | 540 | 67 | 85 | 88 |
| 4200 | 0.3720 | 0.3714 | 7% | 635 | 93.0% | 5328 | 0.0% | 540 | 66 | 84 | 86 |
| 4200 | 0.3720 | 0.3714 | 7% | 640 | 93.2% | 5323 | 0.0% | 540 | 63 | 83 | 80 |
| 4100 | 0.3761 | 0.3740 | 12% | 611 | 84.6% | 4131 | 3.4% | 467 | 52 | 84 | 61 |
| 4100 | 0.3761 | 0.3740 | 11% | 616 | 85.8% | 4131 | 3.4% | 467 | 51 | 88 | 77 |
| 4100 | 0.3761 | 0.3740 | 10% | 620 | 86.6% | 4131 | 3.4% | 467 | 51 | 91 | 89 |
| 4100 | 0.3761 | 0.3740 | 9% | 626 | 87.3% | 4131 | 3.4% | 467 | 50 | 93 | 97 |
| 4100 | 0.3761 | 0.3740 | 9% | 631 | 87.8% | 4131 | 3.4% | 467 | 48 | 91 | 86 |
| 4100 | 0.3761 | 0.3740 | 9% | 635 | 88.1% | 4131 | 3.4% | 467 | 47 | 89 | 78 |
| 4100 | 0.3761 | 0.3740 | 8% | 640 | 88.4% | 4131 | 3.4% | 467 | 45 | 88 | 69 |
| 4100 | 0.3761 | 0.3740 | 13% | 611 | 81.8% | 4131 | 5.0% | 471 | 52 | 87 | 62 |
| 4100 | 0.3761 | 0.3740 | 12% | 616 | 83.1% | 4131 | 4.9% | 471 | 51 | 92 | 80 |
| 4100 | 0.3761 | 0.3740 | 11% | 620 | 84.0% | 4131 | 4.9% | 471 | 50 | 95 | 93 |
| 4100 | 0.3761 | 0.3740 | 10% | 626 | 85.3% | 4200 | 4.5% | 471 | 51 | 95 | 92 |
| 4100 | 0.3761 | 0.3740 | 10% | 631 | 86.1% | 4232 | 4.4% | 471 | 51 | 93 | 80 |
| 4100 | 0.3761 | 0.3740 | 9% | 635 | 86.6% | 4263 | 4.2% | 471 | 50 | 91 | 72 |
| 4100 | 0.3761 | 0.3740 | 9% | 640 | 87.5% | 4331 | 3.8% | 471 | 49 | 88 | 65 |
| 4100 | 0.3761 | 0.3740 | 14% | 611 | 81.1% | 4455 | 5.2% | 476 | 60 | 88 | 63 |
| 4100 | 0.3761 | 0.3740 | 12% | 616 | 82.8% | 4476 | 4.9% | 476 | 59 | 93 | 81 |
| 4100 | 0.3761 | 0.3740 | 11% | 620 | 84.1% | 4517 | 4.6% | 476 | 59 | 96 | 94 |
| 4100 | 0.3761 | 0.3740 | 10% | 626 | 85.4% | 4565 | 4.3% | 476 | 59 | 95 | 91 |
| 4100 | 0.3761 | 0.3740 | 10% | 631 | 86.3% | 4594 | 4.0% | 476 | 57 | 93 | 79 |
| 4100 | 0.3761 | 0.3740 | 9% | 635 | 87.1% | 4634 | 3.7% | 476 | 56 | 90 | 72 |
| 4100 | 0.3761 | 0.3740 | 9% | 640 | 88.1% | 4706 | 3.2% | 476 | 54 | 88 | 65 |
| 4100 | 0.3761 | 0.3740 | 14% | 611 | 80.8% | 4723 | 5.2% | 480 | 64 | 89 | 64 |
| 4100 | 0.3761 | 0.3740 | 12% | 616 | 82.5% | 4729 | 5.0% | 480 | 63 | 94 | 82 |
| 4100 | 0.3761 | 0.3740 | 11% | 620 | 84.0% | 4757 | 4.6% | 480 | 62 | 96 | 95 |
| 4100 | 0.3761 | 0.3740 | 10% | 626 | 85.2% | 4786 | 4.3% | 480 | 61 | 96 | 90 |
| 4100 | 0.3761 | 0.3740 | 10% | 631 | 86.3% | 4819 | 3.9% | 480 | 60 | 92 | 79 |
| 4100 | 0.3761 | 0.3740 | 9% | 635 | 87.4% | 4867 | 3.5% | 480 | 58 | 90 | 72 |
| 4100 | 0.3761 | 0.3740 | 9% | 640 | 88.6% | 4930 | 2.9% | 480 | 56 | 87 | 66 |
| 4100 | 0.3761 | 0.3740 | 14% | 611 | 80.0% | 4972 | 5.7% | 486 | 66 | 90 | 65 |
| 4100 | 0.3761 | 0.3740 | 13% | 616 | 81.9% | 4964 | 5.4% | 486 | 65 | 95 | 84 |
| 4100 | 0.3761 | 0.3740 | 12% | 620 | 83.3% | 4973 | 5.0% | 486 | 64 | 97 | 97 |
| 4100 | 0.3761 | 0.3740 | 11% | 626 | 85.0% | 4999 | 4.4% | 486 | 63 | 95 | 89 |
| 4100 | 0.3761 | 0.3740 | 10% | 631 | 86.7% | 5037 | 3.7% | 486 | 62 | 92 | 79 |
| 4100 | 0.3761 | 0.3740 | 9% | 635 | 87.7% | 5060 | 3.2% | 486 | 60 | 89 | 72 |
| 4100 | 0.3761 | 0.3740 | 9% | 640 | 88.6% | 5081 | 2.8% | 486 | 57 | 87 | 65 |
| 4100 | 0.3761 | 0.3740 | 15% | 611 | 78.6% | 5168 | 6.6% | 491 | 67 | 91 | 67 |
| 4100 | 0.3761 | 0.3740 | 13% | 616 | 80.7% | 5146 | 6.2% | 491 | 66 | 96 | 86 |
| 4100 | 0.3761 | 0.3740 | 12% | 620 | 82.6% | 5146 | 5.5% | 491 | 65 | 97 | 99 |
| 4100 | 0.3761 | 0.3740 | 11% | 626 | 84.9% | 5159 | 4.5% | 491 | 64 | 94 | 88 |
| 4100 | 0.3761 | 0.3740 | 10% | 631 | 86.5% | 5168 | 3.8% | 491 | 63 | 91 | 78 |
| 4100 | 0.3761 | 0.3740 | 9% | 635 | 87.6% | 5176 | 3.3% | 491 | 61 | 88 | 72 |
| 4100 | 0.3761 | 0.3740 | 9% | 640 | 88.7% | 5184 | 2.8% | 491 | 58 | 86 | 65 |
| 4100 | 0.3761 | 0.3740 | 15% | 611 | 76.9% | 5315 | 7.7% | 496 | 68 | 92 | 68 |
| 4100 | 0.3761 | 0.3740 | 13% | 616 | 79.9% | 5280 | 6.7% | 496 | 67 | 96 | 87 |
| 4100 | 0.3761 | 0.3740 | 12% | 620 | 82.0% | 5263 | 6.0% | 496 | 66 | 96 | 99 |
| 4100 | 0.3761 | 0.3740 | 11% | 626 | 84.6% | 5253 | 4.8% | 496 | 65 | 93 | 87 |
| 4100 | 0.3761 | 0.3740 | 10% | 631 | 86.5% | 5247 | 3.9% | 496 | 64 | 90 | 78 |
| 4100 | 0.3761 | 0.3740 | 9% | 635 | 87.7% | 5244 | 3.3% | 496 | 62 | 87 | 72 |
| 4100 | 0.3761 | 0.3740 | 8% | 640 | 88.9% | 5242 | 2.7% | 496 | 59 | 85 | 66 |
| 4100 | 0.3761 | 0.3740 | 16% | 611 | 75.1% | 5485 | 8.9% | 502 | 69 | 93 | 70 |
| 4100 | 0.3761 | 0.3740 | 14% | 616 | 78.6% | 5415 | 7.7% | 502 | 68 | 95 | 89 |
| 4100 | 0.3761 | 0.3740 | 12% | 620 | 81.4% | 5372 | 6.5% | 502 | 67 | 95 | 97 |
| 4100 | 0.3761 | 0.3740 | 11% | 626 | 84.5% | 5333 | 4.9% | 502 | 66 | 92 | 87 |
| 4100 | 0.3761 | 0.3740 | 10% | 631 | 86.6% | 5309 | 3.9% | 502 | 64 | 89 | 78 |
| 4100 | 0.3761 | 0.3740 | 9% | 635 | 88.0% | 5295 | 3.2% | 502 | 63 | 86 | 72 |
| 4100 | 0.3761 | 0.3740 | 8% | 640 | 89.2% | 5282 | 2.5% | 502 | 60 | 84 | 67 |
| 4100 | 0.3761 | 0.3740 | 17% | 611 | 73.0% | 5647 | 10.5% | 508 | 70 | 93 | 72 |
| 4100 | 0.3761 | 0.3740 | 14% | 616 | 77.0% | 5536 | 8.9% | 508 | 69 | 94 | 91 |
| 4100 | 0.3761 | 0.3740 | 12% | 620 | 80.9% | 5451 | 6.9% | 508 | 68 | 93 | 96 |
| 4100 | 0.3761 | 0.3740 | 10% | 626 | 84.5% | 5383 | 5.0% | 508 | 67 | 90 | 87 |
| 4100 | 0.3761 | 0.3740 | 9% | 631 | 86.8% | 5344 | 3.8% | 508 | 65 | 88 | 79 |
| 4100 | 0.3761 | 0.3740 | 9% | 635 | 88.2% | 5322 | 3.1% | 508 | 63 | 86 | 73 |
| 4100 | 0.3761 | 0.3740 | 8% | 640 | 89.5% | 5303 | 2.4% | 508 | 60 | 84 | 68 |
| 4100 | 0.3761 | 0.3740 | 17% | 611 | 71.2% | 5777 | 11.8% | 514 | 71 | 92 | 73 |
| 4100 | 0.3761 | 0.3740 | 14% | 616 | 75.6% | 5630 | 10.0% | 514 | 70 | 93 | 92 |
| 4100 | 0.3761 | 0.3740 | 12% | 620 | 80.5% | 5500 | 7.3% | 514 | 69 | 92 | 95 |
| 4100 | 0.3761 | 0.3740 | 10% | 626 | 84.6% | 5408 | 5.0% | 514 | 68 | 90 | 87 |
| 4100 | 0.3761 | 0.3740 | 9% | 631 | 86.9% | 5362 | 3.8% | 514 | 66 | 87 | 79 |
| 4100 | 0.3761 | 0.3740 | 9% | 635 | 88.3% | 5335 | 3.0% | 514 | 64 | 85 | 74 |

TABLE 2-continued

| | | | | | | | | | | | |
|---|---|---|---|---|---|---|---|---|---|---|---|
| 4100 | 0.3761 | 0.3740 | 8% | 640 | 89.7% | 5311 | 2.3% | 514 | 61 | 83 | 69 |
| 4100 | 0.3761 | 0.3740 | 18% | 611 | 68.3% | 5965 | 14.1% | 521 | 72 | 91 | 75 |
| 4100 | 0.3761 | 0.3740 | 15% | 616 | 73.7% | 5742 | 11.5% | 521 | 70 | 92 | 93 |
| 4100 | 0.3761 | 0.3740 | 12% | 620 | 80.0% | 5545 | 7.8% | 521 | 70 | 91 | 94 |
| 4100 | 0.3761 | 0.3740 | 10% | 626 | 84.4% | 5432 | 5.3% | 521 | 68 | 89 | 87 |
| 4100 | 0.3761 | 0.3740 | 9% | 631 | 86.9% | 5377 | 3.9% | 521 | 66 | 86 | 80 |
| 4100 | 0.3761 | 0.3740 | 9% | 635 | 88.5% | 5343 | 3.0% | 521 | 64 | 85 | 75 |
| 4100 | 0.3761 | 0.3740 | 8% | 640 | 90.1% | 5310 | 2.0% | 521 | 61 | 83 | 70 |
| 4100 | 0.3761 | 0.3740 | 18% | 611 | 64.8% | 6191 | 16.8% | 527 | 73 | 90 | 76 |
| 4100 | 0.3761 | 0.3740 | 15% | 616 | 72.1% | 5836 | 12.9% | 527 | 71 | 91 | 93 |
| 4100 | 0.3761 | 0.3740 | 12% | 620 | 79.6% | 5574 | 8.3% | 527 | 70 | 90 | 94 |
| 4100 | 0.3761 | 0.3740 | 10% | 626 | 84.1% | 5451 | 5.6% | 527 | 68 | 88 | 87 |
| 4100 | 0.3761 | 0.3740 | 9% | 631 | 87.0% | 5383 | 3.9% | 527 | 66 | 86 | 80 |
| 4100 | 0.3761 | 0.3740 | 8% | 635 | 89.0% | 5338 | 2.6% | 527 | 64 | 84 | 76 |
| 4100 | 0.3761 | 0.3740 | 8% | 640 | 91.2% | 5293 | 1.2% | 527 | 61 | 83 | 73 |
| 4100 | 0.3761 | 0.3740 | 20% | 611 | 59.1% | 6651 | 21.3% | 534 | 74 | 89 | 78 |
| 4100 | 0.3761 | 0.3740 | 15% | 616 | 69.7% | 5971 | 15.1% | 534 | 72 | 90 | 93 |
| 4100 | 0.3761 | 0.3740 | 12% | 620 | 78.7% | 5620 | 9.3% | 534 | 71 | 89 | 93 |
| 4100 | 0.3761 | 0.3740 | 10% | 626 | 83.8% | 5469 | 6.0% | 534 | 69 | 87 | 87 |
| 4100 | 0.3761 | 0.3740 | 9% | 631 | 87.9% | 5368 | 3.3% | 534 | 67 | 85 | 83 |
| 4100 | 0.3761 | 0.3740 | 8% | 635 | 90.9% | 5302 | 1.3% | 534 | 65 | 84 | 81 |
| 4100 | 0.3761 | 0.3740 | 7% | 640 | 92.8% | 5263 | 0.0% | 534 | 62 | 83 | 77 |
| 4100 | 0.3761 | 0.3740 | 21% | 611 | 51.4% | 7592 | 27.7% | 540 | 75 | 87 | 79 |
| 4100 | 0.3761 | 0.3740 | 15% | 616 | 67.3% | 6120 | 17.4% | 540 | 73 | 88 | 92 |
| 4100 | 0.3761 | 0.3740 | 12% | 620 | 76.7% | 5698 | 11.0% | 540 | 71 | 88 | 93 |
| 4100 | 0.3761 | 0.3740 | 10% | 626 | 84.4% | 5458 | 5.7% | 540 | 69 | 86 | 89 |
| 4100 | 0.3761 | 0.3740 | 8% | 631 | 90.5% | 5311 | 1.3% | 540 | 67 | 85 | 88 |
| 4100 | 0.3761 | 0.3740 | 7% | 635 | 92.5% | 5269 | 0.0% | 540 | 65 | 84 | 84 |
| 4100 | 0.3761 | 0.3740 | 7% | 640 | 92.8% | 5263 | 0.0% | 540 | 62 | 83 | 77 |
| 4000 | 0.3805 | 0.3768 | 12% | 611 | 84.2% | 4131 | 3.3% | 467 | 53 | 84 | 61 |
| 4000 | 0.3805 | 0.3768 | 11% | 616 | 85.5% | 4131 | 3.3% | 467 | 52 | 89 | 77 |
| 4000 | 0.3805 | 0.3768 | 10% | 620 | 86.3% | 4131 | 3.3% | 467 | 51 | 91 | 90 |
| 4000 | 0.3805 | 0.3768 | 10% | 626 | 87.0% | 4131 | 3.3% | 467 | 50 | 93 | 96 |
| 4000 | 0.3805 | 0.3768 | 9% | 631 | 87.5% | 4131 | 3.3% | 467 | 49 | 91 | 84 |
| 4000 | 0.3805 | 0.3768 | 9% | 635 | 87.8% | 4131 | 3.3% | 467 | 47 | 89 | 75 |
| 4000 | 0.3805 | 0.3768 | 9% | 640 | 88.1% | 4131 | 3.3% | 467 | 45 | 87 | 67 |
| 4000 | 0.3805 | 0.3768 | 14% | 611 | 81.5% | 4131 | 4.8% | 471 | 52 | 87 | 62 |
| 4000 | 0.3805 | 0.3768 | 12% | 616 | 82.9% | 4131 | 4.7% | 471 | 51 | 92 | 80 |
| 4000 | 0.3805 | 0.3768 | 12% | 620 | 83.7% | 4131 | 4.7% | 471 | 50 | 95 | 93 |
| 4000 | 0.3805 | 0.3768 | 11% | 626 | 85.0% | 4196 | 4.4% | 471 | 52 | 95 | 90 |
| 4000 | 0.3805 | 0.3768 | 10% | 631 | 85.8% | 4227 | 4.2% | 471 | 51 | 92 | 78 |
| 4000 | 0.3805 | 0.3768 | 10% | 635 | 86.5% | 4268 | 4.0% | 471 | 51 | 90 | 70 |
| 4000 | 0.3805 | 0.3768 | 9% | 640 | 87.5% | 4354 | 3.5% | 471 | 50 | 87 | 63 |
| 4000 | 0.3805 | 0.3768 | 14% | 611 | 80.7% | 4434 | 5.0% | 476 | 60 | 88 | 63 |
| 4000 | 0.3805 | 0.3768 | 13% | 616 | 82.5% | 4459 | 4.7% | 476 | 60 | 93 | 81 |
| 4000 | 0.3805 | 0.3768 | 12% | 620 | 83.9% | 4501 | 4.4% | 476 | 59 | 96 | 94 |
| 4000 | 0.3805 | 0.3768 | 11% | 626 | 85.2% | 4549 | 4.0% | 476 | 59 | 95 | 90 |
| 4000 | 0.3805 | 0.3768 | 10% | 631 | 86.2% | 4579 | 3.8% | 476 | 57 | 92 | 78 |
| 4000 | 0.3805 | 0.3768 | 10% | 635 | 87.0% | 4628 | 3.5% | 476 | 56 | 90 | 70 |
| 4000 | 0.3805 | 0.3768 | 9% | 640 | 88.2% | 4714 | 2.9% | 476 | 55 | 87 | 63 |
| 4000 | 0.3805 | 0.3768 | 14% | 611 | 80.5% | 4690 | 5.0% | 480 | 64 | 89 | 63 |
| 4000 | 0.3805 | 0.3768 | 13% | 616 | 82.3% | 4701 | 4.8% | 480 | 63 | 94 | 82 |
| 4000 | 0.3805 | 0.3768 | 12% | 620 | 83.7% | 4727 | 4.4% | 480 | 62 | 97 | 96 |
| 4000 | 0.3805 | 0.3768 | 11% | 626 | 85.1% | 4758 | 4.1% | 480 | 61 | 95 | 89 |
| 4000 | 0.3805 | 0.3768 | 10% | 631 | 86.3% | 4798 | 3.6% | 480 | 60 | 92 | 77 |
| 4000 | 0.3805 | 0.3768 | 9% | 635 | 87.5% | 4852 | 3.1% | 480 | 59 | 89 | 71 |
| 4000 | 0.3805 | 0.3768 | 9% | 640 | 88.6% | 4908 | 2.6% | 480 | 56 | 86 | 64 |
| 4000 | 0.3805 | 0.3768 | 15% | 611 | 79.7% | 4926 | 5.5% | 486 | 66 | 90 | 65 |
| 4000 | 0.3805 | 0.3768 | 13% | 616 | 81.7% | 4921 | 5.2% | 486 | 65 | 95 | 84 |
| 4000 | 0.3805 | 0.3768 | 12% | 620 | 83.2% | 4933 | 4.8% | 486 | 64 | 97 | 97 |
| 4000 | 0.3805 | 0.3768 | 11% | 626 | 85.0% | 4962 | 4.1% | 486 | 63 | 95 | 88 |
| 4000 | 0.3805 | 0.3768 | 10% | 631 | 86.6% | 4999 | 3.4% | 486 | 62 | 91 | 78 |
| 4000 | 0.3805 | 0.3768 | 9% | 635 | 87.7% | 5021 | 3.0% | 486 | 60 | 88 | 71 |
| 4000 | 0.3805 | 0.3768 | 9% | 640 | 88.7% | 5044 | 2.5% | 486 | 57 | 86 | 64 |
| 4000 | 0.3805 | 0.3768 | 15% | 611 | 78.3% | 5111 | 6.3% | 491 | 67 | 91 | 66 |
| 4000 | 0.3805 | 0.3768 | 14% | 616 | 80.6% | 5093 | 5.9% | 491 | 66 | 96 | 85 |
| 4000 | 0.3805 | 0.3768 | 12% | 620 | 82.5% | 5092 | 5.3% | 491 | 65 | 97 | 99 |
| 4000 | 0.3805 | 0.3768 | 11% | 626 | 84.8% | 5107 | 4.2% | 491 | 64 | 93 | 88 |
| 4000 | 0.3805 | 0.3768 | 10% | 631 | 86.5% | 5117 | 3.5% | 491 | 63 | 90 | 77 |
| 4000 | 0.3805 | 0.3768 | 9% | 635 | 87.7% | 5126 | 3.0% | 491 | 61 | 88 | 70 |
| 4000 | 0.3805 | 0.3768 | 9% | 640 | 88.8% | 5135 | 2.4% | 491 | 58 | 85 | 64 |
| 4000 | 0.3805 | 0.3768 | 16% | 611 | 76.7% | 5249 | 7.4% | 496 | 68 | 92 | 68 |
| 4000 | 0.3805 | 0.3768 | 14% | 616 | 79.8% | 5216 | 6.4% | 496 | 67 | 96 | 87 |
| 4000 | 0.3805 | 0.3768 | 12% | 620 | 82.0% | 5201 | 5.7% | 496 | 66 | 96 | 99 |
| 4000 | 0.3805 | 0.3768 | 11% | 626 | 84.6% | 5192 | 4.4% | 496 | 65 | 92 | 87 |
| 4000 | 0.3805 | 0.3768 | 10% | 631 | 86.6% | 5187 | 3.5% | 496 | 64 | 89 | 77 |
| 4000 | 0.3805 | 0.3768 | 9% | 635 | 87.8% | 5185 | 2.9% | 496 | 62 | 87 | 71 |
| 4000 | 0.3805 | 0.3768 | 9% | 640 | 89.0% | 5184 | 2.3% | 496 | 59 | 84 | 65 |
| 4000 | 0.3805 | 0.3768 | 16% | 611 | 74.9% | 5405 | 8.6% | 502 | 69 | 93 | 69 |
| 4000 | 0.3805 | 0.3768 | 14% | 616 | 78.5% | 5340 | 7.4% | 502 | 68 | 95 | 88 |

TABLE 2-continued

| | | | | | | | | | | |
|---|---|---|---|---|---|---|---|---|---|---|
| 4000 | 0.3805 | 0.3768 | 12% | 620 | 81.4% | 5300 | 6.1% | 502 | 67 | 95 | 97 |
| 4000 | 0.3805 | 0.3768 | 11% | 626 | 84.6% | 5264 | 4.6% | 502 | 66 | 91 | 87 |
| 4000 | 0.3805 | 0.3768 | 10% | 631 | 86.7% | 5242 | 3.5% | 502 | 64 | 88 | 77 |
| 4000 | 0.3805 | 0.3768 | 9% | 635 | 88.1% | 5228 | 2.7% | 502 | 63 | 86 | 72 |
| 4000 | 0.3805 | 0.3768 | 9% | 640 | 89.4% | 5217 | 2.1% | 502 | 60 | 84 | 66 |
| 4000 | 0.3805 | 0.3768 | 17% | 611 | 72.9% | 5553 | 10.1% | 508 | 70 | 93 | 71 |
| 4000 | 0.3805 | 0.3768 | 14% | 616 | 77.0% | 5449 | 8.5% | 508 | 69 | 94 | 90 |
| 4000 | 0.3805 | 0.3768 | 13% | 620 | 80.9% | 5371 | 6.5% | 508 | 68 | 93 | 96 |
| 4000 | 0.3805 | 0.3768 | 11% | 626 | 84.7% | 5307 | 4.6% | 508 | 67 | 90 | 87 |
| 4000 | 0.3805 | 0.3768 | 10% | 631 | 87.1% | 5271 | 3.3% | 508 | 65 | 87 | 78 |
| 4000 | 0.3805 | 0.3768 | 9% | 635 | 88.5% | 5250 | 2.5% | 508 | 63 | 85 | 73 |
| 4000 | 0.3805 | 0.3768 | 8% | 640 | 89.8% | 5232 | 1.8% | 508 | 60 | 83 | 67 |
| 4000 | 0.3805 | 0.3768 | 17% | 611 | 71.2% | 5671 | 11.4% | 514 | 71 | 92 | 72 |
| 4000 | 0.3805 | 0.3768 | 15% | 616 | 75.7% | 5533 | 9.6% | 514 | 70 | 93 | 91 |
| 4000 | 0.3805 | 0.3768 | 12% | 620 | 80.6% | 5414 | 6.9% | 514 | 69 | 92 | 95 |
| 4000 | 0.3805 | 0.3768 | 11% | 626 | 84.8% | 5328 | 4.5% | 514 | 68 | 89 | 87 |
| 4000 | 0.3805 | 0.3768 | 10% | 631 | 87.2% | 5284 | 3.2% | 514 | 66 | 87 | 79 |
| 4000 | 0.3805 | 0.3768 | 9% | 635 | 88.7% | 5259 | 2.5% | 514 | 63 | 85 | 73 |
| 4000 | 0.3805 | 0.3768 | 8% | 640 | 90.0% | 5237 | 1.7% | 514 | 60 | 83 | 68 |
| 4000 | 0.3805 | 0.3768 | 18% | 611 | 68.4% | 5839 | 13.6% | 521 | 72 | 91 | 74 |
| 4000 | 0.3805 | 0.3768 | 15% | 616 | 73.9% | 5633 | 11.0% | 521 | 71 | 92 | 92 |
| 4000 | 0.3805 | 0.3768 | 12% | 620 | 80.2% | 5453 | 7.3% | 521 | 70 | 91 | 94 |
| 4000 | 0.3805 | 0.3768 | 11% | 626 | 84.8% | 5347 | 4.7% | 521 | 68 | 89 | 87 |
| 4000 | 0.3805 | 0.3768 | 9% | 631 | 87.3% | 5295 | 3.3% | 521 | 66 | 86 | 79 |
| 4000 | 0.3805 | 0.3768 | 9% | 635 | 88.9% | 5263 | 2.3% | 521 | 64 | 85 | 74 |
| 4000 | 0.3805 | 0.3768 | 8% | 640 | 90.6% | 5233 | 1.3% | 521 | 61 | 83 | 70 |
| 4000 | 0.3805 | 0.3768 | 19% | 611 | 65.1% | 6038 | 16.2% | 527 | 73 | 90 | 75 |
| 4000 | 0.3805 | 0.3768 | 15% | 616 | 72.3% | 5718 | 12.4% | 527 | 71 | 91 | 92 |
| 4000 | 0.3805 | 0.3768 | 12% | 620 | 79.9% | 5478 | 7.7% | 527 | 70 | 90 | 94 |
| 4000 | 0.3805 | 0.3768 | 11% | 626 | 84.6% | 5361 | 4.9% | 527 | 68 | 88 | 87 |
| 4000 | 0.3805 | 0.3768 | 9% | 631 | 87.4% | 5298 | 3.2% | 527 | 66 | 86 | 80 |
| 4000 | 0.3805 | 0.3768 | 9% | 635 | 89.5% | 5257 | 1.9% | 527 | 64 | 84 | 76 |
| 4000 | 0.3805 | 0.3768 | 8% | 640 | 91.7% | 5215 | 0.5% | 527 | 61 | 83 | 73 |
| 4000 | 0.3805 | 0.3768 | 20% | 611 | 59.5% | 6442 | 20.6% | 534 | 74 | 89 | 77 |
| 4000 | 0.3805 | 0.3768 | 16% | 616 | 70.0% | 5839 | 14.5% | 534 | 72 | 90 | 92 |
| 4000 | 0.3805 | 0.3768 | 12% | 620 | 79.1% | 5514 | 8.6% | 534 | 71 | 89 | 94 |
| 4000 | 0.3805 | 0.3768 | 10% | 626 | 84.3% | 5374 | 5.2% | 534 | 69 | 87 | 88 |
| 4000 | 0.3805 | 0.3768 | 9% | 631 | 88.4% | 5281 | 2.5% | 534 | 67 | 85 | 83 |
| 4000 | 0.3805 | 0.3768 | 8% | 635 | 91.5% | 5221 | 0.5% | 534 | 65 | 84 | 81 |
| 4000 | 0.3805 | 0.3768 | 8% | 640 | 92.4% | 5204 | 0.0% | 534 | 61 | 83 | 75 |
| 4000 | 0.3805 | 0.3768 | 21% | 611 | 51.9% | 7254 | 26.9% | 540 | 75 | 87 | 78 |
| 4000 | 0.3805 | 0.3768 | 16% | 616 | 67.6% | 5971 | 16.8% | 540 | 73 | 89 | 91 |
| 4000 | 0.3805 | 0.3768 | 12% | 620 | 77.4% | 5577 | 10.1% | 540 | 71 | 88 | 93 |
| 4000 | 0.3805 | 0.3768 | 10% | 626 | 85.1% | 5360 | 4.8% | 540 | 69 | 87 | 89 |
| 4000 | 0.3805 | 0.3768 | 8% | 631 | 91.3% | 5225 | 0.4% | 540 | 67 | 85 | 88 |
| 4000 | 0.3805 | 0.3768 | 8% | 635 | 92.1% | 5209 | 0.0% | 540 | 65 | 84 | 82 |
| 4000 | 0.3805 | 0.3768 | 8% | 640 | 92.4% | 5204 | 0.0% | 540 | 61 | 83 | 75 |
| 3900 | 0.3850 | 0.3795 | 13% | 611 | 83.8% | 4131 | 3.2% | 467 | 53 | 84 | 60 |
| 3900 | 0.3850 | 0.3795 | 12% | 616 | 85.1% | 4131 | 3.1% | 467 | 52 | 89 | 78 |
| 3900 | 0.3850 | 0.3795 | 11% | 620 | 85.9% | 4131 | 3.1% | 467 | 51 | 92 | 91 |
| 3900 | 0.3850 | 0.3795 | 10% | 626 | 86.6% | 4131 | 3.1% | 467 | 50 | 93 | 94 |
| 3900 | 0.3850 | 0.3795 | 10% | 631 | 87.2% | 4131 | 3.1% | 467 | 49 | 91 | 82 |
| 3900 | 0.3850 | 0.3795 | 9% | 635 | 87.5% | 4131 | 3.1% | 467 | 47 | 89 | 73 |
| 3900 | 0.3850 | 0.3795 | 9% | 640 | 87.9% | 4131 | 3.1% | 467 | 45 | 86 | 64 |
| 3900 | 0.3850 | 0.3795 | 14% | 611 | 81.2% | 4131 | 4.5% | 471 | 53 | 87 | 61 |
| 3900 | 0.3850 | 0.3795 | 13% | 616 | 82.6% | 4131 | 4.5% | 471 | 52 | 93 | 80 |
| 3900 | 0.3850 | 0.3795 | 12% | 620 | 83.5% | 4131 | 4.5% | 471 | 51 | 96 | 94 |
| 3900 | 0.3850 | 0.3795 | 11% | 626 | 84.8% | 4195 | 4.2% | 471 | 52 | 95 | 89 |
| 3900 | 0.3850 | 0.3795 | 10% | 631 | 85.6% | 4225 | 4.0% | 471 | 51 | 92 | 77 |
| 3900 | 0.3850 | 0.3795 | 10% | 635 | 86.4% | 4275 | 3.7% | 471 | 51 | 89 | 68 |
| 3900 | 0.3850 | 0.3795 | 9% | 640 | 87.4% | 4369 | 3.2% | 471 | 50 | 86 | 61 |
| 3900 | 0.3850 | 0.3795 | 15% | 611 | 80.3% | 4413 | 4.8% | 476 | 60 | 88 | 62 |
| 3900 | 0.3850 | 0.3795 | 13% | 616 | 82.3% | 4444 | 4.5% | 476 | 60 | 94 | 81 |
| 3900 | 0.3850 | 0.3795 | 12% | 620 | 83.7% | 4486 | 4.2% | 476 | 60 | 96 | 95 |
| 3900 | 0.3850 | 0.3795 | 11% | 626 | 85.0% | 4531 | 3.8% | 476 | 59 | 95 | 89 |
| 3900 | 0.3850 | 0.3795 | 10% | 631 | 86.0% | 4568 | 3.6% | 476 | 58 | 91 | 76 |
| 3900 | 0.3850 | 0.3795 | 10% | 635 | 86.9% | 4619 | 3.2% | 476 | 56 | 89 | 68 |
| 3900 | 0.3850 | 0.3795 | 9% | 640 | 88.1% | 4703 | 2.6% | 476 | 55 | 86 | 61 |
| 3900 | 0.3850 | 0.3795 | 15% | 611 | 80.1% | 4658 | 4.9% | 480 | 64 | 89 | 63 |
| 3900 | 0.3850 | 0.3795 | 13% | 616 | 82.1% | 4673 | 4.6% | 480 | 63 | 94 | 82 |
| 3900 | 0.3850 | 0.3795 | 12% | 620 | 83.5% | 4698 | 4.2% | 480 | 62 | 97 | 96 |
| 3900 | 0.3850 | 0.3795 | 11% | 626 | 84.9% | 4733 | 3.8% | 480 | 61 | 95 | 88 |
| 3900 | 0.3850 | 0.3795 | 10% | 631 | 86.2% | 4774 | 3.4% | 480 | 60 | 91 | 76 |
| 3900 | 0.3850 | 0.3795 | 10% | 635 | 87.4% | 4825 | 2.9% | 480 | 59 | 88 | 69 |
| 3900 | 0.3850 | 0.3795 | 9% | 640 | 88.5% | 4878 | 2.3% | 480 | 56 | 86 | 62 |
| 3900 | 0.3850 | 0.3795 | 15% | 611 | 79.4% | 4881 | 5.3% | 486 | 66 | 90 | 64 |
| 3900 | 0.3850 | 0.3795 | 14% | 616 | 81.4% | 4878 | 4.9% | 486 | 65 | 95 | 84 |
| 3900 | 0.3850 | 0.3795 | 12% | 620 | 83.0% | 4892 | 4.5% | 486 | 64 | 97 | 98 |
| 3900 | 0.3850 | 0.3795 | 11% | 626 | 84.9% | 4925 | 3.8% | 486 | 63 | 94 | 88 |
| 3900 | 0.3850 | 0.3795 | 10% | 631 | 86.5% | 4956 | 3.2% | 486 | 62 | 90 | 76 |

TABLE 2-continued

| | | | | | | | | | | | |
|---|---|---|---|---|---|---|---|---|---|---|---|
| 3900 | 0.3850 | 0.3795 | 10% | 635 | 87.6% | 4982 | 2.7% | 486 | 60 | 88 | 69 |
| 3900 | 0.3850 | 0.3795 | 9% | 640 | 88.7% | 5008 | 2.2% | 486 | 57 | 85 | 62 |
| 3900 | 0.3850 | 0.3795 | 16% | 611 | 78.0% | 5055 | 6.1% | 491 | 67 | 91 | 65 |
| 3900 | 0.3850 | 0.3795 | 14% | 616 | 80.5% | 5040 | 5.6% | 491 | 66 | 96 | 85 |
| 3900 | 0.3850 | 0.3795 | 13% | 620 | 82.3% | 5040 | 5.0% | 491 | 65 | 97 | 100 |
| 3900 | 0.3850 | 0.3795 | 11% | 626 | 84.7% | 5055 | 4.0% | 491 | 64 | 93 | 87 |
| 3900 | 0.3850 | 0.3795 | 10% | 631 | 86.5% | 5068 | 3.2% | 491 | 63 | 89 | 76 |
| 3900 | 0.3850 | 0.3795 | 10% | 635 | 87.8% | 5078 | 2.6% | 491 | 61 | 87 | 69 |
| 3900 | 0.3850 | 0.3795 | 9% | 640 | 88.9% | 5088 | 2.0% | 491 | 58 | 84 | 62 |
| 3900 | 0.3850 | 0.3795 | 16% | 611 | 76.4% | 5183 | 7.2% | 496 | 68 | 92 | 67 |
| 3900 | 0.3850 | 0.3795 | 14% | 616 | 79.7% | 5154 | 6.1% | 496 | 67 | 95 | 86 |
| 3900 | 0.3850 | 0.3795 | 13% | 620 | 81.9% | 5140 | 5.3% | 496 | 66 | 96 | 99 |
| 3900 | 0.3850 | 0.3795 | 11% | 626 | 84.6% | 5133 | 4.1% | 496 | 65 | 92 | 86 |
| 3900 | 0.3850 | 0.3795 | 10% | 631 | 86.6% | 5130 | 3.1% | 496 | 64 | 89 | 76 |
| 3900 | 0.3850 | 0.3795 | 10% | 635 | 88.0% | 5129 | 2.5% | 496 | 62 | 86 | 70 |
| 3900 | 0.3850 | 0.3795 | 9% | 640 | 89.2% | 5128 | 1.8% | 496 | 59 | 84 | 63 |
| 3900 | 0.3850 | 0.3795 | 17% | 611 | 74.8% | 5328 | 8.3% | 502 | 69 | 93 | 68 |
| 3900 | 0.3850 | 0.3795 | 15% | 616 | 78.5% | 5266 | 7.0% | 502 | 68 | 95 | 88 |
| 3900 | 0.3850 | 0.3795 | 13% | 620 | 81.4% | 5229 | 5.7% | 502 | 67 | 95 | 97 |
| 3900 | 0.3850 | 0.3795 | 11% | 626 | 84.6% | 5197 | 4.1% | 502 | 66 | 91 | 86 |
| 3900 | 0.3850 | 0.3795 | 10% | 631 | 86.9% | 5176 | 3.0% | 502 | 64 | 88 | 77 |
| 3900 | 0.3850 | 0.3795 | 9% | 635 | 88.4% | 5164 | 2.3% | 502 | 62 | 86 | 71 |
| 3900 | 0.3850 | 0.3795 | 9% | 640 | 89.7% | 5154 | 1.6% | 502 | 59 | 83 | 65 |
| 3900 | 0.3850 | 0.3795 | 17% | 611 | 72.8% | 5463 | 9.7% | 508 | 70 | 92 | 70 |
| 3900 | 0.3850 | 0.3795 | 15% | 616 | 77.1% | 5364 | 8.1% | 508 | 69 | 94 | 90 |
| 3900 | 0.3850 | 0.3795 | 13% | 620 | 81.0% | 5293 | 6.1% | 508 | 68 | 93 | 96 |
| 3900 | 0.3850 | 0.3795 | 11% | 626 | 84.8% | 5234 | 4.1% | 508 | 67 | 90 | 86 |
| 3900 | 0.3850 | 0.3795 | 10% | 631 | 87.3% | 5199 | 2.8% | 508 | 65 | 87 | 78 |
| 3900 | 0.3850 | 0.3795 | 9% | 635 | 88.8% | 5180 | 2.0% | 508 | 63 | 85 | 72 |
| 3900 | 0.3850 | 0.3795 | 9% | 640 | 90.1% | 5163 | 1.3% | 508 | 60 | 83 | 66 |
| 3900 | 0.3850 | 0.3795 | 18% | 611 | 71.2% | 5569 | 11.0% | 514 | 71 | 92 | 71 |
| 3900 | 0.3850 | 0.3795 | 15% | 616 | 75.8% | 5439 | 9.1% | 514 | 70 | 93 | 91 |
| 3900 | 0.3850 | 0.3795 | 13% | 620 | 80.7% | 5331 | 6.4% | 514 | 69 | 92 | 95 |
| 3900 | 0.3850 | 0.3795 | 11% | 626 | 85.1% | 5250 | 4.0% | 514 | 68 | 89 | 87 |
| 3900 | 0.3850 | 0.3795 | 10% | 631 | 87.5% | 5209 | 2.7% | 514 | 65 | 87 | 78 |
| 3900 | 0.3850 | 0.3795 | 9% | 635 | 89.0% | 5185 | 1.9% | 514 | 63 | 85 | 73 |
| 3900 | 0.3850 | 0.3795 | 9% | 640 | 90.4% | 5164 | 1.1% | 514 | 60 | 83 | 67 |
| 3900 | 0.3850 | 0.3795 | 18% | 611 | 68.6% | 5718 | 13.0% | 521 | 72 | 91 | 73 |
| 3900 | 0.3850 | 0.3795 | 15% | 616 | 74.1% | 5528 | 10.5% | 521 | 71 | 92 | 92 |
| 3900 | 0.3850 | 0.3795 | 13% | 620 | 80.4% | 5365 | 6.8% | 521 | 70 | 91 | 95 |
| 3900 | 0.3850 | 0.3795 | 11% | 626 | 85.1% | 5264 | 4.0% | 521 | 68 | 89 | 87 |
| 3900 | 0.3850 | 0.3795 | 10% | 631 | 87.7% | 5215 | 2.6% | 521 | 66 | 86 | 79 |
| 3900 | 0.3850 | 0.3795 | 9% | 635 | 89.4% | 5186 | 1.6% | 521 | 64 | 84 | 74 |
| 3900 | 0.3850 | 0.3795 | 8% | 640 | 91.1% | 5158 | 0.6% | 521 | 61 | 83 | 69 |
| 3900 | 0.3850 | 0.3795 | 19% | 611 | 65.3% | 5893 | 15.5% | 527 | 73 | 90 | 74 |
| 3900 | 0.3850 | 0.3795 | 16% | 616 | 72.5% | 5605 | 11.8% | 527 | 71 | 91 | 92 |
| 3900 | 0.3850 | 0.3795 | 13% | 620 | 80.1% | 5385 | 7.1% | 527 | 70 | 90 | 94 |
| 3900 | 0.3850 | 0.3795 | 11% | 626 | 85.0% | 5274 | 4.2% | 527 | 68 | 88 | 87 |
| 3900 | 0.3850 | 0.3795 | 10% | 631 | 87.9% | 5216 | 2.5% | 527 | 66 | 86 | 80 |
| 3900 | 0.3850 | 0.3795 | 9% | 635 | 90.0% | 5178 | 1.2% | 527 | 64 | 84 | 76 |
| 3900 | 0.3850 | 0.3795 | 8% | 640 | 91.9% | 5145 | 0.0% | 527 | 61 | 83 | 71 |
| 3900 | 0.3850 | 0.3795 | 20% | 611 | 59.8% | 6246 | 19.9% | 534 | 74 | 89 | 76 |
| 3900 | 0.3850 | 0.3795 | 16% | 616 | 70.3% | 5712 | 13.8% | 534 | 72 | 90 | 92 |
| 3900 | 0.3850 | 0.3795 | 13% | 620 | 79.5% | 5413 | 7.8% | 534 | 71 | 89 | 94 |
| 3900 | 0.3850 | 0.3795 | 11% | 626 | 84.9% | 5282 | 4.4% | 534 | 69 | 87 | 88 |
| 3900 | 0.3850 | 0.3795 | 9% | 631 | 89.0% | 5198 | 1.7% | 534 | 66 | 85 | 82 |
| 3900 | 0.3850 | 0.3795 | 8% | 635 | 91.6% | 5151 | 0.0% | 534 | 64 | 84 | 79 |
| 3900 | 0.3850 | 0.3795 | 8% | 640 | 91.9% | 5145 | 0.0% | 534 | 61 | 83 | 71 |
| 3900 | 0.3850 | 0.3795 | 22% | 611 | 52.3% | 6948 | 26.1% | 540 | 75 | 87 | 77 |
| 3900 | 0.3850 | 0.3795 | 16% | 616 | 67.9% | 5829 | 16.1% | 540 | 73 | 89 | 91 |
| 3900 | 0.3850 | 0.3795 | 13% | 620 | 78.0% | 5463 | 9.2% | 540 | 71 | 88 | 93 |
| 3900 | 0.3850 | 0.3795 | 10% | 626 | 85.8% | 5265 | 3.8% | 540 | 69 | 87 | 90 |
| 3900 | 0.3850 | 0.3795 | 9% | 631 | 91.3% | 5157 | 0.0% | 540 | 67 | 85 | 86 |
| 3900 | 0.3850 | 0.3795 | 8% | 635 | 91.6% | 5151 | 0.0% | 540 | 64 | 84 | 79 |
| 3900 | 0.3850 | 0.3795 | 8% | 640 | 91.9% | 5145 | 0.0% | 540 | 61 | 83 | 71 |
| 3800 | 0.3897 | 0.3823 | 14% | 611 | 83.3% | 4131 | 3.0% | 467 | 53 | 85 | 60 |
| 3800 | 0.3897 | 0.3823 | 12% | 616 | 84.6% | 4131 | 3.0% | 467 | 52 | 89 | 78 |
| 3800 | 0.3897 | 0.3823 | 12% | 620 | 85.5% | 4131 | 3.0% | 467 | 52 | 93 | 92 |
| 3800 | 0.3897 | 0.3823 | 11% | 626 | 86.3% | 4131 | 3.0% | 467 | 50 | 93 | 93 |
| 3800 | 0.3897 | 0.3823 | 10% | 631 | 86.8% | 4131 | 3.0% | 467 | 49 | 90 | 80 |
| 3800 | 0.3897 | 0.3823 | 10% | 635 | 87.2% | 4131 | 3.0% | 467 | 47 | 88 | 70 |
| 3800 | 0.3897 | 0.3823 | 9% | 640 | 87.6% | 4131 | 3.0% | 467 | 45 | 85 | 61 |
| 3800 | 0.3897 | 0.3823 | 15% | 611 | 80.8% | 4131 | 4.3% | 471 | 53 | 88 | 61 |
| 3800 | 0.3897 | 0.3823 | 13% | 616 | 82.3% | 4131 | 4.3% | 471 | 52 | 93 | 80 |
| 3800 | 0.3897 | 0.3823 | 12% | 620 | 83.2% | 4131 | 4.3% | 471 | 51 | 96 | 95 |
| 3800 | 0.3897 | 0.3823 | 12% | 626 | 84.5% | 4192 | 4.0% | 471 | 52 | 95 | 88 |
| 3800 | 0.3897 | 0.3823 | 11% | 631 | 85.4% | 4229 | 3.8% | 471 | 51 | 91 | 75 |
| 3800 | 0.3897 | 0.3823 | 10% | 635 | 86.2% | 4275 | 3.5% | 471 | 51 | 88 | 66 |
| 3800 | 0.3897 | 0.3823 | 10% | 640 | 87.2% | 4364 | 3.0% | 471 | 50 | 85 | 58 |
| 3800 | 0.3897 | 0.3823 | 15% | 611 | 79.9% | 4394 | 4.6% | 476 | 60 | 88 | 61 |

TABLE 2-continued

| | | | | | | | | | | | |
|---|---|---|---|---|---|---|---|---|---|---|---|
| 3800 | 0.3897 | 0.3823 | 14% | 616 | 82.0% | 4430 | 4.3% | 476 | 60 | 94 | 81 |
| 3800 | 0.3897 | 0.3823 | 13% | 620 | 83.4% | 4472 | 4.0% | 476 | 60 | 96 | 96 |
| 3800 | 0.3897 | 0.3823 | 12% | 626 | 84.8% | 4517 | 3.6% | 476 | 59 | 95 | 88 |
| 3800 | 0.3897 | 0.3823 | 11% | 631 | 85.8% | 4553 | 3.3% | 476 | 58 | 91 | 75 |
| 3800 | 0.3897 | 0.3823 | 10% | 635 | 86.7% | 4600 | 3.0% | 476 | 56 | 88 | 66 |
| 3800 | 0.3897 | 0.3823 | 10% | 640 | 87.9% | 4679 | 2.5% | 476 | 54 | 85 | 59 |
| 3800 | 0.3897 | 0.3823 | 16% | 611 | 79.7% | 4626 | 4.7% | 480 | 64 | 89 | 62 |
| 3800 | 0.3897 | 0.3823 | 14% | 616 | 81.8% | 4646 | 4.3% | 480 | 63 | 94 | 82 |
| 3800 | 0.3897 | 0.3823 | 13% | 620 | 83.2% | 4670 | 4.0% | 480 | 63 | 97 | 97 |
| 3800 | 0.3897 | 0.3823 | 12% | 626 | 84.8% | 4710 | 3.6% | 480 | 62 | 94 | 87 |
| 3800 | 0.3897 | 0.3823 | 11% | 631 | 86.0% | 4745 | 3.2% | 480 | 60 | 90 | 74 |
| 3800 | 0.3897 | 0.3823 | 10% | 635 | 87.1% | 4792 | 2.7% | 480 | 59 | 87 | 67 |
| 3800 | 0.3897 | 0.3823 | 10% | 640 | 88.3% | 4849 | 2.1% | 480 | 56 | 85 | 59 |
| 3800 | 0.3897 | 0.3823 | 16% | 611 | 79.0% | 4837 | 5.1% | 486 | 66 | 90 | 63 |
| 3800 | 0.3897 | 0.3823 | 14% | 616 | 81.1% | 4836 | 4.7% | 486 | 65 | 95 | 83 |
| 3800 | 0.3897 | 0.3823 | 13% | 620 | 82.8% | 4852 | 4.3% | 486 | 64 | 97 | 98 |
| 3800 | 0.3897 | 0.3823 | 12% | 626 | 84.8% | 4884 | 3.6% | 486 | 63 | 93 | 87 |
| 3800 | 0.3897 | 0.3823 | 11% | 631 | 86.3% | 4914 | 2.9% | 486 | 62 | 90 | 75 |
| 3800 | 0.3897 | 0.3823 | 10% | 635 | 87.5% | 4943 | 2.4% | 486 | 60 | 87 | 67 |
| 3800 | 0.3897 | 0.3823 | 9% | 640 | 88.7% | 4972 | 1.8% | 486 | 57 | 84 | 60 |
| 3800 | 0.3897 | 0.3823 | 16% | 611 | 77.7% | 5001 | 5.9% | 491 | 68 | 91 | 65 |
| 3800 | 0.3897 | 0.3823 | 14% | 616 | 80.3% | 4988 | 5.3% | 491 | 67 | 95 | 85 |
| 3800 | 0.3897 | 0.3823 | 13% | 620 | 82.2% | 4989 | 4.7% | 491 | 66 | 97 | 100 |
| 3800 | 0.3897 | 0.3823 | 12% | 626 | 84.6% | 5005 | 3.7% | 491 | 65 | 93 | 86 |
| 3800 | 0.3897 | 0.3823 | 11% | 631 | 86.5% | 5019 | 2.8% | 491 | 63 | 89 | 75 |
| 3800 | 0.3897 | 0.3823 | 10% | 635 | 87.8% | 5030 | 2.2% | 491 | 61 | 86 | 68 |
| 3800 | 0.3897 | 0.3823 | 9% | 640 | 89.0% | 5041 | 1.6% | 491 | 58 | 83 | 61 |
| 3800 | 0.3897 | 0.3823 | 17% | 611 | 76.2% | 5120 | 6.9% | 496 | 68 | 92 | 66 |
| 3800 | 0.3897 | 0.3823 | 15% | 616 | 79.6% | 5093 | 5.8% | 496 | 67 | 95 | 86 |
| 3800 | 0.3897 | 0.3823 | 13% | 620 | 81.8% | 5080 | 5.0% | 496 | 67 | 96 | 99 |
| 3800 | 0.3897 | 0.3823 | 12% | 626 | 84.6% | 5075 | 3.7% | 496 | 65 | 92 | 86 |
| 3800 | 0.3897 | 0.3823 | 11% | 631 | 86.7% | 5074 | 2.7% | 496 | 64 | 88 | 75 |
| 3800 | 0.3897 | 0.3823 | 10% | 635 | 88.1% | 5073 | 2.0% | 496 | 62 | 86 | 69 |
| 3800 | 0.3897 | 0.3823 | 9% | 640 | 89.4% | 5074 | 1.4% | 496 | 59 | 83 | 62 |
| 3800 | 0.3897 | 0.3823 | 17% | 611 | 74.6% | 5253 | 8.0% | 502 | 70 | 93 | 68 |
| 3800 | 0.3897 | 0.3823 | 15% | 616 | 78.4% | 5195 | 6.7% | 502 | 68 | 95 | 88 |
| 3800 | 0.3897 | 0.3823 | 13% | 620 | 81.4% | 5161 | 5.4% | 502 | 67 | 94 | 97 |
| 3800 | 0.3897 | 0.3823 | 12% | 626 | 84.7% | 5131 | 3.7% | 502 | 66 | 91 | 86 |
| 3800 | 0.3897 | 0.3823 | 10% | 631 | 87.1% | 5112 | 2.5% | 502 | 64 | 87 | 76 |
| 3800 | 0.3897 | 0.3823 | 10% | 635 | 88.6% | 5101 | 1.8% | 502 | 62 | 85 | 70 |
| 3800 | 0.3897 | 0.3823 | 9% | 640 | 89.9% | 5092 | 1.0% | 502 | 59 | 83 | 64 |
| 3800 | 0.3897 | 0.3823 | 18% | 611 | 72.7% | 5376 | 9.4% | 508 | 71 | 92 | 69 |
| 3800 | 0.3897 | 0.3823 | 15% | 616 | 77.1% | 5283 | 7.6% | 508 | 69 | 94 | 89 |
| 3800 | 0.3897 | 0.3823 | 13% | 620 | 81.0% | 5218 | 5.7% | 508 | 68 | 93 | 96 |
| 3800 | 0.3897 | 0.3823 | 11% | 626 | 85.0% | 5162 | 3.6% | 508 | 67 | 90 | 86 |
| 3800 | 0.3897 | 0.3823 | 10% | 631 | 87.5% | 5130 | 2.3% | 508 | 65 | 87 | 77 |
| 3800 | 0.3897 | 0.3823 | 10% | 635 | 89.0% | 5112 | 1.4% | 508 | 63 | 85 | 71 |
| 3800 | 0.3897 | 0.3823 | 9% | 640 | 90.4% | 5096 | 0.7% | 508 | 60 | 83 | 65 |
| 3800 | 0.3897 | 0.3823 | 18% | 611 | 71.2% | 5471 | 10.5% | 514 | 72 | 92 | 70 |
| 3800 | 0.3897 | 0.3823 | 15% | 616 | 75.9% | 5349 | 8.6% | 514 | 70 | 93 | 90 |
| 3800 | 0.3897 | 0.3823 | 13% | 620 | 80.8% | 5251 | 6.0% | 514 | 69 | 92 | 95 |
| 3800 | 0.3897 | 0.3823 | 11% | 626 | 85.3% | 5175 | 3.4% | 514 | 67 | 89 | 87 |
| 3800 | 0.3897 | 0.3823 | 10% | 631 | 87.8% | 5136 | 2.1% | 514 | 65 | 86 | 78 |
| 3800 | 0.3897 | 0.3823 | 9% | 635 | 89.4% | 5114 | 1.2% | 514 | 63 | 84 | 72 |
| 3800 | 0.3897 | 0.3823 | 9% | 640 | 90.8% | 5094 | 0.4% | 514 | 60 | 82 | 66 |
| 3800 | 0.3897 | 0.3823 | 19% | 611 | 68.7% | 5602 | 12.5% | 521 | 73 | 91 | 71 |
| 3800 | 0.3897 | 0.3823 | 16% | 616 | 74.3% | 5428 | 9.9% | 521 | 71 | 92 | 91 |
| 3800 | 0.3897 | 0.3823 | 13% | 620 | 80.6% | 5279 | 6.3% | 521 | 70 | 91 | 95 |
| 3800 | 0.3897 | 0.3823 | 11% | 626 | 85.5% | 5184 | 3.4% | 521 | 68 | 89 | 87 |
| 3800 | 0.3897 | 0.3823 | 10% | 631 | 88.1% | 5139 | 1.9% | 521 | 66 | 86 | 79 |
| 3800 | 0.3897 | 0.3823 | 9% | 635 | 89.8% | 5111 | 0.9% | 521 | 63 | 84 | 73 |
| 3800 | 0.3897 | 0.3823 | 9% | 640 | 91.4% | 5088 | 0.0% | 521 | 60 | 82 | 68 |
| 3800 | 0.3897 | 0.3823 | 20% | 611 | 65.6% | 5755 | 14.9% | 527 | 73 | 90 | 73 |
| 3800 | 0.3897 | 0.3823 | 16% | 616 | 72.8% | 5495 | 11.2% | 527 | 71 | 91 | 91 |
| 3800 | 0.3897 | 0.3823 | 13% | 620 | 80.4% | 5296 | 6.5% | 527 | 70 | 91 | 94 |
| 3800 | 0.3897 | 0.3823 | 11% | 626 | 85.5% | 5191 | 3.5% | 527 | 68 | 88 | 87 |
| 3800 | 0.3897 | 0.3823 | 10% | 631 | 88.4% | 5137 | 1.7% | 527 | 66 | 86 | 80 |
| 3800 | 0.3897 | 0.3823 | 9% | 635 | 90.5% | 5102 | 0.4% | 527 | 64 | 84 | 75 |
| 3800 | 0.3897 | 0.3823 | 9% | 640 | 91.4% | 5088 | 0.0% | 527 | 60 | 82 | 68 |
| 3800 | 0.3897 | 0.3823 | 21% | 611 | 60.2% | 6062 | 19.1% | 534 | 74 | 89 | 75 |
| 3800 | 0.3897 | 0.3823 | 16% | 616 | 70.6% | 5590 | 13.1% | 534 | 72 | 90 | 92 |
| 3800 | 0.3897 | 0.3823 | 13% | 620 | 79.9% | 5317 | 7.1% | 534 | 70 | 90 | 94 |
| 3800 | 0.3897 | 0.3823 | 11% | 626 | 85.5% | 5194 | 3.5% | 534 | 68 | 88 | 88 |
| 3800 | 0.3897 | 0.3823 | 10% | 631 | 89.7% | 5118 | 0.8% | 534 | 66 | 86 | 82 |
| 3800 | 0.3897 | 0.3823 | 9% | 635 | 91.1% | 5093 | 0.0% | 534 | 64 | 84 | 76 |
| 3800 | 0.3897 | 0.3823 | 9% | 640 | 91.4% | 5088 | 0.0% | 534 | 60 | 82 | 68 |
| 3800 | 0.3897 | 0.3823 | 22% | 611 | 52.8% | 6669 | 25.2% | 540 | 76 | 88 | 76 |
| 3800 | 0.3897 | 0.3823 | 16% | 616 | 68.3% | 5695 | 15.3% | 540 | 73 | 89 | 91 |
| 3800 | 0.3897 | 0.3823 | 13% | 620 | 78.7% | 5354 | 8.2% | 540 | 71 | 89 | 93 |
| 3800 | 0.3897 | 0.3823 | 11% | 626 | 86.6% | 5176 | 2.8% | 540 | 69 | 87 | 90 |

TABLE 2-continued

| | | | | | | | | | | | |
|---|---|---|---|---|---|---|---|---|---|---|---|
| 3800 | 0.3897 | 0.3823 | 9% | 631 | 90.8% | 5099 | 0.0% | 540 | 66 | 86 | 84 |
| 3800 | 0.3897 | 0.3823 | 9% | 635 | 91.1% | 5093 | 0.0% | 540 | 64 | 84 | 76 |
| 3800 | 0.3897 | 0.3823 | 9% | 640 | 91.4% | 5088 | 0.0% | 540 | 60 | 82 | 68 |
| 3700 | 0.3946 | 0.3851 | 14% | 611 | 82.7% | 4131 | 2.9% | 467 | 54 | 85 | 59 |
| 3700 | 0.3946 | 0.3851 | 13% | 616 | 84.2% | 4131 | 2.8% | 467 | 53 | 90 | 78 |
| 3700 | 0.3946 | 0.3851 | 12% | 620 | 85.1% | 4131 | 2.8% | 467 | 52 | 93 | 93 |
| 3700 | 0.3946 | 0.3851 | 11% | 626 | 85.9% | 4131 | 2.8% | 467 | 51 | 93 | 91 |
| 3700 | 0.3946 | 0.3851 | 11% | 631 | 86.5% | 4131 | 2.8% | 467 | 49 | 90 | 77 |
| 3700 | 0.3946 | 0.3851 | 10% | 635 | 86.9% | 4131 | 2.8% | 467 | 47 | 87 | 68 |
| 3700 | 0.3946 | 0.3851 | 10% | 640 | 87.2% | 4131 | 2.8% | 467 | 45 | 84 | 58 |
| 3700 | 0.3946 | 0.3851 | 16% | 611 | 80.4% | 4131 | 4.1% | 471 | 53 | 88 | 60 |
| 3700 | 0.3946 | 0.3851 | 14% | 616 | 81.9% | 4131 | 4.1% | 471 | 52 | 93 | 80 |
| 3700 | 0.3946 | 0.3851 | 13% | 620 | 82.9% | 4135 | 4.1% | 471 | 52 | 96 | 95 |
| 3700 | 0.3946 | 0.3851 | 12% | 626 | 84.3% | 4194 | 3.7% | 471 | 52 | 94 | 87 |
| 3700 | 0.3946 | 0.3851 | 11% | 631 | 85.2% | 4230 | 3.5% | 471 | 52 | 90 | 73 |
| 3700 | 0.3946 | 0.3851 | 11% | 635 | 85.9% | 4269 | 3.3% | 471 | 51 | 87 | 64 |
| 3700 | 0.3946 | 0.3851 | 10% | 640 | 86.9% | 4351 | 2.9% | 471 | 50 | 84 | 55 |
| 3700 | 0.3946 | 0.3851 | 16% | 611 | 79.5% | 4376 | 4.4% | 476 | 60 | 89 | 61 |
| 3700 | 0.3946 | 0.3851 | 14% | 616 | 81.6% | 4416 | 4.1% | 476 | 60 | 94 | 81 |
| 3700 | 0.3946 | 0.3851 | 13% | 620 | 83.1% | 4459 | 3.7% | 476 | 60 | 97 | 96 |
| 3700 | 0.3946 | 0.3851 | 12% | 626 | 84.6% | 4506 | 3.4% | 476 | 59 | 94 | 87 |
| 3700 | 0.3946 | 0.3851 | 11% | 631 | 85.6% | 4535 | 3.1% | 476 | 58 | 90 | 73 |
| 3700 | 0.3946 | 0.3851 | 11% | 635 | 86.4% | 4576 | 2.8% | 476 | 56 | 87 | 64 |
| 3700 | 0.3946 | 0.3851 | 10% | 640 | 87.6% | 4654 | 2.3% | 476 | 54 | 84 | 56 |
| 3700 | 0.3946 | 0.3851 | 16% | 611 | 79.3% | 4596 | 4.5% | 480 | 64 | 89 | 61 |
| 3700 | 0.3946 | 0.3851 | 14% | 616 | 81.5% | 4619 | 4.1% | 480 | 63 | 94 | 82 |
| 3700 | 0.3946 | 0.3851 | 13% | 620 | 83.0% | 4645 | 3.8% | 480 | 63 | 97 | 97 |
| 3700 | 0.3946 | 0.3851 | 12% | 626 | 84.6% | 4686 | 3.3% | 480 | 62 | 94 | 86 |
| 3700 | 0.3946 | 0.3851 | 11% | 631 | 85.7% | 4712 | 3.0% | 480 | 60 | 90 | 73 |
| 3700 | 0.3946 | 0.3851 | 11% | 635 | 86.9% | 4759 | 2.5% | 480 | 58 | 87 | 64 |
| 3700 | 0.3946 | 0.3851 | 10% | 640 | 88.1% | 4821 | 1.9% | 480 | 56 | 83 | 57 |
| 3700 | 0.3946 | 0.3851 | 17% | 611 | 78.6% | 4794 | 4.9% | 486 | 67 | 90 | 62 |
| 3700 | 0.3946 | 0.3851 | 15% | 616 | 80.8% | 4793 | 4.5% | 486 | 65 | 94 | 83 |
| 3700 | 0.3946 | 0.3851 | 13% | 620 | 82.6% | 4813 | 4.0% | 486 | 65 | 97 | 99 |
| 3700 | 0.3946 | 0.3851 | 12% | 626 | 84.5% | 4842 | 3.3% | 486 | 63 | 93 | 85 |
| 3700 | 0.3946 | 0.3851 | 11% | 631 | 86.1% | 4872 | 2.7% | 486 | 62 | 89 | 73 |
| 3700 | 0.3946 | 0.3851 | 10% | 635 | 87.4% | 4905 | 2.1% | 486 | 60 | 86 | 66 |
| 3700 | 0.3946 | 0.3851 | 10% | 640 | 88.7% | 4937 | 1.5% | 486 | 57 | 83 | 58 |
| 3700 | 0.3946 | 0.3851 | 17% | 611 | 77.3% | 4947 | 5.7% | 491 | 68 | 91 | 64 |
| 3700 | 0.3946 | 0.3851 | 15% | 616 | 80.0% | 4936 | 5.0% | 491 | 67 | 95 | 85 |
| 3700 | 0.3946 | 0.3851 | 14% | 620 | 82.1% | 4939 | 4.4% | 491 | 66 | 96 | 99 |
| 3700 | 0.3946 | 0.3851 | 12% | 626 | 84.5% | 4955 | 3.4% | 491 | 65 | 92 | 85 |
| 3700 | 0.3946 | 0.3851 | 11% | 631 | 86.5% | 4971 | 2.5% | 491 | 63 | 88 | 74 |
| 3700 | 0.3946 | 0.3851 | 10% | 635 | 87.9% | 4984 | 1.8% | 491 | 61 | 85 | 67 |
| 3700 | 0.3946 | 0.3851 | 10% | 640 | 89.1% | 4996 | 1.2% | 491 | 58 | 83 | 60 |
| 3700 | 0.3946 | 0.3851 | 18% | 611 | 75.9% | 5057 | 6.6% | 496 | 69 | 92 | 65 |
| 3700 | 0.3946 | 0.3851 | 15% | 616 | 79.4% | 5033 | 5.5% | 496 | 68 | 95 | 86 |
| 3700 | 0.3946 | 0.3851 | 14% | 620 | 81.7% | 5022 | 4.6% | 496 | 67 | 95 | 98 |
| 3700 | 0.3946 | 0.3851 | 12% | 626 | 84.6% | 5019 | 3.3% | 496 | 65 | 91 | 85 |
| 3700 | 0.3946 | 0.3851 | 11% | 631 | 86.8% | 5019 | 2.3% | 496 | 64 | 88 | 74 |
| 3700 | 0.3946 | 0.3851 | 10% | 635 | 88.2% | 5020 | 1.6% | 496 | 62 | 85 | 67 |
| 3700 | 0.3946 | 0.3851 | 10% | 640 | 89.6% | 5021 | 0.9% | 496 | 59 | 82 | 61 |
| 3700 | 0.3946 | 0.3851 | 18% | 611 | 74.4% | 5180 | 7.7% | 502 | 70 | 92 | 67 |
| 3700 | 0.3946 | 0.3851 | 15% | 616 | 78.3% | 5126 | 6.3% | 502 | 69 | 94 | 87 |
| 3700 | 0.3946 | 0.3851 | 14% | 620 | 81.3% | 5095 | 5.0% | 502 | 68 | 94 | 97 |
| 3700 | 0.3946 | 0.3851 | 12% | 626 | 84.8% | 5068 | 3.3% | 502 | 66 | 90 | 85 |
| 3700 | 0.3946 | 0.3851 | 11% | 631 | 87.2% | 5050 | 2.1% | 502 | 64 | 87 | 75 |
| 3700 | 0.3946 | 0.3851 | 10% | 635 | 88.8% | 5041 | 1.2% | 502 | 62 | 85 | 69 |
| 3700 | 0.3946 | 0.3851 | 9% | 640 | 90.2% | 5032 | 0.5% | 502 | 59 | 82 | 63 |
| 3700 | 0.3946 | 0.3851 | 18% | 611 | 72.6% | 5291 | 9.0% | 508 | 71 | 92 | 68 |
| 3700 | 0.3946 | 0.3851 | 16% | 616 | 77.2% | 5204 | 7.2% | 508 | 69 | 94 | 88 |
| 3700 | 0.3946 | 0.3851 | 14% | 620 | 81.1% | 5145 | 5.3% | 508 | 68 | 93 | 96 |
| 3700 | 0.3946 | 0.3851 | 12% | 626 | 85.1% | 5093 | 3.1% | 508 | 67 | 90 | 86 |
| 3700 | 0.3946 | 0.3851 | 11% | 631 | 87.8% | 5063 | 1.7% | 508 | 65 | 86 | 77 |
| 3700 | 0.3946 | 0.3851 | 10% | 635 | 89.3% | 5046 | 0.9% | 508 | 63 | 84 | 70 |
| 3700 | 0.3946 | 0.3851 | 9% | 640 | 90.8% | 5031 | 0.1% | 508 | 59 | 82 | 64 |
| 3700 | 0.3946 | 0.3851 | 19% | 611 | 71.2% | 5376 | 10.1% | 514 | 72 | 91 | 69 |
| 3700 | 0.3946 | 0.3851 | 16% | 616 | 76.1% | 5262 | 8.0% | 514 | 70 | 93 | 89 |
| 3700 | 0.3946 | 0.3851 | 14% | 620 | 80.9% | 5173 | 5.5% | 514 | 69 | 92 | 95 |
| 3700 | 0.3946 | 0.3851 | 12% | 626 | 85.5% | 5102 | 2.9% | 514 | 67 | 89 | 87 |
| 3700 | 0.3946 | 0.3851 | 10% | 631 | 88.2% | 5066 | 1.4% | 514 | 65 | 86 | 78 |
| 3700 | 0.3946 | 0.3851 | 10% | 635 | 89.8% | 5045 | 0.6% | 514 | 63 | 84 | 72 |
| 3700 | 0.3946 | 0.3851 | 9% | 640 | 90.9% | 5030 | 0.0% | 514 | 60 | 82 | 65 |
| 3700 | 0.3946 | 0.3851 | 19% | 611 | 68.8% | 5491 | 11.9% | 521 | 73 | 91 | 70 |
| 3700 | 0.3946 | 0.3851 | 16% | 616 | 74.5% | 5331 | 9.3% | 521 | 71 | 92 | 90 |
| 3700 | 0.3946 | 0.3851 | 14% | 620 | 80.7% | 5197 | 5.7% | 521 | 70 | 91 | 95 |
| 3700 | 0.3946 | 0.3851 | 11% | 626 | 85.8% | 5107 | 2.7% | 521 | 68 | 89 | 87 |
| 3700 | 0.3946 | 0.3851 | 10% | 631 | 88.5% | 5065 | 1.2% | 521 | 66 | 86 | 79 |
| 3700 | 0.3946 | 0.3851 | 10% | 635 | 90.3% | 5039 | 0.2% | 521 | 63 | 84 | 73 |
| 3700 | 0.3946 | 0.3851 | 9% | 640 | 90.9% | 5030 | 0.0% | 521 | 60 | 82 | 65 |

TABLE 2-continued

| | | | | | | | | | | |
|---|---|---|---|---|---|---|---|---|---|---|
| 3700 | 0.3946 | 0.3851 | 20% | 611 | 65.9% | 5624 | 14.2% | 527 | 73 | 90 | 72 |
| 3700 | 0.3946 | 0.3851 | 16% | 616 | 73.0% | 5390 | 10.6% | 527 | 71 | 91 | 91 |
| 3700 | 0.3946 | 0.3851 | 13% | 620 | 80.6% | 5210 | 5.9% | 527 | 70 | 91 | 94 |
| 3700 | 0.3946 | 0.3851 | 11% | 626 | 85.9% | 5110 | 2.7% | 527 | 68 | 88 | 88 |
| 3700 | 0.3946 | 0.3851 | 10% | 631 | 89.0% | 5060 | 0.9% | 527 | 66 | 86 | 80 |
| 3700 | 0.3946 | 0.3851 | 9% | 635 | 90.6% | 5036 | 0.0% | 527 | 63 | 84 | 74 |
| 3700 | 0.3946 | 0.3851 | 9% | 640 | 90.9% | 5030 | 0.0% | 527 | 60 | 82 | 65 |
| 3700 | 0.3946 | 0.3851 | 21% | 611 | 60.7% | 5890 | 18.3% | 534 | 74 | 89 | 73 |
| 3700 | 0.3946 | 0.3851 | 17% | 616 | 70.9% | 5472 | 12.4% | 534 | 72 | 90 | 91 |
| 3700 | 0.3946 | 0.3851 | 13% | 620 | 80.3% | 5225 | 6.3% | 534 | 70 | 90 | 94 |
| 3700 | 0.3946 | 0.3851 | 11% | 626 | 86.1% | 5110 | 2.6% | 534 | 68 | 88 | 88 |
| 3700 | 0.3946 | 0.3851 | 10% | 631 | 90.2% | 5042 | 0.0% | 534 | 66 | 86 | 82 |
| 3700 | 0.3946 | 0.3851 | 9% | 635 | 90.6% | 5036 | 0.0% | 534 | 63 | 84 | 74 |
| 3700 | 0.3946 | 0.3851 | 9% | 640 | 90.9% | 5030 | 0.0% | 534 | 60 | 82 | 65 |
| 3700 | 0.3946 | 0.3851 | 22% | 611 | 53.3% | 6411 | 24.3% | 540 | 76 | 88 | 75 |
| 3700 | 0.3946 | 0.3851 | 17% | 616 | 68.6% | 5565 | 14.5% | 540 | 73 | 89 | 91 |
| 3700 | 0.3946 | 0.3851 | 13% | 620 | 79.4% | 5252 | 7.2% | 540 | 71 | 89 | 94 |
| 3700 | 0.3946 | 0.3851 | 11% | 626 | 87.4% | 5090 | 1.7% | 540 | 68 | 88 | 90 |
| 3700 | 0.3946 | 0.3851 | 10% | 631 | 90.2% | 5042 | 0.0% | 540 | 66 | 86 | 82 |
| 3700 | 0.3946 | 0.3851 | 9% | 635 | 90.6% | 5036 | 0.0% | 540 | 63 | 84 | 74 |
| 3700 | 0.3946 | 0.3851 | 9% | 640 | 90.9% | 5030 | 0.0% | 540 | 60 | 82 | 65 |
| 3600 | 0.3999 | 0.3879 | 15% | 611 | 82.1% | 4131 | 2.7% | 467 | 54 | 85 | 58 |
| 3600 | 0.3999 | 0.3879 | 14% | 616 | 83.7% | 4131 | 2.7% | 467 | 53 | 90 | 78 |
| 3600 | 0.3999 | 0.3879 | 13% | 620 | 84.6% | 4131 | 2.7% | 467 | 52 | 94 | 94 |
| 3600 | 0.3999 | 0.3879 | 12% | 626 | 85.5% | 4131 | 2.7% | 467 | 51 | 92 | 89 |
| 3600 | 0.3999 | 0.3879 | 11% | 631 | 86.1% | 4131 | 2.7% | 467 | 49 | 89 | 75 |
| 3600 | 0.3999 | 0.3879 | 11% | 635 | 86.5% | 4131 | 2.7% | 467 | 48 | 86 | 65 |
| 3600 | 0.3999 | 0.3879 | 10% | 640 | 86.9% | 4131 | 2.7% | 467 | 45 | 83 | 55 |
| 3600 | 0.3999 | 0.3879 | 16% | 611 | 79.9% | 4131 | 3.9% | 471 | 54 | 88 | 59 |
| 3600 | 0.3999 | 0.3879 | 15% | 616 | 81.5% | 4131 | 3.9% | 471 | 53 | 93 | 80 |
| 3600 | 0.3999 | 0.3879 | 14% | 620 | 82.7% | 4144 | 3.8% | 471 | 52 | 96 | 96 |
| 3600 | 0.3999 | 0.3879 | 13% | 626 | 84.0% | 4204 | 3.5% | 471 | 53 | 94 | 86 |
| 3600 | 0.3999 | 0.3879 | 12% | 631 | 84.9% | 4231 | 3.3% | 471 | 52 | 89 | 71 |
| 3600 | 0.3999 | 0.3879 | 11% | 635 | 85.6% | 4264 | 3.1% | 471 | 51 | 86 | 61 |
| 3600 | 0.3999 | 0.3879 | 11% | 640 | 86.5% | 4337 | 2.7% | 471 | 50 | 83 | 52 |
| 3600 | 0.3999 | 0.3879 | 17% | 611 | 79.0% | 4358 | 4.2% | 476 | 61 | 89 | 60 |
| 3600 | 0.3999 | 0.3879 | 15% | 616 | 81.3% | 4403 | 3.8% | 476 | 60 | 94 | 81 |
| 3600 | 0.3999 | 0.3879 | 14% | 620 | 82.8% | 4446 | 3.5% | 476 | 60 | 97 | 97 |
| 3600 | 0.3999 | 0.3879 | 13% | 626 | 84.3% | 4495 | 3.1% | 476 | 59 | 93 | 85 |
| 3600 | 0.3999 | 0.3879 | 12% | 631 | 85.3% | 4516 | 2.9% | 476 | 58 | 89 | 71 |
| 3600 | 0.3999 | 0.3879 | 11% | 635 | 86.1% | 4551 | 2.7% | 476 | 56 | 86 | 61 |
| 3600 | 0.3999 | 0.3879 | 11% | 640 | 87.3% | 4630 | 2.1% | 476 | 54 | 83 | 53 |
| 3600 | 0.3999 | 0.3879 | 17% | 611 | 78.8% | 4567 | 4.3% | 480 | 64 | 89 | 61 |
| 3600 | 0.3999 | 0.3879 | 15% | 616 | 81.1% | 4591 | 3.9% | 480 | 64 | 95 | 82 |
| 3600 | 0.3999 | 0.3879 | 14% | 620 | 82.8% | 4622 | 3.5% | 480 | 63 | 97 | 98 |
| 3600 | 0.3999 | 0.3879 | 13% | 626 | 84.3% | 4659 | 3.1% | 480 | 62 | 93 | 85 |
| 3600 | 0.3999 | 0.3879 | 12% | 631 | 85.4% | 4680 | 2.8% | 480 | 60 | 89 | 71 |
| 3600 | 0.3999 | 0.3879 | 11% | 635 | 86.6% | 4726 | 2.3% | 480 | 58 | 86 | 62 |
| 3600 | 0.3999 | 0.3879 | 10% | 640 | 87.9% | 4793 | 1.6% | 480 | 56 | 82 | 54 |
| 3600 | 0.3999 | 0.3879 | 17% | 611 | 78.1% | 4752 | 4.6% | 486 | 67 | 90 | 62 |
| 3600 | 0.3999 | 0.3879 | 15% | 616 | 80.4% | 4751 | 4.3% | 486 | 65 | 95 | 83 |
| 3600 | 0.3999 | 0.3879 | 14% | 620 | 82.4% | 4774 | 3.7% | 486 | 65 | 97 | 99 |
| 3600 | 0.3999 | 0.3879 | 13% | 626 | 84.3% | 4802 | 3.1% | 486 | 63 | 92 | 84 |
| 3600 | 0.3999 | 0.3879 | 12% | 631 | 85.9% | 4832 | 2.5% | 486 | 62 | 88 | 71 |
| 3600 | 0.3999 | 0.3879 | 11% | 635 | 87.3% | 4868 | 1.8% | 486 | 60 | 85 | 64 |
| 3600 | 0.3999 | 0.3879 | 10% | 640 | 88.7% | 4903 | 1.1% | 486 | 57 | 82 | 56 |
| 3600 | 0.3999 | 0.3879 | 18% | 611 | 76.9% | 4894 | 5.4% | 491 | 68 | 91 | 63 |
| 3600 | 0.3999 | 0.3879 | 15% | 616 | 79.8% | 4886 | 4.7% | 491 | 67 | 95 | 85 |
| 3600 | 0.3999 | 0.3879 | 14% | 620 | 81.9% | 4891 | 4.0% | 491 | 66 | 96 | 99 |
| 3600 | 0.3999 | 0.3879 | 13% | 626 | 84.4% | 4906 | 3.1% | 491 | 65 | 92 | 84 |
| 3600 | 0.3999 | 0.3879 | 11% | 631 | 86.5% | 4924 | 2.1% | 491 | 63 | 87 | 73 |
| 3600 | 0.3999 | 0.3879 | 11% | 635 | 87.9% | 4938 | 1.4% | 491 | 61 | 85 | 65 |
| 3600 | 0.3999 | 0.3879 | 10% | 640 | 89.2% | 4952 | 0.7% | 491 | 58 | 82 | 58 |
| 3600 | 0.3999 | 0.3879 | 18% | 611 | 75.6% | 4997 | 6.3% | 496 | 69 | 92 | 64 |
| 3600 | 0.3999 | 0.3879 | 16% | 616 | 79.2% | 4975 | 5.1% | 496 | 68 | 95 | 85 |
| 3600 | 0.3999 | 0.3879 | 14% | 620 | 81.6% | 4965 | 4.3% | 496 | 67 | 95 | 98 |
| 3600 | 0.3999 | 0.3879 | 12% | 626 | 84.6% | 4964 | 2.9% | 496 | 65 | 91 | 84 |
| 3600 | 0.3999 | 0.3879 | 11% | 631 | 86.9% | 4965 | 1.9% | 496 | 64 | 87 | 73 |
| 3600 | 0.3999 | 0.3879 | 11% | 635 | 88.3% | 4967 | 1.1% | 496 | 62 | 84 | 66 |
| 3600 | 0.3999 | 0.3879 | 10% | 640 | 89.7% | 4969 | 0.4% | 496 | 58 | 82 | 59 |
| 3600 | 0.3999 | 0.3879 | 19% | 611 | 74.1% | 5109 | 7.3% | 502 | 70 | 92 | 65 |
| 3600 | 0.3999 | 0.3879 | 16% | 616 | 78.3% | 5058 | 5.9% | 502 | 69 | 94 | 87 |
| 3600 | 0.3999 | 0.3879 | 14% | 620 | 81.3% | 5030 | 4.6% | 502 | 68 | 94 | 97 |
| 3600 | 0.3999 | 0.3879 | 12% | 626 | 84.9% | 5006 | 2.8% | 502 | 66 | 90 | 85 |
| 3600 | 0.3999 | 0.3879 | 11% | 631 | 87.3% | 4990 | 1.5% | 502 | 64 | 86 | 75 |
| 3600 | 0.3999 | 0.3879 | 10% | 635 | 89.0% | 4981 | 0.7% | 502 | 62 | 84 | 68 |
| 3600 | 0.3999 | 0.3879 | 10% | 640 | 90.3% | 4974 | 0.0% | 502 | 59 | 82 | 61 |
| 3600 | 0.3999 | 0.3879 | 19% | 611 | 72.4% | 5210 | 8.6% | 508 | 71 | 92 | 67 |
| 3600 | 0.3999 | 0.3879 | 16% | 616 | 77.2% | 5127 | 6.7% | 508 | 70 | 94 | 88 |
| 3600 | 0.3999 | 0.3879 | 14% | 620 | 81.1% | 5074 | 4.8% | 508 | 68 | 93 | 96 |

TABLE 2-continued

| | | | | | | | | | | | |
|---|---|---|---|---|---|---|---|---|---|---|---|
| 3600 | 0.3999 | 0.3879 | 12% | 626 | 85.3% | 5026 | 2.6% | 508 | 67 | 89 | 85 |
| 3600 | 0.3999 | 0.3879 | 11% | 631 | 88.0% | 4998 | 1.1% | 508 | 65 | 86 | 76 |
| 3600 | 0.3999 | 0.3879 | 10% | 635 | 89.6% | 4982 | 0.2% | 508 | 63 | 84 | 70 |
| 3600 | 0.3999 | 0.3879 | 10% | 640 | 90.3% | 4974 | 0.0% | 508 | 59 | 82 | 61 |
| 3600 | 0.3999 | 0.3879 | 19% | 611 | 71.1% | 5285 | 9.6% | 514 | 72 | 91 | 68 |
| 3600 | 0.3999 | 0.3879 | 16% | 616 | 76.2% | 5178 | 7.5% | 514 | 70 | 93 | 89 |
| 3600 | 0.3999 | 0.3879 | 14% | 620 | 81.0% | 5098 | 5.0% | 514 | 69 | 92 | 95 |
| 3600 | 0.3999 | 0.3879 | 12% | 626 | 85.8% | 5032 | 2.3% | 514 | 67 | 89 | 86 |
| 3600 | 0.3999 | 0.3879 | 11% | 631 | 88.5% | 4997 | 0.8% | 514 | 65 | 86 | 77 |
| 3600 | 0.3999 | 0.3879 | 10% | 635 | 90.0% | 4979 | 0.0% | 514 | 63 | 84 | 71 |
| 3600 | 0.3999 | 0.3879 | 10% | 640 | 90.3% | 4974 | 0.0% | 514 | 59 | 82 | 61 |
| 3600 | 0.3999 | 0.3879 | 20% | 611 | 68.9% | 5385 | 11.3% | 521 | 73 | 91 | 69 |
| 3600 | 0.3999 | 0.3879 | 17% | 616 | 74.7% | 5238 | 8.7% | 521 | 71 | 92 | 90 |
| 3600 | 0.3999 | 0.3879 | 14% | 620 | 80.9% | 5118 | 5.2% | 521 | 69 | 91 | 95 |
| 3600 | 0.3999 | 0.3879 | 12% | 626 | 86.2% | 5033 | 2.0% | 521 | 68 | 89 | 87 |
| 3600 | 0.3999 | 0.3879 | 11% | 631 | 89.0% | 4993 | 0.4% | 521 | 65 | 86 | 78 |
| 3600 | 0.3999 | 0.3879 | 10% | 635 | 90.0% | 4979 | 0.0% | 521 | 63 | 84 | 71 |
| 3600 | 0.3999 | 0.3879 | 10% | 640 | 90.3% | 4974 | 0.0% | 521 | 59 | 82 | 61 |
| 3600 | 0.3999 | 0.3879 | 20% | 611 | 66.1% | 5499 | 13.4% | 527 | 74 | 90 | 70 |
| 3600 | 0.3999 | 0.3879 | 17% | 616 | 73.3% | 5290 | 9.9% | 527 | 71 | 91 | 90 |
| 3600 | 0.3999 | 0.3879 | 14% | 620 | 80.8% | 5128 | 5.3% | 527 | 70 | 91 | 95 |
| 3600 | 0.3999 | 0.3879 | 12% | 626 | 86.4% | 5033 | 1.9% | 527 | 68 | 88 | 88 |
| 3600 | 0.3999 | 0.3879 | 10% | 631 | 89.5% | 4987 | 0.1% | 527 | 65 | 86 | 80 |
| 3600 | 0.3999 | 0.3879 | 10% | 635 | 90.0% | 4979 | 0.0% | 527 | 63 | 84 | 71 |
| 3600 | 0.3999 | 0.3879 | 10% | 640 | 90.3% | 4974 | 0.0% | 527 | 59 | 82 | 61 |
| 3600 | 0.3999 | 0.3879 | 21% | 611 | 61.1% | 5728 | 17.4% | 534 | 75 | 89 | 72 |
| 3600 | 0.3999 | 0.3879 | 17% | 616 | 71.3% | 5361 | 11.6% | 534 | 72 | 91 | 91 |
| 3600 | 0.3999 | 0.3879 | 14% | 620 | 80.7% | 5137 | 5.5% | 534 | 70 | 90 | 94 |
| 3600 | 0.3999 | 0.3879 | 12% | 626 | 86.8% | 5030 | 1.7% | 534 | 68 | 88 | 88 |
| 3600 | 0.3999 | 0.3879 | 10% | 631 | 89.6% | 4985 | 0.0% | 534 | 65 | 86 | 80 |
| 3600 | 0.3999 | 0.3879 | 10% | 635 | 90.0% | 4979 | 0.0% | 534 | 63 | 84 | 71 |
| 3600 | 0.3999 | 0.3879 | 10% | 640 | 90.3% | 4974 | 0.0% | 534 | 59 | 82 | 61 |
| 3600 | 0.3999 | 0.3879 | 23% | 611 | 53.9% | 6176 | 23.3% | 540 | 76 | 88 | 74 |
| 3600 | 0.3999 | 0.3879 | 17% | 616 | 69.1% | 5441 | 13.7% | 540 | 73 | 89 | 90 |
| 3600 | 0.3999 | 0.3879 | 14% | 620 | 80.1% | 5155 | 6.2% | 540 | 71 | 89 | 94 |
| 3600 | 0.3999 | 0.3879 | 11% | 626 | 88.2% | 5008 | 0.6% | 540 | 68 | 88 | 90 |
| 3600 | 0.3999 | 0.3879 | 10% | 631 | 89.6% | 4985 | 0.0% | 540 | 65 | 86 | 80 |
| 3600 | 0.3999 | 0.3879 | 10% | 635 | 90.0% | 4979 | 0.0% | 540 | 63 | 84 | 71 |
| 3600 | 0.3999 | 0.3879 | 10% | 640 | 90.3% | 4974 | 0.0% | 540 | 59 | 82 | 61 |
| 3500 | 0.4053 | 0.3907 | 16% | 611 | 81.5% | 4131 | 2.6% | 467 | 55 | 85 | 58 |
| 3500 | 0.4053 | 0.3907 | 14% | 616 | 83.1% | 4131 | 2.5% | 467 | 54 | 91 | 79 |
| 3500 | 0.4053 | 0.3907 | 13% | 620 | 84.1% | 4131 | 2.5% | 467 | 53 | 94 | 95 |
| 3500 | 0.4053 | 0.3907 | 12% | 626 | 85.0% | 4131 | 2.5% | 467 | 51 | 92 | 88 |
| 3500 | 0.4053 | 0.3907 | 12% | 631 | 85.7% | 4131 | 2.5% | 467 | 49 | 88 | 73 |
| 3500 | 0.4053 | 0.3907 | 11% | 635 | 86.1% | 4131 | 2.5% | 467 | 48 | 85 | 62 |
| 3500 | 0.4053 | 0.3907 | 11% | 640 | 86.5% | 4131 | 2.5% | 467 | 45 | 82 | 51 |
| 3500 | 0.4053 | 0.3907 | 17% | 611 | 79.4% | 4131 | 3.7% | 471 | 54 | 88 | 59 |
| 3500 | 0.4053 | 0.3907 | 15% | 616 | 81.1% | 4131 | 3.6% | 471 | 53 | 94 | 80 |
| 3500 | 0.4053 | 0.3907 | 14% | 620 | 82.3% | 4151 | 3.5% | 471 | 53 | 97 | 97 |
| 3500 | 0.4053 | 0.3907 | 13% | 626 | 83.8% | 4213 | 3.2% | 471 | 54 | 93 | 85 |
| 3500 | 0.4053 | 0.3907 | 12% | 631 | 84.6% | 4236 | 3.1% | 471 | 52 | 89 | 69 |
| 3500 | 0.4053 | 0.3907 | 12% | 635 | 85.3% | 4265 | 2.9% | 471 | 51 | 85 | 59 |
| 3500 | 0.4053 | 0.3907 | 11% | 640 | 86.2% | 4327 | 2.6% | 471 | 49 | 82 | 49 |
| 3500 | 0.4053 | 0.3907 | 17% | 611 | 78.5% | 4342 | 4.0% | 476 | 61 | 89 | 59 |
| 3500 | 0.4053 | 0.3907 | 15% | 616 | 80.9% | 4390 | 3.6% | 476 | 61 | 94 | 81 |
| 3500 | 0.4053 | 0.3907 | 14% | 620 | 82.6% | 4441 | 3.2% | 476 | 61 | 97 | 98 |
| 3500 | 0.4053 | 0.3907 | 13% | 626 | 84.0% | 4483 | 2.9% | 476 | 60 | 93 | 84 |
| 3500 | 0.4053 | 0.3907 | 12% | 631 | 84.9% | 4499 | 2.7% | 476 | 57 | 88 | 69 |
| 3500 | 0.4053 | 0.3907 | 12% | 635 | 85.7% | 4530 | 2.5% | 476 | 56 | 85 | 59 |
| 3500 | 0.4053 | 0.3907 | 11% | 640 | 86.9% | 4605 | 2.0% | 476 | 53 | 82 | 50 |
| 3500 | 0.4053 | 0.3907 | 18% | 611 | 78.3% | 4538 | 4.1% | 480 | 65 | 89 | 60 |
| 3500 | 0.4053 | 0.3907 | 16% | 616 | 80.7% | 4564 | 3.7% | 480 | 64 | 95 | 82 |
| 3500 | 0.4053 | 0.3907 | 14% | 620 | 82.5% | 4600 | 3.2% | 480 | 63 | 97 | 98 |
| 3500 | 0.4053 | 0.3907 | 13% | 626 | 84.0% | 4632 | 2.8% | 480 | 62 | 92 | 84 |
| 3500 | 0.4053 | 0.3907 | 12% | 631 | 85.1% | 4650 | 2.6% | 480 | 60 | 88 | 69 |
| 3500 | 0.4053 | 0.3907 | 12% | 635 | 86.2% | 4694 | 2.1% | 480 | 58 | 85 | 60 |
| 3500 | 0.4053 | 0.3907 | 11% | 640 | 87.7% | 4766 | 1.4% | 480 | 55 | 81 | 52 |
| 3500 | 0.4053 | 0.3907 | 18% | 611 | 77.7% | 4711 | 4.4% | 486 | 67 | 90 | 61 |
| 3500 | 0.4053 | 0.3907 | 16% | 616 | 80.2% | 4716 | 4.0% | 486 | 66 | 95 | 83 |
| 3500 | 0.4053 | 0.3907 | 14% | 620 | 82.1% | 4737 | 3.4% | 486 | 65 | 97 | 99 |
| 3500 | 0.4053 | 0.3907 | 13% | 626 | 84.0% | 4763 | 2.8% | 486 | 63 | 92 | 83 |
| 3500 | 0.4053 | 0.3907 | 12% | 631 | 85.6% | 4792 | 2.2% | 486 | 61 | 87 | 70 |
| 3500 | 0.4053 | 0.3907 | 11% | 635 | 87.2% | 4832 | 1.5% | 486 | 60 | 84 | 62 |
| 3500 | 0.4053 | 0.3907 | 11% | 640 | 88.6% | 4870 | 0.8% | 486 | 57 | 81 | 54 |
| 3500 | 0.4053 | 0.3907 | 18% | 611 | 76.5% | 4842 | 5.2% | 491 | 68 | 91 | 62 |
| 3500 | 0.4053 | 0.3907 | 16% | 616 | 79.6% | 4838 | 4.4% | 491 | 67 | 95 | 84 |
| 3500 | 0.4053 | 0.3907 | 15% | 620 | 81.8% | 4843 | 3.7% | 491 | 66 | 96 | 99 |
| 3500 | 0.4053 | 0.3907 | 13% | 626 | 84.2% | 4858 | 2.7% | 491 | 65 | 91 | 83 |
| 3500 | 0.4053 | 0.3907 | 12% | 631 | 86.4% | 4879 | 1.7% | 491 | 63 | 87 | 71 |
| 3500 | 0.4053 | 0.3907 | 11% | 635 | 87.9% | 4894 | 1.0% | 491 | 61 | 84 | 64 |

TABLE 2-continued

| | | | | | | | | | | | |
|---|---|---|---|---|---|---|---|---|---|---|---|
| 3500 | 0.4053 | 0.3907 | 10% | 640 | 89.3% | 4909 | 0.3% | 491 | 58 | 81 | 56 |
| 3500 | 0.4053 | 0.3907 | 19% | 611 | 75.3% | 4937 | 6.0% | 496 | 69 | 92 | 63 |
| 3500 | 0.4053 | 0.3907 | 16% | 616 | 79.0% | 4918 | 4.8% | 496 | 68 | 95 | 85 |
| 3500 | 0.4053 | 0.3907 | 15% | 620 | 81.5% | 4910 | 3.9% | 496 | 67 | 95 | 98 |
| 3500 | 0.4053 | 0.3907 | 13% | 626 | 84.5% | 4910 | 2.5% | 496 | 65 | 90 | 84 |
| 3500 | 0.4053 | 0.3907 | 12% | 631 | 86.9% | 4913 | 1.4% | 496 | 64 | 86 | 72 |
| 3500 | 0.4053 | 0.3907 | 11% | 635 | 88.5% | 4916 | 0.6% | 496 | 61 | 84 | 65 |
| 3500 | 0.4053 | 0.3907 | 10% | 640 | 89.7% | 4917 | 0.0% | 496 | 58 | 81 | 57 |
| 3500 | 0.4053 | 0.3907 | 19% | 611 | 73.9% | 5040 | 6.9% | 502 | 70 | 92 | 64 |
| 3500 | 0.4053 | 0.3907 | 16% | 616 | 78.2% | 4993 | 5.4% | 502 | 69 | 94 | 86 |
| 3500 | 0.4053 | 0.3907 | 15% | 620 | 81.2% | 4967 | 4.1% | 502 | 68 | 94 | 97 |
| 3500 | 0.4053 | 0.3907 | 13% | 626 | 84.9% | 4945 | 2.3% | 502 | 66 | 90 | 84 |
| 3500 | 0.4053 | 0.3907 | 11% | 631 | 87.5% | 4931 | 1.0% | 502 | 64 | 86 | 74 |
| 3500 | 0.4053 | 0.3907 | 11% | 635 | 89.2% | 4923 | 0.1% | 502 | 62 | 83 | 67 |
| 3500 | 0.4053 | 0.3907 | 10% | 640 | 89.7% | 4917 | 0.0% | 502 | 58 | 81 | 57 |
| 3500 | 0.4053 | 0.3907 | 20% | 611 | 72.2% | 5131 | 8.1% | 508 | 71 | 92 | 66 |
| 3500 | 0.4053 | 0.3907 | 17% | 616 | 77.2% | 5053 | 6.2% | 508 | 70 | 93 | 87 |
| 3500 | 0.4053 | 0.3907 | 15% | 620 | 81.1% | 5005 | 4.3% | 508 | 68 | 93 | 96 |
| 3500 | 0.4053 | 0.3907 | 13% | 626 | 85.4% | 4961 | 2.0% | 508 | 67 | 89 | 85 |
| 3500 | 0.4053 | 0.3907 | 11% | 631 | 88.2% | 4934 | 0.5% | 508 | 65 | 86 | 75 |
| 3500 | 0.4053 | 0.3907 | 11% | 635 | 89.4% | 4923 | 0.0% | 508 | 62 | 83 | 67 |
| 3500 | 0.4053 | 0.3907 | 10% | 640 | 89.7% | 4917 | 0.0% | 508 | 58 | 81 | 57 |
| 3500 | 0.4053 | 0.3907 | 20% | 611 | 71.0% | 5198 | 9.1% | 514 | 72 | 91 | 67 |
| 3500 | 0.4053 | 0.3907 | 17% | 616 | 76.3% | 5097 | 6.9% | 514 | 70 | 93 | 88 |
| 3500 | 0.4053 | 0.3907 | 15% | 620 | 81.0% | 5026 | 4.4% | 514 | 69 | 92 | 95 |
| 3500 | 0.4053 | 0.3907 | 12% | 626 | 86.0% | 4963 | 1.6% | 514 | 67 | 89 | 86 |
| 3500 | 0.4053 | 0.3907 | 11% | 631 | 88.8% | 4930 | 0.1% | 514 | 65 | 86 | 77 |
| 3500 | 0.4053 | 0.3907 | 11% | 635 | 89.4% | 4923 | 0.0% | 514 | 62 | 83 | 67 |
| 3500 | 0.4053 | 0.3907 | 10% | 640 | 89.7% | 4917 | 0.0% | 514 | 58 | 81 | 57 |
| 3500 | 0.4053 | 0.3907 | 20% | 611 | 69.0% | 5285 | 10.7% | 521 | 73 | 91 | 68 |
| 3500 | 0.4053 | 0.3907 | 17% | 616 | 74.9% | 5149 | 8.0% | 521 | 71 | 92 | 89 |
| 3500 | 0.4053 | 0.3907 | 14% | 620 | 81.0% | 5042 | 4.6% | 521 | 69 | 91 | 95 |
| 3500 | 0.4053 | 0.3907 | 12% | 626 | 86.6% | 4961 | 1.3% | 521 | 67 | 89 | 87 |
| 3500 | 0.4053 | 0.3907 | 11% | 631 | 89.0% | 4929 | 0.0% | 521 | 65 | 86 | 77 |
| 3500 | 0.4053 | 0.3907 | 11% | 635 | 89.4% | 4923 | 0.0% | 521 | 62 | 83 | 67 |
| 3500 | 0.4053 | 0.3907 | 10% | 640 | 89.7% | 4917 | 0.0% | 521 | 58 | 81 | 57 |
| 3500 | 0.4053 | 0.3907 | 21% | 611 | 66.4% | 5382 | 12.7% | 527 | 74 | 90 | 69 |
| 3500 | 0.4053 | 0.3907 | 17% | 616 | 73.6% | 5193 | 9.1% | 527 | 71 | 91 | 89 |
| 3500 | 0.4053 | 0.3907 | 14% | 620 | 81.0% | 5049 | 4.6% | 527 | 70 | 91 | 95 |
| 3500 | 0.4053 | 0.3907 | 12% | 626 | 86.9% | 4958 | 1.1% | 527 | 68 | 88 | 88 |
| 3500 | 0.4053 | 0.3907 | 11% | 631 | 89.0% | 4929 | 0.0% | 527 | 65 | 86 | 77 |
| 3500 | 0.4053 | 0.3907 | 11% | 635 | 89.4% | 4923 | 0.0% | 527 | 62 | 83 | 67 |
| 3500 | 0.4053 | 0.3907 | 10% | 640 | 89.7% | 4917 | 0.0% | 527 | 58 | 81 | 57 |
| 3500 | 0.4053 | 0.3907 | 22% | 611 | 61.6% | 5575 | 16.5% | 534 | 75 | 89 | 71 |
| 3500 | 0.4053 | 0.3907 | 18% | 616 | 71.7% | 5254 | 10.8% | 534 | 72 | 91 | 90 |
| 3500 | 0.4053 | 0.3907 | 14% | 620 | 81.1% | 5054 | 4.7% | 534 | 70 | 90 | 94 |
| 3500 | 0.4053 | 0.3907 | 12% | 626 | 87.4% | 4952 | 0.7% | 534 | 68 | 88 | 89 |
| 3500 | 0.4053 | 0.3907 | 11% | 631 | 89.0% | 4929 | 0.0% | 534 | 65 | 86 | 77 |
| 3500 | 0.4053 | 0.3907 | 11% | 635 | 89.4% | 4923 | 0.0% | 534 | 62 | 83 | 67 |
| 3500 | 0.4053 | 0.3907 | 10% | 640 | 89.7% | 4917 | 0.0% | 534 | 58 | 81 | 57 |
| 3500 | 0.4053 | 0.3907 | 23% | 611 | 54.5% | 5959 | 22.3% | 540 | 76 | 88 | 72 |
| 3500 | 0.4053 | 0.3907 | 18% | 616 | 69.6% | 5323 | 12.7% | 540 | 73 | 90 | 90 |
| 3500 | 0.4053 | 0.3907 | 14% | 620 | 80.8% | 5064 | 5.1% | 540 | 70 | 90 | 94 |
| 3500 | 0.4053 | 0.3907 | 12% | 626 | 88.3% | 4939 | 0.0% | 540 | 68 | 88 | 90 |
| 3500 | 0.4053 | 0.3907 | 11% | 631 | 89.0% | 4929 | 0.0% | 540 | 65 | 86 | 77 |
| 3500 | 0.4053 | 0.3907 | 11% | 635 | 89.4% | 4923 | 0.0% | 540 | 62 | 83 | 67 |
| 3500 | 0.4053 | 0.3907 | 10% | 640 | 89.7% | 4917 | 0.0% | 540 | 58 | 81 | 57 |
| 3400 | 0.4110 | 0.3935 | 17% | 611 | 80.8% | 4131 | 2.4% | 467 | 55 | 85 | 57 |
| 3400 | 0.4110 | 0.3935 | 15% | 616 | 82.5% | 4131 | 2.4% | 467 | 54 | 91 | 79 |
| 3400 | 0.4110 | 0.3935 | 14% | 620 | 83.5% | 4131 | 2.4% | 467 | 53 | 94 | 96 |
| 3400 | 0.4110 | 0.3935 | 13% | 626 | 84.5% | 4131 | 2.4% | 467 | 51 | 92 | 86 |
| 3400 | 0.4110 | 0.3935 | 12% | 631 | 85.2% | 4131 | 2.4% | 467 | 49 | 87 | 70 |
| 3400 | 0.4110 | 0.3935 | 12% | 635 | 85.7% | 4131 | 2.4% | 467 | 48 | 84 | 59 |
| 3400 | 0.4110 | 0.3935 | 12% | 640 | 86.1% | 4131 | 2.3% | 467 | 45 | 81 | 48 |
| 3400 | 0.4110 | 0.3935 | 18% | 611 | 78.8% | 4131 | 3.4% | 471 | 55 | 88 | 58 |
| 3400 | 0.4110 | 0.3935 | 16% | 616 | 80.6% | 4131 | 3.4% | 471 | 54 | 94 | 81 |
| 3400 | 0.4110 | 0.3935 | 15% | 620 | 82.1% | 4173 | 3.2% | 471 | 54 | 96 | 97 |
| 3400 | 0.4110 | 0.3935 | 14% | 626 | 83.4% | 4222 | 2.9% | 471 | 54 | 92 | 83 |
| 3400 | 0.4110 | 0.3935 | 13% | 631 | 84.3% | 4244 | 2.8% | 471 | 53 | 88 | 67 |
| 3400 | 0.4110 | 0.3935 | 12% | 635 | 85.0% | 4274 | 2.6% | 471 | 51 | 84 | 56 |
| 3400 | 0.4110 | 0.3935 | 12% | 640 | 85.8% | 4325 | 2.4% | 471 | 49 | 81 | 46 |
| 3400 | 0.4110 | 0.3935 | 18% | 611 | 78.0% | 4327 | 3.8% | 476 | 61 | 89 | 58 |
| 3400 | 0.4110 | 0.3935 | 16% | 616 | 80.5% | 4377 | 3.4% | 476 | 61 | 94 | 81 |
| 3400 | 0.4110 | 0.3935 | 15% | 620 | 82.3% | 4436 | 2.9% | 476 | 61 | 97 | 98 |
| 3400 | 0.4110 | 0.3935 | 14% | 626 | 83.7% | 4470 | 2.6% | 476 | 60 | 92 | 83 |
| 3400 | 0.4110 | 0.3935 | 13% | 631 | 84.6% | 4486 | 2.5% | 476 | 57 | 87 | 67 |
| 3400 | 0.4110 | 0.3935 | 12% | 635 | 85.4% | 4513 | 2.3% | 476 | 56 | 84 | 56 |
| 3400 | 0.4110 | 0.3935 | 12% | 640 | 86.5% | 4582 | 1.8% | 476 | 53 | 80 | 47 |
| 3400 | 0.4110 | 0.3935 | 18% | 611 | 77.8% | 4511 | 3.8% | 480 | 65 | 89 | 59 |
| 3400 | 0.4110 | 0.3935 | 16% | 616 | 80.2% | 4535 | 3.5% | 480 | 64 | 95 | 82 |

TABLE 2-continued

| | | | | | | | | | | | |
|---|---|---|---|---|---|---|---|---|---|---|---|
| 3400 | 0.4110 | 0.3935 | 15% | 620 | 82.1% | 4576 | 3.0% | 480 | 63 | 97 | 99 |
| 3400 | 0.4110 | 0.3935 | 14% | 626 | 83.7% | 4606 | 2.6% | 480 | 62 | 92 | 82 |
| 3400 | 0.4110 | 0.3935 | 13% | 631 | 84.8% | 4622 | 2.4% | 480 | 59 | 87 | 67 |
| 3400 | 0.4110 | 0.3935 | 12% | 635 | 85.9% | 4662 | 1.9% | 480 | 58 | 84 | 57 |
| 3400 | 0.4110 | 0.3935 | 11% | 640 | 87.4% | 4738 | 1.2% | 480 | 55 | 80 | 49 |
| 3400 | 0.4110 | 0.3935 | 19% | 611 | 77.2% | 4671 | 4.2% | 486 | 67 | 90 | 60 |
| 3400 | 0.4110 | 0.3935 | 16% | 616 | 79.8% | 4681 | 3.7% | 486 | 66 | 95 | 83 |
| 3400 | 0.4110 | 0.3935 | 15% | 620 | 81.8% | 4703 | 3.1% | 486 | 65 | 96 | 100 |
| 3400 | 0.4110 | 0.3935 | 14% | 626 | 83.7% | 4725 | 2.6% | 486 | 63 | 91 | 82 |
| 3400 | 0.4110 | 0.3935 | 13% | 631 | 85.3% | 4753 | 2.0% | 486 | 61 | 86 | 68 |
| 3400 | 0.4110 | 0.3935 | 12% | 635 | 87.0% | 4796 | 1.2% | 486 | 60 | 83 | 60 |
| 3400 | 0.4110 | 0.3935 | 11% | 640 | 88.5% | 4838 | 0.4% | 486 | 57 | 80 | 52 |
| 3400 | 0.4110 | 0.3935 | 19% | 611 | 76.1% | 4792 | 4.9% | 491 | 68 | 91 | 61 |
| 3400 | 0.4110 | 0.3935 | 17% | 616 | 79.3% | 4792 | 4.0% | 491 | 67 | 95 | 84 |
| 3400 | 0.4110 | 0.3935 | 15% | 620 | 81.6% | 4797 | 3.3% | 491 | 66 | 95 | 99 |
| 3400 | 0.4110 | 0.3935 | 14% | 626 | 84.0% | 4812 | 2.4% | 491 | 65 | 90 | 82 |
| 3400 | 0.4110 | 0.3935 | 12% | 631 | 86.3% | 4835 | 1.3% | 491 | 63 | 86 | 70 |
| 3400 | 0.4110 | 0.3935 | 12% | 635 | 87.9% | 4852 | 0.5% | 491 | 61 | 83 | 62 |
| 3400 | 0.4110 | 0.3935 | 11% | 640 | 89.1% | 4862 | 0.0% | 491 | 57 | 80 | 54 |
| 3400 | 0.4110 | 0.3935 | 19% | 611 | 74.9% | 4879 | 5.6% | 496 | 69 | 91 | 62 |
| 3400 | 0.4110 | 0.3935 | 17% | 616 | 78.8% | 4862 | 4.4% | 496 | 68 | 94 | 85 |
| 3400 | 0.4110 | 0.3935 | 15% | 620 | 81.3% | 4856 | 3.5% | 496 | 67 | 95 | 98 |
| 3400 | 0.4110 | 0.3935 | 13% | 626 | 84.4% | 4858 | 2.1% | 496 | 65 | 90 | 83 |
| 3400 | 0.4110 | 0.3935 | 12% | 631 | 86.9% | 4862 | 0.9% | 496 | 64 | 86 | 71 |
| 3400 | 0.4110 | 0.3935 | 11% | 635 | 88.6% | 4866 | 0.1% | 496 | 61 | 83 | 64 |
| 3400 | 0.4110 | 0.3935 | 11% | 640 | 89.1% | 4862 | 0.0% | 496 | 57 | 80 | 54 |
| 3400 | 0.4110 | 0.3935 | 20% | 611 | 73.6% | 4973 | 6.6% | 502 | 70 | 92 | 63 |
| 3400 | 0.4110 | 0.3935 | 17% | 616 | 78.0% | 4929 | 5.0% | 502 | 69 | 94 | 86 |
| 3400 | 0.4110 | 0.3935 | 15% | 620 | 81.1% | 4906 | 3.7% | 502 | 68 | 94 | 97 |
| 3400 | 0.4110 | 0.3935 | 13% | 626 | 84.9% | 4886 | 1.8% | 502 | 66 | 89 | 84 |
| 3400 | 0.4110 | 0.3935 | 12% | 631 | 87.6% | 4874 | 0.5% | 502 | 64 | 86 | 73 |
| 3400 | 0.4110 | 0.3935 | 11% | 635 | 88.7% | 4867 | 0.0% | 502 | 61 | 83 | 64 |
| 3400 | 0.4110 | 0.3935 | 11% | 640 | 89.1% | 4862 | 0.0% | 502 | 57 | 80 | 54 |
| 3400 | 0.4110 | 0.3935 | 20% | 611 | 72.0% | 5055 | 7.7% | 508 | 71 | 91 | 64 |
| 3400 | 0.4110 | 0.3935 | 17% | 616 | 77.2% | 4982 | 5.6% | 508 | 70 | 93 | 86 |
| 3400 | 0.4110 | 0.3935 | 15% | 620 | 81.1% | 4938 | 3.8% | 508 | 68 | 93 | 96 |
| 3400 | 0.4110 | 0.3935 | 13% | 626 | 85.5% | 4897 | 1.4% | 508 | 67 | 89 | 85 |
| 3400 | 0.4110 | 0.3935 | 12% | 631 | 88.3% | 4874 | 0.0% | 508 | 64 | 85 | 74 |
| 3400 | 0.4110 | 0.3935 | 11% | 635 | 88.7% | 4867 | 0.0% | 508 | 61 | 83 | 64 |
| 3400 | 0.4110 | 0.3935 | 11% | 640 | 89.1% | 4862 | 0.0% | 508 | 57 | 80 | 54 |
| 3400 | 0.4110 | 0.3935 | 21% | 611 | 70.9% | 5115 | 8.6% | 514 | 72 | 91 | 65 |
| 3400 | 0.4110 | 0.3935 | 17% | 616 | 76.4% | 5020 | 6.3% | 514 | 70 | 93 | 87 |
| 3400 | 0.4110 | 0.3935 | 15% | 620 | 81.1% | 4955 | 3.9% | 514 | 69 | 92 | 95 |
| 3400 | 0.4110 | 0.3935 | 13% | 626 | 86.2% | 4896 | 1.0% | 514 | 67 | 89 | 86 |
| 3400 | 0.4110 | 0.3935 | 12% | 631 | 88.3% | 4874 | 0.0% | 514 | 64 | 85 | 74 |
| 3400 | 0.4110 | 0.3935 | 11% | 635 | 88.7% | 4867 | 0.0% | 514 | 61 | 83 | 64 |
| 3400 | 0.4110 | 0.3935 | 11% | 640 | 89.1% | 4862 | 0.0% | 514 | 57 | 80 | 54 |
| 3400 | 0.4110 | 0.3935 | 21% | 611 | 69.0% | 5189 | 10.1% | 521 | 73 | 90 | 66 |
| 3400 | 0.4110 | 0.3935 | 18% | 616 | 75.1% | 5063 | 7.3% | 521 | 71 | 92 | 88 |
| 3400 | 0.4110 | 0.3935 | 15% | 620 | 81.1% | 4968 | 3.9% | 521 | 69 | 92 | 95 |
| 3400 | 0.4110 | 0.3935 | 13% | 626 | 86.9% | 4891 | 0.5% | 521 | 67 | 89 | 87 |
| 3400 | 0.4110 | 0.3935 | 12% | 631 | 88.3% | 4874 | 0.0% | 521 | 64 | 85 | 74 |
| 3400 | 0.4110 | 0.3935 | 11% | 635 | 88.7% | 4867 | 0.0% | 521 | 61 | 83 | 64 |
| 3400 | 0.4110 | 0.3935 | 11% | 640 | 89.1% | 4862 | 0.0% | 521 | 57 | 80 | 54 |
| 3400 | 0.4110 | 0.3935 | 21% | 611 | 66.7% | 5271 | 11.9% | 527 | 74 | 90 | 67 |
| 3400 | 0.4110 | 0.3935 | 18% | 616 | 73.9% | 5101 | 8.3% | 527 | 71 | 92 | 89 |
| 3400 | 0.4110 | 0.3935 | 15% | 620 | 81.2% | 4973 | 4.0% | 527 | 70 | 91 | 95 |
| 3400 | 0.4110 | 0.3935 | 12% | 626 | 87.4% | 4886 | 0.2% | 527 | 67 | 89 | 88 |
| 3400 | 0.4110 | 0.3935 | 12% | 631 | 88.3% | 4874 | 0.0% | 527 | 64 | 85 | 74 |
| 3400 | 0.4110 | 0.3935 | 11% | 635 | 88.7% | 4867 | 0.0% | 527 | 61 | 83 | 64 |
| 3400 | 0.4110 | 0.3935 | 11% | 640 | 89.1% | 4862 | 0.0% | 527 | 57 | 80 | 54 |
| 3400 | 0.4110 | 0.3935 | 22% | 611 | 62.2% | 5432 | 15.4% | 534 | 75 | 89 | 69 |
| 3400 | 0.4110 | 0.3935 | 18% | 616 | 72.1% | 5152 | 9.9% | 534 | 72 | 91 | 89 |
| 3400 | 0.4110 | 0.3935 | 15% | 620 | 81.4% | 4975 | 3.9% | 534 | 70 | 91 | 95 |
| 3400 | 0.4110 | 0.3935 | 12% | 626 | 87.6% | 4883 | 0.0% | 534 | 67 | 89 | 88 |
| 3400 | 0.4110 | 0.3935 | 12% | 631 | 88.3% | 4874 | 0.0% | 534 | 64 | 85 | 74 |
| 3400 | 0.4110 | 0.3935 | 11% | 635 | 88.7% | 4867 | 0.0% | 534 | 61 | 83 | 64 |
| 3400 | 0.4110 | 0.3935 | 11% | 640 | 89.1% | 4862 | 0.0% | 534 | 57 | 80 | 54 |
| 3400 | 0.4110 | 0.3935 | 24% | 611 | 55.2% | 5758 | 21.1% | 540 | 76 | 88 | 71 |
| 3400 | 0.4110 | 0.3935 | 18% | 616 | 70.1% | 5210 | 11.7% | 540 | 73 | 90 | 89 |
| 3400 | 0.4110 | 0.3935 | 15% | 620 | 81.5% | 4977 | 4.0% | 540 | 70 | 90 | 94 |
| 3400 | 0.4110 | 0.3935 | 12% | 626 | 87.6% | 4883 | 0.0% | 540 | 67 | 89 | 88 |
| 3400 | 0.4110 | 0.3935 | 12% | 631 | 88.3% | 4874 | 0.0% | 540 | 64 | 85 | 74 |
| 3400 | 0.4110 | 0.3935 | 11% | 635 | 88.7% | 4867 | 0.0% | 540 | 61 | 83 | 64 |
| 3400 | 0.4110 | 0.3935 | 11% | 640 | 89.1% | 4862 | 0.0% | 540 | 57 | 80 | 54 |
| 3300 | 0.4171 | 0.3963 | 18% | 611 | 80.1% | 4131 | 2.2% | 467 | 56 | 86 | 56 |
| 3300 | 0.4171 | 0.3963 | 16% | 616 | 81.8% | 4131 | 2.2% | 467 | 54 | 92 | 79 |
| 3300 | 0.4171 | 0.3963 | 15% | 620 | 82.9% | 4131 | 2.2% | 467 | 53 | 95 | 96 |
| 3300 | 0.4171 | 0.3963 | 14% | 626 | 83.9% | 4131 | 2.2% | 467 | 51 | 91 | 84 |
| 3300 | 0.4171 | 0.3963 | 13% | 631 | 84.7% | 4131 | 2.2% | 467 | 50 | 87 | 68 |

TABLE 2-continued

| | | | | | | | | | | | |
|---|---|---|---|---|---|---|---|---|---|---|---|
| 3300 | 0.4171 | 0.3963 | 13% | 635 | 85.2% | 4131 | 2.2% | 467 | 48 | 83 | 56 |
| 3300 | 0.4171 | 0.3963 | 12% | 640 | 85.6% | 4131 | 2.2% | 467 | 45 | 79 | 44 |
| 3300 | 0.4171 | 0.3963 | 19% | 611 | 78.2% | 4131 | 3.2% | 471 | 55 | 88 | 57 |
| 3300 | 0.4171 | 0.3963 | 17% | 616 | 80.1% | 4131 | 3.2% | 471 | 54 | 94 | 81 |
| 3300 | 0.4171 | 0.3963 | 15% | 620 | 81.7% | 4196 | 2.9% | 471 | 55 | 96 | 98 |
| 3300 | 0.4171 | 0.3963 | 14% | 626 | 83.1% | 4234 | 2.6% | 471 | 55 | 92 | 82 |
| 3300 | 0.4171 | 0.3963 | 13% | 631 | 84.0% | 4257 | 2.5% | 471 | 53 | 87 | 65 |
| 3300 | 0.4171 | 0.3963 | 13% | 635 | 84.7% | 4287 | 2.3% | 471 | 52 | 83 | 54 |
| 3300 | 0.4171 | 0.3963 | 12% | 640 | 85.5% | 4333 | 2.1% | 471 | 49 | 79 | 43 |
| 3300 | 0.4171 | 0.3963 | 19% | 611 | 77.4% | 4313 | 3.6% | 476 | 61 | 89 | 57 |
| 3300 | 0.4171 | 0.3963 | 17% | 616 | 80.0% | 4363 | 3.1% | 476 | 61 | 94 | 81 |
| 3300 | 0.4171 | 0.3963 | 15% | 620 | 81.8% | 4424 | 2.7% | 476 | 61 | 96 | 99 |
| 3300 | 0.4171 | 0.3963 | 14% | 626 | 83.3% | 4460 | 2.4% | 476 | 60 | 91 | 82 |
| 3300 | 0.4171 | 0.3963 | 13% | 631 | 84.3% | 4476 | 2.2% | 476 | 58 | 86 | 65 |
| 3300 | 0.4171 | 0.3963 | 13% | 635 | 85.1% | 4501 | 2.0% | 476 | 55 | 83 | 54 |
| 3300 | 0.4171 | 0.3963 | 12% | 640 | 86.2% | 4561 | 1.6% | 476 | 53 | 79 | 43 |
| 3300 | 0.4171 | 0.3963 | 19% | 611 | 77.2% | 4484 | 3.6% | 480 | 65 | 89 | 58 |
| 3300 | 0.4171 | 0.3963 | 17% | 616 | 79.8% | 4510 | 3.2% | 480 | 64 | 95 | 82 |
| 3300 | 0.4171 | 0.3963 | 16% | 620 | 81.7% | 4554 | 2.7% | 480 | 63 | 96 | 99 |
| 3300 | 0.4171 | 0.3963 | 14% | 626 | 83.3% | 4583 | 2.3% | 480 | 62 | 91 | 81 |
| 3300 | 0.4171 | 0.3963 | 13% | 631 | 84.4% | 4597 | 2.1% | 480 | 59 | 86 | 65 |
| 3300 | 0.4171 | 0.3963 | 13% | 635 | 85.5% | 4633 | 1.7% | 480 | 57 | 82 | 54 |
| 3300 | 0.4171 | 0.3963 | 12% | 640 | 87.1% | 4710 | 0.9% | 480 | 55 | 79 | 46 |
| 3300 | 0.4171 | 0.3963 | 19% | 611 | 76.6% | 4632 | 3.9% | 486 | 67 | 90 | 59 |
| 3300 | 0.4171 | 0.3963 | 17% | 616 | 79.4% | 4646 | 3.4% | 486 | 66 | 95 | 83 |
| 3300 | 0.4171 | 0.3963 | 16% | 620 | 81.5% | 4669 | 2.8% | 486 | 65 | 96 | 99 |
| 3300 | 0.4171 | 0.3963 | 14% | 626 | 83.4% | 4689 | 2.3% | 486 | 63 | 90 | 81 |
| 3300 | 0.4171 | 0.3963 | 13% | 631 | 85.0% | 4715 | 1.7% | 486 | 61 | 86 | 66 |
| 3300 | 0.4171 | 0.3963 | 12% | 635 | 86.7% | 4761 | 0.9% | 486 | 59 | 82 | 57 |
| 3300 | 0.4171 | 0.3963 | 12% | 640 | 88.4% | 4807 | 0.0% | 486 | 56 | 79 | 49 |
| 3300 | 0.4171 | 0.3963 | 20% | 611 | 75.6% | 4743 | 4.6% | 491 | 68 | 91 | 60 |
| 3300 | 0.4171 | 0.3963 | 17% | 616 | 79.0% | 4746 | 3.7% | 491 | 67 | 94 | 83 |
| 3300 | 0.4171 | 0.3963 | 16% | 620 | 81.3% | 4753 | 3.0% | 491 | 66 | 95 | 98 |
| 3300 | 0.4171 | 0.3963 | 14% | 626 | 83.7% | 4766 | 2.1% | 491 | 64 | 90 | 81 |
| 3300 | 0.4171 | 0.3963 | 13% | 631 | 86.2% | 4792 | 0.9% | 491 | 63 | 85 | 69 |
| 3300 | 0.4171 | 0.3963 | 12% | 635 | 87.9% | 4811 | 0.1% | 491 | 61 | 82 | 60 |
| 3300 | 0.4171 | 0.3963 | 12% | 640 | 88.4% | 4808 | 0.0% | 491 | 56 | 79 | 49 |
| 3300 | 0.4171 | 0.3963 | 20% | 611 | 74.5% | 4823 | 5.3% | 496 | 69 | 91 | 61 |
| 3300 | 0.4171 | 0.3963 | 17% | 616 | 78.6% | 4809 | 4.0% | 496 | 68 | 94 | 84 |
| 3300 | 0.4171 | 0.3963 | 16% | 620 | 81.2% | 4804 | 3.1% | 496 | 67 | 94 | 97 |
| 3300 | 0.4171 | 0.3963 | 14% | 626 | 84.3% | 4807 | 1.7% | 496 | 65 | 89 | 82 |
| 3300 | 0.4171 | 0.3963 | 13% | 631 | 87.0% | 4814 | 0.4% | 496 | 63 | 85 | 70 |
| 3300 | 0.4171 | 0.3963 | 12% | 635 | 88.0% | 4813 | 0.0% | 496 | 61 | 82 | 61 |
| 3300 | 0.4171 | 0.3963 | 12% | 640 | 88.4% | 4808 | 0.0% | 496 | 56 | 79 | 49 |
| 3300 | 0.4171 | 0.3963 | 21% | 611 | 73.2% | 4907 | 6.2% | 502 | 70 | 91 | 62 |
| 3300 | 0.4171 | 0.3963 | 18% | 616 | 77.9% | 4867 | 4.5% | 502 | 69 | 94 | 85 |
| 3300 | 0.4171 | 0.3963 | 16% | 620 | 81.0% | 4846 | 3.2% | 502 | 68 | 93 | 97 |
| 3300 | 0.4171 | 0.3963 | 14% | 626 | 85.0% | 4829 | 1.3% | 502 | 66 | 89 | 83 |
| 3300 | 0.4171 | 0.3963 | 12% | 631 | 87.6% | 4819 | 0.0% | 502 | 64 | 85 | 72 |
| 3300 | 0.4171 | 0.3963 | 12% | 635 | 88.0% | 4813 | 0.0% | 502 | 61 | 82 | 61 |
| 3300 | 0.4171 | 0.3963 | 12% | 640 | 88.4% | 4808 | 0.0% | 502 | 56 | 79 | 49 |
| 3300 | 0.4171 | 0.3963 | 21% | 611 | 71.8% | 4982 | 7.3% | 508 | 71 | 91 | 63 |
| 3300 | 0.4171 | 0.3963 | 18% | 616 | 77.2% | 4912 | 5.1% | 508 | 70 | 93 | 86 |
| 3300 | 0.4171 | 0.3963 | 16% | 620 | 81.0% | 4873 | 3.3% | 508 | 68 | 93 | 96 |
| 3300 | 0.4171 | 0.3963 | 14% | 626 | 85.6% | 4835 | 0.8% | 508 | 66 | 89 | 84 |
| 3300 | 0.4171 | 0.3963 | 12% | 631 | 87.6% | 4819 | 0.0% | 508 | 64 | 85 | 72 |
| 3300 | 0.4171 | 0.3963 | 12% | 635 | 88.0% | 4813 | 0.0% | 508 | 61 | 82 | 61 |
| 3300 | 0.4171 | 0.3963 | 12% | 640 | 88.4% | 4808 | 0.0% | 508 | 56 | 79 | 49 |
| 3300 | 0.4171 | 0.3963 | 21% | 611 | 70.7% | 5034 | 8.1% | 514 | 72 | 91 | 64 |
| 3300 | 0.4171 | 0.3963 | 18% | 616 | 76.5% | 4944 | 5.7% | 514 | 70 | 93 | 86 |
| 3300 | 0.4171 | 0.3963 | 16% | 620 | 81.1% | 4886 | 3.3% | 514 | 69 | 92 | 96 |
| 3300 | 0.4171 | 0.3963 | 13% | 626 | 86.4% | 4832 | 0.3% | 514 | 67 | 89 | 86 |
| 3300 | 0.4171 | 0.3963 | 12% | 631 | 87.6% | 4819 | 0.0% | 514 | 64 | 85 | 72 |
| 3300 | 0.4171 | 0.3963 | 12% | 635 | 88.0% | 4813 | 0.0% | 514 | 61 | 82 | 61 |
| 3300 | 0.4171 | 0.3963 | 12% | 640 | 88.4% | 4808 | 0.0% | 514 | 56 | 79 | 49 |
| 3300 | 0.4171 | 0.3963 | 22% | 611 | 69.0% | 5098 | 9.4% | 521 | 73 | 90 | 65 |
| 3300 | 0.4171 | 0.3963 | 18% | 616 | 75.4% | 4981 | 6.5% | 521 | 71 | 92 | 87 |
| 3300 | 0.4171 | 0.3963 | 15% | 620 | 81.2% | 4896 | 3.3% | 521 | 69 | 92 | 95 |
| 3300 | 0.4171 | 0.3963 | 13% | 626 | 86.9% | 4828 | 0.0% | 521 | 67 | 89 | 87 |
| 3300 | 0.4171 | 0.3963 | 12% | 631 | 87.6% | 4819 | 0.0% | 521 | 64 | 85 | 72 |
| 3300 | 0.4171 | 0.3963 | 12% | 635 | 88.0% | 4813 | 0.0% | 521 | 61 | 82 | 61 |
| 3300 | 0.4171 | 0.3963 | 12% | 640 | 88.4% | 4808 | 0.0% | 521 | 56 | 79 | 49 |
| 3300 | 0.4171 | 0.3963 | 22% | 611 | 66.9% | 5166 | 11.1% | 527 | 74 | 90 | 66 |
| 3300 | 0.4171 | 0.3963 | 18% | 616 | 74.2% | 5013 | 7.5% | 527 | 71 | 92 | 88 |
| 3300 | 0.4171 | 0.3963 | 15% | 620 | 81.4% | 4899 | 3.3% | 527 | 69 | 91 | 95 |
| 3300 | 0.4171 | 0.3963 | 13% | 626 | 86.9% | 4828 | 0.0% | 527 | 67 | 89 | 87 |
| 3300 | 0.4171 | 0.3963 | 12% | 631 | 87.6% | 4819 | 0.0% | 527 | 64 | 85 | 72 |
| 3300 | 0.4171 | 0.3963 | 12% | 635 | 88.0% | 4813 | 0.0% | 527 | 61 | 82 | 61 |
| 3300 | 0.4171 | 0.3963 | 12% | 640 | 88.4% | 4808 | 0.0% | 527 | 56 | 79 | 49 |
| 3300 | 0.4171 | 0.3963 | 23% | 611 | 62.7% | 5299 | 14.4% | 534 | 75 | 89 | 67 |

TABLE 2-continued

| | | | | | | | | | | | |
|---|---|---|---|---|---|---|---|---|---|---|---|
| 3300 | 0.4171 | 0.3963 | 19% | 616 | 72.6% | 5056 | 8.9% | 534 | 72 | 91 | 88 |
| 3300 | 0.4171 | 0.3963 | 15% | 620 | 81.7% | 4898 | 3.1% | 534 | 69 | 91 | 95 |
| 3300 | 0.4171 | 0.3963 | 13% | 626 | 86.9% | 4828 | 0.0% | 534 | 67 | 89 | 87 |
| 3300 | 0.4171 | 0.3963 | 12% | 631 | 87.6% | 4819 | 0.0% | 534 | 64 | 85 | 72 |
| 3300 | 0.4171 | 0.3963 | 12% | 635 | 88.0% | 4813 | 0.0% | 534 | 61 | 82 | 61 |
| 3300 | 0.4171 | 0.3963 | 12% | 640 | 88.4% | 4808 | 0.0% | 534 | 56 | 79 | 49 |
| 3300 | 0.4171 | 0.3963 | 24% | 611 | 55.9% | 5570 | 19.9% | 540 | 76 | 88 | 69 |
| 3300 | 0.4171 | 0.3963 | 19% | 616 | 70.7% | 5104 | 10.6% | 540 | 72 | 90 | 88 |
| 3300 | 0.4171 | 0.3963 | 15% | 620 | 82.1% | 4895 | 2.9% | 540 | 70 | 91 | 94 |
| 3300 | 0.4171 | 0.3963 | 13% | 626 | 86.9% | 4828 | 0.0% | 540 | 67 | 89 | 87 |
| 3300 | 0.4171 | 0.3963 | 12% | 631 | 87.6% | 4819 | 0.0% | 540 | 64 | 85 | 72 |
| 3300 | 0.4171 | 0.3963 | 12% | 635 | 88.0% | 4813 | 0.0% | 540 | 61 | 82 | 61 |
| 3300 | 0.4171 | 0.3963 | 12% | 640 | 88.4% | 4808 | 0.0% | 540 | 56 | 79 | 49 |
| 3200 | 0.4234 | 0.3990 | 19% | 611 | 79.3% | 4131 | 2.1% | 467 | 56 | 86 | 55 |
| 3200 | 0.4234 | 0.3990 | 17% | 616 | 81.1% | 4131 | 2.1% | 467 | 55 | 92 | 79 |
| 3200 | 0.4234 | 0.3990 | 16% | 620 | 82.3% | 4131 | 2.1% | 467 | 53 | 95 | 97 |
| 3200 | 0.4234 | 0.3990 | 15% | 626 | 83.3% | 4131 | 2.0% | 467 | 52 | 90 | 82 |
| 3200 | 0.4234 | 0.3990 | 14% | 631 | 84.1% | 4131 | 2.0% | 467 | 50 | 86 | 65 |
| 3200 | 0.4234 | 0.3990 | 13% | 635 | 84.6% | 4131 | 2.0% | 467 | 48 | 82 | 53 |
| 3200 | 0.4234 | 0.3990 | 13% | 640 | 85.1% | 4131 | 2.0% | 467 | 45 | 78 | 40 |
| 3200 | 0.4234 | 0.3990 | 19% | 611 | 77.5% | 4131 | 3.0% | 471 | 56 | 88 | 56 |
| 3200 | 0.4234 | 0.3990 | 18% | 616 | 79.5% | 4131 | 3.0% | 471 | 54 | 94 | 80 |
| 3200 | 0.4234 | 0.3990 | 16% | 620 | 81.2% | 4200 | 2.6% | 471 | 56 | 96 | 99 |
| 3200 | 0.4234 | 0.3990 | 15% | 626 | 82.7% | 4250 | 2.3% | 471 | 55 | 91 | 80 |
| 3200 | 0.4234 | 0.3990 | 14% | 631 | 83.7% | 4274 | 2.2% | 471 | 54 | 86 | 63 |
| 3200 | 0.4234 | 0.3990 | 14% | 635 | 84.4% | 4306 | 2.0% | 471 | 52 | 82 | 51 |
| 3200 | 0.4234 | 0.3990 | 13% | 640 | 85.2% | 4348 | 1.8% | 471 | 49 | 78 | 39 |
| 3200 | 0.4234 | 0.3990 | 20% | 611 | 76.8% | 4300 | 3.3% | 476 | 61 | 89 | 56 |
| 3200 | 0.4234 | 0.3990 | 18% | 616 | 79.4% | 4348 | 2.9% | 476 | 61 | 94 | 81 |
| 3200 | 0.4234 | 0.3990 | 16% | 620 | 81.4% | 4415 | 2.4% | 476 | 61 | 96 | 99 |
| 3200 | 0.4234 | 0.3990 | 15% | 626 | 82.9% | 4454 | 2.1% | 476 | 60 | 90 | 80 |
| 3200 | 0.4234 | 0.3990 | 14% | 631 | 83.9% | 4468 | 1.9% | 476 | 58 | 85 | 63 |
| 3200 | 0.4234 | 0.3990 | 14% | 635 | 84.7% | 4493 | 1.7% | 476 | 55 | 82 | 51 |
| 3200 | 0.4234 | 0.3990 | 13% | 640 | 85.8% | 4544 | 1.4% | 476 | 52 | 78 | 40 |
| 3200 | 0.4234 | 0.3990 | 20% | 611 | 76.6% | 4459 | 3.4% | 480 | 65 | 89 | 57 |
| 3200 | 0.4234 | 0.3990 | 18% | 616 | 79.3% | 4492 | 2.9% | 480 | 64 | 94 | 82 |
| 3200 | 0.4234 | 0.3990 | 16% | 620 | 81.4% | 4535 | 2.4% | 480 | 64 | 96 | 100 |
| 3200 | 0.4234 | 0.3990 | 15% | 626 | 83.0% | 4562 | 2.0% | 480 | 62 | 90 | 80 |
| 3200 | 0.4234 | 0.3990 | 14% | 631 | 84.1% | 4574 | 1.8% | 480 | 59 | 85 | 63 |
| 3200 | 0.4234 | 0.3990 | 13% | 635 | 85.1% | 4606 | 1.5% | 480 | 57 | 81 | 52 |
| 3200 | 0.4234 | 0.3990 | 13% | 640 | 86.7% | 4682 | 0.7% | 480 | 54 | 77 | 43 |
| 3200 | 0.4234 | 0.3990 | 20% | 611 | 76.0% | 4595 | 3.7% | 486 | 67 | 90 | 57 |
| 3200 | 0.4234 | 0.3990 | 18% | 616 | 79.0% | 4612 | 3.1% | 486 | 66 | 94 | 82 |
| 3200 | 0.4234 | 0.3990 | 16% | 620 | 81.2% | 4637 | 2.5% | 486 | 65 | 95 | 99 |
| 3200 | 0.4234 | 0.3990 | 15% | 626 | 83.0% | 4655 | 2.0% | 486 | 63 | 90 | 80 |
| 3200 | 0.4234 | 0.3990 | 14% | 631 | 84.6% | 4678 | 1.4% | 486 | 61 | 85 | 64 |
| 3200 | 0.4234 | 0.3990 | 13% | 635 | 86.5% | 4726 | 0.6% | 486 | 59 | 81 | 55 |
| 3200 | 0.4234 | 0.3990 | 12% | 640 | 87.7% | 4754 | 0.0% | 486 | 55 | 77 | 45 |
| 3200 | 0.4234 | 0.3990 | 21% | 611 | 75.0% | 4696 | 4.3% | 491 | 68 | 90 | 58 |
| 3200 | 0.4234 | 0.3990 | 18% | 616 | 78.7% | 4702 | 3.3% | 491 | 67 | 94 | 83 |
| 3200 | 0.4234 | 0.3990 | 16% | 620 | 81.1% | 4710 | 2.6% | 491 | 66 | 95 | 98 |
| 3200 | 0.4234 | 0.3990 | 15% | 626 | 83.4% | 4723 | 1.7% | 491 | 64 | 89 | 80 |
| 3200 | 0.4234 | 0.3990 | 13% | 631 | 86.0% | 4750 | 0.5% | 491 | 63 | 84 | 67 |
| 3200 | 0.4234 | 0.3990 | 13% | 635 | 87.3% | 4759 | 0.0% | 491 | 60 | 81 | 57 |
| 3200 | 0.4234 | 0.3990 | 12% | 640 | 87.7% | 4754 | 0.0% | 491 | 55 | 77 | 45 |
| 3200 | 0.4234 | 0.3990 | 21% | 611 | 74.0% | 4768 | 5.0% | 496 | 69 | 91 | 59 |
| 3200 | 0.4234 | 0.3990 | 18% | 616 | 78.3% | 4757 | 3.6% | 496 | 68 | 94 | 83 |
| 3200 | 0.4234 | 0.3990 | 16% | 620 | 80.9% | 4753 | 2.7% | 496 | 67 | 94 | 97 |
| 3200 | 0.4234 | 0.3990 | 15% | 626 | 84.2% | 4759 | 1.2% | 496 | 65 | 89 | 81 |
| 3200 | 0.4234 | 0.3990 | 13% | 631 | 86.8% | 4765 | 0.0% | 496 | 63 | 84 | 69 |
| 3200 | 0.4234 | 0.3990 | 13% | 635 | 87.3% | 4759 | 0.0% | 496 | 60 | 81 | 57 |
| 3200 | 0.4234 | 0.3990 | 12% | 640 | 87.7% | 4754 | 0.0% | 496 | 55 | 77 | 45 |
| 3200 | 0.4234 | 0.3990 | 21% | 611 | 72.9% | 4844 | 5.8% | 502 | 70 | 91 | 60 |
| 3200 | 0.4234 | 0.3990 | 18% | 616 | 77.7% | 4807 | 4.0% | 502 | 69 | 93 | 84 |
| 3200 | 0.4234 | 0.3990 | 16% | 620 | 80.9% | 4789 | 2.7% | 502 | 67 | 93 | 96 |
| 3200 | 0.4234 | 0.3990 | 14% | 626 | 85.0% | 4775 | 0.7% | 502 | 66 | 89 | 83 |
| 3200 | 0.4234 | 0.3990 | 13% | 631 | 86.8% | 4765 | 0.0% | 502 | 63 | 84 | 69 |
| 3200 | 0.4234 | 0.3990 | 13% | 635 | 87.3% | 4759 | 0.0% | 502 | 60 | 81 | 57 |
| 3200 | 0.4234 | 0.3990 | 12% | 640 | 87.7% | 4754 | 0.0% | 502 | 55 | 77 | 45 |
| 3200 | 0.4234 | 0.3990 | 22% | 611 | 71.5% | 4910 | 6.8% | 508 | 71 | 91 | 61 |
| 3200 | 0.4234 | 0.3990 | 18% | 616 | 77.1% | 4846 | 4.5% | 508 | 70 | 93 | 85 |
| 3200 | 0.4234 | 0.3990 | 16% | 620 | 81.0% | 4810 | 2.7% | 508 | 68 | 93 | 96 |
| 3200 | 0.4234 | 0.3990 | 14% | 626 | 85.7% | 4776 | 0.2% | 508 | 66 | 88 | 84 |
| 3200 | 0.4234 | 0.3990 | 13% | 631 | 86.8% | 4765 | 0.0% | 508 | 63 | 84 | 69 |
| 3200 | 0.4234 | 0.3990 | 13% | 635 | 87.3% | 4759 | 0.0% | 508 | 60 | 81 | 57 |
| 3200 | 0.4234 | 0.3990 | 12% | 640 | 87.7% | 4754 | 0.0% | 508 | 55 | 77 | 45 |
| 3200 | 0.4234 | 0.3990 | 22% | 611 | 70.5% | 4957 | 7.6% | 514 | 72 | 90 | 62 |
| 3200 | 0.4234 | 0.3990 | 18% | 616 | 76.5% | 4872 | 5.0% | 514 | 70 | 93 | 85 |
| 3200 | 0.4234 | 0.3990 | 16% | 620 | 81.1% | 4821 | 2.7% | 514 | 68 | 92 | 96 |
| 3200 | 0.4234 | 0.3990 | 14% | 626 | 86.1% | 4775 | 0.0% | 514 | 66 | 88 | 85 |

TABLE 2-continued

| | | | | | | | | | | | |
|---|---|---|---|---|---|---|---|---|---|---|---|
| 3200 | 0.4234 | 0.3990 | 13% | 631 | 86.8% | 4765 | 0.0% | 514 | 63 | 84 | 69 |
| 3200 | 0.4234 | 0.3990 | 13% | 635 | 87.3% | 4759 | 0.0% | 514 | 60 | 81 | 57 |
| 3200 | 0.4234 | 0.3990 | 12% | 640 | 87.7% | 4754 | 0.0% | 514 | 55 | 77 | 45 |
| 3200 | 0.4234 | 0.3990 | 22% | 611 | 69.0% | 5012 | 8.8% | 521 | 73 | 90 | 63 |
| 3200 | 0.4234 | 0.3990 | 19% | 616 | 75.6% | 4902 | 5.8% | 521 | 71 | 92 | 86 |
| 3200 | 0.4234 | 0.3990 | 16% | 620 | 81.3% | 4827 | 2.6% | 521 | 69 | 92 | 95 |
| 3200 | 0.4234 | 0.3990 | 14% | 626 | 86.1% | 4775 | 0.0% | 521 | 66 | 88 | 85 |
| 3200 | 0.4234 | 0.3990 | 13% | 631 | 86.8% | 4765 | 0.0% | 521 | 63 | 84 | 69 |
| 3200 | 0.4234 | 0.3990 | 13% | 635 | 87.3% | 4759 | 0.0% | 521 | 60 | 81 | 57 |
| 3200 | 0.4234 | 0.3990 | 12% | 640 | 87.7% | 4754 | 0.0% | 521 | 55 | 77 | 45 |
| 3200 | 0.4234 | 0.3990 | 23% | 611 | 67.1% | 5068 | 10.3% | 527 | 74 | 90 | 64 |
| 3200 | 0.4234 | 0.3990 | 19% | 616 | 74.6% | 4928 | 6.6% | 527 | 71 | 92 | 86 |
| 3200 | 0.4234 | 0.3990 | 16% | 620 | 81.5% | 4829 | 2.5% | 527 | 69 | 92 | 95 |
| 3200 | 0.4234 | 0.3990 | 14% | 626 | 86.1% | 4775 | 0.0% | 527 | 66 | 88 | 85 |
| 3200 | 0.4234 | 0.3990 | 13% | 631 | 86.8% | 4765 | 0.0% | 527 | 63 | 84 | 69 |
| 3200 | 0.4234 | 0.3990 | 13% | 635 | 87.3% | 4759 | 0.0% | 527 | 60 | 81 | 57 |
| 3200 | 0.4234 | 0.3990 | 12% | 640 | 87.7% | 4754 | 0.0% | 527 | 55 | 77 | 45 |
| 3200 | 0.4234 | 0.3990 | 23% | 611 | 63.3% | 5175 | 13.2% | 534 | 75 | 89 | 65 |
| 3200 | 0.4234 | 0.3990 | 19% | 616 | 73.0% | 4963 | 7.9% | 534 | 72 | 91 | 87 |
| 3200 | 0.4234 | 0.3990 | 16% | 620 | 82.0% | 4826 | 2.3% | 534 | 69 | 91 | 95 |
| 3200 | 0.4234 | 0.3990 | 14% | 626 | 86.1% | 4775 | 0.0% | 534 | 66 | 88 | 85 |
| 3200 | 0.4234 | 0.3990 | 13% | 631 | 86.8% | 4765 | 0.0% | 534 | 63 | 84 | 69 |
| 3200 | 0.4234 | 0.3990 | 13% | 635 | 87.3% | 4759 | 0.0% | 534 | 60 | 81 | 57 |
| 3200 | 0.4234 | 0.3990 | 12% | 640 | 87.7% | 4754 | 0.0% | 534 | 55 | 77 | 45 |
| 3200 | 0.4234 | 0.3990 | 25% | 611 | 56.9% | 5396 | 18.4% | 540 | 76 | 88 | 67 |
| 3200 | 0.4234 | 0.3990 | 19% | 616 | 71.3% | 5002 | 9.5% | 540 | 72 | 90 | 87 |
| 3200 | 0.4234 | 0.3990 | 15% | 620 | 82.7% | 4818 | 1.8% | 540 | 69 | 91 | 94 |
| 3200 | 0.4234 | 0.3990 | 14% | 626 | 86.1% | 4775 | 0.0% | 540 | 66 | 88 | 85 |
| 3200 | 0.4234 | 0.3990 | 13% | 631 | 86.8% | 4765 | 0.0% | 540 | 63 | 84 | 69 |
| 3200 | 0.4234 | 0.3990 | 13% | 635 | 87.3% | 4759 | 0.0% | 540 | 60 | 81 | 57 |
| 3200 | 0.4234 | 0.3990 | 12% | 640 | 87.7% | 4754 | 0.0% | 540 | 55 | 77 | 45 |
| 3100 | 0.4300 | 0.4016 | 20% | 611 | 78.4% | 4131 | 1.9% | 467 | 57 | 86 | 54 |
| 3100 | 0.4300 | 0.4016 | 18% | 616 | 80.4% | 4131 | 1.9% | 467 | 55 | 93 | 79 |
| 3100 | 0.4300 | 0.4016 | 17% | 620 | 81.6% | 4131 | 1.9% | 467 | 54 | 95 | 98 |
| 3100 | 0.4300 | 0.4016 | 15% | 626 | 82.7% | 4131 | 1.9% | 467 | 52 | 90 | 80 |
| 3100 | 0.4300 | 0.4016 | 15% | 631 | 83.5% | 4131 | 1.9% | 467 | 50 | 84 | 62 |
| 3100 | 0.4300 | 0.4016 | 14% | 635 | 84.1% | 4131 | 1.9% | 467 | 48 | 81 | 50 |
| 3100 | 0.4300 | 0.4016 | 14% | 640 | 84.5% | 4131 | 1.9% | 467 | 44 | 76 | 37 |
| 3100 | 0.4300 | 0.4016 | 20% | 611 | 76.8% | 4131 | 2.8% | 471 | 56 | 88 | 55 |
| 3100 | 0.4300 | 0.4016 | 18% | 616 | 78.9% | 4131 | 2.7% | 471 | 55 | 94 | 80 |
| 3100 | 0.4300 | 0.4016 | 17% | 620 | 80.8% | 4216 | 2.3% | 471 | 57 | 96 | 99 |
| 3100 | 0.4300 | 0.4016 | 16% | 626 | 82.3% | 4272 | 2.0% | 471 | 56 | 90 | 79 |
| 3100 | 0.4300 | 0.4016 | 15% | 631 | 83.3% | 4296 | 1.9% | 471 | 54 | 85 | 61 |
| 3100 | 0.4300 | 0.4016 | 14% | 635 | 84.1% | 4329 | 1.7% | 471 | 53 | 80 | 49 |
| 3100 | 0.4300 | 0.4016 | 14% | 640 | 84.9% | 4370 | 1.5% | 471 | 50 | 76 | 36 |
| 3100 | 0.4300 | 0.4016 | 21% | 611 | 76.1% | 4289 | 3.1% | 476 | 62 | 88 | 55 |
| 3100 | 0.4300 | 0.4016 | 19% | 616 | 78.9% | 4346 | 2.6% | 476 | 62 | 94 | 81 |
| 3100 | 0.4300 | 0.4016 | 17% | 620 | 80.9% | 4413 | 2.1% | 476 | 62 | 96 | 99 |
| 3100 | 0.4300 | 0.4016 | 16% | 626 | 82.5% | 4450 | 1.8% | 476 | 60 | 90 | 79 |
| 3100 | 0.4300 | 0.4016 | 15% | 631 | 83.6% | 4464 | 1.6% | 476 | 58 | 84 | 61 |
| 3100 | 0.4300 | 0.4016 | 14% | 635 | 84.4% | 4488 | 1.4% | 476 | 55 | 80 | 49 |
| 3100 | 0.4300 | 0.4016 | 14% | 640 | 85.4% | 4532 | 1.1% | 476 | 52 | 76 | 37 |
| 3100 | 0.4300 | 0.4016 | 21% | 611 | 75.9% | 4435 | 3.1% | 480 | 65 | 89 | 55 |
| 3100 | 0.4300 | 0.4016 | 19% | 616 | 78.8% | 4474 | 2.6% | 480 | 64 | 94 | 81 |
| 3100 | 0.4300 | 0.4016 | 17% | 620 | 80.9% | 4516 | 2.1% | 480 | 64 | 95 | 99 |
| 3100 | 0.4300 | 0.4016 | 16% | 626 | 82.6% | 4544 | 1.7% | 480 | 62 | 89 | 79 |
| 3100 | 0.4300 | 0.4016 | 15% | 631 | 83.7% | 4554 | 1.5% | 480 | 59 | 84 | 61 |
| 3100 | 0.4300 | 0.4016 | 14% | 635 | 84.7% | 4582 | 1.2% | 480 | 57 | 80 | 49 |
| 3100 | 0.4300 | 0.4016 | 13% | 640 | 86.3% | 4655 | 0.5% | 480 | 54 | 76 | 39 |
| 3100 | 0.4300 | 0.4016 | 21% | 611 | 75.3% | 4559 | 3.4% | 486 | 67 | 89 | 56 |
| 3100 | 0.4300 | 0.4016 | 19% | 616 | 78.6% | 4583 | 2.7% | 486 | 66 | 94 | 82 |
| 3100 | 0.4300 | 0.4016 | 17% | 620 | 80.8% | 4606 | 2.1% | 486 | 65 | 95 | 98 |
| 3100 | 0.4300 | 0.4016 | 16% | 626 | 82.7% | 4622 | 1.7% | 486 | 63 | 89 | 79 |
| 3100 | 0.4300 | 0.4016 | 15% | 631 | 84.2% | 4642 | 1.2% | 486 | 61 | 84 | 62 |
| 3100 | 0.4300 | 0.4016 | 14% | 635 | 86.1% | 4692 | 0.3% | 486 | 59 | 80 | 53 |
| 3100 | 0.4300 | 0.4016 | 13% | 640 | 87.0% | 4702 | 0.0% | 486 | 55 | 76 | 41 |
| 3100 | 0.4300 | 0.4016 | 22% | 611 | 74.4% | 4650 | 4.0% | 491 | 69 | 90 | 57 |
| 3100 | 0.4300 | 0.4016 | 19% | 616 | 78.3% | 4660 | 2.9% | 491 | 67 | 94 | 82 |
| 3100 | 0.4300 | 0.4016 | 17% | 620 | 80.7% | 4669 | 2.2% | 491 | 66 | 94 | 98 |
| 3100 | 0.4300 | 0.4016 | 16% | 626 | 83.1% | 4681 | 1.4% | 491 | 64 | 89 | 79 |
| 3100 | 0.4300 | 0.4016 | 14% | 631 | 85.8% | 4710 | 0.1% | 491 | 62 | 84 | 65 |
| 3100 | 0.4300 | 0.4016 | 14% | 635 | 86.5% | 4707 | 0.0% | 491 | 59 | 80 | 54 |
| 3100 | 0.4300 | 0.4016 | 13% | 640 | 87.0% | 4702 | 0.0% | 491 | 55 | 76 | 41 |
| 3100 | 0.4300 | 0.4016 | 22% | 611 | 73.5% | 4715 | 4.6% | 496 | 69 | 90 | 58 |
| 3100 | 0.4300 | 0.4016 | 19% | 616 | 78.0% | 4707 | 3.2% | 496 | 68 | 94 | 83 |
| 3100 | 0.4300 | 0.4016 | 17% | 620 | 80.7% | 4705 | 2.2% | 496 | 67 | 94 | 97 |
| 3100 | 0.4300 | 0.4016 | 15% | 626 | 84.0% | 4711 | 0.8% | 496 | 65 | 88 | 81 |
| 3100 | 0.4300 | 0.4016 | 14% | 631 | 86.0% | 4713 | 0.0% | 496 | 62 | 84 | 66 |
| 3100 | 0.4300 | 0.4016 | 14% | 635 | 86.5% | 4707 | 0.0% | 496 | 59 | 80 | 54 |
| 3100 | 0.4300 | 0.4016 | 13% | 640 | 87.0% | 4702 | 0.0% | 496 | 55 | 76 | 41 |

TABLE 2-continued

| | | | | | | | | | | | |
|---|---|---|---|---|---|---|---|---|---|---|---|
| 3100 | 0.4300 | 0.4016 | 22% | 611 | 72.4% | 4783 | 5.4% | 502 | 70 | 91 | 59 |
| 3100 | 0.4300 | 0.4016 | 19% | 616 | 77.5% | 4750 | 3.5% | 502 | 69 | 93 | 83 |
| 3100 | 0.4300 | 0.4016 | 17% | 620 | 80.7% | 4734 | 2.2% | 502 | 67 | 93 | 96 |
| 3100 | 0.4300 | 0.4016 | 15% | 626 | 84.9% | 4722 | 0.2% | 502 | 66 | 88 | 82 |
| 3100 | 0.4300 | 0.4016 | 14% | 631 | 86.0% | 4713 | 0.0% | 502 | 62 | 84 | 66 |
| 3100 | 0.4300 | 0.4016 | 14% | 635 | 86.5% | 4707 | 0.0% | 502 | 59 | 80 | 54 |
| 3100 | 0.4300 | 0.4016 | 13% | 640 | 87.0% | 4702 | 0.0% | 502 | 55 | 76 | 41 |
| 3100 | 0.4300 | 0.4016 | 23% | 611 | 71.1% | 4841 | 6.3% | 508 | 71 | 90 | 60 |
| 3100 | 0.4300 | 0.4016 | 19% | 616 | 77.1% | 4782 | 3.9% | 508 | 69 | 93 | 84 |
| 3100 | 0.4300 | 0.4016 | 17% | 620 | 80.9% | 4750 | 2.2% | 508 | 68 | 93 | 96 |
| 3100 | 0.4300 | 0.4016 | 15% | 626 | 85.2% | 4722 | 0.0% | 508 | 66 | 88 | 83 |
| 3100 | 0.4300 | 0.4016 | 14% | 631 | 86.0% | 4713 | 0.0% | 508 | 62 | 84 | 66 |
| 3100 | 0.4300 | 0.4016 | 14% | 635 | 86.5% | 4707 | 0.0% | 508 | 59 | 80 | 54 |
| 3100 | 0.4300 | 0.4016 | 13% | 640 | 87.0% | 4702 | 0.0% | 508 | 55 | 76 | 41 |
| 3100 | 0.4300 | 0.4016 | 23% | 611 | 70.2% | 4883 | 7.0% | 514 | 72 | 90 | 60 |
| 3100 | 0.4300 | 0.4016 | 19% | 616 | 76.6% | 4803 | 4.3% | 514 | 70 | 92 | 84 |
| 3100 | 0.4300 | 0.4016 | 17% | 620 | 81.1% | 4758 | 2.1% | 514 | 68 | 92 | 96 |
| 3100 | 0.4300 | 0.4016 | 15% | 626 | 85.2% | 4722 | 0.0% | 514 | 66 | 88 | 83 |
| 3100 | 0.4300 | 0.4016 | 14% | 631 | 86.0% | 4713 | 0.0% | 514 | 62 | 84 | 66 |
| 3100 | 0.4300 | 0.4016 | 14% | 635 | 86.5% | 4707 | 0.0% | 514 | 59 | 80 | 54 |
| 3100 | 0.4300 | 0.4016 | 13% | 640 | 87.0% | 4702 | 0.0% | 514 | 55 | 76 | 41 |
| 3100 | 0.4300 | 0.4016 | 23% | 611 | 68.9% | 4929 | 8.1% | 521 | 73 | 90 | 61 |
| 3100 | 0.4300 | 0.4016 | 19% | 616 | 75.8% | 4826 | 4.9% | 521 | 70 | 92 | 85 |
| 3100 | 0.4300 | 0.4016 | 17% | 620 | 81.4% | 4761 | 2.0% | 521 | 68 | 92 | 96 |
| 3100 | 0.4300 | 0.4016 | 15% | 626 | 85.2% | 4722 | 0.0% | 521 | 66 | 88 | 83 |
| 3100 | 0.4300 | 0.4016 | 14% | 631 | 86.0% | 4713 | 0.0% | 521 | 62 | 84 | 66 |
| 3100 | 0.4300 | 0.4016 | 14% | 635 | 86.5% | 4707 | 0.0% | 521 | 59 | 80 | 54 |
| 3100 | 0.4300 | 0.4016 | 13% | 640 | 87.0% | 4702 | 0.0% | 521 | 55 | 76 | 41 |
| 3100 | 0.4300 | 0.4016 | 23% | 611 | 67.2% | 4975 | 9.4% | 527 | 74 | 89 | 62 |
| 3100 | 0.4300 | 0.4016 | 19% | 616 | 74.9% | 4846 | 5.7% | 527 | 71 | 92 | 85 |
| 3100 | 0.4300 | 0.4016 | 17% | 620 | 81.6% | 4761 | 1.8% | 527 | 69 | 92 | 95 |
| 3100 | 0.4300 | 0.4016 | 15% | 626 | 85.2% | 4722 | 0.0% | 527 | 66 | 88 | 83 |
| 3100 | 0.4300 | 0.4016 | 14% | 631 | 86.0% | 4713 | 0.0% | 527 | 62 | 84 | 66 |
| 3100 | 0.4300 | 0.4016 | 14% | 635 | 86.5% | 4707 | 0.0% | 527 | 59 | 80 | 54 |
| 3100 | 0.4300 | 0.4016 | 13% | 640 | 87.0% | 4702 | 0.0% | 527 | 55 | 76 | 41 |
| 3100 | 0.4300 | 0.4016 | 24% | 611 | 63.9% | 5060 | 12.1% | 534 | 75 | 89 | 63 |
| 3100 | 0.4300 | 0.4016 | 20% | 616 | 73.6% | 4874 | 6.8% | 534 | 71 | 91 | 86 |
| 3100 | 0.4300 | 0.4016 | 16% | 620 | 82.2% | 4757 | 1.4% | 534 | 69 | 92 | 95 |
| 3100 | 0.4300 | 0.4016 | 15% | 626 | 85.2% | 4722 | 0.0% | 534 | 66 | 88 | 83 |
| 3100 | 0.4300 | 0.4016 | 14% | 631 | 86.0% | 4713 | 0.0% | 534 | 62 | 84 | 66 |
| 3100 | 0.4300 | 0.4016 | 14% | 635 | 86.5% | 4707 | 0.0% | 534 | 59 | 80 | 54 |
| 3100 | 0.4300 | 0.4016 | 13% | 640 | 87.0% | 4702 | 0.0% | 534 | 55 | 76 | 41 |
| 3100 | 0.4300 | 0.4016 | 25% | 611 | 57.9% | 5235 | 16.9% | 540 | 76 | 88 | 65 |
| 3100 | 0.4300 | 0.4016 | 20% | 616 | 72.1% | 4905 | 8.2% | 540 | 72 | 91 | 86 |
| 3100 | 0.4300 | 0.4016 | 16% | 620 | 83.2% | 4746 | 0.7% | 540 | 69 | 91 | 94 |
| 3100 | 0.4300 | 0.4016 | 15% | 626 | 85.2% | 4722 | 0.0% | 540 | 66 | 88 | 83 |
| 3100 | 0.4300 | 0.4016 | 14% | 631 | 86.0% | 4713 | 0.0% | 540 | 62 | 84 | 66 |
| 3100 | 0.4300 | 0.4016 | 14% | 635 | 86.5% | 4707 | 0.0% | 540 | 59 | 80 | 54 |
| 3100 | 0.4300 | 0.4016 | 13% | 640 | 87.0% | 4702 | 0.0% | 540 | 55 | 76 | 41 |
| 3000 | 0.4369 | 0.4041 | 21% | 611 | 77.4% | 4131 | 1.8% | 467 | 57 | 86 | 53 |
| 3000 | 0.4369 | 0.4041 | 19% | 616 | 79.5% | 4131 | 1.8% | 467 | 56 | 93 | 79 |
| 3000 | 0.4369 | 0.4041 | 17% | 620 | 80.8% | 4131 | 1.7% | 467 | 54 | 95 | 98 |
| 3000 | 0.4369 | 0.4041 | 16% | 626 | 82.0% | 4131 | 1.7% | 467 | 52 | 89 | 78 |
| 3000 | 0.4369 | 0.4041 | 15% | 631 | 82.8% | 4131 | 1.7% | 467 | 50 | 83 | 60 |
| 3000 | 0.4369 | 0.4041 | 15% | 635 | 83.4% | 4131 | 1.7% | 467 | 47 | 79 | 46 |
| 3000 | 0.4369 | 0.4041 | 14% | 640 | 84.2% | 4180 | 1.5% | 467 | 46 | 75 | 33 |
| 3000 | 0.4369 | 0.4041 | 22% | 611 | 75.9% | 4131 | 2.6% | 471 | 57 | 88 | 53 |
| 3000 | 0.4369 | 0.4041 | 19% | 616 | 78.2% | 4137 | 2.5% | 471 | 56 | 94 | 80 |
| 3000 | 0.4369 | 0.4041 | 18% | 620 | 80.2% | 4237 | 2.0% | 471 | 58 | 95 | 99 |
| 3000 | 0.4369 | 0.4041 | 16% | 626 | 81.9% | 4300 | 1.6% | 471 | 57 | 89 | 78 |
| 3000 | 0.4369 | 0.4041 | 16% | 631 | 83.0% | 4321 | 1.5% | 471 | 55 | 83 | 59 |
| 3000 | 0.4369 | 0.4041 | 15% | 635 | 83.8% | 4356 | 1.3% | 471 | 53 | 79 | 46 |
| 3000 | 0.4369 | 0.4041 | 14% | 640 | 84.6% | 4399 | 1.1% | 471 | 50 | 75 | 33 |
| 3000 | 0.4369 | 0.4041 | 22% | 611 | 75.3% | 4279 | 2.8% | 476 | 62 | 88 | 54 |
| 3000 | 0.4369 | 0.4041 | 19% | 616 | 78.3% | 4345 | 2.3% | 476 | 62 | 94 | 80 |
| 3000 | 0.4369 | 0.4041 | 18% | 620 | 80.4% | 4407 | 1.8% | 476 | 62 | 95 | 99 |
| 3000 | 0.4369 | 0.4041 | 16% | 626 | 82.1% | 4450 | 1.4% | 476 | 61 | 89 | 78 |
| 3000 | 0.4369 | 0.4041 | 16% | 631 | 83.2% | 4462 | 1.3% | 476 | 58 | 83 | 59 |
| 3000 | 0.4369 | 0.4041 | 15% | 635 | 84.0% | 4487 | 1.1% | 476 | 55 | 79 | 46 |
| 3000 | 0.4369 | 0.4041 | 14% | 640 | 85.0% | 4526 | 0.8% | 476 | 52 | 75 | 34 |
| 3000 | 0.4369 | 0.4041 | 22% | 611 | 75.1% | 4412 | 2.9% | 480 | 65 | 89 | 54 |
| 3000 | 0.4369 | 0.4041 | 19% | 616 | 78.3% | 4458 | 2.3% | 480 | 65 | 94 | 81 |
| 3000 | 0.4369 | 0.4041 | 18% | 620 | 80.4% | 4500 | 1.8% | 480 | 64 | 95 | 99 |
| 3000 | 0.4369 | 0.4041 | 16% | 626 | 82.2% | 4527 | 1.4% | 480 | 62 | 89 | 77 |
| 3000 | 0.4369 | 0.4041 | 16% | 631 | 83.3% | 4536 | 1.2% | 480 | 59 | 83 | 59 |
| 3000 | 0.4369 | 0.4041 | 15% | 635 | 84.3% | 4562 | 0.9% | 480 | 56 | 79 | 47 |
| 3000 | 0.4369 | 0.4041 | 14% | 640 | 85.8% | 4627 | 0.2% | 480 | 53 | 74 | 36 |
| 3000 | 0.4369 | 0.4041 | 22% | 611 | 74.6% | 4524 | 3.1% | 486 | 67 | 89 | 55 |
| 3000 | 0.4369 | 0.4041 | 20% | 616 | 78.2% | 4554 | 2.3% | 486 | 66 | 94 | 81 |
| 3000 | 0.4369 | 0.4041 | 18% | 620 | 80.4% | 4577 | 1.8% | 486 | 65 | 94 | 98 |

TABLE 2-continued

| | | | | | | | | | | |
|---|---|---|---|---|---|---|---|---|---|---|
| 3000 | 0.4369 | 0.4041 | 16% | 626 | 82.3% | 4592 | 1.3% | 486 | 63 | 88 | 77 |
| 3000 | 0.4369 | 0.4041 | 15% | 631 | 83.8% | 4609 | 0.9% | 486 | 60 | 83 | 60 |
| 3000 | 0.4369 | 0.4041 | 14% | 635 | 85.6% | 4656 | 0.0% | 486 | 58 | 79 | 50 |
| 3000 | 0.4369 | 0.4041 | 14% | 640 | 86.1% | 4650 | 0.0% | 486 | 54 | 74 | 37 |
| 3000 | 0.4369 | 0.4041 | 23% | 611 | 73.8% | 4606 | 3.7% | 491 | 69 | 90 | 55 |
| 3000 | 0.4369 | 0.4041 | 20% | 616 | 77.9% | 4620 | 2.5% | 491 | 67 | 93 | 82 |
| 3000 | 0.4369 | 0.4041 | 18% | 620 | 80.4% | 4629 | 1.8% | 491 | 66 | 94 | 97 |
| 3000 | 0.4369 | 0.4041 | 16% | 626 | 82.7% | 4640 | 1.0% | 491 | 64 | 88 | 78 |
| 3000 | 0.4369 | 0.4041 | 15% | 631 | 85.1% | 4661 | 0.0% | 491 | 62 | 83 | 63 |
| 3000 | 0.4369 | 0.4041 | 14% | 635 | 85.6% | 4656 | 0.0% | 491 | 58 | 79 | 50 |
| 3000 | 0.4369 | 0.4041 | 14% | 640 | 86.1% | 4650 | 0.0% | 491 | 54 | 74 | 37 |
| 3000 | 0.4369 | 0.4041 | 23% | 611 | 73.0% | 4665 | 4.2% | 496 | 70 | 90 | 56 |
| 3000 | 0.4369 | 0.4041 | 20% | 616 | 77.6% | 4660 | 2.7% | 496 | 68 | 93 | 82 |
| 3000 | 0.4369 | 0.4041 | 18% | 620 | 80.4% | 4658 | 1.8% | 496 | 67 | 93 | 97 |
| 3000 | 0.4369 | 0.4041 | 16% | 626 | 83.8% | 4666 | 0.3% | 496 | 65 | 88 | 80 |
| 3000 | 0.4369 | 0.4041 | 15% | 631 | 85.1% | 4661 | 0.0% | 496 | 62 | 83 | 63 |
| 3000 | 0.4369 | 0.4041 | 14% | 635 | 85.6% | 4656 | 0.0% | 496 | 58 | 79 | 50 |
| 3000 | 0.4369 | 0.4041 | 14% | 640 | 86.1% | 4650 | 0.0% | 496 | 54 | 74 | 37 |
| 3000 | 0.4369 | 0.4041 | 23% | 611 | 71.9% | 4724 | 4.9% | 502 | 70 | 90 | 57 |
| 3000 | 0.4369 | 0.4041 | 20% | 616 | 77.3% | 4695 | 3.0% | 502 | 69 | 93 | 82 |
| 3000 | 0.4369 | 0.4041 | 18% | 620 | 80.5% | 4680 | 1.7% | 502 | 67 | 93 | 96 |
| 3000 | 0.4369 | 0.4041 | 16% | 626 | 84.3% | 4671 | 0.0% | 502 | 65 | 88 | 81 |
| 3000 | 0.4369 | 0.4041 | 15% | 631 | 85.1% | 4661 | 0.0% | 502 | 62 | 83 | 63 |
| 3000 | 0.4369 | 0.4041 | 14% | 635 | 85.6% | 4656 | 0.0% | 502 | 58 | 79 | 50 |
| 3000 | 0.4369 | 0.4041 | 14% | 640 | 86.1% | 4650 | 0.0% | 502 | 54 | 74 | 37 |
| 3000 | 0.4369 | 0.4041 | 23% | 611 | 70.7% | 4775 | 5.8% | 508 | 71 | 90 | 58 |
| 3000 | 0.4369 | 0.4041 | 20% | 616 | 76.9% | 4720 | 3.3% | 508 | 69 | 93 | 83 |
| 3000 | 0.4369 | 0.4041 | 18% | 620 | 80.8% | 4693 | 1.6% | 508 | 68 | 92 | 96 |
| 3000 | 0.4369 | 0.4041 | 16% | 626 | 84.3% | 4671 | 0.0% | 508 | 65 | 88 | 81 |
| 3000 | 0.4369 | 0.4041 | 15% | 631 | 85.1% | 4661 | 0.0% | 508 | 62 | 83 | 63 |
| 3000 | 0.4369 | 0.4041 | 14% | 635 | 85.6% | 4656 | 0.0% | 508 | 58 | 79 | 50 |
| 3000 | 0.4369 | 0.4041 | 14% | 640 | 86.1% | 4650 | 0.0% | 508 | 54 | 74 | 37 |
| 3000 | 0.4369 | 0.4041 | 24% | 611 | 69.8% | 4812 | 6.5% | 514 | 72 | 90 | 59 |
| 3000 | 0.4369 | 0.4041 | 20% | 616 | 76.6% | 4737 | 3.6% | 514 | 70 | 92 | 83 |
| 3000 | 0.4369 | 0.4041 | 18% | 620 | 81.0% | 4697 | 1.5% | 514 | 68 | 92 | 96 |
| 3000 | 0.4369 | 0.4041 | 16% | 626 | 84.3% | 4671 | 0.0% | 514 | 65 | 88 | 81 |
| 3000 | 0.4369 | 0.4041 | 15% | 631 | 85.1% | 4661 | 0.0% | 514 | 62 | 83 | 63 |
| 3000 | 0.4369 | 0.4041 | 14% | 635 | 85.6% | 4656 | 0.0% | 514 | 58 | 79 | 50 |
| 3000 | 0.4369 | 0.4041 | 14% | 640 | 86.1% | 4650 | 0.0% | 514 | 54 | 74 | 37 |
| 3000 | 0.4369 | 0.4041 | 24% | 611 | 68.7% | 4851 | 7.4% | 521 | 73 | 90 | 59 |
| 3000 | 0.4369 | 0.4041 | 20% | 616 | 76.0% | 4754 | 4.1% | 521 | 70 | 92 | 83 |
| 3000 | 0.4369 | 0.4041 | 17% | 620 | 81.4% | 4698 | 1.2% | 521 | 68 | 92 | 96 |
| 3000 | 0.4369 | 0.4041 | 16% | 626 | 84.3% | 4671 | 0.0% | 521 | 65 | 88 | 81 |
| 3000 | 0.4369 | 0.4041 | 15% | 631 | 85.1% | 4661 | 0.0% | 521 | 62 | 83 | 63 |
| 3000 | 0.4369 | 0.4041 | 14% | 635 | 85.6% | 4656 | 0.0% | 521 | 58 | 79 | 50 |
| 3000 | 0.4369 | 0.4041 | 14% | 640 | 86.1% | 4650 | 0.0% | 521 | 54 | 74 | 37 |
| 3000 | 0.4369 | 0.4041 | 24% | 611 | 67.3% | 4887 | 8.6% | 527 | 74 | 89 | 60 |
| 3000 | 0.4369 | 0.4041 | 20% | 616 | 75.3% | 4769 | 4.7% | 527 | 71 | 92 | 84 |
| 3000 | 0.4369 | 0.4041 | 17% | 620 | 81.7% | 4696 | 1.0% | 527 | 68 | 92 | 95 |
| 3000 | 0.4369 | 0.4041 | 16% | 626 | 84.3% | 4671 | 0.0% | 527 | 65 | 88 | 81 |
| 3000 | 0.4369 | 0.4041 | 15% | 631 | 85.1% | 4661 | 0.0% | 527 | 62 | 83 | 63 |
| 3000 | 0.4369 | 0.4041 | 14% | 635 | 85.6% | 4656 | 0.0% | 527 | 58 | 79 | 50 |
| 3000 | 0.4369 | 0.4041 | 14% | 640 | 86.1% | 4650 | 0.0% | 527 | 54 | 74 | 37 |
| 3000 | 0.4369 | 0.4041 | 25% | 611 | 64.4% | 4954 | 10.9% | 534 | 74 | 89 | 61 |
| 3000 | 0.4369 | 0.4041 | 20% | 616 | 74.2% | 4790 | 5.6% | 534 | 71 | 91 | 84 |
| 3000 | 0.4369 | 0.4041 | 17% | 620 | 82.4% | 4691 | 0.6% | 534 | 68 | 92 | 95 |
| 3000 | 0.4369 | 0.4041 | 16% | 626 | 84.3% | 4671 | 0.0% | 534 | 65 | 88 | 81 |
| 3000 | 0.4369 | 0.4041 | 15% | 631 | 85.1% | 4661 | 0.0% | 534 | 62 | 83 | 63 |
| 3000 | 0.4369 | 0.4041 | 14% | 635 | 85.6% | 4656 | 0.0% | 534 | 58 | 79 | 50 |
| 3000 | 0.4369 | 0.4041 | 14% | 640 | 86.1% | 4650 | 0.0% | 534 | 54 | 74 | 37 |
| 3000 | 0.4369 | 0.4041 | 26% | 611 | 59.1% | 5087 | 15.1% | 540 | 75 | 88 | 62 |
| 3000 | 0.4369 | 0.4041 | 20% | 616 | 72.9% | 4813 | 6.8% | 540 | 71 | 91 | 85 |
| 3000 | 0.4369 | 0.4041 | 17% | 620 | 83.2% | 4683 | 0.0% | 540 | 68 | 92 | 95 |
| 3000 | 0.4369 | 0.4041 | 16% | 626 | 84.3% | 4671 | 0.0% | 540 | 65 | 88 | 81 |
| 3000 | 0.4369 | 0.4041 | 15% | 631 | 85.1% | 4661 | 0.0% | 540 | 62 | 83 | 63 |
| 3000 | 0.4369 | 0.4041 | 14% | 635 | 85.6% | 4656 | 0.0% | 540 | 58 | 79 | 50 |
| 3000 | 0.4369 | 0.4041 | 14% | 640 | 86.1% | 4650 | 0.0% | 540 | 54 | 74 | 37 |
| 2900 | 0.4442 | 0.4064 | 22% | 611 | 76.3% | 4131 | 1.6% | 467 | 58 | 87 | 51 |
| 2900 | 0.4442 | 0.4064 | 20% | 616 | 78.6% | 4131 | 1.6% | 467 | 56 | 93 | 79 |
| 2900 | 0.4442 | 0.4064 | 18% | 620 | 79.9% | 4131 | 1.6% | 467 | 54 | 94 | 99 |
| 2900 | 0.4442 | 0.4064 | 17% | 626 | 81.2% | 4131 | 1.6% | 467 | 52 | 88 | 77 |
| 2900 | 0.4442 | 0.4064 | 16% | 631 | 82.1% | 4140 | 1.5% | 467 | 50 | 82 | 57 |
| 2900 | 0.4442 | 0.4064 | 16% | 635 | 83.0% | 4202 | 1.3% | 467 | 50 | 78 | 43 |
| 2900 | 0.4442 | 0.4064 | 15% | 640 | 83.9% | 4275 | 1.0% | 467 | 47 | 73 | 30 |
| 2900 | 0.4442 | 0.4064 | 23% | 611 | 75.0% | 4131 | 2.3% | 471 | 58 | 88 | 52 |
| 2900 | 0.4442 | 0.4064 | 20% | 616 | 77.6% | 4166 | 2.1% | 471 | 57 | 94 | 80 |
| 2900 | 0.4442 | 0.4064 | 19% | 620 | 79.6% | 4258 | 1.7% | 471 | 59 | 94 | 99 |
| 2900 | 0.4442 | 0.4064 | 17% | 626 | 81.5% | 4335 | 1.3% | 471 | 59 | 88 | 76 |
| 2900 | 0.4442 | 0.4064 | 16% | 631 | 82.5% | 4352 | 1.1% | 471 | 56 | 82 | 57 |
| 2900 | 0.4442 | 0.4064 | 16% | 635 | 83.4% | 4390 | 1.0% | 471 | 54 | 78 | 44 |

TABLE 2-continued

| | | | | | | | | | | | |
|---|---|---|---|---|---|---|---|---|---|---|---|
| 2900 | 0.4442 | 0.4064 | 15% | 640 | 84.2% | 4434 | 0.7% | 471 | 50 | 73 | 30 |
| 2900 | 0.4442 | 0.4064 | 23% | 611 | 74.5% | 4270 | 2.5% | 476 | 62 | 88 | 52 |
| 2900 | 0.4442 | 0.4064 | 20% | 616 | 77.7% | 4348 | 1.9% | 476 | 63 | 94 | 80 |
| 2900 | 0.4442 | 0.4064 | 19% | 620 | 79.8% | 4406 | 1.5% | 476 | 62 | 94 | 99 |
| 2900 | 0.4442 | 0.4064 | 17% | 626 | 81.6% | 4453 | 1.1% | 476 | 61 | 88 | 76 |
| 2900 | 0.4442 | 0.4064 | 16% | 631 | 82.7% | 4463 | 1.0% | 476 | 58 | 82 | 57 |
| 2900 | 0.4442 | 0.4064 | 16% | 635 | 83.6% | 4489 | 0.8% | 476 | 55 | 78 | 44 |
| 2900 | 0.4442 | 0.4064 | 15% | 640 | 84.5% | 4525 | 0.5% | 476 | 51 | 73 | 30 |
| 2900 | 0.4442 | 0.4064 | 23% | 611 | 74.3% | 4390 | 2.6% | 480 | 65 | 89 | 52 |
| 2900 | 0.4442 | 0.4064 | 20% | 616 | 77.7% | 4447 | 1.9% | 480 | 65 | 94 | 80 |
| 2900 | 0.4442 | 0.4064 | 19% | 620 | 79.9% | 4485 | 1.4% | 480 | 64 | 94 | 98 |
| 2900 | 0.4442 | 0.4064 | 17% | 626 | 81.7% | 4514 | 1.0% | 480 | 62 | 88 | 76 |
| 2900 | 0.4442 | 0.4064 | 16% | 631 | 82.8% | 4521 | 0.9% | 480 | 59 | 82 | 57 |
| 2900 | 0.4442 | 0.4064 | 16% | 635 | 83.9% | 4545 | 0.6% | 480 | 56 | 77 | 44 |
| 2900 | 0.4442 | 0.4064 | 15% | 640 | 85.3% | 4600 | 0.0% | 480 | 52 | 73 | 32 |
| 2900 | 0.4442 | 0.4064 | 23% | 611 | 73.8% | 4491 | 2.9% | 486 | 67 | 89 | 53 |
| 2900 | 0.4442 | 0.4064 | 20% | 616 | 77.6% | 4527 | 1.9% | 486 | 67 | 93 | 80 |
| 2900 | 0.4442 | 0.4064 | 19% | 620 | 79.9% | 4549 | 1.4% | 486 | 65 | 94 | 98 |
| 2900 | 0.4442 | 0.4064 | 17% | 626 | 81.8% | 4564 | 0.9% | 486 | 63 | 87 | 76 |
| 2900 | 0.4442 | 0.4064 | 16% | 631 | 83.3% | 4577 | 0.6% | 486 | 60 | 82 | 58 |
| 2900 | 0.4442 | 0.4064 | 15% | 635 | 84.7% | 4605 | 0.0% | 486 | 57 | 77 | 46 |
| 2900 | 0.4442 | 0.4064 | 15% | 640 | 85.3% | 4600 | 0.0% | 486 | 52 | 73 | 32 |
| 2900 | 0.4442 | 0.4064 | 24% | 611 | 73.0% | 4564 | 3.4% | 491 | 69 | 89 | 54 |
| 2900 | 0.4442 | 0.4064 | 20% | 616 | 77.4% | 4581 | 2.1% | 491 | 67 | 93 | 81 |
| 2900 | 0.4442 | 0.4064 | 19% | 620 | 80.0% | 4591 | 1.3% | 491 | 66 | 93 | 97 |
| 2900 | 0.4442 | 0.4064 | 17% | 626 | 82.3% | 4601 | 0.6% | 491 | 64 | 87 | 77 |
| 2900 | 0.4442 | 0.4064 | 16% | 631 | 84.2% | 4611 | 0.0% | 491 | 61 | 82 | 60 |
| 2900 | 0.4442 | 0.4064 | 15% | 635 | 84.7% | 4605 | 0.0% | 491 | 57 | 77 | 46 |
| 2900 | 0.4442 | 0.4064 | 15% | 640 | 85.3% | 4600 | 0.0% | 491 | 52 | 73 | 32 |
| 2900 | 0.4442 | 0.4064 | 24% | 611 | 72.3% | 4616 | 3.8% | 496 | 70 | 90 | 54 |
| 2900 | 0.4442 | 0.4064 | 21% | 616 | 77.2% | 4614 | 2.2% | 496 | 68 | 93 | 81 |
| 2900 | 0.4442 | 0.4064 | 19% | 620 | 80.1% | 4613 | 1.3% | 496 | 67 | 93 | 97 |
| 2900 | 0.4442 | 0.4064 | 17% | 626 | 83.3% | 4620 | 0.0% | 496 | 64 | 87 | 79 |
| 2900 | 0.4442 | 0.4064 | 16% | 631 | 84.2% | 4611 | 0.0% | 496 | 61 | 82 | 60 |
| 2900 | 0.4442 | 0.4064 | 15% | 635 | 84.7% | 4605 | 0.0% | 496 | 57 | 77 | 46 |
| 2900 | 0.4442 | 0.4064 | 15% | 640 | 85.3% | 4600 | 0.0% | 496 | 52 | 73 | 32 |
| 2900 | 0.4442 | 0.4064 | 24% | 611 | 71.4% | 4668 | 4.5% | 502 | 70 | 90 | 55 |
| 2900 | 0.4442 | 0.4064 | 21% | 616 | 77.0% | 4642 | 2.4% | 502 | 69 | 93 | 81 |
| 2900 | 0.4442 | 0.4064 | 19% | 620 | 80.3% | 4630 | 1.2% | 502 | 67 | 93 | 96 |
| 2900 | 0.4442 | 0.4064 | 17% | 626 | 83.3% | 4620 | 0.0% | 502 | 64 | 87 | 79 |
| 2900 | 0.4442 | 0.4064 | 16% | 631 | 84.2% | 4611 | 0.0% | 502 | 61 | 82 | 60 |
| 2900 | 0.4442 | 0.4064 | 15% | 635 | 84.7% | 4605 | 0.0% | 502 | 57 | 77 | 46 |
| 2900 | 0.4442 | 0.4064 | 15% | 640 | 85.3% | 4600 | 0.0% | 502 | 52 | 73 | 32 |
| 2900 | 0.4442 | 0.4064 | 24% | 611 | 70.3% | 4712 | 5.3% | 508 | 71 | 90 | 56 |
| 2900 | 0.4442 | 0.4064 | 21% | 616 | 76.8% | 4662 | 2.6% | 508 | 69 | 92 | 82 |
| 2900 | 0.4442 | 0.4064 | 18% | 620 | 80.6% | 4637 | 1.0% | 508 | 67 | 92 | 96 |
| 2900 | 0.4442 | 0.4064 | 17% | 626 | 83.3% | 4620 | 0.0% | 508 | 64 | 87 | 79 |
| 2900 | 0.4442 | 0.4064 | 16% | 631 | 84.2% | 4611 | 0.0% | 508 | 61 | 82 | 60 |
| 2900 | 0.4442 | 0.4064 | 15% | 635 | 84.7% | 4605 | 0.0% | 508 | 57 | 77 | 46 |
| 2900 | 0.4442 | 0.4064 | 15% | 640 | 85.3% | 4600 | 0.0% | 508 | 52 | 73 | 32 |
| 2900 | 0.4442 | 0.4064 | 25% | 611 | 69.4% | 4744 | 6.0% | 514 | 72 | 90 | 57 |
| 2900 | 0.4442 | 0.4064 | 21% | 616 | 76.5% | 4674 | 2.8% | 514 | 70 | 92 | 82 |
| 2900 | 0.4442 | 0.4064 | 18% | 620 | 80.9% | 4639 | 0.8% | 514 | 67 | 92 | 96 |
| 2900 | 0.4442 | 0.4064 | 17% | 626 | 83.3% | 4620 | 0.0% | 514 | 64 | 87 | 79 |
| 2900 | 0.4442 | 0.4064 | 16% | 631 | 84.2% | 4611 | 0.0% | 514 | 61 | 82 | 60 |
| 2900 | 0.4442 | 0.4064 | 15% | 635 | 84.7% | 4605 | 0.0% | 514 | 57 | 77 | 46 |
| 2900 | 0.4442 | 0.4064 | 15% | 640 | 85.3% | 4600 | 0.0% | 514 | 52 | 73 | 32 |
| 2900 | 0.4442 | 0.4064 | 25% | 611 | 68.4% | 4777 | 6.8% | 521 | 73 | 89 | 57 |
| 2900 | 0.4442 | 0.4064 | 21% | 616 | 76.1% | 4686 | 3.2% | 521 | 70 | 92 | 82 |
| 2900 | 0.4442 | 0.4064 | 18% | 620 | 81.4% | 4638 | 0.5% | 521 | 68 | 92 | 96 |
| 2900 | 0.4442 | 0.4064 | 17% | 626 | 83.3% | 4620 | 0.0% | 521 | 64 | 87 | 79 |
| 2900 | 0.4442 | 0.4064 | 16% | 631 | 84.2% | 4611 | 0.0% | 521 | 61 | 82 | 60 |
| 2900 | 0.4442 | 0.4064 | 15% | 635 | 84.7% | 4605 | 0.0% | 521 | 57 | 77 | 46 |
| 2900 | 0.4442 | 0.4064 | 15% | 640 | 85.3% | 4600 | 0.0% | 521 | 52 | 73 | 32 |
| 2900 | 0.4442 | 0.4064 | 25% | 611 | 67.2% | 4806 | 7.8% | 527 | 73 | 89 | 58 |
| 2900 | 0.4442 | 0.4064 | 21% | 616 | 75.6% | 4697 | 3.6% | 527 | 70 | 92 | 82 |
| 2900 | 0.4442 | 0.4064 | 18% | 620 | 81.8% | 4635 | 0.2% | 527 | 68 | 92 | 96 |
| 2900 | 0.4442 | 0.4064 | 17% | 626 | 83.3% | 4620 | 0.0% | 527 | 64 | 87 | 79 |
| 2900 | 0.4442 | 0.4064 | 16% | 631 | 84.2% | 4611 | 0.0% | 527 | 61 | 82 | 60 |
| 2900 | 0.4442 | 0.4064 | 15% | 635 | 84.7% | 4605 | 0.0% | 527 | 57 | 77 | 46 |
| 2900 | 0.4442 | 0.4064 | 15% | 640 | 85.3% | 4600 | 0.0% | 527 | 52 | 73 | 32 |
| 2900 | 0.4442 | 0.4064 | 25% | 611 | 64.9% | 4856 | 9.6% | 534 | 74 | 89 | 58 |
| 2900 | 0.4442 | 0.4064 | 21% | 616 | 74.8% | 4711 | 4.3% | 534 | 70 | 91 | 83 |
| 2900 | 0.4442 | 0.4064 | 18% | 620 | 82.1% | 4632 | 0.0% | 534 | 68 | 92 | 95 |
| 2900 | 0.4442 | 0.4064 | 17% | 626 | 83.3% | 4620 | 0.0% | 534 | 64 | 87 | 79 |
| 2900 | 0.4442 | 0.4064 | 16% | 631 | 84.2% | 4611 | 0.0% | 534 | 61 | 82 | 60 |
| 2900 | 0.4442 | 0.4064 | 15% | 635 | 84.7% | 4605 | 0.0% | 534 | 57 | 77 | 46 |
| 2900 | 0.4442 | 0.4064 | 15% | 640 | 85.3% | 4600 | 0.0% | 534 | 52 | 73 | 32 |
| 2900 | 0.4442 | 0.4064 | 26% | 611 | 60.5% | 4952 | 13.2% | 540 | 75 | 88 | 60 |
| 2900 | 0.4442 | 0.4064 | 21% | 616 | 73.8% | 4726 | 5.2% | 540 | 71 | 91 | 83 |

TABLE 2-continued

| | | | | | | | | | | | |
|---|---|---|---|---|---|---|---|---|---|---|---|
| 2900 | 0.4442 | 0.4064 | 18% | 620 | 82.1% | 4632 | 0.0% | 540 | 68 | 92 | 95 |
| 2900 | 0.4442 | 0.4064 | 17% | 626 | 83.3% | 4620 | 0.0% | 540 | 64 | 87 | 79 |
| 2900 | 0.4442 | 0.4064 | 16% | 631 | 84.2% | 4611 | 0.0% | 540 | 61 | 82 | 60 |
| 2900 | 0.4442 | 0.4064 | 15% | 635 | 84.7% | 4605 | 0.0% | 540 | 57 | 77 | 46 |
| 2900 | 0.4442 | 0.4064 | 15% | 640 | 85.3% | 4600 | 0.0% | 540 | 52 | 73 | 32 |
| 2800 | 0.4519 | 0.4086 | 23% | 611 | 75.2% | 4131 | 1.5% | 467 | 58 | 87 | 50 |
| 2800 | 0.4519 | 0.4086 | 21% | 616 | 77.5% | 4131 | 1.4% | 467 | 56 | 93 | 78 |
| 2800 | 0.4519 | 0.4086 | 20% | 620 | 79.0% | 4131 | 1.4% | 467 | 55 | 94 | 98 |
| 2800 | 0.4519 | 0.4086 | 18% | 626 | 80.7% | 4211 | 1.1% | 467 | 55 | 87 | 75 |
| 2800 | 0.4519 | 0.4086 | 17% | 631 | 81.8% | 4237 | 1.0% | 467 | 53 | 81 | 55 |
| 2800 | 0.4519 | 0.4086 | 16% | 635 | 82.7% | 4306 | 0.8% | 467 | 52 | 76 | 41 |
| 2800 | 0.4519 | 0.4086 | 16% | 640 | 83.7% | 4388 | 0.5% | 467 | 49 | 71 | 27 |
| 2800 | 0.4519 | 0.4086 | 24% | 611 | 74.0% | 4131 | 2.1% | 471 | 58 | 88 | 50 |
| 2800 | 0.4519 | 0.4086 | 21% | 616 | 77.0% | 4206 | 1.7% | 471 | 59 | 93 | 79 |
| 2800 | 0.4519 | 0.4086 | 20% | 620 | 79.0% | 4286 | 1.3% | 471 | 60 | 94 | 98 |
| 2800 | 0.4519 | 0.4086 | 18% | 626 | 81.0% | 4377 | 0.8% | 471 | 60 | 87 | 75 |
| 2800 | 0.4519 | 0.4086 | 17% | 631 | 82.1% | 4389 | 0.8% | 471 | 57 | 81 | 55 |
| 2800 | 0.4519 | 0.4086 | 16% | 635 | 83.0% | 4429 | 0.6% | 471 | 54 | 76 | 41 |
| 2800 | 0.4519 | 0.4086 | 16% | 640 | 83.8% | 4475 | 0.3% | 471 | 50 | 71 | 27 |
| 2800 | 0.4519 | 0.4086 | 24% | 611 | 73.6% | 4263 | 2.3% | 476 | 63 | 88 | 50 |
| 2800 | 0.4519 | 0.4086 | 21% | 616 | 77.1% | 4356 | 1.5% | 476 | 64 | 93 | 79 |
| 2800 | 0.4519 | 0.4086 | 20% | 620 | 79.2% | 4409 | 1.1% | 476 | 63 | 93 | 98 |
| 2800 | 0.4519 | 0.4086 | 18% | 626 | 81.1% | 4461 | 0.7% | 476 | 61 | 87 | 75 |
| 2800 | 0.4519 | 0.4086 | 17% | 631 | 82.2% | 4468 | 0.6% | 476 | 58 | 81 | 55 |
| 2800 | 0.4519 | 0.4086 | 16% | 635 | 83.1% | 4494 | 0.4% | 476 | 55 | 76 | 41 |
| 2800 | 0.4519 | 0.4086 | 16% | 640 | 84.1% | 4529 | 0.2% | 476 | 51 | 71 | 27 |
| 2800 | 0.4519 | 0.4086 | 24% | 611 | 73.4% | 4369 | 2.3% | 480 | 66 | 88 | 51 |
| 2800 | 0.4519 | 0.4086 | 21% | 616 | 77.1% | 4436 | 1.5% | 480 | 65 | 93 | 79 |
| 2800 | 0.4519 | 0.4086 | 20% | 620 | 79.3% | 4473 | 1.1% | 480 | 64 | 93 | 98 |
| 2800 | 0.4519 | 0.4086 | 18% | 626 | 81.2% | 4504 | 0.6% | 480 | 62 | 87 | 75 |
| 2800 | 0.4519 | 0.4086 | 17% | 631 | 82.4% | 4509 | 0.5% | 480 | 59 | 81 | 55 |
| 2800 | 0.4519 | 0.4086 | 16% | 635 | 83.4% | 4532 | 0.2% | 480 | 56 | 76 | 42 |
| 2800 | 0.4519 | 0.4086 | 16% | 640 | 84.3% | 4551 | 0.0% | 480 | 51 | 71 | 28 |
| 2800 | 0.4519 | 0.4086 | 24% | 611 | 73.0% | 4459 | 2.6% | 486 | 68 | 89 | 51 |
| 2800 | 0.4519 | 0.4086 | 21% | 616 | 77.0% | 4501 | 1.6% | 486 | 67 | 93 | 80 |
| 2800 | 0.4519 | 0.4086 | 20% | 620 | 79.4% | 4524 | 1.0% | 486 | 65 | 93 | 97 |
| 2800 | 0.4519 | 0.4086 | 18% | 626 | 81.4% | 4538 | 0.5% | 486 | 63 | 87 | 75 |
| 2800 | 0.4519 | 0.4086 | 17% | 631 | 82.8% | 4548 | 0.2% | 486 | 60 | 81 | 56 |
| 2800 | 0.4519 | 0.4086 | 16% | 635 | 83.8% | 4556 | 0.0% | 486 | 56 | 76 | 42 |
| 2800 | 0.4519 | 0.4086 | 16% | 640 | 84.3% | 4551 | 0.0% | 486 | 51 | 71 | 28 |
| 2800 | 0.4519 | 0.4086 | 25% | 611 | 72.3% | 4523 | 3.0% | 491 | 69 | 89 | 52 |
| 2800 | 0.4519 | 0.4086 | 21% | 616 | 76.9% | 4544 | 1.7% | 491 | 67 | 93 | 80 |
| 2800 | 0.4519 | 0.4086 | 20% | 620 | 79.5% | 4555 | 0.9% | 491 | 66 | 93 | 97 |
| 2800 | 0.4519 | 0.4086 | 18% | 626 | 81.9% | 4564 | 0.2% | 491 | 63 | 87 | 76 |
| 2800 | 0.4519 | 0.4086 | 17% | 631 | 83.1% | 4562 | 0.0% | 491 | 60 | 81 | 57 |
| 2800 | 0.4519 | 0.4086 | 16% | 635 | 83.8% | 4556 | 0.0% | 491 | 56 | 76 | 42 |
| 2800 | 0.4519 | 0.4086 | 16% | 640 | 84.3% | 4551 | 0.0% | 491 | 51 | 71 | 28 |
| 2800 | 0.4519 | 0.4086 | 25% | 611 | 71.6% | 4569 | 3.4% | 496 | 70 | 89 | 52 |
| 2800 | 0.4519 | 0.4086 | 21% | 616 | 76.8% | 4570 | 1.7% | 496 | 68 | 92 | 80 |
| 2800 | 0.4519 | 0.4086 | 20% | 620 | 79.7% | 4571 | 0.8% | 496 | 66 | 93 | 97 |
| 2800 | 0.4519 | 0.4086 | 18% | 626 | 82.2% | 4571 | 0.0% | 496 | 64 | 87 | 77 |
| 2800 | 0.4519 | 0.4086 | 17% | 631 | 83.1% | 4562 | 0.0% | 496 | 60 | 81 | 57 |
| 2800 | 0.4519 | 0.4086 | 16% | 635 | 83.8% | 4556 | 0.0% | 496 | 56 | 76 | 42 |
| 2800 | 0.4519 | 0.4086 | 16% | 640 | 84.3% | 4551 | 0.0% | 496 | 51 | 71 | 28 |
| 2800 | 0.4519 | 0.4086 | 25% | 611 | 70.8% | 4614 | 4.0% | 502 | 70 | 89 | 53 |
| 2800 | 0.4519 | 0.4086 | 21% | 616 | 76.7% | 4592 | 1.8% | 502 | 69 | 92 | 80 |
| 2800 | 0.4519 | 0.4086 | 19% | 620 | 80.0% | 4581 | 0.6% | 502 | 67 | 92 | 96 |
| 2800 | 0.4519 | 0.4086 | 18% | 626 | 82.2% | 4571 | 0.0% | 502 | 64 | 87 | 77 |
| 2800 | 0.4519 | 0.4086 | 17% | 631 | 83.1% | 4562 | 0.0% | 502 | 60 | 81 | 57 |
| 2800 | 0.4519 | 0.4086 | 16% | 635 | 83.8% | 4556 | 0.0% | 502 | 56 | 76 | 42 |
| 2800 | 0.4519 | 0.4086 | 16% | 640 | 84.3% | 4551 | 0.0% | 502 | 51 | 71 | 28 |
| 2800 | 0.4519 | 0.4086 | 26% | 611 | 69.7% | 4652 | 4.8% | 508 | 71 | 89 | 54 |
| 2800 | 0.4519 | 0.4086 | 21% | 616 | 76.6% | 4606 | 1.9% | 508 | 69 | 92 | 80 |
| 2800 | 0.4519 | 0.4086 | 19% | 620 | 80.4% | 4584 | 0.4% | 508 | 67 | 92 | 96 |
| 2800 | 0.4519 | 0.4086 | 18% | 626 | 82.2% | 4571 | 0.0% | 508 | 64 | 87 | 77 |
| 2800 | 0.4519 | 0.4086 | 17% | 631 | 83.1% | 4562 | 0.0% | 508 | 60 | 81 | 57 |
| 2800 | 0.4519 | 0.4086 | 16% | 635 | 83.8% | 4556 | 0.0% | 508 | 56 | 76 | 42 |
| 2800 | 0.4519 | 0.4086 | 16% | 640 | 84.3% | 4551 | 0.0% | 508 | 51 | 71 | 28 |
| 2800 | 0.4519 | 0.4086 | 26% | 611 | 68.8% | 4680 | 5.4% | 514 | 72 | 89 | 54 |
| 2800 | 0.4519 | 0.4086 | 21% | 616 | 76.4% | 4614 | 2.1% | 514 | 69 | 92 | 80 |
| 2800 | 0.4519 | 0.4086 | 19% | 620 | 80.8% | 4584 | 0.1% | 514 | 67 | 92 | 96 |
| 2800 | 0.4519 | 0.4086 | 18% | 626 | 82.2% | 4571 | 0.0% | 514 | 64 | 87 | 77 |
| 2800 | 0.4519 | 0.4086 | 17% | 631 | 83.1% | 4562 | 0.0% | 514 | 60 | 81 | 57 |
| 2800 | 0.4519 | 0.4086 | 16% | 635 | 83.8% | 4556 | 0.0% | 514 | 56 | 76 | 42 |
| 2800 | 0.4519 | 0.4086 | 16% | 640 | 84.3% | 4551 | 0.0% | 514 | 51 | 71 | 28 |
| 2800 | 0.4519 | 0.4086 | 26% | 611 | 67.9% | 4708 | 6.2% | 521 | 72 | 89 | 55 |
| 2800 | 0.4519 | 0.4086 | 22% | 616 | 76.2% | 4622 | 2.3% | 521 | 69 | 92 | 81 |
| 2800 | 0.4519 | 0.4086 | 19% | 620 | 80.9% | 4583 | 0.0% | 521 | 67 | 92 | 96 |
| 2800 | 0.4519 | 0.4086 | 18% | 626 | 82.2% | 4571 | 0.0% | 521 | 64 | 87 | 77 |
| 2800 | 0.4519 | 0.4086 | 17% | 631 | 83.1% | 4562 | 0.0% | 521 | 60 | 81 | 57 |

TABLE 2-continued

| | | | | | | | | | | | |
|---|---|---|---|---|---|---|---|---|---|---|---|
| 2800 | 0.4519 | 0.4086 | 16% | 635 | 83.8% | 4556 | 0.0% | 521 | 56 | 76 | 42 |
| 2800 | 0.4519 | 0.4086 | 16% | 640 | 84.3% | 4551 | 0.0% | 521 | 51 | 71 | 28 |
| 2800 | 0.4519 | 0.4086 | 26% | 611 | 66.9% | 4732 | 7.0% | 527 | 73 | 89 | 55 |
| 2800 | 0.4519 | 0.4086 | 22% | 616 | 75.9% | 4628 | 2.5% | 527 | 70 | 92 | 81 |
| 2800 | 0.4519 | 0.4086 | 19% | 620 | 80.9% | 4583 | 0.0% | 527 | 67 | 92 | 96 |
| 2800 | 0.4519 | 0.4086 | 18% | 626 | 82.2% | 4571 | 0.0% | 527 | 64 | 87 | 77 |
| 2800 | 0.4519 | 0.4086 | 17% | 631 | 83.1% | 4562 | 0.0% | 527 | 60 | 81 | 57 |
| 2800 | 0.4519 | 0.4086 | 16% | 635 | 83.8% | 4556 | 0.0% | 527 | 56 | 76 | 42 |
| 2800 | 0.4519 | 0.4086 | 16% | 640 | 84.3% | 4551 | 0.0% | 527 | 51 | 71 | 28 |
| 2800 | 0.4519 | 0.4086 | 26% | 611 | 65.0% | 4768 | 8.6% | 534 | 74 | 89 | 56 |
| 2800 | 0.4519 | 0.4086 | 22% | 616 | 75.4% | 4636 | 3.0% | 534 | 70 | 91 | 81 |
| 2800 | 0.4519 | 0.4086 | 19% | 620 | 80.9% | 4583 | 0.0% | 534 | 67 | 92 | 96 |
| 2800 | 0.4519 | 0.4086 | 18% | 626 | 82.2% | 4571 | 0.0% | 534 | 64 | 87 | 77 |
| 2800 | 0.4519 | 0.4086 | 17% | 631 | 83.1% | 4562 | 0.0% | 534 | 60 | 81 | 57 |
| 2800 | 0.4519 | 0.4086 | 16% | 635 | 83.8% | 4556 | 0.0% | 534 | 56 | 76 | 42 |
| 2800 | 0.4519 | 0.4086 | 16% | 640 | 84.3% | 4551 | 0.0% | 534 | 51 | 71 | 28 |
| 2800 | 0.4519 | 0.4086 | 27% | 611 | 61.6% | 4833 | 11.4% | 540 | 75 | 88 | 57 |
| 2800 | 0.4519 | 0.4086 | 22% | 616 | 74.9% | 4644 | 3.5% | 540 | 70 | 91 | 81 |
| 2800 | 0.4519 | 0.4086 | 19% | 620 | 80.9% | 4583 | 0.0% | 540 | 67 | 92 | 96 |
| 2800 | 0.4519 | 0.4086 | 18% | 626 | 82.2% | 4571 | 0.0% | 540 | 64 | 87 | 77 |
| 2800 | 0.4519 | 0.4086 | 17% | 631 | 83.1% | 4562 | 0.0% | 540 | 60 | 81 | 57 |
| 2800 | 0.4519 | 0.4086 | 16% | 635 | 83.8% | 4556 | 0.0% | 540 | 56 | 76 | 42 |
| 2800 | 0.4519 | 0.4086 | 16% | 640 | 84.3% | 4551 | 0.0% | 540 | 51 | 71 | 28 |
| 2700 | 0.4599 | 0.4106 | 25% | 611 | 73.9% | 4131 | 1.3% | 467 | 59 | 87 | 48 |
| 2700 | 0.4599 | 0.4106 | 22% | 616 | 76.4% | 4131 | 1.3% | 467 | 57 | 93 | 78 |
| 2700 | 0.4599 | 0.4106 | 21% | 620 | 78.0% | 4142 | 1.2% | 467 | 55 | 93 | 98 |
| 2700 | 0.4599 | 0.4106 | 19% | 626 | 80.3% | 4339 | 0.6% | 467 | 59 | 86 | 74 |
| 2700 | 0.4599 | 0.4106 | 18% | 631 | 81.4% | 4351 | 0.5% | 467 | 56 | 80 | 53 |
| 2700 | 0.4599 | 0.4106 | 17% | 635 | 82.4% | 4426 | 0.3% | 467 | 54 | 75 | 38 |
| 2700 | 0.4599 | 0.4106 | 17% | 640 | 83.3% | 4503 | 0.0% | 467 | 50 | 70 | 23 |
| 2700 | 0.4599 | 0.4106 | 25% | 611 | 72.8% | 4131 | 1.9% | 471 | 59 | 87 | 48 |
| 2700 | 0.4599 | 0.4106 | 22% | 616 | 76.2% | 4243 | 1.3% | 471 | 61 | 93 | 78 |
| 2700 | 0.4599 | 0.4106 | 21% | 620 | 78.3% | 4321 | 0.9% | 471 | 61 | 93 | 98 |
| 2700 | 0.4599 | 0.4106 | 19% | 626 | 80.4% | 4429 | 0.4% | 471 | 61 | 86 | 74 |
| 2700 | 0.4599 | 0.4106 | 18% | 631 | 81.5% | 4433 | 0.4% | 471 | 58 | 80 | 53 |
| 2700 | 0.4599 | 0.4106 | 17% | 635 | 82.5% | 4474 | 0.2% | 471 | 55 | 75 | 38 |
| 2700 | 0.4599 | 0.4106 | 17% | 640 | 83.3% | 4503 | 0.0% | 471 | 50 | 70 | 23 |
| 2700 | 0.4599 | 0.4106 | 25% | 611 | 72.6% | 4258 | 2.0% | 476 | 63 | 88 | 49 |
| 2700 | 0.4599 | 0.4106 | 22% | 616 | 76.3% | 4363 | 1.2% | 476 | 64 | 93 | 79 |
| 2700 | 0.4599 | 0.4106 | 21% | 620 | 78.5% | 4415 | 0.8% | 476 | 64 | 93 | 98 |
| 2700 | 0.4599 | 0.4106 | 19% | 626 | 80.5% | 4474 | 0.3% | 476 | 62 | 86 | 74 |
| 2700 | 0.4599 | 0.4106 | 18% | 631 | 81.7% | 4476 | 0.2% | 476 | 58 | 79 | 53 |
| 2700 | 0.4599 | 0.4106 | 17% | 635 | 82.6% | 4503 | 0.0% | 476 | 55 | 75 | 38 |
| 2700 | 0.4599 | 0.4106 | 17% | 640 | 83.3% | 4503 | 0.0% | 476 | 50 | 70 | 23 |
| 2700 | 0.4599 | 0.4106 | 26% | 611 | 72.4% | 4351 | 2.0% | 480 | 66 | 88 | 49 |
| 2700 | 0.4599 | 0.4106 | 22% | 616 | 76.4% | 4426 | 1.2% | 480 | 66 | 93 | 79 |
| 2700 | 0.4599 | 0.4106 | 21% | 620 | 78.6% | 4463 | 0.7% | 480 | 65 | 93 | 97 |
| 2700 | 0.4599 | 0.4106 | 19% | 626 | 80.6% | 4497 | 0.3% | 480 | 62 | 86 | 74 |
| 2700 | 0.4599 | 0.4106 | 18% | 631 | 81.8% | 4499 | 0.1% | 480 | 59 | 79 | 53 |
| 2700 | 0.4599 | 0.4106 | 17% | 635 | 82.7% | 4508 | 0.0% | 480 | 55 | 75 | 39 |
| 2700 | 0.4599 | 0.4106 | 17% | 640 | 83.3% | 4503 | 0.0% | 480 | 50 | 70 | 23 |
| 2700 | 0.4599 | 0.4106 | 26% | 611 | 72.0% | 4429 | 2.2% | 486 | 68 | 88 | 49 |
| 2700 | 0.4599 | 0.4106 | 23% | 616 | 76.3% | 4476 | 1.2% | 486 | 67 | 92 | 79 |
| 2700 | 0.4599 | 0.4106 | 21% | 620 | 78.8% | 4500 | 0.6% | 486 | 65 | 92 | 97 |
| 2700 | 0.4599 | 0.4106 | 19% | 626 | 80.8% | 4515 | 0.1% | 486 | 63 | 86 | 74 |
| 2700 | 0.4599 | 0.4106 | 18% | 631 | 82.0% | 4514 | 0.0% | 486 | 59 | 79 | 54 |
| 2700 | 0.4599 | 0.4106 | 17% | 635 | 82.7% | 4508 | 0.0% | 486 | 55 | 75 | 39 |
| 2700 | 0.4599 | 0.4106 | 17% | 640 | 83.3% | 4503 | 0.0% | 486 | 50 | 70 | 23 |
| 2700 | 0.4599 | 0.4106 | 26% | 611 | 71.4% | 4485 | 2.6% | 491 | 69 | 88 | 50 |
| 2700 | 0.4599 | 0.4106 | 23% | 616 | 76.3% | 4510 | 1.2% | 491 | 67 | 92 | 79 |
| 2700 | 0.4599 | 0.4106 | 21% | 620 | 79.0% | 4521 | 0.4% | 491 | 66 | 92 | 97 |
| 2700 | 0.4599 | 0.4106 | 19% | 626 | 81.0% | 4522 | 0.0% | 491 | 63 | 86 | 75 |
| 2700 | 0.4599 | 0.4106 | 18% | 631 | 82.0% | 4514 | 0.0% | 491 | 59 | 79 | 54 |
| 2700 | 0.4599 | 0.4106 | 17% | 635 | 82.7% | 4508 | 0.0% | 491 | 55 | 75 | 39 |
| 2700 | 0.4599 | 0.4106 | 17% | 640 | 83.3% | 4503 | 0.0% | 491 | 50 | 70 | 23 |
| 2700 | 0.4599 | 0.4106 | 26% | 611 | 70.8% | 4524 | 3.0% | 496 | 69 | 89 | 50 |
| 2700 | 0.4599 | 0.4106 | 23% | 616 | 76.3% | 4529 | 1.2% | 496 | 68 | 92 | 79 |
| 2700 | 0.4599 | 0.4106 | 20% | 620 | 79.3% | 4530 | 0.3% | 496 | 66 | 92 | 96 |
| 2700 | 0.4599 | 0.4106 | 19% | 626 | 81.0% | 4522 | 0.0% | 496 | 63 | 86 | 75 |
| 2700 | 0.4599 | 0.4106 | 18% | 631 | 82.0% | 4514 | 0.0% | 496 | 59 | 79 | 54 |
| 2700 | 0.4599 | 0.4106 | 17% | 635 | 82.7% | 4508 | 0.0% | 496 | 55 | 75 | 39 |
| 2700 | 0.4599 | 0.4106 | 17% | 640 | 83.3% | 4503 | 0.0% | 496 | 50 | 70 | 23 |
| 2700 | 0.4599 | 0.4106 | 26% | 611 | 70.0% | 4562 | 3.6% | 502 | 70 | 89 | 51 |
| 2700 | 0.4599 | 0.4106 | 22% | 616 | 76.3% | 4544 | 1.2% | 502 | 68 | 92 | 79 |
| 2700 | 0.4599 | 0.4106 | 20% | 620 | 79.6% | 4534 | 0.0% | 502 | 66 | 92 | 96 |
| 2700 | 0.4599 | 0.4106 | 19% | 626 | 81.0% | 4522 | 0.0% | 502 | 63 | 86 | 75 |
| 2700 | 0.4599 | 0.4106 | 18% | 631 | 82.0% | 4514 | 0.0% | 502 | 59 | 79 | 54 |
| 2700 | 0.4599 | 0.4106 | 17% | 635 | 82.7% | 4508 | 0.0% | 502 | 55 | 75 | 39 |
| 2700 | 0.4599 | 0.4106 | 17% | 640 | 83.3% | 4503 | 0.0% | 502 | 50 | 70 | 23 |
| 2700 | 0.4599 | 0.4106 | 27% | 611 | 69.1% | 4594 | 4.2% | 508 | 71 | 89 | 52 |

TABLE 2-continued

| | | | | | | | | | | |
|---|---|---|---|---|---|---|---|---|---|---|
| 2700 | 0.4599 | 0.4106 | 22% | 616 | 76.3% | 4553 | 1.3% | 508 | 69 | 92 | 79 |
| 2700 | 0.4599 | 0.4106 | 20% | 620 | 79.7% | 4534 | 0.0% | 508 | 66 | 92 | 96 |
| 2700 | 0.4599 | 0.4106 | 19% | 626 | 81.0% | 4522 | 0.0% | 508 | 63 | 86 | 75 |
| 2700 | 0.4599 | 0.4106 | 18% | 631 | 82.0% | 4514 | 0.0% | 508 | 59 | 79 | 54 |
| 2700 | 0.4599 | 0.4106 | 17% | 635 | 82.7% | 4508 | 0.0% | 508 | 55 | 75 | 39 |
| 2700 | 0.4599 | 0.4106 | 17% | 640 | 83.3% | 4503 | 0.0% | 508 | 50 | 70 | 23 |
| 2700 | 0.4599 | 0.4106 | 27% | 611 | 68.2% | 4618 | 4.9% | 514 | 72 | 89 | 52 |
| 2700 | 0.4599 | 0.4106 | 22% | 616 | 76.3% | 4557 | 1.3% | 514 | 69 | 92 | 79 |
| 2700 | 0.4599 | 0.4106 | 20% | 620 | 79.7% | 4534 | 0.0% | 514 | 66 | 92 | 96 |
| 2700 | 0.4599 | 0.4106 | 19% | 626 | 81.0% | 4522 | 0.0% | 514 | 63 | 86 | 75 |
| 2700 | 0.4599 | 0.4106 | 18% | 631 | 82.0% | 4514 | 0.0% | 514 | 59 | 79 | 54 |
| 2700 | 0.4599 | 0.4106 | 17% | 635 | 82.7% | 4508 | 0.0% | 514 | 55 | 75 | 39 |
| 2700 | 0.4599 | 0.4106 | 17% | 640 | 83.3% | 4503 | 0.0% | 514 | 50 | 70 | 23 |
| 2700 | 0.4599 | 0.4106 | 27% | 611 | 67.3% | 4643 | 5.6% | 521 | 72 | 89 | 53 |
| 2700 | 0.4599 | 0.4106 | 22% | 616 | 76.3% | 4561 | 1.3% | 521 | 69 | 92 | 79 |
| 2700 | 0.4599 | 0.4106 | 20% | 620 | 79.7% | 4534 | 0.0% | 521 | 66 | 92 | 96 |
| 2700 | 0.4599 | 0.4106 | 19% | 626 | 81.0% | 4522 | 0.0% | 521 | 63 | 86 | 75 |
| 2700 | 0.4599 | 0.4106 | 18% | 631 | 82.0% | 4514 | 0.0% | 521 | 59 | 79 | 54 |
| 2700 | 0.4599 | 0.4106 | 17% | 635 | 82.7% | 4508 | 0.0% | 521 | 55 | 75 | 39 |
| 2700 | 0.4599 | 0.4106 | 17% | 640 | 83.3% | 4503 | 0.0% | 521 | 50 | 70 | 23 |
| 2700 | 0.4599 | 0.4106 | 27% | 611 | 66.4% | 4662 | 6.4% | 527 | 73 | 88 | 53 |
| 2700 | 0.4599 | 0.4106 | 22% | 616 | 76.2% | 4564 | 1.4% | 527 | 69 | 92 | 79 |
| 2700 | 0.4599 | 0.4106 | 20% | 620 | 79.7% | 4534 | 0.0% | 527 | 66 | 92 | 96 |
| 2700 | 0.4599 | 0.4106 | 19% | 626 | 81.0% | 4522 | 0.0% | 527 | 63 | 86 | 75 |
| 2700 | 0.4599 | 0.4106 | 18% | 631 | 82.0% | 4514 | 0.0% | 527 | 59 | 79 | 54 |
| 2700 | 0.4599 | 0.4106 | 17% | 635 | 82.7% | 4508 | 0.0% | 527 | 55 | 75 | 39 |
| 2700 | 0.4599 | 0.4106 | 17% | 640 | 83.3% | 4503 | 0.0% | 527 | 50 | 70 | 23 |
| 2700 | 0.4599 | 0.4106 | 27% | 611 | 64.8% | 4691 | 7.7% | 534 | 73 | 88 | 54 |
| 2700 | 0.4599 | 0.4106 | 22% | 616 | 76.1% | 4566 | 1.5% | 534 | 69 | 91 | 79 |
| 2700 | 0.4599 | 0.4106 | 20% | 620 | 79.7% | 4534 | 0.0% | 534 | 66 | 92 | 96 |
| 2700 | 0.4599 | 0.4106 | 19% | 626 | 81.0% | 4522 | 0.0% | 534 | 63 | 86 | 75 |
| 2700 | 0.4599 | 0.4106 | 18% | 631 | 82.0% | 4514 | 0.0% | 534 | 59 | 79 | 54 |
| 2700 | 0.4599 | 0.4106 | 17% | 635 | 82.7% | 4508 | 0.0% | 534 | 55 | 75 | 39 |
| 2700 | 0.4599 | 0.4106 | 17% | 640 | 83.3% | 4503 | 0.0% | 534 | 50 | 70 | 23 |
| 2700 | 0.4599 | 0.4106 | 28% | 611 | 62.1% | 4737 | 9.9% | 540 | 74 | 88 | 54 |
| 2700 | 0.4599 | 0.4106 | 22% | 616 | 76.2% | 4566 | 1.5% | 540 | 69 | 91 | 79 |
| 2700 | 0.4599 | 0.4106 | 20% | 620 | 79.7% | 4534 | 0.0% | 540 | 66 | 92 | 96 |
| 2700 | 0.4599 | 0.4106 | 19% | 626 | 81.0% | 4522 | 0.0% | 540 | 63 | 86 | 75 |
| 2700 | 0.4599 | 0.4106 | 18% | 631 | 82.0% | 4514 | 0.0% | 540 | 59 | 79 | 54 |
| 2700 | 0.4599 | 0.4106 | 17% | 635 | 82.7% | 4508 | 0.0% | 540 | 55 | 75 | 39 |
| 2700 | 0.4599 | 0.4106 | 17% | 640 | 83.3% | 4503 | 0.0% | 540 | 50 | 70 | 23 |
| 2600 | 0.4682 | 0.4123 | 26% | 611 | 72.5% | 4131 | 1.2% | 467 | 59 | 87 | 46 |
| 2600 | 0.4682 | 0.4123 | 24% | 616 | 75.2% | 4131 | 1.1% | 467 | 57 | 92 | 77 |
| 2600 | 0.4682 | 0.4123 | 22% | 620 | 77.4% | 4248 | 0.7% | 467 | 60 | 92 | 97 |
| 2600 | 0.4682 | 0.4123 | 20% | 626 | 79.8% | 4476 | 0.0% | 467 | 62 | 85 | 73 |
| 2600 | 0.4682 | 0.4123 | 19% | 631 | 80.9% | 4467 | 0.0% | 467 | 58 | 78 | 51 |
| 2600 | 0.4682 | 0.4123 | 18% | 635 | 81.5% | 4462 | 0.0% | 467 | 54 | 73 | 35 |
| 2600 | 0.4682 | 0.4123 | 18% | 640 | 82.2% | 4457 | 0.0% | 467 | 49 | 68 | 19 |
| 2600 | 0.4682 | 0.4123 | 27% | 611 | 71.6% | 4131 | 1.7% | 471 | 59 | 87 | 46 |
| 2600 | 0.4682 | 0.4123 | 24% | 616 | 75.4% | 4283 | 0.9% | 471 | 63 | 92 | 78 |
| 2600 | 0.4682 | 0.4123 | 22% | 620 | 77.6% | 4363 | 0.5% | 471 | 63 | 92 | 97 |
| 2600 | 0.4682 | 0.4123 | 20% | 626 | 79.8% | 4476 | 0.0% | 471 | 62 | 85 | 73 |
| 2600 | 0.4682 | 0.4123 | 19% | 631 | 80.9% | 4467 | 0.0% | 471 | 58 | 78 | 51 |
| 2600 | 0.4682 | 0.4123 | 18% | 635 | 81.5% | 4462 | 0.0% | 471 | 54 | 73 | 35 |
| 2600 | 0.4682 | 0.4123 | 18% | 640 | 82.2% | 4457 | 0.0% | 471 | 49 | 68 | 19 |
| 2600 | 0.4682 | 0.4123 | 27% | 611 | 71.4% | 4255 | 1.7% | 476 | 64 | 87 | 47 |
| 2600 | 0.4682 | 0.4123 | 24% | 616 | 75.5% | 4372 | 0.8% | 476 | 65 | 92 | 78 |
| 2600 | 0.4682 | 0.4123 | 22% | 620 | 77.7% | 4424 | 0.4% | 476 | 64 | 92 | 97 |
| 2600 | 0.4682 | 0.4123 | 20% | 626 | 79.8% | 4476 | 0.0% | 476 | 62 | 85 | 73 |
| 2600 | 0.4682 | 0.4123 | 19% | 631 | 80.9% | 4467 | 0.0% | 476 | 58 | 78 | 51 |
| 2600 | 0.4682 | 0.4123 | 18% | 635 | 81.5% | 4462 | 0.0% | 476 | 54 | 73 | 35 |
| 2600 | 0.4682 | 0.4123 | 18% | 640 | 82.2% | 4457 | 0.0% | 476 | 49 | 68 | 19 |
| 2600 | 0.4682 | 0.4123 | 27% | 611 | 71.3% | 4334 | 1.7% | 480 | 66 | 87 | 47 |
| 2600 | 0.4682 | 0.4123 | 24% | 616 | 75.5% | 4418 | 0.8% | 480 | 66 | 92 | 78 |
| 2600 | 0.4682 | 0.4123 | 22% | 620 | 77.9% | 4455 | 0.3% | 480 | 65 | 92 | 97 |
| 2600 | 0.4682 | 0.4123 | 20% | 626 | 79.8% | 4476 | 0.0% | 480 | 62 | 85 | 73 |
| 2600 | 0.4682 | 0.4123 | 19% | 631 | 80.9% | 4467 | 0.0% | 480 | 58 | 78 | 51 |
| 2600 | 0.4682 | 0.4123 | 18% | 635 | 81.5% | 4462 | 0.0% | 480 | 54 | 73 | 35 |
| 2600 | 0.4682 | 0.4123 | 18% | 640 | 82.2% | 4457 | 0.0% | 480 | 49 | 68 | 19 |
| 2600 | 0.4682 | 0.4123 | 27% | 611 | 71.0% | 4401 | 1.9% | 486 | 68 | 88 | 47 |
| 2600 | 0.4682 | 0.4123 | 24% | 616 | 75.5% | 4454 | 0.8% | 486 | 67 | 92 | 78 |
| 2600 | 0.4682 | 0.4123 | 22% | 620 | 78.1% | 4478 | 0.2% | 486 | 65 | 92 | 97 |
| 2600 | 0.4682 | 0.4123 | 20% | 626 | 79.8% | 4476 | 0.0% | 486 | 62 | 85 | 73 |
| 2600 | 0.4682 | 0.4123 | 19% | 631 | 80.9% | 4467 | 0.0% | 486 | 58 | 78 | 51 |
| 2600 | 0.4682 | 0.4123 | 18% | 635 | 81.5% | 4462 | 0.0% | 486 | 54 | 73 | 35 |
| 2600 | 0.4682 | 0.4123 | 18% | 640 | 82.2% | 4457 | 0.0% | 486 | 49 | 68 | 19 |
| 2600 | 0.4682 | 0.4123 | 27% | 611 | 70.4% | 4449 | 2.2% | 491 | 69 | 88 | 47 |
| 2600 | 0.4682 | 0.4123 | 24% | 616 | 75.6% | 4477 | 0.7% | 491 | 67 | 92 | 78 |
| 2600 | 0.4682 | 0.4123 | 22% | 620 | 78.3% | 4487 | 0.0% | 491 | 66 | 92 | 96 |
| 2600 | 0.4682 | 0.4123 | 20% | 626 | 79.8% | 4476 | 0.0% | 491 | 62 | 85 | 73 |

TABLE 2-continued

| | | | | | | | | | | | |
|---|---|---|---|---|---|---|---|---|---|---|---|
| 2600 | 0.4682 | 0.4123 | 19% | 631 | 80.9% | 4467 | 0.0% | 491 | 58 | 78 | 51 |
| 2600 | 0.4682 | 0.4123 | 18% | 635 | 81.5% | 4462 | 0.0% | 491 | 54 | 73 | 35 |
| 2600 | 0.4682 | 0.4123 | 18% | 640 | 82.2% | 4457 | 0.0% | 491 | 49 | 68 | 19 |
| 2600 | 0.4682 | 0.4123 | 27% | 611 | 69.9% | 4481 | 2.6% | 496 | 69 | 88 | 48 |
| 2600 | 0.4682 | 0.4123 | 24% | 616 | 75.7% | 4489 | 0.7% | 496 | 68 | 92 | 78 |
| 2600 | 0.4682 | 0.4123 | 22% | 620 | 78.3% | 4487 | 0.0% | 496 | 66 | 92 | 96 |
| 2600 | 0.4682 | 0.4123 | 20% | 626 | 79.8% | 4476 | 0.0% | 496 | 62 | 85 | 73 |
| 2600 | 0.4682 | 0.4123 | 19% | 631 | 80.9% | 4467 | 0.0% | 496 | 58 | 78 | 51 |
| 2600 | 0.4682 | 0.4123 | 18% | 635 | 81.5% | 4462 | 0.0% | 496 | 54 | 73 | 35 |
| 2600 | 0.4682 | 0.4123 | 18% | 640 | 82.2% | 4457 | 0.0% | 496 | 49 | 68 | 19 |
| 2600 | 0.4682 | 0.4123 | 28% | 611 | 69.2% | 4513 | 3.1% | 502 | 70 | 88 | 48 |
| 2600 | 0.4682 | 0.4123 | 24% | 616 | 75.8% | 4498 | 0.6% | 502 | 68 | 92 | 78 |
| 2600 | 0.4682 | 0.4123 | 22% | 620 | 78.3% | 4487 | 0.0% | 502 | 66 | 92 | 96 |
| 2600 | 0.4682 | 0.4123 | 20% | 626 | 79.8% | 4476 | 0.0% | 502 | 62 | 85 | 73 |
| 2600 | 0.4682 | 0.4123 | 19% | 631 | 80.9% | 4467 | 0.0% | 502 | 58 | 78 | 51 |
| 2600 | 0.4682 | 0.4123 | 18% | 635 | 81.5% | 4462 | 0.0% | 502 | 54 | 73 | 35 |
| 2600 | 0.4682 | 0.4123 | 18% | 640 | 82.2% | 4457 | 0.0% | 502 | 49 | 68 | 19 |
| 2600 | 0.4682 | 0.4123 | 28% | 611 | 68.3% | 4539 | 3.7% | 508 | 71 | 88 | 49 |
| 2600 | 0.4682 | 0.4123 | 24% | 616 | 75.9% | 4502 | 0.5% | 508 | 68 | 91 | 77 |
| 2600 | 0.4682 | 0.4123 | 22% | 620 | 78.3% | 4487 | 0.0% | 508 | 66 | 92 | 96 |
| 2600 | 0.4682 | 0.4123 | 20% | 626 | 79.8% | 4476 | 0.0% | 508 | 62 | 85 | 73 |
| 2600 | 0.4682 | 0.4123 | 19% | 631 | 80.9% | 4467 | 0.0% | 508 | 58 | 78 | 51 |
| 2600 | 0.4682 | 0.4123 | 18% | 635 | 81.5% | 4462 | 0.0% | 508 | 54 | 73 | 35 |
| 2600 | 0.4682 | 0.4123 | 18% | 640 | 82.2% | 4457 | 0.0% | 508 | 49 | 68 | 19 |
| 2600 | 0.4682 | 0.4123 | 28% | 611 | 67.5% | 4559 | 4.3% | 514 | 71 | 88 | 50 |
| 2600 | 0.4682 | 0.4123 | 23% | 616 | 76.1% | 4504 | 0.5% | 514 | 68 | 91 | 77 |
| 2600 | 0.4682 | 0.4123 | 22% | 620 | 78.3% | 4487 | 0.0% | 514 | 66 | 92 | 96 |
| 2600 | 0.4682 | 0.4123 | 20% | 626 | 79.8% | 4476 | 0.0% | 514 | 62 | 85 | 73 |
| 2600 | 0.4682 | 0.4123 | 19% | 631 | 80.9% | 4467 | 0.0% | 514 | 58 | 78 | 51 |
| 2600 | 0.4682 | 0.4123 | 18% | 635 | 81.5% | 4462 | 0.0% | 514 | 54 | 73 | 35 |
| 2600 | 0.4682 | 0.4123 | 18% | 640 | 82.2% | 4457 | 0.0% | 514 | 49 | 68 | 19 |
| 2600 | 0.4682 | 0.4123 | 28% | 611 | 66.6% | 4581 | 5.1% | 521 | 72 | 88 | 50 |
| 2600 | 0.4682 | 0.4123 | 23% | 616 | 76.2% | 4504 | 0.4% | 521 | 68 | 91 | 77 |
| 2600 | 0.4682 | 0.4123 | 22% | 620 | 78.3% | 4487 | 0.0% | 521 | 66 | 92 | 96 |
| 2600 | 0.4682 | 0.4123 | 20% | 626 | 79.8% | 4476 | 0.0% | 521 | 62 | 85 | 73 |
| 2600 | 0.4682 | 0.4123 | 19% | 631 | 80.9% | 4467 | 0.0% | 521 | 58 | 78 | 51 |
| 2600 | 0.4682 | 0.4123 | 18% | 635 | 81.5% | 4462 | 0.0% | 521 | 54 | 73 | 35 |
| 2600 | 0.4682 | 0.4123 | 18% | 640 | 82.2% | 4457 | 0.0% | 521 | 49 | 68 | 19 |
| 2600 | 0.4682 | 0.4123 | 29% | 611 | 65.7% | 4598 | 5.7% | 527 | 72 | 88 | 51 |
| 2600 | 0.4682 | 0.4123 | 23% | 616 | 76.4% | 4503 | 0.2% | 527 | 68 | 91 | 77 |
| 2600 | 0.4682 | 0.4123 | 22% | 620 | 78.3% | 4487 | 0.0% | 527 | 66 | 92 | 96 |
| 2600 | 0.4682 | 0.4123 | 20% | 626 | 79.8% | 4476 | 0.0% | 527 | 62 | 85 | 73 |
| 2600 | 0.4682 | 0.4123 | 19% | 631 | 80.9% | 4467 | 0.0% | 527 | 58 | 78 | 51 |
| 2600 | 0.4682 | 0.4123 | 18% | 635 | 81.5% | 4462 | 0.0% | 527 | 54 | 73 | 35 |
| 2600 | 0.4682 | 0.4123 | 18% | 640 | 82.2% | 4457 | 0.0% | 527 | 49 | 68 | 19 |
| 2600 | 0.4682 | 0.4123 | 29% | 611 | 64.3% | 4621 | 6.9% | 534 | 73 | 88 | 51 |
| 2600 | 0.4682 | 0.4123 | 23% | 616 | 76.8% | 4501 | 0.0% | 534 | 68 | 91 | 77 |
| 2600 | 0.4682 | 0.4123 | 22% | 620 | 78.3% | 4487 | 0.0% | 534 | 66 | 92 | 96 |
| 2600 | 0.4682 | 0.4123 | 20% | 626 | 79.8% | 4476 | 0.0% | 534 | 62 | 85 | 73 |
| 2600 | 0.4682 | 0.4123 | 19% | 631 | 80.9% | 4467 | 0.0% | 534 | 58 | 78 | 51 |
| 2600 | 0.4682 | 0.4123 | 18% | 635 | 81.5% | 4462 | 0.0% | 534 | 54 | 73 | 35 |
| 2600 | 0.4682 | 0.4123 | 18% | 640 | 82.2% | 4457 | 0.0% | 534 | 49 | 68 | 19 |
| 2600 | 0.4682 | 0.4123 | 29% | 611 | 62.0% | 4657 | 8.9% | 540 | 74 | 88 | 51 |
| 2600 | 0.4682 | 0.4123 | 23% | 616 | 76.8% | 4501 | 0.0% | 540 | 68 | 91 | 77 |
| 2600 | 0.4682 | 0.4123 | 22% | 620 | 78.3% | 4487 | 0.0% | 540 | 66 | 92 | 96 |
| 2600 | 0.4682 | 0.4123 | 20% | 626 | 79.8% | 4476 | 0.0% | 540 | 62 | 85 | 73 |
| 2600 | 0.4682 | 0.4123 | 19% | 631 | 80.9% | 4467 | 0.0% | 540 | 58 | 78 | 51 |
| 2600 | 0.4682 | 0.4123 | 18% | 635 | 81.5% | 4462 | 0.0% | 540 | 54 | 73 | 35 |
| 2600 | 0.4682 | 0.4123 | 18% | 640 | 82.2% | 4457 | 0.0% | 540 | 49 | 68 | 19 |
| 2500 | 0.4770 | 0.4137 | 28% | 611 | 71.0% | 4131 | 1.0% | 467 | 60 | 86 | 44 |
| 2500 | 0.4770 | 0.4137 | 25% | 616 | 74.2% | 4218 | 0.7% | 467 | 61 | 91 | 77 |
| 2500 | 0.4770 | 0.4137 | 23% | 620 | 76.6% | 4371 | 0.2% | 467 | 63 | 91 | 97 |
| 2500 | 0.4770 | 0.4137 | 22% | 626 | 78.4% | 4430 | 0.0% | 467 | 61 | 83 | 71 |
| 2500 | 0.4770 | 0.4137 | 20% | 631 | 79.6% | 4421 | 0.0% | 467 | 57 | 76 | 48 |
| 2500 | 0.4770 | 0.4137 | 20% | 635 | 80.3% | 4416 | 0.0% | 467 | 53 | 71 | 31 |
| 2500 | 0.4770 | 0.4137 | 19% | 640 | 81.0% | 4411 | 0.0% | 467 | 48 | 65 | 14 |
| 2500 | 0.4770 | 0.4137 | 28% | 611 | 70.2% | 4131 | 1.5% | 471 | 60 | 87 | 44 |
| 2500 | 0.4770 | 0.4137 | 25% | 616 | 74.4% | 4329 | 0.5% | 471 | 65 | 91 | 77 |
| 2500 | 0.4770 | 0.4137 | 23% | 620 | 76.7% | 4412 | 0.1% | 471 | 64 | 91 | 97 |
| 2500 | 0.4770 | 0.4137 | 22% | 626 | 78.4% | 4430 | 0.0% | 471 | 61 | 83 | 71 |
| 2500 | 0.4770 | 0.4137 | 20% | 631 | 79.6% | 4421 | 0.0% | 471 | 57 | 76 | 48 |
| 2500 | 0.4770 | 0.4137 | 20% | 635 | 80.3% | 4416 | 0.0% | 471 | 53 | 71 | 31 |
| 2500 | 0.4770 | 0.4137 | 19% | 640 | 81.0% | 4411 | 0.0% | 471 | 48 | 65 | 14 |
| 2500 | 0.4770 | 0.4137 | 28% | 611 | 70.2% | 4255 | 1.4% | 476 | 65 | 87 | 44 |
| 2500 | 0.4770 | 0.4137 | 25% | 616 | 74.5% | 4384 | 0.4% | 476 | 66 | 91 | 76 |
| 2500 | 0.4770 | 0.4137 | 23% | 620 | 76.8% | 4437 | 0.0% | 476 | 65 | 91 | 97 |
| 2500 | 0.4770 | 0.4137 | 22% | 626 | 78.4% | 4430 | 0.0% | 476 | 61 | 83 | 71 |
| 2500 | 0.4770 | 0.4137 | 20% | 631 | 79.6% | 4421 | 0.0% | 476 | 57 | 76 | 48 |
| 2500 | 0.4770 | 0.4137 | 20% | 635 | 80.3% | 4416 | 0.0% | 476 | 53 | 71 | 31 |
| 2500 | 0.4770 | 0.4137 | 19% | 640 | 81.0% | 4411 | 0.0% | 476 | 48 | 65 | 14 |

TABLE 2-continued

| | | | | | | | | | | | |
|---|---|---|---|---|---|---|---|---|---|---|---|
| 2500 | 0.4770 | 0.4137 | 29% | 611 | 70.1% | 4320 | 1.4% | 480 | 66 | 87 | 44 |
| 2500 | 0.4770 | 0.4137 | 25% | 616 | 74.6% | 4413 | 0.4% | 480 | 67 | 91 | 76 |
| 2500 | 0.4770 | 0.4137 | 23% | 620 | 76.9% | 4441 | 0.0% | 480 | 65 | 91 | 97 |
| 2500 | 0.4770 | 0.4137 | 22% | 626 | 78.4% | 4430 | 0.0% | 480 | 61 | 83 | 71 |
| 2500 | 0.4770 | 0.4137 | 20% | 631 | 79.6% | 4421 | 0.0% | 480 | 57 | 76 | 48 |
| 2500 | 0.4770 | 0.4137 | 20% | 635 | 80.3% | 4416 | 0.0% | 480 | 53 | 71 | 31 |
| 2500 | 0.4770 | 0.4137 | 19% | 640 | 81.0% | 4411 | 0.0% | 480 | 48 | 65 | 14 |
| 2500 | 0.4770 | 0.4137 | 29% | 611 | 69.8% | 4375 | 1.6% | 486 | 68 | 87 | 45 |
| 2500 | 0.4770 | 0.4137 | 25% | 616 | 74.7% | 4434 | 0.3% | 486 | 67 | 91 | 76 |
| 2500 | 0.4770 | 0.4137 | 23% | 620 | 76.9% | 4441 | 0.0% | 486 | 65 | 91 | 97 |
| 2500 | 0.4770 | 0.4137 | 22% | 626 | 78.4% | 4430 | 0.0% | 486 | 61 | 83 | 71 |
| 2500 | 0.4770 | 0.4137 | 20% | 631 | 79.6% | 4421 | 0.0% | 486 | 57 | 76 | 48 |
| 2500 | 0.4770 | 0.4137 | 20% | 635 | 80.3% | 4416 | 0.0% | 486 | 53 | 71 | 31 |
| 2500 | 0.4770 | 0.4137 | 19% | 640 | 81.0% | 4411 | 0.0% | 486 | 48 | 65 | 14 |
| 2500 | 0.4770 | 0.4137 | 29% | 611 | 69.4% | 4414 | 1.8% | 491 | 69 | 87 | 45 |
| 2500 | 0.4770 | 0.4137 | 25% | 616 | 74.8% | 4447 | 0.2% | 491 | 67 | 91 | 76 |
| 2500 | 0.4770 | 0.4137 | 23% | 620 | 76.9% | 4441 | 0.0% | 491 | 65 | 91 | 97 |
| 2500 | 0.4770 | 0.4137 | 22% | 626 | 78.4% | 4430 | 0.0% | 491 | 61 | 83 | 71 |
| 2500 | 0.4770 | 0.4137 | 20% | 631 | 79.6% | 4421 | 0.0% | 491 | 57 | 76 | 48 |
| 2500 | 0.4770 | 0.4137 | 20% | 635 | 80.3% | 4416 | 0.0% | 491 | 53 | 71 | 31 |
| 2500 | 0.4770 | 0.4137 | 19% | 640 | 81.0% | 4411 | 0.0% | 491 | 48 | 65 | 14 |
| 2500 | 0.4770 | 0.4137 | 29% | 611 | 68.9% | 4440 | 2.1% | 496 | 69 | 87 | 45 |
| 2500 | 0.4770 | 0.4137 | 25% | 616 | 75.0% | 4452 | 0.1% | 496 | 68 | 91 | 76 |
| 2500 | 0.4770 | 0.4137 | 23% | 620 | 76.9% | 4441 | 0.0% | 496 | 65 | 91 | 97 |
| 2500 | 0.4770 | 0.4137 | 22% | 626 | 78.4% | 4430 | 0.0% | 496 | 61 | 83 | 71 |
| 2500 | 0.4770 | 0.4137 | 20% | 631 | 79.6% | 4421 | 0.0% | 496 | 57 | 76 | 48 |
| 2500 | 0.4770 | 0.4137 | 20% | 635 | 80.3% | 4416 | 0.0% | 496 | 53 | 71 | 31 |
| 2500 | 0.4770 | 0.4137 | 19% | 640 | 81.0% | 4411 | 0.0% | 496 | 48 | 65 | 14 |
| 2500 | 0.4770 | 0.4137 | 29% | 611 | 68.3% | 4466 | 2.6% | 502 | 70 | 88 | 46 |
| 2500 | 0.4770 | 0.4137 | 25% | 616 | 75.2% | 4455 | 0.0% | 502 | 68 | 91 | 76 |
| 2500 | 0.4770 | 0.4137 | 23% | 620 | 76.9% | 4441 | 0.0% | 502 | 65 | 91 | 97 |
| 2500 | 0.4770 | 0.4137 | 22% | 626 | 78.4% | 4430 | 0.0% | 502 | 61 | 83 | 71 |
| 2500 | 0.4770 | 0.4137 | 20% | 631 | 79.6% | 4421 | 0.0% | 502 | 57 | 76 | 48 |
| 2500 | 0.4770 | 0.4137 | 20% | 635 | 80.3% | 4416 | 0.0% | 502 | 53 | 71 | 31 |
| 2500 | 0.4770 | 0.4137 | 19% | 640 | 81.0% | 4411 | 0.0% | 502 | 48 | 65 | 14 |
| 2500 | 0.4770 | 0.4137 | 29% | 611 | 67.5% | 4487 | 3.1% | 508 | 70 | 88 | 46 |
| 2500 | 0.4770 | 0.4137 | 25% | 616 | 75.2% | 4455 | 0.0% | 508 | 68 | 91 | 76 |
| 2500 | 0.4770 | 0.4137 | 23% | 620 | 76.9% | 4441 | 0.0% | 508 | 65 | 91 | 97 |
| 2500 | 0.4770 | 0.4137 | 22% | 626 | 78.4% | 4430 | 0.0% | 508 | 61 | 83 | 71 |
| 2500 | 0.4770 | 0.4137 | 20% | 631 | 79.6% | 4421 | 0.0% | 508 | 57 | 76 | 48 |
| 2500 | 0.4770 | 0.4137 | 20% | 635 | 80.3% | 4416 | 0.0% | 508 | 53 | 71 | 31 |
| 2500 | 0.4770 | 0.4137 | 19% | 640 | 81.0% | 4411 | 0.0% | 508 | 48 | 65 | 14 |
| 2500 | 0.4770 | 0.4137 | 30% | 611 | 66.7% | 4503 | 3.7% | 514 | 71 | 88 | 47 |
| 2500 | 0.4770 | 0.4137 | 25% | 616 | 75.2% | 4455 | 0.0% | 514 | 68 | 91 | 76 |
| 2500 | 0.4770 | 0.4137 | 23% | 620 | 76.9% | 4441 | 0.0% | 514 | 65 | 91 | 97 |
| 2500 | 0.4770 | 0.4137 | 22% | 626 | 78.4% | 4430 | 0.0% | 514 | 61 | 83 | 71 |
| 2500 | 0.4770 | 0.4137 | 20% | 631 | 79.6% | 4421 | 0.0% | 514 | 57 | 76 | 48 |
| 2500 | 0.4770 | 0.4137 | 20% | 635 | 80.3% | 4416 | 0.0% | 514 | 53 | 71 | 31 |
| 2500 | 0.4770 | 0.4137 | 19% | 640 | 81.0% | 4411 | 0.0% | 514 | 48 | 65 | 14 |
| 2500 | 0.4770 | 0.4137 | 30% | 611 | 65.7% | 4522 | 4.5% | 521 | 71 | 88 | 47 |
| 2500 | 0.4770 | 0.4137 | 25% | 616 | 75.2% | 4455 | 0.0% | 521 | 68 | 91 | 76 |
| 2500 | 0.4770 | 0.4137 | 23% | 620 | 76.9% | 4441 | 0.0% | 521 | 65 | 91 | 97 |
| 2500 | 0.4770 | 0.4137 | 22% | 626 | 78.4% | 4430 | 0.0% | 521 | 61 | 83 | 71 |
| 2500 | 0.4770 | 0.4137 | 20% | 631 | 79.6% | 4421 | 0.0% | 521 | 57 | 76 | 48 |
| 2500 | 0.4770 | 0.4137 | 20% | 635 | 80.3% | 4416 | 0.0% | 521 | 53 | 71 | 31 |
| 2500 | 0.4770 | 0.4137 | 19% | 640 | 81.0% | 4411 | 0.0% | 521 | 48 | 65 | 14 |
| 2500 | 0.4770 | 0.4137 | 30% | 611 | 64.9% | 4537 | 5.1% | 527 | 72 | 88 | 48 |
| 2500 | 0.4770 | 0.4137 | 25% | 616 | 75.2% | 4455 | 0.0% | 527 | 68 | 91 | 76 |
| 2500 | 0.4770 | 0.4137 | 23% | 620 | 76.9% | 4441 | 0.0% | 527 | 65 | 91 | 97 |
| 2500 | 0.4770 | 0.4137 | 22% | 626 | 78.4% | 4430 | 0.0% | 527 | 61 | 83 | 71 |
| 2500 | 0.4770 | 0.4137 | 20% | 631 | 79.6% | 4421 | 0.0% | 527 | 57 | 76 | 48 |
| 2500 | 0.4770 | 0.4137 | 20% | 635 | 80.3% | 4416 | 0.0% | 527 | 53 | 71 | 31 |
| 2500 | 0.4770 | 0.4137 | 19% | 640 | 81.0% | 4411 | 0.0% | 527 | 48 | 65 | 14 |
| 2500 | 0.4770 | 0.4137 | 30% | 611 | 63.6% | 4556 | 6.2% | 534 | 73 | 88 | 48 |
| 2500 | 0.4770 | 0.4137 | 25% | 616 | 75.2% | 4455 | 0.0% | 534 | 68 | 91 | 76 |
| 2500 | 0.4770 | 0.4137 | 23% | 620 | 76.9% | 4441 | 0.0% | 534 | 65 | 91 | 97 |
| 2500 | 0.4770 | 0.4137 | 22% | 626 | 78.4% | 4430 | 0.0% | 534 | 61 | 83 | 71 |
| 2500 | 0.4770 | 0.4137 | 20% | 631 | 79.6% | 4421 | 0.0% | 534 | 57 | 76 | 48 |
| 2500 | 0.4770 | 0.4137 | 20% | 635 | 80.3% | 4416 | 0.0% | 534 | 53 | 71 | 31 |
| 2500 | 0.4770 | 0.4137 | 19% | 640 | 81.0% | 4411 | 0.0% | 534 | 48 | 65 | 14 |
| 2500 | 0.4770 | 0.4137 | 31% | 611 | 61.5% | 4586 | 8.0% | 540 | 73 | 87 | 49 |
| 2500 | 0.4770 | 0.4137 | 25% | 616 | 75.2% | 4455 | 0.0% | 540 | 68 | 91 | 76 |
| 2500 | 0.4770 | 0.4137 | 23% | 620 | 76.9% | 4441 | 0.0% | 540 | 65 | 91 | 97 |
| 2500 | 0.4770 | 0.4137 | 22% | 626 | 78.4% | 4430 | 0.0% | 540 | 61 | 83 | 71 |
| 2500 | 0.4770 | 0.4137 | 20% | 631 | 79.6% | 4421 | 0.0% | 540 | 57 | 76 | 48 |
| 2500 | 0.4770 | 0.4137 | 20% | 635 | 80.3% | 4416 | 0.0% | 540 | 53 | 71 | 31 |
| 2500 | 0.4770 | 0.4137 | 19% | 640 | 81.0% | 4411 | 0.0% | 540 | 48 | 65 | 14 |

TABLE 2-continued

| Tar CCT | R9 | RO x | RO y | PL x | PL y | BCG x | BCG y | blue % |
|---|---|---|---|---|---|---|---|---|
| 6500 | 0.5 | 0.6669 | 0.3329 | 0.4095 | 0.5146 | 0.1393 | 0.0514 | 0.4% |
| 6500 | 18.4 | 0.6814 | 0.3184 | 0.4095 | 0.5146 | 0.1393 | 0.0514 | 0.4% |
| 6500 | 32.5 | 0.6912 | 0.3087 | 0.4095 | 0.5146 | 0.1393 | 0.0514 | 0.4% |
| 6500 | 47.5 | 0.7008 | 0.2991 | 0.4095 | 0.5146 | 0.1393 | 0.0514 | 0.4% |
| 6500 | 60.2 | 0.7086 | 0.2914 | 0.4095 | 0.5146 | 0.1393 | 0.0514 | 0.4% |
| 6500 | 69.1 | 0.7138 | 0.2862 | 0.4095 | 0.5146 | 0.1393 | 0.0514 | 0.4% |
| 6500 | 78.0 | 0.7188 | 0.2812 | 0.4095 | 0.5146 | 0.1393 | 0.0514 | 0.4% |
| 6500 | 19.2 | 0.6669 | 0.3329 | 0.3942 | 0.4859 | 0.1303 | 0.0723 | 0.7% |
| 6500 | 44.1 | 0.6814 | 0.3184 | 0.3934 | 0.4844 | 0.1303 | 0.0723 | 0.7% |
| 6500 | 64.0 | 0.6912 | 0.3087 | 0.3941 | 0.4856 | 0.1303 | 0.0723 | 0.7% |
| 6500 | 85.3 | 0.7008 | 0.2991 | 0.3953 | 0.4880 | 0.1303 | 0.0723 | 0.7% |
| 6500 | 95.8 | 0.7086 | 0.2914 | 0.3934 | 0.4844 | 0.1303 | 0.0723 | 0.7% |
| 6500 | 87.8 | 0.7138 | 0.2862 | 0.3897 | 0.4774 | 0.1303 | 0.0723 | 0.8% |
| 6500 | 77.8 | 0.7188 | 0.2812 | 0.3875 | 0.4733 | 0.1303 | 0.0723 | 0.9% |
| 6500 | 20.7 | 0.6669 | 0.3329 | 0.3464 | 0.3963 | 0.1192 | 0.1046 | 2.1% |
| 6500 | 46.7 | 0.6814 | 0.3184 | 0.3468 | 0.3969 | 0.1192 | 0.1046 | 2.1% |
| 6500 | 68.2 | 0.6912 | 0.3087 | 0.3478 | 0.3988 | 0.1192 | 0.1046 | 2.1% |
| 6500 | 90.1 | 0.7008 | 0.2991 | 0.3484 | 0.4000 | 0.1192 | 0.1046 | 2.1% |
| 6500 | 92.3 | 0.7086 | 0.2914 | 0.3473 | 0.3979 | 0.1192 | 0.1046 | 2.1% |
| 6500 | 84.2 | 0.7138 | 0.2862 | 0.3454 | 0.3943 | 0.1192 | 0.1046 | 2.2% |
| 6500 | 74.0 | 0.7188 | 0.2812 | 0.3445 | 0.3928 | 0.1192 | 0.1046 | 2.2% |
| 6500 | 22.7 | 0.6669 | 0.3329 | 0.3290 | 0.3635 | 0.1082 | 0.1444 | 2.8% |
| 6500 | 50.8 | 0.6814 | 0.3184 | 0.3298 | 0.3651 | 0.1082 | 0.1444 | 2.8% |
| 6500 | 73.3 | 0.6912 | 0.3087 | 0.3305 | 0.3665 | 0.1082 | 0.1444 | 2.8% |
| 6500 | 94.8 | 0.7008 | 0.2991 | 0.3307 | 0.3669 | 0.1082 | 0.1444 | 2.8% |
| 6500 | 88.2 | 0.7086 | 0.2914 | 0.3299 | 0.3652 | 0.1082 | 0.1444 | 2.8% |
| 6500 | 80.0 | 0.7138 | 0.2862 | 0.3288 | 0.3633 | 0.1082 | 0.1444 | 2.8% |
| 6500 | 69.3 | 0.7188 | 0.2812 | 0.3285 | 0.3627 | 0.1082 | 0.1444 | 2.9% |
| 6500 | 26.6 | 0.6669 | 0.3329 | 0.3167 | 0.3406 | 0.0934 | 0.2133 | 3.4% |
| 6500 | 57.2 | 0.6814 | 0.3184 | 0.3175 | 0.3421 | 0.0934 | 0.2133 | 3.4% |
| 6500 | 80.2 | 0.6912 | 0.3087 | 0.3179 | 0.3428 | 0.0934 | 0.2133 | 3.4% |
| 6500 | 95.7 | 0.7008 | 0.2991 | 0.3180 | 0.3430 | 0.0934 | 0.2133 | 3.4% |
| 6500 | 83.4 | 0.7086 | 0.2914 | 0.3175 | 0.3421 | 0.0934 | 0.2133 | 3.4% |
| 6500 | 73.6 | 0.7138 | 0.2862 | 0.3173 | 0.3417 | 0.0934 | 0.2133 | 3.4% |
| 6500 | 61.4 | 0.7188 | 0.2812 | 0.3173 | 0.3418 | 0.0934 | 0.2133 | 3.4% |
| 6500 | 32.3 | 0.6669 | 0.3329 | 0.3083 | 0.3247 | 0.0792 | 0.3084 | 3.9% |
| 6500 | 64.0 | 0.6814 | 0.3184 | 0.3090 | 0.3261 | 0.0792 | 0.3084 | 3.8% |
| 6500 | 87.5 | 0.6912 | 0.3087 | 0.3094 | 0.3269 | 0.0792 | 0.3084 | 3.8% |
| 6500 | 92.3 | 0.7008 | 0.2991 | 0.3097 | 0.3273 | 0.0792 | 0.3084 | 3.8% |
| 6500 | 76.9 | 0.7086 | 0.2914 | 0.3098 | 0.3277 | 0.0792 | 0.3084 | 3.8% |
| 6500 | 63.6 | 0.7138 | 0.2862 | 0.3100 | 0.3279 | 0.0792 | 0.3084 | 3.8% |
| 6500 | 50.4 | 0.7188 | 0.2812 | 0.3101 | 0.3282 | 0.0792 | 0.3084 | 3.8% |
| 6500 | 37.3 | 0.6669 | 0.3329 | 0.3024 | 0.3137 | 0.0709 | 0.4039 | 4.2% |
| 6500 | 69.8 | 0.6814 | 0.3184 | 0.3034 | 0.3156 | 0.0709 | 0.4039 | 4.2% |
| 6500 | 93.5 | 0.6912 | 0.3087 | 0.3040 | 0.3167 | 0.0709 | 0.4039 | 4.1% |
| 6500 | 86.8 | 0.7008 | 0.2991 | 0.3048 | 0.3181 | 0.0709 | 0.4039 | 4.1% |
| 6500 | 68.4 | 0.7086 | 0.2914 | 0.3051 | 0.3189 | 0.0709 | 0.4039 | 4.1% |
| 6500 | 58.1 | 0.7138 | 0.2862 | 0.3054 | 0.3194 | 0.0709 | 0.4039 | 4.0% |
| 6500 | 48.7 | 0.7188 | 0.2812 | 0.3057 | 0.3200 | 0.0709 | 0.4039 | 4.0% |
| 6500 | 42.1 | 0.6669 | 0.3329 | 0.2963 | 0.3023 | 0.0694 | 0.5232 | 4.6% |
| 6500 | 75.2 | 0.6814 | 0.3184 | 0.2980 | 0.3054 | 0.0694 | 0.5232 | 4.5% |
| 6500 | 96.5 | 0.6912 | 0.3087 | 0.2991 | 0.3075 | 0.0694 | 0.5232 | 4.4% |
| 6500 | 82.4 | 0.7008 | 0.2991 | 0.3003 | 0.3098 | 0.0694 | 0.5232 | 4.4% |
| 6500 | 66.4 | 0.7086 | 0.2914 | 0.3011 | 0.3113 | 0.0694 | 0.5232 | 4.3% |
| 6500 | 56.7 | 0.7138 | 0.2862 | 0.3016 | 0.3122 | 0.0694 | 0.5232 | 4.3% |
| 6500 | 47.8 | 0.7188 | 0.2812 | 0.3021 | 0.3131 | 0.0694 | 0.5232 | 4.3% |
| 6500 | 45.7 | 0.6669 | 0.3329 | 0.2910 | 0.2923 | 0.0799 | 0.6269 | 5.0% |
| 6500 | 82.8 | 0.6814 | 0.3184 | 0.2928 | 0.2957 | 0.0799 | 0.6269 | 4.9% |
| 6500 | 97.2 | 0.6912 | 0.3087 | 0.2955 | 0.3008 | 0.0799 | 0.6269 | 4.7% |
| 6500 | 82.1 | 0.7008 | 0.2991 | 0.2972 | 0.3041 | 0.0799 | 0.6269 | 4.6% |
| 6500 | 68.2 | 0.7086 | 0.2914 | 0.2984 | 0.3062 | 0.0799 | 0.6269 | 4.5% |
| 6500 | 57.9 | 0.7138 | 0.2862 | 0.2990 | 0.3074 | 0.0799 | 0.6269 | 4.4% |
| 6500 | 48.0 | 0.7188 | 0.2812 | 0.2996 | 0.3084 | 0.0799 | 0.6269 | 4.4% |
| 6500 | 49.3 | 0.6669 | 0.3329 | 0.2862 | 0.2834 | 0.0975 | 0.6902 | 5.3% |
| 6500 | 85.1 | 0.6814 | 0.3184 | 0.2894 | 0.2893 | 0.0975 | 0.6902 | 5.1% |
| 6500 | 97.5 | 0.6912 | 0.3087 | 0.2930 | 0.2962 | 0.0975 | 0.6902 | 4.8% |
| 6500 | 83.6 | 0.7008 | 0.2991 | 0.2954 | 0.3005 | 0.0975 | 0.6902 | 4.7% |
| 6500 | 67.8 | 0.7086 | 0.2914 | 0.2965 | 0.3027 | 0.0975 | 0.6902 | 4.6% |
| 6500 | 57.4 | 0.7138 | 0.2862 | 0.2972 | 0.3040 | 0.0975 | 0.6902 | 4.6% |
| 6500 | 48.1 | 0.7188 | 0.2812 | 0.2979 | 0.3053 | 0.0975 | 0.6902 | 4.5% |
| 6500 | 52.6 | 0.6669 | 0.3329 | 0.2800 | 0.2718 | 0.1270 | 0.7352 | 5.8% |
| 6500 | 84.9 | 0.6814 | 0.3184 | 0.2859 | 0.2828 | 0.1270 | 0.7352 | 5.4% |
| 6500 | 97.6 | 0.6912 | 0.3087 | 0.2906 | 0.2916 | 0.1270 | 0.7352 | 5.0% |
| 6500 | 82.7 | 0.7008 | 0.2991 | 0.2930 | 0.2961 | 0.1270 | 0.7352 | 4.8% |
| 6500 | 67.1 | 0.7086 | 0.2914 | 0.2944 | 0.2987 | 0.1270 | 0.7352 | 4.8% |
| 6500 | 57.8 | 0.7138 | 0.2862 | 0.2954 | 0.3005 | 0.1270 | 0.7352 | 4.7% |
| 6500 | 51.2 | 0.7188 | 0.2812 | 0.2964 | 0.3025 | 0.1270 | 0.7352 | 4.6% |
| 6500 | 54.3 | 0.6669 | 0.3329 | 0.2739 | 0.2603 | 0.1561 | 0.7502 | 6.4% |

TABLE 2-continued

| | | | | | | | | |
|---|---|---|---|---|---|---|---|---|
| 6500 | 84.8 | 0.6814 | 0.3184 | 0.2826 | 0.2767 | 0.1561 | 0.7502 | 5.6% |
| 6500 | 97.6 | 0.6912 | 0.3087 | 0.2882 | 0.2872 | 0.1561 | 0.7502 | 5.2% |
| 6500 | 81.8 | 0.7008 | 0.2991 | 0.2908 | 0.2920 | 0.1561 | 0.7502 | 5.0% |
| 6500 | 67.9 | 0.7086 | 0.2914 | 0.2927 | 0.2956 | 0.1561 | 0.7502 | 4.9% |
| 6500 | 61.8 | 0.7138 | 0.2862 | 0.2942 | 0.2984 | 0.1561 | 0.7502 | 4.8% |
| 6500 | 60.3 | 0.7188 | 0.2812 | 0.2959 | 0.3016 | 0.1561 | 0.7502 | 4.6% |
| 6500 | 55.7 | 0.6669 | 0.3329 | 0.2634 | 0.2406 | 0.1938 | 0.7479 | 7.5% |
| 6500 | 81.7 | 0.6814 | 0.3184 | 0.2786 | 0.2692 | 0.1938 | 0.7479 | 6.0% |
| 6500 | 98.4 | 0.6912 | 0.3087 | 0.2842 | 0.2796 | 0.1938 | 0.7479 | 5.5% |
| 6500 | 82.5 | 0.7008 | 0.2991 | 0.2880 | 0.2868 | 0.1938 | 0.7479 | 5.2% |
| 6500 | 75.2 | 0.7086 | 0.2914 | 0.2914 | 0.2931 | 0.1938 | 0.7479 | 5.0% |
| 6500 | 74.2 | 0.7138 | 0.2862 | 0.2938 | 0.2976 | 0.1938 | 0.7479 | 4.8% |
| 6500 | 75.4 | 0.7188 | 0.2812 | 0.2959 | 0.3016 | 0.1938 | 0.7479 | 4.6% |
| 6500 | 47.2 | 0.6669 | 0.3329 | 0.2549 | 0.2246 | 0.2329 | 0.7309 | 8.5% |
| 6500 | 81.8 | 0.6814 | 0.3184 | 0.2707 | 0.2543 | 0.2329 | 0.7309 | 6.7% |
| 6500 | 98.7 | 0.6912 | 0.3087 | 0.2786 | 0.2690 | 0.2329 | 0.7309 | 6.0% |
| 6500 | 90.5 | 0.7008 | 0.2991 | 0.2858 | 0.2827 | 0.2329 | 0.7309 | 5.4% |
| 6500 | 88.4 | 0.7086 | 0.2914 | 0.2907 | 0.2919 | 0.2329 | 0.7309 | 5.0% |
| 6500 | 88.3 | 0.7138 | 0.2862 | 0.2935 | 0.2970 | 0.2329 | 0.7309 | 4.8% |
| 6500 | 89.1 | 0.7188 | 0.2812 | 0.2958 | 0.3013 | 0.2329 | 0.7309 | 4.7% |
| 6400 | 0.4 | 0.6669 | 0.3329 | 0.4095 | 0.5146 | 0.1393 | 0.0514 | 0.4% |
| 6400 | 18.9 | 0.6814 | 0.3184 | 0.4095 | 0.5146 | 0.1393 | 0.0514 | 0.4% |
| 6400 | 33.5 | 0.6912 | 0.3087 | 0.4095 | 0.5146 | 0.1393 | 0.0514 | 0.4% |
| 6400 | 49.1 | 0.7008 | 0.2991 | 0.4095 | 0.5146 | 0.1393 | 0.0514 | 0.4% |
| 6400 | 62.2 | 0.7086 | 0.2914 | 0.4095 | 0.5146 | 0.1393 | 0.0514 | 0.4% |
| 6400 | 71.4 | 0.7138 | 0.2862 | 0.4095 | 0.5146 | 0.1393 | 0.0514 | 0.4% |
| 6400 | 80.5 | 0.7188 | 0.2812 | 0.4095 | 0.5146 | 0.1393 | 0.0514 | 0.4% |
| 6400 | 19.0 | 0.6669 | 0.3329 | 0.3955 | 0.4883 | 0.1303 | 0.0723 | 0.7% |
| 6400 | 44.5 | 0.6814 | 0.3184 | 0.3946 | 0.4866 | 0.1303 | 0.0723 | 0.7% |
| 6400 | 64.8 | 0.6912 | 0.3087 | 0.3951 | 0.4876 | 0.1303 | 0.0723 | 0.7% |
| 6400 | 86.5 | 0.7008 | 0.2991 | 0.3963 | 0.4897 | 0.1303 | 0.0723 | 0.7% |
| 6400 | 95.1 | 0.7086 | 0.2914 | 0.3938 | 0.4851 | 0.1303 | 0.0723 | 0.7% |
| 6400 | 86.4 | 0.7138 | 0.2862 | 0.3900 | 0.4780 | 0.1303 | 0.0723 | 0.8% |
| 6400 | 75.8 | 0.7188 | 0.2812 | 0.3883 | 0.4748 | 0.1303 | 0.0723 | 0.9% |
| 6400 | 20.5 | 0.6669 | 0.3329 | 0.3475 | 0.3984 | 0.1192 | 0.1046 | 2.1% |
| 6400 | 47.1 | 0.6814 | 0.3184 | 0.3478 | 0.3989 | 0.1192 | 0.1046 | 2.1% |
| 6400 | 68.9 | 0.6912 | 0.3087 | 0.3488 | 0.4008 | 0.1192 | 0.1046 | 2.0% |
| 6400 | 91.1 | 0.7008 | 0.2991 | 0.3494 | 0.4018 | 0.1192 | 0.1046 | 2.0% |
| 6400 | 91.5 | 0.7086 | 0.2914 | 0.3480 | 0.3992 | 0.1192 | 0.1046 | 2.1% |
| 6400 | 83.0 | 0.7138 | 0.2862 | 0.3461 | 0.3956 | 0.1192 | 0.1046 | 2.1% |
| 6400 | 72.0 | 0.7188 | 0.2812 | 0.3455 | 0.3945 | 0.1192 | 0.1046 | 2.2% |
| 6400 | 22.4 | 0.6669 | 0.3329 | 0.3300 | 0.3655 | 0.1082 | 0.1444 | 2.8% |
| 6400 | 51.0 | 0.6814 | 0.3184 | 0.3308 | 0.3670 | 0.1082 | 0.1444 | 2.8% |
| 6400 | 73.9 | 0.6912 | 0.3087 | 0.3315 | 0.3684 | 0.1082 | 0.1444 | 2.7% |
| 6400 | 95.5 | 0.7008 | 0.2991 | 0.3317 | 0.3687 | 0.1082 | 0.1444 | 2.7% |
| 6400 | 87.5 | 0.7086 | 0.2914 | 0.3307 | 0.3668 | 0.1082 | 0.1444 | 2.8% |
| 6400 | 78.9 | 0.7138 | 0.2862 | 0.3297 | 0.3649 | 0.1082 | 0.1444 | 2.8% |
| 6400 | 67.4 | 0.7188 | 0.2812 | 0.3295 | 0.3645 | 0.1082 | 0.1444 | 2.8% |
| 6400 | 26.3 | 0.6669 | 0.3329 | 0.3177 | 0.3424 | 0.0934 | 0.2133 | 3.4% |
| 6400 | 57.3 | 0.6814 | 0.3184 | 0.3185 | 0.3440 | 0.0934 | 0.2133 | 3.3% |
| 6400 | 80.7 | 0.6912 | 0.3087 | 0.3189 | 0.3447 | 0.0934 | 0.2133 | 3.3% |
| 6400 | 95.4 | 0.7008 | 0.2991 | 0.3190 | 0.3448 | 0.0934 | 0.2133 | 3.3% |
| 6400 | 82.8 | 0.7086 | 0.2914 | 0.3184 | 0.3438 | 0.0934 | 0.2133 | 3.3% |
| 6400 | 72.2 | 0.7138 | 0.2862 | 0.3183 | 0.3435 | 0.0934 | 0.2133 | 3.3% |
| 6400 | 59.5 | 0.7188 | 0.2812 | 0.3183 | 0.3436 | 0.0934 | 0.2133 | 3.3% |
| 6400 | 31.9 | 0.6669 | 0.3329 | 0.3092 | 0.3266 | 0.0792 | 0.3084 | 3.8% |
| 6400 | 64.0 | 0.6814 | 0.3184 | 0.3100 | 0.3279 | 0.0792 | 0.3084 | 3.8% |
| 6400 | 87.8 | 0.6912 | 0.3087 | 0.3104 | 0.3287 | 0.0792 | 0.3084 | 3.8% |
| 6400 | 92.1 | 0.7008 | 0.2991 | 0.3106 | 0.3292 | 0.0792 | 0.3084 | 3.8% |
| 6400 | 75.8 | 0.7086 | 0.2914 | 0.3108 | 0.3295 | 0.0792 | 0.3084 | 3.7% |
| 6400 | 62.2 | 0.7138 | 0.2862 | 0.3110 | 0.3298 | 0.0792 | 0.3084 | 3.7% |
| 6400 | 49.0 | 0.7188 | 0.2812 | 0.3111 | 0.3301 | 0.0792 | 0.3084 | 3.7% |
| 6400 | 36.8 | 0.6669 | 0.3329 | 0.3034 | 0.3156 | 0.0709 | 0.4039 | 4.2% |
| 6400 | 69.8 | 0.6814 | 0.3184 | 0.3044 | 0.3175 | 0.0709 | 0.4039 | 4.1% |
| 6400 | 93.6 | 0.6912 | 0.3087 | 0.3050 | 0.3187 | 0.0709 | 0.4039 | 4.1% |
| 6400 | 86.2 | 0.7008 | 0.2991 | 0.3058 | 0.3200 | 0.0709 | 0.4039 | 4.0% |
| 6400 | 68.1 | 0.7086 | 0.2914 | 0.3062 | 0.3208 | 0.0709 | 0.4039 | 4.0% |
| 6400 | 57.7 | 0.7138 | 0.2862 | 0.3065 | 0.3214 | 0.0709 | 0.4039 | 4.0% |
| 6400 | 48.1 | 0.7188 | 0.2812 | 0.3067 | 0.3219 | 0.0709 | 0.4039 | 4.0% |
| 6400 | 41.5 | 0.6669 | 0.3329 | 0.2973 | 0.3042 | 0.0694 | 0.5232 | 4.6% |
| 6400 | 75.0 | 0.6814 | 0.3184 | 0.2990 | 0.3074 | 0.0694 | 0.5232 | 4.4% |
| 6400 | 96.5 | 0.6912 | 0.3087 | 0.3001 | 0.3095 | 0.0694 | 0.5232 | 4.4% |
| 6400 | 82.1 | 0.7008 | 0.2991 | 0.3014 | 0.3118 | 0.0694 | 0.5232 | 4.3% |
| 6400 | 65.8 | 0.7086 | 0.2914 | 0.3021 | 0.3132 | 0.0694 | 0.5232 | 4.3% |
| 6400 | 56.1 | 0.7138 | 0.2862 | 0.3026 | 0.3142 | 0.0694 | 0.5232 | 4.2% |
| 6400 | 47.3 | 0.7188 | 0.2812 | 0.3031 | 0.3151 | 0.0694 | 0.5232 | 4.2% |
| 6400 | 45.1 | 0.6669 | 0.3329 | 0.2920 | 0.2942 | 0.0799 | 0.6269 | 4.9% |
| 6400 | 82.5 | 0.6814 | 0.3184 | 0.2939 | 0.2977 | 0.0799 | 0.6269 | 4.8% |
| 6400 | 97.2 | 0.6912 | 0.3087 | 0.2966 | 0.3028 | 0.0799 | 0.6269 | 4.6% |
| 6400 | 82.2 | 0.7008 | 0.2991 | 0.2983 | 0.3061 | 0.0799 | 0.6269 | 4.5% |

TABLE 2-continued

| | | | | | | | | |
|---|---|---|---|---|---|---|---|---|
| 6400 | 68.0 | 0.7086 | 0.2914 | 0.2995 | 0.3083 | 0.0799 | 0.6269 | 4.4% |
| 6400 | 57.6 | 0.7138 | 0.2862 | 0.3001 | 0.3094 | 0.0799 | 0.6269 | 4.4% |
| 6400 | 47.6 | 0.7188 | 0.2812 | 0.3007 | 0.3105 | 0.0799 | 0.6269 | 4.3% |
| 6400 | 48.6 | 0.6669 | 0.3329 | 0.2873 | 0.2854 | 0.0975 | 0.6902 | 5.3% |
| 6400 | 84.8 | 0.6814 | 0.3184 | 0.2904 | 0.2913 | 0.0975 | 0.6902 | 5.0% |
| 6400 | 97.5 | 0.6912 | 0.3087 | 0.2941 | 0.2982 | 0.0975 | 0.6902 | 4.8% |
| 6400 | 83.6 | 0.7008 | 0.2991 | 0.2965 | 0.3026 | 0.0975 | 0.6902 | 4.6% |
| 6400 | 67.7 | 0.7086 | 0.2914 | 0.2976 | 0.3048 | 0.0975 | 0.6902 | 4.5% |
| 6400 | 57.2 | 0.7138 | 0.2862 | 0.2983 | 0.3061 | 0.0975 | 0.6902 | 4.5% |
| 6400 | 47.8 | 0.7188 | 0.2812 | 0.2990 | 0.3074 | 0.0975 | 0.6902 | 4.4% |
| 6400 | 51.9 | 0.6669 | 0.3329 | 0.2811 | 0.2738 | 0.1270 | 0.7352 | 5.8% |
| 6400 | 84.6 | 0.6814 | 0.3184 | 0.2870 | 0.2849 | 0.1270 | 0.7352 | 5.3% |
| 6400 | 97.5 | 0.6912 | 0.3087 | 0.2917 | 0.2937 | 0.1270 | 0.7352 | 4.9% |
| 6400 | 82.8 | 0.7008 | 0.2991 | 0.2941 | 0.2982 | 0.1270 | 0.7352 | 4.8% |
| 6400 | 67.1 | 0.7086 | 0.2914 | 0.2956 | 0.3009 | 0.1270 | 0.7352 | 4.7% |
| 6400 | 57.7 | 0.7138 | 0.2862 | 0.2965 | 0.3027 | 0.1270 | 0.7352 | 4.6% |
| 6400 | 51.0 | 0.7188 | 0.2812 | 0.2976 | 0.3047 | 0.1270 | 0.7352 | 4.5% |
| 6400 | 53.6 | 0.6669 | 0.3329 | 0.2751 | 0.2625 | 0.1561 | 0.7502 | 6.3% |
| 6400 | 84.4 | 0.6814 | 0.3184 | 0.2838 | 0.2788 | 0.1561 | 0.7502 | 5.5% |
| 6400 | 97.5 | 0.6912 | 0.3087 | 0.2894 | 0.2894 | 0.1561 | 0.7502 | 5.1% |
| 6400 | 81.9 | 0.7008 | 0.2991 | 0.2920 | 0.2943 | 0.1561 | 0.7502 | 4.9% |
| 6400 | 68.0 | 0.7086 | 0.2914 | 0.2939 | 0.2979 | 0.1561 | 0.7502 | 4.8% |
| 6400 | 61.8 | 0.7138 | 0.2862 | 0.2954 | 0.3007 | 0.1561 | 0.7502 | 4.7% |
| 6400 | 60.1 | 0.7188 | 0.2812 | 0.2971 | 0.3039 | 0.1561 | 0.7502 | 4.6% |
| 6400 | 55.0 | 0.6669 | 0.3329 | 0.2647 | 0.2430 | 0.1938 | 0.7479 | 7.3% |
| 6400 | 81.4 | 0.6814 | 0.3184 | 0.2798 | 0.2714 | 0.1938 | 0.7479 | 5.9% |
| 6400 | 98.4 | 0.6912 | 0.3087 | 0.2854 | 0.2819 | 0.1938 | 0.7479 | 5.4% |
| 6400 | 82.7 | 0.7008 | 0.2991 | 0.2893 | 0.2891 | 0.1938 | 0.7479 | 5.1% |
| 6400 | 75.2 | 0.7086 | 0.2914 | 0.2927 | 0.2955 | 0.1938 | 0.7479 | 4.9% |
| 6400 | 74.2 | 0.7138 | 0.2862 | 0.2950 | 0.2999 | 0.1938 | 0.7479 | 4.7% |
| 6400 | 75.3 | 0.7188 | 0.2812 | 0.2972 | 0.3040 | 0.1938 | 0.7479 | 4.6% |
| 6400 | 47.7 | 0.6669 | 0.3329 | 0.2549 | 0.2246 | 0.2329 | 0.7309 | 8.5% |
| 6400 | 81.3 | 0.6814 | 0.3184 | 0.2720 | 0.2568 | 0.2329 | 0.7309 | 6.6% |
| 6400 | 98.8 | 0.6912 | 0.3087 | 0.2799 | 0.2716 | 0.2329 | 0.7309 | 5.9% |
| 6400 | 90.7 | 0.7008 | 0.2991 | 0.2872 | 0.2852 | 0.2329 | 0.7309 | 5.3% |
| 6400 | 88.5 | 0.7086 | 0.2914 | 0.2921 | 0.2944 | 0.2329 | 0.7309 | 4.9% |
| 6400 | 88.4 | 0.7138 | 0.2862 | 0.2948 | 0.2995 | 0.2329 | 0.7309 | 4.7% |
| 6400 | 89.1 | 0.7188 | 0.2812 | 0.2971 | 0.3038 | 0.2329 | 0.7309 | 4.6% |
| 6300 | 0.3 | 0.6669 | 0.3329 | 0.4095 | 0.5146 | 0.1393 | 0.0514 | 0.4% |
| 6300 | 19.5 | 0.6814 | 0.3184 | 0.4095 | 0.5146 | 0.1393 | 0.0514 | 0.4% |
| 6300 | 34.6 | 0.6912 | 0.3087 | 0.4095 | 0.5146 | 0.1393 | 0.0514 | 0.4% |
| 6300 | 50.7 | 0.7008 | 0.2991 | 0.4095 | 0.5146 | 0.1393 | 0.0514 | 0.4% |
| 6300 | 64.2 | 0.7086 | 0.2914 | 0.4095 | 0.5146 | 0.1393 | 0.0514 | 0.4% |
| 6300 | 73.7 | 0.7138 | 0.2862 | 0.4095 | 0.5146 | 0.1393 | 0.0514 | 0.4% |
| 6300 | 83.2 | 0.7188 | 0.2812 | 0.4095 | 0.5146 | 0.1393 | 0.0514 | 0.4% |
| 6300 | 18.8 | 0.6669 | 0.3329 | 0.3968 | 0.4907 | 0.1303 | 0.0723 | 0.7% |
| 6300 | 44.9 | 0.6814 | 0.3184 | 0.3958 | 0.4888 | 0.1303 | 0.0723 | 0.7% |
| 6300 | 65.6 | 0.6912 | 0.3087 | 0.3963 | 0.4897 | 0.1303 | 0.0723 | 0.7% |
| 6300 | 87.6 | 0.7008 | 0.2991 | 0.3972 | 0.4915 | 0.1303 | 0.0723 | 0.6% |
| 6300 | 94.3 | 0.7086 | 0.2914 | 0.3941 | 0.4857 | 0.1303 | 0.0723 | 0.7% |
| 6300 | 84.9 | 0.7138 | 0.2862 | 0.3905 | 0.4789 | 0.1303 | 0.0723 | 0.8% |
| 6300 | 73.7 | 0.7188 | 0.2812 | 0.3891 | 0.4763 | 0.1303 | 0.0723 | 0.8% |
| 6300 | 20.3 | 0.6669 | 0.3329 | 0.3487 | 0.4005 | 0.1192 | 0.1046 | 2.1% |
| 6300 | 47.4 | 0.6814 | 0.3184 | 0.3489 | 0.4010 | 0.1192 | 0.1046 | 2.0% |
| 6300 | 69.6 | 0.6912 | 0.3087 | 0.3499 | 0.4028 | 0.1192 | 0.1046 | 2.0% |
| 6300 | 92.0 | 0.7008 | 0.2991 | 0.3504 | 0.4037 | 0.1192 | 0.1046 | 2.0% |
| 6300 | 90.7 | 0.7086 | 0.2914 | 0.3487 | 0.4005 | 0.1192 | 0.1046 | 2.1% |
| 6300 | 81.6 | 0.7138 | 0.2862 | 0.3469 | 0.3972 | 0.1192 | 0.1046 | 2.1% |
| 6300 | 70.0 | 0.7188 | 0.2812 | 0.3465 | 0.3964 | 0.1192 | 0.1046 | 2.1% |
| 6300 | 22.2 | 0.6669 | 0.3329 | 0.3310 | 0.3675 | 0.1082 | 0.1444 | 2.8% |
| 6300 | 51.3 | 0.6814 | 0.3184 | 0.3319 | 0.3690 | 0.1082 | 0.1444 | 2.7% |
| 6300 | 74.5 | 0.6912 | 0.3087 | 0.3326 | 0.3703 | 0.1082 | 0.1444 | 2.7% |
| 6300 | 96.0 | 0.7008 | 0.2991 | 0.3327 | 0.3705 | 0.1082 | 0.1444 | 2.7% |
| 6300 | 86.9 | 0.7086 | 0.2914 | 0.3315 | 0.3683 | 0.1082 | 0.1444 | 2.7% |
| 6300 | 77.5 | 0.7138 | 0.2862 | 0.3306 | 0.3667 | 0.1082 | 0.1444 | 2.8% |
| 6300 | 65.4 | 0.7188 | 0.2812 | 0.3305 | 0.3664 | 0.1082 | 0.1444 | 2.8% |
| 6300 | 26.0 | 0.6669 | 0.3329 | 0.3187 | 0.3444 | 0.0934 | 0.2133 | 3.3% |
| 6300 | 57.4 | 0.6814 | 0.3184 | 0.3196 | 0.3459 | 0.0934 | 0.2133 | 3.3% |
| 6300 | 81.1 | 0.6912 | 0.3087 | 0.3199 | 0.3466 | 0.0934 | 0.2133 | 3.3% |
| 6300 | 95.0 | 0.7008 | 0.2991 | 0.3199 | 0.3466 | 0.0934 | 0.2133 | 3.3% |
| 6300 | 82.2 | 0.7086 | 0.2914 | 0.3194 | 0.3456 | 0.0934 | 0.2133 | 3.3% |
| 6300 | 70.7 | 0.7138 | 0.2862 | 0.3193 | 0.3454 | 0.0934 | 0.2133 | 3.3% |
| 6300 | 57.6 | 0.7188 | 0.2812 | 0.3194 | 0.3456 | 0.0934 | 0.2133 | 3.3% |
| 6300 | 31.4 | 0.6669 | 0.3329 | 0.3103 | 0.3285 | 0.0792 | 0.3084 | 3.8% |
| 6300 | 64.0 | 0.6814 | 0.3184 | 0.3110 | 0.3299 | 0.0792 | 0.3084 | 3.7% |
| 6300 | 88.2 | 0.6912 | 0.3087 | 0.3114 | 0.3307 | 0.0792 | 0.3084 | 3.7% |
| 6300 | 91.9 | 0.7008 | 0.2991 | 0.3117 | 0.3311 | 0.0792 | 0.3084 | 3.7% |
| 6300 | 74.6 | 0.7086 | 0.2914 | 0.3119 | 0.3315 | 0.0792 | 0.3084 | 3.7% |
| 6300 | 60.8 | 0.7138 | 0.2862 | 0.3120 | 0.3318 | 0.0792 | 0.3084 | 3.7% |
| 6300 | 47.6 | 0.7188 | 0.2812 | 0.3121 | 0.3320 | 0.0792 | 0.3084 | 3.7% |

TABLE 2-continued

| | | | | | | | | |
|---|---|---|---|---|---|---|---|---|
| 6300 | 36.3 | 0.6669 | 0.3329 | 0.3044 | 0.3175 | 0.0709 | 0.4039 | 4.1% |
| 6300 | 69.8 | 0.6814 | 0.3184 | 0.3054 | 0.3194 | 0.0709 | 0.4039 | 4.0% |
| 6300 | 93.7 | 0.6912 | 0.3087 | 0.3061 | 0.3206 | 0.0709 | 0.4039 | 4.0% |
| 6300 | 85.6 | 0.7008 | 0.2991 | 0.3068 | 0.3220 | 0.0709 | 0.4039 | 4.0% |
| 6300 | 67.8 | 0.7086 | 0.2914 | 0.3072 | 0.3228 | 0.0709 | 0.4039 | 3.9% |
| 6300 | 57.2 | 0.7138 | 0.2862 | 0.3075 | 0.3233 | 0.0709 | 0.4039 | 3.9% |
| 6300 | 47.5 | 0.7188 | 0.2812 | 0.3078 | 0.3238 | 0.0709 | 0.4039 | 3.9% |
| 6300 | 40.9 | 0.6669 | 0.3329 | 0.2984 | 0.3062 | 0.0694 | 0.5232 | 4.5% |
| 6300 | 74.8 | 0.6814 | 0.3184 | 0.3001 | 0.3094 | 0.0694 | 0.5232 | 4.4% |
| 6300 | 96.4 | 0.6912 | 0.3087 | 0.3012 | 0.3115 | 0.0694 | 0.5232 | 4.3% |
| 6300 | 81.8 | 0.7008 | 0.2991 | 0.3024 | 0.3138 | 0.0694 | 0.5232 | 4.2% |
| 6300 | 65.2 | 0.7086 | 0.2914 | 0.3032 | 0.3152 | 0.0694 | 0.5232 | 4.2% |
| 6300 | 55.5 | 0.7138 | 0.2862 | 0.3037 | 0.3162 | 0.0694 | 0.5232 | 4.2% |
| 6300 | 46.8 | 0.7188 | 0.2812 | 0.3042 | 0.3172 | 0.0694 | 0.5232 | 4.1% |
| 6300 | 44.6 | 0.6669 | 0.3329 | 0.2930 | 0.2962 | 0.0799 | 0.6269 | 4.8% |
| 6300 | 82.2 | 0.6814 | 0.3184 | 0.2950 | 0.2998 | 0.0799 | 0.6269 | 4.7% |
| 6300 | 97.2 | 0.6912 | 0.3087 | 0.2977 | 0.3049 | 0.0799 | 0.6269 | 4.5% |
| 6300 | 82.3 | 0.7008 | 0.2991 | 0.2995 | 0.3082 | 0.0799 | 0.6269 | 4.4% |
| 6300 | 67.8 | 0.7086 | 0.2914 | 0.3006 | 0.3104 | 0.0799 | 0.6269 | 4.3% |
| 6300 | 57.3 | 0.7138 | 0.2862 | 0.3012 | 0.3116 | 0.0799 | 0.6269 | 4.3% |
| 6300 | 47.2 | 0.7188 | 0.2812 | 0.3018 | 0.3126 | 0.0799 | 0.6269 | 4.3% |
| 6300 | 47.9 | 0.6669 | 0.3329 | 0.2884 | 0.2875 | 0.0975 | 0.6902 | 5.2% |
| 6300 | 84.5 | 0.6814 | 0.3184 | 0.2916 | 0.2934 | 0.0975 | 0.6902 | 5.0% |
| 6300 | 97.5 | 0.6912 | 0.3087 | 0.2953 | 0.3004 | 0.0975 | 0.6902 | 4.7% |
| 6300 | 83.6 | 0.7008 | 0.2991 | 0.2976 | 0.3048 | 0.0975 | 0.6902 | 4.5% |
| 6300 | 67.5 | 0.7086 | 0.2914 | 0.2988 | 0.3070 | 0.0975 | 0.6902 | 4.5% |
| 6300 | 57.0 | 0.7138 | 0.2862 | 0.2995 | 0.3083 | 0.0975 | 0.6902 | 4.4% |
| 6300 | 47.5 | 0.7188 | 0.2812 | 0.3002 | 0.3096 | 0.0975 | 0.6902 | 4.4% |
| 6300 | 51.2 | 0.6669 | 0.3329 | 0.2823 | 0.2760 | 0.1270 | 0.7352 | 5.7% |
| 6300 | 84.2 | 0.6814 | 0.3184 | 0.2882 | 0.2870 | 0.1270 | 0.7352 | 5.2% |
| 6300 | 97.4 | 0.6912 | 0.3087 | 0.2929 | 0.2959 | 0.1270 | 0.7352 | 4.9% |
| 6300 | 82.8 | 0.7008 | 0.2991 | 0.2953 | 0.3005 | 0.1270 | 0.7352 | 4.7% |
| 6300 | 67.0 | 0.7086 | 0.2914 | 0.2968 | 0.3031 | 0.1270 | 0.7352 | 4.6% |
| 6300 | 57.6 | 0.7138 | 0.2862 | 0.2977 | 0.3050 | 0.1270 | 0.7352 | 4.5% |
| 6300 | 50.8 | 0.7188 | 0.2812 | 0.2988 | 0.3070 | 0.1270 | 0.7352 | 4.5% |
| 6300 | 52.9 | 0.6669 | 0.3329 | 0.2763 | 0.2647 | 0.1561 | 0.7502 | 6.2% |
| 6300 | 84.1 | 0.6814 | 0.3184 | 0.2849 | 0.2810 | 0.1561 | 0.7502 | 5.4% |
| 6300 | 97.3 | 0.6912 | 0.3087 | 0.2906 | 0.2916 | 0.1561 | 0.7502 | 5.0% |
| 6300 | 82.1 | 0.7008 | 0.2991 | 0.2933 | 0.2966 | 0.1561 | 0.7502 | 4.8% |
| 6300 | 68.0 | 0.7086 | 0.2914 | 0.2952 | 0.3002 | 0.1561 | 0.7502 | 4.7% |
| 6300 | 61.8 | 0.7138 | 0.2862 | 0.2967 | 0.3030 | 0.1561 | 0.7502 | 4.6% |
| 6300 | 60.0 | 0.7188 | 0.2812 | 0.2984 | 0.3062 | 0.1561 | 0.7502 | 4.5% |
| 6300 | 54.2 | 0.6669 | 0.3329 | 0.2660 | 0.2454 | 0.1938 | 0.7479 | 7.2% |
| 6300 | 81.1 | 0.6814 | 0.3184 | 0.2810 | 0.2736 | 0.1938 | 0.7479 | 5.8% |
| 6300 | 98.3 | 0.6912 | 0.3087 | 0.2867 | 0.2844 | 0.1938 | 0.7479 | 5.3% |
| 6300 | 82.9 | 0.7008 | 0.2991 | 0.2906 | 0.2916 | 0.1938 | 0.7479 | 5.0% |
| 6300 | 75.3 | 0.7086 | 0.2914 | 0.2940 | 0.2979 | 0.1938 | 0.7479 | 4.8% |
| 6300 | 74.2 | 0.7138 | 0.2862 | 0.2963 | 0.3024 | 0.1938 | 0.7479 | 4.6% |
| 6300 | 75.3 | 0.7188 | 0.2812 | 0.2985 | 0.3064 | 0.1938 | 0.7479 | 4.5% |
| 6300 | 48.3 | 0.6669 | 0.3329 | 0.2549 | 0.2246 | 0.2329 | 0.7309 | 8.5% |
| 6300 | 80.9 | 0.6814 | 0.3184 | 0.2734 | 0.2594 | 0.2329 | 0.7309 | 6.4% |
| 6300 | 98.7 | 0.6912 | 0.3087 | 0.2813 | 0.2742 | 0.2329 | 0.7309 | 5.7% |
| 6300 | 90.9 | 0.7008 | 0.2991 | 0.2886 | 0.2878 | 0.2329 | 0.7309 | 5.2% |
| 6300 | 88.6 | 0.7086 | 0.2914 | 0.2935 | 0.2970 | 0.2329 | 0.7309 | 4.8% |
| 6300 | 88.4 | 0.7138 | 0.2862 | 0.2962 | 0.3021 | 0.2329 | 0.7309 | 4.6% |
| 6300 | 89.1 | 0.7188 | 0.2812 | 0.2985 | 0.3064 | 0.2329 | 0.7309 | 4.5% |
| 6200 | 0.2 | 0.6669 | 0.3329 | 0.4095 | 0.5146 | 0.1393 | 0.0514 | 0.4% |
| 6200 | 20.1 | 0.6814 | 0.3184 | 0.4095 | 0.5146 | 0.1393 | 0.0514 | 0.4% |
| 6200 | 35.7 | 0.6912 | 0.3087 | 0.4095 | 0.5146 | 0.1393 | 0.0514 | 0.4% |
| 6200 | 52.3 | 0.7008 | 0.2991 | 0.4095 | 0.5146 | 0.1393 | 0.0514 | 0.4% |
| 6200 | 66.3 | 0.7086 | 0.2914 | 0.4095 | 0.5146 | 0.1393 | 0.0514 | 0.4% |
| 6200 | 76.2 | 0.7138 | 0.2862 | 0.4095 | 0.5146 | 0.1393 | 0.0514 | 0.4% |
| 6200 | 85.9 | 0.7188 | 0.2812 | 0.4095 | 0.5146 | 0.1393 | 0.0514 | 0.4% |
| 6200 | 18.6 | 0.6669 | 0.3329 | 0.3981 | 0.4932 | 0.1303 | 0.0723 | 0.6% |
| 6200 | 45.3 | 0.6814 | 0.3184 | 0.3969 | 0.4910 | 0.1303 | 0.0723 | 0.6% |
| 6200 | 66.4 | 0.6912 | 0.3087 | 0.3974 | 0.4918 | 0.1303 | 0.0723 | 0.6% |
| 6200 | 88.7 | 0.7008 | 0.2991 | 0.3981 | 0.4932 | 0.1303 | 0.0723 | 0.6% |
| 6200 | 93.3 | 0.7086 | 0.2914 | 0.3943 | 0.4861 | 0.1303 | 0.0723 | 0.7% |
| 6200 | 83.2 | 0.7138 | 0.2862 | 0.3911 | 0.4801 | 0.1303 | 0.0723 | 0.8% |
| 6200 | 71.5 | 0.7188 | 0.2812 | 0.3900 | 0.4779 | 0.1303 | 0.0723 | 0.8% |
| 6200 | 20.1 | 0.6669 | 0.3329 | 0.3498 | 0.4027 | 0.1192 | 0.1046 | 2.0% |
| 6200 | 47.7 | 0.6814 | 0.3184 | 0.3500 | 0.4030 | 0.1192 | 0.1046 | 2.0% |
| 6200 | 70.4 | 0.6912 | 0.3087 | 0.3510 | 0.4049 | 0.1192 | 0.1046 | 2.0% |
| 6200 | 93.0 | 0.7008 | 0.2991 | 0.3514 | 0.4056 | 0.1192 | 0.1046 | 2.0% |
| 6200 | 89.8 | 0.7086 | 0.2914 | 0.3493 | 0.4017 | 0.1192 | 0.1046 | 2.0% |
| 6200 | 80.0 | 0.7138 | 0.2862 | 0.3478 | 0.3989 | 0.1192 | 0.1046 | 2.1% |
| 6200 | 67.8 | 0.7188 | 0.2812 | 0.3475 | 0.3983 | 0.1192 | 0.1046 | 2.1% |
| 6200 | 21.9 | 0.6669 | 0.3329 | 0.3321 | 0.3695 | 0.1082 | 0.1444 | 2.7% |
| 6200 | 51.5 | 0.6814 | 0.3184 | 0.3329 | 0.3710 | 0.1082 | 0.1444 | 2.7% |
| 6200 | 75.1 | 0.6912 | 0.3087 | 0.3337 | 0.3723 | 0.1082 | 0.1444 | 2.6% |

TABLE 2-continued

| | | | | | | | | |
|---|---|---|---|---|---|---|---|---|
| 6200 | 96.4 | 0.7008 | 0.2991 | 0.3337 | 0.3724 | 0.1082 | 0.1444 | 2.6% |
| 6200 | 86.2 | 0.7086 | 0.2914 | 0.3323 | 0.3698 | 0.1082 | 0.1444 | 2.7% |
| 6200 | 75.9 | 0.7138 | 0.2862 | 0.3316 | 0.3685 | 0.1082 | 0.1444 | 2.7% |
| 6200 | 63.3 | 0.7188 | 0.2812 | 0.3315 | 0.3684 | 0.1082 | 0.1444 | 2.7% |
| 6200 | 25.6 | 0.6669 | 0.3329 | 0.3198 | 0.3463 | 0.0934 | 0.2133 | 3.3% |
| 6200 | 57.5 | 0.6814 | 0.3184 | 0.3206 | 0.3479 | 0.0934 | 0.2133 | 3.2% |
| 6200 | 81.6 | 0.6912 | 0.3087 | 0.3210 | 0.3486 | 0.0934 | 0.2133 | 3.2% |
| 6200 | 94.6 | 0.7008 | 0.2991 | 0.3209 | 0.3485 | 0.0934 | 0.2133 | 3.2% |
| 6200 | 81.4 | 0.7086 | 0.2914 | 0.3204 | 0.3474 | 0.0934 | 0.2133 | 3.2% |
| 6200 | 69.0 | 0.7138 | 0.2862 | 0.3203 | 0.3474 | 0.0934 | 0.2133 | 3.2% |
| 6200 | 55.6 | 0.7188 | 0.2812 | 0.3204 | 0.3475 | 0.0934 | 0.2133 | 3.2% |
| 6200 | 31.0 | 0.6669 | 0.3329 | 0.3113 | 0.3305 | 0.0792 | 0.3084 | 3.7% |
| 6200 | 64.0 | 0.6814 | 0.3184 | 0.3121 | 0.3319 | 0.0792 | 0.3084 | 3.7% |
| 6200 | 88.5 | 0.6912 | 0.3087 | 0.3125 | 0.3327 | 0.0792 | 0.3084 | 3.7% |
| 6200 | 91.7 | 0.7008 | 0.2991 | 0.3127 | 0.3331 | 0.0792 | 0.3084 | 3.6% |
| 6200 | 73.3 | 0.7086 | 0.2914 | 0.3129 | 0.3335 | 0.0792 | 0.3084 | 3.6% |
| 6200 | 59.3 | 0.7138 | 0.2862 | 0.3131 | 0.3337 | 0.0792 | 0.3084 | 3.6% |
| 6200 | 46.2 | 0.7188 | 0.2812 | 0.3132 | 0.3340 | 0.0792 | 0.3084 | 3.6% |
| 6200 | 35.8 | 0.6669 | 0.3329 | 0.3055 | 0.3195 | 0.0709 | 0.4039 | 4.0% |
| 6200 | 69.7 | 0.6814 | 0.3184 | 0.3065 | 0.3215 | 0.0709 | 0.4039 | 4.0% |
| 6200 | 93.8 | 0.6912 | 0.3087 | 0.3072 | 0.3227 | 0.0709 | 0.4039 | 3.9% |
| 6200 | 84.9 | 0.7008 | 0.2991 | 0.3079 | 0.3240 | 0.0709 | 0.4039 | 3.9% |
| 6200 | 67.4 | 0.7086 | 0.2914 | 0.3083 | 0.3248 | 0.0709 | 0.4039 | 3.9% |
| 6200 | 56.7 | 0.7138 | 0.2862 | 0.3086 | 0.3254 | 0.0709 | 0.4039 | 3.9% |
| 6200 | 46.8 | 0.7188 | 0.2812 | 0.3089 | 0.3259 | 0.0709 | 0.4039 | 3.9% |
| 6200 | 40.3 | 0.6669 | 0.3329 | 0.2995 | 0.3082 | 0.0694 | 0.5232 | 4.4% |
| 6200 | 74.5 | 0.6814 | 0.3184 | 0.3012 | 0.3114 | 0.0694 | 0.5232 | 4.3% |
| 6200 | 96.4 | 0.6912 | 0.3087 | 0.3023 | 0.3136 | 0.0694 | 0.5232 | 4.2% |
| 6200 | 81.5 | 0.7008 | 0.2991 | 0.3035 | 0.3159 | 0.0694 | 0.5232 | 4.2% |
| 6200 | 64.7 | 0.7086 | 0.2914 | 0.3043 | 0.3173 | 0.0694 | 0.5232 | 4.1% |
| 6200 | 55.1 | 0.7138 | 0.2862 | 0.3049 | 0.3183 | 0.0694 | 0.5232 | 4.1% |
| 6200 | 46.2 | 0.7188 | 0.2812 | 0.3054 | 0.3193 | 0.0694 | 0.5232 | 4.1% |
| 6200 | 44.1 | 0.6669 | 0.3329 | 0.2941 | 0.2982 | 0.0799 | 0.6269 | 4.8% |
| 6200 | 81.8 | 0.6814 | 0.3184 | 0.2961 | 0.3019 | 0.0799 | 0.6269 | 4.6% |
| 6200 | 97.2 | 0.6912 | 0.3087 | 0.2988 | 0.3071 | 0.0799 | 0.6269 | 4.5% |
| 6200 | 82.4 | 0.7008 | 0.2991 | 0.3006 | 0.3104 | 0.0799 | 0.6269 | 4.3% |
| 6200 | 67.6 | 0.7086 | 0.2914 | 0.3018 | 0.3126 | 0.0799 | 0.6269 | 4.3% |
| 6200 | 56.9 | 0.7138 | 0.2862 | 0.3024 | 0.3137 | 0.0799 | 0.6269 | 4.2% |
| 6200 | 46.8 | 0.7188 | 0.2812 | 0.3030 | 0.3148 | 0.0799 | 0.6269 | 4.2% |
| 6200 | 47.2 | 0.6669 | 0.3329 | 0.2895 | 0.2896 | 0.0975 | 0.6902 | 5.1% |
| 6200 | 84.1 | 0.6814 | 0.3184 | 0.2927 | 0.2956 | 0.0975 | 0.6902 | 4.9% |
| 6200 | 97.5 | 0.6912 | 0.3087 | 0.2965 | 0.3026 | 0.0975 | 0.6902 | 4.6% |
| 6200 | 83.6 | 0.7008 | 0.2991 | 0.2988 | 0.3070 | 0.0975 | 0.6902 | 4.5% |
| 6200 | 67.4 | 0.7086 | 0.2914 | 0.3000 | 0.3092 | 0.0975 | 0.6902 | 4.4% |
| 6200 | 56.7 | 0.7138 | 0.2862 | 0.3007 | 0.3105 | 0.0975 | 0.6902 | 4.3% |
| 6200 | 47.2 | 0.7188 | 0.2812 | 0.3014 | 0.3119 | 0.0975 | 0.6902 | 4.3% |
| 6200 | 50.5 | 0.6669 | 0.3329 | 0.2835 | 0.2782 | 0.1270 | 0.7352 | 5.6% |
| 6200 | 83.9 | 0.6814 | 0.3184 | 0.2893 | 0.2892 | 0.1270 | 0.7352 | 5.1% |
| 6200 | 97.2 | 0.6912 | 0.3087 | 0.2941 | 0.2982 | 0.1270 | 0.7352 | 4.8% |
| 6200 | 82.9 | 0.7008 | 0.2991 | 0.2965 | 0.3028 | 0.1270 | 0.7352 | 4.6% |
| 6200 | 67.0 | 0.7086 | 0.2914 | 0.2980 | 0.3055 | 0.1270 | 0.7352 | 4.5% |
| 6200 | 57.5 | 0.7138 | 0.2862 | 0.2990 | 0.3073 | 0.1270 | 0.7352 | 4.4% |
| 6200 | 50.7 | 0.7188 | 0.2812 | 0.3001 | 0.3093 | 0.1270 | 0.7352 | 4.4% |
| 6200 | 52.1 | 0.6669 | 0.3329 | 0.2775 | 0.2670 | 0.1561 | 0.7502 | 6.1% |
| 6200 | 83.7 | 0.6814 | 0.3184 | 0.2862 | 0.2833 | 0.1561 | 0.7502 | 5.4% |
| 6200 | 97.1 | 0.6912 | 0.3087 | 0.2919 | 0.2940 | 0.1561 | 0.7502 | 4.9% |
| 6200 | 82.2 | 0.7008 | 0.2991 | 0.2945 | 0.2990 | 0.1561 | 0.7502 | 4.7% |
| 6200 | 68.0 | 0.7086 | 0.2914 | 0.2965 | 0.3026 | 0.1561 | 0.7502 | 4.6% |
| 6200 | 61.7 | 0.7138 | 0.2862 | 0.2980 | 0.3054 | 0.1561 | 0.7502 | 4.5% |
| 6200 | 59.8 | 0.7188 | 0.2812 | 0.2997 | 0.3086 | 0.1561 | 0.7502 | 4.4% |
| 6200 | 53.5 | 0.6669 | 0.3329 | 0.2673 | 0.2479 | 0.1938 | 0.7479 | 7.0% |
| 6200 | 80.8 | 0.6814 | 0.3184 | 0.2823 | 0.2760 | 0.1938 | 0.7479 | 5.7% |
| 6200 | 98.2 | 0.6912 | 0.3087 | 0.2881 | 0.2869 | 0.1938 | 0.7479 | 5.2% |
| 6200 | 83.1 | 0.7008 | 0.2991 | 0.2919 | 0.2941 | 0.1938 | 0.7479 | 4.9% |
| 6200 | 75.4 | 0.7086 | 0.2914 | 0.2953 | 0.3005 | 0.1938 | 0.7479 | 4.7% |
| 6200 | 74.2 | 0.7138 | 0.2862 | 0.2977 | 0.3049 | 0.1938 | 0.7479 | 4.5% |
| 6200 | 75.2 | 0.7188 | 0.2812 | 0.2998 | 0.3089 | 0.1938 | 0.7479 | 4.4% |
| 6200 | 48.9 | 0.6669 | 0.3329 | 0.2549 | 0.2246 | 0.2329 | 0.7309 | 8.5% |
| 6200 | 80.4 | 0.6814 | 0.3184 | 0.2749 | 0.2621 | 0.2329 | 0.7309 | 6.3% |
| 6200 | 98.6 | 0.6912 | 0.3087 | 0.2828 | 0.2769 | 0.2329 | 0.7309 | 5.6% |
| 6200 | 91.0 | 0.7008 | 0.2991 | 0.2900 | 0.2905 | 0.2329 | 0.7309 | 5.1% |
| 6200 | 88.6 | 0.7086 | 0.2914 | 0.2949 | 0.2997 | 0.2329 | 0.7309 | 4.7% |
| 6200 | 88.4 | 0.7138 | 0.2862 | 0.2976 | 0.3048 | 0.2329 | 0.7309 | 4.5% |
| 6200 | 89.1 | 0.7188 | 0.2812 | 0.2999 | 0.3091 | 0.2329 | 0.7309 | 4.4% |
| 6100 | 0.1 | 0.6669 | 0.3329 | 0.4095 | 0.5146 | 0.1393 | 0.0514 | 0.4% |
| 6100 | 20.6 | 0.6814 | 0.3184 | 0.4095 | 0.5146 | 0.1393 | 0.0514 | 0.4% |
| 6100 | 36.8 | 0.6912 | 0.3087 | 0.4095 | 0.5146 | 0.1393 | 0.0514 | 0.4% |
| 6100 | 54.0 | 0.7008 | 0.2991 | 0.4095 | 0.5146 | 0.1393 | 0.0514 | 0.4% |
| 6100 | 68.5 | 0.7086 | 0.2914 | 0.4095 | 0.5146 | 0.1393 | 0.0514 | 0.4% |
| 6100 | 78.7 | 0.7138 | 0.2862 | 0.4095 | 0.5146 | 0.1393 | 0.0514 | 0.4% |

TABLE 2-continued

| | | | | | | | | |
|---|---|---|---|---|---|---|---|---|
| 6100 | 88.7 | 0.7188 | 0.2812 | 0.4095 | 0.5146 | 0.1393 | 0.0514 | 0.4% |
| 6100 | 18.4 | 0.6669 | 0.3329 | 0.3995 | 0.4957 | 0.1303 | 0.0723 | 0.6% |
| 6100 | 45.6 | 0.6814 | 0.3184 | 0.3981 | 0.4932 | 0.1303 | 0.0723 | 0.6% |
| 6100 | 67.3 | 0.6912 | 0.3087 | 0.3985 | 0.4940 | 0.1303 | 0.0723 | 0.6% |
| 6100 | 89.8 | 0.7008 | 0.2991 | 0.3990 | 0.4948 | 0.1303 | 0.0723 | 0.6% |
| 6100 | 92.2 | 0.7086 | 0.2914 | 0.3946 | 0.4866 | 0.1303 | 0.0723 | 0.7% |
| 6100 | 81.4 | 0.7138 | 0.2862 | 0.3918 | 0.4814 | 0.1303 | 0.0723 | 0.8% |
| 6100 | 69.2 | 0.7188 | 0.2812 | 0.3909 | 0.4796 | 0.1303 | 0.0723 | 0.8% |
| 6100 | 19.8 | 0.6669 | 0.3329 | 0.3510 | 0.4049 | 0.1192 | 0.1046 | 2.0% |
| 6100 | 48.1 | 0.6814 | 0.3184 | 0.3512 | 0.4052 | 0.1192 | 0.1046 | 2.0% |
| 6100 | 71.1 | 0.6912 | 0.3087 | 0.3521 | 0.4070 | 0.1192 | 0.1046 | 1.9% |
| 6100 | 93.9 | 0.7008 | 0.2991 | 0.3524 | 0.4074 | 0.1192 | 0.1046 | 1.9% |
| 6100 | 89.0 | 0.7086 | 0.2914 | 0.3500 | 0.4030 | 0.1192 | 0.1046 | 2.0% |
| 6100 | 78.2 | 0.7138 | 0.2862 | 0.3488 | 0.4007 | 0.1192 | 0.1046 | 2.0% |
| 6100 | 65.6 | 0.7188 | 0.2812 | 0.3485 | 0.4002 | 0.1192 | 0.1046 | 2.1% |
| 6100 | 21.7 | 0.6669 | 0.3329 | 0.3333 | 0.3716 | 0.1082 | 0.1444 | 2.7% |
| 6100 | 51.8 | 0.6814 | 0.3184 | 0.3340 | 0.3731 | 0.1082 | 0.1444 | 2.6% |
| 6100 | 75.8 | 0.6912 | 0.3087 | 0.3347 | 0.3744 | 0.1082 | 0.1444 | 2.6% |
| 6100 | 96.6 | 0.7008 | 0.2991 | 0.3347 | 0.3743 | 0.1082 | 0.1444 | 2.6% |
| 6100 | 85.5 | 0.7086 | 0.2914 | 0.3332 | 0.3714 | 0.1082 | 0.1444 | 2.7% |
| 6100 | 74.1 | 0.7138 | 0.2862 | 0.3327 | 0.3705 | 0.1082 | 0.1444 | 2.7% |
| 6100 | 61.2 | 0.7188 | 0.2812 | 0.3326 | 0.3704 | 0.1082 | 0.1444 | 2.7% |
| 6100 | 25.3 | 0.6669 | 0.3329 | 0.3209 | 0.3484 | 0.0934 | 0.2133 | 3.2% |
| 6100 | 57.7 | 0.6814 | 0.3184 | 0.3217 | 0.3499 | 0.0934 | 0.2133 | 3.2% |
| 6100 | 82.1 | 0.6912 | 0.3087 | 0.3221 | 0.3507 | 0.0934 | 0.2133 | 3.2% |
| 6100 | 94.3 | 0.7008 | 0.2991 | 0.3220 | 0.3504 | 0.0934 | 0.2133 | 3.2% |
| 6100 | 80.4 | 0.7086 | 0.2914 | 0.3214 | 0.3494 | 0.0934 | 0.2133 | 3.2% |
| 6100 | 67.3 | 0.7138 | 0.2862 | 0.3214 | 0.3494 | 0.0934 | 0.2133 | 3.2% |
| 6100 | 53.6 | 0.7188 | 0.2812 | 0.3215 | 0.3496 | 0.0934 | 0.2133 | 3.2% |
| 6100 | 30.5 | 0.6669 | 0.3329 | 0.3124 | 0.3325 | 0.0792 | 0.3084 | 3.7% |
| 6100 | 64.0 | 0.6814 | 0.3184 | 0.3132 | 0.3339 | 0.0792 | 0.3084 | 3.6% |
| 6100 | 88.9 | 0.6912 | 0.3087 | 0.3136 | 0.3348 | 0.0792 | 0.3084 | 3.6% |
| 6100 | 91.3 | 0.7008 | 0.2991 | 0.3138 | 0.3351 | 0.0792 | 0.3084 | 3.6% |
| 6100 | 72.0 | 0.7086 | 0.2914 | 0.3140 | 0.3355 | 0.0792 | 0.3084 | 3.6% |
| 6100 | 57.9 | 0.7138 | 0.2862 | 0.3142 | 0.3358 | 0.0792 | 0.3084 | 3.6% |
| 6100 | 44.8 | 0.7188 | 0.2812 | 0.3143 | 0.3360 | 0.0792 | 0.3084 | 3.6% |
| 6100 | 35.3 | 0.6669 | 0.3329 | 0.3066 | 0.3216 | 0.0709 | 0.4039 | 4.0% |
| 6100 | 69.7 | 0.6814 | 0.3184 | 0.3076 | 0.3235 | 0.0709 | 0.4039 | 3.9% |
| 6100 | 94.0 | 0.6912 | 0.3087 | 0.3083 | 0.3248 | 0.0709 | 0.4039 | 3.9% |
| 6100 | 84.4 | 0.7008 | 0.2991 | 0.3090 | 0.3261 | 0.0709 | 0.4039 | 3.8% |
| 6100 | 67.0 | 0.7086 | 0.2914 | 0.3094 | 0.3269 | 0.0709 | 0.4039 | 3.8% |
| 6100 | 56.1 | 0.7138 | 0.2862 | 0.3097 | 0.3275 | 0.0709 | 0.4039 | 3.8% |
| 6100 | 46.0 | 0.7188 | 0.2812 | 0.3100 | 0.3280 | 0.0709 | 0.4039 | 3.8% |
| 6100 | 39.7 | 0.6669 | 0.3329 | 0.3006 | 0.3103 | 0.0694 | 0.5232 | 4.3% |
| 6100 | 74.3 | 0.6814 | 0.3184 | 0.3023 | 0.3136 | 0.0694 | 0.5232 | 4.2% |
| 6100 | 96.3 | 0.6912 | 0.3087 | 0.3035 | 0.3158 | 0.0694 | 0.5232 | 4.2% |
| 6100 | 81.3 | 0.7008 | 0.2991 | 0.3047 | 0.3180 | 0.0694 | 0.5232 | 4.1% |
| 6100 | 64.4 | 0.7086 | 0.2914 | 0.3055 | 0.3195 | 0.0694 | 0.5232 | 4.0% |
| 6100 | 54.8 | 0.7138 | 0.2862 | 0.3060 | 0.3205 | 0.0694 | 0.5232 | 4.0% |
| 6100 | 45.7 | 0.7188 | 0.2812 | 0.3065 | 0.3215 | 0.0694 | 0.5232 | 4.0% |
| 6100 | 43.5 | 0.6669 | 0.3329 | 0.2952 | 0.3003 | 0.0799 | 0.6269 | 4.7% |
| 6100 | 81.4 | 0.6814 | 0.3184 | 0.2973 | 0.3041 | 0.0799 | 0.6269 | 4.6% |
| 6100 | 97.1 | 0.6912 | 0.3087 | 0.3000 | 0.3093 | 0.0799 | 0.6269 | 4.4% |
| 6100 | 82.4 | 0.7008 | 0.2991 | 0.3018 | 0.3127 | 0.0799 | 0.6269 | 4.3% |
| 6100 | 67.4 | 0.7086 | 0.2914 | 0.3030 | 0.3148 | 0.0799 | 0.6269 | 4.2% |
| 6100 | 56.6 | 0.7138 | 0.2862 | 0.3036 | 0.3160 | 0.0799 | 0.6269 | 4.2% |
| 6100 | 46.4 | 0.7188 | 0.2812 | 0.3042 | 0.3170 | 0.0799 | 0.6269 | 4.1% |
| 6100 | 46.5 | 0.6669 | 0.3329 | 0.2907 | 0.2918 | 0.0975 | 0.6902 | 5.0% |
| 6100 | 83.8 | 0.6814 | 0.3184 | 0.2939 | 0.2978 | 0.0975 | 0.6902 | 4.8% |
| 6100 | 97.5 | 0.6912 | 0.3087 | 0.2977 | 0.3049 | 0.0975 | 0.6902 | 4.5% |
| 6100 | 83.6 | 0.7008 | 0.2991 | 0.3000 | 0.3093 | 0.0975 | 0.6902 | 4.4% |
| 6100 | 67.2 | 0.7086 | 0.2914 | 0.3012 | 0.3115 | 0.0975 | 0.6902 | 4.3% |
| 6100 | 56.5 | 0.7138 | 0.2862 | 0.3019 | 0.3129 | 0.0975 | 0.6902 | 4.3% |
| 6100 | 46.9 | 0.7188 | 0.2812 | 0.3026 | 0.3142 | 0.0975 | 0.6902 | 4.2% |
| 6100 | 49.7 | 0.6669 | 0.3329 | 0.2847 | 0.2805 | 0.1270 | 0.7352 | 5.5% |
| 6100 | 83.5 | 0.6814 | 0.3184 | 0.2905 | 0.2915 | 0.1270 | 0.7352 | 5.0% |
| 6100 | 97.1 | 0.6912 | 0.3087 | 0.2954 | 0.3005 | 0.1270 | 0.7352 | 4.7% |
| 6100 | 83.0 | 0.7008 | 0.2991 | 0.2978 | 0.3051 | 0.1270 | 0.7352 | 4.5% |
| 6100 | 66.9 | 0.7086 | 0.2914 | 0.2993 | 0.3079 | 0.1270 | 0.7352 | 4.4% |
| 6100 | 57.4 | 0.7138 | 0.2862 | 0.3003 | 0.3097 | 0.1270 | 0.7352 | 4.4% |
| 6100 | 50.5 | 0.7188 | 0.2812 | 0.3013 | 0.3117 | 0.1270 | 0.7352 | 4.3% |
| 6100 | 51.4 | 0.6669 | 0.3329 | 0.2787 | 0.2694 | 0.1561 | 0.7502 | 6.0% |
| 6100 | 83.4 | 0.6814 | 0.3184 | 0.2874 | 0.2856 | 0.1561 | 0.7502 | 5.3% |
| 6100 | 97.0 | 0.6912 | 0.3087 | 0.2932 | 0.2964 | 0.1561 | 0.7502 | 4.8% |
| 6100 | 82.3 | 0.7008 | 0.2991 | 0.2958 | 0.3014 | 0.1561 | 0.7502 | 4.7% |
| 6100 | 68.1 | 0.7086 | 0.2914 | 0.2978 | 0.3051 | 0.1561 | 0.7502 | 4.5% |
| 6100 | 61.6 | 0.7138 | 0.2862 | 0.2993 | 0.3079 | 0.1561 | 0.7502 | 4.4% |
| 6100 | 59.7 | 0.7188 | 0.2812 | 0.3010 | 0.3111 | 0.1561 | 0.7502 | 4.3% |
| 6100 | 52.7 | 0.6669 | 0.3329 | 0.2687 | 0.2505 | 0.1938 | 0.7479 | 6.9% |
| 6100 | 80.5 | 0.6814 | 0.3184 | 0.2836 | 0.2784 | 0.1938 | 0.7479 | 5.6% |

TABLE 2-continued

| | | | | | | | |
|---|---|---|---|---|---|---|---|
| 6100 | 98.0 | 0.6912 | 0.3087 | 0.2894 | 0.2894 | 0.1938 | 0.7479 | 5.1% |
| 6100 | 83.3 | 0.7008 | 0.2991 | 0.2933 | 0.2967 | 0.1938 | 0.7479 | 4.8% |
| 6100 | 75.4 | 0.7086 | 0.2914 | 0.2967 | 0.3031 | 0.1938 | 0.7479 | 4.6% |
| 6100 | 74.2 | 0.7138 | 0.2862 | 0.2991 | 0.3075 | 0.1938 | 0.7479 | 4.4% |
| 6100 | 75.1 | 0.7188 | 0.2812 | 0.3012 | 0.3115 | 0.1938 | 0.7479 | 4.3% |
| 6100 | 48.9 | 0.6669 | 0.3329 | 0.2555 | 0.2258 | 0.2329 | 0.7309 | 8.4% |
| 6100 | 79.9 | 0.6814 | 0.3184 | 0.2763 | 0.2649 | 0.2329 | 0.7309 | 6.2% |
| 6100 | 98.4 | 0.6912 | 0.3087 | 0.2842 | 0.2797 | 0.2329 | 0.7309 | 5.5% |
| 6100 | 91.2 | 0.7008 | 0.2991 | 0.2915 | 0.2933 | 0.2329 | 0.7309 | 5.0% |
| 6100 | 88.7 | 0.7086 | 0.2914 | 0.2964 | 0.3024 | 0.2329 | 0.7309 | 4.6% |
| 6100 | 88.5 | 0.7138 | 0.2862 | 0.2991 | 0.3075 | 0.2329 | 0.7309 | 4.4% |
| 6100 | 89.1 | 0.7188 | 0.2812 | 0.3014 | 0.3118 | 0.2329 | 0.7309 | 4.3% |
| 6000 | −0.1 | 0.6669 | 0.3329 | 0.4095 | 0.5146 | 0.1393 | 0.0514 | 0.4% |
| 6000 | 21.3 | 0.6814 | 0.3184 | 0.4095 | 0.5146 | 0.1393 | 0.0514 | 0.4% |
| 6000 | 38.0 | 0.6912 | 0.3087 | 0.4095 | 0.5146 | 0.1393 | 0.0514 | 0.4% |
| 6000 | 55.7 | 0.7008 | 0.2991 | 0.4095 | 0.5146 | 0.1393 | 0.0514 | 0.4% |
| 6000 | 70.8 | 0.7086 | 0.2914 | 0.4095 | 0.5146 | 0.1393 | 0.0514 | 0.4% |
| 6000 | 81.3 | 0.7138 | 0.2862 | 0.4095 | 0.5146 | 0.1393 | 0.0514 | 0.4% |
| 6000 | 91.6 | 0.7188 | 0.2812 | 0.4095 | 0.5146 | 0.1393 | 0.0514 | 0.4% |
| 6000 | 18.2 | 0.6669 | 0.3329 | 0.4008 | 0.4983 | 0.1303 | 0.0723 | 0.6% |
| 6000 | 46.0 | 0.6814 | 0.3184 | 0.3993 | 0.4955 | 0.1303 | 0.0723 | 0.6% |
| 6000 | 68.1 | 0.6912 | 0.3087 | 0.3997 | 0.4961 | 0.1303 | 0.0723 | 0.6% |
| 6000 | 91.0 | 0.7008 | 0.2991 | 0.3998 | 0.4963 | 0.1303 | 0.0723 | 0.6% |
| 6000 | 91.0 | 0.7086 | 0.2914 | 0.3949 | 0.4871 | 0.1303 | 0.0723 | 0.7% |
| 6000 | 79.5 | 0.7138 | 0.2862 | 0.3926 | 0.4829 | 0.1303 | 0.0723 | 0.8% |
| 6000 | 66.9 | 0.7188 | 0.2812 | 0.3918 | 0.4813 | 0.1303 | 0.0723 | 0.8% |
| 6000 | 19.6 | 0.6669 | 0.3329 | 0.3522 | 0.4071 | 0.1192 | 0.1046 | 1.9% |
| 6000 | 48.4 | 0.6814 | 0.3184 | 0.3523 | 0.4073 | 0.1192 | 0.1046 | 1.9% |
| 6000 | 71.9 | 0.6912 | 0.3087 | 0.3533 | 0.4091 | 0.1192 | 0.1046 | 1.9% |
| 6000 | 94.7 | 0.7008 | 0.2991 | 0.3534 | 0.4093 | 0.1192 | 0.1046 | 1.9% |
| 6000 | 88.0 | 0.7086 | 0.2914 | 0.3507 | 0.4043 | 0.1192 | 0.1046 | 2.0% |
| 6000 | 76.3 | 0.7138 | 0.2862 | 0.3498 | 0.4026 | 0.1192 | 0.1046 | 2.0% |
| 6000 | 63.4 | 0.7188 | 0.2812 | 0.3496 | 0.4022 | 0.1192 | 0.1046 | 2.0% |
| 6000 | 21.4 | 0.6669 | 0.3329 | 0.3344 | 0.3737 | 0.1082 | 0.1444 | 2.6% |
| 6000 | 52.0 | 0.6814 | 0.3184 | 0.3352 | 0.3752 | 0.1082 | 0.1444 | 2.6% |
| 6000 | 76.4 | 0.6912 | 0.3087 | 0.3359 | 0.3765 | 0.1082 | 0.1444 | 2.5% |
| 6000 | 96.6 | 0.7008 | 0.2991 | 0.3357 | 0.3762 | 0.1082 | 0.1444 | 2.6% |
| 6000 | 84.6 | 0.7086 | 0.2914 | 0.3341 | 0.3731 | 0.1082 | 0.1444 | 2.6% |
| 6000 | 72.3 | 0.7138 | 0.2862 | 0.3337 | 0.3725 | 0.1082 | 0.1444 | 2.6% |
| 6000 | 59.0 | 0.7188 | 0.2812 | 0.3337 | 0.3724 | 0.1082 | 0.1444 | 2.6% |
| 6000 | 24.9 | 0.6669 | 0.3329 | 0.3220 | 0.3505 | 0.0934 | 0.2133 | 3.2% |
| 6000 | 57.8 | 0.6814 | 0.3184 | 0.3228 | 0.3520 | 0.0934 | 0.2133 | 3.1% |
| 6000 | 82.6 | 0.6912 | 0.3087 | 0.3232 | 0.3528 | 0.0934 | 0.2133 | 3.1% |
| 6000 | 94.0 | 0.7008 | 0.2991 | 0.3230 | 0.3523 | 0.0934 | 0.2133 | 3.1% |
| 6000 | 79.2 | 0.7086 | 0.2914 | 0.3225 | 0.3514 | 0.0934 | 0.2133 | 3.1% |
| 6000 | 65.6 | 0.7138 | 0.2862 | 0.3225 | 0.3515 | 0.0934 | 0.2133 | 3.1% |
| 6000 | 51.6 | 0.7188 | 0.2812 | 0.3226 | 0.3516 | 0.0934 | 0.2133 | 3.1% |
| 6000 | 30.1 | 0.6669 | 0.3329 | 0.3135 | 0.3346 | 0.0792 | 0.3084 | 3.6% |
| 6000 | 64.0 | 0.6814 | 0.3184 | 0.3143 | 0.3361 | 0.0792 | 0.3084 | 3.6% |
| 6000 | 89.2 | 0.6912 | 0.3087 | 0.3147 | 0.3369 | 0.0792 | 0.3084 | 3.5% |
| 6000 | 90.8 | 0.7008 | 0.2991 | 0.3149 | 0.3372 | 0.0792 | 0.3084 | 3.5% |
| 6000 | 70.7 | 0.7086 | 0.2914 | 0.3151 | 0.3376 | 0.0792 | 0.3084 | 3.5% |
| 6000 | 56.4 | 0.7138 | 0.2862 | 0.3153 | 0.3379 | 0.0792 | 0.3084 | 3.5% |
| 6000 | 43.3 | 0.7188 | 0.2812 | 0.3154 | 0.3381 | 0.0792 | 0.3084 | 3.5% |
| 6000 | 34.8 | 0.6669 | 0.3329 | 0.3077 | 0.3237 | 0.0709 | 0.4039 | 3.9% |
| 6000 | 69.7 | 0.6814 | 0.3184 | 0.3088 | 0.3257 | 0.0709 | 0.4039 | 3.9% |
| 6000 | 94.3 | 0.6912 | 0.3087 | 0.3094 | 0.3269 | 0.0709 | 0.4039 | 3.8% |
| 6000 | 83.9 | 0.7008 | 0.2991 | 0.3101 | 0.3282 | 0.0709 | 0.4039 | 3.8% |
| 6000 | 66.5 | 0.7086 | 0.2914 | 0.3106 | 0.3291 | 0.0709 | 0.4039 | 3.8% |
| 6000 | 55.5 | 0.7138 | 0.2862 | 0.3109 | 0.3296 | 0.0709 | 0.4039 | 3.7% |
| 6000 | 45.2 | 0.7188 | 0.2812 | 0.3111 | 0.3301 | 0.0709 | 0.4039 | 3.7% |
| 6000 | 39.0 | 0.6669 | 0.3329 | 0.3018 | 0.3125 | 0.0694 | 0.5232 | 4.3% |
| 6000 | 74.0 | 0.6814 | 0.3184 | 0.3035 | 0.3158 | 0.0694 | 0.5232 | 4.2% |
| 6000 | 96.2 | 0.6912 | 0.3087 | 0.3047 | 0.3181 | 0.0694 | 0.5232 | 4.1% |
| 6000 | 81.0 | 0.7008 | 0.2991 | 0.3059 | 0.3203 | 0.0694 | 0.5232 | 4.0% |
| 6000 | 64.3 | 0.7086 | 0.2914 | 0.3067 | 0.3218 | 0.0694 | 0.5232 | 4.0% |
| 6000 | 54.5 | 0.7138 | 0.2862 | 0.3072 | 0.3228 | 0.0694 | 0.5232 | 3.9% |
| 6000 | 45.2 | 0.7188 | 0.2812 | 0.3077 | 0.3237 | 0.0694 | 0.5232 | 3.9% |
| 6000 | 42.8 | 0.6669 | 0.3329 | 0.2964 | 0.3025 | 0.0799 | 0.6269 | 4.6% |
| 6000 | 81.0 | 0.6814 | 0.3184 | 0.2985 | 0.3064 | 0.0799 | 0.6269 | 4.5% |
| 6000 | 97.1 | 0.6912 | 0.3087 | 0.3013 | 0.3116 | 0.0799 | 0.6269 | 4.3% |
| 6000 | 82.4 | 0.7008 | 0.2991 | 0.3031 | 0.3150 | 0.0799 | 0.6269 | 4.2% |
| 6000 | 67.2 | 0.7086 | 0.2914 | 0.3042 | 0.3171 | 0.0799 | 0.6269 | 4.1% |
| 6000 | 56.3 | 0.7138 | 0.2862 | 0.3048 | 0.3183 | 0.0799 | 0.6269 | 4.1% |
| 6000 | 46.0 | 0.7188 | 0.2812 | 0.3054 | 0.3194 | 0.0799 | 0.6269 | 4.1% |
| 6000 | 45.8 | 0.6669 | 0.3329 | 0.2919 | 0.2941 | 0.0975 | 0.6902 | 4.9% |
| 6000 | 83.4 | 0.6814 | 0.3184 | 0.2951 | 0.3001 | 0.0975 | 0.6902 | 4.7% |
| 6000 | 97.5 | 0.6912 | 0.3087 | 0.2989 | 0.3072 | 0.0975 | 0.6902 | 4.5% |
| 6000 | 83.6 | 0.7008 | 0.2991 | 0.3013 | 0.3117 | 0.0975 | 0.6902 | 4.3% |
| 6000 | 67.1 | 0.7086 | 0.2914 | 0.3025 | 0.3139 | 0.0975 | 0.6902 | 4.2% |

TABLE 2-continued

| | | | | | | | | |
|---|---|---|---|---|---|---|---|---|
| 6000 | 56.2 | 0.7138 | 0.2862 | 0.3032 | 0.3153 | 0.0975 | 0.6902 | 4.2% |
| 6000 | 46.6 | 0.7188 | 0.2812 | 0.3039 | 0.3166 | 0.0975 | 0.6902 | 4.1% |
| 6000 | 48.9 | 0.6669 | 0.3329 | 0.2860 | 0.2829 | 0.1270 | 0.7352 | 5.4% |
| 6000 | 83.2 | 0.6814 | 0.3184 | 0.2918 | 0.2938 | 0.1270 | 0.7352 | 4.9% |
| 6000 | 96.9 | 0.6912 | 0.3087 | 0.2966 | 0.3029 | 0.1270 | 0.7352 | 4.6% |
| 6000 | 83.0 | 0.7008 | 0.2991 | 0.2991 | 0.3076 | 0.1270 | 0.7352 | 4.4% |
| 6000 | 66.9 | 0.7086 | 0.2914 | 0.3006 | 0.3103 | 0.1270 | 0.7352 | 4.3% |
| 6000 | 57.3 | 0.7138 | 0.2862 | 0.3016 | 0.3122 | 0.1270 | 0.7352 | 4.3% |
| 6000 | 50.3 | 0.7188 | 0.2812 | 0.3027 | 0.3142 | 0.1270 | 0.7352 | 4.2% |
| 6000 | 50.6 | 0.6669 | 0.3329 | 0.2801 | 0.2718 | 0.1561 | 0.7502 | 5.8% |
| 6000 | 83.0 | 0.6814 | 0.3184 | 0.2887 | 0.2880 | 0.1561 | 0.7502 | 5.2% |
| 6000 | 96.7 | 0.6912 | 0.3087 | 0.2945 | 0.2989 | 0.1561 | 0.7502 | 4.7% |
| 6000 | 82.5 | 0.7008 | 0.2991 | 0.2972 | 0.3040 | 0.1561 | 0.7502 | 4.6% |
| 6000 | 68.1 | 0.7086 | 0.2914 | 0.2992 | 0.3077 | 0.1561 | 0.7502 | 4.4% |
| 6000 | 61.6 | 0.7138 | 0.2862 | 0.3007 | 0.3105 | 0.1561 | 0.7502 | 4.3% |
| 6000 | 59.5 | 0.7188 | 0.2812 | 0.3024 | 0.3137 | 0.1561 | 0.7502 | 4.2% |
| 6000 | 51.8 | 0.6669 | 0.3329 | 0.2701 | 0.2532 | 0.1938 | 0.7479 | 6.8% |
| 6000 | 80.2 | 0.6814 | 0.3184 | 0.2849 | 0.2809 | 0.1938 | 0.7479 | 5.4% |
| 6000 | 97.8 | 0.6912 | 0.3087 | 0.2909 | 0.2921 | 0.1938 | 0.7479 | 5.0% |
| 6000 | 83.5 | 0.7008 | 0.2991 | 0.2948 | 0.2994 | 0.1938 | 0.7479 | 4.7% |
| 6000 | 75.5 | 0.7086 | 0.2914 | 0.2981 | 0.3057 | 0.1938 | 0.7479 | 4.5% |
| 6000 | 74.1 | 0.7138 | 0.2862 | 0.3005 | 0.3102 | 0.1938 | 0.7479 | 4.4% |
| 6000 | 74.9 | 0.7188 | 0.2812 | 0.3027 | 0.3142 | 0.1938 | 0.7479 | 4.2% |
| 6000 | 48.2 | 0.6669 | 0.3329 | 0.2570 | 0.2285 | 0.2329 | 0.7309 | 8.2% |
| 6000 | 79.4 | 0.6814 | 0.3184 | 0.2779 | 0.2677 | 0.2329 | 0.7309 | 6.0% |
| 6000 | 98.2 | 0.6912 | 0.3087 | 0.2858 | 0.2826 | 0.2329 | 0.7309 | 5.4% |
| 6000 | 91.4 | 0.7008 | 0.2991 | 0.2930 | 0.2961 | 0.2329 | 0.7309 | 4.8% |
| 6000 | 88.8 | 0.7086 | 0.2914 | 0.2979 | 0.3053 | 0.2329 | 0.7309 | 4.5% |
| 6000 | 88.5 | 0.7138 | 0.2862 | 0.3006 | 0.3104 | 0.2329 | 0.7309 | 4.3% |
| 6000 | 89.1 | 0.7188 | 0.2812 | 0.3029 | 0.3147 | 0.2329 | 0.7309 | 4.2% |
| 5900 | −0.2 | 0.6669 | 0.3329 | 0.4095 | 0.5146 | 0.1393 | 0.0514 | 0.4% |
| 5900 | 21.9 | 0.6814 | 0.3184 | 0.4095 | 0.5146 | 0.1393 | 0.0514 | 0.4% |
| 5900 | 39.2 | 0.6912 | 0.3087 | 0.4095 | 0.5146 | 0.1393 | 0.0514 | 0.4% |
| 5900 | 57.6 | 0.7008 | 0.2991 | 0.4095 | 0.5146 | 0.1393 | 0.0514 | 0.4% |
| 5900 | 73.1 | 0.7086 | 0.2914 | 0.4095 | 0.5146 | 0.1393 | 0.0514 | 0.4% |
| 5900 | 83.9 | 0.7138 | 0.2862 | 0.4095 | 0.5146 | 0.1393 | 0.0514 | 0.4% |
| 5900 | 94.5 | 0.7188 | 0.2812 | 0.4095 | 0.5146 | 0.1393 | 0.0514 | 0.4% |
| 5900 | 18.0 | 0.6669 | 0.3329 | 0.4022 | 0.5008 | 0.1303 | 0.0723 | 0.5% |
| 5900 | 46.4 | 0.6814 | 0.3184 | 0.4006 | 0.4978 | 0.1303 | 0.0723 | 0.6% |
| 5900 | 69.0 | 0.6912 | 0.3087 | 0.4008 | 0.4983 | 0.1303 | 0.0723 | 0.6% |
| 5900 | 92.0 | 0.7008 | 0.2991 | 0.4005 | 0.4977 | 0.1303 | 0.0723 | 0.6% |
| 5900 | 89.7 | 0.7086 | 0.2914 | 0.3953 | 0.4879 | 0.1303 | 0.0723 | 0.7% |
| 5900 | 77.5 | 0.7138 | 0.2862 | 0.3934 | 0.4844 | 0.1303 | 0.0723 | 0.7% |
| 5900 | 64.5 | 0.7188 | 0.2812 | 0.3927 | 0.4830 | 0.1303 | 0.0723 | 0.8% |
| 5900 | 19.3 | 0.6669 | 0.3329 | 0.3534 | 0.4094 | 0.1192 | 0.1046 | 1.9% |
| 5900 | 48.8 | 0.6814 | 0.3184 | 0.3535 | 0.4096 | 0.1192 | 0.1046 | 1.9% |
| 5900 | 72.7 | 0.6912 | 0.3087 | 0.3545 | 0.4114 | 0.1192 | 0.1046 | 1.8% |
| 5900 | 95.4 | 0.7008 | 0.2991 | 0.3543 | 0.4111 | 0.1192 | 0.1046 | 1.9% |
| 5900 | 86.9 | 0.7086 | 0.2914 | 0.3515 | 0.4058 | 0.1192 | 0.1046 | 2.0% |
| 5900 | 74.3 | 0.7138 | 0.2862 | 0.3509 | 0.4046 | 0.1192 | 0.1046 | 2.0% |
| 5900 | 61.0 | 0.7188 | 0.2812 | 0.3507 | 0.4042 | 0.1192 | 0.1046 | 2.0% |
| 5900 | 21.1 | 0.6669 | 0.3329 | 0.3356 | 0.3760 | 0.1082 | 0.1444 | 2.6% |
| 5900 | 52.3 | 0.6814 | 0.3184 | 0.3363 | 0.3774 | 0.1082 | 0.1444 | 2.5% |
| 5900 | 77.1 | 0.6912 | 0.3087 | 0.3370 | 0.3787 | 0.1082 | 0.1444 | 2.5% |
| 5900 | 96.4 | 0.7008 | 0.2991 | 0.3367 | 0.3781 | 0.1082 | 0.1444 | 2.5% |
| 5900 | 83.5 | 0.7086 | 0.2914 | 0.3351 | 0.3750 | 0.1082 | 0.1444 | 2.6% |
| 5900 | 70.4 | 0.7138 | 0.2862 | 0.3348 | 0.3746 | 0.1082 | 0.1444 | 2.6% |
| 5900 | 56.7 | 0.7188 | 0.2812 | 0.3348 | 0.3745 | 0.1082 | 0.1444 | 2.6% |
| 5900 | 24.5 | 0.6669 | 0.3329 | 0.3231 | 0.3526 | 0.0934 | 0.2133 | 3.1% |
| 5900 | 57.9 | 0.6814 | 0.3184 | 0.3240 | 0.3542 | 0.0934 | 0.2133 | 3.1% |
| 5900 | 83.1 | 0.6912 | 0.3087 | 0.3244 | 0.3549 | 0.0934 | 0.2133 | 3.1% |
| 5900 | 93.7 | 0.7008 | 0.2991 | 0.3240 | 0.3543 | 0.0934 | 0.2133 | 3.1% |
| 5900 | 77.8 | 0.7086 | 0.2914 | 0.3236 | 0.3535 | 0.0934 | 0.2133 | 3.1% |
| 5900 | 63.8 | 0.7138 | 0.2862 | 0.3237 | 0.3536 | 0.0934 | 0.2133 | 3.1% |
| 5900 | 49.6 | 0.7188 | 0.2812 | 0.3238 | 0.3538 | 0.0934 | 0.2133 | 3.1% |
| 5900 | 29.6 | 0.6669 | 0.3329 | 0.3147 | 0.3368 | 0.0792 | 0.3084 | 3.5% |
| 5900 | 63.9 | 0.6814 | 0.3184 | 0.3155 | 0.3382 | 0.0792 | 0.3084 | 3.5% |
| 5900 | 89.5 | 0.6912 | 0.3087 | 0.3159 | 0.3391 | 0.0792 | 0.3084 | 3.5% |
| 5900 | 90.1 | 0.7008 | 0.2991 | 0.3161 | 0.3393 | 0.0792 | 0.3084 | 3.5% |
| 5900 | 69.4 | 0.7086 | 0.2914 | 0.3163 | 0.3398 | 0.0792 | 0.3084 | 3.5% |
| 5900 | 54.9 | 0.7138 | 0.2862 | 0.3165 | 0.3401 | 0.0792 | 0.3084 | 3.4% |
| 5900 | 42.6 | 0.7188 | 0.2812 | 0.3165 | 0.3402 | 0.0792 | 0.3084 | 3.4% |
| 5900 | 34.2 | 0.6669 | 0.3329 | 0.3089 | 0.3259 | 0.0709 | 0.4039 | 3.9% |
| 5900 | 69.7 | 0.6814 | 0.3184 | 0.3100 | 0.3279 | 0.0709 | 0.4039 | 3.8% |
| 5900 | 93.9 | 0.6912 | 0.3087 | 0.3106 | 0.3292 | 0.0709 | 0.4039 | 3.8% |
| 5900 | 83.5 | 0.7008 | 0.2991 | 0.3113 | 0.3305 | 0.0709 | 0.4039 | 3.7% |
| 5900 | 66.0 | 0.7086 | 0.2914 | 0.3118 | 0.3313 | 0.0709 | 0.4039 | 3.7% |
| 5900 | 54.8 | 0.7138 | 0.2862 | 0.3121 | 0.3319 | 0.0709 | 0.4039 | 3.7% |
| 5900 | 44.3 | 0.7188 | 0.2812 | 0.3123 | 0.3323 | 0.0709 | 0.4039 | 3.7% |
| 5900 | 38.4 | 0.6669 | 0.3329 | 0.3029 | 0.3148 | 0.0694 | 0.5232 | 4.2% |

TABLE 2-continued

| | | | | | | | | |
|---|---|---|---|---|---|---|---|---|
| 5900 | 73.7 | 0.6814 | 0.3184 | 0.3047 | 0.3180 | 0.0694 | 0.5232 | 4.1% |
| 5900 | 96.1 | 0.6912 | 0.3087 | 0.3059 | 0.3204 | 0.0694 | 0.5232 | 4.0% |
| 5900 | 80.9 | 0.7008 | 0.2991 | 0.3071 | 0.3226 | 0.0694 | 0.5232 | 4.0% |
| 5900 | 64.3 | 0.7086 | 0.2914 | 0.3079 | 0.3241 | 0.0694 | 0.5232 | 3.9% |
| 5900 | 54.2 | 0.7138 | 0.2862 | 0.3085 | 0.3251 | 0.0694 | 0.5232 | 3.9% |
| 5900 | 44.7 | 0.7188 | 0.2812 | 0.3090 | 0.3260 | 0.0694 | 0.5232 | 3.8% |
| 5900 | 42.2 | 0.6669 | 0.3329 | 0.2976 | 0.3048 | 0.0799 | 0.6269 | 4.5% |
| 5900 | 80.6 | 0.6814 | 0.3184 | 0.2998 | 0.3088 | 0.0799 | 0.6269 | 4.4% |
| 5900 | 97.1 | 0.6912 | 0.3087 | 0.3025 | 0.3139 | 0.0799 | 0.6269 | 4.2% |
| 5900 | 82.4 | 0.7008 | 0.2991 | 0.3044 | 0.3174 | 0.0799 | 0.6269 | 4.1% |
| 5900 | 66.9 | 0.7086 | 0.2914 | 0.3055 | 0.3195 | 0.0799 | 0.6269 | 4.0% |
| 5900 | 55.9 | 0.7138 | 0.2862 | 0.3061 | 0.3207 | 0.0799 | 0.6269 | 4.0% |
| 5900 | 45.5 | 0.7188 | 0.2812 | 0.3067 | 0.3218 | 0.0799 | 0.6269 | 4.0% |
| 5900 | 45.0 | 0.6669 | 0.3329 | 0.2932 | 0.2965 | 0.0975 | 0.6902 | 4.8% |
| 5900 | 83.0 | 0.6814 | 0.3184 | 0.2964 | 0.3025 | 0.0975 | 0.6902 | 4.6% |
| 5900 | 97.4 | 0.6912 | 0.3087 | 0.3002 | 0.3096 | 0.0975 | 0.6902 | 4.4% |
| 5900 | 83.6 | 0.7008 | 0.2991 | 0.3026 | 0.3141 | 0.0975 | 0.6902 | 4.2% |
| 5900 | 66.9 | 0.7086 | 0.2914 | 0.3038 | 0.3163 | 0.0975 | 0.6902 | 4.1% |
| 5900 | 56.0 | 0.7138 | 0.2862 | 0.3045 | 0.3177 | 0.0975 | 0.6902 | 4.1% |
| 5900 | 46.3 | 0.7188 | 0.2812 | 0.3053 | 0.3191 | 0.0975 | 0.6902 | 4.1% |
| 5900 | 48.1 | 0.6669 | 0.3329 | 0.2873 | 0.2854 | 0.1270 | 0.7352 | 5.3% |
| 5900 | 82.8 | 0.6814 | 0.3184 | 0.2931 | 0.2963 | 0.1270 | 0.7352 | 4.8% |
| 5900 | 96.8 | 0.6912 | 0.3087 | 0.2980 | 0.3054 | 0.1270 | 0.7352 | 4.5% |
| 5900 | 83.1 | 0.7008 | 0.2991 | 0.3005 | 0.3101 | 0.1270 | 0.7352 | 4.4% |
| 5900 | 66.8 | 0.7086 | 0.2914 | 0.3019 | 0.3129 | 0.1270 | 0.7352 | 4.3% |
| 5900 | 57.1 | 0.7138 | 0.2862 | 0.3030 | 0.3148 | 0.1270 | 0.7352 | 4.2% |
| 5900 | 50.0 | 0.7188 | 0.2812 | 0.3040 | 0.3168 | 0.1270 | 0.7352 | 4.1% |
| 5900 | 49.8 | 0.6669 | 0.3329 | 0.2814 | 0.2744 | 0.1561 | 0.7502 | 5.7% |
| 5900 | 82.6 | 0.6814 | 0.3184 | 0.2900 | 0.2905 | 0.1561 | 0.7502 | 5.1% |
| 5900 | 96.5 | 0.6912 | 0.3087 | 0.2959 | 0.3015 | 0.1561 | 0.7502 | 4.7% |
| 5900 | 82.6 | 0.7008 | 0.2991 | 0.2986 | 0.3066 | 0.1561 | 0.7502 | 4.5% |
| 5900 | 68.1 | 0.7086 | 0.2914 | 0.3006 | 0.3103 | 0.1561 | 0.7502 | 4.3% |
| 5900 | 61.5 | 0.7138 | 0.2862 | 0.3021 | 0.3131 | 0.1561 | 0.7502 | 4.3% |
| 5900 | 59.3 | 0.7188 | 0.2812 | 0.3038 | 0.3163 | 0.1561 | 0.7502 | 4.1% |
| 5900 | 51.0 | 0.6669 | 0.3329 | 0.2716 | 0.2559 | 0.1938 | 0.7479 | 6.6% |
| 5900 | 79.9 | 0.6814 | 0.3184 | 0.2863 | 0.2835 | 0.1938 | 0.7479 | 5.3% |
| 5900 | 97.5 | 0.6912 | 0.3087 | 0.2923 | 0.2949 | 0.1938 | 0.7479 | 4.9% |
| 5900 | 83.7 | 0.7008 | 0.2991 | 0.2962 | 0.3022 | 0.1938 | 0.7479 | 4.6% |
| 5900 | 75.5 | 0.7086 | 0.2914 | 0.2996 | 0.3085 | 0.1938 | 0.7479 | 4.4% |
| 5900 | 74.1 | 0.7138 | 0.2862 | 0.3020 | 0.3129 | 0.1938 | 0.7479 | 4.3% |
| 5900 | 74.8 | 0.7188 | 0.2812 | 0.3041 | 0.3170 | 0.1938 | 0.7479 | 4.1% |
| 5900 | 47.6 | 0.6669 | 0.3329 | 0.2585 | 0.2314 | 0.2329 | 0.7309 | 8.0% |
| 5900 | 78.9 | 0.6814 | 0.3184 | 0.2795 | 0.2707 | 0.2329 | 0.7309 | 5.9% |
| 5900 | 97.9 | 0.6912 | 0.3087 | 0.2874 | 0.2856 | 0.2329 | 0.7309 | 5.3% |
| 5900 | 91.6 | 0.7008 | 0.2991 | 0.2946 | 0.2991 | 0.2329 | 0.7309 | 4.7% |
| 5900 | 88.9 | 0.7086 | 0.2914 | 0.2995 | 0.3082 | 0.2329 | 0.7309 | 4.4% |
| 5900 | 88.5 | 0.7138 | 0.2862 | 0.3022 | 0.3133 | 0.2329 | 0.7309 | 4.2% |
| 5900 | 89.1 | 0.7188 | 0.2812 | 0.3045 | 0.3176 | 0.2329 | 0.7309 | 4.1% |
| 5800 | −0.3 | 0.6669 | 0.3329 | 0.4095 | 0.5146 | 0.1393 | 0.0514 | 0.4% |
| 5800 | 22.5 | 0.6814 | 0.3184 | 0.4095 | 0.5146 | 0.1393 | 0.0514 | 0.4% |
| 5800 | 40.4 | 0.6912 | 0.3087 | 0.4095 | 0.5146 | 0.1393 | 0.0514 | 0.4% |
| 5800 | 59.4 | 0.7008 | 0.2991 | 0.4095 | 0.5146 | 0.1393 | 0.0514 | 0.4% |
| 5800 | 75.5 | 0.7086 | 0.2914 | 0.4095 | 0.5146 | 0.1393 | 0.0514 | 0.4% |
| 5800 | 86.7 | 0.7138 | 0.2862 | 0.4095 | 0.5146 | 0.1393 | 0.0514 | 0.4% |
| 5800 | 97.1 | 0.7188 | 0.2812 | 0.4095 | 0.5146 | 0.1393 | 0.0514 | 0.4% |
| 5800 | 17.7 | 0.6669 | 0.3329 | 0.4036 | 0.5034 | 0.1303 | 0.0723 | 0.5% |
| 5800 | 46.8 | 0.6814 | 0.3184 | 0.4018 | 0.5001 | 0.1303 | 0.0723 | 0.5% |
| 5800 | 69.9 | 0.6912 | 0.3087 | 0.4020 | 0.5005 | 0.1303 | 0.0723 | 0.5% |
| 5800 | 93.1 | 0.7008 | 0.2991 | 0.4012 | 0.4990 | 0.1303 | 0.0723 | 0.6% |
| 5800 | 88.1 | 0.7086 | 0.2914 | 0.3959 | 0.4890 | 0.1303 | 0.0723 | 0.7% |
| 5800 | 75.4 | 0.7138 | 0.2862 | 0.3943 | 0.4860 | 0.1303 | 0.0723 | 0.7% |
| 5800 | 62.0 | 0.7188 | 0.2812 | 0.3936 | 0.4847 | 0.1303 | 0.0723 | 0.7% |
| 5800 | 19.0 | 0.6669 | 0.3329 | 0.3547 | 0.4118 | 0.1192 | 0.1046 | 1.8% |
| 5800 | 49.1 | 0.6814 | 0.3184 | 0.3547 | 0.4118 | 0.1192 | 0.1046 | 1.8% |
| 5800 | 73.5 | 0.6912 | 0.3087 | 0.3557 | 0.4136 | 0.1192 | 0.1046 | 1.8% |
| 5800 | 96.0 | 0.7008 | 0.2991 | 0.3553 | 0.4129 | 0.1192 | 0.1046 | 1.8% |
| 5800 | 85.4 | 0.7086 | 0.2914 | 0.3524 | 0.4075 | 0.1192 | 0.1046 | 1.9% |
| 5800 | 72.3 | 0.7138 | 0.2862 | 0.3519 | 0.4066 | 0.1192 | 0.1046 | 1.9% |
| 5800 | 58.6 | 0.7188 | 0.2812 | 0.3518 | 0.4063 | 0.1192 | 0.1046 | 1.9% |
| 5800 | 20.8 | 0.6669 | 0.3329 | 0.3368 | 0.3782 | 0.1082 | 0.1444 | 2.5% |
| 5800 | 52.6 | 0.6814 | 0.3184 | 0.3375 | 0.3796 | 0.1082 | 0.1444 | 2.5% |
| 5800 | 77.8 | 0.6912 | 0.3087 | 0.3382 | 0.3809 | 0.1082 | 0.1444 | 2.5% |
| 5800 | 96.1 | 0.7008 | 0.2991 | 0.3378 | 0.3800 | 0.1082 | 0.1444 | 2.5% |
| 5800 | 82.0 | 0.7086 | 0.2914 | 0.3361 | 0.3770 | 0.1082 | 0.1444 | 2.5% |
| 5800 | 68.4 | 0.7138 | 0.2862 | 0.3360 | 0.3767 | 0.1082 | 0.1444 | 2.5% |
| 5800 | 54.4 | 0.7188 | 0.2812 | 0.3360 | 0.3767 | 0.1082 | 0.1444 | 2.5% |
| 5800 | 24.1 | 0.6669 | 0.3329 | 0.3243 | 0.3548 | 0.0934 | 0.2133 | 3.1% |
| 5800 | 58.0 | 0.6814 | 0.3184 | 0.3252 | 0.3564 | 0.0934 | 0.2133 | 3.0% |
| 5800 | 83.6 | 0.6912 | 0.3087 | 0.3255 | 0.3571 | 0.0934 | 0.2133 | 3.0% |
| 5800 | 93.5 | 0.7008 | 0.2991 | 0.3251 | 0.3563 | 0.0934 | 0.2133 | 3.0% |

TABLE 2-continued

| | | | | | | | | |
|---|---|---|---|---|---|---|---|---|
| 5800 | 76.3 | 0.7086 | 0.2914 | 0.3248 | 0.3557 | 0.0934 | 0.2133 | 3.0% |
| 5800 | 61.9 | 0.7138 | 0.2862 | 0.3248 | 0.3558 | 0.0934 | 0.2133 | 3.0% |
| 5800 | 47.6 | 0.7188 | 0.2812 | 0.3249 | 0.3559 | 0.0934 | 0.2133 | 3.0% |
| 5800 | 29.0 | 0.6669 | 0.3329 | 0.3159 | 0.3390 | 0.0792 | 0.3084 | 3.5% |
| 5800 | 63.9 | 0.6814 | 0.3184 | 0.3167 | 0.3405 | 0.0792 | 0.3084 | 3.4% |
| 5800 | 89.7 | 0.6912 | 0.3087 | 0.3171 | 0.3413 | 0.0792 | 0.3084 | 3.4% |
| 5800 | 89.2 | 0.7008 | 0.2991 | 0.3172 | 0.3416 | 0.0792 | 0.3084 | 3.4% |
| 5800 | 68.0 | 0.7086 | 0.2914 | 0.3175 | 0.3420 | 0.0792 | 0.3084 | 3.4% |
| 5800 | 53.4 | 0.7138 | 0.2862 | 0.3176 | 0.3423 | 0.0792 | 0.3084 | 3.4% |
| 5800 | 42.4 | 0.7188 | 0.2812 | 0.3177 | 0.3424 | 0.0792 | 0.3084 | 3.4% |
| 5800 | 33.6 | 0.6669 | 0.3329 | 0.3101 | 0.3282 | 0.0709 | 0.4039 | 3.8% |
| 5800 | 69.6 | 0.6814 | 0.3184 | 0.3112 | 0.3302 | 0.0709 | 0.4039 | 3.7% |
| 5800 | 93.7 | 0.6912 | 0.3087 | 0.3119 | 0.3315 | 0.0709 | 0.4039 | 3.7% |
| 5800 | 83.1 | 0.7008 | 0.2991 | 0.3125 | 0.3328 | 0.0709 | 0.4039 | 3.6% |
| 5800 | 65.5 | 0.7086 | 0.2914 | 0.3130 | 0.3336 | 0.0709 | 0.4039 | 3.6% |
| 5800 | 54.1 | 0.7138 | 0.2862 | 0.3133 | 0.3341 | 0.0709 | 0.4039 | 3.6% |
| 5800 | 43.3 | 0.7188 | 0.2812 | 0.3135 | 0.3346 | 0.0709 | 0.4039 | 3.6% |
| 5800 | 37.7 | 0.6669 | 0.3329 | 0.3042 | 0.3171 | 0.0694 | 0.5232 | 4.1% |
| 5800 | 73.4 | 0.6814 | 0.3184 | 0.3060 | 0.3204 | 0.0694 | 0.5232 | 4.0% |
| 5800 | 96.0 | 0.6912 | 0.3087 | 0.3072 | 0.3228 | 0.0694 | 0.5232 | 3.9% |
| 5800 | 80.9 | 0.7008 | 0.2991 | 0.3084 | 0.3250 | 0.0694 | 0.5232 | 3.9% |
| 5800 | 64.2 | 0.7086 | 0.2914 | 0.3092 | 0.3265 | 0.0694 | 0.5232 | 3.8% |
| 5800 | 53.9 | 0.7138 | 0.2862 | 0.3098 | 0.3275 | 0.0694 | 0.5232 | 3.8% |
| 5800 | 44.1 | 0.7188 | 0.2812 | 0.3102 | 0.3284 | 0.0694 | 0.5232 | 3.8% |
| 5800 | 41.5 | 0.6669 | 0.3329 | 0.2989 | 0.3071 | 0.0799 | 0.6269 | 4.5% |
| 5800 | 80.2 | 0.6814 | 0.3184 | 0.3011 | 0.3112 | 0.0799 | 0.6269 | 4.3% |
| 5800 | 97.0 | 0.6912 | 0.3087 | 0.3038 | 0.3164 | 0.0799 | 0.6269 | 4.1% |
| 5800 | 82.4 | 0.7008 | 0.2991 | 0.3057 | 0.3199 | 0.0799 | 0.6269 | 4.0% |
| 5800 | 66.7 | 0.7086 | 0.2914 | 0.3068 | 0.3220 | 0.0799 | 0.6269 | 4.0% |
| 5800 | 55.6 | 0.7138 | 0.2862 | 0.3074 | 0.3232 | 0.0799 | 0.6269 | 3.9% |
| 5800 | 45.1 | 0.7188 | 0.2812 | 0.3080 | 0.3243 | 0.0799 | 0.6269 | 3.9% |
| 5800 | 44.2 | 0.6669 | 0.3329 | 0.2945 | 0.2989 | 0.0975 | 0.6902 | 4.7% |
| 5800 | 82.6 | 0.6814 | 0.3184 | 0.2977 | 0.3050 | 0.0975 | 0.6902 | 4.5% |
| 5800 | 97.3 | 0.6912 | 0.3087 | 0.3015 | 0.3121 | 0.0975 | 0.6902 | 4.3% |
| 5800 | 83.6 | 0.7008 | 0.2991 | 0.3039 | 0.3166 | 0.0975 | 0.6902 | 4.1% |
| 5800 | 66.7 | 0.7086 | 0.2914 | 0.3051 | 0.3189 | 0.0975 | 0.6902 | 4.1% |
| 5800 | 55.7 | 0.7138 | 0.2862 | 0.3059 | 0.3203 | 0.0975 | 0.6902 | 4.0% |
| 5800 | 45.9 | 0.7188 | 0.2812 | 0.3066 | 0.3216 | 0.0975 | 0.6902 | 4.0% |
| 5800 | 47.2 | 0.6669 | 0.3329 | 0.2886 | 0.2879 | 0.1270 | 0.7352 | 5.2% |
| 5800 | 82.4 | 0.6814 | 0.3184 | 0.2944 | 0.2988 | 0.1270 | 0.7352 | 4.7% |
| 5800 | 96.6 | 0.6912 | 0.3087 | 0.2993 | 0.3080 | 0.1270 | 0.7352 | 4.4% |
| 5800 | 83.2 | 0.7008 | 0.2991 | 0.3019 | 0.3127 | 0.1270 | 0.7352 | 4.3% |
| 5800 | 66.8 | 0.7086 | 0.2914 | 0.3034 | 0.3155 | 0.1270 | 0.7352 | 4.2% |
| 5800 | 57.0 | 0.7138 | 0.2862 | 0.3044 | 0.3174 | 0.1270 | 0.7352 | 4.1% |
| 5800 | 49.8 | 0.7188 | 0.2812 | 0.3055 | 0.3195 | 0.1270 | 0.7352 | 4.0% |
| 5800 | 48.9 | 0.6669 | 0.3329 | 0.2828 | 0.2771 | 0.1561 | 0.7502 | 5.6% |
| 5800 | 82.2 | 0.6814 | 0.3184 | 0.2914 | 0.2931 | 0.1561 | 0.7502 | 5.0% |
| 5800 | 96.3 | 0.6912 | 0.3087 | 0.2973 | 0.3042 | 0.1561 | 0.7502 | 4.6% |
| 5800 | 82.8 | 0.7008 | 0.2991 | 0.3001 | 0.3093 | 0.1561 | 0.7502 | 4.4% |
| 5800 | 68.2 | 0.7086 | 0.2914 | 0.3020 | 0.3130 | 0.1561 | 0.7502 | 4.3% |
| 5800 | 61.4 | 0.7138 | 0.2862 | 0.3035 | 0.3159 | 0.1561 | 0.7502 | 4.2% |
| 5800 | 59.0 | 0.7188 | 0.2812 | 0.3052 | 0.3191 | 0.1561 | 0.7502 | 4.1% |
| 5800 | 50.1 | 0.6669 | 0.3329 | 0.2731 | 0.2588 | 0.1938 | 0.7479 | 6.5% |
| 5800 | 79.6 | 0.6814 | 0.3184 | 0.2877 | 0.2861 | 0.1938 | 0.7479 | 5.2% |
| 5800 | 97.2 | 0.6912 | 0.3087 | 0.2939 | 0.2977 | 0.1938 | 0.7479 | 4.8% |
| 5800 | 83.9 | 0.7008 | 0.2991 | 0.2978 | 0.3050 | 0.1938 | 0.7479 | 4.5% |
| 5800 | 75.6 | 0.7086 | 0.2914 | 0.3011 | 0.3114 | 0.1938 | 0.7479 | 4.3% |
| 5800 | 74.0 | 0.7138 | 0.2862 | 0.3035 | 0.3158 | 0.1938 | 0.7479 | 4.2% |
| 5800 | 74.7 | 0.7188 | 0.2812 | 0.3057 | 0.3198 | 0.1938 | 0.7479 | 4.0% |
| 5800 | 46.8 | 0.6669 | 0.3329 | 0.2600 | 0.2343 | 0.2329 | 0.7309 | 7.8% |
| 5800 | 78.4 | 0.6814 | 0.3184 | 0.2811 | 0.2738 | 0.2329 | 0.7309 | 5.8% |
| 5800 | 97.5 | 0.6912 | 0.3087 | 0.2890 | 0.2886 | 0.2329 | 0.7309 | 5.1% |
| 5800 | 91.8 | 0.7008 | 0.2991 | 0.2962 | 0.3021 | 0.2329 | 0.7309 | 4.6% |
| 5800 | 88.9 | 0.7086 | 0.2914 | 0.3011 | 0.3112 | 0.2329 | 0.7309 | 4.3% |
| 5800 | 88.5 | 0.7138 | 0.2862 | 0.3038 | 0.3164 | 0.2329 | 0.7309 | 4.1% |
| 5800 | 89.0 | 0.7188 | 0.2812 | 0.3061 | 0.3206 | 0.2329 | 0.7309 | 4.0% |
| 5700 | −0.4 | 0.6669 | 0.3329 | 0.4095 | 0.5146 | 0.1393 | 0.0514 | 0.4% |
| 5700 | 23.2 | 0.6814 | 0.3184 | 0.4095 | 0.5146 | 0.1393 | 0.0514 | 0.4% |
| 5700 | 41.7 | 0.6912 | 0.3087 | 0.4095 | 0.5146 | 0.1393 | 0.0514 | 0.4% |
| 5700 | 61.3 | 0.7008 | 0.2991 | 0.4095 | 0.5146 | 0.1393 | 0.0514 | 0.4% |
| 5700 | 77.9 | 0.7086 | 0.2914 | 0.4095 | 0.5146 | 0.1393 | 0.0514 | 0.4% |
| 5700 | 89.5 | 0.7138 | 0.2862 | 0.4095 | 0.5146 | 0.1393 | 0.0514 | 0.4% |
| 5700 | 97.6 | 0.7188 | 0.2812 | 0.4095 | 0.5146 | 0.1393 | 0.0514 | 0.4% |
| 5700 | 17.5 | 0.6669 | 0.3329 | 0.4049 | 0.5060 | 0.1303 | 0.0723 | 0.5% |
| 5700 | 47.3 | 0.6814 | 0.3184 | 0.4030 | 0.5024 | 0.1303 | 0.0723 | 0.5% |
| 5700 | 70.8 | 0.6912 | 0.3087 | 0.4031 | 0.5026 | 0.1303 | 0.0723 | 0.5% |
| 5700 | 94.1 | 0.7008 | 0.2991 | 0.4017 | 0.5000 | 0.1303 | 0.0723 | 0.5% |
| 5700 | 86.5 | 0.7086 | 0.2914 | 0.3965 | 0.4902 | 0.1303 | 0.0723 | 0.7% |
| 5700 | 73.2 | 0.7138 | 0.2862 | 0.3951 | 0.4876 | 0.1303 | 0.0723 | 0.7% |
| 5700 | 59.4 | 0.7188 | 0.2812 | 0.3945 | 0.4864 | 0.1303 | 0.0723 | 0.7% |

TABLE 2-continued

| | | | | | | | | |
|---|---|---|---|---|---|---|---|---|
| 5700 | 18.7 | 0.6669 | 0.3329 | 0.3560 | 0.4142 | 0.1192 | 0.1046 | 1.8% |
| 5700 | 49.5 | 0.6814 | 0.3184 | 0.3560 | 0.4141 | 0.1192 | 0.1046 | 1.8% |
| 5700 | 74.4 | 0.6912 | 0.3087 | 0.3569 | 0.4159 | 0.1192 | 0.1046 | 1.8% |
| 5700 | 96.4 | 0.7008 | 0.2991 | 0.3562 | 0.4146 | 0.1192 | 0.1046 | 1.8% |
| 5700 | 83.8 | 0.7086 | 0.2914 | 0.3535 | 0.4095 | 0.1192 | 0.1046 | 1.9% |
| 5700 | 70.2 | 0.7138 | 0.2862 | 0.3531 | 0.4087 | 0.1192 | 0.1046 | 1.9% |
| 5700 | 56.2 | 0.7188 | 0.2812 | 0.3529 | 0.4084 | 0.1192 | 0.1046 | 1.9% |
| 5700 | 20.4 | 0.6669 | 0.3329 | 0.3380 | 0.3806 | 0.1082 | 0.1444 | 2.5% |
| 5700 | 52.8 | 0.6814 | 0.3184 | 0.3387 | 0.3819 | 0.1082 | 0.1444 | 2.4% |
| 5700 | 78.5 | 0.6912 | 0.3087 | 0.3394 | 0.3832 | 0.1082 | 0.1444 | 2.4% |
| 5700 | 95.8 | 0.7008 | 0.2991 | 0.3388 | 0.3819 | 0.1082 | 0.1444 | 2.4% |
| 5700 | 80.5 | 0.7086 | 0.2914 | 0.3373 | 0.3791 | 0.1082 | 0.1444 | 2.5% |
| 5700 | 66.4 | 0.7138 | 0.2862 | 0.3372 | 0.3789 | 0.1082 | 0.1444 | 2.5% |
| 5700 | 52.0 | 0.7188 | 0.2812 | 0.3372 | 0.3789 | 0.1082 | 0.1444 | 2.5% |
| 5700 | 23.6 | 0.6669 | 0.3329 | 0.3255 | 0.3571 | 0.0934 | 0.2133 | 3.0% |
| 5700 | 58.1 | 0.6814 | 0.3184 | 0.3264 | 0.3587 | 0.0934 | 0.2133 | 3.0% |
| 5700 | 84.1 | 0.6912 | 0.3087 | 0.3268 | 0.3594 | 0.0934 | 0.2133 | 2.9% |
| 5700 | 93.2 | 0.7008 | 0.2991 | 0.3262 | 0.3584 | 0.0934 | 0.2133 | 3.0% |
| 5700 | 74.7 | 0.7086 | 0.2914 | 0.3260 | 0.3580 | 0.0934 | 0.2133 | 3.0% |
| 5700 | 60.1 | 0.7138 | 0.2862 | 0.3260 | 0.3581 | 0.0934 | 0.2133 | 3.0% |
| 5700 | 45.7 | 0.7188 | 0.2812 | 0.3261 | 0.3582 | 0.0934 | 0.2133 | 3.0% |
| 5700 | 28.5 | 0.6669 | 0.3329 | 0.3171 | 0.3413 | 0.0792 | 0.3084 | 3.4% |
| 5700 | 63.9 | 0.6814 | 0.3184 | 0.3179 | 0.3428 | 0.0792 | 0.3084 | 3.4% |
| 5700 | 89.9 | 0.6912 | 0.3087 | 0.3183 | 0.3436 | 0.0792 | 0.3084 | 3.3% |
| 5700 | 88.3 | 0.7008 | 0.2991 | 0.3185 | 0.3439 | 0.0792 | 0.3084 | 3.3% |
| 5700 | 66.6 | 0.7086 | 0.2914 | 0.3187 | 0.3443 | 0.0792 | 0.3084 | 3.3% |
| 5700 | 52.3 | 0.7138 | 0.2862 | 0.3189 | 0.3446 | 0.0792 | 0.3084 | 3.3% |
| 5700 | 42.1 | 0.7188 | 0.2812 | 0.3188 | 0.3446 | 0.0792 | 0.3084 | 3.3% |
| 5700 | 33.0 | 0.6669 | 0.3329 | 0.3113 | 0.3305 | 0.0709 | 0.4039 | 3.7% |
| 5700 | 69.6 | 0.6814 | 0.3184 | 0.3124 | 0.3325 | 0.0709 | 0.4039 | 3.7% |
| 5700 | 93.5 | 0.6912 | 0.3087 | 0.3132 | 0.3339 | 0.0709 | 0.4039 | 3.6% |
| 5700 | 82.7 | 0.7008 | 0.2991 | 0.3138 | 0.3351 | 0.0709 | 0.4039 | 3.6% |
| 5700 | 64.9 | 0.7086 | 0.2914 | 0.3143 | 0.3360 | 0.0709 | 0.4039 | 3.6% |
| 5700 | 53.3 | 0.7138 | 0.2862 | 0.3145 | 0.3365 | 0.0709 | 0.4039 | 3.5% |
| 5700 | 42.2 | 0.7188 | 0.2812 | 0.3148 | 0.3369 | 0.0709 | 0.4039 | 3.5% |
| 5700 | 37.0 | 0.6669 | 0.3329 | 0.3055 | 0.3195 | 0.0694 | 0.5232 | 4.0% |
| 5700 | 73.1 | 0.6814 | 0.3184 | 0.3073 | 0.3228 | 0.0694 | 0.5232 | 3.9% |
| 5700 | 95.9 | 0.6912 | 0.3087 | 0.3085 | 0.3253 | 0.0694 | 0.5232 | 3.9% |
| 5700 | 80.9 | 0.7008 | 0.2991 | 0.3097 | 0.3275 | 0.0694 | 0.5232 | 3.8% |
| 5700 | 64.0 | 0.7086 | 0.2914 | 0.3105 | 0.3290 | 0.0694 | 0.5232 | 3.8% |
| 5700 | 53.6 | 0.7138 | 0.2862 | 0.3111 | 0.3300 | 0.0694 | 0.5232 | 3.7% |
| 5700 | 43.6 | 0.7188 | 0.2812 | 0.3116 | 0.3309 | 0.0694 | 0.5232 | 3.7% |
| 5700 | 40.7 | 0.6669 | 0.3329 | 0.3002 | 0.3095 | 0.0799 | 0.6269 | 4.4% |
| 5700 | 79.7 | 0.6814 | 0.3184 | 0.3024 | 0.3137 | 0.0799 | 0.6269 | 4.2% |
| 5700 | 96.9 | 0.6912 | 0.3087 | 0.3052 | 0.3189 | 0.0799 | 0.6269 | 4.1% |
| 5700 | 82.4 | 0.7008 | 0.2991 | 0.3070 | 0.3224 | 0.0799 | 0.6269 | 4.0% |
| 5700 | 66.4 | 0.7086 | 0.2914 | 0.3082 | 0.3246 | 0.0799 | 0.6269 | 3.9% |
| 5700 | 55.2 | 0.7138 | 0.2862 | 0.3088 | 0.3258 | 0.0799 | 0.6269 | 3.9% |
| 5700 | 44.6 | 0.7188 | 0.2812 | 0.3094 | 0.3268 | 0.0799 | 0.6269 | 3.8% |
| 5700 | 43.3 | 0.6669 | 0.3329 | 0.2959 | 0.3015 | 0.0975 | 0.6902 | 4.7% |
| 5700 | 82.1 | 0.6814 | 0.3184 | 0.2991 | 0.3075 | 0.0975 | 0.6902 | 4.4% |
| 5700 | 97.2 | 0.6912 | 0.3087 | 0.3029 | 0.3147 | 0.0975 | 0.6902 | 4.2% |
| 5700 | 83.6 | 0.7008 | 0.2991 | 0.3053 | 0.3192 | 0.0975 | 0.6902 | 4.1% |
| 5700 | 66.6 | 0.7086 | 0.2914 | 0.3065 | 0.3215 | 0.0975 | 0.6902 | 4.0% |
| 5700 | 55.5 | 0.7138 | 0.2862 | 0.3073 | 0.3229 | 0.0975 | 0.6902 | 3.9% |
| 5700 | 45.6 | 0.7188 | 0.2812 | 0.3080 | 0.3243 | 0.0975 | 0.6902 | 3.9% |
| 5700 | 46.3 | 0.6669 | 0.3329 | 0.2901 | 0.2906 | 0.1270 | 0.7352 | 5.1% |
| 5700 | 82.0 | 0.6814 | 0.3184 | 0.2958 | 0.3014 | 0.1270 | 0.7352 | 4.7% |
| 5700 | 96.5 | 0.6912 | 0.3087 | 0.3008 | 0.3107 | 0.1270 | 0.7352 | 4.3% |
| 5700 | 83.2 | 0.7008 | 0.2991 | 0.3033 | 0.3154 | 0.1270 | 0.7352 | 4.2% |
| 5700 | 66.7 | 0.7086 | 0.2914 | 0.3048 | 0.3183 | 0.1270 | 0.7352 | 4.1% |
| 5700 | 56.8 | 0.7138 | 0.2862 | 0.3058 | 0.3202 | 0.1270 | 0.7352 | 4.0% |
| 5700 | 49.5 | 0.7188 | 0.2812 | 0.3069 | 0.3222 | 0.1270 | 0.7352 | 4.0% |
| 5700 | 48.0 | 0.6669 | 0.3329 | 0.2843 | 0.2798 | 0.1561 | 0.7502 | 5.5% |
| 5700 | 81.8 | 0.6814 | 0.3184 | 0.2928 | 0.2958 | 0.1561 | 0.7502 | 4.9% |
| 5700 | 96.0 | 0.6912 | 0.3087 | 0.2988 | 0.3069 | 0.1561 | 0.7502 | 4.5% |
| 5700 | 82.9 | 0.7008 | 0.2991 | 0.3016 | 0.3121 | 0.1561 | 0.7502 | 4.3% |
| 5700 | 68.2 | 0.7086 | 0.2914 | 0.3035 | 0.3159 | 0.1561 | 0.7502 | 4.2% |
| 5700 | 61.3 | 0.7138 | 0.2862 | 0.3051 | 0.3187 | 0.1561 | 0.7502 | 4.1% |
| 5700 | 58.8 | 0.7188 | 0.2812 | 0.3067 | 0.3219 | 0.1561 | 0.7502 | 4.0% |
| 5700 | 49.2 | 0.6669 | 0.3329 | 0.2747 | 0.2618 | 0.1938 | 0.7479 | 6.3% |
| 5700 | 79.3 | 0.6814 | 0.3184 | 0.2891 | 0.2889 | 0.1938 | 0.7479 | 5.1% |
| 5700 | 96.9 | 0.6912 | 0.3087 | 0.2954 | 0.3007 | 0.1938 | 0.7479 | 4.7% |
| 5700 | 84.1 | 0.7008 | 0.2991 | 0.2994 | 0.3080 | 0.1938 | 0.7479 | 4.4% |
| 5700 | 75.6 | 0.7086 | 0.2914 | 0.3027 | 0.3143 | 0.1938 | 0.7479 | 4.2% |
| 5700 | 73.9 | 0.7138 | 0.2862 | 0.3051 | 0.3187 | 0.1938 | 0.7479 | 4.1% |
| 5700 | 74.5 | 0.7188 | 0.2812 | 0.3072 | 0.3228 | 0.1938 | 0.7479 | 3.9% |
| 5700 | 46.1 | 0.6669 | 0.3329 | 0.2617 | 0.2373 | 0.2329 | 0.7309 | 7.7% |
| 5700 | 77.8 | 0.6814 | 0.3184 | 0.2828 | 0.2770 | 0.2329 | 0.7309 | 5.6% |
| 5700 | 97.2 | 0.6912 | 0.3087 | 0.2907 | 0.2918 | 0.2329 | 0.7309 | 5.0% |

TABLE 2-continued

| | | | | | | | | |
|---|---|---|---|---|---|---|---|---|
| 5700 | 92.0 | 0.7008 | 0.2991 | 0.2979 | 0.3053 | 0.2329 | 0.7309 | 4.5% |
| 5700 | 89.0 | 0.7086 | 0.2914 | 0.3027 | 0.3144 | 0.2329 | 0.7309 | 4.2% |
| 5700 | 88.5 | 0.7138 | 0.2862 | 0.3055 | 0.3195 | 0.2329 | 0.7309 | 4.0% |
| 5700 | 89.0 | 0.7188 | 0.2812 | 0.3078 | 0.3238 | 0.2329 | 0.7309 | 3.9% |
| 5600 | −0.5 | 0.6669 | 0.3329 | 0.4095 | 0.5146 | 0.1393 | 0.0514 | 0.4% |
| 5600 | 23.9 | 0.6814 | 0.3184 | 0.4095 | 0.5146 | 0.1393 | 0.0514 | 0.4% |
| 5600 | 43.0 | 0.6912 | 0.3087 | 0.4095 | 0.5146 | 0.1393 | 0.0514 | 0.4% |
| 5600 | 63.3 | 0.7008 | 0.2991 | 0.4095 | 0.5146 | 0.1393 | 0.0514 | 0.4% |
| 5600 | 80.5 | 0.7086 | 0.2914 | 0.4095 | 0.5146 | 0.1393 | 0.0514 | 0.4% |
| 5600 | 92.4 | 0.7138 | 0.2862 | 0.4095 | 0.5146 | 0.1393 | 0.0514 | 0.4% |
| 5600 | 95.0 | 0.7188 | 0.2812 | 0.4095 | 0.5146 | 0.1393 | 0.0514 | 0.4% |
| 5600 | 17.2 | 0.6669 | 0.3329 | 0.4063 | 0.5086 | 0.1303 | 0.0723 | 0.4% |
| 5600 | 47.7 | 0.6814 | 0.3184 | 0.4042 | 0.5047 | 0.1303 | 0.0723 | 0.5% |
| 5600 | 71.8 | 0.6912 | 0.3087 | 0.4043 | 0.5048 | 0.1303 | 0.0723 | 0.5% |
| 5600 | 95.0 | 0.7008 | 0.2991 | 0.4022 | 0.5008 | 0.1303 | 0.0723 | 0.5% |
| 5600 | 84.7 | 0.7086 | 0.2914 | 0.3973 | 0.4916 | 0.1303 | 0.0723 | 0.6% |
| 5600 | 70.9 | 0.7138 | 0.2862 | 0.3960 | 0.4893 | 0.1303 | 0.0723 | 0.7% |
| 5600 | 56.8 | 0.7188 | 0.2812 | 0.3954 | 0.4881 | 0.1303 | 0.0723 | 0.7% |
| 5600 | 18.4 | 0.6669 | 0.3329 | 0.3573 | 0.4167 | 0.1192 | 0.1046 | 1.8% |
| 5600 | 49.8 | 0.6814 | 0.3184 | 0.3572 | 0.4165 | 0.1192 | 0.1046 | 1.8% |
| 5600 | 75.2 | 0.6912 | 0.3087 | 0.3581 | 0.4183 | 0.1192 | 0.1046 | 1.7% |
| 5600 | 96.6 | 0.7008 | 0.2991 | 0.3571 | 0.4162 | 0.1192 | 0.1046 | 1.8% |
| 5600 | 82.1 | 0.7086 | 0.2914 | 0.3545 | 0.4115 | 0.1192 | 0.1046 | 1.8% |
| 5600 | 68.0 | 0.7138 | 0.2862 | 0.3542 | 0.4108 | 0.1192 | 0.1046 | 1.9% |
| 5600 | 53.6 | 0.7188 | 0.2812 | 0.3541 | 0.4106 | 0.1192 | 0.1046 | 1.9% |
| 5600 | 20.0 | 0.6669 | 0.3329 | 0.3393 | 0.3830 | 0.1082 | 0.1444 | 2.4% |
| 5600 | 53.1 | 0.6814 | 0.3184 | 0.3400 | 0.3842 | 0.1082 | 0.1444 | 2.4% |
| 5600 | 79.3 | 0.6912 | 0.3087 | 0.3407 | 0.3855 | 0.1082 | 0.1444 | 2.4% |
| 5600 | 95.4 | 0.7008 | 0.2991 | 0.3397 | 0.3837 | 0.1082 | 0.1444 | 2.4% |
| 5600 | 78.8 | 0.7086 | 0.2914 | 0.3385 | 0.3813 | 0.1082 | 0.1444 | 2.4% |
| 5600 | 64.3 | 0.7138 | 0.2862 | 0.3384 | 0.3812 | 0.1082 | 0.1444 | 2.4% |
| 5600 | 49.6 | 0.7188 | 0.2812 | 0.3384 | 0.3812 | 0.1082 | 0.1444 | 2.4% |
| 5600 | 23.2 | 0.6669 | 0.3329 | 0.3268 | 0.3595 | 0.0934 | 0.2133 | 2.9% |
| 5600 | 58.3 | 0.6814 | 0.3184 | 0.3276 | 0.3611 | 0.0934 | 0.2133 | 2.9% |
| 5600 | 84.6 | 0.6912 | 0.3087 | 0.3280 | 0.3618 | 0.0934 | 0.2133 | 2.9% |
| 5600 | 92.9 | 0.7008 | 0.2991 | 0.3273 | 0.3605 | 0.0934 | 0.2133 | 2.9% |
| 5600 | 73.1 | 0.7086 | 0.2914 | 0.3272 | 0.3603 | 0.0934 | 0.2133 | 2.9% |
| 5600 | 58.2 | 0.7138 | 0.2862 | 0.3273 | 0.3604 | 0.0934 | 0.2133 | 2.9% |
| 5600 | 43.9 | 0.7188 | 0.2812 | 0.3273 | 0.3604 | 0.0934 | 0.2133 | 2.9% |
| 5600 | 27.9 | 0.6669 | 0.3329 | 0.3184 | 0.3437 | 0.0792 | 0.3084 | 3.3% |
| 5600 | 63.8 | 0.6814 | 0.3184 | 0.3192 | 0.3452 | 0.0792 | 0.3084 | 3.3% |
| 5600 | 90.1 | 0.6912 | 0.3087 | 0.3196 | 0.3460 | 0.0792 | 0.3084 | 3.3% |
| 5600 | 87.4 | 0.7008 | 0.2991 | 0.3197 | 0.3462 | 0.0792 | 0.3084 | 3.3% |
| 5600 | 65.2 | 0.7086 | 0.2914 | 0.3200 | 0.3467 | 0.0792 | 0.3084 | 3.3% |
| 5600 | 52.0 | 0.7138 | 0.2862 | 0.3201 | 0.3469 | 0.0792 | 0.3084 | 3.3% |
| 5600 | 41.6 | 0.7188 | 0.2812 | 0.3201 | 0.3468 | 0.0792 | 0.3084 | 3.3% |
| 5600 | 32.4 | 0.6669 | 0.3329 | 0.3126 | 0.3329 | 0.0709 | 0.4039 | 3.6% |
| 5600 | 69.6 | 0.6814 | 0.3184 | 0.3137 | 0.3350 | 0.0709 | 0.4039 | 3.6% |
| 5600 | 93.5 | 0.6912 | 0.3087 | 0.3145 | 0.3364 | 0.0709 | 0.4039 | 3.5% |
| 5600 | 82.4 | 0.7008 | 0.2991 | 0.3151 | 0.3376 | 0.0709 | 0.4039 | 3.5% |
| 5600 | 64.4 | 0.7086 | 0.2914 | 0.3156 | 0.3384 | 0.0709 | 0.4039 | 3.5% |
| 5600 | 52.5 | 0.7138 | 0.2862 | 0.3158 | 0.3389 | 0.0709 | 0.4039 | 3.5% |
| 5600 | 41.1 | 0.7188 | 0.2812 | 0.3161 | 0.3394 | 0.0709 | 0.4039 | 3.5% |
| 5600 | 36.3 | 0.6669 | 0.3329 | 0.3068 | 0.3219 | 0.0694 | 0.5232 | 4.0% |
| 5600 | 72.7 | 0.6814 | 0.3184 | 0.3086 | 0.3253 | 0.0694 | 0.5232 | 3.9% |
| 5600 | 95.8 | 0.6912 | 0.3087 | 0.3099 | 0.3278 | 0.0694 | 0.5232 | 3.8% |
| 5600 | 80.8 | 0.7008 | 0.2991 | 0.3111 | 0.3300 | 0.0694 | 0.5232 | 3.7% |
| 5600 | 63.9 | 0.7086 | 0.2914 | 0.3119 | 0.3316 | 0.0694 | 0.5232 | 3.7% |
| 5600 | 53.2 | 0.7138 | 0.2862 | 0.3124 | 0.3326 | 0.0694 | 0.5232 | 3.7% |
| 5600 | 43.0 | 0.7188 | 0.2812 | 0.3129 | 0.3334 | 0.0694 | 0.5232 | 3.6% |
| 5600 | 39.9 | 0.6669 | 0.3329 | 0.3015 | 0.3121 | 0.0799 | 0.6269 | 4.3% |
| 5600 | 79.3 | 0.6814 | 0.3184 | 0.3038 | 0.3163 | 0.0799 | 0.6269 | 4.1% |
| 5600 | 96.9 | 0.6912 | 0.3087 | 0.3065 | 0.3215 | 0.0799 | 0.6269 | 4.0% |
| 5600 | 82.4 | 0.7008 | 0.2991 | 0.3084 | 0.3251 | 0.0799 | 0.6269 | 3.9% |
| 5600 | 66.2 | 0.7086 | 0.2914 | 0.3096 | 0.3272 | 0.0799 | 0.6269 | 3.8% |
| 5600 | 54.8 | 0.7138 | 0.2862 | 0.3102 | 0.3284 | 0.0799 | 0.6269 | 3.8% |
| 5600 | 44.1 | 0.7188 | 0.2812 | 0.3108 | 0.3295 | 0.0799 | 0.6269 | 3.7% |
| 5600 | 42.4 | 0.6669 | 0.3329 | 0.2973 | 0.3041 | 0.0975 | 0.6902 | 4.6% |
| 5600 | 81.6 | 0.6814 | 0.3184 | 0.3005 | 0.3102 | 0.0975 | 0.6902 | 4.4% |
| 5600 | 97.1 | 0.6912 | 0.3087 | 0.3044 | 0.3174 | 0.0975 | 0.6902 | 4.1% |
| 5600 | 83.5 | 0.7008 | 0.2991 | 0.3068 | 0.3219 | 0.0975 | 0.6902 | 4.0% |
| 5600 | 66.4 | 0.7086 | 0.2914 | 0.3080 | 0.3242 | 0.0975 | 0.6902 | 3.9% |
| 5600 | 55.2 | 0.7138 | 0.2862 | 0.3088 | 0.3256 | 0.0975 | 0.6902 | 3.9% |
| 5600 | 45.2 | 0.7188 | 0.2812 | 0.3095 | 0.3270 | 0.0975 | 0.6902 | 3.8% |
| 5600 | 45.4 | 0.6669 | 0.3329 | 0.2915 | 0.2934 | 0.1270 | 0.7352 | 5.0% |
| 5600 | 81.6 | 0.6814 | 0.3184 | 0.2973 | 0.3041 | 0.1270 | 0.7352 | 4.6% |
| 5600 | 96.3 | 0.6912 | 0.3087 | 0.3022 | 0.3134 | 0.1270 | 0.7352 | 4.2% |
| 5600 | 83.3 | 0.7008 | 0.2991 | 0.3048 | 0.3182 | 0.1270 | 0.7352 | 4.1% |
| 5600 | 66.6 | 0.7086 | 0.2914 | 0.3063 | 0.3211 | 0.1270 | 0.7352 | 4.0% |
| 5600 | 56.7 | 0.7138 | 0.2862 | 0.3073 | 0.3230 | 0.1270 | 0.7352 | 3.9% |

TABLE 2-continued

| | | | | | | | |
|---|---|---|---|---|---|---|---|
| 5600 | 49.3 | 0.7188 | 0.2812 | 0.3084 | 0.3251 | 0.1270 | 0.7352 | 3.9% |
| 5600 | 47.1 | 0.6669 | 0.3329 | 0.2858 | 0.2826 | 0.1561 | 0.7502 | 5.4% |
| 5600 | 81.4 | 0.6814 | 0.3184 | 0.2943 | 0.2986 | 0.1561 | 0.7502 | 4.8% |
| 5600 | 95.8 | 0.6912 | 0.3087 | 0.3003 | 0.3098 | 0.1561 | 0.7502 | 4.4% |
| 5600 | 83.1 | 0.7008 | 0.2991 | 0.3031 | 0.3150 | 0.1561 | 0.7502 | 4.2% |
| 5600 | 68.2 | 0.7086 | 0.2914 | 0.3051 | 0.3188 | 0.1561 | 0.7502 | 4.1% |
| 5600 | 61.2 | 0.7138 | 0.2862 | 0.3066 | 0.3216 | 0.1561 | 0.7502 | 4.0% |
| 5600 | 58.5 | 0.7188 | 0.2812 | 0.3083 | 0.3248 | 0.1561 | 0.7502 | 3.9% |
| 5600 | 48.3 | 0.6669 | 0.3329 | 0.2763 | 0.2649 | 0.1938 | 0.7479 | 6.2% |
| 5600 | 79.0 | 0.6814 | 0.3184 | 0.2907 | 0.2917 | 0.1938 | 0.7479 | 5.0% |
| 5600 | 96.5 | 0.6912 | 0.3087 | 0.2971 | 0.3037 | 0.1938 | 0.7479 | 4.6% |
| 5600 | 84.4 | 0.7008 | 0.2991 | 0.3010 | 0.3111 | 0.1938 | 0.7479 | 4.3% |
| 5600 | 75.7 | 0.7086 | 0.2914 | 0.3043 | 0.3174 | 0.1938 | 0.7479 | 4.1% |
| 5600 | 73.8 | 0.7138 | 0.2862 | 0.3067 | 0.3218 | 0.1938 | 0.7479 | 4.0% |
| 5600 | 74.3 | 0.7188 | 0.2812 | 0.3088 | 0.3258 | 0.1938 | 0.7479 | 3.9% |
| 5600 | 45.3 | 0.6669 | 0.3329 | 0.2634 | 0.2405 | 0.2329 | 0.7309 | 7.5% |
| 5600 | 77.3 | 0.6814 | 0.3184 | 0.2845 | 0.2802 | 0.2329 | 0.7309 | 5.5% |
| 5600 | 96.8 | 0.6912 | 0.3087 | 0.2925 | 0.2951 | 0.2329 | 0.7309 | 4.9% |
| 5600 | 92.1 | 0.7008 | 0.2991 | 0.2996 | 0.3085 | 0.2329 | 0.7309 | 4.4% |
| 5600 | 89.0 | 0.7086 | 0.2914 | 0.3045 | 0.3176 | 0.2329 | 0.7309 | 4.1% |
| 5600 | 88.5 | 0.7138 | 0.2862 | 0.3072 | 0.3227 | 0.2329 | 0.7309 | 3.9% |
| 5600 | 88.9 | 0.7188 | 0.2812 | 0.3095 | 0.3270 | 0.2329 | 0.7309 | 3.8% |
| 5500 | −0.7 | 0.6669 | 0.3329 | 0.4095 | 0.5146 | 0.1393 | 0.0514 | 0.4% |
| 5500 | 24.6 | 0.6814 | 0.3184 | 0.4095 | 0.5146 | 0.1393 | 0.0514 | 0.4% |
| 5500 | 44.4 | 0.6912 | 0.3087 | 0.4095 | 0.5146 | 0.1393 | 0.0514 | 0.4% |
| 5500 | 65.4 | 0.7008 | 0.2991 | 0.4095 | 0.5146 | 0.1393 | 0.0514 | 0.4% |
| 5500 | 83.1 | 0.7086 | 0.2914 | 0.4095 | 0.5146 | 0.1393 | 0.0514 | 0.4% |
| 5500 | 95.3 | 0.7138 | 0.2862 | 0.4095 | 0.5146 | 0.1393 | 0.0514 | 0.4% |
| 5500 | 91.8 | 0.7188 | 0.2812 | 0.4095 | 0.5146 | 0.1393 | 0.0514 | 0.4% |
| 5500 | 16.9 | 0.6669 | 0.3329 | 0.4077 | 0.5112 | 0.1303 | 0.0723 | 0.4% |
| 5500 | 48.1 | 0.6814 | 0.3184 | 0.4054 | 0.5070 | 0.1303 | 0.0723 | 0.5% |
| 5500 | 72.7 | 0.6912 | 0.3087 | 0.4054 | 0.5070 | 0.1303 | 0.0723 | 0.5% |
| 5500 | 95.7 | 0.7008 | 0.2991 | 0.4025 | 0.5014 | 0.1303 | 0.0723 | 0.5% |
| 5500 | 82.8 | 0.7086 | 0.2914 | 0.3980 | 0.4931 | 0.1303 | 0.0723 | 0.6% |
| 5500 | 68.6 | 0.7138 | 0.2862 | 0.3969 | 0.4909 | 0.1303 | 0.0723 | 0.7% |
| 5500 | 54.1 | 0.7188 | 0.2812 | 0.3963 | 0.4898 | 0.1303 | 0.0723 | 0.7% |
| 5500 | 18.1 | 0.6669 | 0.3329 | 0.3587 | 0.4192 | 0.1192 | 0.1046 | 1.7% |
| 5500 | 50.2 | 0.6814 | 0.3184 | 0.3585 | 0.4189 | 0.1192 | 0.1046 | 1.7% |
| 5500 | 76.1 | 0.6912 | 0.3087 | 0.3594 | 0.4206 | 0.1192 | 0.1046 | 1.7% |
| 5500 | 96.5 | 0.7008 | 0.2991 | 0.3579 | 0.4177 | 0.1192 | 0.1046 | 1.7% |
| 5500 | 80.3 | 0.7086 | 0.2914 | 0.3557 | 0.4136 | 0.1192 | 0.1046 | 1.8% |
| 5500 | 65.8 | 0.7138 | 0.2862 | 0.3553 | 0.4130 | 0.1192 | 0.1046 | 1.8% |
| 5500 | 51.0 | 0.7188 | 0.2812 | 0.3552 | 0.4128 | 0.1192 | 0.1046 | 1.8% |
| 5500 | 19.7 | 0.6669 | 0.3329 | 0.3406 | 0.3854 | 0.1082 | 0.1444 | 2.4% |
| 5500 | 53.4 | 0.6814 | 0.3184 | 0.3413 | 0.3867 | 0.1082 | 0.1444 | 2.3% |
| 5500 | 80.0 | 0.6912 | 0.3087 | 0.3420 | 0.3879 | 0.1082 | 0.1444 | 2.3% |
| 5500 | 95.0 | 0.7008 | 0.2991 | 0.3407 | 0.3856 | 0.1082 | 0.1444 | 2.4% |
| 5500 | 77.0 | 0.7086 | 0.2914 | 0.3397 | 0.3836 | 0.1082 | 0.1444 | 2.4% |
| 5500 | 62.2 | 0.7138 | 0.2862 | 0.3396 | 0.3835 | 0.1082 | 0.1444 | 2.4% |
| 5500 | 47.2 | 0.7188 | 0.2812 | 0.3396 | 0.3835 | 0.1082 | 0.1444 | 2.4% |
| 5500 | 22.7 | 0.6669 | 0.3329 | 0.3281 | 0.3619 | 0.0934 | 0.2133 | 2.9% |
| 5500 | 58.4 | 0.6814 | 0.3184 | 0.3289 | 0.3635 | 0.0934 | 0.2133 | 2.8% |
| 5500 | 85.1 | 0.6912 | 0.3087 | 0.3293 | 0.3642 | 0.0934 | 0.2133 | 2.8% |
| 5500 | 92.3 | 0.7008 | 0.2991 | 0.3285 | 0.3627 | 0.0934 | 0.2133 | 2.9% |
| 5500 | 71.5 | 0.7086 | 0.2914 | 0.3285 | 0.3627 | 0.0934 | 0.2133 | 2.9% |
| 5500 | 56.3 | 0.7138 | 0.2862 | 0.3285 | 0.3628 | 0.0934 | 0.2133 | 2.9% |
| 5500 | 42.3 | 0.7188 | 0.2812 | 0.3285 | 0.3626 | 0.0934 | 0.2133 | 2.9% |
| 5500 | 27.3 | 0.6669 | 0.3329 | 0.3197 | 0.3462 | 0.0792 | 0.3084 | 3.3% |
| 5500 | 63.8 | 0.6814 | 0.3184 | 0.3205 | 0.3477 | 0.0792 | 0.3084 | 3.2% |
| 5500 | 90.3 | 0.6912 | 0.3087 | 0.3209 | 0.3485 | 0.0792 | 0.3084 | 3.2% |
| 5500 | 86.4 | 0.7008 | 0.2991 | 0.3210 | 0.3487 | 0.0792 | 0.3084 | 3.2% |
| 5500 | 63.8 | 0.7086 | 0.2914 | 0.3213 | 0.3492 | 0.0792 | 0.3084 | 3.2% |
| 5500 | 51.7 | 0.7138 | 0.2862 | 0.3213 | 0.3492 | 0.0792 | 0.3084 | 3.2% |
| 5500 | 40.8 | 0.7188 | 0.2812 | 0.3213 | 0.3492 | 0.0792 | 0.3084 | 3.2% |
| 5500 | 31.7 | 0.6669 | 0.3329 | 0.3140 | 0.3354 | 0.0709 | 0.4039 | 3.6% |
| 5500 | 69.6 | 0.6814 | 0.3184 | 0.3151 | 0.3375 | 0.0709 | 0.4039 | 3.5% |
| 5500 | 93.5 | 0.6912 | 0.3087 | 0.3158 | 0.3389 | 0.0709 | 0.4039 | 3.5% |
| 5500 | 82.0 | 0.7008 | 0.2991 | 0.3165 | 0.3401 | 0.0709 | 0.4039 | 3.4% |
| 5500 | 63.7 | 0.7086 | 0.2914 | 0.3169 | 0.3409 | 0.0709 | 0.4039 | 3.4% |
| 5500 | 51.6 | 0.7138 | 0.2862 | 0.3172 | 0.3414 | 0.0709 | 0.4039 | 3.4% |
| 5500 | 39.9 | 0.7188 | 0.2812 | 0.3174 | 0.3418 | 0.0709 | 0.4039 | 3.4% |
| 5500 | 35.5 | 0.6669 | 0.3329 | 0.3081 | 0.3245 | 0.0694 | 0.5232 | 3.9% |
| 5500 | 72.3 | 0.6814 | 0.3184 | 0.3100 | 0.3280 | 0.0694 | 0.5232 | 3.8% |
| 5500 | 95.8 | 0.6912 | 0.3087 | 0.3113 | 0.3304 | 0.0694 | 0.5232 | 3.7% |
| 5500 | 80.8 | 0.7008 | 0.2991 | 0.3125 | 0.3326 | 0.0694 | 0.5232 | 3.7% |
| 5500 | 63.6 | 0.7086 | 0.2914 | 0.3133 | 0.3342 | 0.0694 | 0.5232 | 3.6% |
| 5500 | 52.8 | 0.7138 | 0.2862 | 0.3139 | 0.3352 | 0.0694 | 0.5232 | 3.6% |
| 5500 | 42.4 | 0.7188 | 0.2812 | 0.3143 | 0.3361 | 0.0694 | 0.5232 | 3.6% |
| 5500 | 39.1 | 0.6669 | 0.3329 | 0.3029 | 0.3147 | 0.0799 | 0.6269 | 4.2% |
| 5500 | 78.8 | 0.6814 | 0.3184 | 0.3052 | 0.3190 | 0.0799 | 0.6269 | 4.1% |

TABLE 2-continued

| | | | | | | | |
|---|---|---|---|---|---|---|---|
| 5500 | 96.8 | 0.6912 | 0.3087 | 0.3080 | 0.3242 | 0.0799 | 0.6269 | 3.9% |
| 5500 | 82.3 | 0.7008 | 0.2991 | 0.3099 | 0.3278 | 0.0799 | 0.6269 | 3.8% |
| 5500 | 65.9 | 0.7086 | 0.2914 | 0.3110 | 0.3299 | 0.0799 | 0.6269 | 3.7% |
| 5500 | 54.4 | 0.7138 | 0.2862 | 0.3117 | 0.3311 | 0.0799 | 0.6269 | 3.7% |
| 5500 | 43.6 | 0.7188 | 0.2812 | 0.3123 | 0.3322 | 0.0799 | 0.6269 | 3.7% |
| 5500 | 41.5 | 0.6669 | 0.3329 | 0.2987 | 0.3068 | 0.0975 | 0.6902 | 4.5% |
| 5500 | 81.1 | 0.6814 | 0.3184 | 0.3020 | 0.3129 | 0.0975 | 0.6902 | 4.3% |
| 5500 | 97.0 | 0.6912 | 0.3087 | 0.3058 | 0.3201 | 0.0975 | 0.6902 | 4.0% |
| 5500 | 83.5 | 0.7008 | 0.2991 | 0.3083 | 0.3247 | 0.0975 | 0.6902 | 3.9% |
| 5500 | 66.2 | 0.7086 | 0.2914 | 0.3095 | 0.3270 | 0.0975 | 0.6902 | 3.8% |
| 5500 | 54.9 | 0.7138 | 0.2862 | 0.3103 | 0.3285 | 0.0975 | 0.6902 | 3.8% |
| 5500 | 44.8 | 0.7188 | 0.2812 | 0.3110 | 0.3299 | 0.0975 | 0.6902 | 3.7% |
| 5500 | 44.4 | 0.6669 | 0.3329 | 0.2931 | 0.2962 | 0.1270 | 0.7352 | 4.8% |
| 5500 | 81.2 | 0.6814 | 0.3184 | 0.2987 | 0.3069 | 0.1270 | 0.7352 | 4.5% |
| 5500 | 96.1 | 0.6912 | 0.3087 | 0.3037 | 0.3162 | 0.1270 | 0.7352 | 4.2% |
| 5500 | 83.4 | 0.7008 | 0.2991 | 0.3063 | 0.3211 | 0.1270 | 0.7352 | 4.0% |
| 5500 | 66.6 | 0.7086 | 0.2914 | 0.3079 | 0.3240 | 0.1270 | 0.7352 | 3.9% |
| 5500 | 56.5 | 0.7138 | 0.2862 | 0.3089 | 0.3259 | 0.1270 | 0.7352 | 3.8% |
| 5500 | 49.0 | 0.7188 | 0.2812 | 0.3100 | 0.3280 | 0.1270 | 0.7352 | 3.8% |
| 5500 | 46.1 | 0.6669 | 0.3329 | 0.2874 | 0.2856 | 0.1561 | 0.7502 | 5.3% |
| 5500 | 80.9 | 0.6814 | 0.3184 | 0.2959 | 0.3015 | 0.1561 | 0.7502 | 4.7% |
| 5500 | 95.5 | 0.6912 | 0.3087 | 0.3019 | 0.3127 | 0.1561 | 0.7502 | 4.3% |
| 5500 | 83.2 | 0.7008 | 0.2991 | 0.3047 | 0.3181 | 0.1561 | 0.7502 | 4.1% |
| 5500 | 68.2 | 0.7086 | 0.2914 | 0.3067 | 0.3218 | 0.1561 | 0.7502 | 4.0% |
| 5500 | 61.0 | 0.7138 | 0.2862 | 0.3082 | 0.3246 | 0.1561 | 0.7502 | 3.9% |
| 5500 | 58.2 | 0.7188 | 0.2812 | 0.3099 | 0.3278 | 0.1561 | 0.7502 | 3.8% |
| 5500 | 47.3 | 0.6669 | 0.3329 | 0.2781 | 0.2681 | 0.1938 | 0.7479 | 6.0% |
| 5500 | 78.6 | 0.6814 | 0.3184 | 0.2922 | 0.2946 | 0.1938 | 0.7479 | 4.9% |
| 5500 | 96.2 | 0.6912 | 0.3087 | 0.2987 | 0.3069 | 0.1938 | 0.7479 | 4.5% |
| 5500 | 84.6 | 0.7008 | 0.2991 | 0.3027 | 0.3143 | 0.1938 | 0.7479 | 4.2% |
| 5500 | 75.7 | 0.7086 | 0.2914 | 0.3060 | 0.3205 | 0.1938 | 0.7479 | 4.0% |
| 5500 | 73.7 | 0.7138 | 0.2862 | 0.3084 | 0.3249 | 0.1938 | 0.7479 | 3.9% |
| 5500 | 74.1 | 0.7188 | 0.2812 | 0.3105 | 0.3290 | 0.1938 | 0.7479 | 3.8% |
| 5500 | 44.5 | 0.6669 | 0.3329 | 0.2651 | 0.2438 | 0.2329 | 0.7309 | 7.3% |
| 5500 | 76.7 | 0.6814 | 0.3184 | 0.2864 | 0.2836 | 0.2329 | 0.7309 | 5.3% |
| 5500 | 96.4 | 0.6912 | 0.3087 | 0.2943 | 0.2986 | 0.2329 | 0.7309 | 4.8% |
| 5500 | 92.3 | 0.7008 | 0.2991 | 0.3014 | 0.3119 | 0.2329 | 0.7309 | 4.3% |
| 5500 | 89.1 | 0.7086 | 0.2914 | 0.3063 | 0.3210 | 0.2329 | 0.7309 | 4.0% |
| 5500 | 88.4 | 0.7138 | 0.2862 | 0.3090 | 0.3261 | 0.2329 | 0.7309 | 3.8% |
| 5500 | 88.9 | 0.7188 | 0.2812 | 0.3113 | 0.3303 | 0.2329 | 0.7309 | 3.7% |
| 5400 | −0.8 | 0.6669 | 0.3329 | 0.4095 | 0.5146 | 0.1393 | 0.0514 | 0.4% |
| 5400 | 25.3 | 0.6814 | 0.3184 | 0.4095 | 0.5146 | 0.1393 | 0.0514 | 0.4% |
| 5400 | 45.8 | 0.6912 | 0.3087 | 0.4095 | 0.5146 | 0.1393 | 0.0514 | 0.4% |
| 5400 | 67.5 | 0.7008 | 0.2991 | 0.4095 | 0.5146 | 0.1393 | 0.0514 | 0.4% |
| 5400 | 85.8 | 0.7086 | 0.2914 | 0.4095 | 0.5146 | 0.1393 | 0.0514 | 0.4% |
| 5400 | 98.1 | 0.7138 | 0.2862 | 0.4095 | 0.5146 | 0.1393 | 0.0514 | 0.4% |
| 5400 | 88.3 | 0.7188 | 0.2812 | 0.4095 | 0.5146 | 0.1393 | 0.0514 | 0.4% |
| 5400 | 16.5 | 0.6669 | 0.3329 | 0.4091 | 0.5139 | 0.1303 | 0.0723 | 0.4% |
| 5400 | 48.5 | 0.6814 | 0.3184 | 0.4067 | 0.5092 | 0.1303 | 0.0723 | 0.4% |
| 5400 | 73.6 | 0.6912 | 0.3087 | 0.4066 | 0.5091 | 0.1303 | 0.0723 | 0.4% |
| 5400 | 96.3 | 0.7008 | 0.2991 | 0.4027 | 0.5019 | 0.1303 | 0.0723 | 0.5% |
| 5400 | 80.9 | 0.7086 | 0.2914 | 0.3988 | 0.4945 | 0.1303 | 0.0723 | 0.6% |
| 5400 | 66.3 | 0.7138 | 0.2862 | 0.3977 | 0.4925 | 0.1303 | 0.0723 | 0.6% |
| 5400 | 51.4 | 0.7188 | 0.2812 | 0.3971 | 0.4914 | 0.1303 | 0.0723 | 0.6% |
| 5400 | 17.7 | 0.6669 | 0.3329 | 0.3600 | 0.4218 | 0.1192 | 0.1046 | 1.7% |
| 5400 | 50.5 | 0.6814 | 0.3184 | 0.3598 | 0.4214 | 0.1192 | 0.1046 | 1.7% |
| 5400 | 76.9 | 0.6912 | 0.3087 | 0.3607 | 0.4231 | 0.1192 | 0.1046 | 1.6% |
| 5400 | 96.3 | 0.7008 | 0.2991 | 0.3586 | 0.4192 | 0.1192 | 0.1046 | 1.7% |
| 5400 | 78.4 | 0.7086 | 0.2914 | 0.3568 | 0.4158 | 0.1192 | 0.1046 | 1.8% |
| 5400 | 63.5 | 0.7138 | 0.2862 | 0.3565 | 0.4152 | 0.1192 | 0.1046 | 1.8% |
| 5400 | 48.3 | 0.7188 | 0.2812 | 0.3564 | 0.4151 | 0.1192 | 0.1046 | 1.8% |
| 5400 | 19.2 | 0.6669 | 0.3329 | 0.3420 | 0.3880 | 0.1082 | 0.1444 | 2.3% |
| 5400 | 53.6 | 0.6814 | 0.3184 | 0.3426 | 0.3892 | 0.1082 | 0.1444 | 2.3% |
| 5400 | 80.7 | 0.6912 | 0.3087 | 0.3433 | 0.3903 | 0.1082 | 0.1444 | 2.3% |
| 5400 | 94.6 | 0.7008 | 0.2991 | 0.3417 | 0.3874 | 0.1082 | 0.1444 | 2.3% |
| 5400 | 75.2 | 0.7086 | 0.2914 | 0.3409 | 0.3860 | 0.1082 | 0.1444 | 2.3% |
| 5400 | 60.0 | 0.7138 | 0.2862 | 0.3408 | 0.3858 | 0.1082 | 0.1444 | 2.3% |
| 5400 | 44.9 | 0.7188 | 0.2812 | 0.3408 | 0.3857 | 0.1082 | 0.1444 | 2.3% |
| 5400 | 22.2 | 0.6669 | 0.3329 | 0.3294 | 0.3644 | 0.0934 | 0.2133 | 2.8% |
| 5400 | 58.5 | 0.6814 | 0.3184 | 0.3303 | 0.3660 | 0.0934 | 0.2133 | 2.8% |
| 5400 | 85.5 | 0.6912 | 0.3087 | 0.3306 | 0.3666 | 0.0934 | 0.2133 | 2.8% |
| 5400 | 91.5 | 0.7008 | 0.2991 | 0.3298 | 0.3651 | 0.0934 | 0.2133 | 2.8% |
| 5400 | 69.8 | 0.7086 | 0.2914 | 0.3298 | 0.3651 | 0.0934 | 0.2133 | 2.8% |
| 5400 | 54.4 | 0.7138 | 0.2862 | 0.3298 | 0.3652 | 0.0934 | 0.2133 | 2.8% |
| 5400 | 40.6 | 0.7188 | 0.2812 | 0.3297 | 0.3649 | 0.0934 | 0.2133 | 2.8% |
| 5400 | 26.7 | 0.6669 | 0.3329 | 0.3210 | 0.3487 | 0.0792 | 0.3084 | 3.2% |
| 5400 | 63.8 | 0.6814 | 0.3184 | 0.3219 | 0.3502 | 0.0792 | 0.3084 | 3.2% |
| 5400 | 90.5 | 0.6912 | 0.3087 | 0.3223 | 0.3510 | 0.0792 | 0.3084 | 3.2% |
| 5400 | 85.3 | 0.7008 | 0.2991 | 0.3224 | 0.3512 | 0.0792 | 0.3084 | 3.1% |
| 5400 | 63.2 | 0.7086 | 0.2914 | 0.3226 | 0.3516 | 0.0792 | 0.3084 | 3.1% |

TABLE 2-continued

| | | | | | | | | |
|---|---|---|---|---|---|---|---|---|
| 5400 | 51.1 | 0.7138 | 0.2862 | 0.3226 | 0.3516 | 0.0792 | 0.3084 | 3.1% |
| 5400 | 39.9 | 0.7188 | 0.2812 | 0.3226 | 0.3516 | 0.0792 | 0.3084 | 3.1% |
| 5400 | 31.0 | 0.6669 | 0.3329 | 0.3153 | 0.3380 | 0.0709 | 0.4039 | 3.5% |
| 5400 | 69.6 | 0.6814 | 0.3184 | 0.3164 | 0.3401 | 0.0709 | 0.4039 | 3.4% |
| 5400 | 93.6 | 0.6912 | 0.3087 | 0.3172 | 0.3415 | 0.0709 | 0.4039 | 3.4% |
| 5400 | 81.7 | 0.7008 | 0.2991 | 0.3178 | 0.3427 | 0.0709 | 0.4039 | 3.4% |
| 5400 | 63.1 | 0.7086 | 0.2914 | 0.3183 | 0.3435 | 0.0709 | 0.4039 | 3.3% |
| 5400 | 50.7 | 0.7138 | 0.2862 | 0.3185 | 0.3440 | 0.0709 | 0.4039 | 3.3% |
| 5400 | 38.6 | 0.7188 | 0.2812 | 0.3188 | 0.3444 | 0.0709 | 0.4039 | 3.3% |
| 5400 | 34.7 | 0.6669 | 0.3329 | 0.3095 | 0.3271 | 0.0694 | 0.5232 | 3.8% |
| 5400 | 71.9 | 0.6814 | 0.3184 | 0.3114 | 0.3306 | 0.0694 | 0.5232 | 3.7% |
| 5400 | 95.8 | 0.6912 | 0.3087 | 0.3127 | 0.3331 | 0.0694 | 0.5232 | 3.6% |
| 5400 | 80.7 | 0.7008 | 0.2991 | 0.3139 | 0.3354 | 0.0694 | 0.5232 | 3.6% |
| 5400 | 63.4 | 0.7086 | 0.2914 | 0.3148 | 0.3369 | 0.0694 | 0.5232 | 3.5% |
| 5400 | 52.4 | 0.7138 | 0.2862 | 0.3153 | 0.3379 | 0.0694 | 0.5232 | 3.5% |
| 5400 | 41.7 | 0.7188 | 0.2812 | 0.3158 | 0.3388 | 0.0694 | 0.5232 | 3.5% |
| 5400 | 38.3 | 0.6669 | 0.3329 | 0.3044 | 0.3174 | 0.0799 | 0.6269 | 4.1% |
| 5400 | 78.3 | 0.6814 | 0.3184 | 0.3067 | 0.3218 | 0.0799 | 0.6269 | 4.0% |
| 5400 | 96.7 | 0.6912 | 0.3087 | 0.3095 | 0.3270 | 0.0799 | 0.6269 | 3.8% |
| 5400 | 82.3 | 0.7008 | 0.2991 | 0.3114 | 0.3306 | 0.0799 | 0.6269 | 3.7% |
| 5400 | 65.6 | 0.7086 | 0.2914 | 0.3125 | 0.3327 | 0.0799 | 0.6269 | 3.6% |
| 5400 | 54.0 | 0.7138 | 0.2862 | 0.3132 | 0.3339 | 0.0799 | 0.6269 | 3.6% |
| 5400 | 43.1 | 0.7188 | 0.2812 | 0.3138 | 0.3350 | 0.0799 | 0.6269 | 3.6% |
| 5400 | 40.5 | 0.6669 | 0.3329 | 0.3002 | 0.3097 | 0.0975 | 0.6902 | 4.4% |
| 5400 | 80.6 | 0.6814 | 0.3184 | 0.3035 | 0.3158 | 0.0975 | 0.6902 | 4.2% |
| 5400 | 96.9 | 0.6912 | 0.3087 | 0.3073 | 0.3230 | 0.0975 | 0.6902 | 3.9% |
| 5400 | 83.5 | 0.7008 | 0.2991 | 0.3098 | 0.3276 | 0.0975 | 0.6902 | 3.8% |
| 5400 | 66.0 | 0.7086 | 0.2914 | 0.3110 | 0.3299 | 0.0975 | 0.6902 | 3.7% |
| 5400 | 54.6 | 0.7138 | 0.2862 | 0.3118 | 0.3314 | 0.0975 | 0.6902 | 3.7% |
| 5400 | 44.4 | 0.7188 | 0.2812 | 0.3126 | 0.3328 | 0.0975 | 0.6902 | 3.6% |
| 5400 | 43.4 | 0.6669 | 0.3329 | 0.2946 | 0.2992 | 0.1270 | 0.7352 | 4.7% |
| 5400 | 80.7 | 0.6814 | 0.3184 | 0.3003 | 0.3097 | 0.1270 | 0.7352 | 4.4% |
| 5400 | 95.9 | 0.6912 | 0.3087 | 0.3053 | 0.3192 | 0.1270 | 0.7352 | 4.1% |
| 5400 | 83.5 | 0.7008 | 0.2991 | 0.3079 | 0.3241 | 0.1270 | 0.7352 | 3.9% |
| 5400 | 66.5 | 0.7086 | 0.2914 | 0.3095 | 0.3270 | 0.1270 | 0.7352 | 3.8% |
| 5400 | 56.3 | 0.7138 | 0.2862 | 0.3105 | 0.3290 | 0.1270 | 0.7352 | 3.8% |
| 5400 | 48.7 | 0.7188 | 0.2812 | 0.3116 | 0.3310 | 0.1270 | 0.7352 | 3.7% |
| 5400 | 45.1 | 0.6669 | 0.3329 | 0.2890 | 0.2887 | 0.1561 | 0.7502 | 5.1% |
| 5400 | 80.5 | 0.6814 | 0.3184 | 0.2974 | 0.3044 | 0.1561 | 0.7502 | 4.5% |
| 5400 | 95.2 | 0.6912 | 0.3087 | 0.3035 | 0.3158 | 0.1561 | 0.7502 | 4.2% |
| 5400 | 83.4 | 0.7008 | 0.2991 | 0.3064 | 0.3212 | 0.1561 | 0.7502 | 4.0% |
| 5400 | 68.2 | 0.7086 | 0.2914 | 0.3084 | 0.3249 | 0.1561 | 0.7502 | 3.9% |
| 5400 | 60.9 | 0.7138 | 0.2862 | 0.3099 | 0.3278 | 0.1561 | 0.7502 | 3.8% |
| 5400 | 57.9 | 0.7188 | 0.2812 | 0.3116 | 0.3309 | 0.1561 | 0.7502 | 3.7% |
| 5400 | 46.3 | 0.6669 | 0.3329 | 0.2798 | 0.2714 | 0.1938 | 0.7479 | 5.9% |
| 5400 | 78.3 | 0.6814 | 0.3184 | 0.2938 | 0.2977 | 0.1938 | 0.7479 | 4.8% |
| 5400 | 95.8 | 0.6912 | 0.3087 | 0.3005 | 0.3101 | 0.1938 | 0.7479 | 4.4% |
| 5400 | 84.8 | 0.7008 | 0.2991 | 0.3044 | 0.3175 | 0.1938 | 0.7479 | 4.1% |
| 5400 | 75.7 | 0.7086 | 0.2914 | 0.3078 | 0.3238 | 0.1938 | 0.7479 | 3.9% |
| 5400 | 73.5 | 0.7138 | 0.2862 | 0.3101 | 0.3282 | 0.1938 | 0.7479 | 3.8% |
| 5400 | 73.8 | 0.7188 | 0.2812 | 0.3123 | 0.3322 | 0.1938 | 0.7479 | 3.7% |
| 5400 | 43.7 | 0.6669 | 0.3329 | 0.2670 | 0.2473 | 0.2329 | 0.7309 | 7.1% |
| 5400 | 76.1 | 0.6814 | 0.3184 | 0.2882 | 0.2871 | 0.2329 | 0.7309 | 5.2% |
| 5400 | 96.0 | 0.6912 | 0.3087 | 0.2962 | 0.3021 | 0.2329 | 0.7309 | 4.6% |
| 5400 | 92.5 | 0.7008 | 0.2991 | 0.3033 | 0.3153 | 0.2329 | 0.7309 | 4.2% |
| 5400 | 89.1 | 0.7086 | 0.2914 | 0.3081 | 0.3244 | 0.2329 | 0.7309 | 3.9% |
| 5400 | 88.4 | 0.7138 | 0.2862 | 0.3108 | 0.3295 | 0.2329 | 0.7309 | 3.7% |
| 5400 | 88.8 | 0.7188 | 0.2812 | 0.3131 | 0.3338 | 0.2329 | 0.7309 | 3.6% |
| 5300 | −1.0 | 0.6669 | 0.3329 | 0.4095 | 0.5146 | 0.1393 | 0.0514 | 0.4% |
| 5300 | 26.1 | 0.6814 | 0.3184 | 0.4095 | 0.5146 | 0.1393 | 0.0514 | 0.4% |
| 5300 | 47.2 | 0.6912 | 0.3087 | 0.4095 | 0.5146 | 0.1393 | 0.0514 | 0.4% |
| 5300 | 69.7 | 0.7008 | 0.2991 | 0.4095 | 0.5146 | 0.1393 | 0.0514 | 0.4% |
| 5300 | 88.6 | 0.7086 | 0.2914 | 0.4095 | 0.5146 | 0.1393 | 0.0514 | 0.4% |
| 5300 | 97.6 | 0.7138 | 0.2862 | 0.4095 | 0.5146 | 0.1393 | 0.0514 | 0.4% |
| 5300 | 84.7 | 0.7188 | 0.2812 | 0.4095 | 0.5146 | 0.1393 | 0.0514 | 0.4% |
| 5300 | 15.9 | 0.6669 | 0.3329 | 0.4095 | 0.5146 | 0.1303 | 0.0723 | 0.4% |
| 5300 | 48.9 | 0.6814 | 0.3184 | 0.4079 | 0.5115 | 0.1303 | 0.0723 | 0.4% |
| 5300 | 74.6 | 0.6912 | 0.3087 | 0.4076 | 0.5111 | 0.1303 | 0.0723 | 0.4% |
| 5300 | 96.5 | 0.7008 | 0.2991 | 0.4030 | 0.5024 | 0.1303 | 0.0723 | 0.5% |
| 5300 | 78.8 | 0.7086 | 0.2914 | 0.3996 | 0.4960 | 0.1303 | 0.0723 | 0.6% |
| 5300 | 63.8 | 0.7138 | 0.2862 | 0.3985 | 0.4940 | 0.1303 | 0.0723 | 0.6% |
| 5300 | 48.6 | 0.7188 | 0.2812 | 0.3980 | 0.4929 | 0.1303 | 0.0723 | 0.6% |
| 5300 | 17.3 | 0.6669 | 0.3329 | 0.3615 | 0.4245 | 0.1192 | 0.1046 | 1.6% |
| 5300 | 50.9 | 0.6814 | 0.3184 | 0.3612 | 0.4239 | 0.1192 | 0.1046 | 1.6% |
| 5300 | 77.8 | 0.6912 | 0.3087 | 0.3620 | 0.4255 | 0.1192 | 0.1046 | 1.6% |
| 5300 | 95.9 | 0.7008 | 0.2991 | 0.3594 | 0.4206 | 0.1192 | 0.1046 | 1.7% |
| 5300 | 76.4 | 0.7086 | 0.2914 | 0.3580 | 0.4180 | 0.1192 | 0.1046 | 1.7% |
| 5300 | 61.1 | 0.7138 | 0.2862 | 0.3577 | 0.4174 | 0.1192 | 0.1046 | 1.7% |
| 5300 | 45.7 | 0.7188 | 0.2812 | 0.3576 | 0.4172 | 0.1192 | 0.1046 | 1.7% |
| 5300 | 18.8 | 0.6669 | 0.3329 | 0.3434 | 0.3906 | 0.1082 | 0.1444 | 2.2% |

TABLE 2-continued

| | | | | | | | |
|---|---|---|---|---|---|---|---|
| 5300 | 53.9 | 0.6814 | 0.3184 | 0.3440 | 0.3917 | 0.1082 | 0.1444 | 2.2% |
| 5300 | 81.4 | 0.6912 | 0.3087 | 0.3446 | 0.3928 | 0.1082 | 0.1444 | 2.2% |
| 5300 | 94.1 | 0.7008 | 0.2991 | 0.3427 | 0.3894 | 0.1082 | 0.1444 | 2.3% |
| 5300 | 73.3 | 0.7086 | 0.2914 | 0.3422 | 0.3884 | 0.1082 | 0.1444 | 2.3% |
| 5300 | 57.8 | 0.7138 | 0.2862 | 0.3421 | 0.3882 | 0.1082 | 0.1444 | 2.3% |
| 5300 | 42.8 | 0.7188 | 0.2812 | 0.3419 | 0.3878 | 0.1082 | 0.1444 | 2.3% |
| 5300 | 21.6 | 0.6669 | 0.3329 | 0.3308 | 0.3670 | 0.0934 | 0.2133 | 2.8% |
| 5300 | 58.6 | 0.6814 | 0.3184 | 0.3316 | 0.3686 | 0.0934 | 0.2133 | 2.7% |
| 5300 | 85.9 | 0.6912 | 0.3087 | 0.3319 | 0.3691 | 0.0934 | 0.2133 | 2.7% |
| 5300 | 90.5 | 0.7008 | 0.2991 | 0.3311 | 0.3675 | 0.0934 | 0.2133 | 2.7% |
| 5300 | 68.2 | 0.7086 | 0.2914 | 0.3311 | 0.3676 | 0.0934 | 0.2133 | 2.7% |
| 5300 | 52.6 | 0.7138 | 0.2862 | 0.3312 | 0.3677 | 0.0934 | 0.2133 | 2.7% |
| 5300 | 39.0 | 0.7188 | 0.2812 | 0.3309 | 0.3672 | 0.0934 | 0.2133 | 2.8% |
| 5300 | 26.0 | 0.6669 | 0.3329 | 0.3224 | 0.3513 | 0.0792 | 0.3084 | 3.1% |
| 5300 | 63.8 | 0.6814 | 0.3184 | 0.3233 | 0.3529 | 0.0792 | 0.3084 | 3.1% |
| 5300 | 90.6 | 0.6912 | 0.3087 | 0.3237 | 0.3536 | 0.0792 | 0.3084 | 3.1% |
| 5300 | 84.1 | 0.7008 | 0.2991 | 0.3238 | 0.3538 | 0.0792 | 0.3084 | 3.1% |
| 5300 | 62.7 | 0.7086 | 0.2914 | 0.3240 | 0.3542 | 0.0792 | 0.3084 | 3.1% |
| 5300 | 50.4 | 0.7138 | 0.2862 | 0.3240 | 0.3541 | 0.0792 | 0.3084 | 3.1% |
| 5300 | 39.0 | 0.7188 | 0.2812 | 0.3239 | 0.3541 | 0.0792 | 0.3084 | 3.1% |
| 5300 | 30.3 | 0.6669 | 0.3329 | 0.3168 | 0.3407 | 0.0709 | 0.4039 | 3.4% |
| 5300 | 69.6 | 0.6814 | 0.3184 | 0.3179 | 0.3427 | 0.0709 | 0.4039 | 3.4% |
| 5300 | 93.7 | 0.6912 | 0.3087 | 0.3186 | 0.3442 | 0.0709 | 0.4039 | 3.3% |
| 5300 | 81.3 | 0.7008 | 0.2991 | 0.3193 | 0.3454 | 0.0709 | 0.4039 | 3.3% |
| 5300 | 62.5 | 0.7086 | 0.2914 | 0.3197 | 0.3462 | 0.0709 | 0.4039 | 3.3% |
| 5300 | 49.8 | 0.7138 | 0.2862 | 0.3199 | 0.3466 | 0.0709 | 0.4039 | 3.3% |
| 5300 | 37.6 | 0.7188 | 0.2812 | 0.3202 | 0.3471 | 0.0709 | 0.4039 | 3.3% |
| 5300 | 33.9 | 0.6669 | 0.3329 | 0.3110 | 0.3299 | 0.0694 | 0.5232 | 3.7% |
| 5300 | 71.6 | 0.6814 | 0.3184 | 0.3129 | 0.3334 | 0.0694 | 0.5232 | 3.6% |
| 5300 | 95.7 | 0.6912 | 0.3087 | 0.3142 | 0.3359 | 0.0694 | 0.5232 | 3.6% |
| 5300 | 80.6 | 0.7008 | 0.2991 | 0.3154 | 0.3382 | 0.0694 | 0.5232 | 3.5% |
| 5300 | 63.1 | 0.7086 | 0.2914 | 0.3163 | 0.3397 | 0.0694 | 0.5232 | 3.5% |
| 5300 | 51.9 | 0.7138 | 0.2862 | 0.3168 | 0.3407 | 0.0694 | 0.5232 | 3.4% |
| 5300 | 41.1 | 0.7188 | 0.2812 | 0.3172 | 0.3416 | 0.0694 | 0.5232 | 3.4% |
| 5300 | 37.4 | 0.6669 | 0.3329 | 0.3059 | 0.3202 | 0.0799 | 0.6269 | 4.0% |
| 5300 | 77.7 | 0.6814 | 0.3184 | 0.3083 | 0.3247 | 0.0799 | 0.6269 | 3.9% |
| 5300 | 96.6 | 0.6912 | 0.3087 | 0.3110 | 0.3298 | 0.0799 | 0.6269 | 3.7% |
| 5300 | 82.2 | 0.7008 | 0.2991 | 0.3129 | 0.3335 | 0.0799 | 0.6269 | 3.6% |
| 5300 | 65.3 | 0.7086 | 0.2914 | 0.3141 | 0.3356 | 0.0799 | 0.6269 | 3.6% |
| 5300 | 53.6 | 0.7138 | 0.2862 | 0.3147 | 0.3369 | 0.0799 | 0.6269 | 3.5% |
| 5300 | 42.6 | 0.7188 | 0.2812 | 0.3153 | 0.3380 | 0.0799 | 0.6269 | 3.5% |
| 5300 | 39.5 | 0.6669 | 0.3329 | 0.3018 | 0.3126 | 0.0975 | 0.6902 | 4.3% |
| 5300 | 80.1 | 0.6814 | 0.3184 | 0.3051 | 0.3187 | 0.0975 | 0.6902 | 4.1% |
| 5300 | 96.7 | 0.6912 | 0.3087 | 0.3089 | 0.3260 | 0.0975 | 0.6902 | 3.8% |
| 5300 | 83.4 | 0.7008 | 0.2991 | 0.3114 | 0.3306 | 0.0975 | 0.6902 | 3.7% |
| 5300 | 65.8 | 0.7086 | 0.2914 | 0.3126 | 0.3329 | 0.0975 | 0.6902 | 3.6% |
| 5300 | 54.3 | 0.7138 | 0.2862 | 0.3134 | 0.3344 | 0.0975 | 0.6902 | 3.6% |
| 5300 | 44.0 | 0.7188 | 0.2812 | 0.3142 | 0.3358 | 0.0975 | 0.6902 | 3.6% |
| 5300 | 42.3 | 0.6669 | 0.3329 | 0.2963 | 0.3023 | 0.1270 | 0.7352 | 4.6% |
| 5300 | 80.2 | 0.6814 | 0.3184 | 0.3019 | 0.3127 | 0.1270 | 0.7352 | 4.3% |
| 5300 | 95.7 | 0.6912 | 0.3087 | 0.3069 | 0.3222 | 0.1270 | 0.7352 | 4.0% |
| 5300 | 83.5 | 0.7008 | 0.2991 | 0.3096 | 0.3272 | 0.1270 | 0.7352 | 3.8% |
| 5300 | 66.4 | 0.7086 | 0.2914 | 0.3111 | 0.3301 | 0.1270 | 0.7352 | 3.7% |
| 5300 | 56.1 | 0.7138 | 0.2862 | 0.3122 | 0.3321 | 0.1270 | 0.7352 | 3.7% |
| 5300 | 48.3 | 0.7188 | 0.2812 | 0.3133 | 0.3341 | 0.1270 | 0.7352 | 3.6% |
| 5300 | 44.1 | 0.6669 | 0.3329 | 0.2907 | 0.2919 | 0.1561 | 0.7502 | 5.0% |
| 5300 | 80.0 | 0.6814 | 0.3184 | 0.2991 | 0.3075 | 0.1561 | 0.7502 | 4.4% |
| 5300 | 94.9 | 0.6912 | 0.3087 | 0.3052 | 0.3190 | 0.1561 | 0.7502 | 4.1% |
| 5300 | 83.6 | 0.7008 | 0.2991 | 0.3081 | 0.3244 | 0.1561 | 0.7502 | 3.9% |
| 5300 | 68.2 | 0.7086 | 0.2914 | 0.3101 | 0.3282 | 0.1561 | 0.7502 | 3.8% |
| 5300 | 60.7 | 0.7138 | 0.2862 | 0.3116 | 0.3310 | 0.1561 | 0.7502 | 3.7% |
| 5300 | 57.5 | 0.7188 | 0.2812 | 0.3133 | 0.3341 | 0.1561 | 0.7502 | 3.6% |
| 5300 | 45.2 | 0.6669 | 0.3329 | 0.2817 | 0.2748 | 0.1938 | 0.7479 | 5.7% |
| 5300 | 77.9 | 0.6814 | 0.3184 | 0.2955 | 0.3008 | 0.1938 | 0.7479 | 4.7% |
| 5300 | 95.4 | 0.6912 | 0.3087 | 0.3023 | 0.3135 | 0.1938 | 0.7479 | 4.2% |
| 5300 | 85.1 | 0.7008 | 0.2991 | 0.3062 | 0.3209 | 0.1938 | 0.7479 | 4.0% |
| 5300 | 75.7 | 0.7086 | 0.2914 | 0.3096 | 0.3272 | 0.1938 | 0.7479 | 3.8% |
| 5300 | 73.4 | 0.7138 | 0.2862 | 0.3119 | 0.3315 | 0.1938 | 0.7479 | 3.7% |
| 5300 | 73.6 | 0.7188 | 0.2812 | 0.3140 | 0.3356 | 0.1938 | 0.7479 | 3.6% |
| 5300 | 42.8 | 0.6669 | 0.3329 | 0.2689 | 0.2509 | 0.2329 | 0.7309 | 6.9% |
| 5300 | 75.6 | 0.6814 | 0.3184 | 0.2902 | 0.2908 | 0.2329 | 0.7309 | 5.1% |
| 5300 | 95.6 | 0.6912 | 0.3087 | 0.2981 | 0.3057 | 0.2329 | 0.7309 | 4.5% |
| 5300 | 92.7 | 0.7008 | 0.2991 | 0.3052 | 0.3189 | 0.2329 | 0.7309 | 4.1% |
| 5300 | 89.1 | 0.7086 | 0.2914 | 0.3100 | 0.3280 | 0.2329 | 0.7309 | 3.8% |
| 5300 | 88.4 | 0.7138 | 0.2862 | 0.3127 | 0.3331 | 0.2329 | 0.7309 | 3.6% |
| 5300 | 88.7 | 0.7188 | 0.2812 | 0.3150 | 0.3373 | 0.2329 | 0.7309 | 3.5% |
| 5200 | −1.2 | 0.6669 | 0.3329 | 0.4095 | 0.5146 | 0.1393 | 0.0514 | 0.4% |
| 5200 | 26.9 | 0.6814 | 0.3184 | 0.4095 | 0.5146 | 0.1393 | 0.0514 | 0.4% |
| 5200 | 48.7 | 0.6912 | 0.3087 | 0.4095 | 0.5146 | 0.1393 | 0.0514 | 0.4% |
| 5200 | 71.9 | 0.7008 | 0.2991 | 0.4095 | 0.5146 | 0.1393 | 0.0514 | 0.4% |

TABLE 2-continued

| | | | | | | | | |
|---|---|---|---|---|---|---|---|---|
| 5200 | 91.5 | 0.7086 | 0.2914 | 0.4095 | 0.5146 | 0.1393 | 0.0514 | 0.4% |
| 5200 | 94.6 | 0.7138 | 0.2862 | 0.4095 | 0.5146 | 0.1393 | 0.0514 | 0.4% |
| 5200 | 81.0 | 0.7188 | 0.2812 | 0.4095 | 0.5146 | 0.1393 | 0.0514 | 0.4% |
| 5200 | 15.2 | 0.6669 | 0.3329 | 0.4095 | 0.5146 | 0.1303 | 0.0723 | 0.4% |
| 5200 | 49.3 | 0.6814 | 0.3184 | 0.4091 | 0.5138 | 0.1303 | 0.0723 | 0.4% |
| 5200 | 75.5 | 0.6912 | 0.3087 | 0.4087 | 0.5130 | 0.1303 | 0.0723 | 0.4% |
| 5200 | 96.3 | 0.7008 | 0.2991 | 0.4034 | 0.5031 | 0.1303 | 0.0723 | 0.5% |
| 5200 | 76.8 | 0.7086 | 0.2914 | 0.4004 | 0.4975 | 0.1303 | 0.0723 | 0.6% |
| 5200 | 61.4 | 0.7138 | 0.2862 | 0.3993 | 0.4954 | 0.1303 | 0.0723 | 0.6% |
| 5200 | 45.8 | 0.7188 | 0.2812 | 0.3986 | 0.4942 | 0.1303 | 0.0723 | 0.6% |
| 5200 | 16.9 | 0.6669 | 0.3329 | 0.3629 | 0.4271 | 0.1192 | 0.1046 | 1.6% |
| 5200 | 51.3 | 0.6814 | 0.3184 | 0.3626 | 0.4265 | 0.1192 | 0.1046 | 1.6% |
| 5200 | 78.6 | 0.6912 | 0.3087 | 0.3633 | 0.4278 | 0.1192 | 0.1046 | 1.6% |
| 5200 | 95.2 | 0.7008 | 0.2991 | 0.3603 | 0.4223 | 0.1192 | 0.1046 | 1.7% |
| 5200 | 74.4 | 0.7086 | 0.2914 | 0.3592 | 0.4203 | 0.1192 | 0.1046 | 1.7% |
| 5200 | 58.8 | 0.7138 | 0.2862 | 0.3589 | 0.4197 | 0.1192 | 0.1046 | 1.7% |
| 5200 | 43.4 | 0.7188 | 0.2812 | 0.3585 | 0.4189 | 0.1192 | 0.1046 | 1.7% |
| 5200 | 18.3 | 0.6669 | 0.3329 | 0.3448 | 0.3932 | 0.1082 | 0.1444 | 2.2% |
| 5200 | 54.2 | 0.6814 | 0.3184 | 0.3454 | 0.3943 | 0.1082 | 0.1444 | 2.2% |
| 5200 | 82.0 | 0.6912 | 0.3087 | 0.3459 | 0.3952 | 0.1082 | 0.1444 | 2.2% |
| 5200 | 93.2 | 0.7008 | 0.2991 | 0.3439 | 0.3915 | 0.1082 | 0.1444 | 2.2% |
| 5200 | 71.4 | 0.7086 | 0.2914 | 0.3435 | 0.3908 | 0.1082 | 0.1444 | 2.2% |
| 5200 | 55.7 | 0.7138 | 0.2862 | 0.3434 | 0.3906 | 0.1082 | 0.1444 | 2.2% |
| 5200 | 40.9 | 0.7188 | 0.2812 | 0.3430 | 0.3899 | 0.1082 | 0.1444 | 2.3% |
| 5200 | 21.1 | 0.6669 | 0.3329 | 0.3322 | 0.3696 | 0.0934 | 0.2133 | 2.7% |
| 5200 | 58.7 | 0.6814 | 0.3184 | 0.3331 | 0.3712 | 0.0934 | 0.2133 | 2.7% |
| 5200 | 86.3 | 0.6912 | 0.3087 | 0.3333 | 0.3716 | 0.0934 | 0.2133 | 2.7% |
| 5200 | 89.3 | 0.7008 | 0.2991 | 0.3325 | 0.3701 | 0.0934 | 0.2133 | 2.7% |
| 5200 | 66.4 | 0.7086 | 0.2914 | 0.3325 | 0.3702 | 0.0934 | 0.2133 | 2.7% |
| 5200 | 50.8 | 0.7138 | 0.2862 | 0.3325 | 0.3702 | 0.0934 | 0.2133 | 2.7% |
| 5200 | 37.3 | 0.7188 | 0.2812 | 0.3322 | 0.3696 | 0.0934 | 0.2133 | 2.7% |
| 5200 | 25.3 | 0.6669 | 0.3329 | 0.3239 | 0.3540 | 0.0792 | 0.3084 | 3.1% |
| 5200 | 63.7 | 0.6814 | 0.3184 | 0.3247 | 0.3556 | 0.0792 | 0.3084 | 3.0% |
| 5200 | 90.9 | 0.6912 | 0.3087 | 0.3251 | 0.3563 | 0.0792 | 0.3084 | 3.0% |
| 5200 | 83.0 | 0.7008 | 0.2991 | 0.3252 | 0.3565 | 0.0792 | 0.3084 | 3.0% |
| 5200 | 62.2 | 0.7086 | 0.2914 | 0.3253 | 0.3567 | 0.0792 | 0.3084 | 3.0% |
| 5200 | 49.7 | 0.7138 | 0.2862 | 0.3253 | 0.3567 | 0.0792 | 0.3084 | 3.0% |
| 5200 | 37.9 | 0.7188 | 0.2812 | 0.3253 | 0.3566 | 0.0792 | 0.3084 | 3.0% |
| 5200 | 29.5 | 0.6669 | 0.3329 | 0.3182 | 0.3434 | 0.0709 | 0.4039 | 3.4% |
| 5200 | 68.8 | 0.6814 | 0.3184 | 0.3194 | 0.3456 | 0.0709 | 0.4039 | 3.3% |
| 5200 | 93.9 | 0.6912 | 0.3087 | 0.3201 | 0.3469 | 0.0709 | 0.4039 | 3.3% |
| 5200 | 81.0 | 0.7008 | 0.2991 | 0.3207 | 0.3481 | 0.0709 | 0.4039 | 3.2% |
| 5200 | 61.8 | 0.7086 | 0.2914 | 0.3212 | 0.3489 | 0.0709 | 0.4039 | 3.2% |
| 5200 | 49.0 | 0.7138 | 0.2862 | 0.3214 | 0.3494 | 0.0709 | 0.4039 | 3.2% |
| 5200 | 37.0 | 0.7188 | 0.2812 | 0.3216 | 0.3498 | 0.0709 | 0.4039 | 3.2% |
| 5200 | 33.1 | 0.6669 | 0.3329 | 0.3125 | 0.3327 | 0.0694 | 0.5232 | 3.7% |
| 5200 | 71.3 | 0.6814 | 0.3184 | 0.3144 | 0.3362 | 0.0694 | 0.5232 | 3.5% |
| 5200 | 95.7 | 0.6912 | 0.3087 | 0.3157 | 0.3387 | 0.0694 | 0.5232 | 3.5% |
| 5200 | 80.5 | 0.7008 | 0.2991 | 0.3170 | 0.3411 | 0.0694 | 0.5232 | 3.4% |
| 5200 | 62.8 | 0.7086 | 0.2914 | 0.3178 | 0.3426 | 0.0694 | 0.5232 | 3.4% |
| 5200 | 51.4 | 0.7138 | 0.2862 | 0.3183 | 0.3436 | 0.0694 | 0.5232 | 3.3% |
| 5200 | 40.4 | 0.7188 | 0.2812 | 0.3188 | 0.3445 | 0.0694 | 0.5232 | 3.3% |
| 5200 | 36.4 | 0.6669 | 0.3329 | 0.3074 | 0.3231 | 0.0799 | 0.6269 | 3.9% |
| 5200 | 77.1 | 0.6814 | 0.3184 | 0.3099 | 0.3277 | 0.0799 | 0.6269 | 3.8% |
| 5200 | 96.5 | 0.6912 | 0.3087 | 0.3126 | 0.3328 | 0.0799 | 0.6269 | 3.6% |
| 5200 | 82.1 | 0.7008 | 0.2991 | 0.3145 | 0.3365 | 0.0799 | 0.6269 | 3.5% |
| 5200 | 65.0 | 0.7086 | 0.2914 | 0.3157 | 0.3386 | 0.0799 | 0.6269 | 3.5% |
| 5200 | 53.1 | 0.7138 | 0.2862 | 0.3163 | 0.3399 | 0.0799 | 0.6269 | 3.4% |
| 5200 | 42.0 | 0.7188 | 0.2812 | 0.3169 | 0.3410 | 0.0799 | 0.6269 | 3.4% |
| 5200 | 38.5 | 0.6669 | 0.3329 | 0.3034 | 0.3156 | 0.0975 | 0.6902 | 4.2% |
| 5200 | 79.5 | 0.6814 | 0.3184 | 0.3067 | 0.3218 | 0.0975 | 0.6902 | 4.0% |
| 5200 | 96.6 | 0.6912 | 0.3087 | 0.3105 | 0.3290 | 0.0975 | 0.6902 | 3.8% |
| 5200 | 83.4 | 0.7008 | 0.2991 | 0.3130 | 0.3336 | 0.0975 | 0.6902 | 3.6% |
| 5200 | 65.6 | 0.7086 | 0.2914 | 0.3143 | 0.3360 | 0.0975 | 0.6902 | 3.6% |
| 5200 | 54.0 | 0.7138 | 0.2862 | 0.3151 | 0.3375 | 0.0975 | 0.6902 | 3.5% |
| 5200 | 43.6 | 0.7188 | 0.2812 | 0.3158 | 0.3389 | 0.0975 | 0.6902 | 3.5% |
| 5200 | 41.2 | 0.6669 | 0.3329 | 0.2980 | 0.3055 | 0.1270 | 0.7352 | 4.5% |
| 5200 | 79.7 | 0.6814 | 0.3184 | 0.3035 | 0.3158 | 0.1270 | 0.7352 | 4.2% |
| 5200 | 95.5 | 0.6912 | 0.3087 | 0.3086 | 0.3254 | 0.1270 | 0.7352 | 3.9% |
| 5200 | 83.6 | 0.7008 | 0.2991 | 0.3113 | 0.3304 | 0.1270 | 0.7352 | 3.7% |
| 5200 | 66.3 | 0.7086 | 0.2914 | 0.3129 | 0.3334 | 0.1270 | 0.7352 | 3.6% |
| 5200 | 55.9 | 0.7138 | 0.2862 | 0.3139 | 0.3353 | 0.1270 | 0.7352 | 3.6% |
| 5200 | 47.9 | 0.7188 | 0.2812 | 0.3150 | 0.3374 | 0.1270 | 0.7352 | 3.5% |
| 5200 | 43.0 | 0.6669 | 0.3329 | 0.2925 | 0.2952 | 0.1561 | 0.7502 | 4.9% |
| 5200 | 79.5 | 0.6814 | 0.3184 | 0.3008 | 0.3107 | 0.1561 | 0.7502 | 4.3% |
| 5200 | 94.6 | 0.6912 | 0.3087 | 0.3069 | 0.3222 | 0.1561 | 0.7502 | 4.0% |
| 5200 | 83.8 | 0.7008 | 0.2991 | 0.3099 | 0.3277 | 0.1561 | 0.7502 | 3.8% |
| 5200 | 68.2 | 0.7086 | 0.2914 | 0.3119 | 0.3315 | 0.1561 | 0.7502 | 3.7% |
| 5200 | 60.5 | 0.7138 | 0.2862 | 0.3134 | 0.3343 | 0.1561 | 0.7502 | 3.6% |
| 5200 | 57.1 | 0.7188 | 0.2812 | 0.3150 | 0.3374 | 0.1561 | 0.7502 | 3.5% |

TABLE 2-continued

| | | | | | | | | |
|---|---|---|---|---|---|---|---|---|
| 5200 | 44.1 | 0.6669 | 0.3329 | 0.2836 | 0.2784 | 0.1938 | 0.7479 | 5.6% |
| 5200 | 77.5 | 0.6814 | 0.3184 | 0.2973 | 0.3041 | 0.1938 | 0.7479 | 4.6% |
| 5200 | 94.9 | 0.6912 | 0.3087 | 0.3041 | 0.3170 | 0.1938 | 0.7479 | 4.1% |
| 5200 | 85.3 | 0.7008 | 0.2991 | 0.3081 | 0.3244 | 0.1938 | 0.7479 | 3.9% |
| 5200 | 75.7 | 0.7086 | 0.2914 | 0.3114 | 0.3307 | 0.1938 | 0.7479 | 3.7% |
| 5200 | 73.2 | 0.7138 | 0.2862 | 0.3137 | 0.3350 | 0.1938 | 0.7479 | 3.6% |
| 5200 | 73.3 | 0.7188 | 0.2812 | 0.3159 | 0.3390 | 0.1938 | 0.7479 | 3.5% |
| 5200 | 41.8 | 0.6669 | 0.3329 | 0.2709 | 0.2547 | 0.2329 | 0.7309 | 6.7% |
| 5200 | 75.0 | 0.6814 | 0.3184 | 0.2922 | 0.2945 | 0.2329 | 0.7309 | 4.9% |
| 5200 | 95.1 | 0.6912 | 0.3087 | 0.3002 | 0.3095 | 0.2329 | 0.7309 | 4.4% |
| 5200 | 92.9 | 0.7008 | 0.2991 | 0.3072 | 0.3226 | 0.2329 | 0.7309 | 3.9% |
| 5200 | 89.1 | 0.7086 | 0.2914 | 0.3120 | 0.3317 | 0.2329 | 0.7309 | 3.7% |
| 5200 | 88.3 | 0.7138 | 0.2862 | 0.3147 | 0.3367 | 0.2329 | 0.7309 | 3.5% |
| 5200 | 88.6 | 0.7188 | 0.2812 | 0.3169 | 0.3410 | 0.2329 | 0.7309 | 3.4% |
| 5100 | −1.3 | 0.6669 | 0.3329 | 0.4095 | 0.5146 | 0.1393 | 0.0514 | 0.4% |
| 5100 | 27.7 | 0.6814 | 0.3184 | 0.4095 | 0.5146 | 0.1393 | 0.0514 | 0.4% |
| 5100 | 50.3 | 0.6912 | 0.3087 | 0.4095 | 0.5146 | 0.1393 | 0.0514 | 0.4% |
| 5100 | 74.3 | 0.7008 | 0.2991 | 0.4095 | 0.5146 | 0.1393 | 0.0514 | 0.4% |
| 5100 | 94.4 | 0.7086 | 0.2914 | 0.4095 | 0.5146 | 0.1393 | 0.0514 | 0.4% |
| 5100 | 91.2 | 0.7138 | 0.2862 | 0.4095 | 0.5146 | 0.1393 | 0.0514 | 0.4% |
| 5100 | 77.1 | 0.7188 | 0.2812 | 0.4095 | 0.5146 | 0.1393 | 0.0514 | 0.4% |
| 5100 | 14.5 | 0.6669 | 0.3329 | 0.4095 | 0.5146 | 0.1303 | 0.0723 | 0.4% |
| 5100 | 49.4 | 0.6814 | 0.3184 | 0.4095 | 0.5146 | 0.1303 | 0.0723 | 0.4% |
| 5100 | 76.5 | 0.6912 | 0.3087 | 0.4095 | 0.5146 | 0.1303 | 0.0723 | 0.4% |
| 5100 | 95.6 | 0.7008 | 0.2991 | 0.4039 | 0.5040 | 0.1303 | 0.0723 | 0.5% |
| 5100 | 74.7 | 0.7086 | 0.2914 | 0.4011 | 0.4988 | 0.1303 | 0.0723 | 0.6% |
| 5100 | 58.9 | 0.7138 | 0.2862 | 0.3999 | 0.4966 | 0.1303 | 0.0723 | 0.6% |
| 5100 | 43.7 | 0.7188 | 0.2812 | 0.3981 | 0.4931 | 0.1303 | 0.0723 | 0.6% |
| 5100 | 16.4 | 0.6669 | 0.3329 | 0.3643 | 0.4299 | 0.1192 | 0.1046 | 1.5% |
| 5100 | 51.6 | 0.6814 | 0.3184 | 0.3639 | 0.4291 | 0.1192 | 0.1046 | 1.5% |
| 5100 | 79.4 | 0.6912 | 0.3087 | 0.3645 | 0.4302 | 0.1192 | 0.1046 | 1.5% |
| 5100 | 94.2 | 0.7008 | 0.2991 | 0.3613 | 0.4242 | 0.1192 | 0.1046 | 1.6% |
| 5100 | 72.4 | 0.7086 | 0.2914 | 0.3604 | 0.4225 | 0.1192 | 0.1046 | 1.7% |
| 5100 | 56.4 | 0.7138 | 0.2862 | 0.3600 | 0.4218 | 0.1192 | 0.1046 | 1.7% |
| 5100 | 41.5 | 0.7188 | 0.2812 | 0.3592 | 0.4202 | 0.1192 | 0.1046 | 1.7% |
| 5100 | 17.8 | 0.6669 | 0.3329 | 0.3462 | 0.3959 | 0.1082 | 0.1444 | 2.1% |
| 5100 | 54.4 | 0.6814 | 0.3184 | 0.3468 | 0.3970 | 0.1082 | 0.1444 | 2.1% |
| 5100 | 82.6 | 0.6912 | 0.3087 | 0.3472 | 0.3977 | 0.1082 | 0.1444 | 2.1% |
| 5100 | 92.1 | 0.7008 | 0.2991 | 0.3452 | 0.3939 | 0.1082 | 0.1444 | 2.2% |
| 5100 | 69.5 | 0.7086 | 0.2914 | 0.3448 | 0.3933 | 0.1082 | 0.1444 | 2.2% |
| 5100 | 53.5 | 0.7138 | 0.2862 | 0.3447 | 0.3930 | 0.1082 | 0.1444 | 2.2% |
| 5100 | 39.0 | 0.7188 | 0.2812 | 0.3441 | 0.3919 | 0.1082 | 0.1444 | 2.2% |
| 5100 | 20.5 | 0.6669 | 0.3329 | 0.3337 | 0.3723 | 0.0934 | 0.2133 | 2.6% |
| 5100 | 58.8 | 0.6814 | 0.3184 | 0.3345 | 0.3739 | 0.0934 | 0.2133 | 2.6% |
| 5100 | 86.6 | 0.6912 | 0.3087 | 0.3346 | 0.3742 | 0.0934 | 0.2133 | 2.6% |
| 5100 | 88.1 | 0.7008 | 0.2991 | 0.3339 | 0.3728 | 0.0934 | 0.2133 | 2.6% |
| 5100 | 64.7 | 0.7086 | 0.2914 | 0.3339 | 0.3729 | 0.0934 | 0.2133 | 2.6% |
| 5100 | 49.1 | 0.7138 | 0.2862 | 0.3338 | 0.3727 | 0.0934 | 0.2133 | 2.6% |
| 5100 | 35.7 | 0.7188 | 0.2812 | 0.3335 | 0.3720 | 0.0934 | 0.2133 | 2.6% |
| 5100 | 24.6 | 0.6669 | 0.3329 | 0.3254 | 0.3568 | 0.0792 | 0.3084 | 3.0% |
| 5100 | 63.7 | 0.6814 | 0.3184 | 0.3262 | 0.3584 | 0.0792 | 0.3084 | 3.0% |
| 5100 | 91.1 | 0.6912 | 0.3087 | 0.3266 | 0.3590 | 0.0792 | 0.3084 | 3.0% |
| 5100 | 82.0 | 0.7008 | 0.2991 | 0.3267 | 0.3593 | 0.0792 | 0.3084 | 2.9% |
| 5100 | 61.5 | 0.7086 | 0.2914 | 0.3268 | 0.3594 | 0.0792 | 0.3084 | 2.9% |
| 5100 | 48.9 | 0.7138 | 0.2862 | 0.3267 | 0.3593 | 0.0792 | 0.3084 | 2.9% |
| 5100 | 36.7 | 0.7188 | 0.2812 | 0.3267 | 0.3592 | 0.0792 | 0.3084 | 2.9% |
| 5100 | 28.7 | 0.6669 | 0.3329 | 0.3198 | 0.3463 | 0.0709 | 0.4039 | 3.3% |
| 5100 | 68.1 | 0.6814 | 0.3184 | 0.3209 | 0.3485 | 0.0709 | 0.4039 | 3.2% |
| 5100 | 94.0 | 0.6912 | 0.3087 | 0.3216 | 0.3498 | 0.0709 | 0.4039 | 3.2% |
| 5100 | 80.7 | 0.7008 | 0.2991 | 0.3223 | 0.3510 | 0.0709 | 0.4039 | 3.2% |
| 5100 | 61.2 | 0.7086 | 0.2914 | 0.3227 | 0.3517 | 0.0709 | 0.4039 | 3.1% |
| 5100 | 48.3 | 0.7138 | 0.2862 | 0.3229 | 0.3522 | 0.0709 | 0.4039 | 3.1% |
| 5100 | 36.4 | 0.7188 | 0.2812 | 0.3231 | 0.3526 | 0.0709 | 0.4039 | 3.1% |
| 5100 | 32.2 | 0.6669 | 0.3329 | 0.3141 | 0.3356 | 0.0694 | 0.5232 | 3.6% |
| 5100 | 71.0 | 0.6814 | 0.3184 | 0.3160 | 0.3392 | 0.0694 | 0.5232 | 3.5% |
| 5100 | 95.7 | 0.6912 | 0.3087 | 0.3173 | 0.3417 | 0.0694 | 0.5232 | 3.4% |
| 5100 | 80.3 | 0.7008 | 0.2991 | 0.3186 | 0.3440 | 0.0694 | 0.5232 | 3.3% |
| 5100 | 62.4 | 0.7086 | 0.2914 | 0.3194 | 0.3456 | 0.0694 | 0.5232 | 3.3% |
| 5100 | 50.8 | 0.7138 | 0.2862 | 0.3199 | 0.3466 | 0.0694 | 0.5232 | 3.3% |
| 5100 | 39.7 | 0.7188 | 0.2812 | 0.3204 | 0.3474 | 0.0694 | 0.5232 | 3.2% |
| 5100 | 35.4 | 0.6669 | 0.3329 | 0.3090 | 0.3262 | 0.0799 | 0.6269 | 3.8% |
| 5100 | 76.5 | 0.6814 | 0.3184 | 0.3115 | 0.3308 | 0.0799 | 0.6269 | 3.7% |
| 5100 | 96.4 | 0.6912 | 0.3087 | 0.3142 | 0.3359 | 0.0799 | 0.6269 | 3.6% |
| 5100 | 82.0 | 0.7008 | 0.2991 | 0.3162 | 0.3396 | 0.0799 | 0.6269 | 3.5% |
| 5100 | 64.6 | 0.7086 | 0.2914 | 0.3173 | 0.3417 | 0.0799 | 0.6269 | 3.4% |
| 5100 | 52.7 | 0.7138 | 0.2862 | 0.3180 | 0.3430 | 0.0799 | 0.6269 | 3.4% |
| 5100 | 41.5 | 0.7188 | 0.2812 | 0.3186 | 0.3441 | 0.0799 | 0.6269 | 3.3% |
| 5100 | 37.4 | 0.6669 | 0.3329 | 0.3051 | 0.3188 | 0.0975 | 0.6902 | 4.1% |
| 5100 | 78.9 | 0.6814 | 0.3184 | 0.3084 | 0.3249 | 0.0975 | 0.6902 | 3.9% |
| 5100 | 96.4 | 0.6912 | 0.3087 | 0.3122 | 0.3322 | 0.0975 | 0.6902 | 3.7% |

TABLE 2-continued

| | | | | | | | | |
|---|---|---|---|---|---|---|---|---|
| 5100 | 83.4 | 0.7008 | 0.2991 | 0.3147 | 0.3368 | 0.0975 | 0.6902 | 3.5% |
| 5100 | 65.4 | 0.7086 | 0.2914 | 0.3160 | 0.3392 | 0.0975 | 0.6902 | 3.5% |
| 5100 | 53.6 | 0.7138 | 0.2862 | 0.3168 | 0.3407 | 0.0975 | 0.6902 | 3.4% |
| 5100 | 43.1 | 0.7188 | 0.2812 | 0.3176 | 0.3421 | 0.0975 | 0.6902 | 3.4% |
| 5100 | 40.0 | 0.6669 | 0.3329 | 0.2998 | 0.3088 | 0.1270 | 0.7352 | 4.4% |
| 5100 | 79.2 | 0.6814 | 0.3184 | 0.3052 | 0.3191 | 0.1270 | 0.7352 | 4.1% |
| 5100 | 95.2 | 0.6912 | 0.3087 | 0.3103 | 0.3286 | 0.1270 | 0.7352 | 3.8% |
| 5100 | 83.7 | 0.7008 | 0.2991 | 0.3131 | 0.3337 | 0.1270 | 0.7352 | 3.6% |
| 5100 | 66.3 | 0.7086 | 0.2914 | 0.3146 | 0.3367 | 0.1270 | 0.7352 | 3.5% |
| 5100 | 55.7 | 0.7138 | 0.2862 | 0.3157 | 0.3387 | 0.1270 | 0.7352 | 3.5% |
| 5100 | 47.6 | 0.7188 | 0.2812 | 0.3168 | 0.3407 | 0.1270 | 0.7352 | 3.4% |
| 5100 | 41.8 | 0.6669 | 0.3329 | 0.2943 | 0.2986 | 0.1561 | 0.7502 | 4.8% |
| 5100 | 78.9 | 0.6814 | 0.3184 | 0.3026 | 0.3140 | 0.1561 | 0.7502 | 4.2% |
| 5100 | 94.3 | 0.6912 | 0.3087 | 0.3087 | 0.3256 | 0.1561 | 0.7502 | 3.9% |
| 5100 | 84.0 | 0.7008 | 0.2991 | 0.3117 | 0.3312 | 0.1561 | 0.7502 | 3.7% |
| 5100 | 68.2 | 0.7086 | 0.2914 | 0.3137 | 0.3350 | 0.1561 | 0.7502 | 3.6% |
| 5100 | 60.3 | 0.7138 | 0.2862 | 0.3152 | 0.3378 | 0.1561 | 0.7502 | 3.5% |
| 5100 | 56.7 | 0.7188 | 0.2812 | 0.3169 | 0.3409 | 0.1561 | 0.7502 | 3.4% |
| 5100 | 43.0 | 0.6669 | 0.3329 | 0.2855 | 0.2821 | 0.1938 | 0.7479 | 5.4% |
| 5100 | 77.1 | 0.6814 | 0.3184 | 0.2991 | 0.3075 | 0.1938 | 0.7479 | 4.4% |
| 5100 | 94.5 | 0.6912 | 0.3087 | 0.3061 | 0.3206 | 0.1938 | 0.7479 | 4.0% |
| 5100 | 85.6 | 0.7008 | 0.2991 | 0.3100 | 0.3281 | 0.1938 | 0.7479 | 3.8% |
| 5100 | 75.7 | 0.7086 | 0.2914 | 0.3133 | 0.3343 | 0.1938 | 0.7479 | 3.6% |
| 5100 | 73.0 | 0.7138 | 0.2862 | 0.3157 | 0.3386 | 0.1938 | 0.7479 | 3.5% |
| 5100 | 72.9 | 0.7188 | 0.2812 | 0.3178 | 0.3426 | 0.1938 | 0.7479 | 3.4% |
| 5100 | 40.8 | 0.6669 | 0.3329 | 0.2730 | 0.2586 | 0.2329 | 0.7309 | 6.5% |
| 5100 | 74.3 | 0.6814 | 0.3184 | 0.2942 | 0.2984 | 0.2329 | 0.7309 | 4.8% |
| 5100 | 94.6 | 0.6912 | 0.3087 | 0.3022 | 0.3134 | 0.2329 | 0.7309 | 4.2% |
| 5100 | 93.0 | 0.7008 | 0.2991 | 0.3092 | 0.3265 | 0.2329 | 0.7309 | 3.8% |
| 5100 | 89.2 | 0.7086 | 0.2914 | 0.3140 | 0.3355 | 0.2329 | 0.7309 | 3.6% |
| 5100 | 88.2 | 0.7138 | 0.2862 | 0.3167 | 0.3405 | 0.2329 | 0.7309 | 3.4% |
| 5100 | 88.4 | 0.7188 | 0.2812 | 0.3190 | 0.3448 | 0.2329 | 0.7309 | 3.3% |
| 5000 | −1.5 | 0.6669 | 0.3329 | 0.4095 | 0.5146 | 0.1393 | 0.0514 | 0.4% |
| 5000 | 28.5 | 0.6814 | 0.3184 | 0.4095 | 0.5146 | 0.1393 | 0.0514 | 0.4% |
| 5000 | 51.9 | 0.6912 | 0.3087 | 0.4095 | 0.5146 | 0.1393 | 0.0514 | 0.4% |
| 5000 | 76.6 | 0.7008 | 0.2991 | 0.4095 | 0.5146 | 0.1393 | 0.0514 | 0.4% |
| 5000 | 97.4 | 0.7086 | 0.2914 | 0.4095 | 0.5146 | 0.1393 | 0.0514 | 0.4% |
| 5000 | 87.7 | 0.7138 | 0.2862 | 0.4095 | 0.5146 | 0.1393 | 0.0514 | 0.4% |
| 5000 | 73.1 | 0.7188 | 0.2812 | 0.4095 | 0.5146 | 0.1393 | 0.0514 | 0.4% |
| 5000 | 13.7 | 0.6669 | 0.3329 | 0.4095 | 0.5146 | 0.1303 | 0.0723 | 0.4% |
| 5000 | 49.5 | 0.6814 | 0.3184 | 0.4095 | 0.5146 | 0.1303 | 0.0723 | 0.4% |
| 5000 | 77.1 | 0.6912 | 0.3087 | 0.4095 | 0.5146 | 0.1303 | 0.0723 | 0.4% |
| 5000 | 94.5 | 0.7008 | 0.2991 | 0.4044 | 0.5050 | 0.1303 | 0.0723 | 0.5% |
| 5000 | 72.5 | 0.7086 | 0.2914 | 0.4017 | 0.4999 | 0.1303 | 0.0723 | 0.5% |
| 5000 | 56.6 | 0.7138 | 0.2862 | 0.4002 | 0.4971 | 0.1303 | 0.0723 | 0.6% |
| 5000 | 41.7 | 0.7188 | 0.2812 | 0.3972 | 0.4915 | 0.1303 | 0.0723 | 0.6% |
| 5000 | 15.9 | 0.6669 | 0.3329 | 0.3658 | 0.4326 | 0.1192 | 0.1046 | 1.5% |
| 5000 | 51.9 | 0.6814 | 0.3184 | 0.3654 | 0.4318 | 0.1192 | 0.1046 | 1.5% |
| 5000 | 80.2 | 0.6912 | 0.3087 | 0.3657 | 0.4324 | 0.1192 | 0.1046 | 1.5% |
| 5000 | 92.9 | 0.7008 | 0.2991 | 0.3625 | 0.4264 | 0.1192 | 0.1046 | 1.6% |
| 5000 | 70.4 | 0.7086 | 0.2914 | 0.3616 | 0.4247 | 0.1192 | 0.1046 | 1.6% |
| 5000 | 54.2 | 0.7138 | 0.2862 | 0.3611 | 0.4237 | 0.1192 | 0.1046 | 1.6% |
| 5000 | 39.4 | 0.7188 | 0.2812 | 0.3599 | 0.4215 | 0.1192 | 0.1046 | 1.7% |
| 5000 | 17.3 | 0.6669 | 0.3329 | 0.3477 | 0.3987 | 0.1082 | 0.1444 | 2.1% |
| 5000 | 54.7 | 0.6814 | 0.3184 | 0.3483 | 0.3998 | 0.1082 | 0.1444 | 2.1% |
| 5000 | 83.1 | 0.6912 | 0.3087 | 0.3485 | 0.4001 | 0.1082 | 0.1444 | 2.1% |
| 5000 | 90.8 | 0.7008 | 0.2991 | 0.3465 | 0.3964 | 0.1082 | 0.1444 | 2.1% |
| 5000 | 67.6 | 0.7086 | 0.2914 | 0.3462 | 0.3958 | 0.1082 | 0.1444 | 2.1% |
| 5000 | 51.4 | 0.7138 | 0.2862 | 0.3459 | 0.3954 | 0.1082 | 0.1444 | 2.2% |
| 5000 | 37.1 | 0.7188 | 0.2812 | 0.3452 | 0.3939 | 0.1082 | 0.1444 | 2.2% |
| 5000 | 19.8 | 0.6669 | 0.3329 | 0.3352 | 0.3752 | 0.0934 | 0.2133 | 2.6% |
| 5000 | 58.9 | 0.6814 | 0.3184 | 0.3360 | 0.3768 | 0.0934 | 0.2133 | 2.5% |
| 5000 | 86.8 | 0.6912 | 0.3087 | 0.3360 | 0.3768 | 0.0934 | 0.2133 | 2.5% |
| 5000 | 86.9 | 0.7008 | 0.2991 | 0.3353 | 0.3755 | 0.0934 | 0.2133 | 2.6% |
| 5000 | 62.9 | 0.7086 | 0.2914 | 0.3354 | 0.3756 | 0.0934 | 0.2133 | 2.6% |
| 5000 | 47.6 | 0.7138 | 0.2862 | 0.3352 | 0.3752 | 0.0934 | 0.2133 | 2.6% |
| 5000 | 34.7 | 0.7188 | 0.2812 | 0.3347 | 0.3743 | 0.0934 | 0.2133 | 2.6% |
| 5000 | 23.8 | 0.6669 | 0.3329 | 0.3269 | 0.3597 | 0.0792 | 0.3084 | 2.9% |
| 5000 | 63.6 | 0.6814 | 0.3184 | 0.3278 | 0.3613 | 0.0792 | 0.3084 | 2.9% |
| 5000 | 91.4 | 0.6912 | 0.3087 | 0.3281 | 0.3619 | 0.0792 | 0.3084 | 2.9% |
| 5000 | 81.4 | 0.7008 | 0.2991 | 0.3282 | 0.3621 | 0.0792 | 0.3084 | 2.9% |
| 5000 | 60.9 | 0.7086 | 0.2914 | 0.3282 | 0.3621 | 0.0792 | 0.3084 | 2.9% |
| 5000 | 48.0 | 0.7138 | 0.2862 | 0.3282 | 0.3620 | 0.0792 | 0.3084 | 2.9% |
| 5000 | 35.5 | 0.7188 | 0.2812 | 0.3281 | 0.3619 | 0.0792 | 0.3084 | 2.9% |
| 5000 | 27.9 | 0.6669 | 0.3329 | 0.3213 | 0.3492 | 0.0709 | 0.4039 | 3.2% |
| 5000 | 67.6 | 0.6814 | 0.3184 | 0.3225 | 0.3514 | 0.0709 | 0.4039 | 3.1% |
| 5000 | 94.2 | 0.6912 | 0.3087 | 0.3232 | 0.3528 | 0.0709 | 0.4039 | 3.1% |
| 5000 | 80.4 | 0.7008 | 0.2991 | 0.3238 | 0.3539 | 0.0709 | 0.4039 | 3.1% |
| 5000 | 60.7 | 0.7086 | 0.2914 | 0.3242 | 0.3546 | 0.0709 | 0.4039 | 3.1% |
| 5000 | 47.7 | 0.7138 | 0.2862 | 0.3245 | 0.3551 | 0.0709 | 0.4039 | 3.0% |

TABLE 2-continued

| | | | | | | | | |
|---|---|---|---|---|---|---|---|---|
| 5000 | 35.9 | 0.7188 | 0.2812 | 0.3247 | 0.3555 | 0.0709 | 0.4039 | 3.0% |
| 5000 | 31.2 | 0.6669 | 0.3329 | 0.3157 | 0.3386 | 0.0694 | 0.5232 | 3.5% |
| 5000 | 70.7 | 0.6814 | 0.3184 | 0.3176 | 0.3422 | 0.0694 | 0.5232 | 3.4% |
| 5000 | 95.6 | 0.6912 | 0.3087 | 0.3190 | 0.3448 | 0.0694 | 0.5232 | 3.3% |
| 5000 | 80.2 | 0.7008 | 0.2991 | 0.3202 | 0.3471 | 0.0694 | 0.5232 | 3.3% |
| 5000 | 62.0 | 0.7086 | 0.2914 | 0.3210 | 0.3487 | 0.0694 | 0.5232 | 3.2% |
| 5000 | 50.2 | 0.7138 | 0.2862 | 0.3216 | 0.3496 | 0.0694 | 0.5232 | 3.2% |
| 5000 | 39.0 | 0.7188 | 0.2812 | 0.3220 | 0.3505 | 0.0694 | 0.5232 | 3.2% |
| 5000 | 34.4 | 0.6669 | 0.3329 | 0.3107 | 0.3293 | 0.0799 | 0.6269 | 3.7% |
| 5000 | 75.9 | 0.6814 | 0.3184 | 0.3132 | 0.3340 | 0.0799 | 0.6269 | 3.6% |
| 5000 | 96.3 | 0.6912 | 0.3087 | 0.3159 | 0.3390 | 0.0799 | 0.6269 | 3.5% |
| 5000 | 81.9 | 0.7008 | 0.2991 | 0.3179 | 0.3427 | 0.0799 | 0.6269 | 3.4% |
| 5000 | 64.3 | 0.7086 | 0.2914 | 0.3190 | 0.3449 | 0.0799 | 0.6269 | 3.3% |
| 5000 | 52.2 | 0.7138 | 0.2862 | 0.3197 | 0.3462 | 0.0799 | 0.6269 | 3.3% |
| 5000 | 40.9 | 0.7188 | 0.2812 | 0.3203 | 0.3473 | 0.0799 | 0.6269 | 3.2% |
| 5000 | 36.3 | 0.6669 | 0.3329 | 0.3068 | 0.3220 | 0.0975 | 0.6902 | 4.0% |
| 5000 | 78.2 | 0.6814 | 0.3184 | 0.3101 | 0.3282 | 0.0975 | 0.6902 | 3.8% |
| 5000 | 96.2 | 0.6912 | 0.3087 | 0.3140 | 0.3354 | 0.0975 | 0.6902 | 3.6% |
| 5000 | 83.3 | 0.7008 | 0.2991 | 0.3165 | 0.3401 | 0.0975 | 0.6902 | 3.4% |
| 5000 | 65.2 | 0.7086 | 0.2914 | 0.3178 | 0.3425 | 0.0975 | 0.6902 | 3.4% |
| 5000 | 53.3 | 0.7138 | 0.2862 | 0.3186 | 0.3440 | 0.0975 | 0.6902 | 3.3% |
| 5000 | 42.6 | 0.7188 | 0.2812 | 0.3193 | 0.3455 | 0.0975 | 0.6902 | 3.3% |
| 5000 | 38.8 | 0.6669 | 0.3329 | 0.3016 | 0.3122 | 0.1270 | 0.7352 | 4.3% |
| 5000 | 78.7 | 0.6814 | 0.3184 | 0.3070 | 0.3224 | 0.1270 | 0.7352 | 4.0% |
| 5000 | 95.0 | 0.6912 | 0.3087 | 0.3121 | 0.3320 | 0.1270 | 0.7352 | 3.7% |
| 5000 | 83.8 | 0.7008 | 0.2991 | 0.3149 | 0.3372 | 0.1270 | 0.7352 | 3.5% |
| 5000 | 66.2 | 0.7086 | 0.2914 | 0.3165 | 0.3402 | 0.1270 | 0.7352 | 3.4% |
| 5000 | 55.4 | 0.7138 | 0.2862 | 0.3175 | 0.3421 | 0.1270 | 0.7352 | 3.4% |
| 5000 | 47.1 | 0.7188 | 0.2812 | 0.3186 | 0.3442 | 0.1270 | 0.7352 | 3.3% |
| 5000 | 40.6 | 0.6669 | 0.3329 | 0.2963 | 0.3022 | 0.1561 | 0.7502 | 4.6% |
| 5000 | 78.4 | 0.6814 | 0.3184 | 0.3044 | 0.3174 | 0.1561 | 0.7502 | 4.1% |
| 5000 | 94.0 | 0.6912 | 0.3087 | 0.3106 | 0.3291 | 0.1561 | 0.7502 | 3.8% |
| 5000 | 84.1 | 0.7008 | 0.2991 | 0.3136 | 0.3347 | 0.1561 | 0.7502 | 3.6% |
| 5000 | 68.1 | 0.7086 | 0.2914 | 0.3156 | 0.3385 | 0.1561 | 0.7502 | 3.5% |
| 5000 | 60.1 | 0.7138 | 0.2862 | 0.3171 | 0.3413 | 0.1561 | 0.7502 | 3.4% |
| 5000 | 56.2 | 0.7188 | 0.2812 | 0.3188 | 0.3444 | 0.1561 | 0.7502 | 3.3% |
| 5000 | 41.8 | 0.6669 | 0.3329 | 0.2876 | 0.2860 | 0.1938 | 0.7479 | 5.2% |
| 5000 | 76.7 | 0.6814 | 0.3184 | 0.3009 | 0.3110 | 0.1938 | 0.7479 | 4.3% |
| 5000 | 94.1 | 0.6912 | 0.3087 | 0.3081 | 0.3244 | 0.1938 | 0.7479 | 3.9% |
| 5000 | 85.8 | 0.7008 | 0.2991 | 0.3121 | 0.3318 | 0.1938 | 0.7479 | 3.7% |
| 5000 | 75.6 | 0.7086 | 0.2914 | 0.3153 | 0.3380 | 0.1938 | 0.7479 | 3.5% |
| 5000 | 72.8 | 0.7138 | 0.2862 | 0.3176 | 0.3423 | 0.1938 | 0.7479 | 3.4% |
| 5000 | 72.5 | 0.7188 | 0.2812 | 0.3198 | 0.3463 | 0.1938 | 0.7479 | 3.3% |
| 5000 | 39.8 | 0.6669 | 0.3329 | 0.2752 | 0.2627 | 0.2329 | 0.7309 | 6.3% |
| 5000 | 73.7 | 0.6814 | 0.3184 | 0.2963 | 0.3024 | 0.2329 | 0.7309 | 4.6% |
| 5000 | 94.1 | 0.6912 | 0.3087 | 0.3044 | 0.3175 | 0.2329 | 0.7309 | 4.1% |
| 5000 | 93.2 | 0.7008 | 0.2991 | 0.3113 | 0.3304 | 0.2329 | 0.7309 | 3.7% |
| 5000 | 89.1 | 0.7086 | 0.2914 | 0.3161 | 0.3394 | 0.2329 | 0.7309 | 3.5% |
| 5000 | 88.1 | 0.7138 | 0.2862 | 0.3188 | 0.3444 | 0.2329 | 0.7309 | 3.3% |
| 5000 | 88.3 | 0.7188 | 0.2812 | 0.3210 | 0.3487 | 0.2329 | 0.7309 | 3.2% |
| 4900 | −1.7 | 0.6669 | 0.3329 | 0.4095 | 0.5146 | 0.1393 | 0.0514 | 0.4% |
| 4900 | 29.3 | 0.6814 | 0.3184 | 0.4095 | 0.5146 | 0.1393 | 0.0514 | 0.4% |
| 4900 | 53.5 | 0.6912 | 0.3087 | 0.4095 | 0.5146 | 0.1393 | 0.0514 | 0.4% |
| 4900 | 79.1 | 0.7008 | 0.2991 | 0.4095 | 0.5146 | 0.1393 | 0.0514 | 0.4% |
| 4900 | 99.0 | 0.7086 | 0.2914 | 0.4095 | 0.5146 | 0.1393 | 0.0514 | 0.4% |
| 4900 | 84.1 | 0.7138 | 0.2862 | 0.4095 | 0.5146 | 0.1393 | 0.0514 | 0.4% |
| 4900 | 69.0 | 0.7188 | 0.2812 | 0.4095 | 0.5146 | 0.1393 | 0.0514 | 0.4% |
| 4900 | 13.0 | 0.6669 | 0.3329 | 0.4095 | 0.5146 | 0.1303 | 0.0723 | 0.4% |
| 4900 | 49.5 | 0.6814 | 0.3184 | 0.4095 | 0.5146 | 0.1303 | 0.0723 | 0.4% |
| 4900 | 77.7 | 0.6912 | 0.3087 | 0.4095 | 0.5146 | 0.1303 | 0.0723 | 0.4% |
| 4900 | 93.2 | 0.7008 | 0.2991 | 0.4049 | 0.5060 | 0.1303 | 0.0723 | 0.5% |
| 4900 | 70.5 | 0.7086 | 0.2914 | 0.4021 | 0.5006 | 0.1303 | 0.0723 | 0.5% |
| 4900 | 54.5 | 0.7138 | 0.2862 | 0.3998 | 0.4964 | 0.1303 | 0.0723 | 0.6% |
| 4900 | 39.6 | 0.7188 | 0.2812 | 0.3965 | 0.4901 | 0.1303 | 0.0723 | 0.7% |
| 4900 | 15.4 | 0.6669 | 0.3329 | 0.3673 | 0.4355 | 0.1192 | 0.1046 | 1.4% |
| 4900 | 52.3 | 0.6814 | 0.3184 | 0.3668 | 0.4345 | 0.1192 | 0.1046 | 1.5% |
| 4900 | 80.9 | 0.6912 | 0.3087 | 0.3668 | 0.4346 | 0.1192 | 0.1046 | 1.5% |
| 4900 | 91.6 | 0.7008 | 0.2991 | 0.3637 | 0.4286 | 0.1192 | 0.1046 | 1.5% |
| 4900 | 68.4 | 0.7086 | 0.2914 | 0.3627 | 0.4268 | 0.1192 | 0.1046 | 1.6% |
| 4900 | 52.1 | 0.7138 | 0.2862 | 0.3620 | 0.4255 | 0.1192 | 0.1046 | 1.6% |
| 4900 | 37.3 | 0.7188 | 0.2812 | 0.3605 | 0.4228 | 0.1192 | 0.1046 | 1.6% |
| 4900 | 16.7 | 0.6669 | 0.3329 | 0.3493 | 0.4016 | 0.1082 | 0.1444 | 2.0% |
| 4900 | 54.9 | 0.6814 | 0.3184 | 0.3498 | 0.4026 | 0.1082 | 0.1444 | 2.0% |
| 4900 | 83.6 | 0.6912 | 0.3087 | 0.3498 | 0.4025 | 0.1082 | 0.1444 | 2.0% |
| 4900 | 89.4 | 0.7008 | 0.2991 | 0.3479 | 0.3990 | 0.1082 | 0.1444 | 2.1% |
| 4900 | 65.7 | 0.7086 | 0.2914 | 0.3475 | 0.3983 | 0.1082 | 0.1444 | 2.1% |
| 4900 | 49.3 | 0.7138 | 0.2862 | 0.3472 | 0.3977 | 0.1082 | 0.1444 | 2.1% |
| 4900 | 35.1 | 0.7188 | 0.2812 | 0.3462 | 0.3959 | 0.1082 | 0.1444 | 2.1% |
| 4900 | 19.2 | 0.6669 | 0.3329 | 0.3367 | 0.3781 | 0.0934 | 0.2133 | 2.5% |
| 4900 | 59.0 | 0.6814 | 0.3184 | 0.3376 | 0.3796 | 0.0934 | 0.2133 | 2.5% |

TABLE 2-continued

| | | | | | | | |
|---|---|---|---|---|---|---|---|
| 4900 | 87.1 | 0.6912 | 0.3087 | 0.3375 | 0.3795 | 0.0934 | 0.2133 | 2.5% |
| 4900 | 85.7 | 0.7008 | 0.2991 | 0.3368 | 0.3783 | 0.0934 | 0.2133 | 2.5% |
| 4900 | 61.2 | 0.7086 | 0.2914 | 0.3368 | 0.3783 | 0.0934 | 0.2133 | 2.5% |
| 4900 | 46.3 | 0.7138 | 0.2862 | 0.3365 | 0.3777 | 0.0934 | 0.2133 | 2.5% |
| 4900 | 33.7 | 0.7188 | 0.2812 | 0.3359 | 0.3766 | 0.0934 | 0.2133 | 2.5% |
| 4900 | 23.0 | 0.6669 | 0.3329 | 0.3285 | 0.3626 | 0.0792 | 0.3084 | 2.9% |
| 4900 | 63.6 | 0.6814 | 0.3184 | 0.3293 | 0.3643 | 0.0792 | 0.3084 | 2.8% |
| 4900 | 91.7 | 0.6912 | 0.3087 | 0.3297 | 0.3648 | 0.0792 | 0.3084 | 2.8% |
| 4900 | 80.7 | 0.7008 | 0.2991 | 0.3297 | 0.3650 | 0.0792 | 0.3084 | 2.8% |
| 4900 | 60.2 | 0.7086 | 0.2914 | 0.3297 | 0.3649 | 0.0792 | 0.3084 | 2.8% |
| 4900 | 47.1 | 0.7138 | 0.2862 | 0.3296 | 0.3648 | 0.0792 | 0.3084 | 2.8% |
| 4900 | 34.3 | 0.7188 | 0.2812 | 0.3296 | 0.3647 | 0.0792 | 0.3084 | 2.8% |
| 4900 | 27.0 | 0.6669 | 0.3329 | 0.3230 | 0.3523 | 0.0709 | 0.4039 | 3.1% |
| 4900 | 67.0 | 0.6814 | 0.3184 | 0.3241 | 0.3545 | 0.0709 | 0.4039 | 3.1% |
| 4900 | 94.4 | 0.6912 | 0.3087 | 0.3248 | 0.3558 | 0.0709 | 0.4039 | 3.0% |
| 4900 | 80.2 | 0.7008 | 0.2991 | 0.3254 | 0.3569 | 0.0709 | 0.4039 | 3.0% |
| 4900 | 60.2 | 0.7086 | 0.2914 | 0.3258 | 0.3576 | 0.0709 | 0.4039 | 3.0% |
| 4900 | 47.1 | 0.7138 | 0.2862 | 0.3260 | 0.3581 | 0.0709 | 0.4039 | 3.0% |
| 4900 | 35.0 | 0.7188 | 0.2812 | 0.3262 | 0.3584 | 0.0709 | 0.4039 | 3.0% |
| 4900 | 30.3 | 0.6669 | 0.3329 | 0.3173 | 0.3418 | 0.0694 | 0.5232 | 3.4% |
| 4900 | 70.3 | 0.6814 | 0.3184 | 0.3193 | 0.3454 | 0.0694 | 0.5232 | 3.3% |
| 4900 | 95.6 | 0.6912 | 0.3087 | 0.3206 | 0.3479 | 0.0694 | 0.5232 | 3.2% |
| 4900 | 80.0 | 0.7008 | 0.2991 | 0.3219 | 0.3503 | 0.0694 | 0.5232 | 3.2% |
| 4900 | 61.6 | 0.7086 | 0.2914 | 0.3227 | 0.3519 | 0.0694 | 0.5232 | 3.1% |
| 4900 | 49.6 | 0.7138 | 0.2862 | 0.3232 | 0.3528 | 0.0694 | 0.5232 | 3.1% |
| 4900 | 38.2 | 0.7188 | 0.2812 | 0.3237 | 0.3537 | 0.0694 | 0.5232 | 3.1% |
| 4900 | 33.3 | 0.6669 | 0.3329 | 0.3124 | 0.3325 | 0.0799 | 0.6269 | 3.7% |
| 4900 | 75.2 | 0.6814 | 0.3184 | 0.3150 | 0.3373 | 0.0799 | 0.6269 | 3.5% |
| 4900 | 96.2 | 0.6912 | 0.3087 | 0.3177 | 0.3423 | 0.0799 | 0.6269 | 3.4% |
| 4900 | 81.8 | 0.7008 | 0.2991 | 0.3196 | 0.3460 | 0.0799 | 0.6269 | 3.3% |
| 4900 | 63.9 | 0.7086 | 0.2914 | 0.3208 | 0.3482 | 0.0799 | 0.6269 | 3.2% |
| 4900 | 51.7 | 0.7138 | 0.2862 | 0.3215 | 0.3495 | 0.0799 | 0.6269 | 3.2% |
| 4900 | 40.2 | 0.7188 | 0.2812 | 0.3221 | 0.3506 | 0.0799 | 0.6269 | 3.2% |
| 4900 | 35.1 | 0.6669 | 0.3329 | 0.3086 | 0.3254 | 0.0975 | 0.6902 | 3.9% |
| 4900 | 77.5 | 0.6814 | 0.3184 | 0.3120 | 0.3317 | 0.0975 | 0.6902 | 3.7% |
| 4900 | 96.0 | 0.6912 | 0.3087 | 0.3158 | 0.3388 | 0.0975 | 0.6902 | 3.5% |
| 4900 | 83.3 | 0.7008 | 0.2991 | 0.3183 | 0.3435 | 0.0975 | 0.6902 | 3.3% |
| 4900 | 64.9 | 0.7086 | 0.2914 | 0.3196 | 0.3460 | 0.0975 | 0.6902 | 3.3% |
| 4900 | 52.9 | 0.7138 | 0.2862 | 0.3204 | 0.3475 | 0.0975 | 0.6902 | 3.2% |
| 4900 | 42.1 | 0.7188 | 0.2812 | 0.3212 | 0.3489 | 0.0975 | 0.6902 | 3.2% |
| 4900 | 37.5 | 0.6669 | 0.3329 | 0.3035 | 0.3158 | 0.1270 | 0.7352 | 4.2% |
| 4900 | 78.1 | 0.6814 | 0.3184 | 0.3089 | 0.3258 | 0.1270 | 0.7352 | 3.9% |
| 4900 | 94.8 | 0.6912 | 0.3087 | 0.3140 | 0.3355 | 0.1270 | 0.7352 | 3.6% |
| 4900 | 83.9 | 0.7008 | 0.2991 | 0.3168 | 0.3407 | 0.1270 | 0.7352 | 3.4% |
| 4900 | 66.1 | 0.7086 | 0.2914 | 0.3184 | 0.3437 | 0.1270 | 0.7352 | 3.3% |
| 4900 | 55.2 | 0.7138 | 0.2862 | 0.3195 | 0.3457 | 0.1270 | 0.7352 | 3.3% |
| 4900 | 46.7 | 0.7188 | 0.2812 | 0.3205 | 0.3478 | 0.1270 | 0.7352 | 3.2% |
| 4900 | 39.3 | 0.6669 | 0.3329 | 0.2982 | 0.3059 | 0.1561 | 0.7502 | 4.5% |
| 4900 | 77.8 | 0.6814 | 0.3184 | 0.3063 | 0.3210 | 0.1561 | 0.7502 | 4.0% |
| 4900 | 93.6 | 0.6912 | 0.3087 | 0.3125 | 0.3328 | 0.1561 | 0.7502 | 3.6% |
| 4900 | 84.3 | 0.7008 | 0.2991 | 0.3156 | 0.3384 | 0.1561 | 0.7502 | 3.5% |
| 4900 | 68.1 | 0.7086 | 0.2914 | 0.3176 | 0.3422 | 0.1561 | 0.7502 | 3.4% |
| 4900 | 59.9 | 0.7138 | 0.2862 | 0.3191 | 0.3450 | 0.1561 | 0.7502 | 3.3% |
| 4900 | 55.7 | 0.7188 | 0.2812 | 0.3207 | 0.3481 | 0.1561 | 0.7502 | 3.2% |
| 4900 | 40.6 | 0.6669 | 0.3329 | 0.2897 | 0.2899 | 0.1938 | 0.7479 | 5.1% |
| 4900 | 76.3 | 0.6814 | 0.3184 | 0.3029 | 0.3146 | 0.1938 | 0.7479 | 4.2% |
| 4900 | 93.6 | 0.6912 | 0.3087 | 0.3101 | 0.3282 | 0.1938 | 0.7479 | 3.8% |
| 4900 | 86.1 | 0.7008 | 0.2991 | 0.3141 | 0.3357 | 0.1938 | 0.7479 | 3.6% |
| 4900 | 75.6 | 0.7086 | 0.2914 | 0.3174 | 0.3418 | 0.1938 | 0.7479 | 3.4% |
| 4900 | 72.5 | 0.7138 | 0.2862 | 0.3197 | 0.3461 | 0.1938 | 0.7479 | 3.3% |
| 4900 | 72.1 | 0.7188 | 0.2812 | 0.3218 | 0.3501 | 0.1938 | 0.7479 | 3.2% |
| 4900 | 38.7 | 0.6669 | 0.3329 | 0.2775 | 0.2670 | 0.2329 | 0.7309 | 6.1% |
| 4900 | 73.1 | 0.6814 | 0.3184 | 0.2985 | 0.3065 | 0.2329 | 0.7309 | 4.5% |
| 4900 | 93.6 | 0.6912 | 0.3087 | 0.3066 | 0.3217 | 0.2329 | 0.7309 | 4.0% |
| 4900 | 93.4 | 0.7008 | 0.2991 | 0.3135 | 0.3345 | 0.2329 | 0.7309 | 3.6% |
| 4900 | 89.1 | 0.7086 | 0.2914 | 0.3183 | 0.3435 | 0.2329 | 0.7309 | 3.4% |
| 4900 | 88.0 | 0.7138 | 0.2862 | 0.3209 | 0.3485 | 0.2329 | 0.7309 | 3.2% |
| 4900 | 88.1 | 0.7188 | 0.2812 | 0.3232 | 0.3527 | 0.2329 | 0.7309 | 3.1% |
| 4800 | −2.0 | 0.6669 | 0.3329 | 0.4095 | 0.5146 | 0.1393 | 0.0514 | 0.4% |
| 4800 | 30.1 | 0.6814 | 0.3184 | 0.4095 | 0.5146 | 0.1393 | 0.0514 | 0.4% |
| 4800 | 55.2 | 0.6912 | 0.3087 | 0.4095 | 0.5146 | 0.1393 | 0.0514 | 0.4% |
| 4800 | 81.6 | 0.7008 | 0.2991 | 0.4095 | 0.5146 | 0.1393 | 0.0514 | 0.4% |
| 4800 | 96.0 | 0.7086 | 0.2914 | 0.4095 | 0.5146 | 0.1393 | 0.0514 | 0.4% |
| 4800 | 80.3 | 0.7138 | 0.2862 | 0.4095 | 0.5146 | 0.1393 | 0.0514 | 0.4% |
| 4800 | 64.7 | 0.7188 | 0.2812 | 0.4095 | 0.5146 | 0.1393 | 0.0514 | 0.4% |
| 4800 | 12.2 | 0.6669 | 0.3329 | 0.4095 | 0.5146 | 0.1303 | 0.0723 | 0.4% |
| 4800 | 49.6 | 0.6814 | 0.3184 | 0.4095 | 0.5146 | 0.1303 | 0.0723 | 0.4% |
| 4800 | 78.4 | 0.6912 | 0.3087 | 0.4095 | 0.5146 | 0.1303 | 0.0723 | 0.4% |
| 4800 | 91.7 | 0.7008 | 0.2991 | 0.4054 | 0.5069 | 0.1303 | 0.0723 | 0.5% |
| 4800 | 68.6 | 0.7086 | 0.2914 | 0.4019 | 0.5002 | 0.1303 | 0.0723 | 0.5% |

TABLE 2-continued

| | | | | | | | | |
|---|---|---|---|---|---|---|---|---|
| 4800 | 52.4 | 0.7138 | 0.2862 | 0.3993 | 0.4954 | 0.1303 | 0.0723 | 0.6% |
| 4800 | 37.2 | 0.7188 | 0.2812 | 0.3958 | 0.4888 | 0.1303 | 0.0723 | 0.7% |
| 4800 | 14.8 | 0.6669 | 0.3329 | 0.3688 | 0.4383 | 0.1192 | 0.1046 | 1.4% |
| 4800 | 52.6 | 0.6814 | 0.3184 | 0.3683 | 0.4373 | 0.1192 | 0.1046 | 1.4% |
| 4800 | 81.5 | 0.6912 | 0.3087 | 0.3679 | 0.4366 | 0.1192 | 0.1046 | 1.4% |
| 4800 | 90.1 | 0.7008 | 0.2991 | 0.3648 | 0.4308 | 0.1192 | 0.1046 | 1.5% |
| 4800 | 66.5 | 0.7086 | 0.2914 | 0.3637 | 0.4287 | 0.1192 | 0.1046 | 1.5% |
| 4800 | 49.9 | 0.7138 | 0.2862 | 0.3629 | 0.4272 | 0.1192 | 0.1046 | 1.6% |
| 4800 | 35.1 | 0.7188 | 0.2812 | 0.3612 | 0.4240 | 0.1192 | 0.1046 | 1.6% |
| 4800 | 16.1 | 0.6669 | 0.3329 | 0.3508 | 0.4046 | 0.1082 | 0.1444 | 2.0% |
| 4800 | 55.2 | 0.6814 | 0.3184 | 0.3513 | 0.4055 | 0.1082 | 0.1444 | 2.0% |
| 4800 | 84.0 | 0.6912 | 0.3087 | 0.3510 | 0.4049 | 0.1082 | 0.1444 | 2.0% |
| 4800 | 88.1 | 0.7008 | 0.2991 | 0.3492 | 0.4016 | 0.1082 | 0.1444 | 2.0% |
| 4800 | 63.7 | 0.7086 | 0.2914 | 0.3489 | 0.4009 | 0.1082 | 0.1444 | 2.0% |
| 4800 | 47.4 | 0.7138 | 0.2862 | 0.3484 | 0.4000 | 0.1082 | 0.1444 | 2.1% |
| 4800 | 33.2 | 0.7188 | 0.2812 | 0.3473 | 0.3979 | 0.1082 | 0.1444 | 2.1% |
| 4800 | 18.5 | 0.6669 | 0.3329 | 0.3383 | 0.3810 | 0.0934 | 0.2133 | 2.4% |
| 4800 | 59.0 | 0.6814 | 0.3184 | 0.3391 | 0.3826 | 0.0934 | 0.2133 | 2.4% |
| 4800 | 87.3 | 0.6912 | 0.3087 | 0.3389 | 0.3822 | 0.0934 | 0.2133 | 2.4% |
| 4800 | 84.3 | 0.7008 | 0.2991 | 0.3384 | 0.3811 | 0.0934 | 0.2133 | 2.4% |
| 4800 | 59.7 | 0.7086 | 0.2914 | 0.3383 | 0.3811 | 0.0934 | 0.2133 | 2.4% |
| 4800 | 45.2 | 0.7138 | 0.2862 | 0.3378 | 0.3802 | 0.0934 | 0.2133 | 2.5% |
| 4800 | 32.5 | 0.7188 | 0.2812 | 0.3372 | 0.3789 | 0.0934 | 0.2133 | 2.5% |
| 4800 | 22.2 | 0.6669 | 0.3329 | 0.3301 | 0.3657 | 0.0792 | 0.3084 | 2.8% |
| 4800 | 63.5 | 0.6814 | 0.3184 | 0.3310 | 0.3673 | 0.0792 | 0.3084 | 2.8% |
| 4800 | 92.1 | 0.6912 | 0.3087 | 0.3313 | 0.3679 | 0.0792 | 0.3084 | 2.7% |
| 4800 | 80.2 | 0.7008 | 0.2991 | 0.3313 | 0.3679 | 0.0792 | 0.3084 | 2.7% |
| 4800 | 59.6 | 0.7086 | 0.2914 | 0.3312 | 0.3678 | 0.0792 | 0.3084 | 2.7% |
| 4800 | 46.2 | 0.7138 | 0.2862 | 0.3312 | 0.3677 | 0.0792 | 0.3084 | 2.7% |
| 4800 | 33.1 | 0.7188 | 0.2812 | 0.3311 | 0.3675 | 0.0792 | 0.3084 | 2.7% |
| 4800 | 26.1 | 0.6669 | 0.3329 | 0.3246 | 0.3554 | 0.0709 | 0.4039 | 3.0% |
| 4800 | 66.5 | 0.6814 | 0.3184 | 0.3258 | 0.3577 | 0.0709 | 0.4039 | 3.0% |
| 4800 | 94.5 | 0.6912 | 0.3087 | 0.3265 | 0.3589 | 0.0709 | 0.4039 | 3.0% |
| 4800 | 79.9 | 0.7008 | 0.2991 | 0.3271 | 0.3600 | 0.0709 | 0.4039 | 2.9% |
| 4800 | 59.6 | 0.7086 | 0.2914 | 0.3275 | 0.3607 | 0.0709 | 0.4039 | 2.9% |
| 4800 | 46.4 | 0.7138 | 0.2862 | 0.3277 | 0.3611 | 0.0709 | 0.4039 | 2.9% |
| 4800 | 34.2 | 0.7188 | 0.2812 | 0.3279 | 0.3615 | 0.0709 | 0.4039 | 2.9% |
| 4800 | 29.2 | 0.6669 | 0.3329 | 0.3191 | 0.3450 | 0.0694 | 0.5232 | 3.3% |
| 4800 | 69.9 | 0.6814 | 0.3184 | 0.3210 | 0.3486 | 0.0694 | 0.5232 | 3.2% |
| 4800 | 95.5 | 0.6912 | 0.3087 | 0.3224 | 0.3512 | 0.0694 | 0.5232 | 3.1% |
| 4800 | 79.8 | 0.7008 | 0.2991 | 0.3236 | 0.3536 | 0.0694 | 0.5232 | 3.1% |
| 4800 | 61.1 | 0.7086 | 0.2914 | 0.3245 | 0.3551 | 0.0694 | 0.5232 | 3.0% |
| 4800 | 49.0 | 0.7138 | 0.2862 | 0.3250 | 0.3561 | 0.0694 | 0.5232 | 3.0% |
| 4800 | 37.4 | 0.7188 | 0.2812 | 0.3254 | 0.3569 | 0.0694 | 0.5232 | 3.0% |
| 4800 | 32.1 | 0.6669 | 0.3329 | 0.3142 | 0.3359 | 0.0799 | 0.6269 | 3.6% |
| 4800 | 74.5 | 0.6814 | 0.3184 | 0.3168 | 0.3408 | 0.0799 | 0.6269 | 3.4% |
| 4800 | 96.0 | 0.6912 | 0.3087 | 0.3195 | 0.3457 | 0.0799 | 0.6269 | 3.3% |
| 4800 | 81.6 | 0.7008 | 0.2991 | 0.3215 | 0.3495 | 0.0799 | 0.6269 | 3.2% |
| 4800 | 63.6 | 0.7086 | 0.2914 | 0.3226 | 0.3517 | 0.0799 | 0.6269 | 3.1% |
| 4800 | 51.2 | 0.7138 | 0.2862 | 0.3233 | 0.3529 | 0.0799 | 0.6269 | 3.1% |
| 4800 | 39.6 | 0.7188 | 0.2812 | 0.3239 | 0.3541 | 0.0799 | 0.6269 | 3.1% |
| 4800 | 33.8 | 0.6669 | 0.3329 | 0.3105 | 0.3289 | 0.0975 | 0.6902 | 3.8% |
| 4800 | 76.7 | 0.6814 | 0.3184 | 0.3138 | 0.3352 | 0.0975 | 0.6902 | 3.6% |
| 4800 | 95.8 | 0.6912 | 0.3087 | 0.3176 | 0.3423 | 0.0975 | 0.6902 | 3.4% |
| 4800 | 83.3 | 0.7008 | 0.2991 | 0.3202 | 0.3470 | 0.0975 | 0.6902 | 3.3% |
| 4800 | 64.7 | 0.7086 | 0.2914 | 0.3215 | 0.3495 | 0.0975 | 0.6902 | 3.2% |
| 4800 | 52.5 | 0.7138 | 0.2862 | 0.3223 | 0.3510 | 0.0975 | 0.6902 | 3.2% |
| 4800 | 41.6 | 0.7188 | 0.2812 | 0.3231 | 0.3525 | 0.0975 | 0.6902 | 3.1% |
| 4800 | 36.2 | 0.6669 | 0.3329 | 0.3055 | 0.3195 | 0.1270 | 0.7352 | 4.0% |
| 4800 | 77.4 | 0.6814 | 0.3184 | 0.3108 | 0.3294 | 0.1270 | 0.7352 | 3.7% |
| 4800 | 94.5 | 0.6912 | 0.3087 | 0.3159 | 0.3391 | 0.1270 | 0.7352 | 3.5% |
| 4800 | 84.0 | 0.7008 | 0.2991 | 0.3188 | 0.3444 | 0.1270 | 0.7352 | 3.3% |
| 4800 | 66.0 | 0.7086 | 0.2914 | 0.3204 | 0.3474 | 0.1270 | 0.7352 | 3.2% |
| 4800 | 54.9 | 0.7138 | 0.2862 | 0.3214 | 0.3494 | 0.1270 | 0.7352 | 3.2% |
| 4800 | 46.2 | 0.7188 | 0.2812 | 0.3225 | 0.3514 | 0.1270 | 0.7352 | 3.1% |
| 4800 | 38.0 | 0.6669 | 0.3329 | 0.3003 | 0.3098 | 0.1561 | 0.7502 | 4.4% |
| 4800 | 77.2 | 0.6814 | 0.3184 | 0.3083 | 0.3247 | 0.1561 | 0.7502 | 3.9% |
| 4800 | 93.3 | 0.6912 | 0.3087 | 0.3145 | 0.3365 | 0.1561 | 0.7502 | 3.5% |
| 4800 | 84.5 | 0.7008 | 0.2991 | 0.3176 | 0.3422 | 0.1561 | 0.7502 | 3.4% |
| 4800 | 68.1 | 0.7086 | 0.2914 | 0.3196 | 0.3461 | 0.1561 | 0.7502 | 3.3% |
| 4800 | 59.6 | 0.7138 | 0.2862 | 0.3211 | 0.3488 | 0.1561 | 0.7502 | 3.2% |
| 4800 | 55.2 | 0.7188 | 0.2812 | 0.3227 | 0.3519 | 0.1561 | 0.7502 | 3.1% |
| 4800 | 39.3 | 0.6669 | 0.3329 | 0.2919 | 0.2941 | 0.1938 | 0.7479 | 4.9% |
| 4800 | 75.8 | 0.6814 | 0.3184 | 0.3049 | 0.3184 | 0.1938 | 0.7479 | 4.1% |
| 4800 | 93.1 | 0.6912 | 0.3087 | 0.3123 | 0.3322 | 0.1938 | 0.7479 | 3.7% |
| 4800 | 86.3 | 0.7008 | 0.2991 | 0.3163 | 0.3397 | 0.1938 | 0.7479 | 3.5% |
| 4800 | 75.5 | 0.7086 | 0.2914 | 0.3195 | 0.3458 | 0.1938 | 0.7479 | 3.3% |
| 4800 | 72.2 | 0.7138 | 0.2862 | 0.3218 | 0.3501 | 0.1938 | 0.7479 | 3.2% |
| 4800 | 71.7 | 0.7188 | 0.2812 | 0.3239 | 0.3540 | 0.1938 | 0.7479 | 3.1% |
| 4800 | 37.6 | 0.6669 | 0.3329 | 0.2799 | 0.2715 | 0.2329 | 0.7309 | 5.9% |

TABLE 2-continued

| | | | | | | | | |
|---|---|---|---|---|---|---|---|---|
| 4800 | 72.4 | 0.6814 | 0.3184 | 0.3008 | 0.3107 | 0.2329 | 0.7309 | 4.3% |
| 4800 | 93.1 | 0.6912 | 0.3087 | 0.3090 | 0.3260 | 0.2329 | 0.7309 | 3.8% |
| 4800 | 93.6 | 0.7008 | 0.2991 | 0.3158 | 0.3388 | 0.2329 | 0.7309 | 3.5% |
| 4800 | 89.1 | 0.7086 | 0.2914 | 0.3205 | 0.3476 | 0.2329 | 0.7309 | 3.2% |
| 4800 | 87.8 | 0.7138 | 0.2862 | 0.3232 | 0.3527 | 0.2329 | 0.7309 | 3.1% |
| 4800 | 87.9 | 0.7188 | 0.2812 | 0.3254 | 0.3569 | 0.2329 | 0.7309 | 3.0% |
| 4700 | −2.2 | 0.6669 | 0.3329 | 0.4095 | 0.5146 | 0.1393 | 0.0514 | 0.4% |
| 4700 | 31.0 | 0.6814 | 0.3184 | 0.4095 | 0.5146 | 0.1393 | 0.0514 | 0.4% |
| 4700 | 56.9 | 0.6912 | 0.3087 | 0.4095 | 0.5146 | 0.1393 | 0.0514 | 0.4% |
| 4700 | 84.2 | 0.7008 | 0.2991 | 0.4095 | 0.5146 | 0.1393 | 0.0514 | 0.4% |
| 4700 | 92.7 | 0.7086 | 0.2914 | 0.4095 | 0.5146 | 0.1393 | 0.0514 | 0.4% |
| 4700 | 76.5 | 0.7138 | 0.2862 | 0.4095 | 0.5146 | 0.1393 | 0.0514 | 0.4% |
| 4700 | 60.4 | 0.7188 | 0.2812 | 0.4095 | 0.5146 | 0.1393 | 0.0514 | 0.4% |
| 4700 | 11.4 | 0.6669 | 0.3329 | 0.4095 | 0.5146 | 0.1303 | 0.0723 | 0.4% |
| 4700 | 49.7 | 0.6814 | 0.3184 | 0.4095 | 0.5146 | 0.1303 | 0.0723 | 0.4% |
| 4700 | 79.2 | 0.6912 | 0.3087 | 0.4095 | 0.5146 | 0.1303 | 0.0723 | 0.4% |
| 4700 | 90.3 | 0.7008 | 0.2991 | 0.4057 | 0.5075 | 0.1303 | 0.0723 | 0.5% |
| 4700 | 66.9 | 0.7086 | 0.2914 | 0.4012 | 0.4991 | 0.1303 | 0.0723 | 0.6% |
| 4700 | 50.2 | 0.7138 | 0.2862 | 0.3989 | 0.4947 | 0.1303 | 0.0723 | 0.6% |
| 4700 | 34.8 | 0.7188 | 0.2812 | 0.3950 | 0.4874 | 0.1303 | 0.0723 | 0.7% |
| 4700 | 14.2 | 0.6669 | 0.3329 | 0.3704 | 0.4412 | 0.1192 | 0.1046 | 1.3% |
| 4700 | 52.9 | 0.6814 | 0.3184 | 0.3698 | 0.4401 | 0.1192 | 0.1046 | 1.4% |
| 4700 | 82.1 | 0.6912 | 0.3087 | 0.3689 | 0.4384 | 0.1192 | 0.1046 | 1.4% |
| 4700 | 88.7 | 0.7008 | 0.2991 | 0.3660 | 0.4329 | 0.1192 | 0.1046 | 1.5% |
| 4700 | 64.5 | 0.7086 | 0.2914 | 0.3647 | 0.4306 | 0.1192 | 0.1046 | 1.5% |
| 4700 | 47.7 | 0.7138 | 0.2862 | 0.3638 | 0.4289 | 0.1192 | 0.1046 | 1.5% |
| 4700 | 32.9 | 0.7188 | 0.2812 | 0.3618 | 0.4251 | 0.1192 | 0.1046 | 1.6% |
| 4700 | 15.5 | 0.6669 | 0.3329 | 0.3524 | 0.4076 | 0.1082 | 0.1444 | 1.9% |
| 4700 | 55.4 | 0.6814 | 0.3184 | 0.3529 | 0.4085 | 0.1082 | 0.1444 | 1.9% |
| 4700 | 84.4 | 0.6912 | 0.3087 | 0.3523 | 0.4072 | 0.1082 | 0.1444 | 1.9% |
| 4700 | 86.7 | 0.7008 | 0.2991 | 0.3506 | 0.4041 | 0.1082 | 0.1444 | 2.0% |
| 4700 | 61.7 | 0.7086 | 0.2914 | 0.3503 | 0.4035 | 0.1082 | 0.1444 | 2.0% |
| 4700 | 45.6 | 0.7138 | 0.2862 | 0.3495 | 0.4021 | 0.1082 | 0.1444 | 2.0% |
| 4700 | 31.2 | 0.7188 | 0.2812 | 0.3483 | 0.3999 | 0.1082 | 0.1444 | 2.1% |
| 4700 | 17.7 | 0.6669 | 0.3329 | 0.3399 | 0.3841 | 0.0934 | 0.2133 | 2.4% |
| 4700 | 59.0 | 0.6814 | 0.3184 | 0.3408 | 0.3857 | 0.0934 | 0.2133 | 2.4% |
| 4700 | 87.7 | 0.6912 | 0.3087 | 0.3405 | 0.3851 | 0.0934 | 0.2133 | 2.4% |
| 4700 | 82.9 | 0.7008 | 0.2991 | 0.3399 | 0.3841 | 0.0934 | 0.2133 | 2.4% |
| 4700 | 58.5 | 0.7086 | 0.2914 | 0.3397 | 0.3838 | 0.0934 | 0.2133 | 2.4% |
| 4700 | 44.2 | 0.7138 | 0.2862 | 0.3391 | 0.3826 | 0.0934 | 0.2133 | 2.4% |
| 4700 | 31.4 | 0.7188 | 0.2812 | 0.3384 | 0.3813 | 0.0934 | 0.2133 | 2.4% |
| 4700 | 21.3 | 0.6669 | 0.3329 | 0.3318 | 0.3688 | 0.0792 | 0.3084 | 2.7% |
| 4700 | 63.3 | 0.6814 | 0.3184 | 0.3327 | 0.3705 | 0.0792 | 0.3084 | 2.7% |
| 4700 | 92.2 | 0.6912 | 0.3087 | 0.3329 | 0.3710 | 0.0792 | 0.3084 | 2.7% |
| 4700 | 79.7 | 0.7008 | 0.2991 | 0.3329 | 0.3710 | 0.0792 | 0.3084 | 2.7% |
| 4700 | 59.0 | 0.7086 | 0.2914 | 0.3328 | 0.3708 | 0.0792 | 0.3084 | 2.7% |
| 4700 | 45.3 | 0.7138 | 0.2862 | 0.3327 | 0.3706 | 0.0792 | 0.3084 | 2.7% |
| 4700 | 31.9 | 0.7188 | 0.2812 | 0.3326 | 0.3704 | 0.0792 | 0.3084 | 2.7% |
| 4700 | 25.1 | 0.6669 | 0.3329 | 0.3264 | 0.3587 | 0.0709 | 0.4039 | 3.0% |
| 4700 | 66.1 | 0.6814 | 0.3184 | 0.3276 | 0.3609 | 0.0709 | 0.4039 | 2.9% |
| 4700 | 94.6 | 0.6912 | 0.3087 | 0.3282 | 0.3622 | 0.0709 | 0.4039 | 2.9% |
| 4700 | 79.5 | 0.7008 | 0.2991 | 0.3288 | 0.3632 | 0.0709 | 0.4039 | 2.9% |
| 4700 | 59.0 | 0.7086 | 0.2914 | 0.3292 | 0.3639 | 0.0709 | 0.4039 | 2.8% |
| 4700 | 45.7 | 0.7138 | 0.2862 | 0.3294 | 0.3643 | 0.0709 | 0.4039 | 2.8% |
| 4700 | 33.3 | 0.7188 | 0.2812 | 0.3295 | 0.3646 | 0.0709 | 0.4039 | 2.8% |
| 4700 | 28.1 | 0.6669 | 0.3329 | 0.3209 | 0.3484 | 0.0694 | 0.5232 | 3.2% |
| 4700 | 69.5 | 0.6814 | 0.3184 | 0.3228 | 0.3520 | 0.0694 | 0.5232 | 3.1% |
| 4700 | 95.5 | 0.6912 | 0.3087 | 0.3242 | 0.3546 | 0.0694 | 0.5232 | 3.1% |
| 4700 | 79.5 | 0.7008 | 0.2991 | 0.3254 | 0.3569 | 0.0694 | 0.5232 | 3.0% |
| 4700 | 60.6 | 0.7086 | 0.2914 | 0.3263 | 0.3585 | 0.0694 | 0.5232 | 3.0% |
| 4700 | 48.3 | 0.7138 | 0.2862 | 0.3268 | 0.3595 | 0.0694 | 0.5232 | 2.9% |
| 4700 | 36.6 | 0.7188 | 0.2812 | 0.3272 | 0.3603 | 0.0694 | 0.5232 | 2.9% |
| 4700 | 30.9 | 0.6669 | 0.3329 | 0.3161 | 0.3394 | 0.0799 | 0.6269 | 3.5% |
| 4700 | 73.8 | 0.6814 | 0.3184 | 0.3187 | 0.3444 | 0.0799 | 0.6269 | 3.3% |
| 4700 | 95.9 | 0.6912 | 0.3087 | 0.3213 | 0.3492 | 0.0799 | 0.6269 | 3.2% |
| 4700 | 81.5 | 0.7008 | 0.2991 | 0.3233 | 0.3530 | 0.0799 | 0.6269 | 3.1% |
| 4700 | 63.2 | 0.7086 | 0.2914 | 0.3245 | 0.3552 | 0.0799 | 0.6269 | 3.0% |
| 4700 | 50.7 | 0.7138 | 0.2862 | 0.3252 | 0.3565 | 0.0799 | 0.6269 | 3.0% |
| 4700 | 38.9 | 0.7188 | 0.2812 | 0.3258 | 0.3576 | 0.0799 | 0.6269 | 3.0% |
| 4700 | 32.5 | 0.6669 | 0.3329 | 0.3125 | 0.3326 | 0.0975 | 0.6902 | 3.7% |
| 4700 | 75.9 | 0.6814 | 0.3184 | 0.3158 | 0.3389 | 0.0975 | 0.6902 | 3.5% |
| 4700 | 95.6 | 0.6912 | 0.3087 | 0.3196 | 0.3459 | 0.0975 | 0.6902 | 3.3% |
| 4700 | 83.2 | 0.7008 | 0.2991 | 0.3221 | 0.3507 | 0.0975 | 0.6902 | 3.2% |
| 4700 | 64.5 | 0.7086 | 0.2914 | 0.3234 | 0.3532 | 0.0975 | 0.6902 | 3.1% |
| 4700 | 52.1 | 0.7138 | 0.2862 | 0.3243 | 0.3547 | 0.0975 | 0.6902 | 3.1% |
| 4700 | 41.0 | 0.7188 | 0.2812 | 0.3250 | 0.3562 | 0.0975 | 0.6902 | 3.0% |
| 4700 | 34.8 | 0.6669 | 0.3329 | 0.3075 | 0.3234 | 0.1270 | 0.7352 | 3.9% |
| 4700 | 76.7 | 0.6814 | 0.3184 | 0.3128 | 0.3332 | 0.1270 | 0.7352 | 3.6% |
| 4700 | 94.3 | 0.6912 | 0.3087 | 0.3179 | 0.3428 | 0.1270 | 0.7352 | 3.4% |
| 4700 | 84.2 | 0.7008 | 0.2991 | 0.3208 | 0.3482 | 0.1270 | 0.7352 | 3.2% |

TABLE 2-continued

| | | | | | | | | |
|---|---|---|---|---|---|---|---|---|
| 4700 | 65.8 | 0.7086 | 0.2914 | 0.3224 | 0.3512 | 0.1270 | 0.7352 | 3.1% |
| 4700 | 54.6 | 0.7138 | 0.2862 | 0.3235 | 0.3532 | 0.1270 | 0.7352 | 3.1% |
| 4700 | 45.7 | 0.7188 | 0.2812 | 0.3246 | 0.3553 | 0.1270 | 0.7352 | 3.0% |
| 4700 | 36.6 | 0.6669 | 0.3329 | 0.3025 | 0.3138 | 0.1561 | 0.7502 | 4.2% |
| 4700 | 76.5 | 0.6814 | 0.3184 | 0.3103 | 0.3285 | 0.1561 | 0.7502 | 3.8% |
| 4700 | 92.9 | 0.6912 | 0.3087 | 0.3166 | 0.3404 | 0.1561 | 0.7502 | 3.4% |
| 4700 | 84.8 | 0.7008 | 0.2991 | 0.3197 | 0.3462 | 0.1561 | 0.7502 | 3.3% |
| 4700 | 68.0 | 0.7086 | 0.2914 | 0.3218 | 0.3500 | 0.1561 | 0.7502 | 3.2% |
| 4700 | 59.3 | 0.7138 | 0.2862 | 0.3232 | 0.3528 | 0.1561 | 0.7502 | 3.1% |
| 4700 | 54.6 | 0.7188 | 0.2812 | 0.3248 | 0.3558 | 0.1561 | 0.7502 | 3.0% |
| 4700 | 37.9 | 0.6669 | 0.3329 | 0.2942 | 0.2984 | 0.1938 | 0.7479 | 4.8% |
| 4700 | 75.3 | 0.6814 | 0.3184 | 0.3070 | 0.3223 | 0.1938 | 0.7479 | 4.0% |
| 4700 | 92.6 | 0.6912 | 0.3087 | 0.3145 | 0.3364 | 0.1938 | 0.7479 | 3.5% |
| 4700 | 86.6 | 0.7008 | 0.2991 | 0.3185 | 0.3439 | 0.1938 | 0.7479 | 3.3% |
| 4700 | 75.4 | 0.7086 | 0.2914 | 0.3217 | 0.3499 | 0.1938 | 0.7479 | 3.2% |
| 4700 | 71.9 | 0.7138 | 0.2862 | 0.3239 | 0.3541 | 0.1938 | 0.7479 | 3.1% |
| 4700 | 71.1 | 0.7188 | 0.2812 | 0.3260 | 0.3581 | 0.1938 | 0.7479 | 3.0% |
| 4700 | 36.4 | 0.6669 | 0.3329 | 0.2823 | 0.2761 | 0.2329 | 0.7309 | 5.7% |
| 4700 | 71.8 | 0.6814 | 0.3184 | 0.3031 | 0.3151 | 0.2329 | 0.7309 | 4.2% |
| 4700 | 92.5 | 0.6912 | 0.3087 | 0.3113 | 0.3305 | 0.2329 | 0.7309 | 3.7% |
| 4700 | 93.8 | 0.7008 | 0.2991 | 0.3181 | 0.3432 | 0.2329 | 0.7309 | 3.4% |
| 4700 | 89.0 | 0.7086 | 0.2914 | 0.3228 | 0.3520 | 0.2329 | 0.7309 | 3.1% |
| 4700 | 87.7 | 0.7138 | 0.2862 | 0.3255 | 0.3570 | 0.2329 | 0.7309 | 3.0% |
| 4700 | 87.7 | 0.7188 | 0.2812 | 0.3277 | 0.3612 | 0.2329 | 0.7309 | 2.9% |
| 4600 | −2.5 | 0.6669 | 0.3329 | 0.4095 | 0.5146 | 0.1393 | 0.0514 | 0.4% |
| 4600 | 31.9 | 0.6814 | 0.3184 | 0.4095 | 0.5146 | 0.1393 | 0.0514 | 0.4% |
| 4600 | 58.6 | 0.6912 | 0.3087 | 0.4095 | 0.5146 | 0.1393 | 0.0514 | 0.4% |
| 4600 | 86.9 | 0.7008 | 0.2991 | 0.4095 | 0.5146 | 0.1393 | 0.0514 | 0.4% |
| 4600 | 89.2 | 0.7086 | 0.2914 | 0.4095 | 0.5146 | 0.1393 | 0.0514 | 0.4% |
| 4600 | 72.5 | 0.7138 | 0.2862 | 0.4095 | 0.5146 | 0.1393 | 0.0514 | 0.4% |
| 4600 | 55.9 | 0.7188 | 0.2812 | 0.4095 | 0.5146 | 0.1393 | 0.0514 | 0.4% |
| 4600 | 10.5 | 0.6669 | 0.3329 | 0.4095 | 0.5146 | 0.1303 | 0.0723 | 0.4% |
| 4600 | 49.7 | 0.6814 | 0.3184 | 0.4095 | 0.5146 | 0.1303 | 0.0723 | 0.4% |
| 4600 | 79.9 | 0.6912 | 0.3087 | 0.4095 | 0.5146 | 0.1303 | 0.0723 | 0.4% |
| 4600 | 88.9 | 0.7008 | 0.2991 | 0.4056 | 0.5073 | 0.1303 | 0.0723 | 0.5% |
| 4600 | 65.0 | 0.7086 | 0.2914 | 0.4008 | 0.4982 | 0.1303 | 0.0723 | 0.6% |
| 4600 | 47.7 | 0.7138 | 0.2862 | 0.3986 | 0.4941 | 0.1303 | 0.0723 | 0.6% |
| 4600 | 32.3 | 0.7188 | 0.2812 | 0.3942 | 0.4858 | 0.1303 | 0.0723 | 0.7% |
| 4600 | 13.6 | 0.6669 | 0.3329 | 0.3720 | 0.4441 | 0.1192 | 0.1046 | 1.3% |
| 4600 | 53.2 | 0.6814 | 0.3184 | 0.3713 | 0.4429 | 0.1192 | 0.1046 | 1.3% |
| 4600 | 82.7 | 0.6912 | 0.3087 | 0.3699 | 0.4402 | 0.1192 | 0.1046 | 1.4% |
| 4600 | 87.4 | 0.7008 | 0.2991 | 0.3670 | 0.4348 | 0.1192 | 0.1046 | 1.4% |
| 4600 | 62.4 | 0.7086 | 0.2914 | 0.3658 | 0.4326 | 0.1192 | 0.1046 | 1.5% |
| 4600 | 45.5 | 0.7138 | 0.2862 | 0.3646 | 0.4303 | 0.1192 | 0.1046 | 1.5% |
| 4600 | 30.7 | 0.7188 | 0.2812 | 0.3623 | 0.4260 | 0.1192 | 0.1046 | 1.6% |
| 4600 | 14.8 | 0.6669 | 0.3329 | 0.3541 | 0.4106 | 0.1082 | 0.1444 | 1.9% |
| 4600 | 55.6 | 0.6814 | 0.3184 | 0.3545 | 0.4114 | 0.1082 | 0.1444 | 1.8% |
| 4600 | 84.8 | 0.6912 | 0.3087 | 0.3535 | 0.4096 | 0.1082 | 0.1444 | 1.9% |
| 4600 | 85.4 | 0.7008 | 0.2991 | 0.3520 | 0.4067 | 0.1082 | 0.1444 | 1.9% |
| 4600 | 59.8 | 0.7086 | 0.2914 | 0.3516 | 0.4060 | 0.1082 | 0.1444 | 1.9% |
| 4600 | 43.9 | 0.7138 | 0.2862 | 0.3506 | 0.4041 | 0.1082 | 0.1444 | 2.0% |
| 4600 | 29.1 | 0.7188 | 0.2812 | 0.3494 | 0.4018 | 0.1082 | 0.1444 | 2.0% |
| 4600 | 16.9 | 0.6669 | 0.3329 | 0.3416 | 0.3873 | 0.0934 | 0.2133 | 2.3% |
| 4600 | 59.0 | 0.6814 | 0.3184 | 0.3424 | 0.3888 | 0.0934 | 0.2133 | 2.3% |
| 4600 | 88.0 | 0.6912 | 0.3087 | 0.3420 | 0.3880 | 0.0934 | 0.2133 | 2.3% |
| 4600 | 81.5 | 0.7008 | 0.2991 | 0.3416 | 0.3872 | 0.0934 | 0.2133 | 2.3% |
| 4600 | 57.4 | 0.7086 | 0.2914 | 0.3412 | 0.3864 | 0.0934 | 0.2133 | 2.3% |
| 4600 | 43.2 | 0.7138 | 0.2862 | 0.3405 | 0.3851 | 0.0934 | 0.2133 | 2.4% |
| 4600 | 30.2 | 0.7188 | 0.2812 | 0.3397 | 0.3837 | 0.0934 | 0.2133 | 2.4% |
| 4600 | 20.4 | 0.6669 | 0.3329 | 0.3335 | 0.3721 | 0.0792 | 0.3084 | 2.6% |
| 4600 | 63.2 | 0.6814 | 0.3184 | 0.3344 | 0.3738 | 0.0792 | 0.3084 | 2.6% |
| 4600 | 92.1 | 0.6912 | 0.3087 | 0.3346 | 0.3741 | 0.0792 | 0.3084 | 2.6% |
| 4600 | 79.2 | 0.7008 | 0.2991 | 0.3346 | 0.3741 | 0.0792 | 0.3084 | 2.6% |
| 4600 | 58.4 | 0.7086 | 0.2914 | 0.3344 | 0.3738 | 0.0792 | 0.3084 | 2.6% |
| 4600 | 44.4 | 0.7138 | 0.2862 | 0.3343 | 0.3735 | 0.0792 | 0.3084 | 2.6% |
| 4600 | 30.8 | 0.7188 | 0.2812 | 0.3342 | 0.3733 | 0.0792 | 0.3084 | 2.6% |
| 4600 | 24.1 | 0.6669 | 0.3329 | 0.3282 | 0.3621 | 0.0709 | 0.4039 | 2.9% |
| 4600 | 65.6 | 0.6814 | 0.3184 | 0.3294 | 0.3643 | 0.0709 | 0.4039 | 2.8% |
| 4600 | 94.7 | 0.6912 | 0.3087 | 0.3300 | 0.3655 | 0.0709 | 0.4039 | 2.8% |
| 4600 | 79.1 | 0.7008 | 0.2991 | 0.3306 | 0.3665 | 0.0709 | 0.4039 | 2.8% |
| 4600 | 58.4 | 0.7086 | 0.2914 | 0.3309 | 0.3672 | 0.0709 | 0.4039 | 2.8% |
| 4600 | 44.9 | 0.7138 | 0.2862 | 0.3311 | 0.3675 | 0.0709 | 0.4039 | 2.7% |
| 4600 | 32.4 | 0.7188 | 0.2812 | 0.3313 | 0.3678 | 0.0709 | 0.4039 | 2.7% |
| 4600 | 27.0 | 0.6669 | 0.3329 | 0.3227 | 0.3518 | 0.0694 | 0.5232 | 3.1% |
| 4600 | 69.0 | 0.6814 | 0.3184 | 0.3247 | 0.3555 | 0.0694 | 0.5232 | 3.0% |
| 4600 | 95.4 | 0.6912 | 0.3087 | 0.3261 | 0.3581 | 0.0694 | 0.5232 | 3.0% |
| 4600 | 79.3 | 0.7008 | 0.2991 | 0.3273 | 0.3604 | 0.0694 | 0.5232 | 2.9% |
| 4600 | 60.1 | 0.7086 | 0.2914 | 0.3281 | 0.3620 | 0.0694 | 0.5232 | 2.9% |
| 4600 | 47.6 | 0.7138 | 0.2862 | 0.3286 | 0.3629 | 0.0694 | 0.5232 | 2.9% |
| 4600 | 35.7 | 0.7188 | 0.2812 | 0.3291 | 0.3637 | 0.0694 | 0.5232 | 2.8% |

TABLE 2-continued

| | | | | | | | | |
|---|---|---|---|---|---|---|---|---|
| 4600 | 29.7 | 0.6669 | 0.3329 | 0.3180 | 0.3430 | 0.0799 | 0.6269 | 3.4% |
| 4600 | 73.0 | 0.6814 | 0.3184 | 0.3207 | 0.3480 | 0.0799 | 0.6269 | 3.2% |
| 4600 | 95.7 | 0.6912 | 0.3087 | 0.3233 | 0.3529 | 0.0799 | 0.6269 | 3.1% |
| 4600 | 81.4 | 0.7008 | 0.2991 | 0.3253 | 0.3566 | 0.0799 | 0.6269 | 3.0% |
| 4600 | 62.8 | 0.7086 | 0.2914 | 0.3265 | 0.3589 | 0.0799 | 0.6269 | 3.0% |
| 4600 | 50.1 | 0.7138 | 0.2862 | 0.3271 | 0.3601 | 0.0799 | 0.6269 | 2.9% |
| 4600 | 38.2 | 0.7188 | 0.2812 | 0.3278 | 0.3613 | 0.0799 | 0.6269 | 2.9% |
| 4600 | 31.1 | 0.6669 | 0.3329 | 0.3145 | 0.3364 | 0.0975 | 0.6902 | 3.5% |
| 4600 | 75.1 | 0.6814 | 0.3184 | 0.3178 | 0.3427 | 0.0975 | 0.6902 | 3.4% |
| 4600 | 95.4 | 0.6912 | 0.3087 | 0.3216 | 0.3497 | 0.0975 | 0.6902 | 3.2% |
| 4600 | 83.2 | 0.7008 | 0.2991 | 0.3241 | 0.3545 | 0.0975 | 0.6902 | 3.1% |
| 4600 | 64.2 | 0.7086 | 0.2914 | 0.3255 | 0.3570 | 0.0975 | 0.6902 | 3.0% |
| 4600 | 51.7 | 0.7138 | 0.2862 | 0.3263 | 0.3585 | 0.0975 | 0.6902 | 3.0% |
| 4600 | 40.4 | 0.7188 | 0.2812 | 0.3271 | 0.3600 | 0.0975 | 0.6902 | 2.9% |
| 4600 | 33.3 | 0.6669 | 0.3329 | 0.3097 | 0.3274 | 0.1270 | 0.7352 | 3.8% |
| 4600 | 76.0 | 0.6814 | 0.3184 | 0.3148 | 0.3371 | 0.1270 | 0.7352 | 3.5% |
| 4600 | 94.0 | 0.6912 | 0.3087 | 0.3200 | 0.3467 | 0.1270 | 0.7352 | 3.3% |
| 4600 | 84.3 | 0.7008 | 0.2991 | 0.3229 | 0.3522 | 0.1270 | 0.7352 | 3.1% |
| 4600 | 65.7 | 0.7086 | 0.2914 | 0.3245 | 0.3552 | 0.1270 | 0.7352 | 3.0% |
| 4600 | 54.3 | 0.7138 | 0.2862 | 0.3256 | 0.3572 | 0.1270 | 0.7352 | 3.0% |
| 4600 | 45.2 | 0.7188 | 0.2812 | 0.3267 | 0.3592 | 0.1270 | 0.7352 | 2.9% |
| 4600 | 35.1 | 0.6669 | 0.3329 | 0.3047 | 0.3180 | 0.1561 | 0.7502 | 4.1% |
| 4600 | 75.8 | 0.6814 | 0.3184 | 0.3124 | 0.3325 | 0.1561 | 0.7502 | 3.7% |
| 4600 | 92.6 | 0.6912 | 0.3087 | 0.3188 | 0.3444 | 0.1561 | 0.7502 | 3.3% |
| 4600 | 85.0 | 0.7008 | 0.2991 | 0.3219 | 0.3503 | 0.1561 | 0.7502 | 3.2% |
| 4600 | 68.0 | 0.7086 | 0.2914 | 0.3239 | 0.3541 | 0.1561 | 0.7502 | 3.1% |
| 4600 | 59.0 | 0.7138 | 0.2862 | 0.3254 | 0.3568 | 0.1561 | 0.7502 | 3.0% |
| 4600 | 54.0 | 0.7188 | 0.2812 | 0.3270 | 0.3598 | 0.1561 | 0.7502 | 2.9% |
| 4600 | 36.5 | 0.6669 | 0.3329 | 0.2966 | 0.3029 | 0.1938 | 0.7479 | 4.6% |
| 4600 | 74.7 | 0.6814 | 0.3184 | 0.3092 | 0.3264 | 0.1938 | 0.7479 | 3.8% |
| 4600 | 92.1 | 0.6912 | 0.3087 | 0.3168 | 0.3407 | 0.1938 | 0.7479 | 3.4% |
| 4600 | 86.9 | 0.7008 | 0.2991 | 0.3208 | 0.3482 | 0.1938 | 0.7479 | 3.2% |
| 4600 | 75.3 | 0.7086 | 0.2914 | 0.3240 | 0.3542 | 0.1938 | 0.7479 | 3.1% |
| 4600 | 71.6 | 0.7138 | 0.2862 | 0.3262 | 0.3583 | 0.1938 | 0.7479 | 3.0% |
| 4600 | 70.6 | 0.7188 | 0.2812 | 0.3283 | 0.3623 | 0.1938 | 0.7479 | 2.9% |
| 4600 | 35.1 | 0.6669 | 0.3329 | 0.2849 | 0.2809 | 0.2329 | 0.7309 | 5.4% |
| 4600 | 71.2 | 0.6814 | 0.3184 | 0.3055 | 0.3196 | 0.2329 | 0.7309 | 4.0% |
| 4600 | 92.0 | 0.6912 | 0.3087 | 0.3138 | 0.3352 | 0.2329 | 0.7309 | 3.6% |
| 4600 | 93.9 | 0.7008 | 0.2991 | 0.3205 | 0.3477 | 0.2329 | 0.7309 | 3.2% |
| 4600 | 89.0 | 0.7086 | 0.2914 | 0.3252 | 0.3564 | 0.2329 | 0.7309 | 3.0% |
| 4600 | 87.5 | 0.7138 | 0.2862 | 0.3278 | 0.3614 | 0.2329 | 0.7309 | 2.9% |
| 4600 | 87.4 | 0.7188 | 0.2812 | 0.3301 | 0.3656 | 0.2329 | 0.7309 | 2.8% |
| 4500 | −2.8 | 0.6669 | 0.3329 | 0.4095 | 0.5146 | 0.1393 | 0.0514 | 0.4% |
| 4500 | 32.8 | 0.6814 | 0.3184 | 0.4095 | 0.5146 | 0.1393 | 0.0514 | 0.4% |
| 4500 | 60.4 | 0.6912 | 0.3087 | 0.4095 | 0.5146 | 0.1393 | 0.0514 | 0.4% |
| 4500 | 89.6 | 0.7008 | 0.2991 | 0.4095 | 0.5146 | 0.1393 | 0.0514 | 0.4% |
| 4500 | 85.7 | 0.7086 | 0.2914 | 0.4095 | 0.5146 | 0.1393 | 0.0514 | 0.4% |
| 4500 | 68.4 | 0.7138 | 0.2862 | 0.4095 | 0.5146 | 0.1393 | 0.0514 | 0.4% |
| 4500 | 51.2 | 0.7188 | 0.2812 | 0.4095 | 0.5146 | 0.1393 | 0.0514 | 0.4% |
| 4500 | 9.7 | 0.6669 | 0.3329 | 0.4095 | 0.5146 | 0.1303 | 0.0723 | 0.4% |
| 4500 | 49.8 | 0.6814 | 0.3184 | 0.4095 | 0.5146 | 0.1303 | 0.0723 | 0.4% |
| 4500 | 80.8 | 0.6912 | 0.3087 | 0.4095 | 0.5146 | 0.1303 | 0.0723 | 0.4% |
| 4500 | 87.8 | 0.7008 | 0.2991 | 0.4047 | 0.5055 | 0.1303 | 0.0723 | 0.5% |
| 4500 | 62.8 | 0.7086 | 0.2914 | 0.4007 | 0.4981 | 0.1303 | 0.0723 | 0.6% |
| 4500 | 45.3 | 0.7138 | 0.2862 | 0.3981 | 0.4932 | 0.1303 | 0.0723 | 0.6% |
| 4500 | 29.8 | 0.7188 | 0.2812 | 0.3930 | 0.4837 | 0.1303 | 0.0723 | 0.7% |
| 4500 | 12.9 | 0.6669 | 0.3329 | 0.3735 | 0.4471 | 0.1192 | 0.1046 | 1.3% |
| 4500 | 53.5 | 0.6814 | 0.3184 | 0.3727 | 0.4456 | 0.1192 | 0.1046 | 1.3% |
| 4500 | 83.3 | 0.6912 | 0.3087 | 0.3709 | 0.4421 | 0.1192 | 0.1046 | 1.3% |
| 4500 | 86.2 | 0.7008 | 0.2991 | 0.3678 | 0.4363 | 0.1192 | 0.1046 | 1.4% |
| 4500 | 60.2 | 0.7086 | 0.2914 | 0.3669 | 0.4346 | 0.1192 | 0.1046 | 1.5% |
| 4500 | 43.5 | 0.7138 | 0.2862 | 0.3652 | 0.4315 | 0.1192 | 0.1046 | 1.5% |
| 4500 | 28.4 | 0.7188 | 0.2812 | 0.3628 | 0.4270 | 0.1192 | 0.1046 | 1.6% |
| 4500 | 14.0 | 0.6669 | 0.3329 | 0.3558 | 0.4138 | 0.1082 | 0.1444 | 1.8% |
| 4500 | 55.7 | 0.6814 | 0.3184 | 0.3561 | 0.4145 | 0.1082 | 0.1444 | 1.8% |
| 4500 | 85.2 | 0.6912 | 0.3087 | 0.3549 | 0.4121 | 0.1082 | 0.1444 | 1.8% |
| 4500 | 84.1 | 0.7008 | 0.2991 | 0.3534 | 0.4093 | 0.1082 | 0.1444 | 1.9% |
| 4500 | 58.0 | 0.7086 | 0.2914 | 0.3529 | 0.4084 | 0.1082 | 0.1444 | 1.9% |
| 4500 | 42.0 | 0.7138 | 0.2862 | 0.3518 | 0.4063 | 0.1082 | 0.1444 | 1.9% |
| 4500 | 27.3 | 0.7188 | 0.2812 | 0.3503 | 0.4036 | 0.1082 | 0.1444 | 2.0% |
| 4500 | 16.1 | 0.6669 | 0.3329 | 0.3434 | 0.3905 | 0.0934 | 0.2133 | 2.2% |
| 4500 | 58.9 | 0.6814 | 0.3184 | 0.3441 | 0.3919 | 0.0934 | 0.2133 | 2.2% |
| 4500 | 88.5 | 0.6912 | 0.3087 | 0.3437 | 0.3911 | 0.0934 | 0.2133 | 2.2% |
| 4500 | 80.0 | 0.7008 | 0.2991 | 0.3433 | 0.3903 | 0.0934 | 0.2133 | 2.3% |
| 4500 | 56.4 | 0.7086 | 0.2914 | 0.3426 | 0.3891 | 0.0934 | 0.2133 | 2.3% |
| 4500 | 42.2 | 0.7138 | 0.2862 | 0.3418 | 0.3876 | 0.0934 | 0.2133 | 2.3% |
| 4500 | 29.0 | 0.7188 | 0.2812 | 0.3410 | 0.3861 | 0.0934 | 0.2133 | 2.3% |
| 4500 | 19.4 | 0.6669 | 0.3329 | 0.3353 | 0.3755 | 0.0792 | 0.3084 | 2.6% |
| 4500 | 63.0 | 0.6814 | 0.3184 | 0.3362 | 0.3771 | 0.0792 | 0.3084 | 2.5% |
| 4500 | 92.2 | 0.6912 | 0.3087 | 0.3363 | 0.3774 | 0.0792 | 0.3084 | 2.5% |

TABLE 2-continued

| | | | | | | | | |
|---|---|---|---|---|---|---|---|---|
| 4500 | 78.9 | 0.7008 | 0.2991 | 0.3363 | 0.3772 | 0.0792 | 0.3084 | 2.5% |
| 4500 | 57.8 | 0.7086 | 0.2914 | 0.3360 | 0.3768 | 0.0792 | 0.3084 | 2.5% |
| 4500 | 43.4 | 0.7138 | 0.2862 | 0.3359 | 0.3766 | 0.0792 | 0.3084 | 2.5% |
| 4500 | 29.6 | 0.7188 | 0.2812 | 0.3358 | 0.3763 | 0.0792 | 0.3084 | 2.6% |
| 4500 | 23.0 | 0.6669 | 0.3329 | 0.3300 | 0.3655 | 0.0709 | 0.4039 | 2.8% |
| 4500 | 65.1 | 0.6814 | 0.3184 | 0.3312 | 0.3678 | 0.0709 | 0.4039 | 2.7% |
| 4500 | 94.7 | 0.6912 | 0.3087 | 0.3319 | 0.3690 | 0.0709 | 0.4039 | 2.7% |
| 4500 | 78.7 | 0.7008 | 0.2991 | 0.3324 | 0.3699 | 0.0709 | 0.4039 | 2.7% |
| 4500 | 57.7 | 0.7086 | 0.2914 | 0.3327 | 0.3705 | 0.0709 | 0.4039 | 2.7% |
| 4500 | 44.1 | 0.7138 | 0.2862 | 0.3329 | 0.3709 | 0.0709 | 0.4039 | 2.7% |
| 4500 | 31.4 | 0.7188 | 0.2812 | 0.3330 | 0.3711 | 0.0709 | 0.4039 | 2.7% |
| 4500 | 25.8 | 0.6669 | 0.3329 | 0.3247 | 0.3555 | 0.0694 | 0.5232 | 3.0% |
| 4500 | 68.4 | 0.6814 | 0.3184 | 0.3266 | 0.3591 | 0.0694 | 0.5232 | 2.9% |
| 4500 | 95.3 | 0.6912 | 0.3087 | 0.3280 | 0.3617 | 0.0694 | 0.5232 | 2.9% |
| 4500 | 79.1 | 0.7008 | 0.2991 | 0.3292 | 0.3640 | 0.0694 | 0.5232 | 2.8% |
| 4500 | 59.6 | 0.7086 | 0.2914 | 0.3300 | 0.3656 | 0.0694 | 0.5232 | 2.8% |
| 4500 | 46.9 | 0.7138 | 0.2862 | 0.3305 | 0.3665 | 0.0694 | 0.5232 | 2.8% |
| 4500 | 34.8 | 0.7188 | 0.2812 | 0.3310 | 0.3673 | 0.0694 | 0.5232 | 2.8% |
| 4500 | 28.3 | 0.6669 | 0.3329 | 0.3200 | 0.3468 | 0.0799 | 0.6269 | 3.3% |
| 4500 | 72.2 | 0.6814 | 0.3184 | 0.3227 | 0.3519 | 0.0799 | 0.6269 | 3.1% |
| 4500 | 95.5 | 0.6912 | 0.3087 | 0.3253 | 0.3566 | 0.0799 | 0.6269 | 3.0% |
| 4500 | 81.2 | 0.7008 | 0.2991 | 0.3273 | 0.3604 | 0.0799 | 0.6269 | 2.9% |
| 4500 | 62.4 | 0.7086 | 0.2914 | 0.3285 | 0.3626 | 0.0799 | 0.6269 | 2.9% |
| 4500 | 49.6 | 0.7138 | 0.2862 | 0.3292 | 0.3639 | 0.0799 | 0.6269 | 2.8% |
| 4500 | 37.5 | 0.7188 | 0.2812 | 0.3298 | 0.3651 | 0.0799 | 0.6269 | 2.8% |
| 4500 | 29.7 | 0.6669 | 0.3329 | 0.3166 | 0.3403 | 0.0975 | 0.6902 | 3.4% |
| 4500 | 74.2 | 0.6814 | 0.3184 | 0.3200 | 0.3466 | 0.0975 | 0.6902 | 3.3% |
| 4500 | 95.1 | 0.6912 | 0.3087 | 0.3236 | 0.3535 | 0.0975 | 0.6902 | 3.1% |
| 4500 | 83.2 | 0.7008 | 0.2991 | 0.3262 | 0.3584 | 0.0975 | 0.6902 | 3.0% |
| 4500 | 63.9 | 0.7086 | 0.2914 | 0.3276 | 0.3609 | 0.0975 | 0.6902 | 2.9% |
| 4500 | 51.3 | 0.7138 | 0.2862 | 0.3284 | 0.3625 | 0.0975 | 0.6902 | 2.9% |
| 4500 | 39.8 | 0.7188 | 0.2812 | 0.3292 | 0.3639 | 0.0975 | 0.6902 | 2.8% |
| 4500 | 31.8 | 0.6669 | 0.3329 | 0.3119 | 0.3315 | 0.1270 | 0.7352 | 3.7% |
| 4500 | 75.2 | 0.6814 | 0.3184 | 0.3170 | 0.3411 | 0.1270 | 0.7352 | 3.4% |
| 4500 | 93.7 | 0.6912 | 0.3087 | 0.3221 | 0.3507 | 0.1270 | 0.7352 | 3.2% |
| 4500 | 84.4 | 0.7008 | 0.2991 | 0.3251 | 0.3562 | 0.1270 | 0.7352 | 3.0% |
| 4500 | 65.6 | 0.7086 | 0.2914 | 0.3267 | 0.3593 | 0.1270 | 0.7352 | 2.9% |
| 4500 | 54.0 | 0.7138 | 0.2862 | 0.3278 | 0.3613 | 0.1270 | 0.7352 | 2.9% |
| 4500 | 44.6 | 0.7188 | 0.2812 | 0.3288 | 0.3633 | 0.1270 | 0.7352 | 2.8% |
| 4500 | 33.6 | 0.6669 | 0.3329 | 0.3070 | 0.3224 | 0.1561 | 0.7502 | 4.0% |
| 4500 | 75.1 | 0.6814 | 0.3184 | 0.3146 | 0.3367 | 0.1561 | 0.7502 | 3.5% |
| 4500 | 92.2 | 0.6912 | 0.3087 | 0.3210 | 0.3486 | 0.1561 | 0.7502 | 3.2% |
| 4500 | 85.2 | 0.7008 | 0.2991 | 0.3242 | 0.3545 | 0.1561 | 0.7502 | 3.1% |
| 4500 | 67.9 | 0.7086 | 0.2914 | 0.3262 | 0.3584 | 0.1561 | 0.7502 | 3.0% |
| 4500 | 58.7 | 0.7138 | 0.2862 | 0.3276 | 0.3611 | 0.1561 | 0.7502 | 2.9% |
| 4500 | 53.3 | 0.7188 | 0.2812 | 0.3292 | 0.3640 | 0.1561 | 0.7502 | 2.8% |
| 4500 | 35.0 | 0.6669 | 0.3329 | 0.2991 | 0.3076 | 0.1938 | 0.7479 | 4.4% |
| 4500 | 74.1 | 0.6814 | 0.3184 | 0.3114 | 0.3307 | 0.1938 | 0.7479 | 3.7% |
| 4500 | 91.5 | 0.6912 | 0.3087 | 0.3191 | 0.3451 | 0.1938 | 0.7479 | 3.3% |
| 4500 | 87.2 | 0.7008 | 0.2991 | 0.3232 | 0.3527 | 0.1938 | 0.7479 | 3.1% |
| 4500 | 75.2 | 0.7086 | 0.2914 | 0.3263 | 0.3586 | 0.1938 | 0.7479 | 3.0% |
| 4500 | 71.2 | 0.7138 | 0.2862 | 0.3285 | 0.3627 | 0.1938 | 0.7479 | 2.9% |
| 4500 | 69.9 | 0.7188 | 0.2812 | 0.3306 | 0.3666 | 0.1938 | 0.7479 | 2.8% |
| 4500 | 33.8 | 0.6669 | 0.3329 | 0.2876 | 0.2860 | 0.2329 | 0.7309 | 5.2% |
| 4500 | 70.5 | 0.6814 | 0.3184 | 0.3080 | 0.3242 | 0.2329 | 0.7309 | 3.9% |
| 4500 | 91.4 | 0.6912 | 0.3087 | 0.3164 | 0.3400 | 0.2329 | 0.7309 | 3.4% |
| 4500 | 94.1 | 0.7008 | 0.2991 | 0.3230 | 0.3524 | 0.2329 | 0.7309 | 3.1% |
| 4500 | 88.9 | 0.7086 | 0.2914 | 0.3276 | 0.3610 | 0.2329 | 0.7309 | 2.9% |
| 4500 | 87.3 | 0.7138 | 0.2862 | 0.3303 | 0.3660 | 0.2329 | 0.7309 | 2.8% |
| 4500 | 86.8 | 0.7188 | 0.2812 | 0.3325 | 0.3701 | 0.2329 | 0.7309 | 2.7% |
| 4400 | −3.1 | 0.6669 | 0.3329 | 0.4095 | 0.5146 | 0.1393 | 0.0514 | 0.4% |
| 4400 | 33.7 | 0.6814 | 0.3184 | 0.4095 | 0.5146 | 0.1393 | 0.0514 | 0.4% |
| 4400 | 62.2 | 0.6912 | 0.3087 | 0.4095 | 0.5146 | 0.1393 | 0.0514 | 0.4% |
| 4400 | 92.4 | 0.7008 | 0.2991 | 0.4095 | 0.5146 | 0.1393 | 0.0514 | 0.4% |
| 4400 | 82.1 | 0.7086 | 0.2914 | 0.4095 | 0.5146 | 0.1393 | 0.0514 | 0.4% |
| 4400 | 64.2 | 0.7138 | 0.2862 | 0.4095 | 0.5146 | 0.1393 | 0.0514 | 0.4% |
| 4400 | 46.5 | 0.7188 | 0.2812 | 0.4095 | 0.5146 | 0.1393 | 0.0514 | 0.4% |
| 4400 | 8.8 | 0.6669 | 0.3329 | 0.4095 | 0.5146 | 0.1303 | 0.0723 | 0.4% |
| 4400 | 49.9 | 0.6814 | 0.3184 | 0.4095 | 0.5146 | 0.1303 | 0.0723 | 0.4% |
| 4400 | 81.6 | 0.6912 | 0.3087 | 0.4095 | 0.5146 | 0.1303 | 0.0723 | 0.4% |
| 4400 | 86.8 | 0.7008 | 0.2991 | 0.4032 | 0.5027 | 0.1303 | 0.0723 | 0.5% |
| 4400 | 60.4 | 0.7086 | 0.2914 | 0.4008 | 0.4982 | 0.1303 | 0.0723 | 0.6% |
| 4400 | 42.9 | 0.7138 | 0.2862 | 0.3973 | 0.4917 | 0.1303 | 0.0723 | 0.6% |
| 4400 | 27.2 | 0.7188 | 0.2812 | 0.3918 | 0.4813 | 0.1303 | 0.0723 | 0.8% |
| 4400 | 12.1 | 0.6669 | 0.3329 | 0.3751 | 0.4501 | 0.1192 | 0.1046 | 1.2% |
| 4400 | 53.7 | 0.6814 | 0.3184 | 0.3742 | 0.4484 | 0.1192 | 0.1046 | 1.2% |
| 4400 | 84.0 | 0.6912 | 0.3087 | 0.3719 | 0.4441 | 0.1192 | 0.1046 | 1.3% |
| 4400 | 85.0 | 0.7008 | 0.2991 | 0.3686 | 0.4378 | 0.1192 | 0.1046 | 1.4% |
| 4400 | 58.2 | 0.7086 | 0.2914 | 0.3678 | 0.4364 | 0.1192 | 0.1046 | 1.4% |
| 4400 | 41.6 | 0.7138 | 0.2862 | 0.3656 | 0.4323 | 0.1192 | 0.1046 | 1.5% |

TABLE 2-continued

| | | | | | | | | |
|---|---|---|---|---|---|---|---|---|
| 4400 | 25.5 | 0.7188 | 0.2812 | 0.3636 | 0.4285 | 0.1192 | 0.1046 | 1.6% |
| 4400 | 13.2 | 0.6669 | 0.3329 | 0.3575 | 0.4170 | 0.1082 | 0.1444 | 1.7% |
| 4400 | 55.8 | 0.6814 | 0.3184 | 0.3577 | 0.4175 | 0.1082 | 0.1444 | 1.7% |
| 4400 | 85.8 | 0.6912 | 0.3087 | 0.3563 | 0.4148 | 0.1082 | 0.1444 | 1.8% |
| 4400 | 82.5 | 0.7008 | 0.2991 | 0.3549 | 0.4121 | 0.1082 | 0.1444 | 1.8% |
| 4400 | 56.5 | 0.7086 | 0.2914 | 0.3541 | 0.4106 | 0.1082 | 0.1444 | 1.9% |
| 4400 | 40.0 | 0.7138 | 0.2862 | 0.3529 | 0.4085 | 0.1082 | 0.1444 | 1.9% |
| 4400 | 25.7 | 0.7188 | 0.2812 | 0.3511 | 0.4051 | 0.1082 | 0.1444 | 2.0% |
| 4400 | 15.2 | 0.6669 | 0.3329 | 0.3451 | 0.3939 | 0.0934 | 0.2133 | 2.2% |
| 4400 | 58.7 | 0.6814 | 0.3184 | 0.3458 | 0.3951 | 0.0934 | 0.2133 | 2.2% |
| 4400 | 89.0 | 0.6912 | 0.3087 | 0.3453 | 0.3942 | 0.0934 | 0.2133 | 2.2% |
| 4400 | 79.0 | 0.7008 | 0.2991 | 0.3449 | 0.3933 | 0.0934 | 0.2133 | 2.2% |
| 4400 | 55.5 | 0.7086 | 0.2914 | 0.3440 | 0.3918 | 0.0934 | 0.2133 | 2.2% |
| 4400 | 41.4 | 0.7138 | 0.2862 | 0.3431 | 0.3901 | 0.0934 | 0.2133 | 2.3% |
| 4400 | 27.9 | 0.7188 | 0.2812 | 0.3423 | 0.3885 | 0.0934 | 0.2133 | 2.3% |
| 4400 | 18.3 | 0.6669 | 0.3329 | 0.3372 | 0.3790 | 0.0792 | 0.3084 | 2.5% |
| 4400 | 62.8 | 0.6814 | 0.3184 | 0.3381 | 0.3806 | 0.0792 | 0.3084 | 2.5% |
| 4400 | 92.4 | 0.6912 | 0.3087 | 0.3382 | 0.3808 | 0.0792 | 0.3084 | 2.5% |
| 4400 | 78.7 | 0.7008 | 0.2991 | 0.3380 | 0.3804 | 0.0792 | 0.3084 | 2.5% |
| 4400 | 57.0 | 0.7086 | 0.2914 | 0.3377 | 0.3800 | 0.0792 | 0.3084 | 2.5% |
| 4400 | 42.2 | 0.7138 | 0.2862 | 0.3376 | 0.3797 | 0.0792 | 0.3084 | 2.5% |
| 4400 | 28.4 | 0.7188 | 0.2812 | 0.3374 | 0.3794 | 0.0792 | 0.3084 | 2.5% |
| 4400 | 21.8 | 0.6669 | 0.3329 | 0.3319 | 0.3691 | 0.0709 | 0.4039 | 2.7% |
| 4400 | 64.7 | 0.6814 | 0.3184 | 0.3331 | 0.3714 | 0.0709 | 0.4039 | 2.7% |
| 4400 | 94.7 | 0.6912 | 0.3087 | 0.3338 | 0.3726 | 0.0709 | 0.4039 | 2.6% |
| 4400 | 78.2 | 0.7008 | 0.2991 | 0.3342 | 0.3734 | 0.0709 | 0.4039 | 2.6% |
| 4400 | 56.9 | 0.7086 | 0.2914 | 0.3345 | 0.3740 | 0.0709 | 0.4039 | 2.6% |
| 4400 | 43.2 | 0.7138 | 0.2862 | 0.3347 | 0.3743 | 0.0709 | 0.4039 | 2.6% |
| 4400 | 30.3 | 0.7188 | 0.2812 | 0.3348 | 0.3745 | 0.0709 | 0.4039 | 2.6% |
| 4400 | 24.5 | 0.6669 | 0.3329 | 0.3266 | 0.3592 | 0.0694 | 0.5232 | 2.9% |
| 4400 | 67.8 | 0.6814 | 0.3184 | 0.3286 | 0.3629 | 0.0694 | 0.5232 | 2.9% |
| 4400 | 95.2 | 0.6912 | 0.3087 | 0.3300 | 0.3654 | 0.0694 | 0.5232 | 2.8% |
| 4400 | 78.8 | 0.7008 | 0.2991 | 0.3312 | 0.3678 | 0.0694 | 0.5232 | 2.7% |
| 4400 | 59.0 | 0.7086 | 0.2914 | 0.3320 | 0.3693 | 0.0694 | 0.5232 | 2.7% |
| 4400 | 46.1 | 0.7138 | 0.2862 | 0.3325 | 0.3702 | 0.0694 | 0.5232 | 2.7% |
| 4400 | 33.8 | 0.7188 | 0.2812 | 0.3329 | 0.3710 | 0.0694 | 0.5232 | 2.7% |
| 4400 | 26.9 | 0.6669 | 0.3329 | 0.3221 | 0.3507 | 0.0799 | 0.6269 | 3.2% |
| 4400 | 71.3 | 0.6814 | 0.3184 | 0.3249 | 0.3558 | 0.0799 | 0.6269 | 3.0% |
| 4400 | 95.3 | 0.6912 | 0.3087 | 0.3274 | 0.3605 | 0.0799 | 0.6269 | 2.9% |
| 4400 | 81.1 | 0.7008 | 0.2991 | 0.3294 | 0.3643 | 0.0799 | 0.6269 | 2.8% |
| 4400 | 62.0 | 0.7086 | 0.2914 | 0.3306 | 0.3665 | 0.0799 | 0.6269 | 2.8% |
| 4400 | 49.0 | 0.7138 | 0.2862 | 0.3312 | 0.3678 | 0.0799 | 0.6269 | 2.7% |
| 4400 | 36.7 | 0.7188 | 0.2812 | 0.3319 | 0.3690 | 0.0799 | 0.6269 | 2.7% |
| 4400 | 28.2 | 0.6669 | 0.3329 | 0.3187 | 0.3443 | 0.0975 | 0.6902 | 3.3% |
| 4400 | 73.2 | 0.6814 | 0.3184 | 0.3221 | 0.3507 | 0.0975 | 0.6902 | 3.2% |
| 4400 | 94.9 | 0.6912 | 0.3087 | 0.3258 | 0.3575 | 0.0975 | 0.6902 | 3.0% |
| 4400 | 83.2 | 0.7008 | 0.2991 | 0.3284 | 0.3624 | 0.0975 | 0.6902 | 2.9% |
| 4400 | 63.7 | 0.7086 | 0.2914 | 0.3297 | 0.3650 | 0.0975 | 0.6902 | 2.8% |
| 4400 | 50.9 | 0.7138 | 0.2862 | 0.3305 | 0.3665 | 0.0975 | 0.6902 | 2.8% |
| 4400 | 39.2 | 0.7188 | 0.2812 | 0.3313 | 0.3680 | 0.0975 | 0.6902 | 2.7% |
| 4400 | 30.2 | 0.6669 | 0.3329 | 0.3142 | 0.3358 | 0.1270 | 0.7352 | 3.6% |
| 4400 | 74.4 | 0.6814 | 0.3184 | 0.3192 | 0.3453 | 0.1270 | 0.7352 | 3.3% |
| 4400 | 93.4 | 0.6912 | 0.3087 | 0.3243 | 0.3548 | 0.1270 | 0.7352 | 3.1% |
| 4400 | 84.5 | 0.7008 | 0.2991 | 0.3273 | 0.3605 | 0.1270 | 0.7352 | 2.9% |
| 4400 | 65.5 | 0.7086 | 0.2914 | 0.3290 | 0.3635 | 0.1270 | 0.7352 | 2.8% |
| 4400 | 53.7 | 0.7138 | 0.2862 | 0.3300 | 0.3655 | 0.1270 | 0.7352 | 2.8% |
| 4400 | 44.0 | 0.7188 | 0.2812 | 0.3311 | 0.3675 | 0.1270 | 0.7352 | 2.8% |
| 4400 | 32.0 | 0.6669 | 0.3329 | 0.3094 | 0.3269 | 0.1561 | 0.7502 | 3.8% |
| 4400 | 74.3 | 0.6814 | 0.3184 | 0.3169 | 0.3410 | 0.1561 | 0.7502 | 3.4% |
| 4400 | 91.8 | 0.6912 | 0.3087 | 0.3233 | 0.3529 | 0.1561 | 0.7502 | 3.1% |
| 4400 | 85.4 | 0.7008 | 0.2991 | 0.3265 | 0.3589 | 0.1561 | 0.7502 | 3.0% |
| 4400 | 67.9 | 0.7086 | 0.2914 | 0.3285 | 0.3627 | 0.1561 | 0.7502 | 2.9% |
| 4400 | 58.3 | 0.7138 | 0.2862 | 0.3300 | 0.3654 | 0.1561 | 0.7502 | 2.8% |
| 4400 | 52.5 | 0.7188 | 0.2812 | 0.3315 | 0.3683 | 0.1561 | 0.7502 | 2.7% |
| 4400 | 33.4 | 0.6669 | 0.3329 | 0.3017 | 0.3124 | 0.1938 | 0.7479 | 4.3% |
| 4400 | 73.4 | 0.6814 | 0.3184 | 0.3138 | 0.3351 | 0.1938 | 0.7479 | 3.6% |
| 4400 | 91.0 | 0.6912 | 0.3087 | 0.3216 | 0.3497 | 0.1938 | 0.7479 | 3.2% |
| 4400 | 87.5 | 0.7008 | 0.2991 | 0.3256 | 0.3573 | 0.1938 | 0.7479 | 3.0% |
| 4400 | 75.1 | 0.7086 | 0.2914 | 0.3287 | 0.3631 | 0.1938 | 0.7479 | 2.9% |
| 4400 | 70.7 | 0.7138 | 0.2862 | 0.3309 | 0.3672 | 0.1938 | 0.7479 | 2.8% |
| 4400 | 69.2 | 0.7188 | 0.2812 | 0.3330 | 0.3710 | 0.1938 | 0.7479 | 2.7% |
| 4400 | 32.4 | 0.6669 | 0.3329 | 0.2904 | 0.2913 | 0.2329 | 0.7309 | 5.0% |
| 4400 | 69.9 | 0.6814 | 0.3184 | 0.3105 | 0.3290 | 0.2329 | 0.7309 | 3.8% |
| 4400 | 90.7 | 0.6912 | 0.3087 | 0.3190 | 0.3449 | 0.2329 | 0.7309 | 3.3% |
| 4400 | 94.3 | 0.7008 | 0.2991 | 0.3256 | 0.3572 | 0.2329 | 0.7309 | 3.0% |
| 4400 | 88.8 | 0.7086 | 0.2914 | 0.3302 | 0.3658 | 0.2329 | 0.7309 | 2.8% |
| 4400 | 87.0 | 0.7138 | 0.2862 | 0.3328 | 0.3707 | 0.2329 | 0.7309 | 2.7% |
| 4400 | 80.5 | 0.7188 | 0.2812 | 0.3342 | 0.3733 | 0.2329 | 0.7309 | 2.6% |
| 4300 | −3.5 | 0.6669 | 0.3329 | 0.4095 | 0.5146 | 0.1393 | 0.0514 | 0.4% |
| 4300 | 34.6 | 0.6814 | 0.3184 | 0.4095 | 0.5146 | 0.1393 | 0.0514 | 0.4% |

TABLE 2-continued

| | | | | | | | | |
|---|---|---|---|---|---|---|---|---|
| 4300 | 64.1 | 0.6912 | 0.3087 | 0.4095 | 0.5146 | 0.1393 | 0.0514 | 0.4% |
| 4300 | 95.3 | 0.7008 | 0.2991 | 0.4095 | 0.5146 | 0.1393 | 0.0514 | 0.4% |
| 4300 | 78.4 | 0.7086 | 0.2914 | 0.4095 | 0.5146 | 0.1393 | 0.0514 | 0.4% |
| 4300 | 59.9 | 0.7138 | 0.2862 | 0.4095 | 0.5146 | 0.1393 | 0.0514 | 0.4% |
| 4300 | 41.6 | 0.7188 | 0.2812 | 0.4095 | 0.5146 | 0.1393 | 0.0514 | 0.4% |
| 4300 | 7.8 | 0.6669 | 0.3329 | 0.4095 | 0.5146 | 0.1303 | 0.0723 | 0.4% |
| 4300 | 50.0 | 0.6814 | 0.3184 | 0.4095 | 0.5146 | 0.1303 | 0.0723 | 0.4% |
| 4300 | 82.5 | 0.6912 | 0.3087 | 0.4095 | 0.5146 | 0.1303 | 0.0723 | 0.4% |
| 4300 | 85.7 | 0.7008 | 0.2991 | 0.4019 | 0.5004 | 0.1303 | 0.0723 | 0.5% |
| 4300 | 58.0 | 0.7086 | 0.2914 | 0.4006 | 0.4979 | 0.1303 | 0.0723 | 0.6% |
| 4300 | 40.7 | 0.7138 | 0.2862 | 0.3960 | 0.4892 | 0.1303 | 0.0723 | 0.7% |
| 4300 | 23.8 | 0.7188 | 0.2812 | 0.3917 | 0.4812 | 0.1303 | 0.0723 | 0.8% |
| 4300 | 11.3 | 0.6669 | 0.3329 | 0.3767 | 0.4530 | 0.1192 | 0.1046 | 1.2% |
| 4300 | 53.8 | 0.6814 | 0.3184 | 0.3756 | 0.4511 | 0.1192 | 0.1046 | 1.2% |
| 4300 | 84.8 | 0.6912 | 0.3087 | 0.3731 | 0.4462 | 0.1192 | 0.1046 | 1.3% |
| 4300 | 83.5 | 0.7008 | 0.2991 | 0.3696 | 0.4398 | 0.1192 | 0.1046 | 1.4% |
| 4300 | 56.3 | 0.7086 | 0.2914 | 0.3685 | 0.4377 | 0.1192 | 0.1046 | 1.4% |
| 4300 | 39.1 | 0.7138 | 0.2862 | 0.3665 | 0.4339 | 0.1192 | 0.1046 | 1.5% |
| 4300 | 23.0 | 0.7188 | 0.2812 | 0.3640 | 0.4293 | 0.1192 | 0.1046 | 1.5% |
| 4300 | 12.3 | 0.6669 | 0.3329 | 0.3592 | 0.4202 | 0.1082 | 0.1444 | 1.7% |
| 4300 | 55.8 | 0.6814 | 0.3184 | 0.3593 | 0.4205 | 0.1082 | 0.1444 | 1.7% |
| 4300 | 86.5 | 0.6912 | 0.3087 | 0.3578 | 0.4176 | 0.1082 | 0.1444 | 1.7% |
| 4300 | 80.9 | 0.7008 | 0.2991 | 0.3564 | 0.4150 | 0.1082 | 0.1444 | 1.8% |
| 4300 | 54.6 | 0.7086 | 0.2914 | 0.3554 | 0.4131 | 0.1082 | 0.1444 | 1.8% |
| 4300 | 38.3 | 0.7138 | 0.2862 | 0.3539 | 0.4104 | 0.1082 | 0.1444 | 1.9% |
| 4300 | 24.4 | 0.7188 | 0.2812 | 0.3518 | 0.4064 | 0.1082 | 0.1444 | 1.9% |
| 4300 | 14.2 | 0.6669 | 0.3329 | 0.3470 | 0.3973 | 0.0934 | 0.2133 | 2.1% |
| 4300 | 58.5 | 0.6814 | 0.3184 | 0.3476 | 0.3984 | 0.0934 | 0.2133 | 2.1% |
| 4300 | 89.6 | 0.6912 | 0.3087 | 0.3471 | 0.3975 | 0.0934 | 0.2133 | 2.1% |
| 4300 | 78.1 | 0.7008 | 0.2991 | 0.3465 | 0.3964 | 0.0934 | 0.2133 | 2.1% |
| 4300 | 54.8 | 0.7086 | 0.2914 | 0.3454 | 0.3944 | 0.0934 | 0.2133 | 2.2% |
| 4300 | 40.7 | 0.7138 | 0.2862 | 0.3444 | 0.3925 | 0.0934 | 0.2133 | 2.2% |
| 4300 | 26.7 | 0.7188 | 0.2812 | 0.3436 | 0.3909 | 0.0934 | 0.2133 | 2.2% |
| 4300 | 17.2 | 0.6669 | 0.3329 | 0.3391 | 0.3825 | 0.0792 | 0.3084 | 2.4% |
| 4300 | 62.6 | 0.6814 | 0.3184 | 0.3400 | 0.3842 | 0.0792 | 0.3084 | 2.4% |
| 4300 | 92.7 | 0.6912 | 0.3087 | 0.3400 | 0.3843 | 0.0792 | 0.3084 | 2.4% |
| 4300 | 78.5 | 0.7008 | 0.2991 | 0.3397 | 0.3837 | 0.0792 | 0.3084 | 2.4% |
| 4300 | 55.9 | 0.7086 | 0.2914 | 0.3395 | 0.3833 | 0.0792 | 0.3084 | 2.4% |
| 4300 | 41.0 | 0.7138 | 0.2862 | 0.3393 | 0.3829 | 0.0792 | 0.3084 | 2.4% |
| 4300 | 27.1 | 0.7188 | 0.2812 | 0.3391 | 0.3825 | 0.0792 | 0.3084 | 2.4% |
| 4300 | 20.6 | 0.6669 | 0.3329 | 0.3339 | 0.3729 | 0.0709 | 0.4039 | 2.6% |
| 4300 | 64.1 | 0.6814 | 0.3184 | 0.3351 | 0.3751 | 0.0709 | 0.4039 | 2.6% |
| 4300 | 94.5 | 0.6912 | 0.3087 | 0.3357 | 0.3762 | 0.0709 | 0.4039 | 2.6% |
| 4300 | 77.8 | 0.7008 | 0.2991 | 0.3362 | 0.3770 | 0.0709 | 0.4039 | 2.5% |
| 4300 | 56.2 | 0.7086 | 0.2914 | 0.3364 | 0.3775 | 0.0709 | 0.4039 | 2.5% |
| 4300 | 42.2 | 0.7138 | 0.2862 | 0.3366 | 0.3778 | 0.0709 | 0.4039 | 2.5% |
| 4300 | 29.2 | 0.7188 | 0.2812 | 0.3367 | 0.3780 | 0.0709 | 0.4039 | 2.5% |
| 4300 | 23.1 | 0.6669 | 0.3329 | 0.3287 | 0.3631 | 0.0694 | 0.5232 | 2.9% |
| 4300 | 67.2 | 0.6814 | 0.3184 | 0.3307 | 0.3668 | 0.0694 | 0.5232 | 2.8% |
| 4300 | 95.1 | 0.6912 | 0.3087 | 0.3320 | 0.3693 | 0.0694 | 0.5232 | 2.7% |
| 4300 | 78.5 | 0.7008 | 0.2991 | 0.3333 | 0.3716 | 0.0694 | 0.5232 | 2.7% |
| 4300 | 58.4 | 0.7086 | 0.2914 | 0.3341 | 0.3731 | 0.0694 | 0.5232 | 2.6% |
| 4300 | 45.3 | 0.7138 | 0.2862 | 0.3345 | 0.3740 | 0.0694 | 0.5232 | 2.6% |
| 4300 | 32.9 | 0.7188 | 0.2812 | 0.3350 | 0.3748 | 0.0694 | 0.5232 | 2.6% |
| 4300 | 25.5 | 0.6669 | 0.3329 | 0.3243 | 0.3547 | 0.0799 | 0.6269 | 3.1% |
| 4300 | 70.3 | 0.6814 | 0.3184 | 0.3270 | 0.3599 | 0.0799 | 0.6269 | 2.9% |
| 4300 | 95.1 | 0.6912 | 0.3087 | 0.3295 | 0.3645 | 0.0799 | 0.6269 | 2.8% |
| 4300 | 80.9 | 0.7008 | 0.2991 | 0.3315 | 0.3683 | 0.0799 | 0.6269 | 2.7% |
| 4300 | 61.6 | 0.7086 | 0.2914 | 0.3327 | 0.3706 | 0.0799 | 0.6269 | 2.7% |
| 4300 | 48.4 | 0.7138 | 0.2862 | 0.3334 | 0.3719 | 0.0799 | 0.6269 | 2.7% |
| 4300 | 36.0 | 0.7188 | 0.2812 | 0.3340 | 0.3730 | 0.0799 | 0.6269 | 2.6% |
| 4300 | 26.7 | 0.6669 | 0.3329 | 0.3210 | 0.3485 | 0.0975 | 0.6902 | 3.2% |
| 4300 | 72.2 | 0.6814 | 0.3184 | 0.3244 | 0.3550 | 0.0975 | 0.6902 | 3.1% |
| 4300 | 94.6 | 0.6912 | 0.3087 | 0.3280 | 0.3617 | 0.0975 | 0.6902 | 2.9% |
| 4300 | 83.1 | 0.7008 | 0.2991 | 0.3306 | 0.3666 | 0.0975 | 0.6902 | 2.8% |
| 4300 | 63.4 | 0.7086 | 0.2914 | 0.3320 | 0.3692 | 0.0975 | 0.6902 | 2.7% |
| 4300 | 50.4 | 0.7138 | 0.2862 | 0.3328 | 0.3707 | 0.0975 | 0.6902 | 2.7% |
| 4300 | 38.5 | 0.7188 | 0.2812 | 0.3336 | 0.3722 | 0.0975 | 0.6902 | 2.6% |
| 4300 | 28.5 | 0.6669 | 0.3329 | 0.3166 | 0.3403 | 0.1270 | 0.7352 | 3.4% |
| 4300 | 73.4 | 0.6814 | 0.3184 | 0.3216 | 0.3497 | 0.1270 | 0.7352 | 3.2% |
| 4300 | 93.1 | 0.6912 | 0.3087 | 0.3266 | 0.3591 | 0.1270 | 0.7352 | 2.9% |
| 4300 | 84.7 | 0.7008 | 0.2991 | 0.3297 | 0.3648 | 0.1270 | 0.7352 | 2.8% |
| 4300 | 65.4 | 0.7086 | 0.2914 | 0.3313 | 0.3679 | 0.1270 | 0.7352 | 2.7% |
| 4300 | 53.3 | 0.7138 | 0.2862 | 0.3323 | 0.3699 | 0.1270 | 0.7352 | 2.7% |
| 4300 | 43.3 | 0.7188 | 0.2812 | 0.3334 | 0.3719 | 0.1270 | 0.7352 | 2.7% |
| 4300 | 30.3 | 0.6669 | 0.3329 | 0.3120 | 0.3317 | 0.1561 | 0.7502 | 3.7% |
| 4300 | 73.4 | 0.6814 | 0.3184 | 0.3193 | 0.3454 | 0.1561 | 0.7502 | 3.3% |
| 4300 | 91.4 | 0.6912 | 0.3087 | 0.3256 | 0.3573 | 0.1561 | 0.7502 | 3.0% |
| 4300 | 85.7 | 0.7008 | 0.2991 | 0.3289 | 0.3635 | 0.1561 | 0.7502 | 2.8% |
| 4300 | 67.8 | 0.7086 | 0.2914 | 0.3309 | 0.3673 | 0.1561 | 0.7502 | 2.8% |

TABLE 2-continued

| | | | | | | | | |
|---|---|---|---|---|---|---|---|---|
| 4300 | 57.9 | 0.7138 | 0.2862 | 0.3324 | 0.3699 | 0.1561 | 0.7502 | 2.7% |
| 4300 | 51.7 | 0.7188 | 0.2812 | 0.3339 | 0.3727 | 0.1561 | 0.7502 | 2.6% |
| 4300 | 31.8 | 0.6669 | 0.3329 | 0.3044 | 0.3175 | 0.1938 | 0.7479 | 4.1% |
| 4300 | 72.7 | 0.6814 | 0.3184 | 0.3163 | 0.3397 | 0.1938 | 0.7479 | 3.5% |
| 4300 | 90.4 | 0.6912 | 0.3087 | 0.3241 | 0.3545 | 0.1938 | 0.7479 | 3.1% |
| 4300 | 87.8 | 0.7008 | 0.2991 | 0.3282 | 0.3620 | 0.1938 | 0.7479 | 2.9% |
| 4300 | 75.0 | 0.7086 | 0.2914 | 0.3312 | 0.3678 | 0.1938 | 0.7479 | 2.7% |
| 4300 | 70.2 | 0.7138 | 0.2862 | 0.3334 | 0.3718 | 0.1938 | 0.7479 | 2.7% |
| 4300 | 68.5 | 0.7188 | 0.2812 | 0.3354 | 0.3756 | 0.1938 | 0.7479 | 2.6% |
| 4300 | 30.9 | 0.6669 | 0.3329 | 0.2933 | 0.2967 | 0.2329 | 0.7309 | 4.8% |
| 4300 | 69.3 | 0.6814 | 0.3184 | 0.3132 | 0.3339 | 0.2329 | 0.7309 | 3.6% |
| 4300 | 90.1 | 0.6912 | 0.3087 | 0.3218 | 0.3501 | 0.2329 | 0.7309 | 3.2% |
| 4300 | 94.5 | 0.7008 | 0.2991 | 0.3282 | 0.3622 | 0.2329 | 0.7309 | 2.9% |
| 4300 | 88.7 | 0.7086 | 0.2914 | 0.3328 | 0.3707 | 0.2329 | 0.7309 | 2.7% |
| 4300 | 86.7 | 0.7138 | 0.2862 | 0.3354 | 0.3756 | 0.2329 | 0.7309 | 2.6% |
| 4300 | 73.9 | 0.7188 | 0.2812 | 0.3360 | 0.3767 | 0.2329 | 0.7309 | 2.5% |
| 4200 | −3.9 | 0.6669 | 0.3329 | 0.4095 | 0.5146 | 0.1393 | 0.0514 | 0.4% |
| 4200 | 35.5 | 0.6814 | 0.3184 | 0.4095 | 0.5146 | 0.1393 | 0.0514 | 0.4% |
| 4200 | 66.0 | 0.6912 | 0.3087 | 0.4095 | 0.5146 | 0.1393 | 0.0514 | 0.4% |
| 4200 | 98.1 | 0.7008 | 0.2991 | 0.4095 | 0.5146 | 0.1393 | 0.0514 | 0.4% |
| 4200 | 74.5 | 0.7086 | 0.2914 | 0.4095 | 0.5146 | 0.1393 | 0.0514 | 0.4% |
| 4200 | 55.5 | 0.7138 | 0.2862 | 0.4095 | 0.5146 | 0.1393 | 0.0514 | 0.4% |
| 4200 | 36.6 | 0.7188 | 0.2812 | 0.4095 | 0.5146 | 0.1393 | 0.0514 | 0.4% |
| 4200 | 6.9 | 0.6669 | 0.3329 | 0.4095 | 0.5146 | 0.1303 | 0.0723 | 0.4% |
| 4200 | 50.1 | 0.6814 | 0.3184 | 0.4095 | 0.5146 | 0.1303 | 0.0723 | 0.4% |
| 4200 | 83.4 | 0.6912 | 0.3087 | 0.4095 | 0.5146 | 0.1303 | 0.0723 | 0.4% |
| 4200 | 84.0 | 0.7008 | 0.2991 | 0.4016 | 0.4997 | 0.1303 | 0.0723 | 0.5% |
| 4200 | 55.8 | 0.7086 | 0.2914 | 0.3999 | 0.4966 | 0.1303 | 0.0723 | 0.6% |
| 4200 | 38.0 | 0.7138 | 0.2862 | 0.3953 | 0.4879 | 0.1303 | 0.0723 | 0.7% |
| 4200 | 20.4 | 0.7188 | 0.2812 | 0.3912 | 0.4803 | 0.1303 | 0.0723 | 0.8% |
| 4200 | 10.4 | 0.6669 | 0.3329 | 0.3783 | 0.4560 | 0.1192 | 0.1046 | 1.1% |
| 4200 | 53.9 | 0.6814 | 0.3184 | 0.3770 | 0.4536 | 0.1192 | 0.1046 | 1.2% |
| 4200 | 85.5 | 0.6912 | 0.3087 | 0.3742 | 0.4484 | 0.1192 | 0.1046 | 1.2% |
| 4200 | 81.6 | 0.7008 | 0.2991 | 0.3709 | 0.4421 | 0.1192 | 0.1046 | 1.3% |
| 4200 | 54.4 | 0.7086 | 0.2914 | 0.3691 | 0.4388 | 0.1192 | 0.1046 | 1.4% |
| 4200 | 36.3 | 0.7138 | 0.2862 | 0.3674 | 0.4356 | 0.1192 | 0.1046 | 1.4% |
| 4200 | 21.0 | 0.7188 | 0.2812 | 0.3640 | 0.4293 | 0.1192 | 0.1046 | 1.5% |
| 4200 | 11.4 | 0.6669 | 0.3329 | 0.3610 | 0.4236 | 0.1082 | 0.1444 | 1.6% |
| 4200 | 55.7 | 0.6814 | 0.3184 | 0.3609 | 0.4234 | 0.1082 | 0.1444 | 1.6% |
| 4200 | 87.2 | 0.6912 | 0.3087 | 0.3593 | 0.4205 | 0.1082 | 0.1444 | 1.7% |
| 4200 | 79.2 | 0.7008 | 0.2991 | 0.3580 | 0.4179 | 0.1082 | 0.1444 | 1.7% |
| 4200 | 52.8 | 0.7086 | 0.2914 | 0.3567 | 0.4155 | 0.1082 | 0.1444 | 1.8% |
| 4200 | 36.8 | 0.7138 | 0.2862 | 0.3548 | 0.4120 | 0.1082 | 0.1444 | 1.8% |
| 4200 | 23.4 | 0.7188 | 0.2812 | 0.3523 | 0.4073 | 0.1082 | 0.1444 | 1.9% |
| 4200 | 13.2 | 0.6669 | 0.3329 | 0.3489 | 0.4009 | 0.0934 | 0.2133 | 2.0% |
| 4200 | 58.2 | 0.6814 | 0.3184 | 0.3493 | 0.4017 | 0.0934 | 0.2133 | 2.0% |
| 4200 | 90.2 | 0.6912 | 0.3087 | 0.3489 | 0.4009 | 0.0934 | 0.2133 | 2.0% |
| 4200 | 77.2 | 0.7008 | 0.2991 | 0.3481 | 0.3994 | 0.0934 | 0.2133 | 2.1% |
| 4200 | 54.2 | 0.7086 | 0.2914 | 0.3468 | 0.3969 | 0.0934 | 0.2133 | 2.1% |
| 4200 | 39.9 | 0.7138 | 0.2862 | 0.3457 | 0.3949 | 0.0934 | 0.2133 | 2.2% |
| 4200 | 24.9 | 0.7188 | 0.2812 | 0.3449 | 0.3935 | 0.0934 | 0.2133 | 2.2% |
| 4200 | 16.1 | 0.6669 | 0.3329 | 0.3411 | 0.3863 | 0.0792 | 0.3084 | 2.3% |
| 4200 | 62.4 | 0.6814 | 0.3184 | 0.3420 | 0.3879 | 0.0792 | 0.3084 | 2.3% |
| 4200 | 92.9 | 0.6912 | 0.3087 | 0.3419 | 0.3879 | 0.0792 | 0.3084 | 2.3% |
| 4200 | 78.0 | 0.7008 | 0.2991 | 0.3415 | 0.3871 | 0.0792 | 0.3084 | 2.3% |
| 4200 | 54.8 | 0.7086 | 0.2914 | 0.3413 | 0.3866 | 0.0792 | 0.3084 | 2.3% |
| 4200 | 39.7 | 0.7138 | 0.2862 | 0.3410 | 0.3862 | 0.0792 | 0.3084 | 2.3% |
| 4200 | 25.7 | 0.7188 | 0.2812 | 0.3408 | 0.3857 | 0.0792 | 0.3084 | 2.3% |
| 4200 | 19.3 | 0.6669 | 0.3329 | 0.3360 | 0.3767 | 0.0709 | 0.4039 | 2.5% |
| 4200 | 63.5 | 0.6814 | 0.3184 | 0.3371 | 0.3789 | 0.0709 | 0.4039 | 2.5% |
| 4200 | 94.4 | 0.6912 | 0.3087 | 0.3377 | 0.3800 | 0.0709 | 0.4039 | 2.5% |
| 4200 | 77.2 | 0.7008 | 0.2991 | 0.3381 | 0.3807 | 0.0709 | 0.4039 | 2.5% |
| 4200 | 55.4 | 0.7086 | 0.2914 | 0.3384 | 0.3812 | 0.0709 | 0.4039 | 2.4% |
| 4200 | 41.2 | 0.7138 | 0.2862 | 0.3385 | 0.3814 | 0.0709 | 0.4039 | 2.4% |
| 4200 | 28.0 | 0.7188 | 0.2812 | 0.3386 | 0.3816 | 0.0709 | 0.4039 | 2.4% |
| 4200 | 21.7 | 0.6669 | 0.3329 | 0.3308 | 0.3671 | 0.0694 | 0.5232 | 2.8% |
| 4200 | 66.4 | 0.6814 | 0.3184 | 0.3328 | 0.3708 | 0.0694 | 0.5232 | 2.7% |
| 4200 | 95.0 | 0.6912 | 0.3087 | 0.3342 | 0.3733 | 0.0694 | 0.5232 | 2.6% |
| 4200 | 78.2 | 0.7008 | 0.2991 | 0.3354 | 0.3755 | 0.0694 | 0.5232 | 2.6% |
| 4200 | 57.8 | 0.7086 | 0.2914 | 0.3362 | 0.3770 | 0.0694 | 0.5232 | 2.5% |
| 4200 | 44.5 | 0.7138 | 0.2862 | 0.3366 | 0.3779 | 0.0694 | 0.5232 | 2.5% |
| 4200 | 31.8 | 0.7188 | 0.2812 | 0.3370 | 0.3787 | 0.0694 | 0.5232 | 2.5% |
| 4200 | 23.9 | 0.6669 | 0.3329 | 0.3265 | 0.3589 | 0.0799 | 0.6269 | 3.0% |
| 4200 | 69.4 | 0.6814 | 0.3184 | 0.3293 | 0.3642 | 0.0799 | 0.6269 | 2.8% |
| 4200 | 94.9 | 0.6912 | 0.3087 | 0.3317 | 0.3687 | 0.0799 | 0.6269 | 2.7% |
| 4200 | 80.7 | 0.7008 | 0.2991 | 0.3337 | 0.3725 | 0.0799 | 0.6269 | 2.6% |
| 4200 | 61.1 | 0.7086 | 0.2914 | 0.3349 | 0.3747 | 0.0799 | 0.6269 | 2.6% |
| 4200 | 47.8 | 0.7138 | 0.2862 | 0.3356 | 0.3760 | 0.0799 | 0.6269 | 2.6% |
| 4200 | 35.1 | 0.7188 | 0.2812 | 0.3362 | 0.3772 | 0.0799 | 0.6269 | 2.5% |
| 4200 | 25.0 | 0.6669 | 0.3329 | 0.3233 | 0.3529 | 0.0975 | 0.6902 | 3.1% |

TABLE 2-continued

| | | | | | | | | |
|---|---|---|---|---|---|---|---|---|
| 4200 | 71.2 | 0.6814 | 0.3184 | 0.3268 | 0.3594 | 0.0975 | 0.6902 | 2.9% |
| 4200 | 94.3 | 0.6912 | 0.3087 | 0.3303 | 0.3660 | 0.0975 | 0.6902 | 2.8% |
| 4200 | 83.1 | 0.7008 | 0.2991 | 0.3329 | 0.3709 | 0.0975 | 0.6902 | 2.7% |
| 4200 | 63.1 | 0.7086 | 0.2914 | 0.3343 | 0.3735 | 0.0975 | 0.6902 | 2.6% |
| 4200 | 49.9 | 0.7138 | 0.2862 | 0.3351 | 0.3750 | 0.0975 | 0.6902 | 2.6% |
| 4200 | 37.8 | 0.7188 | 0.2812 | 0.3359 | 0.3765 | 0.0975 | 0.6902 | 2.5% |
| 4200 | 26.7 | 0.6669 | 0.3329 | 0.3191 | 0.3450 | 0.1270 | 0.7352 | 3.3% |
| 4200 | 72.4 | 0.6814 | 0.3184 | 0.3240 | 0.3542 | 0.1270 | 0.7352 | 3.1% |
| 4200 | 92.8 | 0.6912 | 0.3087 | 0.3290 | 0.3636 | 0.1270 | 0.7352 | 2.8% |
| 4200 | 84.8 | 0.7008 | 0.2991 | 0.3321 | 0.3693 | 0.1270 | 0.7352 | 2.7% |
| 4200 | 65.2 | 0.7086 | 0.2914 | 0.3337 | 0.3724 | 0.1270 | 0.7352 | 2.6% |
| 4200 | 52.9 | 0.7138 | 0.2862 | 0.3348 | 0.3744 | 0.1270 | 0.7352 | 2.6% |
| 4200 | 42.7 | 0.7188 | 0.2812 | 0.3358 | 0.3764 | 0.1270 | 0.7352 | 2.5% |
| 4200 | 28.5 | 0.6669 | 0.3329 | 0.3146 | 0.3366 | 0.1561 | 0.7502 | 3.5% |
| 4200 | 72.5 | 0.6814 | 0.3184 | 0.3218 | 0.3501 | 0.1561 | 0.7502 | 3.2% |
| 4200 | 91.1 | 0.6912 | 0.3087 | 0.3281 | 0.3619 | 0.1561 | 0.7502 | 2.9% |
| 4200 | 85.9 | 0.7008 | 0.2991 | 0.3314 | 0.3682 | 0.1561 | 0.7502 | 2.7% |
| 4200 | 67.7 | 0.7086 | 0.2914 | 0.3334 | 0.3719 | 0.1561 | 0.7502 | 2.6% |
| 4200 | 57.5 | 0.7138 | 0.2862 | 0.3348 | 0.3745 | 0.1561 | 0.7502 | 2.6% |
| 4200 | 50.9 | 0.7188 | 0.2812 | 0.3363 | 0.3773 | 0.1561 | 0.7502 | 2.5% |
| 4200 | 30.1 | 0.6669 | 0.3329 | 0.3072 | 0.3227 | 0.1938 | 0.7479 | 3.9% |
| 4200 | 71.9 | 0.6814 | 0.3184 | 0.3188 | 0.3445 | 0.1938 | 0.7479 | 3.3% |
| 4200 | 89.8 | 0.6912 | 0.3087 | 0.3267 | 0.3594 | 0.1938 | 0.7479 | 2.9% |
| 4200 | 88.1 | 0.7008 | 0.2991 | 0.3308 | 0.3669 | 0.1938 | 0.7479 | 2.8% |
| 4200 | 74.8 | 0.7086 | 0.2914 | 0.3338 | 0.3726 | 0.1938 | 0.7479 | 2.6% |
| 4200 | 69.7 | 0.7138 | 0.2862 | 0.3359 | 0.3766 | 0.1938 | 0.7479 | 2.5% |
| 4200 | 67.1 | 0.7188 | 0.2812 | 0.3379 | 0.3802 | 0.1938 | 0.7479 | 2.5% |
| 4200 | 29.4 | 0.6669 | 0.3329 | 0.2964 | 0.3024 | 0.2329 | 0.7309 | 4.6% |
| 4200 | 68.6 | 0.6814 | 0.3184 | 0.3158 | 0.3389 | 0.2329 | 0.7309 | 3.5% |
| 4200 | 89.4 | 0.6912 | 0.3087 | 0.3246 | 0.3554 | 0.2329 | 0.7309 | 3.0% |
| 4200 | 94.7 | 0.7008 | 0.2991 | 0.3310 | 0.3673 | 0.2329 | 0.7309 | 2.8% |
| 4200 | 88.5 | 0.7086 | 0.2914 | 0.3355 | 0.3758 | 0.2329 | 0.7309 | 2.6% |
| 4200 | 83.9 | 0.7138 | 0.2862 | 0.3377 | 0.3799 | 0.2329 | 0.7309 | 2.5% |
| 4200 | 67.1 | 0.7188 | 0.2812 | 0.3379 | 0.3802 | 0.2329 | 0.7309 | 2.5% |
| 4100 | −4.3 | 0.6669 | 0.3329 | 0.4095 | 0.5146 | 0.1393 | 0.0514 | 0.4% |
| 4100 | 36.4 | 0.6814 | 0.3184 | 0.4095 | 0.5146 | 0.1393 | 0.0514 | 0.4% |
| 4100 | 67.9 | 0.6912 | 0.3087 | 0.4095 | 0.5146 | 0.1393 | 0.0514 | 0.4% |
| 4100 | 98.3 | 0.7008 | 0.2991 | 0.4095 | 0.5146 | 0.1393 | 0.0514 | 0.4% |
| 4100 | 70.6 | 0.7086 | 0.2914 | 0.4095 | 0.5146 | 0.1393 | 0.0514 | 0.4% |
| 4100 | 51.0 | 0.7138 | 0.2862 | 0.4095 | 0.5146 | 0.1393 | 0.0514 | 0.4% |
| 4100 | 31.4 | 0.7188 | 0.2812 | 0.4095 | 0.5146 | 0.1393 | 0.0514 | 0.4% |
| 4100 | 5.8 | 0.6669 | 0.3329 | 0.4095 | 0.5146 | 0.1303 | 0.0723 | 0.4% |
| 4100 | 50.2 | 0.6814 | 0.3184 | 0.4095 | 0.5146 | 0.1303 | 0.0723 | 0.4% |
| 4100 | 84.3 | 0.6912 | 0.3087 | 0.4095 | 0.5146 | 0.1303 | 0.0723 | 0.4% |
| 4100 | 82.0 | 0.7008 | 0.2991 | 0.4020 | 0.5004 | 0.1303 | 0.0723 | 0.5% |
| 4100 | 53.7 | 0.7086 | 0.2914 | 0.3987 | 0.4943 | 0.1303 | 0.0723 | 0.6% |
| 4100 | 34.5 | 0.7138 | 0.2862 | 0.3958 | 0.4888 | 0.1303 | 0.0723 | 0.7% |
| 4100 | 17.6 | 0.7188 | 0.2812 | 0.3897 | 0.4774 | 0.1303 | 0.0723 | 0.8% |
| 4100 | 9.4 | 0.6669 | 0.3329 | 0.3799 | 0.4590 | 0.1192 | 0.1046 | 1.1% |
| 4100 | 54.0 | 0.6814 | 0.3184 | 0.3783 | 0.4560 | 0.1192 | 0.1046 | 1.1% |
| 4100 | 86.3 | 0.6912 | 0.3087 | 0.3754 | 0.4506 | 0.1192 | 0.1046 | 1.2% |
| 4100 | 79.8 | 0.7008 | 0.2991 | 0.3721 | 0.4445 | 0.1192 | 0.1046 | 1.3% |
| 4100 | 51.8 | 0.7086 | 0.2914 | 0.3703 | 0.4411 | 0.1192 | 0.1046 | 1.3% |
| 4100 | 34.0 | 0.7138 | 0.2862 | 0.3679 | 0.4365 | 0.1192 | 0.1046 | 1.4% |
| 4100 | 19.3 | 0.7188 | 0.2812 | 0.3637 | 0.4287 | 0.1192 | 0.1046 | 1.5% |
| 4100 | 10.4 | 0.6669 | 0.3329 | 0.3628 | 0.4269 | 0.1082 | 0.1444 | 1.6% |
| 4100 | 55.5 | 0.6814 | 0.3184 | 0.3625 | 0.4263 | 0.1082 | 0.1444 | 1.6% |
| 4100 | 87.9 | 0.6912 | 0.3087 | 0.3609 | 0.4235 | 0.1082 | 0.1444 | 1.6% |
| 4100 | 77.8 | 0.7008 | 0.2991 | 0.3594 | 0.4207 | 0.1082 | 0.1444 | 1.7% |
| 4100 | 51.1 | 0.7086 | 0.2914 | 0.3578 | 0.4176 | 0.1082 | 0.1444 | 1.7% |
| 4100 | 35.6 | 0.7138 | 0.2862 | 0.3555 | 0.4133 | 0.1082 | 0.1444 | 1.8% |
| 4100 | 22.6 | 0.7188 | 0.2812 | 0.3526 | 0.4079 | 0.1082 | 0.1444 | 1.9% |
| 4100 | 12.1 | 0.6669 | 0.3329 | 0.3508 | 0.4045 | 0.0934 | 0.2133 | 2.0% |
| 4100 | 57.9 | 0.6814 | 0.3184 | 0.3511 | 0.4051 | 0.0934 | 0.2133 | 2.0% |
| 4100 | 90.8 | 0.6912 | 0.3087 | 0.3507 | 0.4044 | 0.0934 | 0.2133 | 2.0% |
| 4100 | 76.5 | 0.7008 | 0.2991 | 0.3497 | 0.4024 | 0.0934 | 0.2133 | 2.0% |
| 4100 | 53.8 | 0.7086 | 0.2914 | 0.3481 | 0.3994 | 0.0934 | 0.2133 | 2.1% |
| 4100 | 38.1 | 0.7138 | 0.2862 | 0.3472 | 0.3977 | 0.0934 | 0.2133 | 2.1% |
| 4100 | 22.8 | 0.7188 | 0.2812 | 0.3464 | 0.3962 | 0.0934 | 0.2133 | 2.1% |
| 4100 | 14.9 | 0.6669 | 0.3329 | 0.3431 | 0.3901 | 0.0792 | 0.3084 | 2.3% |
| 4100 | 61.6 | 0.6814 | 0.3184 | 0.3439 | 0.3916 | 0.0792 | 0.3084 | 2.2% |
| 4100 | 93.1 | 0.6912 | 0.3087 | 0.3439 | 0.3915 | 0.0792 | 0.3084 | 2.2% |
| 4100 | 77.1 | 0.7008 | 0.2991 | 0.3434 | 0.3907 | 0.0792 | 0.3084 | 2.2% |
| 4100 | 53.6 | 0.7086 | 0.2914 | 0.3431 | 0.3901 | 0.0792 | 0.3084 | 2.3% |
| 4100 | 38.4 | 0.7138 | 0.2862 | 0.3428 | 0.3895 | 0.0792 | 0.3084 | 2.3% |
| 4100 | 24.2 | 0.7188 | 0.2812 | 0.3425 | 0.3890 | 0.0792 | 0.3084 | 2.3% |
| 4100 | 18.0 | 0.6669 | 0.3329 | 0.3381 | 0.3807 | 0.0709 | 0.4039 | 2.5% |
| 4100 | 62.8 | 0.6814 | 0.3184 | 0.3392 | 0.3828 | 0.0709 | 0.4039 | 2.4% |
| 4100 | 94.3 | 0.6912 | 0.3087 | 0.3398 | 0.3839 | 0.0709 | 0.4039 | 2.4% |
| 4100 | 76.7 | 0.7008 | 0.2991 | 0.3402 | 0.3845 | 0.0709 | 0.4039 | 2.4% |

TABLE 2-continued

| | | | | | | | | |
|---|---|---|---|---|---|---|---|---|
| 4100 | 54.5 | 0.7086 | 0.2914 | 0.3404 | 0.3849 | 0.0709 | 0.4039 | 2.4% |
| 4100 | 40.1 | 0.7138 | 0.2862 | 0.3405 | 0.3851 | 0.0709 | 0.4039 | 2.4% |
| 4100 | 26.7 | 0.7188 | 0.2812 | 0.3405 | 0.3852 | 0.0709 | 0.4039 | 2.4% |
| 4100 | 20.2 | 0.6669 | 0.3329 | 0.3331 | 0.3712 | 0.0694 | 0.5232 | 2.7% |
| 4100 | 65.7 | 0.6814 | 0.3184 | 0.3350 | 0.3749 | 0.0694 | 0.5232 | 2.6% |
| 4100 | 94.8 | 0.6912 | 0.3087 | 0.3364 | 0.3774 | 0.0694 | 0.5232 | 2.5% |
| 4100 | 77.9 | 0.7008 | 0.2991 | 0.3375 | 0.3796 | 0.0694 | 0.5232 | 2.5% |
| 4100 | 57.2 | 0.7086 | 0.2914 | 0.3383 | 0.3811 | 0.0694 | 0.5232 | 2.4% |
| 4100 | 43.6 | 0.7138 | 0.2862 | 0.3388 | 0.3819 | 0.0694 | 0.5232 | 2.4% |
| 4100 | 30.8 | 0.7188 | 0.2812 | 0.3392 | 0.3827 | 0.0694 | 0.5232 | 2.4% |
| 4100 | 22.3 | 0.6669 | 0.3329 | 0.3288 | 0.3632 | 0.0799 | 0.6269 | 2.9% |
| 4100 | 68.3 | 0.6814 | 0.3184 | 0.3316 | 0.3686 | 0.0799 | 0.6269 | 2.7% |
| 4100 | 94.7 | 0.6912 | 0.3087 | 0.3340 | 0.3730 | 0.0799 | 0.6269 | 2.6% |
| 4100 | 80.5 | 0.7008 | 0.2991 | 0.3360 | 0.3767 | 0.0799 | 0.6269 | 2.5% |
| 4100 | 60.6 | 0.7086 | 0.2914 | 0.3372 | 0.3790 | 0.0799 | 0.6269 | 2.5% |
| 4100 | 47.1 | 0.7138 | 0.2862 | 0.3379 | 0.3803 | 0.0799 | 0.6269 | 2.5% |
| 4100 | 34.3 | 0.7188 | 0.2812 | 0.3385 | 0.3814 | 0.0799 | 0.6269 | 2.4% |
| 4100 | 23.3 | 0.6669 | 0.3329 | 0.3257 | 0.3574 | 0.0975 | 0.6902 | 3.0% |
| 4100 | 70.0 | 0.6814 | 0.3184 | 0.3292 | 0.3640 | 0.0975 | 0.6902 | 2.8% |
| 4100 | 94.0 | 0.6912 | 0.3087 | 0.3326 | 0.3704 | 0.0975 | 0.6902 | 2.7% |
| 4100 | 83.1 | 0.7008 | 0.2991 | 0.3353 | 0.3753 | 0.0975 | 0.6902 | 2.6% |
| 4100 | 62.8 | 0.7086 | 0.2914 | 0.3367 | 0.3780 | 0.0975 | 0.6902 | 2.5% |
| 4100 | 49.4 | 0.7138 | 0.2862 | 0.3375 | 0.3795 | 0.0975 | 0.6902 | 2.5% |
| 4100 | 37.1 | 0.7188 | 0.2812 | 0.3382 | 0.3810 | 0.0975 | 0.6902 | 2.4% |
| 4100 | 24.9 | 0.6669 | 0.3329 | 0.3216 | 0.3498 | 0.1270 | 0.7352 | 3.2% |
| 4100 | 71.3 | 0.6814 | 0.3184 | 0.3265 | 0.3589 | 0.1270 | 0.7352 | 3.0% |
| 4100 | 92.4 | 0.6912 | 0.3087 | 0.3314 | 0.3681 | 0.1270 | 0.7352 | 2.7% |
| 4100 | 85.0 | 0.7008 | 0.2991 | 0.3346 | 0.3740 | 0.1270 | 0.7352 | 2.6% |
| 4100 | 65.1 | 0.7086 | 0.2914 | 0.3362 | 0.3771 | 0.1270 | 0.7352 | 2.5% |
| 4100 | 52.5 | 0.7138 | 0.2862 | 0.3372 | 0.3791 | 0.1270 | 0.7352 | 2.5% |
| 4100 | 41.9 | 0.7188 | 0.2812 | 0.3383 | 0.3810 | 0.1270 | 0.7352 | 2.4% |
| 4100 | 26.6 | 0.6669 | 0.3329 | 0.3173 | 0.3417 | 0.1561 | 0.7502 | 3.4% |
| 4100 | 71.5 | 0.6814 | 0.3184 | 0.3244 | 0.3549 | 0.1561 | 0.7502 | 3.1% |
| 4100 | 90.7 | 0.6912 | 0.3087 | 0.3306 | 0.3667 | 0.1561 | 0.7502 | 2.8% |
| 4100 | 86.2 | 0.7008 | 0.2991 | 0.3340 | 0.3730 | 0.1561 | 0.7502 | 2.6% |
| 4100 | 67.6 | 0.7086 | 0.2914 | 0.3360 | 0.3768 | 0.1561 | 0.7502 | 2.5% |
| 4100 | 57.1 | 0.7138 | 0.2862 | 0.3374 | 0.3793 | 0.1561 | 0.7502 | 2.5% |
| 4100 | 50.0 | 0.7188 | 0.2812 | 0.3388 | 0.3821 | 0.1561 | 0.7502 | 2.4% |
| 4100 | 28.2 | 0.6669 | 0.3329 | 0.3101 | 0.3282 | 0.1938 | 0.7479 | 3.8% |
| 4100 | 71.0 | 0.6814 | 0.3184 | 0.3215 | 0.3496 | 0.1938 | 0.7479 | 3.2% |
| 4100 | 89.2 | 0.6912 | 0.3087 | 0.3294 | 0.3645 | 0.1938 | 0.7479 | 2.8% |
| 4100 | 88.4 | 0.7008 | 0.2991 | 0.3335 | 0.3720 | 0.1938 | 0.7479 | 2.6% |
| 4100 | 74.6 | 0.7086 | 0.2914 | 0.3365 | 0.3776 | 0.1938 | 0.7479 | 2.5% |
| 4100 | 69.1 | 0.7138 | 0.2862 | 0.3385 | 0.3815 | 0.1938 | 0.7479 | 2.4% |
| 4100 | 60.2 | 0.7188 | 0.2812 | 0.3398 | 0.3839 | 0.1938 | 0.7479 | 2.4% |
| 4100 | 27.7 | 0.6669 | 0.3329 | 0.2995 | 0.3084 | 0.2329 | 0.7309 | 4.4% |
| 4100 | 68.0 | 0.6814 | 0.3184 | 0.3186 | 0.3442 | 0.2329 | 0.7309 | 3.3% |
| 4100 | 88.7 | 0.6912 | 0.3087 | 0.3275 | 0.3609 | 0.2329 | 0.7309 | 2.9% |
| 4100 | 94.9 | 0.7008 | 0.2991 | 0.3338 | 0.3726 | 0.2329 | 0.7309 | 2.6% |
| 4100 | 88.3 | 0.7086 | 0.2914 | 0.3383 | 0.3810 | 0.2329 | 0.7309 | 2.4% |
| 4100 | 77.8 | 0.7138 | 0.2862 | 0.3396 | 0.3835 | 0.2329 | 0.7309 | 2.4% |
| 4100 | 60.2 | 0.7188 | 0.2812 | 0.3398 | 0.3839 | 0.2329 | 0.7309 | 2.4% |
| 4000 | −4.8 | 0.6669 | 0.3329 | 0.4095 | 0.5146 | 0.1393 | 0.0514 | 0.4% |
| 4000 | 37.3 | 0.6814 | 0.3184 | 0.4095 | 0.5146 | 0.1393 | 0.0514 | 0.4% |
| 4000 | 69.9 | 0.6912 | 0.3087 | 0.4095 | 0.5146 | 0.1393 | 0.0514 | 0.4% |
| 4000 | 95.5 | 0.7008 | 0.2991 | 0.4095 | 0.5146 | 0.1393 | 0.0514 | 0.4% |
| 4000 | 66.6 | 0.7086 | 0.2914 | 0.4095 | 0.5146 | 0.1393 | 0.0514 | 0.4% |
| 4000 | 46.3 | 0.7138 | 0.2862 | 0.4095 | 0.5146 | 0.1393 | 0.0514 | 0.4% |
| 4000 | 26.2 | 0.7188 | 0.2812 | 0.4095 | 0.5146 | 0.1393 | 0.0514 | 0.4% |
| 4000 | 4.7 | 0.6669 | 0.3329 | 0.4095 | 0.5146 | 0.1303 | 0.0723 | 0.4% |
| 4000 | 50.3 | 0.6814 | 0.3184 | 0.4095 | 0.5146 | 0.1303 | 0.0723 | 0.4% |
| 4000 | 85.3 | 0.6912 | 0.3087 | 0.4095 | 0.5146 | 0.1303 | 0.0723 | 0.4% |
| 4000 | 79.9 | 0.7008 | 0.2991 | 0.4024 | 0.5013 | 0.1303 | 0.0723 | 0.5% |
| 4000 | 50.7 | 0.7086 | 0.2914 | 0.3993 | 0.4954 | 0.1303 | 0.0723 | 0.6% |
| 4000 | 31.4 | 0.7138 | 0.2862 | 0.3953 | 0.4880 | 0.1303 | 0.0723 | 0.7% |
| 4000 | 14.9 | 0.7188 | 0.2812 | 0.3877 | 0.4737 | 0.1303 | 0.0723 | 0.9% |
| 4000 | 8.3 | 0.6669 | 0.3329 | 0.3814 | 0.4619 | 0.1192 | 0.1046 | 1.0% |
| 4000 | 53.9 | 0.6814 | 0.3184 | 0.3795 | 0.4583 | 0.1192 | 0.1046 | 1.1% |
| 4000 | 87.1 | 0.6912 | 0.3087 | 0.3765 | 0.4527 | 0.1192 | 0.1046 | 1.2% |
| 4000 | 78.0 | 0.7008 | 0.2991 | 0.3732 | 0.4466 | 0.1192 | 0.1046 | 1.3% |
| 4000 | 49.4 | 0.7086 | 0.2914 | 0.3713 | 0.4428 | 0.1192 | 0.1046 | 1.3% |
| 4000 | 31.8 | 0.7138 | 0.2862 | 0.3682 | 0.4371 | 0.1192 | 0.1046 | 1.4% |
| 4000 | 17.5 | 0.7188 | 0.2812 | 0.3633 | 0.4279 | 0.1192 | 0.1046 | 1.6% |
| 4000 | 9.3 | 0.6669 | 0.3329 | 0.3646 | 0.4304 | 0.1082 | 0.1444 | 1.5% |
| 4000 | 55.3 | 0.6814 | 0.3184 | 0.3640 | 0.4292 | 0.1082 | 0.1444 | 1.5% |
| 4000 | 88.6 | 0.6912 | 0.3087 | 0.3625 | 0.4265 | 0.1082 | 0.1444 | 1.6% |
| 4000 | 76.3 | 0.7008 | 0.2991 | 0.3609 | 0.4234 | 0.1082 | 0.1444 | 1.6% |
| 4000 | 49.6 | 0.7086 | 0.2914 | 0.3589 | 0.4196 | 0.1082 | 0.1444 | 1.7% |
| 4000 | 34.3 | 0.7138 | 0.2862 | 0.3562 | 0.4146 | 0.1082 | 0.1444 | 1.8% |
| 4000 | 20.0 | 0.7188 | 0.2812 | 0.3536 | 0.4097 | 0.1082 | 0.1444 | 1.9% |

TABLE 2-continued

| | | | | | | | | |
|---|---|---|---|---|---|---|---|---|
| 4000 | 10.9 | 0.6669 | 0.3329 | 0.3528 | 0.4082 | 0.0934 | 0.2133 | 1.9% |
| 4000 | 57.6 | 0.6814 | 0.3184 | 0.3530 | 0.4086 | 0.0934 | 0.2133 | 1.9% |
| 4000 | 91.1 | 0.6912 | 0.3087 | 0.3525 | 0.4077 | 0.0934 | 0.2133 | 1.9% |
| 4000 | 75.9 | 0.7008 | 0.2991 | 0.3512 | 0.4053 | 0.0934 | 0.2133 | 2.0% |
| 4000 | 52.2 | 0.7086 | 0.2914 | 0.3497 | 0.4024 | 0.0934 | 0.2133 | 2.0% |
| 4000 | 35.9 | 0.7138 | 0.2862 | 0.3488 | 0.4007 | 0.0934 | 0.2133 | 2.0% |
| 4000 | 20.6 | 0.7188 | 0.2812 | 0.3478 | 0.3989 | 0.0934 | 0.2133 | 2.1% |
| 4000 | 13.5 | 0.6669 | 0.3329 | 0.3452 | 0.3940 | 0.0792 | 0.3084 | 2.2% |
| 4000 | 60.7 | 0.6814 | 0.3184 | 0.3459 | 0.3953 | 0.0792 | 0.3084 | 2.2% |
| 4000 | 93.4 | 0.6912 | 0.3087 | 0.3459 | 0.3953 | 0.0792 | 0.3084 | 2.2% |
| 4000 | 76.1 | 0.7008 | 0.2991 | 0.3454 | 0.3943 | 0.0792 | 0.3084 | 2.2% |
| 4000 | 52.3 | 0.7086 | 0.2914 | 0.3450 | 0.3936 | 0.0792 | 0.3084 | 2.2% |
| 4000 | 37.0 | 0.7138 | 0.2862 | 0.3447 | 0.3930 | 0.0792 | 0.3084 | 2.2% |
| 4000 | 22.6 | 0.7188 | 0.2812 | 0.3443 | 0.3923 | 0.0792 | 0.3084 | 2.2% |
| 4000 | 16.5 | 0.6669 | 0.3329 | 0.3403 | 0.3848 | 0.0709 | 0.4039 | 2.4% |
| 4000 | 62.1 | 0.6814 | 0.3184 | 0.3414 | 0.3869 | 0.0709 | 0.4039 | 2.3% |
| 4000 | 94.2 | 0.6912 | 0.3087 | 0.3420 | 0.3879 | 0.0709 | 0.4039 | 2.3% |
| 4000 | 76.1 | 0.7008 | 0.2991 | 0.3422 | 0.3884 | 0.0709 | 0.4039 | 2.3% |
| 4000 | 53.6 | 0.7086 | 0.2914 | 0.3424 | 0.3888 | 0.0709 | 0.4039 | 2.3% |
| 4000 | 39.0 | 0.7138 | 0.2862 | 0.3425 | 0.3889 | 0.0709 | 0.4039 | 2.3% |
| 4000 | 25.4 | 0.7188 | 0.2812 | 0.3425 | 0.3890 | 0.0709 | 0.4039 | 2.3% |
| 4000 | 18.6 | 0.6669 | 0.3329 | 0.3353 | 0.3755 | 0.0694 | 0.5232 | 2.6% |
| 4000 | 64.8 | 0.6814 | 0.3184 | 0.3373 | 0.3792 | 0.0694 | 0.5232 | 2.5% |
| 4000 | 94.7 | 0.6912 | 0.3087 | 0.3386 | 0.3816 | 0.0694 | 0.5232 | 2.4% |
| 4000 | 77.6 | 0.7008 | 0.2991 | 0.3398 | 0.3838 | 0.0694 | 0.5232 | 2.4% |
| 4000 | 56.5 | 0.7086 | 0.2914 | 0.3405 | 0.3852 | 0.0694 | 0.5232 | 2.4% |
| 4000 | 42.7 | 0.7138 | 0.2862 | 0.3410 | 0.3861 | 0.0694 | 0.5232 | 2.3% |
| 4000 | 29.7 | 0.7188 | 0.2812 | 0.3414 | 0.3868 | 0.0694 | 0.5232 | 2.3% |
| 4000 | 20.6 | 0.6669 | 0.3329 | 0.3312 | 0.3677 | 0.0799 | 0.6269 | 2.7% |
| 4000 | 67.2 | 0.6814 | 0.3184 | 0.3341 | 0.3731 | 0.0799 | 0.6269 | 2.6% |
| 4000 | 94.4 | 0.6912 | 0.3087 | 0.3364 | 0.3774 | 0.0799 | 0.6269 | 2.5% |
| 4000 | 80.4 | 0.7008 | 0.2991 | 0.3384 | 0.3812 | 0.0799 | 0.6269 | 2.4% |
| 4000 | 60.2 | 0.7086 | 0.2914 | 0.3396 | 0.3834 | 0.0799 | 0.6269 | 2.4% |
| 4000 | 46.4 | 0.7138 | 0.2862 | 0.3403 | 0.3847 | 0.0799 | 0.6269 | 2.4% |
| 4000 | 33.4 | 0.7188 | 0.2812 | 0.3409 | 0.3859 | 0.0799 | 0.6269 | 2.3% |
| 4000 | 21.5 | 0.6669 | 0.3329 | 0.3282 | 0.3621 | 0.0975 | 0.6902 | 2.9% |
| 4000 | 68.8 | 0.6814 | 0.3184 | 0.3317 | 0.3687 | 0.0975 | 0.6902 | 2.7% |
| 4000 | 93.6 | 0.6912 | 0.3087 | 0.3351 | 0.3750 | 0.0975 | 0.6902 | 2.6% |
| 4000 | 83.1 | 0.7008 | 0.2991 | 0.3377 | 0.3799 | 0.0975 | 0.6902 | 2.5% |
| 4000 | 62.6 | 0.7086 | 0.2914 | 0.3391 | 0.3826 | 0.0975 | 0.6902 | 2.4% |
| 4000 | 48.9 | 0.7138 | 0.2862 | 0.3399 | 0.3841 | 0.0975 | 0.6902 | 2.4% |
| 4000 | 36.3 | 0.7188 | 0.2812 | 0.3407 | 0.3856 | 0.0975 | 0.6902 | 2.4% |
| 4000 | 23.0 | 0.6669 | 0.3329 | 0.3243 | 0.3548 | 0.1270 | 0.7352 | 3.1% |
| 4000 | 70.1 | 0.6814 | 0.3184 | 0.3291 | 0.3639 | 0.1270 | 0.7352 | 2.8% |
| 4000 | 92.1 | 0.6912 | 0.3087 | 0.3340 | 0.3729 | 0.1270 | 0.7352 | 2.6% |
| 4000 | 85.2 | 0.7008 | 0.2991 | 0.3371 | 0.3788 | 0.1270 | 0.7352 | 2.5% |
| 4000 | 64.9 | 0.7086 | 0.2914 | 0.3388 | 0.3819 | 0.1270 | 0.7352 | 2.4% |
| 4000 | 52.1 | 0.7138 | 0.2862 | 0.3398 | 0.3839 | 0.1270 | 0.7352 | 2.4% |
| 4000 | 41.2 | 0.7188 | 0.2812 | 0.3408 | 0.3858 | 0.1270 | 0.7352 | 2.3% |
| 4000 | 24.6 | 0.6669 | 0.3329 | 0.3202 | 0.3471 | 0.1561 | 0.7502 | 3.3% |
| 4000 | 70.4 | 0.6814 | 0.3184 | 0.3271 | 0.3600 | 0.1561 | 0.7502 | 2.9% |
| 4000 | 90.3 | 0.6912 | 0.3087 | 0.3332 | 0.3716 | 0.1561 | 0.7502 | 2.7% |
| 4000 | 86.5 | 0.7008 | 0.2991 | 0.3367 | 0.3780 | 0.1561 | 0.7502 | 2.5% |
| 4000 | 67.5 | 0.7086 | 0.2914 | 0.3387 | 0.3818 | 0.1561 | 0.7502 | 2.4% |
| 4000 | 56.6 | 0.7138 | 0.2862 | 0.3400 | 0.3843 | 0.1561 | 0.7502 | 2.4% |
| 4000 | 49.1 | 0.7188 | 0.2812 | 0.3414 | 0.3869 | 0.1561 | 0.7502 | 2.3% |
| 4000 | 26.3 | 0.6669 | 0.3329 | 0.3132 | 0.3340 | 0.1938 | 0.7479 | 3.6% |
| 4000 | 70.0 | 0.6814 | 0.3184 | 0.3243 | 0.3548 | 0.1938 | 0.7479 | 3.1% |
| 4000 | 88.6 | 0.6912 | 0.3087 | 0.3322 | 0.3697 | 0.1938 | 0.7479 | 2.7% |
| 4000 | 88.7 | 0.7008 | 0.2991 | 0.3363 | 0.3773 | 0.1938 | 0.7479 | 2.5% |
| 4000 | 74.4 | 0.7086 | 0.2914 | 0.3392 | 0.3828 | 0.1938 | 0.7479 | 2.4% |
| 4000 | 68.4 | 0.7138 | 0.2862 | 0.3413 | 0.3866 | 0.1938 | 0.7479 | 2.3% |
| 4000 | 53.1 | 0.7188 | 0.2812 | 0.3418 | 0.3877 | 0.1938 | 0.7479 | 2.3% |
| 4000 | 26.0 | 0.6669 | 0.3329 | 0.3029 | 0.3146 | 0.2329 | 0.7309 | 4.2% |
| 4000 | 67.2 | 0.6814 | 0.3184 | 0.3215 | 0.3496 | 0.2329 | 0.7309 | 3.2% |
| 4000 | 88.0 | 0.6912 | 0.3087 | 0.3306 | 0.3665 | 0.2329 | 0.7309 | 2.8% |
| 4000 | 95.0 | 0.7008 | 0.2991 | 0.3367 | 0.3781 | 0.2329 | 0.7309 | 2.5% |
| 4000 | 88.1 | 0.7086 | 0.2914 | 0.3411 | 0.3863 | 0.2329 | 0.7309 | 2.3% |
| 4000 | 71.6 | 0.7138 | 0.2862 | 0.3416 | 0.3873 | 0.2329 | 0.7309 | 2.3% |
| 4000 | 53.1 | 0.7188 | 0.2812 | 0.3418 | 0.3877 | 0.2329 | 0.7309 | 2.3% |
| 3900 | −5.4 | 0.6669 | 0.3329 | 0.4095 | 0.5146 | 0.1393 | 0.0514 | 0.4% |
| 3900 | 38.2 | 0.6814 | 0.3184 | 0.4095 | 0.5146 | 0.1393 | 0.0514 | 0.4% |
| 3900 | 71.9 | 0.6912 | 0.3087 | 0.4095 | 0.5146 | 0.1393 | 0.0514 | 0.4% |
| 3900 | 92.4 | 0.7008 | 0.2991 | 0.4095 | 0.5146 | 0.1393 | 0.0514 | 0.4% |
| 3900 | 62.6 | 0.7086 | 0.2914 | 0.4095 | 0.5146 | 0.1393 | 0.0514 | 0.4% |
| 3900 | 41.6 | 0.7138 | 0.2862 | 0.4095 | 0.5146 | 0.1393 | 0.0514 | 0.4% |
| 3900 | 20.8 | 0.7188 | 0.2812 | 0.4095 | 0.5146 | 0.1393 | 0.0514 | 0.4% |
| 3900 | 3.6 | 0.6669 | 0.3329 | 0.4095 | 0.5146 | 0.1303 | 0.0723 | 0.4% |
| 3900 | 50.4 | 0.6814 | 0.3184 | 0.4095 | 0.5146 | 0.1303 | 0.0723 | 0.4% |
| 3900 | 86.2 | 0.6912 | 0.3087 | 0.4095 | 0.5146 | 0.1303 | 0.0723 | 0.4% |

TABLE 2-continued

| | | | | | | | |
|---|---|---|---|---|---|---|---|
| 3900 | 77.8 | 0.7008 | 0.2991 | 0.4025 | 0.5014 | 0.1303 | 0.0723 | 0.5% |
| 3900 | 47.7 | 0.7086 | 0.2914 | 0.3995 | 0.4957 | 0.1303 | 0.0723 | 0.6% |
| 3900 | 28.3 | 0.7138 | 0.2862 | 0.3946 | 0.4867 | 0.1303 | 0.0723 | 0.7% |
| 3900 | 11.5 | 0.7188 | 0.2812 | 0.3865 | 0.4714 | 0.1303 | 0.0723 | 0.9% |
| 3900 | 7.2 | 0.6669 | 0.3329 | 0.3830 | 0.4648 | 0.1192 | 0.1046 | 1.0% |
| 3900 | 53.8 | 0.6814 | 0.3184 | 0.3806 | 0.4604 | 0.1192 | 0.1046 | 1.1% |
| 3900 | 87.9 | 0.6912 | 0.3087 | 0.3776 | 0.4547 | 0.1192 | 0.1046 | 1.1% |
| 3900 | 76.2 | 0.7008 | 0.2991 | 0.3744 | 0.4488 | 0.1192 | 0.1046 | 1.2% |
| 3900 | 47.2 | 0.7086 | 0.2914 | 0.3720 | 0.4442 | 0.1192 | 0.1046 | 1.3% |
| 3900 | 29.1 | 0.7138 | 0.2862 | 0.3687 | 0.4381 | 0.1192 | 0.1046 | 1.4% |
| 3900 | 14.1 | 0.7188 | 0.2812 | 0.3639 | 0.4290 | 0.1192 | 0.1046 | 1.5% |
| 3900 | 8.1 | 0.6669 | 0.3329 | 0.3664 | 0.4338 | 0.1082 | 0.1444 | 1.5% |
| 3900 | 55.0 | 0.6814 | 0.3184 | 0.3655 | 0.4321 | 0.1082 | 0.1444 | 1.5% |
| 3900 | 89.3 | 0.6912 | 0.3087 | 0.3641 | 0.4295 | 0.1082 | 0.1444 | 1.5% |
| 3900 | 75.0 | 0.7008 | 0.2991 | 0.3622 | 0.4259 | 0.1082 | 0.1444 | 1.6% |
| 3900 | 47.7 | 0.7086 | 0.2914 | 0.3600 | 0.4218 | 0.1082 | 0.1444 | 1.7% |
| 3900 | 31.5 | 0.7138 | 0.2862 | 0.3575 | 0.4170 | 0.1082 | 0.1444 | 1.7% |
| 3900 | 16.3 | 0.7188 | 0.2812 | 0.3550 | 0.4123 | 0.1082 | 0.1444 | 1.8% |
| 3900 | 9.6 | 0.6669 | 0.3329 | 0.3548 | 0.4120 | 0.0934 | 0.2133 | 1.8% |
| 3900 | 57.3 | 0.6814 | 0.3184 | 0.3550 | 0.4123 | 0.0934 | 0.2133 | 1.8% |
| 3900 | 91.4 | 0.6912 | 0.3087 | 0.3543 | 0.4111 | 0.0934 | 0.2133 | 1.9% |
| 3900 | 75.2 | 0.7008 | 0.2991 | 0.3528 | 0.4083 | 0.0934 | 0.2133 | 1.9% |
| 3900 | 49.8 | 0.7086 | 0.2914 | 0.3515 | 0.4058 | 0.0934 | 0.2133 | 2.0% |
| 3900 | 33.6 | 0.7138 | 0.2862 | 0.3504 | 0.4037 | 0.0934 | 0.2133 | 2.0% |
| 3900 | 18.2 | 0.7188 | 0.2812 | 0.3493 | 0.4017 | 0.0934 | 0.2133 | 2.0% |
| 3900 | 12.2 | 0.6669 | 0.3329 | 0.3474 | 0.3981 | 0.0792 | 0.3084 | 2.1% |
| 3900 | 60.0 | 0.6814 | 0.3184 | 0.3480 | 0.3992 | 0.0792 | 0.3084 | 2.1% |
| 3900 | 93.5 | 0.6912 | 0.3087 | 0.3480 | 0.3992 | 0.0792 | 0.3084 | 2.1% |
| 3900 | 75.0 | 0.7008 | 0.2991 | 0.3474 | 0.3981 | 0.0792 | 0.3084 | 2.1% |
| 3900 | 51.0 | 0.7086 | 0.2914 | 0.3469 | 0.3972 | 0.0792 | 0.3084 | 2.1% |
| 3900 | 35.5 | 0.7138 | 0.2862 | 0.3465 | 0.3964 | 0.0792 | 0.3084 | 2.1% |
| 3900 | 20.9 | 0.7188 | 0.2812 | 0.3461 | 0.3957 | 0.0792 | 0.3084 | 2.1% |
| 3900 | 14.9 | 0.6669 | 0.3329 | 0.3426 | 0.3890 | 0.0709 | 0.4039 | 2.3% |
| 3900 | 61.4 | 0.6814 | 0.3184 | 0.3436 | 0.3910 | 0.0709 | 0.4039 | 2.2% |
| 3900 | 94.1 | 0.6912 | 0.3087 | 0.3441 | 0.3920 | 0.0709 | 0.4039 | 2.2% |
| 3900 | 75.6 | 0.7008 | 0.2991 | 0.3444 | 0.3925 | 0.0709 | 0.4039 | 2.2% |
| 3900 | 52.7 | 0.7086 | 0.2914 | 0.3445 | 0.3927 | 0.0709 | 0.4039 | 2.2% |
| 3900 | 37.9 | 0.7138 | 0.2862 | 0.3446 | 0.3928 | 0.0709 | 0.4039 | 2.2% |
| 3900 | 24.0 | 0.7188 | 0.2812 | 0.3446 | 0.3928 | 0.0709 | 0.4039 | 2.2% |
| 3900 | 16.9 | 0.6669 | 0.3329 | 0.3377 | 0.3799 | 0.0694 | 0.5232 | 2.5% |
| 3900 | 63.9 | 0.6814 | 0.3184 | 0.3397 | 0.3837 | 0.0694 | 0.5232 | 2.4% |
| 3900 | 94.5 | 0.6912 | 0.3087 | 0.3410 | 0.3860 | 0.0694 | 0.5232 | 2.3% |
| 3900 | 77.3 | 0.7008 | 0.2991 | 0.3421 | 0.3881 | 0.0694 | 0.5232 | 2.3% |
| 3900 | 55.8 | 0.7086 | 0.2914 | 0.3428 | 0.3895 | 0.0694 | 0.5232 | 2.3% |
| 3900 | 41.8 | 0.7138 | 0.2862 | 0.3433 | 0.3903 | 0.0694 | 0.5232 | 2.3% |
| 3900 | 28.5 | 0.7188 | 0.2812 | 0.3436 | 0.3910 | 0.0694 | 0.5232 | 2.2% |
| 3900 | 18.8 | 0.6669 | 0.3329 | 0.3337 | 0.3724 | 0.0799 | 0.6269 | 2.6% |
| 3900 | 66.0 | 0.6814 | 0.3184 | 0.3366 | 0.3778 | 0.0799 | 0.6269 | 2.5% |
| 3900 | 94.1 | 0.6912 | 0.3087 | 0.3388 | 0.3820 | 0.0799 | 0.6269 | 2.4% |
| 3900 | 80.2 | 0.7008 | 0.2991 | 0.3408 | 0.3857 | 0.0799 | 0.6269 | 2.3% |
| 3900 | 59.7 | 0.7086 | 0.2914 | 0.3420 | 0.3880 | 0.0799 | 0.6269 | 2.3% |
| 3900 | 45.7 | 0.7138 | 0.2862 | 0.3427 | 0.3893 | 0.0799 | 0.6269 | 2.3% |
| 3900 | 32.5 | 0.7188 | 0.2812 | 0.3433 | 0.3904 | 0.0799 | 0.6269 | 2.3% |
| 3900 | 19.6 | 0.6669 | 0.3329 | 0.3308 | 0.3669 | 0.0975 | 0.6902 | 2.8% |
| 3900 | 67.5 | 0.6814 | 0.3184 | 0.3343 | 0.3736 | 0.0975 | 0.6902 | 2.6% |
| 3900 | 93.3 | 0.6912 | 0.3087 | 0.3376 | 0.3797 | 0.0975 | 0.6902 | 2.5% |
| 3900 | 83.0 | 0.7008 | 0.2991 | 0.3402 | 0.3847 | 0.0975 | 0.6902 | 2.4% |
| 3900 | 62.3 | 0.7086 | 0.2914 | 0.3417 | 0.3873 | 0.0975 | 0.6902 | 2.3% |
| 3900 | 48.4 | 0.7138 | 0.2862 | 0.3425 | 0.3889 | 0.0975 | 0.6902 | 2.3% |
| 3900 | 35.5 | 0.7188 | 0.2812 | 0.3432 | 0.3903 | 0.0975 | 0.6902 | 2.3% |
| 3900 | 20.9 | 0.6669 | 0.3329 | 0.3271 | 0.3600 | 0.1270 | 0.7352 | 2.9% |
| 3900 | 68.8 | 0.6814 | 0.3184 | 0.3319 | 0.3690 | 0.1270 | 0.7352 | 2.7% |
| 3900 | 91.7 | 0.6912 | 0.3087 | 0.3366 | 0.3778 | 0.1270 | 0.7352 | 2.5% |
| 3900 | 85.4 | 0.7008 | 0.2991 | 0.3398 | 0.3838 | 0.1270 | 0.7352 | 2.4% |
| 3900 | 64.8 | 0.7086 | 0.2914 | 0.3414 | 0.3869 | 0.1270 | 0.7352 | 2.3% |
| 3900 | 51.7 | 0.7138 | 0.2862 | 0.3425 | 0.3889 | 0.1270 | 0.7352 | 2.3% |
| 3900 | 40.4 | 0.7188 | 0.2812 | 0.3435 | 0.3907 | 0.1270 | 0.7352 | 2.2% |
| 3900 | 22.4 | 0.6669 | 0.3329 | 0.3231 | 0.3526 | 0.1561 | 0.7502 | 3.1% |
| 3900 | 69.2 | 0.6814 | 0.3184 | 0.3299 | 0.3652 | 0.1561 | 0.7502 | 2.8% |
| 3900 | 89.9 | 0.6912 | 0.3087 | 0.3359 | 0.3766 | 0.1561 | 0.7502 | 2.5% |
| 3900 | 86.8 | 0.7008 | 0.2991 | 0.3394 | 0.3832 | 0.1561 | 0.7502 | 2.4% |
| 3900 | 67.4 | 0.7086 | 0.2914 | 0.3414 | 0.3869 | 0.1561 | 0.7502 | 2.3% |
| 3900 | 56.1 | 0.7138 | 0.2862 | 0.3428 | 0.3894 | 0.1561 | 0.7502 | 2.3% |
| 3900 | 46.0 | 0.7188 | 0.2812 | 0.3439 | 0.3916 | 0.1561 | 0.7502 | 2.2% |
| 3900 | 24.2 | 0.6669 | 0.3329 | 0.3164 | 0.3400 | 0.1938 | 0.7479 | 3.4% |
| 3900 | 69.0 | 0.6814 | 0.3184 | 0.3272 | 0.3602 | 0.1938 | 0.7479 | 2.9% |
| 3900 | 88.0 | 0.6912 | 0.3087 | 0.3351 | 0.3751 | 0.1938 | 0.7479 | 2.6% |
| 3900 | 89.1 | 0.7008 | 0.2991 | 0.3392 | 0.3827 | 0.1938 | 0.7479 | 2.4% |
| 3900 | 74.2 | 0.7086 | 0.2914 | 0.3420 | 0.3881 | 0.1938 | 0.7479 | 2.3% |
| 3900 | 65.2 | 0.7138 | 0.2862 | 0.3437 | 0.3912 | 0.1938 | 0.7479 | 2.2% |

TABLE 2-continued

| | | | | | | | |
|---|---|---|---|---|---|---|---|
| 3900 | 46.0 | 0.7188 | 0.2812 | 0.3439 | 0.3916 | 0.1938 | 0.7479 | 2.2% |
| 3900 | 24.1 | 0.6669 | 0.3329 | 0.3063 | 0.3210 | 0.2329 | 0.7309 | 4.0% |
| 3900 | 66.5 | 0.6814 | 0.3184 | 0.3245 | 0.3552 | 0.2329 | 0.7309 | 3.0% |
| 3900 | 87.2 | 0.6912 | 0.3087 | 0.3337 | 0.3724 | 0.2329 | 0.7309 | 2.6% |
| 3900 | 95.2 | 0.7008 | 0.2991 | 0.3397 | 0.3837 | 0.2329 | 0.7309 | 2.4% |
| 3900 | 84.5 | 0.7086 | 0.2914 | 0.3435 | 0.3908 | 0.2329 | 0.7309 | 2.2% |
| 3900 | 65.2 | 0.7138 | 0.2862 | 0.3437 | 0.3912 | 0.2329 | 0.7309 | 2.2% |
| 3900 | 46.0 | 0.7188 | 0.2812 | 0.3439 | 0.3916 | 0.2329 | 0.7309 | 2.2% |
| 3800 | −6.0 | 0.6669 | 0.3329 | 0.4095 | 0.5146 | 0.1393 | 0.0514 | 0.4% |
| 3800 | 39.1 | 0.6814 | 0.3184 | 0.4095 | 0.5146 | 0.1393 | 0.0514 | 0.4% |
| 3800 | 73.9 | 0.6912 | 0.3087 | 0.4095 | 0.5146 | 0.1393 | 0.0514 | 0.4% |
| 3800 | 89.3 | 0.7008 | 0.2991 | 0.4095 | 0.5146 | 0.1393 | 0.0514 | 0.4% |
| 3800 | 58.4 | 0.7086 | 0.2914 | 0.4095 | 0.5146 | 0.1393 | 0.0514 | 0.4% |
| 3800 | 36.8 | 0.7138 | 0.2862 | 0.4095 | 0.5146 | 0.1393 | 0.0514 | 0.4% |
| 3800 | 15.3 | 0.7188 | 0.2812 | 0.4095 | 0.5146 | 0.1393 | 0.0514 | 0.4% |
| 3800 | 2.4 | 0.6669 | 0.3329 | 0.4095 | 0.5146 | 0.1303 | 0.0723 | 0.4% |
| 3800 | 50.5 | 0.6814 | 0.3184 | 0.4095 | 0.5146 | 0.1303 | 0.0723 | 0.4% |
| 3800 | 87.2 | 0.6912 | 0.3087 | 0.4095 | 0.5146 | 0.1303 | 0.0723 | 0.4% |
| 3800 | 75.6 | 0.7008 | 0.2991 | 0.4028 | 0.5020 | 0.1303 | 0.0723 | 0.5% |
| 3800 | 44.9 | 0.7086 | 0.2914 | 0.3991 | 0.4951 | 0.1303 | 0.0723 | 0.6% |
| 3800 | 24.7 | 0.7138 | 0.2862 | 0.3946 | 0.4866 | 0.1303 | 0.0723 | 0.7% |
| 3800 | 7.0 | 0.7188 | 0.2812 | 0.3868 | 0.4721 | 0.1303 | 0.0723 | 0.9% |
| 3800 | 5.9 | 0.6669 | 0.3329 | 0.3845 | 0.4676 | 0.1192 | 0.1046 | 1.0% |
| 3800 | 53.6 | 0.6814 | 0.3184 | 0.3817 | 0.4624 | 0.1192 | 0.1046 | 1.0% |
| 3800 | 88.6 | 0.6912 | 0.3087 | 0.3786 | 0.4566 | 0.1192 | 0.1046 | 1.1% |
| 3800 | 74.4 | 0.7008 | 0.2991 | 0.3754 | 0.4506 | 0.1192 | 0.1046 | 1.2% |
| 3800 | 44.6 | 0.7086 | 0.2914 | 0.3729 | 0.4460 | 0.1192 | 0.1046 | 1.3% |
| 3800 | 25.6 | 0.7138 | 0.2862 | 0.3699 | 0.4403 | 0.1192 | 0.1046 | 1.4% |
| 3800 | 9.6 | 0.7188 | 0.2812 | 0.3652 | 0.4315 | 0.1192 | 0.1046 | 1.5% |
| 3800 | 6.8 | 0.6669 | 0.3329 | 0.3683 | 0.4373 | 0.1082 | 0.1444 | 1.4% |
| 3800 | 54.7 | 0.6814 | 0.3184 | 0.3671 | 0.4351 | 0.1082 | 0.1444 | 1.4% |
| 3800 | 90.0 | 0.6912 | 0.3087 | 0.3657 | 0.4325 | 0.1082 | 0.1444 | 1.5% |
| 3800 | 73.8 | 0.7008 | 0.2991 | 0.3635 | 0.4283 | 0.1082 | 0.1444 | 1.6% |
| 3800 | 45.1 | 0.7086 | 0.2914 | 0.3616 | 0.4247 | 0.1082 | 0.1444 | 1.6% |
| 3800 | 27.9 | 0.7138 | 0.2862 | 0.3591 | 0.4201 | 0.1082 | 0.1444 | 1.7% |
| 3800 | 12.5 | 0.7188 | 0.2812 | 0.3563 | 0.4148 | 0.1082 | 0.1444 | 1.8% |
| 3800 | 8.3 | 0.6669 | 0.3329 | 0.3569 | 0.4159 | 0.0934 | 0.2133 | 1.8% |
| 3800 | 57.1 | 0.6814 | 0.3184 | 0.3570 | 0.4161 | 0.0934 | 0.2133 | 1.8% |
| 3800 | 91.7 | 0.6912 | 0.3087 | 0.3562 | 0.4146 | 0.0934 | 0.2133 | 1.8% |
| 3800 | 73.8 | 0.7008 | 0.2991 | 0.3547 | 0.4118 | 0.0934 | 0.2133 | 1.8% |
| 3800 | 47.3 | 0.7086 | 0.2914 | 0.3533 | 0.4093 | 0.0934 | 0.2133 | 1.9% |
| 3800 | 31.1 | 0.7138 | 0.2862 | 0.3521 | 0.4068 | 0.0934 | 0.2133 | 1.9% |
| 3800 | 15.8 | 0.7188 | 0.2812 | 0.3508 | 0.4045 | 0.0934 | 0.2133 | 2.0% |
| 3800 | 10.7 | 0.6669 | 0.3329 | 0.3496 | 0.4022 | 0.0792 | 0.3084 | 2.0% |
| 3800 | 59.4 | 0.6814 | 0.3184 | 0.3501 | 0.4032 | 0.0792 | 0.3084 | 2.0% |
| 3800 | 93.5 | 0.6912 | 0.3087 | 0.3501 | 0.4031 | 0.0792 | 0.3084 | 2.0% |
| 3800 | 74.0 | 0.7008 | 0.2991 | 0.3494 | 0.4019 | 0.0792 | 0.3084 | 2.0% |
| 3800 | 49.6 | 0.7086 | 0.2914 | 0.3489 | 0.4008 | 0.0792 | 0.3084 | 2.0% |
| 3800 | 33.9 | 0.7138 | 0.2862 | 0.3484 | 0.4000 | 0.0792 | 0.3084 | 2.1% |
| 3800 | 19.2 | 0.7188 | 0.2812 | 0.3479 | 0.3991 | 0.0792 | 0.3084 | 2.1% |
| 3800 | 13.2 | 0.6669 | 0.3329 | 0.3449 | 0.3934 | 0.0709 | 0.4039 | 2.2% |
| 3800 | 60.7 | 0.6814 | 0.3184 | 0.3459 | 0.3953 | 0.0709 | 0.4039 | 2.2% |
| 3800 | 94.0 | 0.6912 | 0.3087 | 0.3464 | 0.3962 | 0.0709 | 0.4039 | 2.1% |
| 3800 | 75.0 | 0.7008 | 0.2991 | 0.3466 | 0.3966 | 0.0709 | 0.4039 | 2.1% |
| 3800 | 51.7 | 0.7086 | 0.2914 | 0.3467 | 0.3967 | 0.0709 | 0.4039 | 2.1% |
| 3800 | 36.7 | 0.7138 | 0.2862 | 0.3467 | 0.3967 | 0.0709 | 0.4039 | 2.1% |
| 3800 | 22.6 | 0.7188 | 0.2812 | 0.3466 | 0.3967 | 0.0709 | 0.4039 | 2.1% |
| 3800 | 15.1 | 0.6669 | 0.3329 | 0.3402 | 0.3845 | 0.0694 | 0.5232 | 2.4% |
| 3800 | 62.9 | 0.6814 | 0.3184 | 0.3421 | 0.3883 | 0.0694 | 0.5232 | 2.3% |
| 3800 | 94.3 | 0.6912 | 0.3087 | 0.3434 | 0.3905 | 0.0694 | 0.5232 | 2.2% |
| 3800 | 77.0 | 0.7008 | 0.2991 | 0.3445 | 0.3926 | 0.0694 | 0.5232 | 2.2% |
| 3800 | 55.1 | 0.7086 | 0.2914 | 0.3452 | 0.3939 | 0.0694 | 0.5232 | 2.2% |
| 3800 | 40.8 | 0.7138 | 0.2862 | 0.3456 | 0.3947 | 0.0694 | 0.5232 | 2.2% |
| 3800 | 27.3 | 0.7188 | 0.2812 | 0.3459 | 0.3954 | 0.0694 | 0.5232 | 2.2% |
| 3800 | 16.9 | 0.6669 | 0.3329 | 0.3362 | 0.3772 | 0.0799 | 0.6269 | 2.5% |
| 3800 | 64.8 | 0.6814 | 0.3184 | 0.3392 | 0.3827 | 0.0799 | 0.6269 | 2.4% |
| 3800 | 93.8 | 0.6912 | 0.3087 | 0.3414 | 0.3868 | 0.0799 | 0.6269 | 2.3% |
| 3800 | 80.0 | 0.7008 | 0.2991 | 0.3433 | 0.3904 | 0.0799 | 0.6269 | 2.3% |
| 3800 | 59.2 | 0.7086 | 0.2914 | 0.3445 | 0.3927 | 0.0799 | 0.6269 | 2.2% |
| 3800 | 45.0 | 0.7138 | 0.2862 | 0.3452 | 0.3940 | 0.0799 | 0.6269 | 2.2% |
| 3800 | 31.6 | 0.7188 | 0.2812 | 0.3458 | 0.3951 | 0.0799 | 0.6269 | 2.2% |
| 3800 | 17.6 | 0.6669 | 0.3329 | 0.3335 | 0.3720 | 0.0975 | 0.6902 | 2.6% |
| 3800 | 66.1 | 0.6814 | 0.3184 | 0.3371 | 0.3787 | 0.0975 | 0.6902 | 2.5% |
| 3800 | 92.9 | 0.6912 | 0.3087 | 0.3402 | 0.3847 | 0.0975 | 0.6902 | 2.4% |
| 3800 | 83.0 | 0.7008 | 0.2991 | 0.3429 | 0.3896 | 0.0975 | 0.6902 | 2.3% |
| 3800 | 61.9 | 0.7086 | 0.2914 | 0.3443 | 0.3923 | 0.0975 | 0.6902 | 2.2% |
| 3800 | 47.8 | 0.7138 | 0.2862 | 0.3451 | 0.3938 | 0.0975 | 0.6902 | 2.2% |
| 3800 | 34.7 | 0.7188 | 0.2812 | 0.3459 | 0.3952 | 0.0975 | 0.6902 | 2.2% |
| 3800 | 18.8 | 0.6669 | 0.3329 | 0.3299 | 0.3653 | 0.1270 | 0.7352 | 2.8% |
| 3800 | 67.4 | 0.6814 | 0.3184 | 0.3347 | 0.3743 | 0.1270 | 0.7352 | 2.6% |

TABLE 2-continued

| | | | | | | | |
|---|---|---|---|---|---|---|---|
| 3800 | 91.3 | 0.6912 | 0.3087 | 0.3393 | 0.3829 | 0.1270 | 0.7352 | 2.4% |
| 3800 | 85.6 | 0.7008 | 0.2991 | 0.3425 | 0.3890 | 0.1270 | 0.7352 | 2.3% |
| 3800 | 64.6 | 0.7086 | 0.2914 | 0.3442 | 0.3921 | 0.1270 | 0.7352 | 2.2% |
| 3800 | 51.2 | 0.7138 | 0.2862 | 0.3452 | 0.3940 | 0.1270 | 0.7352 | 2.2% |
| 3800 | 38.7 | 0.7188 | 0.2812 | 0.3461 | 0.3957 | 0.1270 | 0.7352 | 2.1% |
| 3800 | 20.2 | 0.6669 | 0.3329 | 0.3262 | 0.3583 | 0.1561 | 0.7502 | 3.0% |
| 3800 | 67.9 | 0.6814 | 0.3184 | 0.3328 | 0.3707 | 0.1561 | 0.7502 | 2.7% |
| 3800 | 89.5 | 0.6912 | 0.3087 | 0.3387 | 0.3819 | 0.1561 | 0.7502 | 2.4% |
| 3800 | 87.1 | 0.7008 | 0.2991 | 0.3423 | 0.3885 | 0.1561 | 0.7502 | 2.3% |
| 3800 | 67.3 | 0.7086 | 0.2914 | 0.3443 | 0.3922 | 0.1561 | 0.7502 | 2.2% |
| 3800 | 55.6 | 0.7138 | 0.2862 | 0.3456 | 0.3947 | 0.1561 | 0.7502 | 2.2% |
| 3800 | 38.7 | 0.7188 | 0.2812 | 0.3461 | 0.3957 | 0.1561 | 0.7502 | 2.1% |
| 3800 | 22.0 | 0.6669 | 0.3329 | 0.3197 | 0.3462 | 0.1938 | 0.7479 | 3.3% |
| 3800 | 67.8 | 0.6814 | 0.3184 | 0.3302 | 0.3659 | 0.1938 | 0.7479 | 2.8% |
| 3800 | 87.4 | 0.6912 | 0.3087 | 0.3381 | 0.3806 | 0.1938 | 0.7479 | 2.5% |
| 3800 | 89.5 | 0.7008 | 0.2991 | 0.3422 | 0.3883 | 0.1938 | 0.7479 | 2.3% |
| 3800 | 73.9 | 0.7086 | 0.2914 | 0.3450 | 0.3935 | 0.1938 | 0.7479 | 2.2% |
| 3800 | 58.8 | 0.7138 | 0.2862 | 0.3459 | 0.3953 | 0.1938 | 0.7479 | 2.2% |
| 3800 | 38.7 | 0.7188 | 0.2812 | 0.3461 | 0.3957 | 0.1938 | 0.7479 | 2.1% |
| 3800 | 22.1 | 0.6669 | 0.3329 | 0.3099 | 0.3278 | 0.2329 | 0.7309 | 2.8% |
| 3800 | 65.6 | 0.6814 | 0.3184 | 0.3276 | 0.3610 | 0.2329 | 0.7309 | 2.9% |
| 3800 | 86.4 | 0.6912 | 0.3087 | 0.3369 | 0.3784 | 0.2329 | 0.7309 | 2.5% |
| 3800 | 95.4 | 0.7008 | 0.2991 | 0.3428 | 0.3896 | 0.2329 | 0.7309 | 2.3% |
| 3800 | 78.9 | 0.7086 | 0.2914 | 0.3457 | 0.3949 | 0.2329 | 0.7309 | 2.2% |
| 3800 | 58.8 | 0.7138 | 0.2862 | 0.3459 | 0.3953 | 0.2329 | 0.7309 | 2.2% |
| 3800 | 38.7 | 0.7188 | 0.2812 | 0.3461 | 0.3957 | 0.2329 | 0.7309 | 2.1% |
| 3700 | −6.7 | 0.6669 | 0.3329 | 0.4095 | 0.5146 | 0.1393 | 0.0514 | 0.4% |
| 3700 | 39.9 | 0.6814 | 0.3184 | 0.4095 | 0.5146 | 0.1393 | 0.0514 | 0.4% |
| 3700 | 75.8 | 0.6912 | 0.3087 | 0.4095 | 0.5146 | 0.1393 | 0.0514 | 0.4% |
| 3700 | 86.0 | 0.7008 | 0.2991 | 0.4095 | 0.5146 | 0.1393 | 0.0514 | 0.4% |
| 3700 | 54.2 | 0.7086 | 0.2914 | 0.4095 | 0.5146 | 0.1393 | 0.0514 | 0.4% |
| 3700 | 31.8 | 0.7138 | 0.2862 | 0.4095 | 0.5146 | 0.1393 | 0.0514 | 0.4% |
| 3700 | 9.6 | 0.7188 | 0.2812 | 0.4095 | 0.5146 | 0.1393 | 0.0514 | 0.4% |
| 3700 | 1.1 | 0.6669 | 0.3329 | 0.4095 | 0.5146 | 0.1303 | 0.0723 | 0.4% |
| 3700 | 50.5 | 0.6814 | 0.3184 | 0.4095 | 0.5146 | 0.1303 | 0.0723 | 0.4% |
| 3700 | 88.1 | 0.6912 | 0.3087 | 0.4091 | 0.5139 | 0.1303 | 0.0723 | 0.4% |
| 3700 | 73.6 | 0.7008 | 0.2991 | 0.4026 | 0.5016 | 0.1303 | 0.0723 | 0.5% |
| 3700 | 42.0 | 0.7086 | 0.2914 | 0.3989 | 0.4947 | 0.1303 | 0.0723 | 0.6% |
| 3700 | 20.6 | 0.7138 | 0.2862 | 0.3953 | 0.4878 | 0.1303 | 0.0723 | 0.7% |
| 3700 | 1.9 | 0.7188 | 0.2812 | 0.3880 | 0.4742 | 0.1303 | 0.0723 | 0.9% |
| 3700 | 4.6 | 0.6669 | 0.3329 | 0.3859 | 0.4704 | 0.1192 | 0.1046 | 0.9% |
| 3700 | 53.4 | 0.6814 | 0.3184 | 0.3827 | 0.4644 | 0.1192 | 0.1046 | 1.0% |
| 3700 | 89.2 | 0.6912 | 0.3087 | 0.3795 | 0.4583 | 0.1192 | 0.1046 | 1.1% |
| 3700 | 72.9 | 0.7008 | 0.2991 | 0.3761 | 0.4520 | 0.1192 | 0.1046 | 1.2% |
| 3700 | 41.6 | 0.7086 | 0.2914 | 0.3742 | 0.4483 | 0.1192 | 0.1046 | 1.2% |
| 3700 | 21.5 | 0.7138 | 0.2862 | 0.3715 | 0.4433 | 0.1192 | 0.1046 | 1.3% |
| 3700 | 4.8 | 0.7188 | 0.2812 | 0.3666 | 0.4342 | 0.1192 | 0.1046 | 1.5% |
| 3700 | 5.4 | 0.6669 | 0.3329 | 0.3702 | 0.4408 | 0.1082 | 0.1444 | 1.4% |
| 3700 | 54.5 | 0.6814 | 0.3184 | 0.3688 | 0.4382 | 0.1082 | 0.1444 | 1.4% |
| 3700 | 90.4 | 0.6912 | 0.3087 | 0.3672 | 0.4352 | 0.1082 | 0.1444 | 1.4% |
| 3700 | 72.4 | 0.7008 | 0.2991 | 0.3648 | 0.4308 | 0.1082 | 0.1444 | 1.5% |
| 3700 | 42.1 | 0.7086 | 0.2914 | 0.3633 | 0.4280 | 0.1082 | 0.1444 | 1.6% |
| 3700 | 24.1 | 0.7138 | 0.2862 | 0.3608 | 0.4233 | 0.1082 | 0.1444 | 1.6% |
| 3700 | 8.7 | 0.7188 | 0.2812 | 0.3577 | 0.4174 | 0.1082 | 0.1444 | 1.7% |
| 3700 | 6.8 | 0.6669 | 0.3329 | 0.3590 | 0.4199 | 0.0934 | 0.2133 | 1.7% |
| 3700 | 56.9 | 0.6814 | 0.3184 | 0.3591 | 0.4201 | 0.0934 | 0.2133 | 1.7% |
| 3700 | 92.0 | 0.6912 | 0.3087 | 0.3581 | 0.4182 | 0.0934 | 0.2133 | 1.7% |
| 3700 | 72.1 | 0.7008 | 0.2991 | 0.3567 | 0.4155 | 0.0934 | 0.2133 | 1.8% |
| 3700 | 44.8 | 0.7086 | 0.2914 | 0.3552 | 0.4128 | 0.0934 | 0.2133 | 1.8% |
| 3700 | 28.5 | 0.7138 | 0.2862 | 0.3537 | 0.4100 | 0.0934 | 0.2133 | 1.9% |
| 3700 | 13.2 | 0.7188 | 0.2812 | 0.3523 | 0.4073 | 0.0934 | 0.2133 | 1.9% |
| 3700 | 9.1 | 0.6669 | 0.3329 | 0.3519 | 0.4065 | 0.0792 | 0.3084 | 1.9% |
| 3700 | 58.7 | 0.6814 | 0.3184 | 0.3523 | 0.4074 | 0.0792 | 0.3084 | 1.9% |
| 3700 | 93.4 | 0.6912 | 0.3087 | 0.3522 | 0.4071 | 0.0792 | 0.3084 | 1.9% |
| 3700 | 72.8 | 0.7008 | 0.2991 | 0.3515 | 0.4059 | 0.0792 | 0.3084 | 1.9% |
| 3700 | 48.2 | 0.7086 | 0.2914 | 0.3508 | 0.4046 | 0.0792 | 0.3084 | 2.0% |
| 3700 | 32.3 | 0.7138 | 0.2862 | 0.3503 | 0.4036 | 0.0792 | 0.3084 | 2.0% |
| 3700 | 17.3 | 0.7188 | 0.2812 | 0.3498 | 0.4026 | 0.0792 | 0.3084 | 2.0% |
| 3700 | 11.5 | 0.6669 | 0.3329 | 0.3473 | 0.3979 | 0.0709 | 0.4039 | 2.1% |
| 3700 | 59.8 | 0.6814 | 0.3184 | 0.3483 | 0.3998 | 0.0709 | 0.4039 | 2.1% |
| 3700 | 93.9 | 0.6912 | 0.3087 | 0.3487 | 0.4006 | 0.0709 | 0.4039 | 2.1% |
| 3700 | 74.3 | 0.7008 | 0.2991 | 0.3488 | 0.4008 | 0.0709 | 0.4039 | 2.0% |
| 3700 | 50.8 | 0.7086 | 0.2914 | 0.3489 | 0.4008 | 0.0709 | 0.4039 | 2.0% |
| 3700 | 35.4 | 0.7138 | 0.2862 | 0.3488 | 0.4008 | 0.0709 | 0.4039 | 2.0% |
| 3700 | 21.1 | 0.7188 | 0.2812 | 0.3488 | 0.4007 | 0.0709 | 0.4039 | 2.0% |
| 3700 | 13.2 | 0.6669 | 0.3329 | 0.3427 | 0.3893 | 0.0694 | 0.5232 | 2.3% |
| 3700 | 61.8 | 0.6814 | 0.3184 | 0.3447 | 0.3930 | 0.0694 | 0.5232 | 2.2% |
| 3700 | 94.0 | 0.6912 | 0.3087 | 0.3458 | 0.3952 | 0.0694 | 0.5232 | 2.2% |
| 3700 | 76.7 | 0.7008 | 0.2991 | 0.3469 | 0.3972 | 0.0694 | 0.5232 | 2.1% |
| 3700 | 54.3 | 0.7086 | 0.2914 | 0.3476 | 0.3984 | 0.0694 | 0.5232 | 2.1% |

TABLE 2-continued

| | | | | | | | | |
|---|---|---|---|---|---|---|---|---|
| 3700 | 39.8 | 0.7138 | 0.2862 | 0.3480 | 0.3992 | 0.0694 | 0.5232 | 2.1% |
| 3700 | 26.1 | 0.7188 | 0.2812 | 0.3483 | 0.3998 | 0.0694 | 0.5232 | 2.1% |
| 3700 | 14.9 | 0.6669 | 0.3329 | 0.3389 | 0.3821 | 0.0799 | 0.6269 | 2.4% |
| 3700 | 63.4 | 0.6814 | 0.3184 | 0.3418 | 0.3877 | 0.0799 | 0.6269 | 2.3% |
| 3700 | 93.4 | 0.6912 | 0.3087 | 0.3440 | 0.3917 | 0.0799 | 0.6269 | 2.2% |
| 3700 | 79.8 | 0.7008 | 0.2991 | 0.3459 | 0.3953 | 0.0799 | 0.6269 | 2.2% |
| 3700 | 58.6 | 0.7086 | 0.2914 | 0.3471 | 0.3975 | 0.0799 | 0.6269 | 2.1% |
| 3700 | 44.3 | 0.7138 | 0.2862 | 0.3478 | 0.3988 | 0.0799 | 0.6269 | 2.1% |
| 3700 | 30.6 | 0.7188 | 0.2812 | 0.3483 | 0.3999 | 0.0799 | 0.6269 | 2.1% |
| 3700 | 15.5 | 0.6669 | 0.3329 | 0.3362 | 0.3772 | 0.0975 | 0.6902 | 2.5% |
| 3700 | 64.7 | 0.6814 | 0.3184 | 0.3399 | 0.3840 | 0.0975 | 0.6902 | 2.4% |
| 3700 | 92.5 | 0.6912 | 0.3087 | 0.3429 | 0.3897 | 0.0975 | 0.6902 | 2.3% |
| 3700 | 83.0 | 0.7008 | 0.2991 | 0.3456 | 0.3947 | 0.0975 | 0.6902 | 2.2% |
| 3700 | 61.6 | 0.7086 | 0.2914 | 0.3470 | 0.3973 | 0.0975 | 0.6902 | 2.1% |
| 3700 | 47.2 | 0.7138 | 0.2862 | 0.3478 | 0.3989 | 0.0975 | 0.6902 | 2.1% |
| 3700 | 31.4 | 0.7188 | 0.2812 | 0.3484 | 0.3999 | 0.0975 | 0.6902 | 2.1% |
| 3700 | 16.5 | 0.6669 | 0.3329 | 0.3329 | 0.3709 | 0.1270 | 0.7352 | 2.7% |
| 3700 | 65.9 | 0.6814 | 0.3184 | 0.3376 | 0.3798 | 0.1270 | 0.7352 | 2.5% |
| 3700 | 90.9 | 0.6912 | 0.3087 | 0.3421 | 0.3881 | 0.1270 | 0.7352 | 2.3% |
| 3700 | 85.8 | 0.7008 | 0.2991 | 0.3454 | 0.3943 | 0.1270 | 0.7352 | 2.2% |
| 3700 | 64.5 | 0.7086 | 0.2914 | 0.3470 | 0.3974 | 0.1270 | 0.7352 | 2.1% |
| 3700 | 50.8 | 0.7138 | 0.2862 | 0.3480 | 0.3993 | 0.1270 | 0.7352 | 2.1% |
| 3700 | 31.4 | 0.7188 | 0.2812 | 0.3484 | 0.3999 | 0.1270 | 0.7352 | 2.1% |
| 3700 | 17.8 | 0.6669 | 0.3329 | 0.3294 | 0.3643 | 0.1561 | 0.7502 | 2.8% |
| 3700 | 66.4 | 0.6814 | 0.3184 | 0.3358 | 0.3763 | 0.1561 | 0.7502 | 2.6% |
| 3700 | 89.1 | 0.6912 | 0.3087 | 0.3416 | 0.3873 | 0.1561 | 0.7502 | 2.3% |
| 3700 | 87.4 | 0.7008 | 0.2991 | 0.3452 | 0.3941 | 0.1561 | 0.7502 | 2.2% |
| 3700 | 67.2 | 0.7086 | 0.2914 | 0.3472 | 0.3977 | 0.1561 | 0.7502 | 2.1% |
| 3700 | 52.2 | 0.7138 | 0.2862 | 0.3482 | 0.3995 | 0.1561 | 0.7502 | 2.1% |
| 3700 | 31.4 | 0.7188 | 0.2812 | 0.3484 | 0.3999 | 0.1561 | 0.7502 | 2.1% |
| 3700 | 19.6 | 0.6669 | 0.3329 | 0.3232 | 0.3527 | 0.1938 | 0.7479 | 3.1% |
| 3700 | 66.4 | 0.6814 | 0.3184 | 0.3334 | 0.3719 | 0.1938 | 0.7479 | 2.7% |
| 3700 | 86.8 | 0.6912 | 0.3087 | 0.3411 | 0.3863 | 0.1938 | 0.7479 | 2.3% |
| 3700 | 89.8 | 0.7008 | 0.2991 | 0.3452 | 0.3941 | 0.1938 | 0.7479 | 2.2% |
| 3700 | 73.2 | 0.7086 | 0.2914 | 0.3479 | 0.3991 | 0.1938 | 0.7479 | 2.1% |
| 3700 | 52.2 | 0.7138 | 0.2862 | 0.3482 | 0.3995 | 0.1938 | 0.7479 | 2.1% |
| 3700 | 31.4 | 0.7188 | 0.2812 | 0.3484 | 0.3999 | 0.1938 | 0.7479 | 2.1% |
| 3700 | 20.0 | 0.6669 | 0.3329 | 0.3137 | 0.3349 | 0.2329 | 0.7309 | 3.6% |
| 3700 | 64.6 | 0.6814 | 0.3184 | 0.3309 | 0.3671 | 0.2329 | 0.7309 | 2.8% |
| 3700 | 85.6 | 0.6912 | 0.3087 | 0.3402 | 0.3846 | 0.2329 | 0.7309 | 2.4% |
| 3700 | 95.6 | 0.7008 | 0.2991 | 0.3460 | 0.3955 | 0.2329 | 0.7309 | 2.1% |
| 3700 | 73.2 | 0.7086 | 0.2914 | 0.3479 | 0.3991 | 0.2329 | 0.7309 | 2.1% |
| 3700 | 52.2 | 0.7138 | 0.2862 | 0.3482 | 0.3995 | 0.2329 | 0.7309 | 2.1% |
| 3700 | 31.4 | 0.7188 | 0.2812 | 0.3484 | 0.3999 | 0.2329 | 0.7309 | 2.1% |
| 3600 | −7.5 | 0.6669 | 0.3329 | 0.4095 | 0.5146 | 0.1393 | 0.0514 | 0.4% |
| 3600 | 40.7 | 0.6814 | 0.3184 | 0.4095 | 0.5146 | 0.1393 | 0.0514 | 0.4% |
| 3600 | 77.8 | 0.6912 | 0.3087 | 0.4095 | 0.5146 | 0.1393 | 0.0514 | 0.4% |
| 3600 | 82.8 | 0.7008 | 0.2991 | 0.4095 | 0.5146 | 0.1393 | 0.0514 | 0.4% |
| 3600 | 49.9 | 0.7086 | 0.2914 | 0.4095 | 0.5146 | 0.1393 | 0.0514 | 0.4% |
| 3600 | 26.8 | 0.7138 | 0.2862 | 0.4095 | 0.5146 | 0.1393 | 0.0514 | 0.4% |
| 3600 | 3.9 | 0.7188 | 0.2812 | 0.4095 | 0.5146 | 0.1393 | 0.0514 | 0.4% |
| 3600 | −0.2 | 0.6669 | 0.3329 | 0.4095 | 0.5146 | 0.1303 | 0.0723 | 0.4% |
| 3600 | 50.5 | 0.6814 | 0.3184 | 0.4095 | 0.5146 | 0.1303 | 0.0723 | 0.4% |
| 3600 | 88.8 | 0.6912 | 0.3087 | 0.4081 | 0.5119 | 0.1303 | 0.0723 | 0.4% |
| 3600 | 71.8 | 0.7008 | 0.2991 | 0.4016 | 0.4998 | 0.1303 | 0.0723 | 0.5% |
| 3600 | 38.9 | 0.7086 | 0.2914 | 0.3988 | 0.4946 | 0.1303 | 0.0723 | 0.6% |
| 3600 | 16.6 | 0.7138 | 0.2862 | 0.3957 | 0.4887 | 0.1303 | 0.0723 | 0.7% |
| 3600 | −3.4 | 0.7188 | 0.2812 | 0.3892 | 0.4765 | 0.1303 | 0.0723 | 0.8% |
| 3600 | 3.1 | 0.6669 | 0.3329 | 0.3873 | 0.4730 | 0.1192 | 0.1046 | 0.9% |
| 3600 | 53.1 | 0.6814 | 0.3184 | 0.3838 | 0.4663 | 0.1192 | 0.1046 | 1.0% |
| 3600 | 89.9 | 0.6912 | 0.3087 | 0.3805 | 0.4601 | 0.1192 | 0.1046 | 1.1% |
| 3600 | 71.2 | 0.7008 | 0.2991 | 0.3769 | 0.4534 | 0.1192 | 0.1046 | 1.2% |
| 3600 | 38.6 | 0.7086 | 0.2914 | 0.3755 | 0.4508 | 0.1192 | 0.1046 | 1.2% |
| 3600 | 17.4 | 0.7138 | 0.2862 | 0.3731 | 0.4463 | 0.1192 | 0.1046 | 1.3% |
| 3600 | −0.1 | 0.7188 | 0.2812 | 0.3681 | 0.4370 | 0.1192 | 0.1046 | 1.4% |
| 3600 | 3.9 | 0.6669 | 0.3329 | 0.3721 | 0.4444 | 0.1082 | 0.1444 | 1.3% |
| 3600 | 54.2 | 0.6814 | 0.3184 | 0.3705 | 0.4414 | 0.1082 | 0.1444 | 1.3% |
| 3600 | 90.8 | 0.6912 | 0.3087 | 0.3685 | 0.4378 | 0.1082 | 0.1444 | 1.4% |
| 3600 | 70.7 | 0.7008 | 0.2991 | 0.3664 | 0.4337 | 0.1082 | 0.1444 | 1.5% |
| 3600 | 39.0 | 0.7086 | 0.2914 | 0.3652 | 0.4314 | 0.1082 | 0.1444 | 1.5% |
| 3600 | 20.2 | 0.7138 | 0.2862 | 0.3626 | 0.4266 | 0.1082 | 0.1444 | 1.6% |
| 3600 | 4.6 | 0.7188 | 0.2812 | 0.3591 | 0.4200 | 0.1082 | 0.1444 | 1.7% |
| 3600 | 5.2 | 0.6669 | 0.3329 | 0.3612 | 0.4240 | 0.0934 | 0.2133 | 1.6% |
| 3600 | 56.6 | 0.6814 | 0.3184 | 0.3613 | 0.4241 | 0.0934 | 0.2133 | 1.6% |
| 3600 | 92.3 | 0.6912 | 0.3087 | 0.3601 | 0.4218 | 0.0934 | 0.2133 | 1.7% |
| 3600 | 70.4 | 0.7008 | 0.2991 | 0.3586 | 0.4192 | 0.0934 | 0.2133 | 1.7% |
| 3600 | 42.2 | 0.7086 | 0.2914 | 0.3572 | 0.4164 | 0.0934 | 0.2133 | 1.8% |
| 3600 | 25.8 | 0.7138 | 0.2862 | 0.3554 | 0.4132 | 0.0934 | 0.2133 | 1.8% |
| 3600 | 10.5 | 0.7188 | 0.2812 | 0.3538 | 0.4101 | 0.0934 | 0.2133 | 1.9% |
| 3600 | 7.4 | 0.6669 | 0.3329 | 0.3543 | 0.4110 | 0.0792 | 0.3084 | 1.9% |

TABLE 2-continued

| | | | | | | | | |
|---|---|---|---|---|---|---|---|---|
| 3600 | 57.9 | 0.6814 | 0.3184 | 0.3546 | 0.4116 | 0.0792 | 0.3084 | 1.8% |
| 3600 | 93.3 | 0.6912 | 0.3087 | 0.3544 | 0.4112 | 0.0792 | 0.3084 | 1.9% |
| 3600 | 71.7 | 0.7008 | 0.2991 | 0.3537 | 0.4099 | 0.0792 | 0.3084 | 1.9% |
| 3600 | 46.6 | 0.7086 | 0.2914 | 0.3529 | 0.4084 | 0.0792 | 0.3084 | 1.9% |
| 3600 | 30.6 | 0.7138 | 0.2862 | 0.3522 | 0.4072 | 0.0792 | 0.3084 | 1.9% |
| 3600 | 15.4 | 0.7188 | 0.2812 | 0.3517 | 0.4061 | 0.0792 | 0.3084 | 1.9% |
| 3600 | 9.5 | 0.6669 | 0.3329 | 0.3498 | 0.4026 | 0.0709 | 0.4039 | 2.0% |
| 3600 | 58.9 | 0.6814 | 0.3184 | 0.3507 | 0.4043 | 0.0709 | 0.4039 | 2.0% |
| 3600 | 93.7 | 0.6912 | 0.3087 | 0.3511 | 0.4050 | 0.0709 | 0.4039 | 2.0% |
| 3600 | 73.7 | 0.7008 | 0.2991 | 0.3511 | 0.4051 | 0.0709 | 0.4039 | 2.0% |
| 3600 | 49.7 | 0.7086 | 0.2914 | 0.3511 | 0.4050 | 0.0709 | 0.4039 | 2.0% |
| 3600 | 34.1 | 0.7138 | 0.2862 | 0.3510 | 0.4049 | 0.0709 | 0.4039 | 2.0% |
| 3600 | 19.5 | 0.7188 | 0.2812 | 0.3509 | 0.4047 | 0.0709 | 0.4039 | 2.0% |
| 3600 | 11.2 | 0.6669 | 0.3329 | 0.3453 | 0.3942 | 0.0694 | 0.5232 | 2.2% |
| 3600 | 60.6 | 0.6814 | 0.3184 | 0.3473 | 0.3978 | 0.0694 | 0.5232 | 2.1% |
| 3600 | 93.7 | 0.6912 | 0.3087 | 0.3484 | 0.4000 | 0.0694 | 0.5232 | 2.1% |
| 3600 | 76.4 | 0.7008 | 0.2991 | 0.3494 | 0.4019 | 0.0694 | 0.5232 | 2.0% |
| 3600 | 53.6 | 0.7086 | 0.2914 | 0.3500 | 0.4031 | 0.0694 | 0.5232 | 2.0% |
| 3600 | 38.7 | 0.7138 | 0.2862 | 0.3504 | 0.4038 | 0.0694 | 0.5232 | 2.0% |
| 3600 | 24.0 | 0.7188 | 0.2812 | 0.3507 | 0.4044 | 0.0694 | 0.5232 | 2.0% |
| 3600 | 12.8 | 0.6669 | 0.3329 | 0.3416 | 0.3873 | 0.0799 | 0.6269 | 2.3% |
| 3600 | 62.0 | 0.6814 | 0.3184 | 0.3446 | 0.3929 | 0.0799 | 0.6269 | 2.2% |
| 3600 | 93.0 | 0.6912 | 0.3087 | 0.3467 | 0.3967 | 0.0799 | 0.6269 | 2.1% |
| 3600 | 79.7 | 0.7008 | 0.2991 | 0.3486 | 0.4003 | 0.0799 | 0.6269 | 2.1% |
| 3600 | 58.1 | 0.7086 | 0.2914 | 0.3497 | 0.4025 | 0.0799 | 0.6269 | 2.0% |
| 3600 | 43.5 | 0.7138 | 0.2862 | 0.3504 | 0.4037 | 0.0799 | 0.6269 | 2.0% |
| 3600 | 24.0 | 0.7188 | 0.2812 | 0.3507 | 0.4044 | 0.0799 | 0.6269 | 2.0% |
| 3600 | 13.3 | 0.6669 | 0.3329 | 0.3391 | 0.3825 | 0.0975 | 0.6902 | 2.4% |
| 3600 | 63.1 | 0.6814 | 0.3184 | 0.3427 | 0.3894 | 0.0975 | 0.6902 | 2.3% |
| 3600 | 92.0 | 0.6912 | 0.3087 | 0.3457 | 0.3949 | 0.0975 | 0.6902 | 2.2% |
| 3600 | 83.0 | 0.7008 | 0.2991 | 0.3483 | 0.3999 | 0.0975 | 0.6902 | 2.1% |
| 3600 | 61.3 | 0.7086 | 0.2914 | 0.3498 | 0.4025 | 0.0975 | 0.6902 | 2.0% |
| 3600 | 45.7 | 0.7138 | 0.2862 | 0.3505 | 0.4039 | 0.0975 | 0.6902 | 2.0% |
| 3600 | 24.0 | 0.7188 | 0.2812 | 0.3507 | 0.4044 | 0.0975 | 0.6902 | 2.0% |
| 3600 | 14.2 | 0.6669 | 0.3329 | 0.3359 | 0.3766 | 0.1270 | 0.7352 | 2.5% |
| 3600 | 64.3 | 0.6814 | 0.3184 | 0.3407 | 0.3855 | 0.1270 | 0.7352 | 2.4% |
| 3600 | 90.4 | 0.6912 | 0.3087 | 0.3450 | 0.3935 | 0.1270 | 0.7352 | 2.2% |
| 3600 | 86.0 | 0.7008 | 0.2991 | 0.3483 | 0.3998 | 0.1270 | 0.7352 | 2.1% |
| 3600 | 64.3 | 0.7086 | 0.2914 | 0.3499 | 0.4028 | 0.1270 | 0.7352 | 2.0% |
| 3600 | 45.7 | 0.7138 | 0.2862 | 0.3505 | 0.4039 | 0.1270 | 0.7352 | 2.0% |
| 3600 | 24.0 | 0.7188 | 0.2812 | 0.3507 | 0.4044 | 0.1270 | 0.7352 | 2.0% |
| 3600 | 15.4 | 0.6669 | 0.3329 | 0.3327 | 0.3705 | 0.1561 | 0.7502 | 2.7% |
| 3600 | 64.9 | 0.6814 | 0.3184 | 0.3389 | 0.3823 | 0.1561 | 0.7502 | 2.4% |
| 3600 | 88.6 | 0.6912 | 0.3087 | 0.3446 | 0.3928 | 0.1561 | 0.7502 | 2.2% |
| 3600 | 87.8 | 0.7008 | 0.2991 | 0.3483 | 0.3997 | 0.1561 | 0.7502 | 2.1% |
| 3600 | 67.1 | 0.7086 | 0.2914 | 0.3502 | 0.4033 | 0.1561 | 0.7502 | 2.0% |
| 3600 | 45.7 | 0.7138 | 0.2862 | 0.3505 | 0.4039 | 0.1561 | 0.7502 | 2.0% |
| 3600 | 24.0 | 0.7188 | 0.2812 | 0.3507 | 0.4044 | 0.1561 | 0.7502 | 2.0% |
| 3600 | 17.1 | 0.6669 | 0.3329 | 0.3268 | 0.3595 | 0.1938 | 0.7479 | 2.9% |
| 3600 | 65.0 | 0.6814 | 0.3184 | 0.3367 | 0.3780 | 0.1938 | 0.7479 | 2.5% |
| 3600 | 86.3 | 0.6912 | 0.3087 | 0.3442 | 0.3922 | 0.1938 | 0.7479 | 2.2% |
| 3600 | 90.3 | 0.7008 | 0.2991 | 0.3484 | 0.4000 | 0.1938 | 0.7479 | 2.1% |
| 3600 | 67.5 | 0.7086 | 0.2914 | 0.3502 | 0.4034 | 0.1938 | 0.7479 | 2.0% |
| 3600 | 45.7 | 0.7138 | 0.2862 | 0.3505 | 0.4039 | 0.1938 | 0.7479 | 2.0% |
| 3600 | 24.0 | 0.7188 | 0.2812 | 0.3507 | 0.4044 | 0.1938 | 0.7479 | 2.0% |
| 3600 | 17.8 | 0.6669 | 0.3329 | 0.3176 | 0.3422 | 0.2329 | 0.7309 | 3.4% |
| 3600 | 63.4 | 0.6814 | 0.3184 | 0.3343 | 0.3735 | 0.2329 | 0.7309 | 2.6% |
| 3600 | 84.8 | 0.6912 | 0.3087 | 0.3436 | 0.3909 | 0.2329 | 0.7309 | 2.2% |
| 3600 | 95.9 | 0.7008 | 0.2991 | 0.3493 | 0.4017 | 0.2329 | 0.7309 | 2.0% |
| 3600 | 67.5 | 0.7086 | 0.2914 | 0.3502 | 0.4034 | 0.2329 | 0.7309 | 2.0% |
| 3600 | 45.7 | 0.7138 | 0.2862 | 0.3505 | 0.4039 | 0.2329 | 0.7309 | 2.0% |
| 3600 | 24.0 | 0.7188 | 0.2812 | 0.3507 | 0.4044 | 0.2329 | 0.7309 | 2.0% |
| 3500 | −8.4 | 0.6669 | 0.3329 | 0.4095 | 0.5146 | 0.1393 | 0.0514 | 0.4% |
| 3500 | 41.4 | 0.6814 | 0.3184 | 0.4095 | 0.5146 | 0.1393 | 0.0514 | 0.4% |
| 3500 | 79.8 | 0.6912 | 0.3087 | 0.4095 | 0.5146 | 0.1393 | 0.0514 | 0.4% |
| 3500 | 79.5 | 0.7008 | 0.2991 | 0.4095 | 0.5146 | 0.1393 | 0.0514 | 0.4% |
| 3500 | 45.6 | 0.7086 | 0.2914 | 0.4095 | 0.5146 | 0.1393 | 0.0514 | 0.4% |
| 3500 | 21.7 | 0.7138 | 0.2862 | 0.4095 | 0.5146 | 0.1393 | 0.0514 | 0.4% |
| 3500 | −1.9 | 0.7188 | 0.2812 | 0.4095 | 0.5146 | 0.1393 | 0.0514 | 0.4% |
| 3500 | −1.7 | 0.6669 | 0.3329 | 0.4095 | 0.5146 | 0.1303 | 0.0723 | 0.4% |
| 3500 | 50.5 | 0.6814 | 0.3184 | 0.4095 | 0.5146 | 0.1303 | 0.0723 | 0.4% |
| 3500 | 89.6 | 0.6912 | 0.3087 | 0.4073 | 0.5105 | 0.1303 | 0.0723 | 0.4% |
| 3500 | 69.9 | 0.7008 | 0.2991 | 0.4007 | 0.4980 | 0.1303 | 0.0723 | 0.6% |
| 3500 | 35.9 | 0.7086 | 0.2914 | 0.3984 | 0.4938 | 0.1303 | 0.0723 | 0.6% |
| 3500 | 12.8 | 0.7138 | 0.2862 | 0.3956 | 0.4884 | 0.1303 | 0.0723 | 0.7% |
| 3500 | −8.5 | 0.7188 | 0.2812 | 0.3900 | 0.4780 | 0.1303 | 0.0723 | 0.8% |
| 3500 | 1.5 | 0.6669 | 0.3329 | 0.3887 | 0.4756 | 0.1192 | 0.1046 | 0.8% |
| 3500 | 52.7 | 0.6814 | 0.3184 | 0.3848 | 0.4682 | 0.1192 | 0.1046 | 0.9% |
| 3500 | 90.2 | 0.6912 | 0.3087 | 0.3809 | 0.4609 | 0.1192 | 0.1046 | 1.1% |
| 3500 | 69.4 | 0.7008 | 0.2991 | 0.3778 | 0.4551 | 0.1192 | 0.1046 | 1.1% |

TABLE 2-continued

| | | | | | | | | |
|---|---|---|---|---|---|---|---|---|
| 3500 | 35.6 | 0.7086 | 0.2914 | 0.3766 | 0.4529 | 0.1192 | 0.1046 | 1.2% |
| 3500 | 13.4 | 0.7138 | 0.2862 | 0.3745 | 0.4489 | 0.1192 | 0.1046 | 1.2% |
| 3500 | −5.1 | 0.7188 | 0.2812 | 0.3696 | 0.4398 | 0.1192 | 0.1046 | 1.4% |
| 3500 | 2.3 | 0.6669 | 0.3329 | 0.3739 | 0.4479 | 0.1082 | 0.1444 | 1.2% |
| 3500 | 53.8 | 0.6814 | 0.3184 | 0.3722 | 0.4447 | 0.1082 | 0.1444 | 1.3% |
| 3500 | 91.1 | 0.6912 | 0.3087 | 0.3699 | 0.4403 | 0.1082 | 0.1444 | 1.4% |
| 3500 | 68.9 | 0.7008 | 0.2991 | 0.3680 | 0.4367 | 0.1082 | 0.1444 | 1.4% |
| 3500 | 35.9 | 0.7086 | 0.2914 | 0.3669 | 0.4347 | 0.1082 | 0.1444 | 1.4% |
| 3500 | 16.2 | 0.7138 | 0.2862 | 0.3644 | 0.4300 | 0.1082 | 0.1444 | 1.5% |
| 3500 | 0.4 | 0.7188 | 0.2812 | 0.3605 | 0.4227 | 0.1082 | 0.1444 | 1.6% |
| 3500 | 3.5 | 0.6669 | 0.3329 | 0.3634 | 0.4282 | 0.0934 | 0.2133 | 1.6% |
| 3500 | 55.6 | 0.6814 | 0.3184 | 0.3631 | 0.4276 | 0.0934 | 0.2133 | 1.6% |
| 3500 | 92.5 | 0.6912 | 0.3087 | 0.3620 | 0.4255 | 0.0934 | 0.2133 | 1.6% |
| 3500 | 68.8 | 0.7008 | 0.2991 | 0.3607 | 0.4230 | 0.0934 | 0.2133 | 1.6% |
| 3500 | 39.5 | 0.7086 | 0.2914 | 0.3591 | 0.4201 | 0.0934 | 0.2133 | 1.7% |
| 3500 | 23.0 | 0.7138 | 0.2862 | 0.3572 | 0.4164 | 0.0934 | 0.2133 | 1.8% |
| 3500 | 7.6 | 0.7188 | 0.2812 | 0.3553 | 0.4130 | 0.0934 | 0.2133 | 1.8% |
| 3500 | 5.6 | 0.6669 | 0.3329 | 0.3567 | 0.4155 | 0.0792 | 0.3084 | 1.8% |
| 3500 | 56.9 | 0.6814 | 0.3184 | 0.3569 | 0.4158 | 0.0792 | 0.3084 | 1.8% |
| 3500 | 93.2 | 0.6912 | 0.3087 | 0.3566 | 0.4154 | 0.0792 | 0.3084 | 1.8% |
| 3500 | 70.5 | 0.7008 | 0.2991 | 0.3559 | 0.4141 | 0.0792 | 0.3084 | 1.8% |
| 3500 | 45.1 | 0.7086 | 0.2914 | 0.3549 | 0.4122 | 0.0792 | 0.3084 | 1.8% |
| 3500 | 28.8 | 0.7138 | 0.2862 | 0.3542 | 0.4109 | 0.0792 | 0.3084 | 1.9% |
| 3500 | 13.4 | 0.7188 | 0.2812 | 0.3535 | 0.4096 | 0.0792 | 0.3084 | 1.9% |
| 3500 | 7.5 | 0.6669 | 0.3329 | 0.3523 | 0.4073 | 0.0709 | 0.4039 | 1.9% |
| 3500 | 57.9 | 0.6814 | 0.3184 | 0.3532 | 0.4089 | 0.0709 | 0.4039 | 1.9% |
| 3500 | 93.5 | 0.6912 | 0.3087 | 0.3535 | 0.4096 | 0.0709 | 0.4039 | 1.9% |
| 3500 | 73.1 | 0.7008 | 0.2991 | 0.3535 | 0.4096 | 0.0709 | 0.4039 | 1.9% |
| 3500 | 48.7 | 0.7086 | 0.2914 | 0.3534 | 0.4093 | 0.0709 | 0.4039 | 1.9% |
| 3500 | 32.8 | 0.7138 | 0.2862 | 0.3533 | 0.4091 | 0.0709 | 0.4039 | 1.9% |
| 3500 | 16.5 | 0.7188 | 0.2812 | 0.3532 | 0.4089 | 0.0709 | 0.4039 | 1.9% |
| 3500 | 9.0 | 0.6669 | 0.3329 | 0.3480 | 0.3992 | 0.0694 | 0.5232 | 2.1% |
| 3500 | 59.3 | 0.6814 | 0.3184 | 0.3499 | 0.4029 | 0.0694 | 0.5232 | 2.0% |
| 3500 | 93.4 | 0.6912 | 0.3087 | 0.3510 | 0.4049 | 0.0694 | 0.5232 | 2.0% |
| 3500 | 76.1 | 0.7008 | 0.2991 | 0.3520 | 0.4067 | 0.0694 | 0.5232 | 1.9% |
| 3500 | 52.8 | 0.7086 | 0.2914 | 0.3526 | 0.4078 | 0.0694 | 0.5232 | 1.9% |
| 3500 | 37.6 | 0.7138 | 0.2862 | 0.3529 | 0.4085 | 0.0694 | 0.5232 | 1.9% |
| 3500 | 16.5 | 0.7188 | 0.2812 | 0.3532 | 0.4089 | 0.0694 | 0.5232 | 1.9% |
| 3500 | 10.5 | 0.6669 | 0.3329 | 0.3445 | 0.3926 | 0.0799 | 0.6269 | 2.2% |
| 3500 | 60.5 | 0.6814 | 0.3184 | 0.3475 | 0.3982 | 0.0799 | 0.6269 | 2.1% |
| 3500 | 92.5 | 0.6912 | 0.3087 | 0.3494 | 0.4019 | 0.0799 | 0.6269 | 2.0% |
| 3500 | 79.5 | 0.7008 | 0.2991 | 0.3513 | 0.4054 | 0.0799 | 0.6269 | 2.0% |
| 3500 | 57.5 | 0.7086 | 0.2914 | 0.3524 | 0.4076 | 0.0799 | 0.6269 | 1.9% |
| 3500 | 39.0 | 0.7138 | 0.2862 | 0.3529 | 0.4085 | 0.0799 | 0.6269 | 1.9% |
| 3500 | 16.5 | 0.7188 | 0.2812 | 0.3532 | 0.4089 | 0.0799 | 0.6269 | 1.9% |
| 3500 | 10.9 | 0.6669 | 0.3329 | 0.3420 | 0.3880 | 0.0975 | 0.6902 | 2.3% |
| 3500 | 61.4 | 0.6814 | 0.3184 | 0.3457 | 0.3950 | 0.0975 | 0.6902 | 2.2% |
| 3500 | 91.5 | 0.6912 | 0.3087 | 0.3486 | 0.4003 | 0.0975 | 0.6902 | 2.1% |
| 3500 | 83.0 | 0.7008 | 0.2991 | 0.3512 | 0.4052 | 0.0975 | 0.6902 | 2.0% |
| 3500 | 61.0 | 0.7086 | 0.2914 | 0.3526 | 0.4079 | 0.0975 | 0.6902 | 1.9% |
| 3500 | 39.0 | 0.7138 | 0.2862 | 0.3529 | 0.4085 | 0.0975 | 0.6902 | 1.9% |
| 3500 | 16.5 | 0.7188 | 0.2812 | 0.3532 | 0.4089 | 0.0975 | 0.6902 | 1.9% |
| 3500 | 11.7 | 0.6669 | 0.3329 | 0.3391 | 0.3826 | 0.1270 | 0.7352 | 2.4% |
| 3500 | 62.5 | 0.6814 | 0.3184 | 0.3438 | 0.3914 | 0.1270 | 0.7352 | 2.2% |
| 3500 | 89.9 | 0.6912 | 0.3087 | 0.3479 | 0.3991 | 0.1270 | 0.7352 | 2.1% |
| 3500 | 86.3 | 0.7008 | 0.2991 | 0.3513 | 0.4054 | 0.1270 | 0.7352 | 2.0% |
| 3500 | 61.7 | 0.7086 | 0.2914 | 0.3527 | 0.4080 | 0.1270 | 0.7352 | 1.9% |
| 3500 | 39.0 | 0.7138 | 0.2862 | 0.3529 | 0.4085 | 0.1270 | 0.7352 | 1.9% |
| 3500 | 16.5 | 0.7188 | 0.2812 | 0.3532 | 0.4089 | 0.1270 | 0.7352 | 1.9% |
| 3500 | 12.7 | 0.6669 | 0.3329 | 0.3361 | 0.3768 | 0.1561 | 0.7502 | 2.5% |
| 3500 | 63.1 | 0.6814 | 0.3184 | 0.3422 | 0.3884 | 0.1561 | 0.7502 | 2.3% |
| 3500 | 88.2 | 0.6912 | 0.3087 | 0.3476 | 0.3985 | 0.1561 | 0.7502 | 2.1% |
| 3500 | 88.2 | 0.7008 | 0.2991 | 0.3514 | 0.4056 | 0.1561 | 0.7502 | 2.0% |
| 3500 | 61.7 | 0.7086 | 0.2914 | 0.3527 | 0.4080 | 0.1561 | 0.7502 | 1.9% |
| 3500 | 39.0 | 0.7138 | 0.2862 | 0.3529 | 0.4085 | 0.1561 | 0.7502 | 1.9% |
| 3500 | 16.5 | 0.7188 | 0.2812 | 0.3532 | 0.4089 | 0.1561 | 0.7502 | 1.9% |
| 3500 | 14.4 | 0.6669 | 0.3329 | 0.3306 | 0.3666 | 0.1938 | 0.7479 | 2.8% |
| 3500 | 63.3 | 0.6814 | 0.3184 | 0.3401 | 0.3845 | 0.1938 | 0.7479 | 2.4% |
| 3500 | 85.7 | 0.6912 | 0.3087 | 0.3474 | 0.3982 | 0.1938 | 0.7479 | 2.1% |
| 3500 | 90.7 | 0.7008 | 0.2991 | 0.3517 | 0.4061 | 0.1938 | 0.7479 | 1.9% |
| 3500 | 61.7 | 0.7086 | 0.2914 | 0.3527 | 0.4080 | 0.1938 | 0.7479 | 1.9% |
| 3500 | 39.0 | 0.7138 | 0.2862 | 0.3529 | 0.4085 | 0.1938 | 0.7479 | 1.9% |
| 3500 | 16.5 | 0.7188 | 0.2812 | 0.3532 | 0.4089 | 0.1938 | 0.7479 | 1.9% |
| 3500 | 15.3 | 0.6669 | 0.3329 | 0.3218 | 0.3500 | 0.2329 | 0.7309 | 3.2% |
| 3500 | 62.0 | 0.6814 | 0.3184 | 0.3379 | 0.3802 | 0.2329 | 0.7309 | 2.5% |
| 3500 | 83.9 | 0.6912 | 0.3087 | 0.3470 | 0.3974 | 0.2329 | 0.7309 | 2.1% |
| 3500 | 94.0 | 0.7008 | 0.2991 | 0.3522 | 0.4072 | 0.2329 | 0.7309 | 1.9% |
| 3500 | 61.7 | 0.7086 | 0.2914 | 0.3527 | 0.4080 | 0.2329 | 0.7309 | 1.9% |
| 3500 | 39.0 | 0.7138 | 0.2862 | 0.3529 | 0.4085 | 0.2329 | 0.7309 | 1.9% |
| 3500 | 16.5 | 0.7188 | 0.2812 | 0.3532 | 0.4089 | 0.2329 | 0.7309 | 1.9% |

TABLE 2-continued

| | | | | | | | |
|---|---|---|---|---|---|---|---|
| 3400 | −9.4 | 0.6669 | 0.3329 | 0.4095 | 0.5146 | 0.1393 | 0.0514 | 0.4% |
| 3400 | 42.1 | 0.6814 | 0.3184 | 0.4095 | 0.5146 | 0.1393 | 0.0514 | 0.4% |
| 3400 | 81.7 | 0.6912 | 0.3087 | 0.4095 | 0.5146 | 0.1393 | 0.0514 | 0.4% |
| 3400 | 76.3 | 0.7008 | 0.2991 | 0.4095 | 0.5146 | 0.1393 | 0.0514 | 0.4% |
| 3400 | 41.2 | 0.7086 | 0.2914 | 0.4095 | 0.5146 | 0.1393 | 0.0514 | 0.4% |
| 3400 | 16.6 | 0.7138 | 0.2862 | 0.4095 | 0.5146 | 0.1393 | 0.0514 | 0.4% |
| 3400 | −7.8 | 0.7188 | 0.2812 | 0.4095 | 0.5146 | 0.1393 | 0.0514 | 0.4% |
| 3400 | −3.2 | 0.6669 | 0.3329 | 0.4095 | 0.5146 | 0.1303 | 0.0723 | 0.4% |
| 3400 | 50.4 | 0.6814 | 0.3184 | 0.4095 | 0.5146 | 0.1303 | 0.0723 | 0.4% |
| 3400 | 89.9 | 0.6912 | 0.3087 | 0.4049 | 0.5059 | 0.1303 | 0.0723 | 0.5% |
| 3400 | 68.0 | 0.7008 | 0.2991 | 0.3997 | 0.4963 | 0.1303 | 0.0723 | 0.6% |
| 3400 | 32.9 | 0.7086 | 0.2914 | 0.3976 | 0.4922 | 0.1303 | 0.0723 | 0.6% |
| 3400 | 9.1 | 0.7138 | 0.2862 | 0.3948 | 0.4870 | 0.1303 | 0.0723 | 0.7% |
| 3400 | −13.4 | 0.7188 | 0.2812 | 0.3901 | 0.4783 | 0.1303 | 0.0723 | 0.8% |
| 3400 | −0.2 | 0.6669 | 0.3329 | 0.3900 | 0.4780 | 0.1192 | 0.1046 | 0.8% |
| 3400 | 52.4 | 0.6814 | 0.3184 | 0.3858 | 0.4701 | 0.1192 | 0.1046 | 0.9% |
| 3400 | 90.5 | 0.6912 | 0.3087 | 0.3812 | 0.4616 | 0.1192 | 0.1046 | 1.0% |
| 3400 | 67.5 | 0.7008 | 0.2991 | 0.3787 | 0.4568 | 0.1192 | 0.1046 | 1.1% |
| 3400 | 32.7 | 0.7086 | 0.2914 | 0.3776 | 0.4547 | 0.1192 | 0.1046 | 1.1% |
| 3400 | 9.6 | 0.7138 | 0.2862 | 0.3756 | 0.4511 | 0.1192 | 0.1046 | 1.2% |
| 3400 | −10.2 | 0.7188 | 0.2812 | 0.3711 | 0.4425 | 0.1192 | 0.1046 | 1.3% |
| 3400 | 0.5 | 0.6669 | 0.3329 | 0.3758 | 0.4514 | 0.1082 | 0.1444 | 1.2% |
| 3400 | 53.5 | 0.6814 | 0.3184 | 0.3741 | 0.4482 | 0.1082 | 0.1444 | 1.2% |
| 3400 | 91.6 | 0.6912 | 0.3087 | 0.3715 | 0.4433 | 0.1082 | 0.1444 | 1.3% |
| 3400 | 67.2 | 0.7008 | 0.2991 | 0.3695 | 0.4396 | 0.1082 | 0.1444 | 1.4% |
| 3400 | 33.0 | 0.7086 | 0.2914 | 0.3686 | 0.4378 | 0.1082 | 0.1444 | 1.4% |
| 3400 | 12.3 | 0.7138 | 0.2862 | 0.3662 | 0.4333 | 0.1082 | 0.1444 | 1.5% |
| 3400 | −4.0 | 0.7188 | 0.2812 | 0.3620 | 0.4254 | 0.1082 | 0.1444 | 1.6% |
| 3400 | 1.7 | 0.6669 | 0.3329 | 0.3657 | 0.4324 | 0.0934 | 0.2133 | 1.5% |
| 3400 | 54.8 | 0.6814 | 0.3184 | 0.3651 | 0.4313 | 0.0934 | 0.2133 | 1.5% |
| 3400 | 92.5 | 0.6912 | 0.3087 | 0.3639 | 0.4290 | 0.0934 | 0.2133 | 1.5% |
| 3400 | 67.2 | 0.7008 | 0.2991 | 0.3627 | 0.4267 | 0.0934 | 0.2133 | 1.6% |
| 3400 | 36.8 | 0.7086 | 0.2914 | 0.3611 | 0.4239 | 0.0934 | 0.2133 | 1.6% |
| 3400 | 20.0 | 0.7138 | 0.2862 | 0.3589 | 0.4198 | 0.0934 | 0.2133 | 1.7% |
| 3400 | 4.5 | 0.7188 | 0.2812 | 0.3569 | 0.4158 | 0.0934 | 0.2133 | 1.8% |
| 3400 | 3.6 | 0.6669 | 0.3329 | 0.3592 | 0.4201 | 0.0792 | 0.3084 | 1.7% |
| 3400 | 55.8 | 0.6814 | 0.3184 | 0.3592 | 0.4202 | 0.0792 | 0.3084 | 1.7% |
| 3400 | 93.1 | 0.6912 | 0.3087 | 0.3589 | 0.4196 | 0.0792 | 0.3084 | 1.7% |
| 3400 | 69.3 | 0.7008 | 0.2991 | 0.3582 | 0.4183 | 0.0792 | 0.3084 | 1.7% |
| 3400 | 43.4 | 0.7086 | 0.2914 | 0.3570 | 0.4162 | 0.0792 | 0.3084 | 1.8% |
| 3400 | 26.9 | 0.7138 | 0.2862 | 0.3562 | 0.4146 | 0.0792 | 0.3084 | 1.8% |
| 3400 | 9.0 | 0.7188 | 0.2812 | 0.3557 | 0.4137 | 0.0792 | 0.3084 | 1.8% |
| 3400 | 5.3 | 0.6669 | 0.3329 | 0.3549 | 0.4122 | 0.0709 | 0.4039 | 1.8% |
| 3400 | 56.7 | 0.6814 | 0.3184 | 0.3557 | 0.4137 | 0.0709 | 0.4039 | 1.8% |
| 3400 | 93.2 | 0.6912 | 0.3087 | 0.3560 | 0.4143 | 0.0709 | 0.4039 | 1.8% |
| 3400 | 72.4 | 0.7008 | 0.2991 | 0.3559 | 0.4141 | 0.0709 | 0.4039 | 1.8% |
| 3400 | 47.6 | 0.7086 | 0.2914 | 0.3557 | 0.4137 | 0.0709 | 0.4039 | 1.8% |
| 3400 | 31.3 | 0.7138 | 0.2862 | 0.3555 | 0.4133 | 0.0709 | 0.4039 | 1.8% |
| 3400 | 9.0 | 0.7188 | 0.2812 | 0.3557 | 0.4137 | 0.0709 | 0.4039 | 1.8% |
| 3400 | 6.8 | 0.6669 | 0.3329 | 0.3508 | 0.4044 | 0.0694 | 0.5232 | 2.0% |
| 3400 | 57.9 | 0.6814 | 0.3184 | 0.3527 | 0.4080 | 0.0694 | 0.5232 | 1.9% |
| 3400 | 93.0 | 0.6912 | 0.3087 | 0.3537 | 0.4099 | 0.0694 | 0.5232 | 1.9% |
| 3400 | 75.8 | 0.7008 | 0.2991 | 0.3546 | 0.4116 | 0.0694 | 0.5232 | 1.8% |
| 3400 | 52.0 | 0.7086 | 0.2914 | 0.3552 | 0.4127 | 0.0694 | 0.5232 | 1.8% |
| 3400 | 32.4 | 0.7138 | 0.2862 | 0.3555 | 0.4132 | 0.0694 | 0.5232 | 1.8% |
| 3400 | 9.0 | 0.7188 | 0.2812 | 0.3557 | 0.4137 | 0.0694 | 0.5232 | 1.8% |
| 3400 | 8.1 | 0.6669 | 0.3329 | 0.3474 | 0.3981 | 0.0799 | 0.6269 | 2.1% |
| 3400 | 58.9 | 0.6814 | 0.3184 | 0.3504 | 0.4037 | 0.0799 | 0.6269 | 2.0% |
| 3400 | 92.0 | 0.6912 | 0.3087 | 0.3523 | 0.4073 | 0.0799 | 0.6269 | 1.9% |
| 3400 | 79.4 | 0.7008 | 0.2991 | 0.3541 | 0.4107 | 0.0799 | 0.6269 | 1.9% |
| 3400 | 56.0 | 0.7086 | 0.2914 | 0.3552 | 0.4127 | 0.0799 | 0.6269 | 1.8% |
| 3400 | 32.4 | 0.7138 | 0.2862 | 0.3555 | 0.4132 | 0.0799 | 0.6269 | 1.8% |
| 3400 | 9.0 | 0.7188 | 0.2812 | 0.3557 | 0.4137 | 0.0799 | 0.6269 | 1.8% |
| 3400 | 8.5 | 0.6669 | 0.3329 | 0.3451 | 0.3938 | 0.0975 | 0.6902 | 2.2% |
| 3400 | 59.7 | 0.6814 | 0.3184 | 0.3488 | 0.4008 | 0.0975 | 0.6902 | 2.0% |
| 3400 | 90.9 | 0.6912 | 0.3087 | 0.3515 | 0.4059 | 0.0975 | 0.6902 | 2.0% |
| 3400 | 82.9 | 0.7008 | 0.2991 | 0.3541 | 0.4107 | 0.0975 | 0.6902 | 1.9% |
| 3400 | 56.0 | 0.7086 | 0.2914 | 0.3552 | 0.4127 | 0.0975 | 0.6902 | 1.8% |
| 3400 | 32.4 | 0.7138 | 0.2862 | 0.3555 | 0.4132 | 0.0975 | 0.6902 | 1.8% |
| 3400 | 9.0 | 0.7188 | 0.2812 | 0.3557 | 0.4137 | 0.0975 | 0.6902 | 1.8% |
| 3400 | 9.1 | 0.6669 | 0.3329 | 0.3424 | 0.3887 | 0.1270 | 0.7352 | 2.3% |
| 3400 | 60.6 | 0.6814 | 0.3184 | 0.3471 | 0.3975 | 0.1270 | 0.7352 | 2.1% |
| 3400 | 89.4 | 0.6912 | 0.3087 | 0.3510 | 0.4049 | 0.1270 | 0.7352 | 2.0% |
| 3400 | 86.5 | 0.7008 | 0.2991 | 0.3544 | 0.4112 | 0.1270 | 0.7352 | 1.9% |
| 3400 | 56.0 | 0.7086 | 0.2914 | 0.3552 | 0.4127 | 0.1270 | 0.7352 | 1.8% |
| 3400 | 32.4 | 0.7138 | 0.2862 | 0.3555 | 0.4132 | 0.1270 | 0.7352 | 1.8% |
| 3400 | 9.0 | 0.7188 | 0.2812 | 0.3557 | 0.4137 | 0.1270 | 0.7352 | 1.8% |
| 3400 | 10.0 | 0.6669 | 0.3329 | 0.3396 | 0.3834 | 0.1561 | 0.7502 | 2.4% |
| 3400 | 61.3 | 0.6814 | 0.3184 | 0.3456 | 0.3947 | 0.1561 | 0.7502 | 2.2% |
| 3400 | 87.7 | 0.6912 | 0.3087 | 0.3508 | 0.4044 | 0.1561 | 0.7502 | 2.0% |

TABLE 2-continued

| | | | | | | | |
|---|---|---|---|---|---|---|---|
| 3400 | 88.6 | 0.7008 | 0.2991 | 0.3546 | 0.4116 | 0.1561 | 0.7502 | 1.8% |
| 3400 | 56.0 | 0.7086 | 0.2914 | 0.3552 | 0.4127 | 0.1561 | 0.7502 | 1.8% |
| 3400 | 32.4 | 0.7138 | 0.2862 | 0.3555 | 0.4132 | 0.1561 | 0.7502 | 1.8% |
| 3400 | 9.0 | 0.7188 | 0.2812 | 0.3557 | 0.4137 | 0.1561 | 0.7502 | 1.8% |
| 3400 | 11.5 | 0.6669 | 0.3329 | 0.3346 | 0.3740 | 0.1938 | 0.7479 | 2.6% |
| 3400 | 61.5 | 0.6814 | 0.3184 | 0.3437 | 0.3911 | 0.1938 | 0.7479 | 2.2% |
| 3400 | 85.2 | 0.6912 | 0.3087 | 0.3507 | 0.4043 | 0.1938 | 0.7479 | 2.0% |
| 3400 | 89.5 | 0.7008 | 0.2991 | 0.3547 | 0.4119 | 0.1938 | 0.7479 | 1.8% |
| 3400 | 56.0 | 0.7086 | 0.2914 | 0.3552 | 0.4127 | 0.1938 | 0.7479 | 1.8% |
| 3400 | 32.4 | 0.7138 | 0.2862 | 0.3555 | 0.4132 | 0.1938 | 0.7479 | 1.8% |
| 3400 | 9.0 | 0.7188 | 0.2812 | 0.3557 | 0.4137 | 0.1938 | 0.7479 | 1.8% |
| 3400 | 12.6 | 0.6669 | 0.3329 | 0.3261 | 0.3582 | 0.2329 | 0.7309 | 3.0% |
| 3400 | 60.5 | 0.6814 | 0.3184 | 0.3416 | 0.3873 | 0.2329 | 0.7309 | 2.3% |
| 3400 | 83.1 | 0.6912 | 0.3087 | 0.3506 | 0.4041 | 0.2329 | 0.7309 | 2.0% |
| 3400 | 89.5 | 0.7008 | 0.2991 | 0.3547 | 0.4119 | 0.2329 | 0.7309 | 1.8% |
| 3400 | 56.0 | 0.7086 | 0.2914 | 0.3552 | 0.4127 | 0.2329 | 0.7309 | 1.8% |
| 3400 | 32.4 | 0.7138 | 0.2862 | 0.3555 | 0.4132 | 0.2329 | 0.7309 | 1.8% |
| 3400 | 9.0 | 0.7188 | 0.2812 | 0.3557 | 0.4137 | 0.2329 | 0.7309 | 1.8% |
| 3300 | −10.6 | 0.6669 | 0.3329 | 0.4095 | 0.5146 | 0.1393 | 0.0514 | 0.4% |
| 3300 | 42.7 | 0.6814 | 0.3184 | 0.4095 | 0.5146 | 0.1393 | 0.0514 | 0.4% |
| 3300 | 83.5 | 0.6912 | 0.3087 | 0.4095 | 0.5146 | 0.1393 | 0.0514 | 0.4% |
| 3300 | 73.0 | 0.7008 | 0.2991 | 0.4095 | 0.5146 | 0.1393 | 0.0514 | 0.4% |
| 3300 | 36.8 | 0.7086 | 0.2914 | 0.4095 | 0.5146 | 0.1393 | 0.0514 | 0.4% |
| 3300 | 11.4 | 0.7138 | 0.2862 | 0.4095 | 0.5146 | 0.1393 | 0.0514 | 0.4% |
| 3300 | −13.8 | 0.7188 | 0.2812 | 0.4095 | 0.5146 | 0.1393 | 0.0514 | 0.4% |
| 3300 | −4.9 | 0.6669 | 0.3329 | 0.4095 | 0.5146 | 0.1303 | 0.0723 | 0.4% |
| 3300 | 50.3 | 0.6814 | 0.3184 | 0.4095 | 0.5146 | 0.1303 | 0.0723 | 0.4% |
| 3300 | 90.2 | 0.6912 | 0.3087 | 0.4025 | 0.5014 | 0.1303 | 0.0723 | 0.5% |
| 3300 | 66.1 | 0.7008 | 0.2991 | 0.3986 | 0.4941 | 0.1303 | 0.0723 | 0.6% |
| 3300 | 30.1 | 0.7086 | 0.2914 | 0.3963 | 0.4899 | 0.1303 | 0.0723 | 0.7% |
| 3300 | 5.6 | 0.7138 | 0.2862 | 0.3935 | 0.4846 | 0.1303 | 0.0723 | 0.7% |
| 3300 | −17.9 | 0.7188 | 0.2812 | 0.3895 | 0.4770 | 0.1303 | 0.0723 | 0.8% |
| 3300 | −2.1 | 0.6669 | 0.3329 | 0.3912 | 0.4803 | 0.1192 | 0.1046 | 0.8% |
| 3300 | 52.0 | 0.6814 | 0.3184 | 0.3870 | 0.4723 | 0.1192 | 0.1046 | 0.9% |
| 3300 | 91.1 | 0.6912 | 0.3087 | 0.3821 | 0.4632 | 0.1192 | 0.1046 | 1.0% |
| 3300 | 65.8 | 0.7008 | 0.2991 | 0.3794 | 0.4582 | 0.1192 | 0.1046 | 1.1% |
| 3300 | 29.9 | 0.7086 | 0.2914 | 0.3783 | 0.4561 | 0.1192 | 0.1046 | 1.1% |
| 3300 | 6.0 | 0.7138 | 0.2862 | 0.3765 | 0.4526 | 0.1192 | 0.1046 | 1.2% |
| 3300 | −15.2 | 0.7188 | 0.2812 | 0.3724 | 0.4451 | 0.1192 | 0.1046 | 1.3% |
| 3300 | −1.4 | 0.6669 | 0.3329 | 0.3777 | 0.4549 | 0.1082 | 0.1444 | 1.1% |
| 3300 | 53.0 | 0.6814 | 0.3184 | 0.3759 | 0.4515 | 0.1082 | 0.1444 | 1.2% |
| 3300 | 91.9 | 0.6912 | 0.3087 | 0.3729 | 0.4459 | 0.1082 | 0.1444 | 1.3% |
| 3300 | 65.5 | 0.7008 | 0.2991 | 0.3710 | 0.4424 | 0.1082 | 0.1444 | 1.3% |
| 3300 | 30.2 | 0.7086 | 0.2914 | 0.3701 | 0.4408 | 0.1082 | 0.1444 | 1.4% |
| 3300 | 8.3 | 0.7138 | 0.2862 | 0.3679 | 0.4366 | 0.1082 | 0.1444 | 1.4% |
| 3300 | −8.6 | 0.7188 | 0.2812 | 0.3635 | 0.4282 | 0.1082 | 0.1444 | 1.6% |
| 3300 | −0.3 | 0.6669 | 0.3329 | 0.3679 | 0.4366 | 0.0934 | 0.2133 | 1.4% |
| 3300 | 53.9 | 0.6814 | 0.3184 | 0.3672 | 0.4352 | 0.0934 | 0.2133 | 1.4% |
| 3300 | 92.5 | 0.6912 | 0.3087 | 0.3658 | 0.4326 | 0.0934 | 0.2133 | 1.5% |
| 3300 | 65.7 | 0.7008 | 0.2991 | 0.3647 | 0.4305 | 0.0934 | 0.2133 | 1.5% |
| 3300 | 33.9 | 0.7086 | 0.2914 | 0.3632 | 0.4277 | 0.0934 | 0.2133 | 1.6% |
| 3300 | 16.9 | 0.7138 | 0.2862 | 0.3607 | 0.4231 | 0.0934 | 0.2133 | 1.6% |
| 3300 | 1.3 | 0.7188 | 0.2812 | 0.3584 | 0.4187 | 0.0934 | 0.2133 | 1.7% |
| 3300 | 1.5 | 0.6669 | 0.3329 | 0.3617 | 0.4249 | 0.0792 | 0.3084 | 1.6% |
| 3300 | 54.6 | 0.6814 | 0.3184 | 0.3615 | 0.4246 | 0.0792 | 0.3084 | 1.6% |
| 3300 | 92.9 | 0.6912 | 0.3087 | 0.3612 | 0.4239 | 0.0792 | 0.3084 | 1.6% |
| 3300 | 68.1 | 0.7008 | 0.2991 | 0.3604 | 0.4226 | 0.0792 | 0.3084 | 1.7% |
| 3300 | 41.7 | 0.7086 | 0.2914 | 0.3591 | 0.4201 | 0.0792 | 0.3084 | 1.7% |
| 3300 | 25.0 | 0.7138 | 0.2862 | 0.3582 | 0.4184 | 0.0792 | 0.3084 | 1.7% |
| 3300 | 1.4 | 0.7188 | 0.2812 | 0.3584 | 0.4187 | 0.0792 | 0.3084 | 1.7% |
| 3300 | 3.0 | 0.6669 | 0.3329 | 0.3576 | 0.4173 | 0.0709 | 0.4039 | 1.7% |
| 3300 | 55.5 | 0.6814 | 0.3184 | 0.3583 | 0.4186 | 0.0709 | 0.4039 | 1.7% |
| 3300 | 92.9 | 0.6912 | 0.3087 | 0.3586 | 0.4190 | 0.0709 | 0.4039 | 1.7% |
| 3300 | 71.8 | 0.7008 | 0.2991 | 0.3584 | 0.4187 | 0.0709 | 0.4039 | 1.7% |
| 3300 | 46.5 | 0.7086 | 0.2914 | 0.3581 | 0.4181 | 0.0709 | 0.4039 | 1.7% |
| 3300 | 25.8 | 0.7138 | 0.2862 | 0.3581 | 0.4181 | 0.0709 | 0.4039 | 1.7% |
| 3300 | 1.4 | 0.7188 | 0.2812 | 0.3584 | 0.4187 | 0.0709 | 0.4039 | 1.7% |
| 3300 | 4.3 | 0.6669 | 0.3329 | 0.3536 | 0.4098 | 0.0694 | 0.5232 | 1.9% |
| 3300 | 56.4 | 0.6814 | 0.3184 | 0.3555 | 0.4133 | 0.0694 | 0.5232 | 1.8% |
| 3300 | 92.5 | 0.6912 | 0.3087 | 0.3565 | 0.4151 | 0.0694 | 0.5232 | 1.8% |
| 3300 | 75.6 | 0.7008 | 0.2991 | 0.3573 | 0.4166 | 0.0694 | 0.5232 | 1.8% |
| 3300 | 50.2 | 0.7086 | 0.2914 | 0.3578 | 0.4176 | 0.0694 | 0.5232 | 1.7% |
| 3300 | 25.8 | 0.7138 | 0.2862 | 0.3581 | 0.4181 | 0.0694 | 0.5232 | 1.7% |
| 3300 | 1.4 | 0.7188 | 0.2812 | 0.3584 | 0.4187 | 0.0694 | 0.5232 | 1.7% |
| 3300 | 5.6 | 0.6669 | 0.3329 | 0.3504 | 0.4037 | 0.0799 | 0.6269 | 2.0% |
| 3300 | 57.2 | 0.6814 | 0.3184 | 0.3534 | 0.4094 | 0.0799 | 0.6269 | 1.9% |
| 3300 | 91.5 | 0.6912 | 0.3087 | 0.3552 | 0.4127 | 0.0799 | 0.6269 | 1.8% |
| 3300 | 79.2 | 0.7008 | 0.2991 | 0.3570 | 0.4161 | 0.0799 | 0.6269 | 1.8% |
| 3300 | 50.2 | 0.7086 | 0.2914 | 0.3578 | 0.4176 | 0.0799 | 0.6269 | 1.7% |
| 3300 | 25.8 | 0.7138 | 0.2862 | 0.3581 | 0.4181 | 0.0799 | 0.6269 | 1.7% |

TABLE 2-continued

| | | | | | | | |
|---|---|---|---|---|---|---|---|
| 3300 | 1.4 | 0.7188 | 0.2812 | 0.3584 | 0.4187 | 0.0799 | 0.6269 | 1.7% |
| 3300 | 5.9 | 0.6669 | 0.3329 | 0.3482 | 0.3996 | 0.0975 | 0.6902 | 2.1% |
| 3300 | 57.8 | 0.6814 | 0.3184 | 0.3520 | 0.4067 | 0.0975 | 0.6902 | 1.9% |
| 3300 | 90.3 | 0.6912 | 0.3087 | 0.3546 | 0.4116 | 0.0975 | 0.6902 | 1.8% |
| 3300 | 82.9 | 0.7008 | 0.2991 | 0.3571 | 0.4164 | 0.0975 | 0.6902 | 1.8% |
| 3300 | 50.2 | 0.7086 | 0.2914 | 0.3578 | 0.4176 | 0.0975 | 0.6902 | 1.7% |
| 3300 | 25.8 | 0.7138 | 0.2862 | 0.3581 | 0.4181 | 0.0975 | 0.6902 | 1.7% |
| 3300 | 1.4 | 0.7188 | 0.2812 | 0.3584 | 0.4187 | 0.0975 | 0.6902 | 1.7% |
| 3300 | 6.3 | 0.6669 | 0.3329 | 0.3457 | 0.3949 | 0.1270 | 0.7352 | 2.2% |
| 3300 | 58.6 | 0.6814 | 0.3184 | 0.3504 | 0.4038 | 0.1270 | 0.7352 | 2.0% |
| 3300 | 88.8 | 0.6912 | 0.3087 | 0.3542 | 0.4108 | 0.1270 | 0.7352 | 1.9% |
| 3300 | 85.1 | 0.7008 | 0.2991 | 0.3573 | 0.4167 | 0.1270 | 0.7352 | 1.8% |
| 3300 | 50.2 | 0.7086 | 0.2914 | 0.3578 | 0.4176 | 0.1270 | 0.7352 | 1.7% |
| 3300 | 25.8 | 0.7138 | 0.2862 | 0.3581 | 0.4181 | 0.1270 | 0.7352 | 1.7% |
| 3300 | 1.4 | 0.7188 | 0.2812 | 0.3584 | 0.4187 | 0.1270 | 0.7352 | 1.7% |
| 3300 | 7.1 | 0.6669 | 0.3329 | 0.3432 | 0.3902 | 0.1561 | 0.7502 | 2.3% |
| 3300 | 59.2 | 0.6814 | 0.3184 | 0.3491 | 0.4013 | 0.1561 | 0.7502 | 2.0% |
| 3300 | 87.2 | 0.6912 | 0.3087 | 0.3540 | 0.4105 | 0.1561 | 0.7502 | 1.9% |
| 3300 | 85.1 | 0.7008 | 0.2991 | 0.3573 | 0.4167 | 0.1561 | 0.7502 | 1.8% |
| 3300 | 50.2 | 0.7086 | 0.2914 | 0.3578 | 0.4176 | 0.1561 | 0.7502 | 1.7% |
| 3300 | 25.8 | 0.7138 | 0.2862 | 0.3581 | 0.4181 | 0.1561 | 0.7502 | 1.7% |
| 3300 | 1.4 | 0.7188 | 0.2812 | 0.3584 | 0.4187 | 0.1561 | 0.7502 | 1.7% |
| 3300 | 8.5 | 0.6669 | 0.3329 | 0.3386 | 0.3817 | 0.1938 | 0.7479 | 2.4% |
| 3300 | 59.6 | 0.6814 | 0.3184 | 0.3474 | 0.3981 | 0.1938 | 0.7479 | 2.1% |
| 3300 | 84.8 | 0.6912 | 0.3087 | 0.3540 | 0.4106 | 0.1938 | 0.7479 | 1.9% |
| 3300 | 85.1 | 0.7008 | 0.2991 | 0.3573 | 0.4167 | 0.1938 | 0.7479 | 1.8% |
| 3300 | 50.2 | 0.7086 | 0.2914 | 0.3578 | 0.4176 | 0.1938 | 0.7479 | 1.7% |
| 3300 | 25.8 | 0.7138 | 0.2862 | 0.3581 | 0.4181 | 0.1938 | 0.7479 | 1.7% |
| 3300 | 1.4 | 0.7188 | 0.2812 | 0.3584 | 0.4187 | 0.1938 | 0.7479 | 1.7% |
| 3300 | 9.7 | 0.6669 | 0.3329 | 0.3307 | 0.3669 | 0.2329 | 0.7309 | 2.8% |
| 3300 | 58.7 | 0.6814 | 0.3184 | 0.3455 | 0.3945 | 0.2329 | 0.7309 | 2.2% |
| 3300 | 82.3 | 0.6912 | 0.3087 | 0.3542 | 0.4108 | 0.2329 | 0.7309 | 1.9% |
| 3300 | 85.1 | 0.7008 | 0.2991 | 0.3573 | 0.4167 | 0.2329 | 0.7309 | 1.8% |
| 3300 | 50.2 | 0.7086 | 0.2914 | 0.3578 | 0.4176 | 0.2329 | 0.7309 | 1.7% |
| 3300 | 25.8 | 0.7138 | 0.2862 | 0.3581 | 0.4181 | 0.2329 | 0.7309 | 1.7% |
| 3300 | 1.4 | 0.7188 | 0.2812 | 0.3584 | 0.4187 | 0.2329 | 0.7309 | 1.7% |
| 3200 | −11.9 | 0.6669 | 0.3329 | 0.4095 | 0.5146 | 0.1393 | 0.0514 | 0.4% |
| 3200 | 43.2 | 0.6814 | 0.3184 | 0.4095 | 0.5146 | 0.1393 | 0.0514 | 0.4% |
| 3200 | 85.3 | 0.6912 | 0.3087 | 0.4095 | 0.5146 | 0.1393 | 0.0514 | 0.4% |
| 3200 | 69.8 | 0.7008 | 0.2991 | 0.4095 | 0.5146 | 0.1393 | 0.0514 | 0.4% |
| 3200 | 32.4 | 0.7086 | 0.2914 | 0.4095 | 0.5146 | 0.1393 | 0.0514 | 0.4% |
| 3200 | 6.2 | 0.7138 | 0.2862 | 0.4095 | 0.5146 | 0.1393 | 0.0514 | 0.4% |
| 3200 | −19.8 | 0.7188 | 0.2812 | 0.4095 | 0.5146 | 0.1393 | 0.0514 | 0.4% |
| 3200 | −6.7 | 0.6669 | 0.3329 | 0.4095 | 0.5146 | 0.1303 | 0.0723 | 0.4% |
| 3200 | 50.0 | 0.6814 | 0.3184 | 0.4095 | 0.5146 | 0.1303 | 0.0723 | 0.4% |
| 3200 | 91.0 | 0.6912 | 0.3087 | 0.4020 | 0.5005 | 0.1303 | 0.0723 | 0.5% |
| 3200 | 64.4 | 0.7008 | 0.2991 | 0.3970 | 0.4911 | 0.1303 | 0.0723 | 0.6% |
| 3200 | 27.4 | 0.7086 | 0.2914 | 0.3947 | 0.4869 | 0.1303 | 0.0723 | 0.7% |
| 3200 | 2.2 | 0.7138 | 0.2862 | 0.3919 | 0.4815 | 0.1303 | 0.0723 | 0.8% |
| 3200 | −22.2 | 0.7188 | 0.2812 | 0.3882 | 0.4746 | 0.1303 | 0.0723 | 0.9% |
| 3200 | −4.2 | 0.6669 | 0.3329 | 0.3923 | 0.4824 | 0.1192 | 0.1046 | 0.8% |
| 3200 | 51.6 | 0.6814 | 0.3184 | 0.3882 | 0.4747 | 0.1192 | 0.1046 | 0.9% |
| 3200 | 91.5 | 0.6912 | 0.3087 | 0.3828 | 0.4646 | 0.1192 | 0.1046 | 1.0% |
| 3200 | 64.1 | 0.7008 | 0.2991 | 0.3799 | 0.4591 | 0.1192 | 0.1046 | 1.1% |
| 3200 | 27.3 | 0.7086 | 0.2914 | 0.3789 | 0.4571 | 0.1192 | 0.1046 | 1.1% |
| 3200 | 2.5 | 0.7138 | 0.2862 | 0.3771 | 0.4537 | 0.1192 | 0.1046 | 1.2% |
| 3200 | −20.0 | 0.7188 | 0.2812 | 0.3736 | 0.4472 | 0.1192 | 0.1046 | 1.3% |
| 3200 | −3.5 | 0.6669 | 0.3329 | 0.3795 | 0.4584 | 0.1082 | 0.1444 | 1.1% |
| 3200 | 52.0 | 0.6814 | 0.3184 | 0.3771 | 0.4538 | 0.1082 | 0.1444 | 1.2% |
| 3200 | 92.0 | 0.6912 | 0.3087 | 0.3741 | 0.4482 | 0.1082 | 0.1444 | 1.2% |
| 3200 | 64.0 | 0.7008 | 0.2991 | 0.3724 | 0.4449 | 0.1082 | 0.1444 | 1.3% |
| 3200 | 27.6 | 0.7086 | 0.2914 | 0.3716 | 0.4435 | 0.1082 | 0.1444 | 1.3% |
| 3200 | 4.5 | 0.7138 | 0.2862 | 0.3696 | 0.4397 | 0.1082 | 0.1444 | 1.4% |
| 3200 | −13.4 | 0.7188 | 0.2812 | 0.3650 | 0.4312 | 0.1082 | 0.1444 | 1.5% |
| 3200 | −2.5 | 0.6669 | 0.3329 | 0.3703 | 0.4410 | 0.0934 | 0.2133 | 1.3% |
| 3200 | 52.9 | 0.6814 | 0.3184 | 0.3692 | 0.4390 | 0.0934 | 0.2133 | 1.4% |
| 3200 | 92.5 | 0.6912 | 0.3087 | 0.3677 | 0.4361 | 0.0934 | 0.2133 | 1.4% |
| 3200 | 64.4 | 0.7008 | 0.2991 | 0.3666 | 0.4342 | 0.0934 | 0.2133 | 1.5% |
| 3200 | 31.1 | 0.7086 | 0.2914 | 0.3653 | 0.4316 | 0.0934 | 0.2133 | 1.5% |
| 3200 | 13.6 | 0.7138 | 0.2862 | 0.3626 | 0.4266 | 0.0934 | 0.2133 | 1.6% |
| 3200 | −6.1 | 0.7188 | 0.2812 | 0.3611 | 0.4238 | 0.0934 | 0.2133 | 1.6% |
| 3200 | −0.8 | 0.6669 | 0.3329 | 0.3643 | 0.4298 | 0.0792 | 0.3084 | 1.5% |
| 3200 | 53.4 | 0.6814 | 0.3184 | 0.3639 | 0.4290 | 0.0792 | 0.3084 | 1.5% |
| 3200 | 92.6 | 0.6912 | 0.3087 | 0.3635 | 0.4283 | 0.0792 | 0.3084 | 1.6% |
| 3200 | 66.9 | 0.7008 | 0.2991 | 0.3628 | 0.4269 | 0.0792 | 0.3084 | 1.6% |
| 3200 | 39.9 | 0.7086 | 0.2914 | 0.3613 | 0.4242 | 0.0792 | 0.3084 | 1.6% |
| 3200 | 19.1 | 0.7138 | 0.2862 | 0.3608 | 0.4233 | 0.0792 | 0.3084 | 1.6% |
| 3200 | −6.1 | 0.7188 | 0.2812 | 0.3611 | 0.4238 | 0.0792 | 0.3084 | 1.6% |
| 3200 | 0.5 | 0.6669 | 0.3329 | 0.3604 | 0.4224 | 0.0709 | 0.4039 | 1.7% |
| 3200 | 54.1 | 0.6814 | 0.3184 | 0.3609 | 0.4235 | 0.0709 | 0.4039 | 1.6% |

TABLE 2-continued

| | | | | | | | |
|---|---|---|---|---|---|---|---|
| 3200 | 92.5 | 0.6912 | 0.3087 | 0.3611 | 0.4239 | 0.0709 | 0.4039 | 1.6% |
| 3200 | 71.1 | 0.7008 | 0.2991 | 0.3609 | 0.4234 | 0.0709 | 0.4039 | 1.6% |
| 3200 | 44.5 | 0.7086 | 0.2914 | 0.3605 | 0.4227 | 0.0709 | 0.4039 | 1.6% |
| 3200 | 19.1 | 0.7138 | 0.2862 | 0.3608 | 0.4233 | 0.0709 | 0.4039 | 1.6% |
| 3200 | −6.1 | 0.7188 | 0.2812 | 0.3611 | 0.4238 | 0.0709 | 0.4039 | 1.6% |
| 3200 | 1.7 | 0.6669 | 0.3329 | 0.3566 | 0.4153 | 0.0694 | 0.5232 | 1.8% |
| 3200 | 54.7 | 0.6814 | 0.3184 | 0.3584 | 0.4187 | 0.0694 | 0.5232 | 1.7% |
| 3200 | 92.0 | 0.6912 | 0.3087 | 0.3593 | 0.4204 | 0.0694 | 0.5232 | 1.7% |
| 3200 | 75.3 | 0.7008 | 0.2991 | 0.3600 | 0.4218 | 0.0694 | 0.5232 | 1.7% |
| 3200 | 44.5 | 0.7086 | 0.2914 | 0.3605 | 0.4227 | 0.0694 | 0.5232 | 1.6% |
| 3200 | 19.1 | 0.7138 | 0.2862 | 0.3608 | 0.4233 | 0.0694 | 0.5232 | 1.6% |
| 3200 | −6.1 | 0.7188 | 0.2812 | 0.3611 | 0.4238 | 0.0694 | 0.5232 | 1.6% |
| 3200 | 2.9 | 0.6669 | 0.3329 | 0.3535 | 0.4096 | 0.0799 | 0.6269 | 1.9% |
| 3200 | 55.3 | 0.6814 | 0.3184 | 0.3565 | 0.4152 | 0.0799 | 0.6269 | 1.8% |
| 3200 | 90.8 | 0.6912 | 0.3087 | 0.3582 | 0.4184 | 0.0799 | 0.6269 | 1.7% |
| 3200 | 79.1 | 0.7008 | 0.2991 | 0.3599 | 0.4216 | 0.0799 | 0.6269 | 1.7% |
| 3200 | 44.5 | 0.7086 | 0.2914 | 0.3605 | 0.4227 | 0.0799 | 0.6269 | 1.6% |
| 3200 | 19.1 | 0.7138 | 0.2862 | 0.3608 | 0.4233 | 0.0799 | 0.6269 | 1.6% |
| 3200 | −6.1 | 0.7188 | 0.2812 | 0.3611 | 0.4238 | 0.0799 | 0.6269 | 1.6% |
| 3200 | 3.2 | 0.6669 | 0.3329 | 0.3514 | 0.4057 | 0.0975 | 0.6902 | 2.0% |
| 3200 | 55.8 | 0.6814 | 0.3184 | 0.3552 | 0.4128 | 0.0975 | 0.6902 | 1.8% |
| 3200 | 89.7 | 0.6912 | 0.3087 | 0.3577 | 0.4174 | 0.0975 | 0.6902 | 1.7% |
| 3200 | 80.7 | 0.7008 | 0.2991 | 0.3600 | 0.4218 | 0.0975 | 0.6902 | 1.7% |
| 3200 | 44.5 | 0.7086 | 0.2914 | 0.3605 | 0.4227 | 0.0975 | 0.6902 | 1.6% |
| 3200 | 19.1 | 0.7138 | 0.2862 | 0.3608 | 0.4233 | 0.0975 | 0.6902 | 1.6% |
| 3200 | −6.1 | 0.7188 | 0.2812 | 0.3611 | 0.4238 | 0.0975 | 0.6902 | 1.6% |
| 3200 | 3.5 | 0.6669 | 0.3329 | 0.3491 | 0.4014 | 0.1270 | 0.7352 | 2.0% |
| 3200 | 56.4 | 0.6814 | 0.3184 | 0.3539 | 0.4103 | 0.1270 | 0.7352 | 1.9% |
| 3200 | 88.1 | 0.6912 | 0.3087 | 0.3574 | 0.4169 | 0.1270 | 0.7352 | 1.8% |
| 3200 | 80.7 | 0.7008 | 0.2991 | 0.3600 | 0.4218 | 0.1270 | 0.7352 | 1.7% |
| 3200 | 44.5 | 0.7086 | 0.2914 | 0.3605 | 0.4227 | 0.1270 | 0.7352 | 1.6% |
| 3200 | 19.1 | 0.7138 | 0.2862 | 0.3608 | 0.4233 | 0.1270 | 0.7352 | 1.6% |
| 3200 | −6.1 | 0.7188 | 0.2812 | 0.3611 | 0.4238 | 0.1270 | 0.7352 | 1.6% |
| 3200 | 4.0 | 0.6669 | 0.3329 | 0.3469 | 0.3972 | 0.1561 | 0.7502 | 2.1% |
| 3200 | 57.0 | 0.6814 | 0.3184 | 0.3527 | 0.4081 | 0.1561 | 0.7502 | 1.9% |
| 3200 | 86.6 | 0.6912 | 0.3087 | 0.3573 | 0.4167 | 0.1561 | 0.7502 | 1.8% |
| 3200 | 80.7 | 0.7008 | 0.2991 | 0.3600 | 0.4218 | 0.1561 | 0.7502 | 1.7% |
| 3200 | 44.5 | 0.7086 | 0.2914 | 0.3605 | 0.4227 | 0.1561 | 0.7502 | 1.6% |
| 3200 | 19.1 | 0.7138 | 0.2862 | 0.3608 | 0.4233 | 0.1561 | 0.7502 | 1.6% |
| 3200 | −6.1 | 0.7188 | 0.2812 | 0.3611 | 0.4238 | 0.1561 | 0.7502 | 1.6% |
| 3200 | 5.2 | 0.0669 | 0.3329 | 0.3428 | 0.3896 | 0.1938 | 0.7479 | 2.3% |
| 3200 | 57.4 | 0.6814 | 0.3184 | 0.3512 | 0.4052 | 0.1938 | 0.7479 | 2.0% |
| 3200 | 84.3 | 0.6912 | 0.3087 | 0.3575 | 0.4170 | 0.1938 | 0.7479 | 1.7% |
| 3200 | 80.7 | 0.7008 | 0.2991 | 0.3600 | 0.4218 | 0.1938 | 0.7479 | 1.7% |
| 3200 | 44.5 | 0.7086 | 0.2914 | 0.3605 | 0.4227 | 0.1938 | 0.7479 | 1.6% |
| 3200 | 19.1 | 0.7138 | 0.2862 | 0.3608 | 0.4233 | 0.1938 | 0.7479 | 1.6% |
| 3200 | −6.1 | 0.7188 | 0.2812 | 0.3611 | 0.4238 | 0.1938 | 0.7479 | 1.6% |
| 3200 | 6.5 | 0.6669 | 0.3329 | 0.3356 | 0.3760 | 0.2329 | 0.7309 | 2.6% |
| 3200 | 56.7 | 0.6814 | 0.3184 | 0.3495 | 0.4021 | 0.2329 | 0.7309 | 2.0% |
| 3200 | 81.5 | 0.6912 | 0.3087 | 0.3578 | 0.4177 | 0.2329 | 0.7309 | 1.7% |
| 3200 | 80.7 | 0.7008 | 0.2991 | 0.3600 | 0.4218 | 0.2329 | 0.7309 | 1.7% |
| 3200 | 44.5 | 0.7086 | 0.2914 | 0.3605 | 0.4227 | 0.2329 | 0.7309 | 1.6% |
| 3200 | 19.1 | 0.7138 | 0.2862 | 0.3608 | 0.4233 | 0.2329 | 0.7309 | 1.6% |
| 3200 | −6.1 | 0.7188 | 0.2812 | 0.3611 | 0.4238 | 0.2329 | 0.7309 | 1.6% |
| 3100 | −13.3 | 0.6669 | 0.3329 | 0.4095 | 0.5146 | 0.1393 | 0.0514 | 0.4% |
| 3100 | 43.5 | 0.6814 | 0.3184 | 0.4095 | 0.5146 | 0.1393 | 0.0514 | 0.4% |
| 3100 | 86.9 | 0.6912 | 0.3087 | 0.4095 | 0.5146 | 0.1393 | 0.0514 | 0.4% |
| 3100 | 66.6 | 0.7008 | 0.2991 | 0.4095 | 0.5146 | 0.1393 | 0.0514 | 0.4% |
| 3100 | 28.0 | 0.7086 | 0.2914 | 0.4095 | 0.5146 | 0.1393 | 0.0514 | 0.4% |
| 3100 | 1.0 | 0.7138 | 0.2862 | 0.4095 | 0.5146 | 0.1393 | 0.0514 | 0.4% |
| 3100 | −25.9 | 0.7188 | 0.2812 | 0.4095 | 0.5146 | 0.1393 | 0.0514 | 0.4% |
| 3100 | −8.7 | 0.6669 | 0.3329 | 0.4095 | 0.5146 | 0.1303 | 0.0723 | 0.4% |
| 3100 | 49.7 | 0.6814 | 0.3184 | 0.4095 | 0.5146 | 0.1303 | 0.0723 | 0.4% |
| 3100 | 91.4 | 0.6912 | 0.3087 | 0.4004 | 0.4974 | 0.1303 | 0.0723 | 0.6% |
| 3100 | 62.8 | 0.7008 | 0.2991 | 0.3949 | 0.4872 | 0.1303 | 0.0723 | 0.7% |
| 3100 | 24.7 | 0.7086 | 0.2914 | 0.3928 | 0.4832 | 0.1303 | 0.0723 | 0.7% |
| 3100 | −1.2 | 0.7138 | 0.2862 | 0.3899 | 0.4777 | 0.1303 | 0.0723 | 0.8% |
| 3100 | −26.4 | 0.7188 | 0.2812 | 0.3864 | 0.4712 | 0.1303 | 0.0723 | 0.9% |
| 3100 | −6.4 | 0.6669 | 0.3329 | 0.3934 | 0.4843 | 0.1192 | 0.1046 | 0.7% |
| 3100 | 50.5 | 0.6814 | 0.3184 | 0.3884 | 0.4749 | 0.1192 | 0.1046 | 0.9% |
| 3100 | 91.7 | 0.6912 | 0.3087 | 0.3830 | 0.4649 | 0.1192 | 0.1046 | 1.0% |
| 3100 | 62.7 | 0.7008 | 0.2991 | 0.3802 | 0.4596 | 0.1192 | 0.1046 | 1.1% |
| 3100 | 24.7 | 0.7086 | 0.2914 | 0.3792 | 0.4577 | 0.1192 | 0.1046 | 1.1% |
| 3100 | −0.8 | 0.7138 | 0.2862 | 0.3774 | 0.4544 | 0.1192 | 0.1046 | 1.1% |
| 3100 | −24.6 | 0.7188 | 0.2812 | 0.3744 | 0.4487 | 0.1192 | 0.1046 | 1.2% |
| 3100 | −5.8 | 0.6669 | 0.3329 | 0.3813 | 0.4617 | 0.1082 | 0.1444 | 1.0% |
| 3100 | 51.0 | 0.6814 | 0.3184 | 0.3784 | 0.4563 | 0.1082 | 0.1444 | 1.1% |
| 3100 | 92.1 | 0.6912 | 0.3087 | 0.3754 | 0.4507 | 0.1082 | 0.1444 | 1.2% |
| 3100 | 62.7 | 0.7008 | 0.2991 | 0.3736 | 0.4472 | 0.1082 | 0.1444 | 1.3% |
| 3100 | 25.1 | 0.7086 | 0.2914 | 0.3729 | 0.4459 | 0.1082 | 0.1444 | 1.3% |

TABLE 2-continued

| | | | | | | | | |
|---|---|---|---|---|---|---|---|---|
| 3100 | 0.9 | 0.7138 | 0.2862 | 0.3711 | 0.4425 | 0.1082 | 0.1444 | 1.3% |
| 3100 | −18.3 | 0.7188 | 0.2812 | 0.3666 | 0.4342 | 0.1082 | 0.1444 | 1.5% |
| 3100 | −4.9 | 0.6669 | 0.3329 | 0.3726 | 0.4453 | 0.0934 | 0.2133 | 1.3% |
| 3100 | 51.5 | 0.6814 | 0.3184 | 0.3710 | 0.4424 | 0.0934 | 0.2133 | 1.4% |
| 3100 | 92.3 | 0.6912 | 0.3087 | 0.3696 | 0.4397 | 0.0934 | 0.2133 | 1.4% |
| 3100 | 63.1 | 0.7008 | 0.2991 | 0.3686 | 0.4378 | 0.0934 | 0.2133 | 1.4% |
| 3100 | 28.3 | 0.7086 | 0.2914 | 0.3673 | 0.4355 | 0.0934 | 0.2133 | 1.4% |
| 3100 | 10.1 | 0.7138 | 0.2862 | 0.3645 | 0.4301 | 0.0934 | 0.2133 | 1.5% |
| 3100 | −13.6 | 0.7188 | 0.2812 | 0.3639 | 0.4291 | 0.0934 | 0.2133 | 1.5% |
| 3100 | −3.3 | 0.6669 | 0.3329 | 0.3669 | 0.4347 | 0.0792 | 0.3084 | 1.4% |
| 3100 | 52.0 | 0.6814 | 0.3184 | 0.3663 | 0.4335 | 0.0792 | 0.3084 | 1.5% |
| 3100 | 92.2 | 0.6912 | 0.3087 | 0.3658 | 0.4326 | 0.0792 | 0.3084 | 1.5% |
| 3100 | 65.7 | 0.7008 | 0.2991 | 0.3651 | 0.4314 | 0.0792 | 0.3084 | 1.5% |
| 3100 | 38.0 | 0.7086 | 0.2914 | 0.3635 | 0.4282 | 0.0792 | 0.3084 | 1.6% |
| 3100 | 12.5 | 0.7138 | 0.2862 | 0.3636 | 0.4286 | 0.0792 | 0.3084 | 1.5% |
| 3100 | −13.6 | 0.7188 | 0.2812 | 0.3639 | 0.4291 | 0.0792 | 0.3084 | 1.5% |
| 3100 | −2.2 | 0.6669 | 0.3329 | 0.3632 | 0.4277 | 0.0709 | 0.4039 | 1.6% |
| 3100 | 52.5 | 0.6814 | 0.3184 | 0.3636 | 0.4285 | 0.0709 | 0.4039 | 1.5% |
| 3100 | 92.0 | 0.6912 | 0.3087 | 0.3638 | 0.4288 | 0.0709 | 0.4039 | 1.5% |
| 3100 | 70.5 | 0.7008 | 0.2991 | 0.3634 | 0.4281 | 0.0709 | 0.4039 | 1.6% |
| 3100 | 38.8 | 0.7086 | 0.2914 | 0.3633 | 0.4280 | 0.0709 | 0.4039 | 1.6% |
| 3100 | 12.5 | 0.7138 | 0.2862 | 0.3636 | 0.4286 | 0.0709 | 0.4039 | 1.5% |
| 3100 | −13.6 | 0.7188 | 0.2812 | 0.3639 | 0.4291 | 0.0709 | 0.4039 | 1.5% |
| 3100 | −1.1 | 0.6669 | 0.3329 | 0.3596 | 0.4210 | 0.0694 | 0.5232 | 1.7% |
| 3100 | 53.0 | 0.6814 | 0.3184 | 0.3613 | 0.4242 | 0.0694 | 0.5232 | 1.6% |
| 3100 | 91.3 | 0.6912 | 0.3087 | 0.3622 | 0.4258 | 0.0694 | 0.5232 | 1.6% |
| 3100 | 75.1 | 0.7008 | 0.2991 | 0.3628 | 0.4270 | 0.0694 | 0.5232 | 1.6% |
| 3100 | 38.8 | 0.7086 | 0.2914 | 0.3633 | 0.4280 | 0.0694 | 0.5232 | 1.6% |
| 3100 | 12.5 | 0.7138 | 0.2862 | 0.3636 | 0.4286 | 0.0694 | 0.5232 | 1.5% |
| 3100 | −13.6 | 0.7188 | 0.2812 | 0.3639 | 0.4291 | 0.0694 | 0.5232 | 1.5% |
| 3100 | 0.1 | 0.6669 | 0.3329 | 0.3567 | 0.4156 | 0.0799 | 0.6269 | 1.8% |
| 3100 | 53.3 | 0.6814 | 0.3184 | 0.3597 | 0.4211 | 0.0799 | 0.6269 | 1.7% |
| 3100 | 90.1 | 0.6912 | 0.3087 | 0.3613 | 0.4242 | 0.0799 | 0.6269 | 1.6% |
| 3100 | 76.3 | 0.7008 | 0.2991 | 0.3628 | 0.4270 | 0.0799 | 0.6269 | 1.6% |
| 3100 | 38.8 | 0.7086 | 0.2914 | 0.3633 | 0.4280 | 0.0799 | 0.6269 | 1.6% |
| 3100 | 12.5 | 0.7138 | 0.2862 | 0.3636 | 0.4286 | 0.0799 | 0.6269 | 1.5% |
| 3100 | −13.6 | 0.7188 | 0.2812 | 0.3639 | 0.4291 | 0.0799 | 0.6269 | 1.5% |
| 3100 | 0.3 | 0.6669 | 0.3329 | 0.3548 | 0.4119 | 0.0975 | 0.6902 | 1.8% |
| 3100 | 53.6 | 0.6814 | 0.3184 | 0.3586 | 0.4191 | 0.0975 | 0.6902 | 1.7% |
| 3100 | 88.9 | 0.6912 | 0.3087 | 0.3609 | 0.4234 | 0.0975 | 0.6902 | 1.6% |
| 3100 | 76.3 | 0.7008 | 0.2991 | 0.3628 | 0.4270 | 0.0975 | 0.6902 | 1.6% |
| 3100 | 38.8 | 0.7086 | 0.2914 | 0.3633 | 0.4280 | 0.0975 | 0.6902 | 1.6% |
| 3100 | 12.5 | 0.7138 | 0.2862 | 0.3636 | 0.4286 | 0.0975 | 0.6902 | 1.5% |
| 3100 | −13.6 | 0.7188 | 0.2812 | 0.3639 | 0.4291 | 0.0975 | 0.6902 | 1.5% |
| 3100 | 0.4 | 0.6669 | 0.3329 | 0.3527 | 0.4080 | 0.1270 | 0.7352 | 1.9% |
| 3100 | 54.1 | 0.6814 | 0.3184 | 0.3574 | 0.4169 | 0.1270 | 0.7352 | 1.7% |
| 3100 | 87.4 | 0.6912 | 0.3087 | 0.3607 | 0.4231 | 0.1270 | 0.7352 | 1.6% |
| 3100 | 76.3 | 0.7008 | 0.2991 | 0.3628 | 0.4270 | 0.1270 | 0.7352 | 1.6% |
| 3100 | 38.8 | 0.7086 | 0.2914 | 0.3633 | 0.4280 | 0.1270 | 0.7352 | 1.6% |
| 3100 | 12.5 | 0.7138 | 0.2862 | 0.3636 | 0.4286 | 0.1270 | 0.7352 | 1.5% |
| 3100 | −13.6 | 0.7188 | 0.2812 | 0.3639 | 0.4291 | 0.1270 | 0.7352 | 1.5% |
| 3100 | 0.8 | 0.6669 | 0.3329 | 0.3507 | 0.4043 | 0.1561 | 0.7502 | 2.0% |
| 3100 | 54.6 | 0.6814 | 0.3184 | 0.3565 | 0.4151 | 0.1561 | 0.7502 | 1.8% |
| 3100 | 85.9 | 0.6912 | 0.3087 | 0.3607 | 0.4231 | 0.1561 | 0.7502 | 1.6% |
| 3100 | 76.3 | 0.7008 | 0.2991 | 0.3628 | 0.4270 | 0.1561 | 0.7502 | 1.6% |
| 3100 | 38.8 | 0.7086 | 0.2914 | 0.3633 | 0.4280 | 0.1561 | 0.7502 | 1.6% |
| 3100 | 12.5 | 0.7138 | 0.2862 | 0.3636 | 0.4286 | 0.1561 | 0.7502 | 1.5% |
| 3100 | −13.6 | 0.7188 | 0.2812 | 0.3639 | 0.4291 | 0.1561 | 0.7502 | 1.5% |
| 3100 | 1.7 | 0.6669 | 0.3329 | 0.3472 | 0.3977 | 0.1938 | 0.7479 | 2.1% |
| 3100 | 55.0 | 0.6814 | 0.3184 | 0.3551 | 0.4126 | 0.1938 | 0.7479 | 1.8% |
| 3100 | 83.8 | 0.6912 | 0.3087 | 0.3610 | 0.4235 | 0.1938 | 0.7479 | 1.6% |
| 3100 | 76.3 | 0.7008 | 0.2991 | 0.3628 | 0.4270 | 0.1938 | 0.7479 | 1.6% |
| 3100 | 38.8 | 0.7086 | 0.2914 | 0.3633 | 0.4280 | 0.1938 | 0.7479 | 1.6% |
| 3100 | 12.5 | 0.7138 | 0.2862 | 0.3636 | 0.4286 | 0.1938 | 0.7479 | 1.5% |
| 3100 | −13.6 | 0.7188 | 0.2812 | 0.3639 | 0.4291 | 0.1938 | 0.7479 | 1.5% |
| 3100 | 2.9 | 0.6669 | 0.3329 | 0.3408 | 0.3857 | 0.2329 | 0.7309 | 2.4% |
| 3100 | 54.5 | 0.6814 | 0.3184 | 0.3537 | 0.4100 | 0.2329 | 0.7309 | 1.9% |
| 3100 | 80.9 | 0.6912 | 0.3087 | 0.3615 | 0.4246 | 0.2329 | 0.7309 | 1.6% |
| 3100 | 76.3 | 0.7008 | 0.2991 | 0.3628 | 0.4270 | 0.2329 | 0.7309 | 1.6% |
| 3100 | 38.8 | 0.7086 | 0.2914 | 0.3633 | 0.4280 | 0.2329 | 0.7309 | 1.6% |
| 3100 | 12.5 | 0.7138 | 0.2862 | 0.3636 | 0.4286 | 0.2329 | 0.7309 | 1.5% |
| 3100 | −13.6 | 0.7188 | 0.2812 | 0.3639 | 0.4291 | 0.2329 | 0.7309 | 1.5% |
| 3000 | −15.0 | 0.6669 | 0.3329 | 0.4095 | 0.5146 | 0.1393 | 0.0514 | 0.4% |
| 3000 | 43.7 | 0.6814 | 0.3184 | 0.4095 | 0.5146 | 0.1393 | 0.0514 | 0.4% |
| 3000 | 88.4 | 0.6912 | 0.3087 | 0.4095 | 0.5146 | 0.1393 | 0.0514 | 0.4% |
| 3000 | 63.5 | 0.7008 | 0.2991 | 0.4095 | 0.5146 | 0.1393 | 0.0514 | 0.4% |
| 3000 | 23.7 | 0.7086 | 0.2914 | 0.4095 | 0.5146 | 0.1393 | 0.0514 | 0.4% |
| 3000 | −4.2 | 0.7138 | 0.2862 | 0.4095 | 0.5146 | 0.1393 | 0.0514 | 0.4% |
| 3000 | −30.8 | 0.7188 | 0.2812 | 0.4041 | 0.5045 | 0.1393 | 0.0514 | 0.5% |
| 3000 | −10.9 | 0.6669 | 0.3329 | 0.4095 | 0.5146 | 0.1303 | 0.0723 | 0.4% |

TABLE 2-continued

| | | | | | | | | |
|---|---|---|---|---|---|---|---|---|
| 3000 | 49.1 | 0.6814 | 0.3184 | 0.4088 | 0.5133 | 0.1303 | 0.0723 | 0.4% |
| 3000 | 91.6 | 0.6912 | 0.3087 | 0.3982 | 0.4934 | 0.1303 | 0.0723 | 0.6% |
| 3000 | 61.3 | 0.7008 | 0.2991 | 0.3924 | 0.4824 | 0.1303 | 0.0723 | 0.8% |
| 3000 | 22.1 | 0.7086 | 0.2914 | 0.3905 | 0.4789 | 0.1303 | 0.0723 | 0.8% |
| 3000 | −4.5 | 0.7138 | 0.2862 | 0.3875 | 0.4733 | 0.1303 | 0.0723 | 0.9% |
| 3000 | −30.5 | 0.7188 | 0.2812 | 0.3841 | 0.4669 | 0.1303 | 0.0723 | 1.0% |
| 3000 | −8.9 | 0.6669 | 0.3329 | 0.3943 | 0.4861 | 0.1192 | 0.1046 | 0.7% |
| 3000 | 49.4 | 0.6814 | 0.3184 | 0.3884 | 0.4751 | 0.1192 | 0.1046 | 0.9% |
| 3000 | 91.9 | 0.6912 | 0.3087 | 0.3834 | 0.4657 | 0.1192 | 0.1046 | 1.0% |
| 3000 | 61.3 | 0.7008 | 0.2991 | 0.3802 | 0.4596 | 0.1192 | 0.1046 | 1.1% |
| 3000 | 22.3 | 0.7086 | 0.2914 | 0.3793 | 0.4580 | 0.1192 | 0.1046 | 1.1% |
| 3000 | −4.0 | 0.7138 | 0.2862 | 0.3775 | 0.4546 | 0.1192 | 0.1046 | 1.1% |
| 3000 | −28.9 | 0.7188 | 0.2812 | 0.3748 | 0.4494 | 0.1192 | 0.1046 | 1.2% |
| 3000 | −8.3 | 0.6669 | 0.3329 | 0.3831 | 0.4651 | 0.1082 | 0.1444 | 1.0% |
| 3000 | 49.8 | 0.6814 | 0.3184 | 0.3796 | 0.4585 | 0.1082 | 0.1444 | 1.1% |
| 3000 | 92.0 | 0.6912 | 0.3087 | 0.3766 | 0.4529 | 0.1082 | 0.1444 | 1.2% |
| 3000 | 61.4 | 0.7008 | 0.2991 | 0.3747 | 0.4492 | 0.1082 | 0.1444 | 1.2% |
| 3000 | 22.7 | 0.7086 | 0.2914 | 0.3741 | 0.4481 | 0.1082 | 0.1444 | 1.2% |
| 3000 | −2.5 | 0.7138 | 0.2862 | 0.3724 | 0.4449 | 0.1082 | 0.1444 | 1.3% |
| 3000 | −23.3 | 0.7188 | 0.2812 | 0.3683 | 0.4372 | 0.1082 | 0.1444 | 1.4% |
| 3000 | −7.4 | 0.6669 | 0.3329 | 0.3749 | 0.4497 | 0.0934 | 0.2133 | 1.2% |
| 3000 | 50.0 | 0.6814 | 0.3184 | 0.3729 | 0.4459 | 0.0934 | 0.2133 | 1.3% |
| 3000 | 92.0 | 0.6912 | 0.3087 | 0.3714 | 0.4431 | 0.0934 | 0.2133 | 1.3% |
| 3000 | 62.0 | 0.7008 | 0.2991 | 0.3704 | 0.4413 | 0.0934 | 0.2133 | 1.3% |
| 3000 | 25.6 | 0.7086 | 0.2914 | 0.3694 | 0.4394 | 0.0934 | 0.2133 | 1.4% |
| 3000 | 6.0 | 0.7138 | 0.2862 | 0.3666 | 0.4341 | 0.0934 | 0.2133 | 1.5% |
| 3000 | −21.0 | 0.7188 | 0.2812 | 0.3669 | 0.4346 | 0.0934 | 0.2133 | 1.4% |
| 3000 | −6.1 | 0.6669 | 0.3329 | 0.3696 | 0.4397 | 0.0792 | 0.3084 | 1.4% |
| 3000 | 50.5 | 0.6814 | 0.3184 | 0.3687 | 0.4381 | 0.0792 | 0.3084 | 1.4% |
| 3000 | 91.8 | 0.6912 | 0.3087 | 0.3682 | 0.4370 | 0.0792 | 0.3084 | 1.4% |
| 3000 | 64.6 | 0.7008 | 0.2991 | 0.3675 | 0.4358 | 0.0792 | 0.3084 | 1.4% |
| 3000 | 33.3 | 0.7086 | 0.2914 | 0.3662 | 0.4334 | 0.0792 | 0.3084 | 1.5% |
| 3000 | 6.0 | 0.7138 | 0.2862 | 0.3666 | 0.4341 | 0.0792 | 0.3084 | 1.5% |
| 3000 | −21.0 | 0.7188 | 0.2812 | 0.3669 | 0.4346 | 0.0792 | 0.3084 | 1.4% |
| 3000 | −5.1 | 0.6669 | 0.3329 | 0.3660 | 0.4331 | 0.0709 | 0.4039 | 1.5% |
| 3000 | 50.8 | 0.6814 | 0.3184 | 0.3663 | 0.4336 | 0.0709 | 0.4039 | 1.5% |
| 3000 | 91.4 | 0.6912 | 0.3087 | 0.3664 | 0.4338 | 0.0709 | 0.4039 | 1.5% |
| 3000 | 69.9 | 0.7008 | 0.2991 | 0.3660 | 0.4329 | 0.0709 | 0.4039 | 1.5% |
| 3000 | 33.3 | 0.7086 | 0.2914 | 0.3662 | 0.4334 | 0.0709 | 0.4039 | 1.5% |
| 3000 | 6.0 | 0.7138 | 0.2862 | 0.3666 | 0.4341 | 0.0709 | 0.4039 | 1.5% |
| 3000 | −21.0 | 0.7188 | 0.2812 | 0.3669 | 0.4346 | 0.0709 | 0.4039 | 1.4% |
| 3000 | −4.0 | 0.6669 | 0.3329 | 0.3627 | 0.4268 | 0.0694 | 0.5232 | 1.6% |
| 3000 | 51.0 | 0.6814 | 0.3184 | 0.3643 | 0.4298 | 0.0694 | 0.5232 | 1.5% |
| 3000 | 90.6 | 0.6912 | 0.3087 | 0.3651 | 0.4314 | 0.0694 | 0.5232 | 1.5% |
| 3000 | 72.2 | 0.7008 | 0.2991 | 0.3657 | 0.4324 | 0.0694 | 0.5232 | 1.5% |
| 3000 | 33.3 | 0.7086 | 0.2914 | 0.3662 | 0.4334 | 0.0694 | 0.5232 | 1.5% |
| 3000 | 6.0 | 0.7138 | 0.2862 | 0.3666 | 0.4341 | 0.0694 | 0.5232 | 1.5% |
| 3000 | −21.0 | 0.7188 | 0.2812 | 0.3669 | 0.4346 | 0.0694 | 0.5232 | 1.4% |
| 3000 | −3.0 | 0.6669 | 0.3329 | 0.3600 | 0.4217 | 0.0799 | 0.6269 | 1.7% |
| 3000 | 51.2 | 0.6814 | 0.3184 | 0.3629 | 0.4272 | 0.0799 | 0.6269 | 1.6% |
| 3000 | 89.3 | 0.6912 | 0.3087 | 0.3644 | 0.4301 | 0.0799 | 0.6269 | 1.5% |
| 3000 | 72.2 | 0.7008 | 0.2991 | 0.3657 | 0.4324 | 0.0799 | 0.6269 | 1.5% |
| 3000 | 33.3 | 0.7086 | 0.2914 | 0.3662 | 0.4334 | 0.0799 | 0.6269 | 1.5% |
| 3000 | 6.0 | 0.7138 | 0.2862 | 0.3666 | 0.4341 | 0.0799 | 0.6269 | 1.5% |
| 3000 | −21.0 | 0.7188 | 0.2812 | 0.3669 | 0.4346 | 0.0799 | 0.6269 | 1.4% |
| 3000 | −2.7 | 0.6669 | 0.3329 | 0.3582 | 0.4183 | 0.0975 | 0.6902 | 1.7% |
| 3000 | 51.3 | 0.6814 | 0.3184 | 0.3620 | 0.4255 | 0.0975 | 0.6902 | 1.6% |
| 3000 | 88.1 | 0.6912 | 0.3087 | 0.3642 | 0.4296 | 0.0975 | 0.6902 | 1.5% |
| 3000 | 72.2 | 0.7008 | 0.2991 | 0.3657 | 0.4324 | 0.0975 | 0.6902 | 1.5% |
| 3000 | 33.3 | 0.7086 | 0.2914 | 0.3662 | 0.4334 | 0.0975 | 0.6902 | 1.5% |
| 3000 | 6.0 | 0.7138 | 0.2862 | 0.3666 | 0.4341 | 0.0975 | 0.6902 | 1.5% |
| 3000 | −21.0 | 0.7188 | 0.2812 | 0.3669 | 0.4346 | 0.0975 | 0.6902 | 1.4% |
| 3000 | −2.7 | 0.6669 | 0.3329 | 0.3562 | 0.4147 | 0.1270 | 0.7352 | 1.8% |
| 3000 | 51.6 | 0.6814 | 0.3184 | 0.3611 | 0.4238 | 0.1270 | 0.7352 | 1.6% |
| 3000 | 86.6 | 0.6912 | 0.3087 | 0.3641 | 0.4295 | 0.1270 | 0.7352 | 1.5% |
| 3000 | 72.2 | 0.7008 | 0.2991 | 0.3657 | 0.4324 | 0.1270 | 0.7352 | 1.5% |
| 3000 | 33.3 | 0.7086 | 0.2914 | 0.3662 | 0.4334 | 0.1270 | 0.7352 | 1.5% |
| 3000 | 6.0 | 0.7138 | 0.2862 | 0.3666 | 0.4341 | 0.1270 | 0.7352 | 1.5% |
| 3000 | −21.0 | 0.7188 | 0.2812 | 0.3669 | 0.4346 | 0.1270 | 0.7352 | 1.4% |
| 3000 | −2.6 | 0.6669 | 0.3329 | 0.3545 | 0.4115 | 0.1561 | 0.7502 | 1.8% |
| 3000 | 52.0 | 0.6814 | 0.3184 | 0.3603 | 0.4223 | 0.1561 | 0.7502 | 1.7% |
| 3000 | 85.2 | 0.6912 | 0.3087 | 0.3642 | 0.4297 | 0.1561 | 0.7502 | 1.5% |
| 3000 | 72.2 | 0.7008 | 0.2991 | 0.3657 | 0.4324 | 0.1561 | 0.7502 | 1.5% |
| 3000 | 33.3 | 0.7086 | 0.2914 | 0.3662 | 0.4334 | 0.1561 | 0.7502 | 1.5% |
| 3000 | 6.0 | 0.7138 | 0.2862 | 0.3666 | 0.4341 | 0.1561 | 0.7502 | 1.5% |
| 3000 | −21.0 | 0.7188 | 0.2812 | 0.3669 | 0.4346 | 0.1561 | 0.7502 | 1.4% |
| 3000 | −2.0 | 0.6669 | 0.3329 | 0.3516 | 0.4060 | 0.1938 | 0.7479 | 1.9% |
| 3000 | 52.3 | 0.6814 | 0.3184 | 0.3592 | 0.4203 | 0.1938 | 0.7479 | 1.7% |
| 3000 | 83.1 | 0.6912 | 0.3087 | 0.3645 | 0.4303 | 0.1938 | 0.7479 | 1.5% |
| 3000 | 72.2 | 0.7008 | 0.2991 | 0.3657 | 0.4324 | 0.1938 | 0.7479 | 1.5% |

TABLE 2-continued

| | | | | | | | |
|---|---|---|---|---|---|---|---|
| 3000 | 33.3 | 0.7086 | 0.2914 | 0.3662 | 0.4334 | 0.1938 | 0.7479 | 1.5% |
| 3000 | 6.0 | 0.7138 | 0.2862 | 0.3666 | 0.4341 | 0.1938 | 0.7479 | 1.5% |
| 3000 | −21.0 | 0.7188 | 0.2812 | 0.3669 | 0.4346 | 0.1938 | 0.7479 | 1.4% |
| 3000 | −0.9 | 0.6669 | 0.3329 | 0.3461 | 0.3957 | 0.2329 | 0.7309 | 2.1% |
| 3000 | 52.0 | 0.6814 | 0.3184 | 0.3581 | 0.4181 | 0.2329 | 0.7309 | 1.7% |
| 3000 | 81.3 | 0.6912 | 0.3087 | 0.3650 | 0.4311 | 0.2329 | 0.7309 | 1.5% |
| 3000 | 72.2 | 0.7008 | 0.2991 | 0.3657 | 0.4324 | 0.2329 | 0.7309 | 1.5% |
| 3000 | 33.3 | 0.7086 | 0.2914 | 0.3662 | 0.4334 | 0.2329 | 0.7309 | 1.5% |
| 3000 | 6.0 | 0.7138 | 0.2862 | 0.3666 | 0.4341 | 0.2329 | 0.7309 | 1.5% |
| 3000 | −21.0 | 0.7188 | 0.2812 | 0.3669 | 0.4346 | 0.2329 | 0.7309 | 1.4% |
| 2900 | −16.9 | 0.6669 | 0.3329 | 0.4095 | 0.5146 | 0.1393 | 0.0514 | 0.4% |
| 2900 | 43.7 | 0.6814 | 0.3184 | 0.4095 | 0.5146 | 0.1393 | 0.0514 | 0.4% |
| 2900 | 89.7 | 0.6912 | 0.3087 | 0.4095 | 0.5146 | 0.1393 | 0.0514 | 0.4% |
| 2900 | 60.5 | 0.7008 | 0.2991 | 0.4095 | 0.5146 | 0.1393 | 0.0514 | 0.4% |
| 2900 | 19.6 | 0.7086 | 0.2914 | 0.4086 | 0.5128 | 0.1393 | 0.0514 | 0.4% |
| 2900 | −7.8 | 0.7138 | 0.2862 | 0.4018 | 0.5000 | 0.1393 | 0.0514 | 0.5% |
| 2900 | −34.7 | 0.7188 | 0.2812 | 0.3946 | 0.4866 | 0.1393 | 0.0514 | 0.7% |
| 2900 | −13.3 | 0.6669 | 0.3329 | 0.4095 | 0.5146 | 0.1303 | 0.0723 | 0.4% |
| 2900 | 47.8 | 0.6814 | 0.3184 | 0.4056 | 0.5072 | 0.1303 | 0.0723 | 0.5% |
| 2900 | 91.8 | 0.6912 | 0.3087 | 0.3963 | 0.4898 | 0.1303 | 0.0723 | 0.7% |
| 2900 | 60.1 | 0.7008 | 0.2991 | 0.3893 | 0.4767 | 0.1303 | 0.0723 | 0.8% |
| 2900 | 19.7 | 0.7086 | 0.2914 | 0.3878 | 0.4740 | 0.1303 | 0.0723 | 0.9% |
| 2900 | −7.7 | 0.7138 | 0.2862 | 0.3848 | 0.4683 | 0.1303 | 0.0723 | 0.9% |
| 2900 | −34.4 | 0.7188 | 0.2812 | 0.3814 | 0.4619 | 0.1303 | 0.0723 | 1.0% |
| 2900 | −11.6 | 0.6669 | 0.3329 | 0.3951 | 0.4876 | 0.1192 | 0.1046 | 0.7% |
| 2900 | 48.0 | 0.6814 | 0.3184 | 0.3882 | 0.4746 | 0.1192 | 0.1046 | 0.9% |
| 2900 | 91.8 | 0.6912 | 0.3087 | 0.3835 | 0.4658 | 0.1192 | 0.1046 | 1.0% |
| 2900 | 60.2 | 0.7008 | 0.2991 | 0.3799 | 0.4591 | 0.1192 | 0.1046 | 1.1% |
| 2900 | 19.9 | 0.7086 | 0.2914 | 0.3792 | 0.4578 | 0.1192 | 0.1046 | 1.1% |
| 2900 | −7.1 | 0.7138 | 0.2862 | 0.3774 | 0.4543 | 0.1192 | 0.1046 | 1.1% |
| 2900 | −33.0 | 0.7188 | 0.2812 | 0.3749 | 0.4496 | 0.1192 | 0.1046 | 1.2% |
| 2900 | −11.1 | 0.6669 | 0.3329 | 0.3848 | 0.4683 | 0.1082 | 0.1444 | 0.9% |
| 2900 | 48.2 | 0.6814 | 0.3184 | 0.3804 | 0.4600 | 0.1082 | 0.1444 | 1.1% |
| 2900 | 91.8 | 0.6912 | 0.3087 | 0.3776 | 0.4548 | 0.1082 | 0.1444 | 1.1% |
| 2900 | 60.4 | 0.7008 | 0.2991 | 0.3756 | 0.4510 | 0.1082 | 0.1444 | 1.2% |
| 2900 | 20.5 | 0.7086 | 0.2914 | 0.3751 | 0.4501 | 0.1082 | 0.1444 | 1.2% |
| 2900 | −5.7 | 0.7138 | 0.2862 | 0.3735 | 0.4470 | 0.1082 | 0.1444 | 1.3% |
| 2900 | −28.4 | 0.7188 | 0.2812 | 0.3699 | 0.4403 | 0.1082 | 0.1444 | 1.4% |
| 2900 | −10.2 | 0.6669 | 0.3329 | 0.3772 | 0.4540 | 0.0934 | 0.2133 | 1.2% |
| 2900 | 48.4 | 0.6814 | 0.3184 | 0.3747 | 0.4493 | 0.0934 | 0.2133 | 1.2% |
| 2900 | 91.6 | 0.6912 | 0.3087 | 0.3732 | 0.4465 | 0.0934 | 0.2133 | 1.3% |
| 2900 | 61.1 | 0.7008 | 0.2991 | 0.3722 | 0.4447 | 0.0934 | 0.2133 | 1.3% |
| 2900 | 23.0 | 0.7086 | 0.2914 | 0.3714 | 0.4431 | 0.0934 | 0.2133 | 1.3% |
| 2900 | −0.3 | 0.7138 | 0.2862 | 0.3696 | 0.4397 | 0.0934 | 0.2133 | 1.4% |
| 2900 | −28.4 | 0.7188 | 0.2812 | 0.3699 | 0.4403 | 0.0934 | 0.2133 | 1.4% |
| 2900 | −9.0 | 0.6669 | 0.3329 | 0.3723 | 0.4447 | 0.0792 | 0.3084 | 1.3% |
| 2900 | 48.7 | 0.6814 | 0.3184 | 0.3711 | 0.4426 | 0.0792 | 0.3084 | 1.3% |
| 2900 | 91.1 | 0.6912 | 0.3087 | 0.3705 | 0.4414 | 0.0792 | 0.3084 | 1.3% |
| 2900 | 63.6 | 0.7008 | 0.2991 | 0.3699 | 0.4402 | 0.0792 | 0.3084 | 1.4% |
| 2900 | 27.9 | 0.7086 | 0.2914 | 0.3693 | 0.4391 | 0.0792 | 0.3084 | 1.4% |
| 2900 | −0.3 | 0.7138 | 0.2862 | 0.3696 | 0.4397 | 0.0792 | 0.3084 | 1.4% |
| 2900 | −28.4 | 0.7188 | 0.2812 | 0.3699 | 0.4403 | 0.0792 | 0.3084 | 1.4% |
| 2900 | −8.2 | 0.6669 | 0.3329 | 0.3690 | 0.4386 | 0.0709 | 0.4039 | 1.4% |
| 2900 | 48.9 | 0.6814 | 0.3184 | 0.3691 | 0.4388 | 0.0709 | 0.4039 | 1.4% |
| 2900 | 90.6 | 0.6912 | 0.3087 | 0.3691 | 0.4388 | 0.0709 | 0.4039 | 1.4% |
| 2900 | 68.1 | 0.7008 | 0.2991 | 0.3687 | 0.4380 | 0.0709 | 0.4039 | 1.4% |
| 2900 | 27.9 | 0.7086 | 0.2914 | 0.3693 | 0.4391 | 0.0709 | 0.4039 | 1.4% |
| 2900 | −0.3 | 0.7138 | 0.2862 | 0.3696 | 0.4397 | 0.0709 | 0.4039 | 1.4% |
| 2900 | −28.4 | 0.7188 | 0.2812 | 0.3699 | 0.4403 | 0.0709 | 0.4039 | 1.4% |
| 2900 | −7.2 | 0.6669 | 0.3329 | 0.3659 | 0.4327 | 0.0694 | 0.5232 | 1.5% |
| 2900 | 48.9 | 0.6814 | 0.3184 | 0.3674 | 0.4356 | 0.0694 | 0.5232 | 1.4% |
| 2900 | 89.7 | 0.6912 | 0.3087 | 0.3681 | 0.4370 | 0.0694 | 0.5232 | 1.4% |
| 2900 | 68.1 | 0.7008 | 0.2991 | 0.3687 | 0.4380 | 0.0694 | 0.5232 | 1.4% |
| 2900 | 27.9 | 0.7086 | 0.2914 | 0.3693 | 0.4391 | 0.0694 | 0.5232 | 1.4% |
| 2900 | −0.3 | 0.7138 | 0.2862 | 0.3696 | 0.4397 | 0.0694 | 0.5232 | 1.4% |
| 2900 | −28.4 | 0.7188 | 0.2812 | 0.3699 | 0.4403 | 0.0694 | 0.5232 | 1.4% |
| 2900 | −6.3 | 0.6669 | 0.3329 | 0.3634 | 0.4280 | 0.0799 | 0.6269 | 1.6% |
| 2900 | 48.9 | 0.6814 | 0.3184 | 0.3662 | 0.4334 | 0.0799 | 0.6269 | 1.5% |
| 2900 | 88.4 | 0.6912 | 0.3087 | 0.3677 | 0.4361 | 0.0799 | 0.6269 | 1.4% |
| 2900 | 68.1 | 0.7008 | 0.2991 | 0.3687 | 0.4380 | 0.0799 | 0.6269 | 1.4% |
| 2900 | 27.9 | 0.7086 | 0.2914 | 0.3693 | 0.4391 | 0.0799 | 0.6269 | 1.4% |
| 2900 | −0.3 | 0.7138 | 0.2862 | 0.3696 | 0.4397 | 0.0799 | 0.6269 | 1.4% |
| 2900 | −28.4 | 0.7188 | 0.2812 | 0.3699 | 0.4403 | 0.0799 | 0.6269 | 1.4% |
| 2900 | −6.0 | 0.6669 | 0.3329 | 0.3616 | 0.4248 | 0.0975 | 0.6902 | 1.6% |
| 2900 | 48.9 | 0.6814 | 0.3184 | 0.3655 | 0.4321 | 0.0975 | 0.6902 | 1.5% |
| 2900 | 87.1 | 0.6912 | 0.3087 | 0.3675 | 0.4359 | 0.0975 | 0.6902 | 1.4% |
| 2900 | 68.1 | 0.7008 | 0.2991 | 0.3687 | 0.4380 | 0.0975 | 0.6902 | 1.4% |
| 2900 | 27.9 | 0.7086 | 0.2914 | 0.3693 | 0.4391 | 0.0975 | 0.6902 | 1.4% |
| 2900 | −0.3 | 0.7138 | 0.2862 | 0.3696 | 0.4397 | 0.0975 | 0.6902 | 1.4% |
| 2900 | −28.4 | 0.7188 | 0.2812 | 0.3699 | 0.4403 | 0.0975 | 0.6902 | 1.4% |

TABLE 2-continued

| | | | | | | | |
|---|---|---|---|---|---|---|---|
| 2900 | −6.0 | 0.6669 | 0.3329 | 0.3599 | 0.4215 | 0.1270 | 0.7352 | 1.7% |
| 2900 | 49.0 | 0.6814 | 0.3184 | 0.3648 | 0.4307 | 0.1270 | 0.7352 | 1.5% |
| 2900 | 85.6 | 0.6912 | 0.3087 | 0.3676 | 0.4360 | 0.1270 | 0.7352 | 1.4% |
| 2900 | 68.1 | 0.7008 | 0.2991 | 0.3687 | 0.4380 | 0.1270 | 0.7352 | 1.4% |
| 2900 | 27.9 | 0.7086 | 0.2914 | 0.3693 | 0.4391 | 0.1270 | 0.7352 | 1.4% |
| 2900 | −0.3 | 0.7138 | 0.2862 | 0.3696 | 0.4397 | 0.1270 | 0.7352 | 1.4% |
| 2900 | −28.4 | 0.7188 | 0.2812 | 0.3699 | 0.4403 | 0.1270 | 0.7352 | 1.4% |
| 2900 | −6.0 | 0.6669 | 0.3329 | 0.3584 | 0.4188 | 0.1561 | 0.7502 | 1.7% |
| 2900 | 49.1 | 0.6814 | 0.3184 | 0.3642 | 0.4296 | 0.1561 | 0.7502 | 1.5% |
| 2900 | 84.3 | 0.6912 | 0.3087 | 0.3678 | 0.4364 | 0.1561 | 0.7502 | 1.4% |
| 2900 | 68.1 | 0.7008 | 0.2991 | 0.3687 | 0.4380 | 0.1561 | 0.7502 | 1.4% |
| 2900 | 27.9 | 0.7086 | 0.2914 | 0.3693 | 0.4391 | 0.1561 | 0.7502 | 1.4% |
| 2900 | −0.3 | 0.7138 | 0.2862 | 0.3696 | 0.4397 | 0.1561 | 0.7502 | 1.4% |
| 2900 | −28.4 | 0.7188 | 0.2812 | 0.3699 | 0.4403 | 0.1561 | 0.7502 | 1.4% |
| 2900 | −5.8 | 0.6669 | 0.3329 | 0.3560 | 0.4143 | 0.1938 | 0.7479 | 1.8% |
| 2900 | 49.3 | 0.6814 | 0.3184 | 0.3634 | 0.4282 | 0.1938 | 0.7479 | 1.6% |
| 2900 | 83.5 | 0.6912 | 0.3087 | 0.3679 | 0.4366 | 0.1938 | 0.7479 | 1.4% |
| 2900 | 68.1 | 0.7008 | 0.2991 | 0.3687 | 0.4380 | 0.1938 | 0.7479 | 1.4% |
| 2900 | 27.9 | 0.7086 | 0.2914 | 0.3693 | 0.4391 | 0.1938 | 0.7479 | 1.4% |
| 2900 | −0.3 | 0.7138 | 0.2862 | 0.3696 | 0.4397 | 0.1938 | 0.7479 | 1.4% |
| 2900 | −28.4 | 0.7188 | 0.2812 | 0.3699 | 0.4403 | 0.1938 | 0.7479 | 1.4% |
| 2900 | −5.1 | 0.6669 | 0.3329 | 0.3517 | 0.4061 | 0.2329 | 0.7309 | 1.9% |
| 2900 | 49.1 | 0.6814 | 0.3184 | 0.3626 | 0.4266 | 0.2329 | 0.7309 | 1.6% |
| 2900 | 83.5 | 0.6912 | 0.3087 | 0.3679 | 0.4366 | 0.2329 | 0.7309 | 1.4% |
| 2900 | 68.1 | 0.7008 | 0.2991 | 0.3687 | 0.4380 | 0.2329 | 0.7309 | 1.4% |
| 2900 | 27.9 | 0.7086 | 0.2914 | 0.3693 | 0.4391 | 0.2329 | 0.7309 | 1.4% |
| 2900 | −0.3 | 0.7138 | 0.2862 | 0.3696 | 0.4397 | 0.2329 | 0.7309 | 1.4% |
| 2900 | −28.4 | 0.7188 | 0.2812 | 0.3699 | 0.4403 | 0.2329 | 0.7309 | 1.4% |
| 2800 | −19.0 | 0.6669 | 0.3329 | 0.4095 | 0.5146 | 0.1393 | 0.0514 | 0.4% |
| 2800 | 43.6 | 0.6814 | 0.3184 | 0.4095 | 0.5146 | 0.1393 | 0.0514 | 0.4% |
| 2800 | 90.7 | 0.6912 | 0.3087 | 0.4095 | 0.5146 | 0.1393 | 0.0514 | 0.4% |
| 2800 | 59.0 | 0.7008 | 0.2991 | 0.4008 | 0.4983 | 0.1393 | 0.0514 | 0.6% |
| 2800 | 17.3 | 0.7086 | 0.2914 | 0.3983 | 0.4936 | 0.1393 | 0.0514 | 0.6% |
| 2800 | −10.9 | 0.7138 | 0.2862 | 0.3919 | 0.4815 | 0.1393 | 0.0514 | 0.8% |
| 2800 | −38.6 | 0.7188 | 0.2812 | 0.3850 | 0.4685 | 0.1393 | 0.0514 | 0.9% |
| 2800 | −15.9 | 0.6669 | 0.3329 | 0.4095 | 0.5146 | 0.1303 | 0.0723 | 0.4% |
| 2800 | 46.2 | 0.6814 | 0.3184 | 0.4014 | 0.4994 | 0.1303 | 0.0723 | 0.5% |
| 2800 | 91.7 | 0.6912 | 0.3087 | 0.3936 | 0.4848 | 0.1303 | 0.0723 | 0.7% |
| 2800 | 59.1 | 0.7008 | 0.2991 | 0.3858 | 0.4701 | 0.1303 | 0.0723 | 0.9% |
| 2800 | 17.4 | 0.7086 | 0.2914 | 0.3848 | 0.4683 | 0.1303 | 0.0723 | 0.9% |
| 2800 | −10.7 | 0.7138 | 0.2862 | 0.3818 | 0.4626 | 0.1303 | 0.0723 | 1.0% |
| 2800 | −38.3 | 0.7188 | 0.2812 | 0.3784 | 0.4562 | 0.1303 | 0.0723 | 1.1% |
| 2800 | −14.5 | 0.6669 | 0.3329 | 0.3958 | 0.4888 | 0.1192 | 0.1046 | 0.7% |
| 2800 | 46.4 | 0.6814 | 0.3184 | 0.3875 | 0.4733 | 0.1192 | 0.1046 | 0.9% |
| 2800 | 91.6 | 0.6912 | 0.3087 | 0.3833 | 0.4655 | 0.1192 | 0.1046 | 1.0% |
| 2800 | 59.3 | 0.7008 | 0.2991 | 0.3794 | 0.4580 | 0.1192 | 0.1046 | 1.1% |
| 2800 | 17.8 | 0.7086 | 0.2914 | 0.3789 | 0.4571 | 0.1192 | 0.1046 | 1.1% |
| 2800 | −10.0 | 0.7138 | 0.2862 | 0.3770 | 0.4536 | 0.1192 | 0.1046 | 1.2% |
| 2800 | −37.0 | 0.7188 | 0.2812 | 0.3746 | 0.4491 | 0.1192 | 0.1046 | 1.2% |
| 2800 | −14.1 | 0.6669 | 0.3329 | 0.3864 | 0.4713 | 0.1082 | 0.1444 | 0.9% |
| 2800 | 46.5 | 0.6814 | 0.3184 | 0.3812 | 0.4615 | 0.1082 | 0.1444 | 1.0% |
| 2800 | 91.4 | 0.6912 | 0.3087 | 0.3785 | 0.4565 | 0.1082 | 0.1444 | 1.1% |
| 2800 | 59.6 | 0.7008 | 0.2991 | 0.3763 | 0.4523 | 0.1082 | 0.1444 | 1.2% |
| 2800 | 18.4 | 0.7086 | 0.2914 | 0.3760 | 0.4517 | 0.1082 | 0.1444 | 1.2% |
| 2800 | −8.7 | 0.7138 | 0.2862 | 0.3744 | 0.4487 | 0.1082 | 0.1444 | 1.2% |
| 2800 | −35.6 | 0.7188 | 0.2812 | 0.3731 | 0.4463 | 0.1082 | 0.1444 | 1.3% |
| 2800 | −13.3 | 0.6669 | 0.3329 | 0.3795 | 0.4583 | 0.0934 | 0.2133 | 1.1% |
| 2800 | 46.7 | 0.6814 | 0.3184 | 0.3765 | 0.4527 | 0.0934 | 0.2133 | 1.2% |
| 2800 | 91.0 | 0.6912 | 0.3087 | 0.3749 | 0.4497 | 0.0934 | 0.2133 | 1.2% |
| 2800 | 60.3 | 0.7008 | 0.2991 | 0.3739 | 0.4479 | 0.0934 | 0.2133 | 1.2% |
| 2800 | 20.8 | 0.7086 | 0.2914 | 0.3733 | 0.4466 | 0.0934 | 0.2133 | 1.3% |
| 2800 | −6.6 | 0.7138 | 0.2862 | 0.3727 | 0.4456 | 0.0934 | 0.2133 | 1.3% |
| 2800 | −35.6 | 0.7188 | 0.2812 | 0.3731 | 0.4463 | 0.0934 | 0.2133 | 1.3% |
| 2800 | −12.3 | 0.6669 | 0.3329 | 0.3749 | 0.4498 | 0.0792 | 0.3084 | 1.2% |
| 2800 | 46.8 | 0.6814 | 0.3184 | 0.3735 | 0.4471 | 0.0792 | 0.3084 | 1.3% |
| 2800 | 90.4 | 0.6912 | 0.3087 | 0.3728 | 0.4458 | 0.0792 | 0.3084 | 1.3% |
| 2800 | 62.8 | 0.7008 | 0.2991 | 0.3722 | 0.4447 | 0.0792 | 0.3084 | 1.3% |
| 2800 | 22.6 | 0.7086 | 0.2914 | 0.3724 | 0.4449 | 0.0792 | 0.3084 | 1.3% |
| 2800 | −6.6 | 0.7138 | 0.2862 | 0.3727 | 0.4456 | 0.0792 | 0.3084 | 1.3% |
| 2800 | −35.6 | 0.7188 | 0.2812 | 0.3731 | 0.4463 | 0.0792 | 0.3084 | 1.3% |
| 2800 | −11.5 | 0.6669 | 0.3329 | 0.3719 | 0.4441 | 0.0709 | 0.4039 | 1.3% |
| 2800 | 46.7 | 0.6814 | 0.3184 | 0.3718 | 0.4439 | 0.0709 | 0.4039 | 1.3% |
| 2800 | 89.7 | 0.6912 | 0.3087 | 0.3718 | 0.4439 | 0.0709 | 0.4039 | 1.3% |
| 2800 | 64.3 | 0.7008 | 0.2991 | 0.3718 | 0.4439 | 0.0709 | 0.4039 | 1.3% |
| 2800 | 22.6 | 0.7086 | 0.2914 | 0.3724 | 0.4449 | 0.0709 | 0.4039 | 1.3% |
| 2800 | −6.6 | 0.7138 | 0.2862 | 0.3727 | 0.4456 | 0.0709 | 0.4039 | 1.3% |
| 2800 | −35.6 | 0.7188 | 0.2812 | 0.3731 | 0.4463 | 0.0709 | 0.4039 | 1.3% |
| 2800 | −10.7 | 0.6669 | 0.3329 | 0.3691 | 0.4388 | 0.0694 | 0.5232 | 1.4% |
| 2800 | 46.6 | 0.6814 | 0.3184 | 0.3705 | 0.4413 | 0.0694 | 0.5232 | 1.3% |
| 2800 | 88.6 | 0.6912 | 0.3087 | 0.3712 | 0.4426 | 0.0694 | 0.5232 | 1.3% |

TABLE 2-continued

| | | | | | | | | |
|---|---|---|---|---|---|---|---|---|
| 2800 | 64.3 | 0.7008 | 0.2991 | 0.3718 | 0.4439 | 0.0694 | 0.5232 | 1.3% |
| 2800 | 22.6 | 0.7086 | 0.2914 | 0.3724 | 0.4449 | 0.0694 | 0.5232 | 1.3% |
| 2800 | −6.6 | 0.7138 | 0.2862 | 0.3727 | 0.4456 | 0.0694 | 0.5232 | 1.3% |
| 2800 | −35.6 | 0.7188 | 0.2812 | 0.3731 | 0.4463 | 0.0694 | 0.5232 | 1.3% |
| 2800 | −9.8 | 0.6669 | 0.3329 | 0.3668 | 0.4345 | 0.0799 | 0.6269 | 1.5% |
| 2800 | 46.4 | 0.6814 | 0.3184 | 0.3696 | 0.4397 | 0.0799 | 0.6269 | 1.4% |
| 2800 | 87.3 | 0.6912 | 0.3087 | 0.3709 | 0.4422 | 0.0799 | 0.6269 | 1.3% |
| 2800 | 64.3 | 0.7008 | 0.2991 | 0.3718 | 0.4439 | 0.0799 | 0.6269 | 1.3% |
| 2800 | 22.6 | 0.7086 | 0.2914 | 0.3724 | 0.4449 | 0.0799 | 0.6269 | 1.3% |
| 2800 | −6.6 | 0.7138 | 0.2862 | 0.3727 | 0.4456 | 0.0799 | 0.6269 | 1.3% |
| 2800 | −35.6 | 0.7188 | 0.2812 | 0.3731 | 0.4463 | 0.0799 | 0.6269 | 1.3% |
| 2800 | −9.4 | 0.6669 | 0.3329 | 0.3652 | 0.4315 | 0.0975 | 0.6902 | 1.5% |
| 2800 | 46.3 | 0.6814 | 0.3184 | 0.3691 | 0.4387 | 0.0975 | 0.6902 | 1.4% |
| 2800 | 86.0 | 0.6912 | 0.3087 | 0.3710 | 0.4423 | 0.0975 | 0.6902 | 1.3% |
| 2800 | 64.3 | 0.7008 | 0.2991 | 0.3718 | 0.4439 | 0.0975 | 0.6902 | 1.3% |
| 2800 | 22.6 | 0.7086 | 0.2914 | 0.3724 | 0.4449 | 0.0975 | 0.6902 | 1.3% |
| 2800 | −6.6 | 0.7138 | 0.2862 | 0.3727 | 0.4456 | 0.0975 | 0.6902 | 1.3% |
| 2800 | −35.6 | 0.7188 | 0.2812 | 0.3731 | 0.4463 | 0.0975 | 0.6902 | 1.3% |
| 2800 | −9.4 | 0.6669 | 0.3329 | 0.3636 | 0.4285 | 0.1270 | 0.7352 | 1.6% |
| 2800 | 46.2 | 0.6814 | 0.3184 | 0.3686 | 0.4378 | 0.1270 | 0.7352 | 1.4% |
| 2800 | 85.5 | 0.6912 | 0.3087 | 0.3710 | 0.4424 | 0.1270 | 0.7352 | 1.3% |
| 2800 | 64.3 | 0.7008 | 0.2991 | 0.3718 | 0.4439 | 0.1270 | 0.7352 | 1.3% |
| 2800 | 22.6 | 0.7086 | 0.2914 | 0.3724 | 0.4449 | 0.1270 | 0.7352 | 1.3% |
| 2800 | −6.6 | 0.7138 | 0.2862 | 0.3727 | 0.4456 | 0.1270 | 0.7352 | 1.3% |
| 2800 | −35.6 | 0.7188 | 0.2812 | 0.3731 | 0.4463 | 0.1270 | 0.7352 | 1.3% |
| 2800 | −9.5 | 0.6669 | 0.3329 | 0.3623 | 0.4260 | 0.1561 | 0.7502 | 1.6% |
| 2800 | 46.1 | 0.6814 | 0.3184 | 0.3682 | 0.4371 | 0.1561 | 0.7502 | 1.4% |
| 2800 | 85.5 | 0.6912 | 0.3087 | 0.3710 | 0.4424 | 0.1561 | 0.7502 | 1.3% |
| 2800 | 64.3 | 0.7008 | 0.2991 | 0.3718 | 0.4439 | 0.1561 | 0.7502 | 1.3% |
| 2800 | 22.6 | 0.7086 | 0.2914 | 0.3724 | 0.4449 | 0.1561 | 0.7502 | 1.3% |
| 2800 | −6.6 | 0.7138 | 0.2862 | 0.3727 | 0.4456 | 0.1561 | 0.7502 | 1.3% |
| 2800 | −35.6 | 0.7188 | 0.2812 | 0.3731 | 0.4463 | 0.1561 | 0.7502 | 1.3% |
| 2800 | −9.6 | 0.6669 | 0.3329 | 0.3604 | 0.4224 | 0.1938 | 0.7479 | 1.7% |
| 2800 | 46.1 | 0.6814 | 0.3184 | 0.3677 | 0.4363 | 0.1938 | 0.7479 | 1.4% |
| 2800 | 85.5 | 0.6912 | 0.3087 | 0.3710 | 0.4424 | 0.1938 | 0.7479 | 1.3% |
| 2800 | 64.3 | 0.7008 | 0.2991 | 0.3718 | 0.4439 | 0.1938 | 0.7479 | 1.3% |
| 2800 | 22.6 | 0.7086 | 0.2914 | 0.3724 | 0.4449 | 0.1938 | 0.7479 | 1.3% |
| 2800 | −6.6 | 0.7138 | 0.2862 | 0.3727 | 0.4456 | 0.1938 | 0.7479 | 1.3% |
| 2800 | −35.6 | 0.7188 | 0.2812 | 0.3731 | 0.4463 | 0.1938 | 0.7479 | 1.3% |
| 2800 | −9.4 | 0.6669 | 0.3329 | 0.3571 | 0.4163 | 0.2329 | 0.7309 | 1.8% |
| 2800 | 45.7 | 0.6814 | 0.3184 | 0.3673 | 0.4354 | 0.2329 | 0.7309 | 1.4% |
| 2800 | 85.5 | 0.6912 | 0.3087 | 0.3710 | 0.4424 | 0.2329 | 0.7309 | 1.3% |
| 2800 | 64.3 | 0.7008 | 0.2991 | 0.3718 | 0.4439 | 0.2329 | 0.7309 | 1.3% |
| 2800 | 22.6 | 0.7086 | 0.2914 | 0.3724 | 0.4449 | 0.2329 | 0.7309 | 1.3% |
| 2800 | −6.6 | 0.7138 | 0.2862 | 0.3727 | 0.4456 | 0.2329 | 0.7309 | 1.3% |
| 2800 | −35.6 | 0.7188 | 0.2812 | 0.3731 | 0.4463 | 0.2329 | 0.7309 | 1.3% |
| 2700 | −21.5 | 0.6669 | 0.3329 | 0.4095 | 0.5146 | 0.1393 | 0.0514 | 0.4% |
| 2700 | 43.1 | 0.6814 | 0.3184 | 0.4095 | 0.5146 | 0.1393 | 0.0514 | 0.4% |
| 2700 | 91.4 | 0.6912 | 0.3087 | 0.4083 | 0.5123 | 0.1393 | 0.0514 | 0.4% |
| 2700 | 58.2 | 0.7008 | 0.2991 | 0.3890 | 0.4761 | 0.1393 | 0.0514 | 0.8% |
| 2700 | 15.1 | 0.7086 | 0.2914 | 0.3879 | 0.4741 | 0.1393 | 0.0514 | 0.9% |
| 2700 | −13.9 | 0.7138 | 0.2862 | 0.3820 | 0.4630 | 0.1393 | 0.0514 | 1.0% |
| 2700 | −42.6 | 0.7188 | 0.2812 | 0.3763 | 0.4524 | 0.1393 | 0.0514 | 1.2% |
| 2700 | −18.7 | 0.6669 | 0.3329 | 0.4095 | 0.5146 | 0.1303 | 0.0723 | 0.4% |
| 2700 | 44.5 | 0.6814 | 0.3184 | 0.3976 | 0.4923 | 0.1303 | 0.0723 | 0.6% |
| 2700 | 91.3 | 0.6912 | 0.3087 | 0.3905 | 0.4789 | 0.1303 | 0.0723 | 0.8% |
| 2700 | 58.3 | 0.7008 | 0.2991 | 0.3818 | 0.4626 | 0.1303 | 0.0723 | 1.0% |
| 2700 | 15.3 | 0.7086 | 0.2914 | 0.3814 | 0.4620 | 0.1303 | 0.0723 | 1.0% |
| 2700 | −13.7 | 0.7138 | 0.2862 | 0.3784 | 0.4563 | 0.1303 | 0.0723 | 1.1% |
| 2700 | −42.6 | 0.7188 | 0.2812 | 0.3763 | 0.4524 | 0.1303 | 0.0723 | 1.2% |
| 2700 | −17.7 | 0.6669 | 0.3329 | 0.3962 | 0.4897 | 0.1192 | 0.1046 | 0.7% |
| 2700 | 44.6 | 0.6814 | 0.3184 | 0.3869 | 0.4722 | 0.1192 | 0.1046 | 0.9% |
| 2700 | 91.2 | 0.6912 | 0.3087 | 0.3829 | 0.4646 | 0.1192 | 0.1046 | 1.0% |
| 2700 | 58.6 | 0.7008 | 0.2991 | 0.3784 | 0.4563 | 0.1192 | 0.1046 | 1.1% |
| 2700 | 15.8 | 0.7086 | 0.2914 | 0.3783 | 0.4560 | 0.1192 | 0.1046 | 1.1% |
| 2700 | −12.8 | 0.7138 | 0.2862 | 0.3763 | 0.4524 | 0.1192 | 0.1046 | 1.2% |
| 2700 | −42.6 | 0.7188 | 0.2812 | 0.3763 | 0.4524 | 0.1192 | 0.1046 | 1.2% |
| 2700 | −17.4 | 0.6669 | 0.3329 | 0.3880 | 0.4742 | 0.1082 | 0.1444 | 0.9% |
| 2700 | 44.6 | 0.6814 | 0.3184 | 0.3820 | 0.4630 | 0.1082 | 0.1444 | 1.0% |
| 2700 | 90.9 | 0.6912 | 0.3087 | 0.3793 | 0.4578 | 0.1082 | 0.1444 | 1.1% |
| 2700 | 58.9 | 0.7008 | 0.2991 | 0.3768 | 0.4532 | 0.1082 | 0.1444 | 1.2% |
| 2700 | 16.5 | 0.7086 | 0.2914 | 0.3766 | 0.4529 | 0.1082 | 0.1444 | 1.2% |
| 2700 | −12.6 | 0.7138 | 0.2862 | 0.3760 | 0.4517 | 0.1082 | 0.1444 | 1.2% |
| 2700 | −42.6 | 0.7188 | 0.2812 | 0.3763 | 0.4524 | 0.1082 | 0.1444 | 1.2% |
| 2700 | −16.7 | 0.6669 | 0.3329 | 0.3818 | 0.4626 | 0.0934 | 0.2133 | 1.0% |
| 2700 | 44.7 | 0.6814 | 0.3184 | 0.3783 | 0.4560 | 0.0934 | 0.2133 | 1.1% |
| 2700 | 90.3 | 0.6912 | 0.3087 | 0.3766 | 0.4528 | 0.0934 | 0.2133 | 1.2% |
| 2700 | 59.8 | 0.7008 | 0.2991 | 0.3755 | 0.4508 | 0.0934 | 0.2133 | 1.2% |
| 2700 | 17.6 | 0.7086 | 0.2914 | 0.3756 | 0.4510 | 0.0934 | 0.2133 | 1.2% |
| 2700 | −12.6 | 0.7138 | 0.2862 | 0.3760 | 0.4517 | 0.0934 | 0.2133 | 1.2% |

TABLE 2-continued

| | | | | | | | | |
|---|---|---|---|---|---|---|---|---|
| 2700 | −42.6 | 0.7188 | 0.2812 | 0.3763 | 0.4524 | 0.0934 | 0.2133 | 1.2% |
| 2700 | −15.9 | 0.6669 | 0.3329 | 0.3776 | 0.4548 | 0.0792 | 0.3084 | 1.1% |
| 2700 | 44.6 | 0.6814 | 0.3184 | 0.3759 | 0.4515 | 0.0792 | 0.3084 | 1.2% |
| 2700 | 89.4 | 0.6912 | 0.3087 | 0.3751 | 0.4500 | 0.0792 | 0.3084 | 1.2% |
| 2700 | 60.7 | 0.7008 | 0.2991 | 0.3750 | 0.4499 | 0.0792 | 0.3084 | 1.2% |
| 2700 | 17.6 | 0.7086 | 0.2914 | 0.3756 | 0.4510 | 0.0792 | 0.3084 | 1.2% |
| 2700 | −12.6 | 0.7138 | 0.2862 | 0.3760 | 0.4517 | 0.0792 | 0.3084 | 1.2% |
| 2700 | −42.6 | 0.7188 | 0.2812 | 0.3763 | 0.4524 | 0.0792 | 0.3084 | 1.2% |
| 2700 | −15.2 | 0.6669 | 0.3329 | 0.3749 | 0.4497 | 0.0709 | 0.4039 | 1.2% |
| 2700 | 44.4 | 0.6814 | 0.3184 | 0.3746 | 0.4491 | 0.0709 | 0.4039 | 1.2% |
| 2700 | 88.6 | 0.6912 | 0.3087 | 0.3745 | 0.4489 | 0.0709 | 0.4039 | 1.2% |
| 2700 | 60.7 | 0.7008 | 0.2991 | 0.3750 | 0.4499 | 0.0709 | 0.4039 | 1.2% |
| 2700 | 17.6 | 0.7086 | 0.2914 | 0.3756 | 0.4510 | 0.0709 | 0.4039 | 1.2% |
| 2700 | −12.6 | 0.7138 | 0.2862 | 0.3760 | 0.4517 | 0.0709 | 0.4039 | 1.2% |
| 2700 | −42.6 | 0.7188 | 0.2812 | 0.3763 | 0.4524 | 0.0709 | 0.4039 | 1.2% |
| 2700 | −14.4 | 0.6669 | 0.3329 | 0.3724 | 0.4449 | 0.0694 | 0.5232 | 1.3% |
| 2700 | 44.1 | 0.6814 | 0.3184 | 0.3736 | 0.4472 | 0.0694 | 0.5232 | 1.3% |
| 2700 | 87.4 | 0.6912 | 0.3087 | 0.3742 | 0.4484 | 0.0694 | 0.5232 | 1.2% |
| 2700 | 60.7 | 0.7008 | 0.2991 | 0.3750 | 0.4499 | 0.0694 | 0.5232 | 1.2% |
| 2700 | 17.6 | 0.7086 | 0.2914 | 0.3756 | 0.4510 | 0.0694 | 0.5232 | 1.2% |
| 2700 | −12.6 | 0.7138 | 0.2862 | 0.3760 | 0.4517 | 0.0694 | 0.5232 | 1.2% |
| 2700 | −42.6 | 0.7188 | 0.2812 | 0.3763 | 0.4524 | 0.0694 | 0.5232 | 1.2% |
| 2700 | −13.6 | 0.6669 | 0.3329 | 0.3703 | 0.4411 | 0.0799 | 0.6269 | 1.3% |
| 2700 | 43.7 | 0.6814 | 0.3184 | 0.3730 | 0.4461 | 0.0799 | 0.6269 | 1.3% |
| 2700 | 87.2 | 0.6912 | 0.3087 | 0.3742 | 0.4484 | 0.0799 | 0.6269 | 1.2% |
| 2700 | 60.7 | 0.7008 | 0.2991 | 0.3750 | 0.4499 | 0.0799 | 0.6269 | 1.2% |
| 2700 | 17.6 | 0.7086 | 0.2914 | 0.3756 | 0.4510 | 0.0799 | 0.6269 | 1.2% |
| 2700 | −12.6 | 0.7138 | 0.2862 | 0.3760 | 0.4517 | 0.0799 | 0.6269 | 1.2% |
| 2700 | −42.6 | 0.7188 | 0.2812 | 0.3763 | 0.4524 | 0.0799 | 0.6269 | 1.2% |
| 2700 | −13.2 | 0.6669 | 0.3329 | 0.3688 | 0.4383 | 0.0975 | 0.6902 | 1.4% |
| 2700 | 43.4 | 0.6814 | 0.3184 | 0.3727 | 0.4455 | 0.0975 | 0.6902 | 1.3% |
| 2700 | 87.2 | 0.6912 | 0.3087 | 0.3742 | 0.4484 | 0.0975 | 0.6902 | 1.2% |
| 2700 | 60.7 | 0.7008 | 0.2991 | 0.3750 | 0.4499 | 0.0975 | 0.6902 | 1.2% |
| 2700 | 17.6 | 0.7086 | 0.2914 | 0.3756 | 0.4510 | 0.0975 | 0.6902 | 1.2% |
| 2700 | −12.6 | 0.7138 | 0.2862 | 0.3760 | 0.4517 | 0.0975 | 0.6902 | 1.2% |
| 2700 | −42.6 | 0.7188 | 0.2812 | 0.3763 | 0.4524 | 0.0975 | 0.6902 | 1.2% |
| 2700 | −13.1 | 0.6669 | 0.3329 | 0.3673 | 0.4355 | 0.1270 | 0.7352 | 1.4% |
| 2700 | 43.1 | 0.6814 | 0.3184 | 0.3724 | 0.4450 | 0.1270 | 0.7352 | 1.3% |
| 2700 | 87.2 | 0.6912 | 0.3087 | 0.3742 | 0.4484 | 0.1270 | 0.7352 | 1.2% |
| 2700 | 60.7 | 0.7008 | 0.2991 | 0.3750 | 0.4499 | 0.1270 | 0.7352 | 1.2% |
| 2700 | 17.6 | 0.7086 | 0.2914 | 0.3756 | 0.4510 | 0.1270 | 0.7352 | 1.2% |
| 2700 | −12.6 | 0.7138 | 0.2862 | 0.3760 | 0.4517 | 0.1270 | 0.7352 | 1.2% |
| 2700 | −42.6 | 0.7188 | 0.2812 | 0.3763 | 0.4524 | 0.1270 | 0.7352 | 1.2% |
| 2700 | −13.2 | 0.6669 | 0.3329 | 0.3662 | 0.4333 | 0.1561 | 0.7502 | 1.5% |
| 2700 | 42.9 | 0.6814 | 0.3184 | 0.3723 | 0.4447 | 0.1561 | 0.7502 | 1.3% |
| 2700 | 87.2 | 0.6912 | 0.3087 | 0.3742 | 0.4484 | 0.1561 | 0.7502 | 1.2% |
| 2700 | 60.7 | 0.7008 | 0.2991 | 0.3750 | 0.4499 | 0.1561 | 0.7502 | 1.2% |
| 2700 | 17.6 | 0.7086 | 0.2914 | 0.3756 | 0.4510 | 0.1561 | 0.7502 | 1.2% |
| 2700 | −12.6 | 0.7138 | 0.2862 | 0.3760 | 0.4517 | 0.1561 | 0.7502 | 1.2% |
| 2700 | −42.6 | 0.7188 | 0.2812 | 0.3763 | 0.4524 | 0.1561 | 0.7502 | 1.2% |
| 2700 | −13.3 | 0.6669 | 0.3329 | 0.3645 | 0.4303 | 0.1938 | 0.7479 | 1.5% |
| 2700 | 42.6 | 0.6814 | 0.3184 | 0.3721 | 0.4444 | 0.1938 | 0.7479 | 1.3% |
| 2700 | 87.2 | 0.6912 | 0.3087 | 0.3742 | 0.4484 | 0.1938 | 0.7479 | 1.2% |
| 2700 | 60.7 | 0.7008 | 0.2991 | 0.3750 | 0.4499 | 0.1938 | 0.7479 | 1.2% |
| 2700 | 17.6 | 0.7086 | 0.2914 | 0.3756 | 0.4510 | 0.1938 | 0.7479 | 1.2% |
| 2700 | −12.6 | 0.7138 | 0.2862 | 0.3760 | 0.4517 | 0.1938 | 0.7479 | 1.2% |
| 2700 | −42.6 | 0.7188 | 0.2812 | 0.3763 | 0.4524 | 0.1938 | 0.7479 | 1.2% |
| 2700 | −13.5 | 0.6669 | 0.3329 | 0.3620 | 0.4255 | 0.2329 | 0.7309 | 1.6% |
| 2700 | 41.9 | 0.6814 | 0.3184 | 0.3721 | 0.4444 | 0.2329 | 0.7309 | 1.3% |
| 2700 | 87.2 | 0.6912 | 0.3087 | 0.3742 | 0.4484 | 0.2329 | 0.7309 | 1.2% |
| 2700 | 60.7 | 0.7008 | 0.2991 | 0.3750 | 0.4499 | 0.2329 | 0.7309 | 1.2% |
| 2700 | 17.6 | 0.7086 | 0.2914 | 0.3756 | 0.4510 | 0.2329 | 0.7309 | 1.2% |
| 2700 | −12.6 | 0.7138 | 0.2862 | 0.3760 | 0.4517 | 0.2329 | 0.7309 | 1.2% |
| 2700 | −42.6 | 0.7188 | 0.2812 | 0.3763 | 0.4524 | 0.2329 | 0.7309 | 1.2% |
| 2600 | −24.3 | 0.6669 | 0.3329 | 0.4095 | 0.5146 | 0.1393 | 0.0514 | 0.4% |
| 2600 | 42.3 | 0.6814 | 0.3184 | 0.4095 | 0.5146 | 0.1393 | 0.0514 | 0.4% |
| 2600 | 90.8 | 0.6912 | 0.3087 | 0.3972 | 0.4916 | 0.1393 | 0.0514 | 0.6% |
| 2600 | 57.4 | 0.7008 | 0.2991 | 0.3783 | 0.4561 | 0.1393 | 0.0514 | 1.1% |
| 2600 | 12.9 | 0.7086 | 0.2914 | 0.3789 | 0.4572 | 0.1393 | 0.0514 | 1.1% |
| 2600 | −18.3 | 0.7138 | 0.2862 | 0.3793 | 0.4580 | 0.1393 | 0.0514 | 1.1% |
| 2600 | −49.4 | 0.7188 | 0.2812 | 0.3797 | 0.4587 | 0.1393 | 0.0514 | 1.1% |
| 2600 | −21.9 | 0.6669 | 0.3329 | 0.4095 | 0.5146 | 0.1303 | 0.0723 | 0.4% |
| 2600 | 42.6 | 0.6814 | 0.3184 | 0.3939 | 0.4853 | 0.1303 | 0.0723 | 0.7% |
| 2600 | 90.7 | 0.6912 | 0.3087 | 0.3869 | 0.4722 | 0.1303 | 0.0723 | 0.9% |
| 2600 | 57.4 | 0.7008 | 0.2991 | 0.3783 | 0.4561 | 0.1303 | 0.0723 | 1.1% |
| 2600 | 12.9 | 0.7086 | 0.2914 | 0.3789 | 0.4572 | 0.1303 | 0.0723 | 1.1% |
| 2600 | −18.3 | 0.7138 | 0.2862 | 0.3793 | 0.4580 | 0.1303 | 0.0723 | 1.1% |
| 2600 | −49.4 | 0.7188 | 0.2812 | 0.3797 | 0.4586 | 0.1303 | 0.0723 | 1.1% |
| 2600 | −21.3 | 0.6669 | 0.3329 | 0.3965 | 0.4902 | 0.1192 | 0.1046 | 0.7% |
| 2600 | 42.6 | 0.6814 | 0.3184 | 0.3862 | 0.4709 | 0.1192 | 0.1046 | 0.9% |

TABLE 2-continued

| | | | | | | | | |
|---|---|---|---|---|---|---|---|---|
| 2600 | 90.5 | 0.6912 | 0.3087 | 0.3821 | 0.4633 | 0.1192 | 0.1046 | 1.0% |
| 2600 | 57.4 | 0.7008 | 0.2991 | 0.3783 | 0.4561 | 0.1192 | 0.1046 | 1.1% |
| 2600 | 12.9 | 0.7086 | 0.2914 | 0.3789 | 0.4572 | 0.1192 | 0.1046 | 1.1% |
| 2600 | −18.3 | 0.7138 | 0.2862 | 0.3793 | 0.4580 | 0.1192 | 0.1046 | 1.1% |
| 2600 | −49.4 | 0.7188 | 0.2812 | 0.3797 | 0.4587 | 0.1192 | 0.1046 | 1.1% |
| 2600 | −21.0 | 0.6669 | 0.3329 | 0.3894 | 0.4768 | 0.1082 | 0.1444 | 0.8% |
| 2600 | 42.5 | 0.6814 | 0.3184 | 0.3826 | 0.4641 | 0.1082 | 0.1444 | 1.0% |
| 2600 | 90.1 | 0.6912 | 0.3087 | 0.3798 | 0.4589 | 0.1082 | 0.1444 | 1.1% |
| 2600 | 57.4 | 0.7008 | 0.2991 | 0.3783 | 0.4561 | 0.1082 | 0.1444 | 1.1% |
| 2600 | 12.9 | 0.7086 | 0.2914 | 0.3789 | 0.4572 | 0.1082 | 0.1444 | 1.1% |
| 2600 | −18.3 | 0.7138 | 0.2862 | 0.3793 | 0.4580 | 0.1082 | 0.1444 | 1.1% |
| 2600 | −49.4 | 0.7188 | 0.2812 | 0.3797 | 0.4587 | 0.1082 | 0.1444 | 1.1% |
| 2600 | −20.5 | 0.6669 | 0.3329 | 0.3840 | 0.4667 | 0.0934 | 0.2133 | 1.0% |
| 2600 | 42.4 | 0.6814 | 0.3184 | 0.3799 | 0.4590 | 0.0934 | 0.2133 | 1.1% |
| 2600 | 89.3 | 0.6912 | 0.3087 | 0.3781 | 0.4557 | 0.0934 | 0.2133 | 1.1% |
| 2600 | 57.4 | 0.7008 | 0.2991 | 0.3783 | 0.4561 | 0.0934 | 0.2133 | 1.1% |
| 2600 | 12.9 | 0.7086 | 0.2914 | 0.3789 | 0.4572 | 0.0934 | 0.2133 | 1.1% |
| 2600 | −18.3 | 0.7138 | 0.2862 | 0.3793 | 0.4580 | 0.0934 | 0.2133 | 1.1% |
| 2600 | −49.4 | 0.7188 | 0.2812 | 0.3797 | 0.4587 | 0.0934 | 0.2133 | 1.1% |
| 2600 | −19.8 | 0.6669 | 0.3329 | 0.3803 | 0.4598 | 0.0792 | 0.3084 | 1.1% |
| 2600 | 42.1 | 0.6814 | 0.3184 | 0.3782 | 0.4559 | 0.0792 | 0.3084 | 1.1% |
| 2600 | 88.5 | 0.6912 | 0.3087 | 0.3775 | 0.4545 | 0.0792 | 0.3084 | 1.1% |
| 2600 | 57.4 | 0.7008 | 0.2991 | 0.3783 | 0.4561 | 0.0792 | 0.3084 | 1.1% |
| 2600 | 12.9 | 0.7086 | 0.2914 | 0.3789 | 0.4572 | 0.0792 | 0.3084 | 1.1% |
| 2600 | −18.3 | 0.7138 | 0.2862 | 0.3793 | 0.4580 | 0.0792 | 0.3084 | 1.1% |
| 2600 | −49.4 | 0.7188 | 0.2812 | 0.3797 | 0.4587 | 0.0792 | 0.3084 | 1.1% |
| 2600 | −19.2 | 0.6669 | 0.3329 | 0.3779 | 0.4554 | 0.0709 | 0.4039 | 1.1% |
| 2600 | 41.8 | 0.6814 | 0.3184 | 0.3773 | 0.4542 | 0.0709 | 0.4039 | 1.1% |
| 2600 | 88.5 | 0.6912 | 0.3087 | 0.3775 | 0.4545 | 0.0709 | 0.4039 | 1.1% |
| 2600 | 57.4 | 0.7008 | 0.2991 | 0.3783 | 0.4561 | 0.0709 | 0.4039 | 1.1% |
| 2600 | 12.9 | 0.7086 | 0.2914 | 0.3789 | 0.4572 | 0.0709 | 0.4039 | 1.1% |
| 2600 | −18.3 | 0.7138 | 0.2862 | 0.3793 | 0.4580 | 0.0709 | 0.4039 | 1.1% |
| 2600 | −49.4 | 0.7188 | 0.2812 | 0.3797 | 0.4587 | 0.0709 | 0.4039 | 1.1% |
| 2600 | −18.5 | 0.6669 | 0.3329 | 0.3757 | 0.4512 | 0.0694 | 0.5232 | 1.2% |
| 2600 | 41.3 | 0.6814 | 0.3184 | 0.3767 | 0.4531 | 0.0694 | 0.5232 | 1.2% |
| 2600 | 88.5 | 0.6912 | 0.3087 | 0.3775 | 0.4545 | 0.0694 | 0.5232 | 1.1% |
| 2600 | 57.4 | 0.7008 | 0.2991 | 0.3783 | 0.4561 | 0.0694 | 0.5232 | 1.1% |
| 2600 | 12.9 | 0.7086 | 0.2914 | 0.3789 | 0.4572 | 0.0694 | 0.5232 | 1.1% |
| 2600 | −18.3 | 0.7138 | 0.2862 | 0.3793 | 0.4580 | 0.0694 | 0.5232 | 1.1% |
| 2600 | −49.4 | 0.7188 | 0.2812 | 0.3797 | 0.4587 | 0.0694 | 0.5232 | 1.1% |
| 2600 | −17.8 | 0.6669 | 0.3329 | 0.3739 | 0.4478 | 0.0799 | 0.6269 | 1.2% |
| 2600 | 40.8 | 0.6814 | 0.3184 | 0.3764 | 0.4525 | 0.0799 | 0.6269 | 1.2% |
| 2600 | 88.5 | 0.6912 | 0.3087 | 0.3775 | 0.4545 | 0.0799 | 0.6269 | 1.1% |
| 2600 | 57.4 | 0.7008 | 0.2991 | 0.3783 | 0.4561 | 0.0799 | 0.6269 | 1.1% |
| 2600 | 12.9 | 0.7086 | 0.2914 | 0.3789 | 0.4572 | 0.0799 | 0.6269 | 1.1% |
| 2600 | −18.3 | 0.7138 | 0.2862 | 0.3793 | 0.4580 | 0.0799 | 0.6269 | 1.1% |
| 2600 | −49.4 | 0.7188 | 0.2812 | 0.3797 | 0.4587 | 0.0799 | 0.6269 | 1.1% |
| 2600 | −17.2 | 0.6669 | 0.3329 | 0.3725 | 0.4452 | 0.0975 | 0.6902 | 1.3% |
| 2600 | 40.4 | 0.6814 | 0.3184 | 0.3763 | 0.4523 | 0.0975 | 0.6902 | 1.2% |
| 2600 | 88.5 | 0.6912 | 0.3087 | 0.3775 | 0.4545 | 0.0975 | 0.6902 | 1.1% |
| 2600 | 57.4 | 0.7008 | 0.2991 | 0.3783 | 0.4561 | 0.0975 | 0.6902 | 1.1% |
| 2600 | 12.9 | 0.7086 | 0.2914 | 0.3789 | 0.4572 | 0.0975 | 0.6902 | 1.1% |
| 2600 | −18.3 | 0.7138 | 0.2862 | 0.3793 | 0.4580 | 0.0975 | 0.6902 | 1.1% |
| 2600 | −49.4 | 0.7188 | 0.2812 | 0.3797 | 0.4587 | 0.0975 | 0.6902 | 1.1% |
| 2600 | −17.0 | 0.6669 | 0.3329 | 0.3711 | 0.4426 | 0.1270 | 0.7352 | 1.3% |
| 2600 | 39.9 | 0.6814 | 0.3184 | 0.3763 | 0.4523 | 0.1270 | 0.7352 | 1.2% |
| 2600 | 88.5 | 0.6912 | 0.3087 | 0.3775 | 0.4545 | 0.1270 | 0.7352 | 1.1% |
| 2600 | 57.4 | 0.7008 | 0.2991 | 0.3783 | 0.4561 | 0.1270 | 0.7352 | 1.1% |
| 2600 | 12.9 | 0.7086 | 0.2914 | 0.3789 | 0.4572 | 0.1270 | 0.7352 | 1.1% |
| 2600 | −18.3 | 0.7138 | 0.2862 | 0.3793 | 0.4580 | 0.1270 | 0.7352 | 1.1% |
| 2600 | −49.4 | 0.7188 | 0.2812 | 0.3797 | 0.4587 | 0.1270 | 0.7352 | 1.1% |
| 2600 | −17.0 | 0.6669 | 0.3329 | 0.3701 | 0.4406 | 0.1561 | 0.7502 | 1.4% |
| 2600 | 39.5 | 0.6814 | 0.3184 | 0.3763 | 0.4524 | 0.1561 | 0.7502 | 1.2% |
| 2600 | 88.5 | 0.6912 | 0.3087 | 0.3775 | 0.4545 | 0.1561 | 0.7502 | 1.1% |
| 2600 | 57.4 | 0.7008 | 0.2991 | 0.3783 | 0.4561 | 0.1561 | 0.7502 | 1.1% |
| 2600 | 12.9 | 0.7086 | 0.2914 | 0.3789 | 0.4572 | 0.1561 | 0.7502 | 1.1% |
| 2600 | −18.3 | 0.7138 | 0.2862 | 0.3793 | 0.4580 | 0.1561 | 0.7502 | 1.1% |
| 2600 | −49.4 | 0.7188 | 0.2812 | 0.3797 | 0.4587 | 0.1561 | 0.7502 | 1.1% |
| 2600 | −17.2 | 0.6669 | 0.3329 | 0.3686 | 0.4379 | 0.1938 | 0.7479 | 1.4% |
| 2600 | 38.9 | 0.6814 | 0.3184 | 0.3765 | 0.4527 | 0.1938 | 0.7479 | 1.2% |
| 2600 | 88.5 | 0.6912 | 0.3087 | 0.3775 | 0.4545 | 0.1938 | 0.7479 | 1.1% |
| 2600 | 57.4 | 0.7008 | 0.2991 | 0.3783 | 0.4561 | 0.1938 | 0.7479 | 1.1% |
| 2600 | 12.9 | 0.7086 | 0.2914 | 0.3789 | 0.4572 | 0.1938 | 0.7479 | 1.1% |
| 2600 | −18.3 | 0.7138 | 0.2862 | 0.3793 | 0.4580 | 0.1938 | 0.7479 | 1.1% |
| 2600 | −49.4 | 0.7188 | 0.2812 | 0.3797 | 0.4587 | 0.1938 | 0.7479 | 1.1% |
| 2600 | −17.4 | 0.6669 | 0.3329 | 0.3665 | 0.4339 | 0.2329 | 0.7309 | 1.5% |
| 2600 | 38.8 | 0.6814 | 0.3184 | 0.3765 | 0.4527 | 0.2329 | 0.7309 | 1.2% |
| 2600 | 88.5 | 0.6912 | 0.3087 | 0.3775 | 0.4545 | 0.2329 | 0.7309 | 1.1% |
| 2600 | 57.4 | 0.7008 | 0.2991 | 0.3783 | 0.4561 | 0.2329 | 0.7309 | 1.1% |
| 2600 | 12.9 | 0.7086 | 0.2914 | 0.3789 | 0.4572 | 0.2329 | 0.7309 | 1.1% |

TABLE 2-continued

| | | | | | | | | |
|---|---|---|---|---|---|---|---|---|
| 2600 | −18.3 | 0.7138 | 0.2862 | 0.3793 | 0.4580 | 0.2329 | 0.7309 | 1.1% |
| 2600 | −49.4 | 0.7188 | 0.2812 | 0.3797 | 0.4587 | 0.2329 | 0.7309 | 1.1% |
| 2500 | −27.5 | 0.6669 | 0.3329 | 0.4095 | 0.5146 | 0.1393 | 0.0514 | 0.4% |
| 2500 | 40.4 | 0.6814 | 0.3184 | 0.4002 | 0.4971 | 0.1393 | 0.0514 | 0.6% |
| 2500 | 90.0 | 0.6912 | 0.3087 | 0.3863 | 0.4710 | 0.1393 | 0.0514 | 0.9% |
| 2500 | 54.5 | 0.7008 | 0.2991 | 0.3817 | 0.4625 | 0.1393 | 0.0514 | 1.0% |
| 2500 | 8.6 | 0.7086 | 0.2914 | 0.3824 | 0.4637 | 0.1393 | 0.0514 | 1.0% |
| 2500 | −23.7 | 0.7138 | 0.2862 | 0.3828 | 0.4644 | 0.1393 | 0.0514 | 1.0% |
| 2500 | −55.8 | 0.7188 | 0.2812 | 0.3831 | 0.4651 | 0.1393 | 0.0514 | 1.0% |
| 2500 | −25.5 | 0.6669 | 0.3329 | 0.4095 | 0.5146 | 0.1303 | 0.0723 | 0.4% |
| 2500 | 40.3 | 0.6814 | 0.3184 | 0.3898 | 0.4777 | 0.1303 | 0.0723 | 0.8% |
| 2500 | 89.9 | 0.6912 | 0.3087 | 0.3831 | 0.4650 | 0.1303 | 0.0723 | 1.0% |
| 2500 | 54.5 | 0.7008 | 0.2991 | 0.3817 | 0.4625 | 0.1303 | 0.0723 | 1.0% |
| 2500 | 8.6 | 0.7086 | 0.2914 | 0.3824 | 0.4637 | 0.1303 | 0.0723 | 1.0% |
| 2500 | −23.7 | 0.7138 | 0.2862 | 0.3828 | 0.4644 | 0.1303 | 0.0723 | 1.0% |
| 2500 | −55.8 | 0.7188 | 0.2812 | 0.3831 | 0.4651 | 0.1303 | 0.0723 | 1.0% |
| 2500 | −25.3 | 0.6669 | 0.3329 | 0.3965 | 0.4902 | 0.1192 | 0.1046 | 0.7% |
| 2500 | 40.2 | 0.6814 | 0.3184 | 0.3852 | 0.4690 | 0.1192 | 0.1046 | 0.9% |
| 2500 | 89.5 | 0.6912 | 0.3087 | 0.3812 | 0.4615 | 0.1192 | 0.1046 | 1.0% |
| 2500 | 54.5 | 0.7008 | 0.2991 | 0.3817 | 0.4625 | 0.1192 | 0.1046 | 1.0% |
| 2500 | 8.6 | 0.7086 | 0.2914 | 0.3824 | 0.4637 | 0.1192 | 0.1046 | 1.0% |
| 2500 | −23.7 | 0.7138 | 0.2862 | 0.3828 | 0.4644 | 0.1192 | 0.1046 | 1.0% |
| 2500 | −55.8 | 0.7188 | 0.2812 | 0.3831 | 0.4651 | 0.1192 | 0.1046 | 1.0% |
| 2500 | −25.0 | 0.6669 | 0.3329 | 0.3906 | 0.4791 | 0.1082 | 0.1444 | 0.8% |
| 2500 | 40.1 | 0.6814 | 0.3184 | 0.3830 | 0.4649 | 0.1082 | 0.1444 | 1.0% |
| 2500 | 89.4 | 0.6912 | 0.3087 | 0.3808 | 0.4608 | 0.1082 | 0.1444 | 1.1% |
| 2500 | 54.5 | 0.7008 | 0.2991 | 0.3817 | 0.4625 | 0.1082 | 0.1444 | 1.0% |
| 2500 | 8.6 | 0.7086 | 0.2914 | 0.3824 | 0.4637 | 0.1082 | 0.1444 | 1.0% |
| 2500 | −23.7 | 0.7138 | 0.2862 | 0.3828 | 0.4644 | 0.1082 | 0.1444 | 1.0% |
| 2500 | −55.8 | 0.7188 | 0.2812 | 0.3831 | 0.4651 | 0.1082 | 0.1444 | 1.0% |
| 2500 | −24.6 | 0.6669 | 0.3329 | 0.3860 | 0.4705 | 0.0934 | 0.2133 | 0.9% |
| 2500 | 39.8 | 0.6814 | 0.3184 | 0.3814 | 0.4618 | 0.0934 | 0.2133 | 1.0% |
| 2500 | 89.4 | 0.6912 | 0.3087 | 0.3808 | 0.4608 | 0.0934 | 0.2133 | 1.1% |
| 2500 | 54.5 | 0.7008 | 0.2991 | 0.3817 | 0.4625 | 0.0934 | 0.2133 | 1.0% |
| 2500 | 8.6 | 0.7086 | 0.2914 | 0.3824 | 0.4637 | 0.0934 | 0.2133 | 1.0% |
| 2500 | −23.7 | 0.7138 | 0.2862 | 0.3828 | 0.4644 | 0.0934 | 0.2133 | 1.0% |
| 2500 | −55.8 | 0.7188 | 0.2812 | 0.3831 | 0.4651 | 0.0934 | 0.2133 | 1.0% |
| 2500 | −24.0 | 0.6669 | 0.3329 | 0.3829 | 0.4647 | 0.0792 | 0.3084 | 1.0% |
| 2500 | 39.3 | 0.6814 | 0.3184 | 0.3804 | 0.4601 | 0.0792 | 0.3084 | 1.1% |
| 2500 | 89.4 | 0.6912 | 0.3087 | 0.3808 | 0.4608 | 0.0792 | 0.3084 | 1.1% |
| 2500 | 54.5 | 0.7008 | 0.2991 | 0.3817 | 0.4625 | 0.0792 | 0.3084 | 1.0% |
| 2500 | 8.6 | 0.7086 | 0.2914 | 0.3824 | 0.4637 | 0.0792 | 0.3084 | 1.0% |
| 2500 | −23.7 | 0.7138 | 0.2862 | 0.3828 | 0.4644 | 0.0792 | 0.3084 | 1.0% |
| 2500 | −55.8 | 0.7188 | 0.2812 | 0.3831 | 0.4651 | 0.0792 | 0.3084 | 1.0% |
| 2500 | −23.6 | 0.6669 | 0.3329 | 0.3809 | 0.4610 | 0.0709 | 0.4039 | 1.0% |
| 2500 | 38.9 | 0.6814 | 0.3184 | 0.3800 | 0.4593 | 0.0709 | 0.4039 | 1.1% |
| 2500 | 89.4 | 0.6912 | 0.3087 | 0.3800 | 0.4608 | 0.0709 | 0.4039 | 1.1% |
| 2500 | 54.5 | 0.7008 | 0.2991 | 0.3817 | 0.4625 | 0.0709 | 0.4039 | 1.0% |
| 2500 | 8.6 | 0.7086 | 0.2914 | 0.3824 | 0.4637 | 0.0709 | 0.4039 | 1.0% |
| 2500 | −23.7 | 0.7138 | 0.2862 | 0.3828 | 0.4644 | 0.0709 | 0.4039 | 1.0% |
| 2500 | −55.8 | 0.7188 | 0.2812 | 0.3831 | 0.4651 | 0.0709 | 0.4039 | 1.0% |
| 2500 | −23.0 | 0.6669 | 0.3329 | 0.3790 | 0.4575 | 0.0694 | 0.5232 | 1.1% |
| 2500 | 38.3 | 0.6814 | 0.3184 | 0.3798 | 0.4590 | 0.0694 | 0.5232 | 1.1% |
| 2500 | 89.4 | 0.6912 | 0.3087 | 0.3808 | 0.4608 | 0.0694 | 0.5232 | 1.1% |
| 2500 | 54.5 | 0.7008 | 0.2991 | 0.3817 | 0.4625 | 0.0694 | 0.5232 | 1.0% |
| 2500 | 8.6 | 0.7086 | 0.2914 | 0.3824 | 0.4637 | 0.0694 | 0.5232 | 1.0% |
| 2500 | −23.7 | 0.7138 | 0.2862 | 0.3828 | 0.4644 | 0.0694 | 0.5232 | 1.0% |
| 2500 | −55.8 | 0.7188 | 0.2812 | 0.3831 | 0.4651 | 0.0694 | 0.5232 | 1.0% |
| 2500 | −22.3 | 0.6669 | 0.3329 | 0.3775 | 0.4546 | 0.0799 | 0.6269 | 1.1% |
| 2500 | 38.3 | 0.6814 | 0.3184 | 0.3798 | 0.4590 | 0.0799 | 0.6269 | 1.1% |
| 2500 | 89.4 | 0.6912 | 0.3087 | 0.3808 | 0.4608 | 0.0799 | 0.6269 | 1.1% |
| 2500 | 54.5 | 0.7008 | 0.2991 | 0.3817 | 0.4625 | 0.0799 | 0.6269 | 1.0% |
| 2500 | 8.6 | 0.7086 | 0.2914 | 0.3824 | 0.4637 | 0.0799 | 0.6269 | 1.0% |
| 2500 | −23.7 | 0.7138 | 0.2862 | 0.3828 | 0.4644 | 0.0799 | 0.6269 | 1.0% |
| 2500 | −55.8 | 0.7188 | 0.2812 | 0.3831 | 0.4651 | 0.0799 | 0.6269 | 1.0% |
| 2500 | −21.7 | 0.6669 | 0.3329 | 0.3763 | 0.4524 | 0.0975 | 0.6902 | 1.2% |
| 2500 | 38.3 | 0.6814 | 0.3184 | 0.3798 | 0.4590 | 0.0975 | 0.6902 | 1.1% |
| 2500 | 89.4 | 0.6912 | 0.3087 | 0.3808 | 0.4608 | 0.0975 | 0.6902 | 1.1% |
| 2500 | 54.5 | 0.7008 | 0.2991 | 0.3817 | 0.4625 | 0.0975 | 0.6902 | 1.0% |
| 2500 | 8.6 | 0.7086 | 0.2914 | 0.3824 | 0.4637 | 0.0975 | 0.6902 | 1.0% |
| 2500 | −23.7 | 0.7138 | 0.2862 | 0.3828 | 0.4644 | 0.0975 | 0.6902 | 1.0% |
| 2500 | −55.8 | 0.7188 | 0.2812 | 0.3831 | 0.4651 | 0.0975 | 0.6902 | 1.0% |
| 2500 | −21.2 | 0.6669 | 0.3329 | 0.3750 | 0.4499 | 0.1270 | 0.7352 | 1.2% |
| 2500 | 38.3 | 0.6814 | 0.3184 | 0.3798 | 0.4590 | 0.1270 | 0.7352 | 1.1% |
| 2500 | 89.4 | 0.6912 | 0.3087 | 0.3808 | 0.4608 | 0.1270 | 0.7352 | 1.1% |
| 2500 | 54.5 | 0.7008 | 0.2991 | 0.3817 | 0.4625 | 0.1270 | 0.7352 | 1.0% |
| 2500 | 8.6 | 0.7086 | 0.2914 | 0.3824 | 0.4637 | 0.1270 | 0.7352 | 1.0% |
| 2500 | −23.7 | 0.7138 | 0.2862 | 0.3828 | 0.4644 | 0.1270 | 0.7352 | 1.0% |
| 2500 | −55.8 | 0.7188 | 0.2812 | 0.3831 | 0.4651 | 0.1270 | 0.7352 | 1.0% |
| 2500 | −21.2 | 0.6669 | 0.3329 | 0.3740 | 0.4480 | 0.1561 | 0.7502 | 1.2% |

TABLE 2-continued

| | | | | | | | | |
|---|---|---|---|---|---|---|---|---|
| 2500 | 38.3 | 0.6814 | 0.3184 | 0.3798 | 0.4590 | 0.1561 | 0.7502 | 1.1% |
| 2500 | 89.4 | 0.6912 | 0.3087 | 0.3808 | 0.4608 | 0.1561 | 0.7502 | 1.1% |
| 2500 | 54.5 | 0.7008 | 0.2991 | 0.3817 | 0.4625 | 0.1561 | 0.7502 | 1.0% |
| 2500 | 8.6 | 0.7086 | 0.2914 | 0.3824 | 0.4637 | 0.1561 | 0.7502 | 1.0% |
| 2500 | −23.7 | 0.7138 | 0.2862 | 0.3828 | 0.4644 | 0.1561 | 0.7502 | 1.0% |
| 2500 | −55.8 | 0.7188 | 0.2812 | 0.3831 | 0.4651 | 0.1561 | 0.7502 | 1.0% |
| 2500 | −21.3 | 0.6669 | 0.3329 | 0.3727 | 0.4456 | 0.1938 | 0.7479 | 1.3% |
| 2500 | 38.3 | 0.6814 | 0.3184 | 0.3798 | 0.4590 | 0.1938 | 0.7479 | 1.1% |
| 2500 | 89.4 | 0.6912 | 0.3087 | 0.3808 | 0.4608 | 0.1938 | 0.7479 | 1.1% |
| 2500 | 54.5 | 0.7008 | 0.2991 | 0.3817 | 0.4625 | 0.1938 | 0.7479 | 1.0% |
| 2500 | 8.6 | 0.7086 | 0.2914 | 0.3824 | 0.4637 | 0.1938 | 0.7479 | 1.0% |
| 2500 | −23.7 | 0.7138 | 0.2862 | 0.3828 | 0.4644 | 0.1938 | 0.7479 | 1.0% |
| 2500 | −55.8 | 0.7188 | 0.2812 | 0.3831 | 0.4651 | 0.1938 | 0.7479 | 1.0% |
| 2500 | −21.4 | 0.6669 | 0.3329 | 0.3708 | 0.4421 | 0.2329 | 0.7309 | 1.3% |
| 2500 | 38.3 | 0.6814 | 0.3184 | 0.3798 | 0.4590 | 0.2329 | 0.7309 | 1.1% |
| 2500 | 89.4 | 0.6912 | 0.3087 | 0.3808 | 0.4608 | 0.2329 | 0.7309 | 1.1% |
| 2500 | 54.5 | 0.7008 | 0.2991 | 0.3817 | 0.4625 | 0.2329 | 0.7309 | 1.0% |
| 2500 | 8.6 | 0.7086 | 0.2914 | 0.3824 | 0.4637 | 0.2329 | 0.7309 | 1.0% |
| 2500 | −23.7 | 0.7138 | 0.2862 | 0.3828 | 0.4644 | 0.2329 | 0.7309 | 1.0% |
| 2500 | −55.8 | 0.7188 | 0.2812 | 0.3831 | 0.4651 | 0.2329 | 0.7309 | 1.0% |

The following examples are intended to highlight various aspects of the present inventive subject matter and are provided for illustrative purposes only. The following examples should not be used to limit the scope of the present inventive subject matter as defined in the claims.

EXAMPLES

Light emitting diodes have been demonstrated to be able to produce white light with efficacy >150 L/W and are anticipated to be the predominant lighting devices within the next decade. LED based luminaires are already commercially available with efficacies up to 60 L/W. Many systems are based primarily on LEDs which combine blue+YAG:Ce or BOSE, or RGB InGaN/AlInGaP LEDs or UV LED excited RGB phosphors. These methods have good efficacy but only medium CRI. They have not been able to demonstrate both high CRI and high efficacy especially with color temperatures between 2700K and 4000K. The general approach described in U.S. Pat. No. 7,213,940 was utilized to produce white light and demonstrate a warm-white luminaire with a wall plug efficacy of 85 lumens per watt, a CRI Ra of 92 at a CCT of 2865K. By combining high efficiency AlInGaP Red LEDs and wide spectrum yellowish phosphor LEDs, high-efficacy high-CRI warm-white illumination was produced.

A YAG:Ce phosphor was combined with 452 nm peak blue InGaN LEDs such that the color point fell well above the black body locus and the color was distinctly yellow. This point coincided with the peak efficacy for the Blue+YAG:Ce system but this was not a white LED lamp.

Mixing this light with a reddish AlInGaP LED's light, we were able to pull the yellow color back to the black body curve and produce warm white light. FIG. 4 shows the tie lines between a red LED and various yellow and yellowish points on the Blue/YAG tie line.

With this approach, high efficacy warm white light with an exceptional CRI was produced. The combination of a yellow phosphor LED and a red LED dramatically improved the CRI and efficacy of the light. Initial experiments achieved CRI Ra>90 for color temperatures below 3500K and very good efficacy.

FIG. 5 shows the efficacy and high CRI achievable with this initial arrangement.

The complete integrated (power supply, optic, etc) LED light unit was tested (report #1859182-1) at The CSA International laboratory (NVLAP certified by NIST) in Atlanta Ga., USA and found to have the following results at thermal equilibrium. 619 lumens, 2865K, 85 LPW, CRI Ra 92, 120VAC, 7.28 W, PF=0.97 (after 90 minutes of operation to achieve thermal equilibrium at an ambient temperature of 25° C.).

In another example, an LR6 from LED Lighting Fixtures of Morrisville, N.C. was modified to include a BCG LED by replacing one of the more blueish phosphor LEDs with a 480 nm dominant BCG LED. The LR6 would typically have a color temperature of 2700K. Adding the BCG LED allowed the LR6 to be tuned to provide a 3500K fixture that is very close to the BBL, with an efficacy of ~60 L/W, and a CRI Ra of 95.

Any two or more structural parts of the devices described herein can be integrated. Any structural part of the devices described herein can be provided in two or more parts, which are held together, if necessary.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

The invention claimed is:

1. A lighting device comprising:
   a first group of non-white light sources, said non-white light sources, when illuminated, emitting light having u', v' color coordinates which define a point which is (1) outside an area bounded by a first white-light boundary curve which is 0.01 u'v' above the planckian blackbody locus and a second white-light boundary curve which is 0.01 u'v' below the planckian blackbody locus and (2) within an area on a 1976 CIE Chromaticity Diagram enclosed by a first saturated light curve extending along all points representing saturated light having wavelength in the range of from about 430 nm to about 480 nm, a first line segment extending from a point representing saturated light having wavelength of about 480 nm to a point representing saturated light having wavelength of about 560 nm, a second saturated light curve extending along all points representing saturated light having wavelength in the range of from about 560 nm to about 580 nm, and a second line segment extending from a point representing saturated light having wavelength of about 580 nm to a point representing saturated light having wavelength of about 430 nm;
   a first group of supplemental light emitters, said first group of supplemental light emitters having a dominant emission wavelength in the range of from about 465 nm to about 540 nm; and
   a second group of supplemental light emitters, said second group of supplemental light emitters having a dominant emission wavelength in the range of from about 600 nm to about 640 nm.

2. A lighting device as recited in claim 1, wherein said first group of non-white light sources comprises at least a first light source solid state light emitter and at least a first luminescent material.

3. A lighting device as recited in claim 1, wherein said first group of non-white light sources comprises at least a first light source having a FWHM value of at least 40 nm.

4. A lighting device as recited in claim 1, wherein when each of said first group of non-white light sources, each of said first group of supplemental light emitters and each of said second group of supplemental light emitters are emitting light, a mixture of (1) light emitted from said lighting device which was emitted by said first group of non-white light sources, (2) light emitted from said lighting device which was emitted by said first group of supplemental light emitters, and (3) light emitted from said lighting device which was emitted by said second group of supplemental light emitters would, in the absence of any additional light, have a combined illumination having x, y color coordinates which is within 0.01 u'v' of at least one point on the blackbody locus on a 1976 CIE Chromaticity Diagram.

5. A lighting device as recited in claim 1, wherein said lighting device further comprises at least a first power line, and when energy is supplied to said first power line, said lighting device emits light which is within 0.01 u'v' of at least one point on the blackbody locus on a 1976 CIE Chromaticity Diagram.

6. A lighting device as recited in claim 1, wherein when each of said first group of non-white light sources, each of said first group of supplemental light emitters and each of said second group of supplemental light emitters are emitting light, a mixture of (1) light emitted from said lighting device which was emitted by said first group of non-white light sources, (2) light emitted from said lighting device which was emitted by said first group of supplemental light emitters, and (3) light emitted from said lighting device which was emitted by said second group of supplemental light emitters would, in the absence of any additional light, have a correlated color temperature in the range of from about 2,000 K to about 11,000 K.

7. A lighting device as recited in claim 1, wherein when each of said first group of non-white light sources, each of said first group of supplemental light emitters and each of said second group of supplemental light emitters are emitting light, a mixture of (1) light emitted from said lighting device which was emitted by said first group of non-white light sources, (2) light emitted from said lighting device which was emitted by said first group of supplemental light emitters, and (3) light emitted from said lighting device which was emitted by said second group of supplemental light emitters would, in the absence of any additional light, have a CRI of at least Ra 85.

8. A lighting device as recited in claim 1, wherein when each of said first group of non-white light sources, each of said first group of supplemental light emitters and each of said second group of supplemental light emitters are emitting light, light emitted from said lighting device which was emitted by said first group of non-white light sources comprises from about 40 percent to about 95 percent of the light emitted from said lighting device.

9. A lighting device as recited in claim 8, wherein said first group of non-white light sources comprises at least a first light source solid state light emitter which has a peak emission wavelength in the range of from about 390 nm to about 480 nm.

10. A lighting device as recited in claim 8, wherein said first group of non-white light sources comprises at least a first luminescent material which has a dominant emission wavelength in the range of from about 560 nm to about 580 nm.

11. A lighting device as recited in claim 1, wherein said first group of supplemental light emitters comprises at least a first supplemental group first light emitter which has a FWHM value of at least 40 nm.

12. A lighting device as recited in claim 1, wherein said first group of supplemental light emitters comprises at least a first supplemental group first light emitter which has a FWHM value in the range of from about 15 nm to about 30 nm.

13. A lighting device as recited in claim 1, wherein said second group of supplemental light emitters has a dominant emission wavelength in the range of from about 610 nm to about 635 nm.

14. A lighting device as recited in claim 1, wherein said second group of supplemental light emitters comprises at least a second supplemental group first light emitter which has a FWHM value of at least 40 nm.

15. A lighting device as recited in claim 1, wherein said second group of supplemental light emitters comprises at least a second supplemental group first light emitter which has a FWHM value in the range of from about 15 nm to about 30 nm.

16. A lighting device as recited in claim 1, wherein each of said first group of supplemental light emitters is a packaged light emitting diode and each of said second group of supplemental light emitters is a packaged light emitting diode.

17. A lighting device as recited in claim 1, wherein at least one of said first group of supplemental light emitters and at least one of said second group of supplemental light emitters are combined as a single light emitting diode.

18. A lighting device as recited in claim 1, wherein:
   said first non-white light source comprises at least a first light source solid state light emitter and at least a first luminescent material, at least one of said first group of supplemental light emitters, at least one of said second group of supplemental light emitters, said first light source solid state light emitter and said first luminescent material are combined as a single light emitting diode.

19. A lighting device as recited in claim 18, wherein said first light source solid state light emitter is a light emitting diode.

20. A lighting device as recited in claim 1, wherein said non-white light sources, when illuminated, emit light having x, y color coordinates which define a point which is within an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38.

21. A lighting device as recited in claim 1, wherein said first group of non-white light sources consists of a single light emitter.

22. A lighting device as recited in claim 1, wherein said lighting device further comprises at least a third group of supplemental light emitters, said third group of supplemental light emitters comprising at least one light source that emits light perceived as white, off-white, purple-ish, blueish-purple and/or blueish-green.

23. A lighting device as recited in claim 1, wherein each of said non-white light sources comprises at least one first light source solid state light emitter and at least one luminescent material.

24. A lighting device as recited in claim 1, wherein each of said first group of supplemental light emitters and each of said second group of supplemental light emitters is a solid state light emitter.

25. A lighting device as recited in claim 1, wherein:
said lighting device further comprises a second group of non-white light sources, said second group of non-white light sources, when illuminated, emitting light having u', v' color coordinates which define a point which is (1) outside the area bounded by the first white-light boundary curve and the second white-light boundary curve, and (2) within the area on a 1976 CIE Chromaticity Diagram enclosed by the first saturated light curve, the first line segment, the second saturated light curve, and the second line segment;
the first group of non-white light sources is electrically connected so as to be commonly energized;
the second group of non-white light sources is electrically connected so as to be commonly energized and separately energized from the first group of non-white light sources; and
the first group of supplemental light emitters comprises at least one first group supplemental light emitter which is electrically connected so as to be commonly energized with the first group of non-white light emitters or the second group of non-white light emitters.

26. The lighting device of claim 25, wherein the first group of non-white light emitters and the second group of non-white light emitters have respective color points such that at least a portion of a tie line between the respective color points on the CIE31 Chromaticity Diagram is contained within a region bounded by the points having x, y coordinates of about 0.3528,0.4414; 0.3640,0.4629; 0.3953,0.4487; and 0.3845, 0.4296.

27. The lighting device of claim 26, wherein the at least one first group supplemental light emitter has a dominant wavelength in the range of from about 475 nm to about 485 nm.

28. The lighting device of claim 26, wherein the lighting device has a Color Temperature of from about 2500 K to about 4000 K and a color point within about 4 MacAdam ellipses of the blackbody locus.

29. The lighting device of claim 25, wherein the first group of non-white light sources and the second group of non-white light sources have respective color points such that at least a portion of a tie line between the respective color points on the CIE31 Chromaticity Diagram is contained within a region bounded by the points having x, y coordinates of about 0.3318,0.4013; 0.3426,0.4219; 0.3747,0.4122; and 0.3643, 0.3937.

30. The lighting device of claim 29, wherein the at least one first supplemental light emitter has a dominant wavelength of from about 475 nm to about 485 nm.

31. The lighting device of claim 29, wherein the lighting device has a Color Temperature of about 4000K and a color point within about 4 MacAdam ellipses of the black body locus.

32. A lighting device, comprising:
a first string comprising a first group of non-white light sources and at least one supplemental light emitter, said first group of non-white light sources, when illuminated, emitting light having u', v' color coordinates which define a point which is (1) outside an area bounded by a first white-light boundary curve which is 0.01 u'v' above the planckian blackbody locus and a second white-light boundary curve which is 0.01 u'v' below the planckian blackbody locus and (2) within an area on a 1976 CIE Chromaticity Diagram enclosed by a first saturated light curve extending along all points representing saturated light having wavelength in the range of from about 430 nm to about 480 nm, a first line segment extending from a point representing saturated light having wavelength of about 480 nm to a point representing saturated light having wavelength of about 560 nm, a second saturated light curve extending along all points representing saturated light having wavelength in the range of from about 560 nm to about 580 nm, and a second line segment extending from a point representing saturated light having wavelength of about 580 nm to a point representing saturated light having wavelength of about 430 nm;
a second string comprising a second group of non-white light sources, said second group of non-white light sources, when illuminated, emitting light having u', v' color coordinates which define a point which is (1) outside an area bounded by a first white-light boundary curve which is 0.01 u'v' above the planckian blackbody locus and a second white-light boundary curve which is 0.01 u'v' below the planckian blackbody locus and (2) within an area on a 1976 CIE Chromaticity Diagram enclosed by a first saturated light curve extending along all points representing saturated light having wavelength in the range of from about 430 nm to about 480 nm, a first line segment extending from a point representing saturated light having wavelength of about 480 nm to a point representing saturated light having wavelength of about 560 nm, a second saturated light curve extending along all points representing saturated light having wavelength in the range of from about 560 nm to about 580 nm, and a second line segment extending from a point representing saturated light having wavelength of about 580 mm to a point representing saturated light having wavelength of about 430 nm; and a third string comprising a second group of supplemental light emitters, said second group of supplemental light emitters having a dominant emission wavelength in the range of from about 600 nm to about 640 nm.

33. A lighting device as recited in claim 32, wherein said at least one supplemental light emitter, when illuminated, emits light having a wavelength in the range of from about 430 nm to about 480 nm.

34. A lighting device as recited in claim 32, wherein said first group of non-white light sources emits light which is more blueish than light emitted by said second group of non-white light sources, and said second group of non-white light sources emits light which is more yellowish than light emitted by said first group of non-white light sources.

35. A lighting device as recited in claim 32, wherein said first group of non-white light sources emits light which is within a first color bin having chromaticity region bounded by line segments extending between coordinates on a CIE31 Chromaticity diagram of 0.3577, 0.4508; 0.3892, 0.4380; 0.3845, 0.4296; and 0.3528, 0.4414, and said second group of non-white light sources emits light which is within a second color bin having chromaticity region bounded by line segments extending between coordinates on a CIE31 Chromaticity diagram of 0.3640, 0.4629; 0.3953, 0.4487; 0.3892, 0.438; and 0.3577, 0.4508.

36. A lighting device as recited in claim 32, wherein when each of said first group of non-white light sources, each of said at least one supplemental light emitter and each of said second group of non-white light sources is emitting light, a mixture of (1) light emitted from said lighting device which was emitted by said first group of non-white light sources, (2) light emitted from said lighting device which was emitted by said at least one supplemental light emitter, and (3) light emitted from said lighting device which was emitted by said second group of non-white light sources would, in the absence of any additional light, have a CRI of at least Ra 85.

37. A lighting device as recited in claim 32, wherein when each of said first group of non-white light sources, each of said at least one supplemental light emitter and each of said second group of non-white light sources is emitting light, a mixture of (1) light emitted from said lighting device which was emitted by said first group of non-white light sources, (2) light emitted from said lighting device which was emitted by said at least one supplemental light emitter, and (3) light emitted from said lighting device which was emitted by said second group of non-white light sources would, in the absence of any additional light, have a correlated color temperature in the range of from about 2,000 K to about 11,000 K.

* * * * *

UNITED STATES PATENT AND TRADEMARK OFFICE
CERTIFICATE OF CORRECTION

PATENT NO. : 8,018,135 B2  
APPLICATION NO. : 12/248220  
DATED : September 13, 2011  
INVENTOR(S) : Antony Paul Van De Ven and Gerald H. Negley It is certified that error appears in the above-identified patent and that said Letters Patent is hereby corrected as shown below:

Title page, Item (75), Inventors: *change* "Gerald H. Negley, Durhan, NC" to --Gerald H. Negley, Durham, NC--

Title page, Item (56), References Cited, Other Publications: *add* --Narendran et al., *Color Rendering Properties of LED Light Sources*, 2002, pp. 1-8, 01/2002--

Signed and Sealed this  
Tenth Day of January, 2012

David J. Kappos  
*Director of the United States Patent and Trademark Office*